US011302873B2

(12) United States Patent
La et al.

(10) Patent No.: US 11,302,873 B2
(45) Date of Patent: Apr. 12, 2022

(54) ORGANIC LIGHT-EMITTING DEVICE

(71) Applicant: LT MATERIALS CO., LTD., Yongin (KR)

(72) Inventors: Hyun Ju La, Hwaseong-si (KR); Yun Ji Lee, Osan-si (KR); Gi Back Lee, Osan-si (KR); Won Jang Jeong, Hwaseong-si (KR); Jin Seok Choi, Suwon-si (KR); Dae Hyuk Choi, Yongin-si (KR)

(73) Assignee: LT MATERIALS CO, LTD., Yongin-si (KR)

( * ) Notice: Subject to any disclaimer, the term of this patent is extended or adjusted under 35 U.S.C. 154(b) by 236 days.

(21) Appl. No.: 16/462,852

(22) PCT Filed: Dec. 19, 2017

(86) PCT No.: PCT/KR2017/015011

§ 371 (c)(1),
(2) Date: May 21, 2019

(87) PCT Pub. No.: WO2018/124588

PCT Pub. Date: Jul. 5, 2018

(65) Prior Publication Data

US 2020/0066996 A1 Feb. 27, 2020

(30) Foreign Application Priority Data

Dec. 26, 2016 (KR) ........................ 10-2016-0179082

(51) Int. Cl.
*H01L 51/00* (2006.01)
*H01L 51/52* (2006.01)

(52) U.S. Cl.
CPC ...... *H01L 51/0072* (2013.01); *H01L 51/0054* (2013.01); *H01L 51/0067* (2013.01); *H01L 51/5206* (2013.01); *H01L 51/5221* (2013.01)

(58) Field of Classification Search
CPC ............... H01L 51/072; H01L 51/0054; H01L 51/0067; H01L 51/5206; H01L 51/5221; H01L 51/0052; H01L 51/50
(Continued)

(56) References Cited

U.S. PATENT DOCUMENTS 4,356,429 A 10/1982 Tang
9,728,731 B2 8/2017 La et al.
(Continued)

FOREIGN PATENT DOCUMENTS

EP 3 165 527 A1 5/2017
JP 2004-342614 A 12/2004
(Continued)

OTHER PUBLICATIONS

International Search Report for PCT/KR2017/015011 dated Mar. 30, 2018.
(Continued)

*Primary Examiner* — Tri V Nguyen
(74) *Attorney, Agent, or Firm* — Birch, Stewart, Kolasch & Birch, LLP

(57) ABSTRACT

The present application provides a hetero-cyclic compound capable of greatly enhancing a lifetime, efficiency, electrochemical stability and thermal stability of an organic light emitting device, and an organic light emitting device containing the hetero-cyclic compound in an organic compound layer.

10 Claims, 3 Drawing Sheets

(58) Field of Classification Search
USPC ............... 428/917; 257/40, E51.05, E51.051
See application file for complete search history.

(56) References Cited

U.S. PATENT DOCUMENTS

| | | | |
|---|---|---|---|
| 2004/0227460 | A1 | 11/2004 | Liao et al. |
| 2015/0243895 | A1 | 8/2015 | Lim et al. |
| 2015/0243908 | A1 | 8/2015 | Lee et al. |
| 2015/0349275 | A1 | 12/2015 | Jeong et al. |
| 2016/0204357 | A1 | 7/2016 | Jang et al. |
| 2017/0125696 | A1 | 5/2017 | Park et al. |
| 2017/0133602 | A1 | 5/2017 | Lee et al. |
| 2017/0317295 | A1 | 11/2017 | No et al. |

FOREIGN PATENT DOCUMENTS

| | | | | |
|---|---|---|---|---|
| KR | 10-2013-0135178 | A | 12/2013 | |
| KR | 10-2014-0055968 | A | 5/2014 | |
| KR | 10-2015-0101898 | A | 9/2015 | |
| KR | 10-1558495 | B1 | 10/2015 | |
| KR | 101579289 | B1 * | 12/2015 | ............. C09K 11/06 |
| KR | 10-2016-002408 | A | 1/2016 | |
| KR | 10-2016-0007438 | A | 1/2016 | |
| KR | 10-2016-0008819 | A | 1/2016 | |
| KR | 10-2016-0041019 | A | 4/2016 | |
| KR | 10-2016-0046703 | A | 4/2016 | |
| KR | 10-2016-0082067 | A | 7/2016 | |
| KR | 10-2016-0124623 | A | 10/2016 | |
| KR | 10-2016-0129781 | A | 11/2016 | |
| KR | 10-2017-0090139 | A | 8/2017 | |
| WO | WO 2015/099508 | A1 | 7/2015 | |
| WO | WO 2016/064088 | A2 | 4/2016 | |
| WO | WO 2016/068633 | A2 | 5/2016 | |

OTHER PUBLICATIONS

Kuwabara et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials", Advanced Material, 1994, vol. 6, No. 9, pp. 677-679.

European Search Report for Appl. No. 17887386.5 dated Jul. 1, 2020.

* cited by examiner

【FIG. 1】
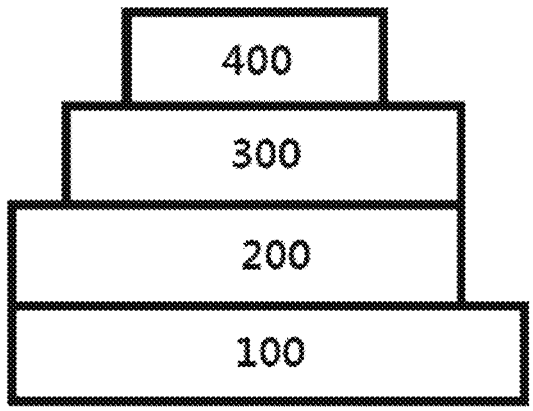
【FIG. 2】
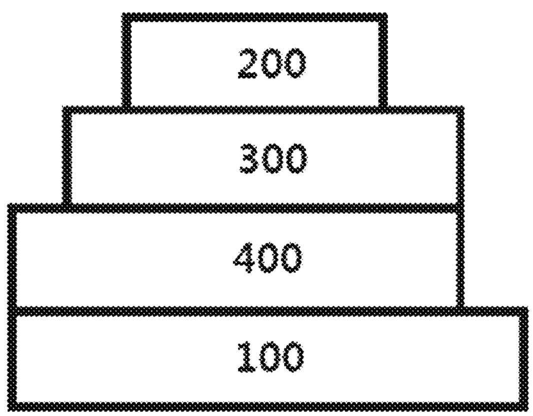

【FIG. 3】
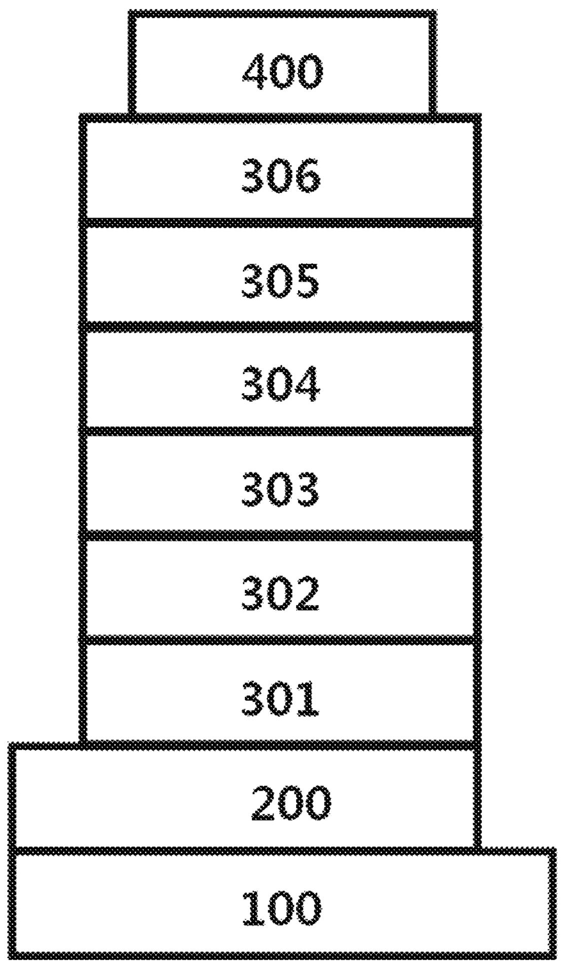

【FIG. 4】
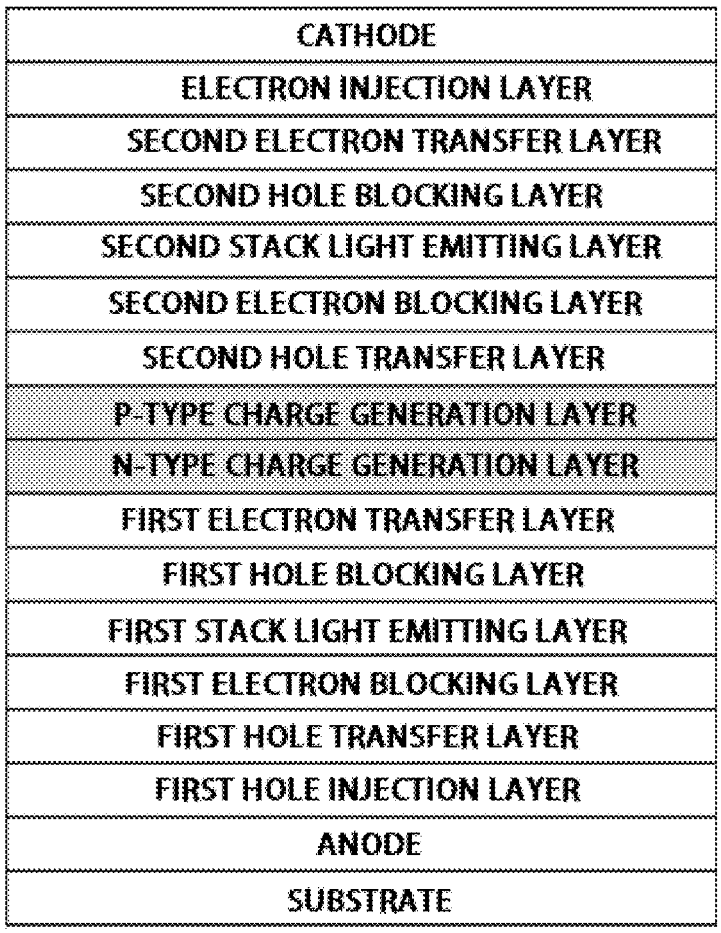

ORGANIC LIGHT-EMITTING DEVICE

TECHNICAL FIELD

This application claims priority to and the benefits of Korean Patent Application No. 10-2016-0179082, filed with the Korean Intellectual Property Office on Dec. 26, 2016, the entire contents of which are incorporated herein by reference.

The present application relates to a hetero-cyclic compound and an organic light emitting device using the same.

BACKGROUND ART

An electroluminescent device is one type of self-emissive display devices, and has an advantage of having a wide viewing angle, and a high response speed as well as having an excellent contrast.

An organic light emitting device has a structure disposing an organic thin film between two electrodes. When a voltage is applied to an organic light emitting device having such a structure, electrons and holes injected from the two electrodes bind and pair in the organic thin film, and light emits as these annihilate. The organic thin film may be formed in a single layer or a multilayer as necessary.

A material of the organic thin film may have a light emitting function as necessary. For example, as a material of the organic thin film, compounds capable of forming a light emitting layer themselves may be used alone, or compounds capable of performing a role of a host or a dopant of a host-dopant-based light emitting layer may also be used. In addition thereto, compounds capable of performing roles of hole injection, hole transfer, electron blocking, hole blocking, electron transfer, electron injection and the like may also be used as a material of the organic thin film.

Development of an organic thin film material has been continuously required for enhancing performance, lifetime or efficiency of an organic light emitting device.

DISCLOSURE

Technical Problem

The present application is directed to providing an organic light emitting device comprising a compound having a specific substituent.

Technical Solution

One embodiment of the present application provides an organic light emitting device comprising an anode, a cathode, and one or more organic material layers provided between the anode and the cathode, wherein one or more layers of the organic material layers comprise a hetero-cyclic compound represented by the following Chemical Formula 1.

[Chemical Formula 1]

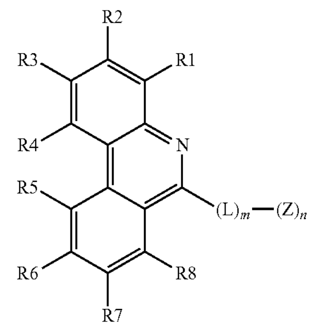

In Chemical Formula 1, at least one of R1 and R2, R3 and R4, R5 and R6, R6 and R7, and R7 and R8 bond to each other to form a hydrocarbon fused ring or a hetero fused ring, the rest are the same as or different from each other, and each independently selected from the group consisting of hydrogen; deuterium; a halogen group; —CN; a substituted or unsubstituted $C_1$ to $C_{60}$ alkyl group; a substituted or unsubstituted $C_2$ to $C_{60}$ alkenyl group; a substituted or unsubstituted $C_2$ to $C_{60}$ alkynyl group; a substituted or unsubstituted $C_1$ to $C_{60}$ alkoxy group; a substituted or unsubstituted $C_3$ to $C_{60}$ cycloalkyl group; a substituted or unsubstituted $C_2$ to $C_{60}$ heterocycloalkyl group; a substituted or unsubstituted $C_6$ to $C_{60}$ aryl group; a substituted or unsubstituted $C_2$ to $C_{60}$ heteroaryl group; —SiRR'R"; —P(═O)RR'; and an amine group unsubstituted or substituted with a $C_1$ to $C_{20}$ alkyl group, a $C_6$ to $C_{60}$ aryl group, or a $C_2$ to $C_{60}$ heteroaryl group, L is a direct bond, a substituted or unsubstituted $C_6$ to $C_{60}$ arylene group, or a $C_2$ to $C_{60}$ heteroarylene group, Z is selected from the group consisting of hydrogen; deuterium; a halogen group; —CN; a substituted or unsubstituted $C_1$ to $C_{60}$ alkyl group; a substituted or unsubstituted $C_6$ to $C_{60}$ aryl group; a substituted or unsubstituted $C_2$ to $C_{60}$ heteroaryl group; —SiRR'R"; —P(═O)RR'; and an amine group unsubstituted or substituted with a $C_1$ to $C_{20}$ alkyl group, a $C_6$ to $C_{60}$ aryl group, or a $C_2$ to $C_{60}$ heteroaryl group, m is an integer of 0 to 4, n is an integer of 1 to 4, and R, R' and R" are the same as or different from each other, and each independently hydrogen; deuterium; —CN; a substituted or unsubstituted $C_1$ to $C_{60}$ alkyl group; a substituted or unsubstituted $C_3$ to $C_{60}$ cycloalkyl group; a substituted or unsubstituted $C_6$ to $C_{60}$ aryl group; or a substituted or unsubstituted $C_2$ to $C_{60}$ heteroaryl group.

Advantageous Effects

A hetero-cyclic compound according to one embodiment of the present application can be used as an organic material layer material of an organic light emitting device. The hetero-cyclic compound can be used as a material of a hole injection layer, a hole transfer layer, a light emitting layer, an electron transfer layer, an electron injection layer, a charge generation layer or the like in an organic light emitting device. Particularly, a hetero-cyclic compound represented by Chemical Formula 1 can be used as a material of an electron transfer layer or a charge generation layer in an organic light emitting device. In addition, using the hetero-cyclic compound represented by Chemical Formula 1 in an organic light emitting device lowers a driving voltage of the device, enhances light efficiency, and can enhance a lifetime property of the device with thermal stability of the compound.

DESCRIPTION OF DRAWINGS

FIG. 1 to FIG. 4 are diagrams each schematically illustrating a lamination structure of an organic light emitting device according to one embodiment of the present application.

REFERENCE NUMERAL

100: Substrate
200: Anode
300: Organic Material Layer
301: Hole Injection Layer
302: Hole Transfer Layer
303: Light Emitting Layer
304: Hole Blocking Layer
305: Electron Transfer Layer
306: Electron Injection Layer
400: Cathode

BEST MODE

Hereinafter, the present application will be described in detail.

An organic light emitting device according to one embodiment of the present application comprises an anode, a cathode and one or more organic material layers provided between the anode and the cathode, wherein one or more layers of the organic material layers comprise a heterocyclic compound represented by Chemical Formula 1.

In one embodiment of the present application, when m of Chemical Formula 1 is 2 or greater, two or more Ls may be the same as or different from each other. In addition, when n of Chemical Formula 1 is 2 or greater, two or more Zs may be the same as or different from each other.

In one embodiment of the present application, R5 and R6 of Chemical Formula 1 may bond to each other to form a hydrocarbon fused ring.

In another embodiment, R5 and R6 of Chemical Formula 1 may bond to each other to form a $C_6$ to $C_{60}$ hydrocarbon fused ring.

In another embodiment, R5 and R6 of Chemical Formula 1 may bond to each other to form a $C_6$ to $C_{40}$ hydrocarbon fused ring.

In another embodiment, R5 and R6 of Chemical Formula 1 may bond to each other to form a benzene ring.

In one embodiment of the present application, R5 and R6 of Chemical Formula 1 bond to each other to form a hydrocarbon fused ring, and at the same time, R7 and R8 may bond to each other to form a hydrocarbon fused ring.

In another embodiment, R5 and R6 of Chemical Formula 1 bond to each other to form a $C_6$ to $C_{60}$ hydrocarbon fused ring, and at the same time, R7 and R8 may bond to each other to form a $C_6$ to $C_{60}$ hydrocarbon fused ring.

In another embodiment, R5 and R6 of Chemical Formula 1 bond to each other to form a $C_6$ to $C_{40}$ hydrocarbon fused ring, and at the same time, R7 and R8 may bond to each other to form a $C_6$ to $C_{40}$ hydrocarbon fused ring.

In another embodiment, R5 and R6 of Chemical Formula 1 bond to each other to form a benzene ring, and at the same time, R7 and R8 may bond to each other to form a benzene ring.

In one embodiment of the present application, R1 and R2 of Chemical Formula 1 bond to each other to form a hydrocarbon fused ring, and at the same time, R3 and R4 may bond to each other to form a hydrocarbon fused ring.

In another embodiment, R1 and R2 of Chemical Formula 1 bond to each other to form a $C_6$ to $C_{60}$ hydrocarbon fused ring, and at the same time, R3 and R4 may bond to each other to form a $C_6$ to $C_{60}$ hydrocarbon fused ring.

In another embodiment, R1 and R2 of Chemical Formula 1 bond to each other to form a $C_6$ to $C_{40}$ hydrocarbon fused ring, and at the same time, R3 and R4 may bond to each other to form a $C_6$ to $C_{40}$ hydrocarbon fused ring.

In another embodiment, R1 and R2 of Chemical Formula 1 bond to each other to form a benzene ring, and at the same time, R3 and R4 may bond to each other to form a benzene ring.

In one embodiment of the present application, R5 and R6 of Chemical Formula 1 may bond to each other to form a hetero fused ring.

In another embodiment, R5 and R6 of Chemical Formula 1 may bond to each other to form a $C_2$ to $C_{60}$ hetero fused ring.

In another embodiment, R5 and R6 of Chemical Formula 1 may bond to each other to form a $C_2$ to $C_{40}$ hetero fused ring.

In another embodiment, R5 and R6 of Chemical Formula 1 may bond to each other to form a $C_2$ to $C_{40}$ hetero fused ring containing O, S or N.

In another embodiment, R5 and R6 of Chemical Formula 1 may bond to each other to form a benzothiophene group; or a benzofuran group.

In one embodiment of the present application, R6 and R7 of Chemical Formula 1 may bond to each other to form a substituted or unsubstituted hydrocarbon fused ring.

In another embodiment, R6 and R7 of Chemical Formula 1 may bond to each other to form a substituted or unsubstituted $C_6$ to $C_{60}$ hydrocarbon fused ring.

In another embodiment, R6 and R7 of Chemical Formula 1 may bond to each other to form a $C_6$ to $C_{40}$ hydrocarbon fused ring unsubstituted or substituted with a $C_6$ to $C_{40}$ aryl group.

In another embodiment, R6 and R7 of Chemical Formula 1 may bond to each other to form an indene group unsubstituted or substituted with a phenyl group.

In one embodiment of the present application, at least one of R1 and R2, R3 and R4, R5 and R6, R6 and R7, and R7 and R8 of Chemical Formula 1 bond to each other to form a hydrocarbon fused ring or a hetero fused ring, and the groups that do not form a hydrocarbon fused ring or a hetero fused ring among R1 to R8 may be hydrogen or deuterium.

According to one embodiment of the present application, Chemical Formula 1 may be represented by any one of the following Chemical Formulae 2 to 6.

[Chemical Formula 2]

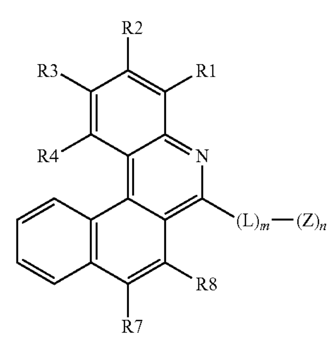

-continued

[Chemical Formula 3]

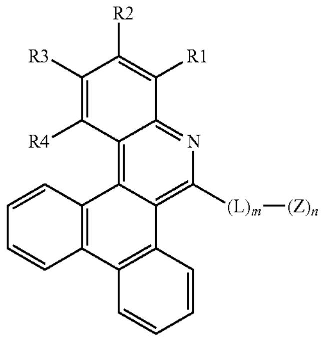

[Chemical Formula 4]

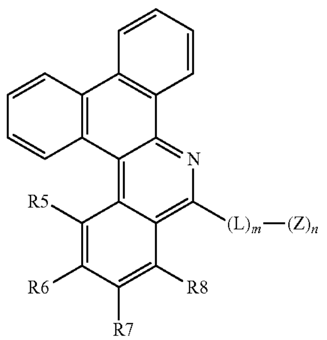

[Chemical Formula 5]

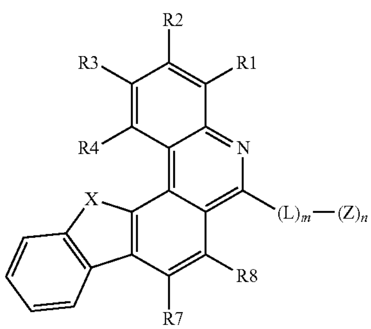

[Chemical Formula 6]

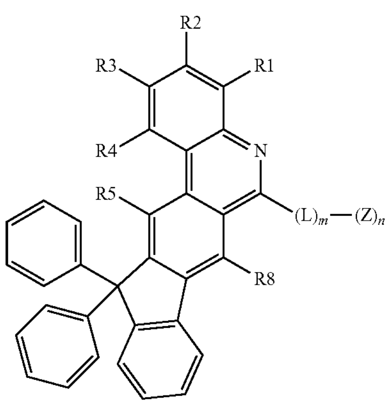

In Chemical Formulae 2 to 6,

R1 to R8 are the same as or different from each other, and each independently hydrogen; deuterium; a halogen group; —CN; a substituted or unsubstituted $C_1$ to $C_{60}$ alkyl group; a substituted or unsubstituted $C_2$ to $C_{60}$ alkenyl group; a substituted or unsubstituted $C_2$ to $C_{60}$ alkynyl group; a substituted or unsubstituted $C_1$ to $C_{60}$ alkoxy group; a substituted or unsubstituted $C_3$ to $C_{60}$ cycloalkyl group; a substituted or unsubstituted $C_2$ to $C_{60}$ heterocycloalkyl group; a substituted or unsubstituted $C_6$ to $C_{60}$ aryl group; a substituted or unsubstituted $C_2$ to $C_{60}$ heteroaryl group; —SiRR'R"; —P(═O)RR'; and an amine group unsubstituted or substituted with a $C_1$ to $C_{20}$ alkyl group, a $C_6$ to $C_{60}$ aryl group, or a $C_2$ to $C_{60}$ heteroaryl group, L is a direct bond; a substituted or unsubstituted $C_6$ to $C_{60}$ arylene group; or a substituted or unsubstituted $C_2$ to $C_{60}$ heteroarylene group, Z is selected from the group consisting of hydrogen; deuterium; a halogen group; —CN; a substituted or unsubstituted $C_1$ to $C_{60}$ alkyl group; a substituted or unsubstituted $C_6$ to $C_{60}$ aryl group; a substituted or unsubstituted $C_2$ to $C_{60}$ heteroaryl group; —SiRR'R"; —P(═O)RR'; and an amine group unsubstituted or substituted with a $C_1$ to $C_{20}$ alkyl group, a $C_6$ to $C_{60}$ aryl group, or a $C_2$ to $C_{60}$ heteroaryl group, X is S; O; NR; or CR'R", m is an integer of 0 to 4, n is an integer of 1 to 4, R, R' and R" are the same as or different from each other, and each independently hydrogen; deuterium; —CN; a substituted or unsubstituted $C_1$ to $C_{60}$ alkyl group; a substituted or unsubstituted $C_3$ to $C_{60}$ cycloalkyl group; a substituted or unsubstituted $C_6$ to $C_{60}$ aryl group; or a substituted or unsubstituted $C_2$ to $C_{60}$ heteroaryl group.

In one embodiment of the present application, L may be a direct bond; a substituted or unsubstituted $C_6$ to $C_{60}$ arylene group; or a substituted or unsubstituted $C_2$ to $C_{60}$ heteroarylene group.

In another embodiment, L may be a substituted or unsubstituted $C_6$ to $C_{40}$ arylene group; or a substituted or unsubstituted $C_2$ to $C_{40}$ heteroarylene group.

In another embodiment, L may be a $C_6$ to $C_{40}$ arylene group; or a $C_2$ to $C_{40}$ heteroarylene group.

In another embodiment, L may be a phenylene group; a biphenylene group; a naphthylene group; a phenanthrenylene group; a triphenylenylene group; an anthracenylene group; or a pyrenylene group.

In another embodiment, L may be a divalent pyridine group; a divalent phenanthroline group; a divalent pyrimidine group; or a divalent quinoline group.

In one embodiment of the present application, Z may be selected from the group consisting of hydrogen; deuterium; a halogen group; —CN; a substituted or unsubstituted $C_1$ to $C_{60}$ alkyl group; a substituted or unsubstituted $C_6$ to $C_{60}$ aryl group; a substituted or unsubstituted $C_2$ to $C_{60}$ heteroaryl group; —SiRR'R"; —P(═O)RR'; and an amine group unsubstituted or substituted with a $C_1$ to $C_{20}$ alkyl group, a $C_6$ to $C_{60}$ aryl group, or a $C_2$ to $C_{60}$ heteroaryl group.

In another embodiment, Z may be selected from the group consisting of hydrogen; a substituted or unsubstituted $C_6$ to $C_{60}$ aryl group; a substituted or unsubstituted $C_2$ to $C_{60}$ heteroaryl group; and an amine group unsubstituted or substituted with a $C_1$ to $C_{20}$ alkyl group, a $C_6$ to $C_{60}$ aryl group, or a $C_2$ to $C_{60}$ heteroaryl group.

In another embodiment, Z may be selected from the group consisting of hydrogen; a substituted or unsubstituted $C_6$ to $C_{60}$ aryl group; and a substituted or unsubstituted $C_2$ to $C_{60}$ heteroaryl group.

In another embodiment, Z may be selected from the group consisting of hydrogen; a substituted or unsubstituted $C_6$ to $C_{40}$ aryl group; and a substituted or unsubstituted $C_2$ to $C_{40}$ heteroaryl group.

In another embodiment, Z may be selected from the group consisting of hydrogen; a $C_6$ to $C_{40}$ aryl group; and a $C_2$ to $C_{40}$ heteroaryl group unsubstituted or substituted with a CG to $C_{40}$ aryl group.

In another embodiment, Z may be selected from the group consisting of hydrogen; a phenyl group; and a phenanthroline group unsubstituted or substituted with a phenyl group.

In one embodiment of the present application, R, R' and R" of Chemical Formula 1 are the same as or different from each other, and may be each independently hydrogen; a substituted or unsubstituted $C_1$ to $C_{60}$ alkyl group; or a substituted or unsubstituted $C_6$ to $C_{60}$ aryl group.

In another embodiment, R, R' and R" of Chemical Formula 1 are the same as or different from each other, and may be each independently hydrogen; a $C_1$ to $C_{60}$ alkyl group; or a $C_6$ to $C_{60}$ aryl group.

In another embodiment, R, R' and R" of Chemical Formula 1 are the same as or different from each other, and may be each independently a phenyl group.

In one embodiment of the present application, L of Chemical Formula 1 may be selected from among the following structural formulae, but is not limited thereto.

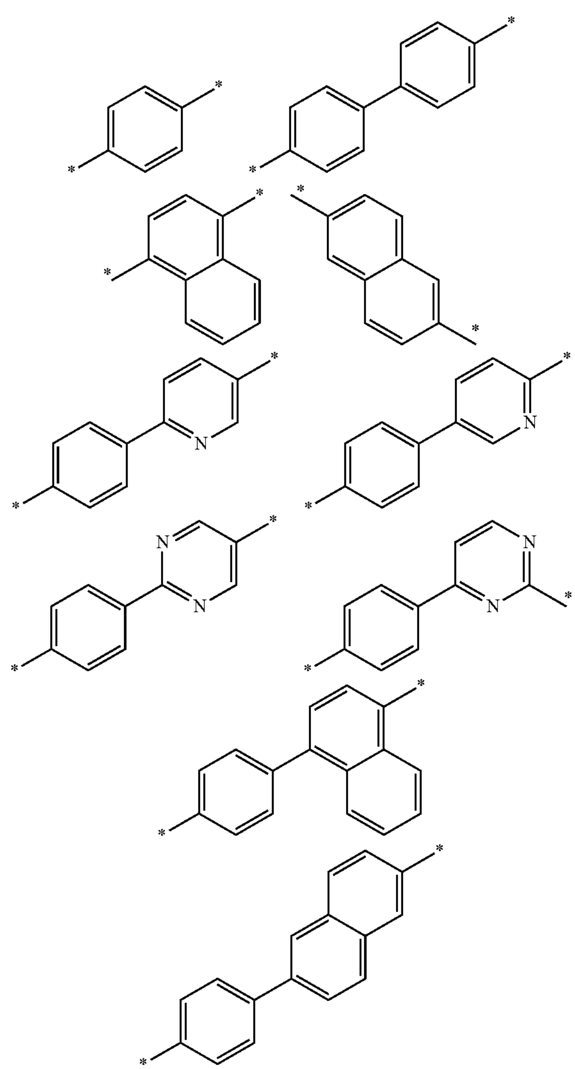

-continued

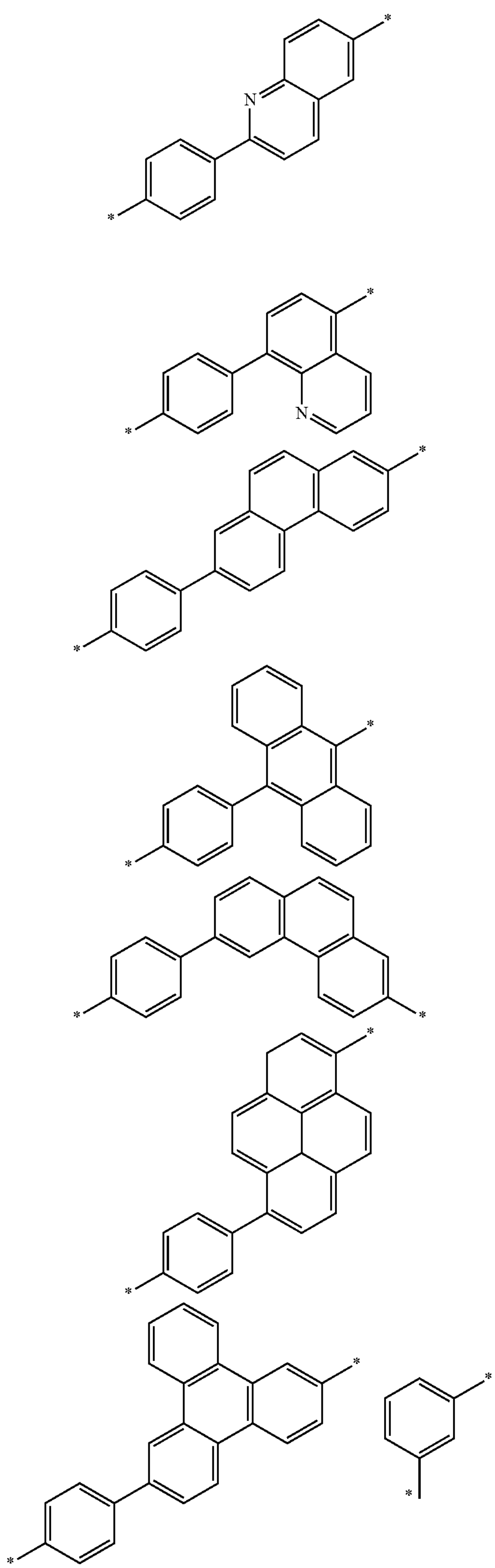

-continued

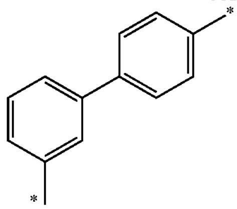
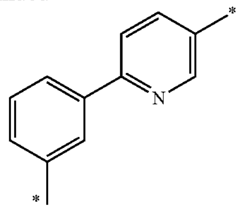
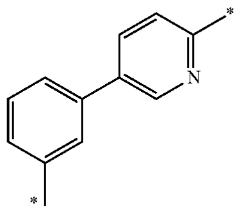
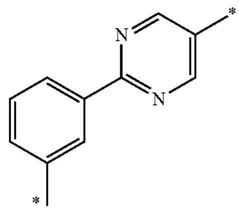
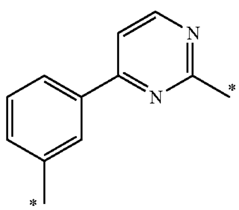
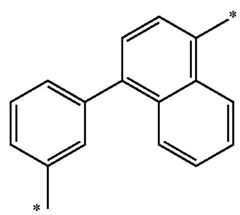
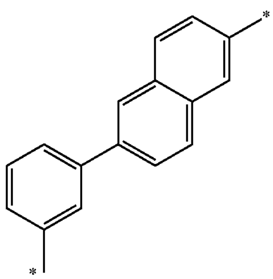
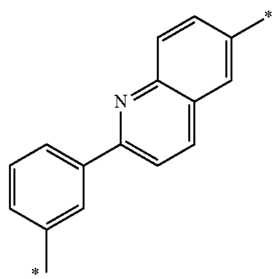
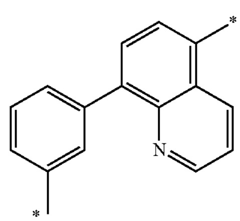
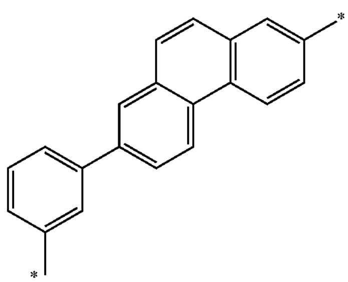
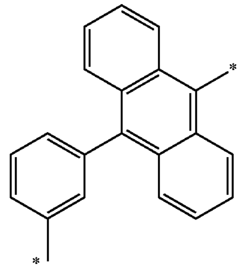

-continued

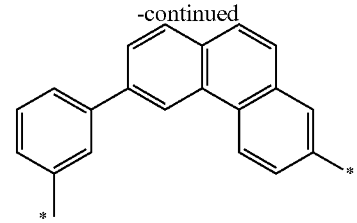
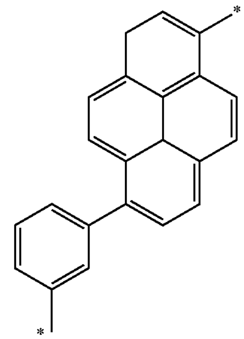
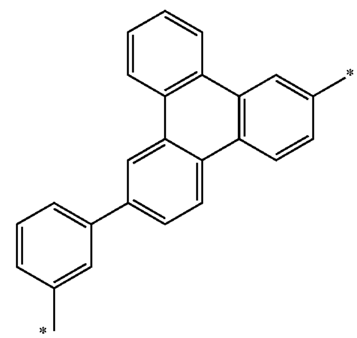 [SMILES: *c1ccc2c3ccc(-c4cccc(C)c4)cc3c3ccccc3c2c1]

In one embodiment of the present application, Z of Chemical Formula 1 may be selected from among the following structural formulae, but is not limited thereto.

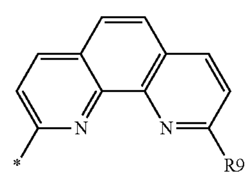
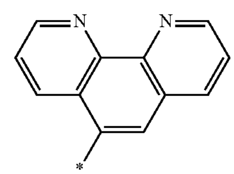
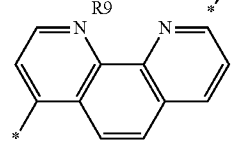

In the structural formulae, R9 is hydrogen; or a $C_6$ to $C_{60}$ aryl group.

In another embodiment, R9 is hydrogen; or a $C_6$ to $C_{40}$ aryl group.

In another embodiment, R9 is hydrogen; or a phenyl group.

In the present specification, the term "substituted or unsubstituted" means being substituted with one or more substituents selected from the group consisting of deuterium; a halogen group; —CN; a $C_1$ to $C_{60}$ alkyl group; a $C_2$ to $C_{60}$ alkenyl group; a $C_2$ to $C_{60}$ alkynyl group; a $C_3$ to $C_{60}$ cycloalkyl group; a $C_2$ to $C_{60}$ heterocycloalkyl group; a $C_6$ to $C_{60}$ aryl group; a $C_2$ to $C_{60}$ heteroaryl group; —SiRR'R";

—P(═O)RR'; a $C_1$ to $C_{20}$ alkylamine group; a $C_6$ to $C_{60}$ arylamine group; and a $C_2$ to $C_{60}$ heteroarylamine group, or being unsubstituted, or being substituted with a substituent bonding two or more of the above-mentioned substituents, or being substituted, or being substituted with a substituent linking two or more substituents selected from among the above-mentioned substituents, or being unsubstituted. For example, "a substituent linking two or more substituents" may comprise a biphenyl group. In other words, a biphenyl group may be an aryl group, or may be interpreted as a substituent linking two phenyl groups. The additional substituents may be further substituted. R, R' and R" are the same as or different from each other, and each independently hydrogen; deuterium; —CN; a substituted or unsubstituted $C_1$ to $C_{60}$ alkyl group; a substituted or unsubstituted $C_3$ to $C_{60}$ cycloalkyl group; a substituted or unsubstituted $C_6$ to $C_{60}$ aryl group; or a substituted or unsubstituted $C_2$ to $C_{60}$ heteroaryl group.

According to one embodiment of the present application, the "substituted or unsubstituted" means being substituted with one or more substituents selected from the group consisting of deuterium, a halogen group, —CN, SiRR'R", P(═O)RR', a $C_1$ to $C_{20}$ linear or branched alkyl group, a $C_6$ to $C_{60}$ aryl group, and a $C_2$ to $C_{60}$ heteroaryl group, or being unsubstituted, and R, R' and R" are the same as or different from each other, and each independently hydrogen; deuterium; —CN; a $C_1$ to $C_{60}$ alkyl group unsubstituted or substituted with deuterium, a halogen group, —CN, a $C_1$ to $C_{20}$ alkyl group, a $C_6$ to $C_{60}$ aryl group and a $C_2$ to $C_{60}$ heteroaryl group; a $C_3$ to $C_{60}$ cycloalkyl group unsubstituted or substituted with deuterium, halogen, —CN, a $C_1$ to $C_{20}$ alkyl group, a $C_6$ to $C_{60}$ aryl group and a $C_2$ to $C_{60}$ heteroaryl group; a $C_6$ to $C_{60}$ aryl group unsubstituted or substituted with deuterium, halogen, —CN, a $C_1$ to $C_{20}$ alkyl group, a $C_6$ to $C_{60}$ aryl group and a $C_2$ to $C_{60}$ heteroaryl group; or a $C_2$ to $C_{60}$ heteroaryl group unsubstituted or substituted with deuterium, halogen, —CN, a $C_1$ to $C_{20}$ alkyl group, a $C_6$ to $C_{60}$ aryl group and a $C_2$ to $C_{60}$ heteroaryl group.

The term "substituted" means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents may be the same as or different from each other.

In the present specification, the halogen may be fluorine, chlorine, bromine or iodine.

In the present specification, the alkyl group comprises linear or branched having 1 to 60 carbon atoms, and may be further substituted with other substituents. The number of carbon atoms of the alkyl group may be from 1 to 60, specifically from 1 to 40 and more specifically from 1 to 20. Specific examples thereof may comprise a methyl group, an ethyl group, a propyl group, an n-propyl group, an isopropyl group, a butyl group, an n-butyl group, an isobutyl group, a tert-butyl group, a sec-butyl group, a 1-methyl-butyl group, a 1-ethyl-butyl group, a pentyl group, an n-pentyl group, an isopentyl group, a neopentyl group, a tert-pentyl group, a hexyl group, an n-hexyl group, a 1-methylpentyl group, a 2-methylpentyl group, a 4-methyl-2-pentyl group, a 3,3-dimethylbutyl group, a 2-ethylbutyl group, a heptyl group, an n-heptyl group, a 1-methylhexyl group, a cyclopentylmethyl group, a cyclohexylmethyl group, an octyl group, an n-octyl group, a tert-octyl group, a 1-methylheptyl group, a 2-ethylhexyl group, a 2-propylpentyl group, an n-nonyl group, a 2,2-dimethylheptyl group, a 1-ethyl-propyl group, a 1,1-dimethyl-propyl group, an isohexyl group, a 2-methylpentyl group, a 4-methylhexyl group, a 5-methylhexyl group and the like, but are not limited thereto.

In the present specification, the alkenyl group comprises linear or branched having 2 to 60 carbon atoms, and may be further substituted with other substituents. The number of carbon atoms of the alkenyl group may be from 2 to 60, specifically from 2 to 40 and more specifically from 2 to 20. Specific examples thereof may comprise a vinyl group, a 1-propenyl group, an isopropenyl group, a 1-butenyl group, a 2-butenyl group, a 3-butenyl group, a 1-pentenyl group, a 2-pentenyl group, a 3-pentenyl group, a 3-methyl-1-butenyl group, a 1,3-butadienyl group, an allyl group, a 1-phenylvinyl-1-yl group, a 2-phenylvinyl-1-yl group, a 2,2-diphenylvinyl-1-yl group, a 2-phenyl-2-(naphthyl-1-yl)vinyl-1-yl group, a 2,2-bis(diphenyl-1-yl)vinyl-1-yl group, a stilbenyl group, a styrenyl group and the like, but are not limited thereto.

In the present specification, the alkynyl group comprises linear or branched having 2 to 60 carbon atoms, and may be further substituted with other substituents. The number of carbon atoms of the alkynyl group may be from 2 to 60, specifically from 2 to 40 and more specifically from 2 to 20.

In the present specification, the cycloalkyl group comprises monocyclic or multicyclic having 3 to 60 carbon atoms, and may be further substituted with other substituents. Herein, the multicyclic means a group in which the cycloalkyl group is directly linked to or fused with other cyclic groups. Herein, the other cyclic groups may be a cycloalkyl group, but may also be different types of cyclic groups such as a heterocycloalkyl group, an aryl group and a heteroaryl group. The number of carbon groups of the cycloalkyl group may be from 3 to 60, specifically from 3 to 40 and more specifically from 5 to 20. Specific examples thereof may comprise a cyclopropyl group, a cyclobutyl group, a cyclopentyl group, a 3-methylcyclopentyl group, a 2,3-dimethylcyclopentyl group, a cyclohexyl group, a 3-methylcyclohexyl group, a 4-methylcyclohexyl group, a 2,3-dimethylcyclohexyl group, a 3,4,5-trimethylcyclohexyl group, a 4-tert-butylcyclohexyl group, a cycloheptyl group, a cyclooctyl group and the like, but are not limited thereto.

In the present specification, the heterocycloalkyl group comprises O, S, Se, N or Si as a heteroatom, comprises monocyclic or multicyclic having 2 to 60 carbon atoms, and may be further substituted with other substituents. Herein, the multicyclic means a group in which the heterocycloalkyl group is directly linked to or fused with other cyclic groups. Herein, the other cyclic groups may be a heterocycloalkyl group, but may also be different types of cyclic groups such as a cycloalkyl group, an aryl group and a heteroaryl group. The number of carbon atoms of the heterocycloalkyl group may be from 2 to 60, specifically from 2 to 40 and more specifically from 3 to 20.

In the present specification, the aryl group comprises monocyclic or multicyclic having 6 to 60 carbon atoms, and may be further substituted with other substituents. Herein, the multicyclic means a group in which the aryl group is directly linked to or fused with other cyclic groups. Herein, the other cyclic groups may be an aryl group, but may also be different types of cyclic groups such as a cycloalkyl group, a heterocycloalkyl group and a heteroaryl group. The aryl group comprises a spiro group. The number of carbon atoms of the aryl group may be from 6 to 60, specifically from 6 to 40 and more specifically from 6 to 25. Specific examples of the aryl group may comprise a phenyl group, a biphenyl group, a triphenyl group, a naphthyl group, an anthryl group, a chrysenyl group, a phenanthrenyl group, a perylenyl group, a fluoranthenyl group, a triphenylenyl group, a phenalenyl group, a pyrenyl group, a tetracenyl group, a pentacenyl group, a fluorenyl group, an indenyl group, an acenaphthylenyl group, a benzofluorenyl group, a spirobifluorenyl group, a 2,3-dihydro-1H-indenyl group, a fused ring thereof, and the like, but are not limited thereto.

In the present specification, the spiro group is a group comprising a spiro structure, and may have 15 to 60 carbon atoms. For example, the spiro group may comprise a structure in which a 2,3-dihydro-1H-indene group or a cyclohexane group spiro bonds to a fluorenyl group. Specifically, the following spiro group may comprise any one of the groups having the following structural formulae.

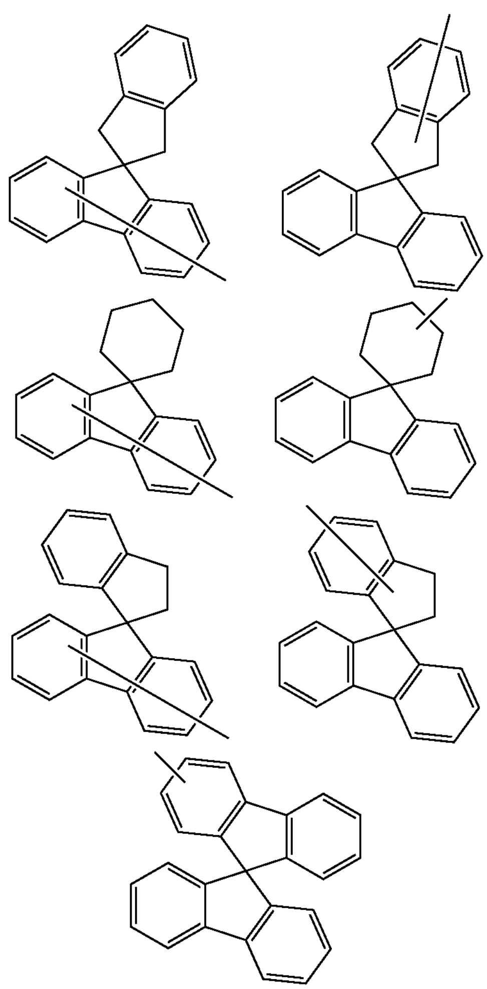

In the present specification, the heteroaryl group comprises O, S, Se, N or Si as a heteroatom, comprises monocyclic or multicyclic having 2 to 60 carbon atoms, and may be further substituted with other substituents. Herein, the multicyclic means a group in which the heteroaryl group is directly linked to or fused with other cyclic groups. Herein, the other cyclic groups may be a heteroaryl group, but may also be different types of cyclic groups such as a cycloalkyl group, a heterocycloalkyl group and an aryl group. The number of carbon atoms of the heteroaryl group may be from 2 to 60, specifically from 2 to 40 and more specifically from 3 to 25. Specific examples of the heteroaryl group may comprise a pyridyl group, a pyrrolyl group, a pyrimidyl group, a pyridazinyl group, a furanyl group, a thiophene group, an imidazolyl group, a pyrazolyl group, an oxazolyl group, an isoxazolyl group, a thiazolyl group, an isothiazolyl group, a triazolyl group, a furazanyl group, an oxadiazolyl group, a thiadiazolyl group, a dithiazolyl group, a tetrazolyl group, a pyranyl group, a thiopyranyl group, a diazinyl group, an oxazinyl group, a thiazinyl group, a dioxynyl group, a triazinyl group, a tetrazinyl group, a quinolyl group, an isoquinolyl group, a quinazolinyl group, an isoquinazolinyl group, a qninozolinyl group, a naphthyridyl group, an acridinyl group, a phenanthridinyl group, an imidazopyridinyl group, a diazanaphthalenyl group, a triazaindene group, an indolyl group, an indolizinyl group, a benzothiazolyl group, a benzoxazolyl group, a benzimidazolyl group, a benzothiophene group, a benzofuran group, a dibenzothiophene group, a dibenzofuran group, a carbazolyl group, a benzocarbazolyl group, a dibenzocarbazolyl group, a phenazinyl group, a dibenzosilole group, spirobi(dibenzosilole), a dihydrophenazinyl group, a phenoxazinyl group, a phenanthridyl group, an imidazopyridinyl group, a thienyl group, an indolo[2,3-a]carbazolyl group, an indolo[2,3-b]carbazolyl group, an indolinyl group, a 10,111-dihydro-dibenzo[b,f]azepine group, a 9,10-dihydroacridinyl group, a phenanthrazinyl group, a phenothiazinyl group, a phthalazinyl group, a naphthyridinyl group, a phenanthrolinyl group, a benzo[c][1,2,5]thiadiadiazolyl group, a 5,10-dihydrobenzo[b,e][1,4]azasilinyl group, a pyrazolo[1,5-c]quinazolinyl group, a pyrido[1,2-b]indazolyl group, a pyrido[1,2-a]imidazo[1,2-e]indolinyl group, a 5,11-dihydroindeno[1,2-b]carbazolyl group and the like, but are not limited thereto.

In the present specification, the amine group may be selected from the group consisting of a monoalkylamine group; a monoarylamine group; a monoheteroarylamine group; —$NH_2$; a dialkylamine group; a diarylamine group; a diheteroarylamine group; an alkylarylamine group; an alkylheteroarylamine group; and an arylheteroarylamine group, and although not particularly limited thereto, the number of carbon atoms is preferably from 1 to 30. Specific examples of the amine group may comprise a methylamine group, a dimethylamine group, an ethylamine group, a diethylamine group, a phenylamine group, a naphthylamine group, a biphenylamine group, a dibiphenylamine group, an anthracenylamine group, a 9-methyl-anthracenylamine group, a diphenylamine group, a phenylnaphthylamine group, a ditolylamine group, a phenyltolylamine group, a triphenylamine group, a biphenylnaphthylamine group, a phenylbiphenylamine group, a biphenylfluorenylamine group, a phenyltriphenylenylamine group, a biphenyltriphenylenylamine group and the like, but are not limited thereto.

In the present specification, the arylene group means the aryl group having two bonding sites, that is, a divalent group. Descriptions on the aryl group provided above may be applied thereto except for each being a divalent. In addition, the heteroarylene group means the heteroaryl group having two bonding sites, that is, a divalent group. Descriptions on the heteroaryl group provided above may be applied thereto except for each being a divalent.

According to one embodiment of the present application, Chemical Formula 1 may be represented by any one of the following compounds, but is not limited thereto.

1-1
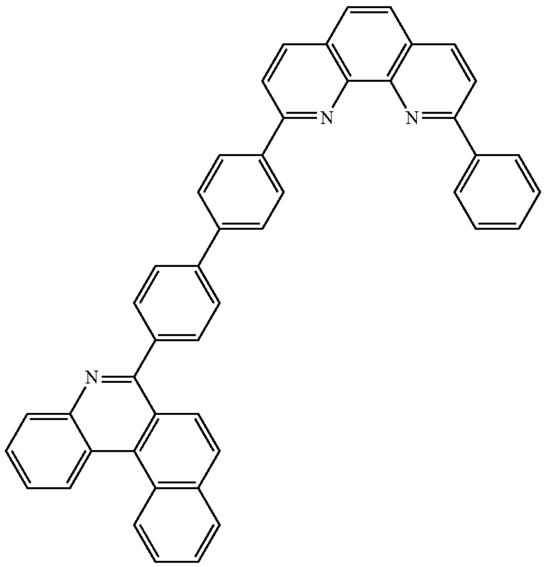
1-2
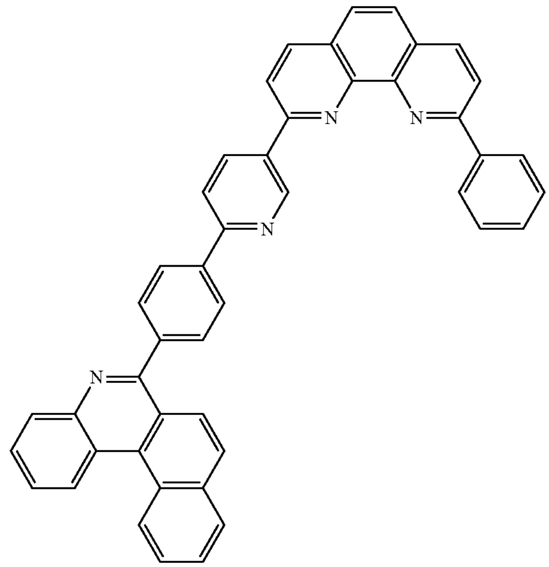
1-3
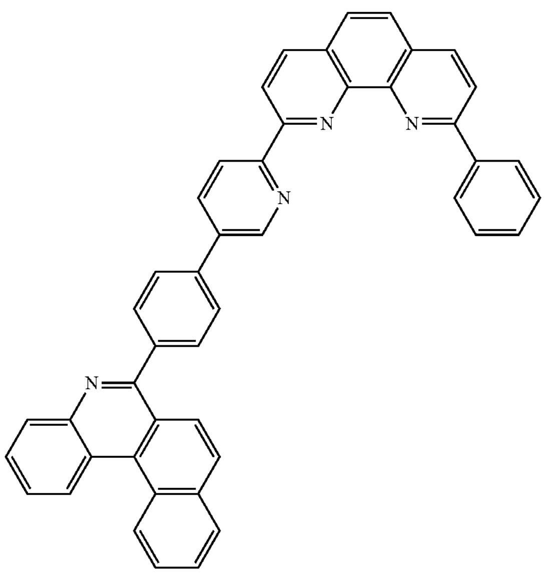
1-4
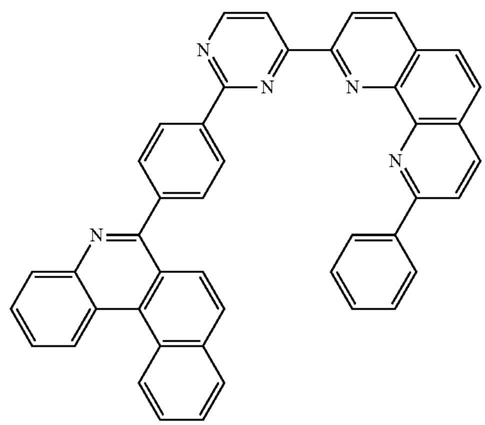
1-5
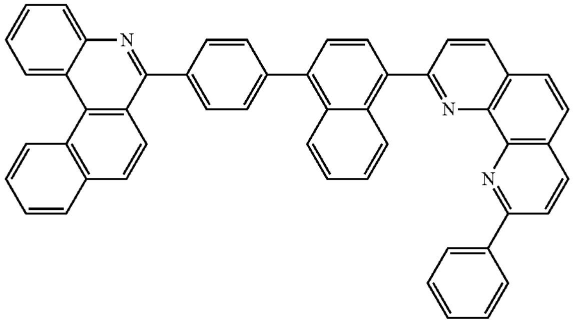
1-6
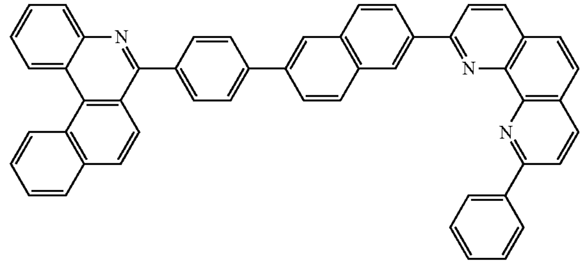

-continued
1-7
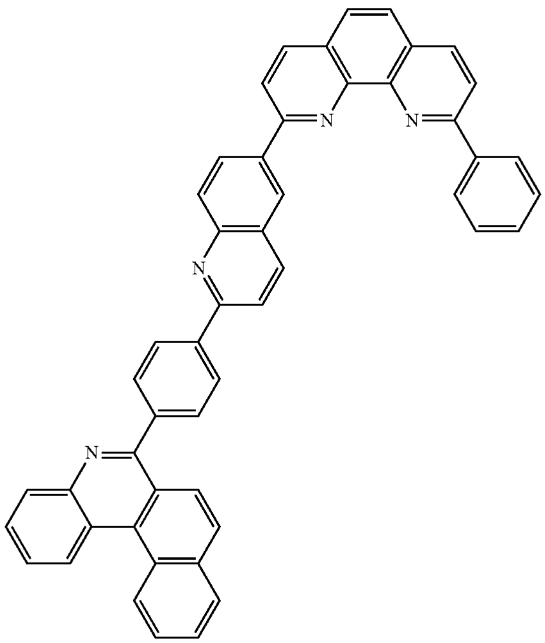
1-8
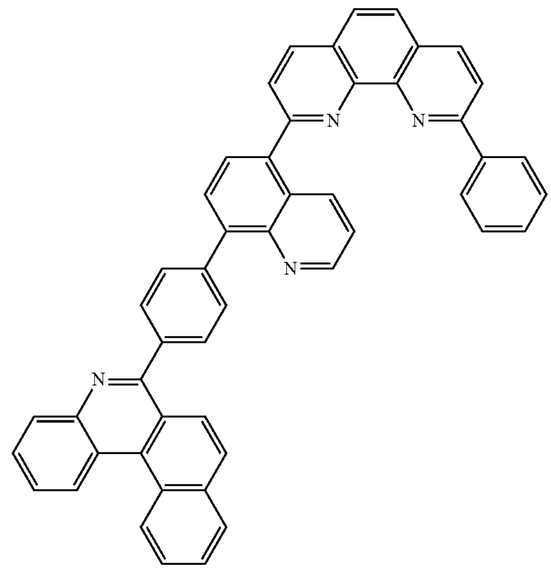
1-9
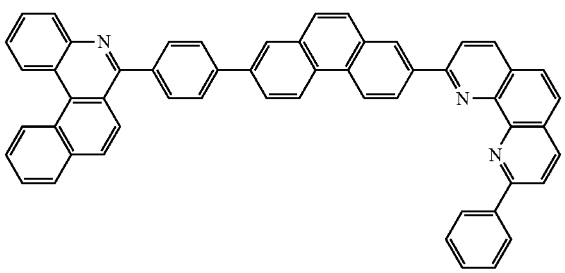
1-10
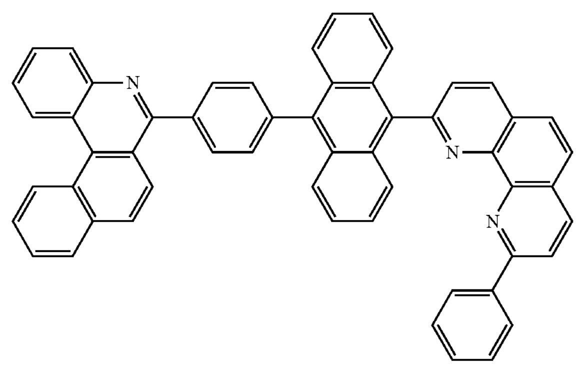
1-11
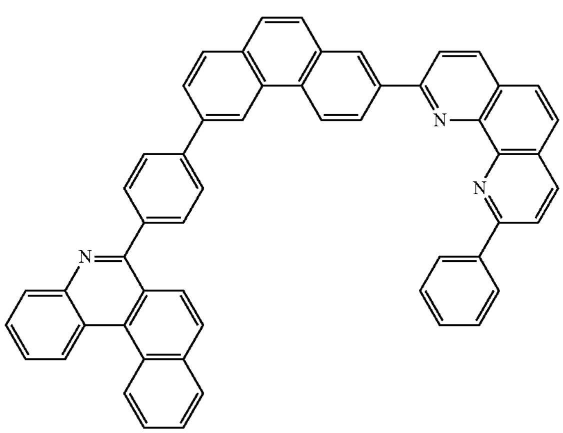
1-12
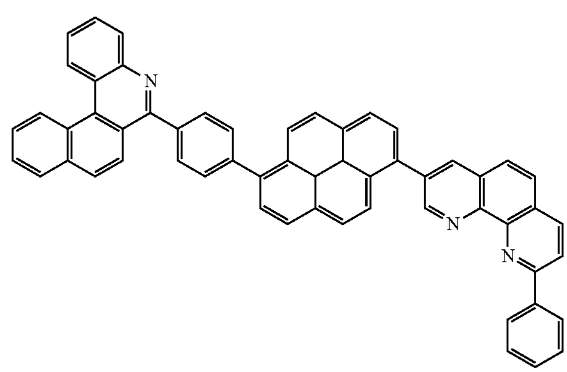

-continued
1-13
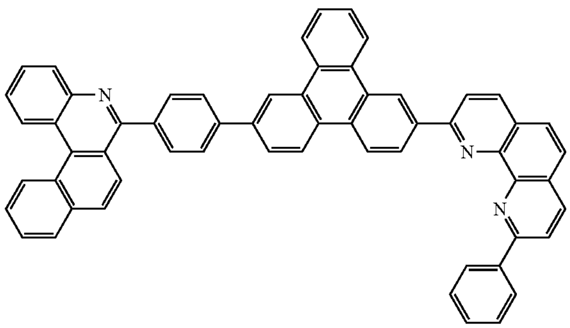
1-14
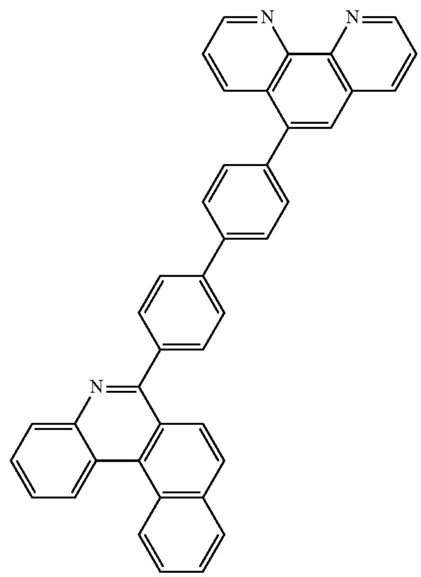
1-15
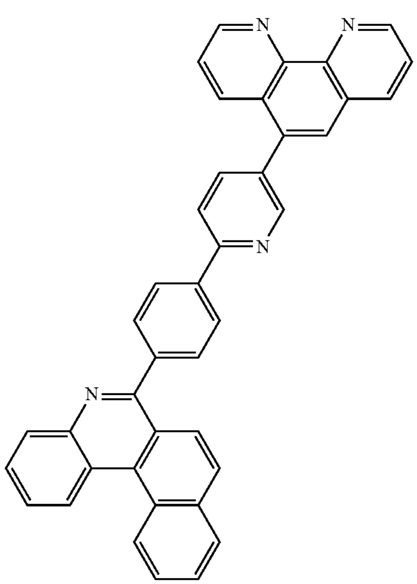
1-16
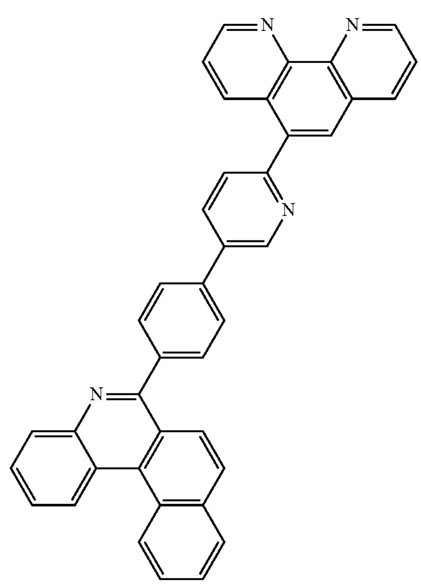

-continued
1-17
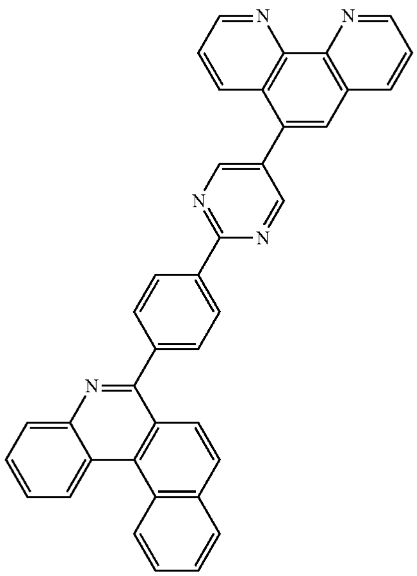
1-18
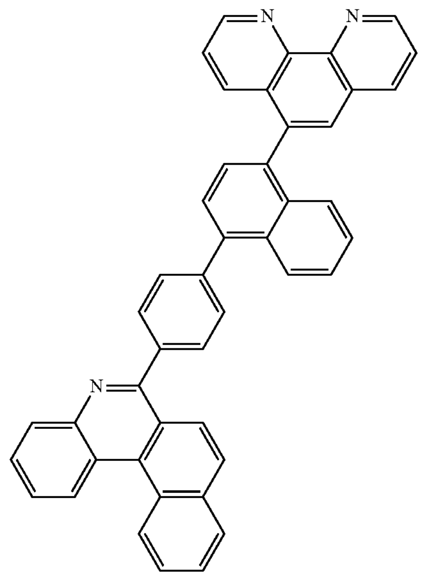
1-19
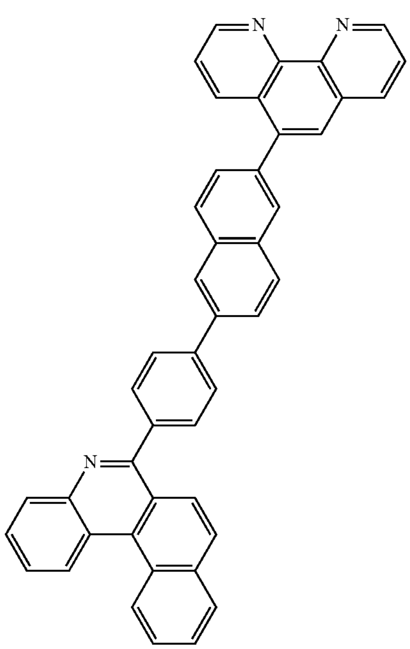
1-20
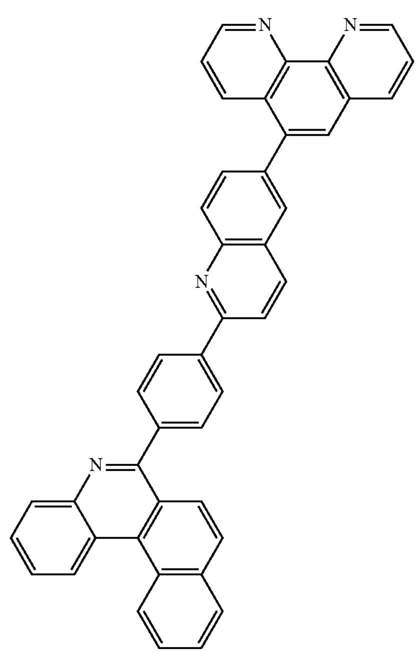

-continued
1-21
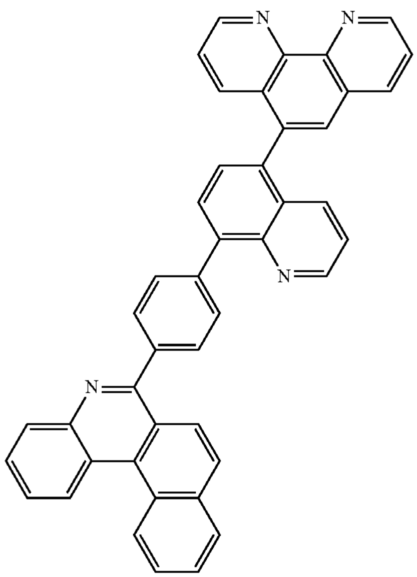
1-22
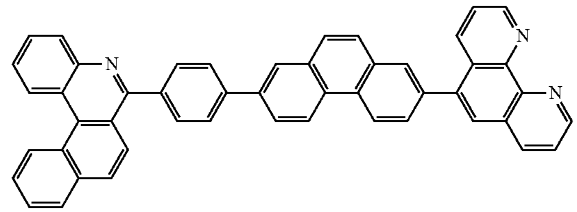
1-23
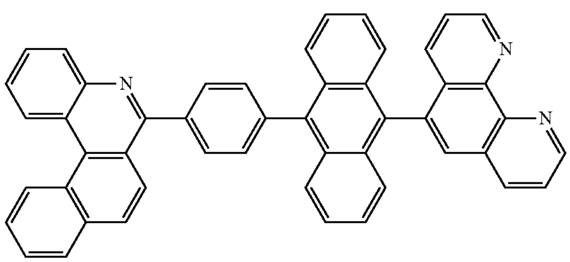
1-24
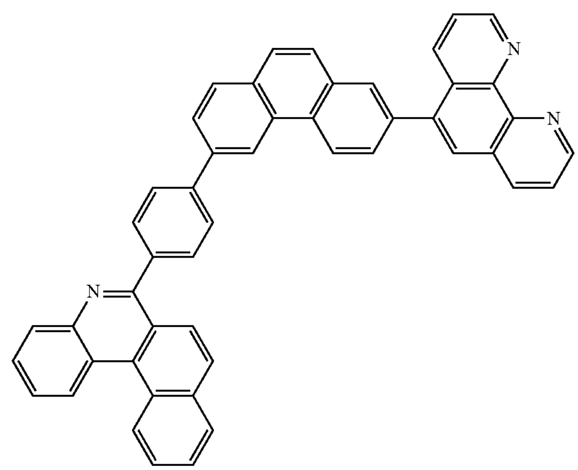
1-25
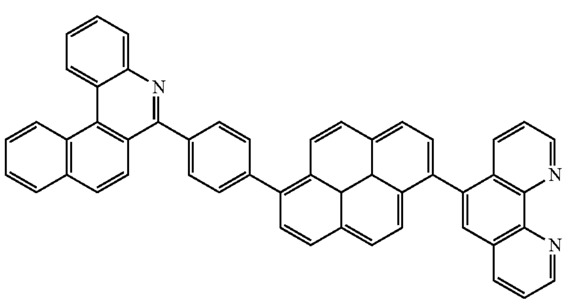
1-26
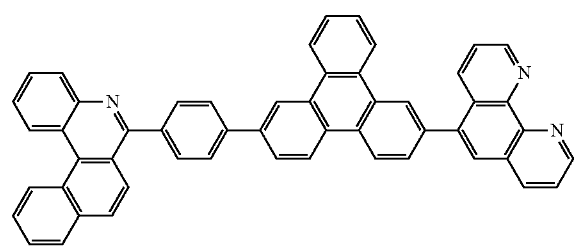

-continued
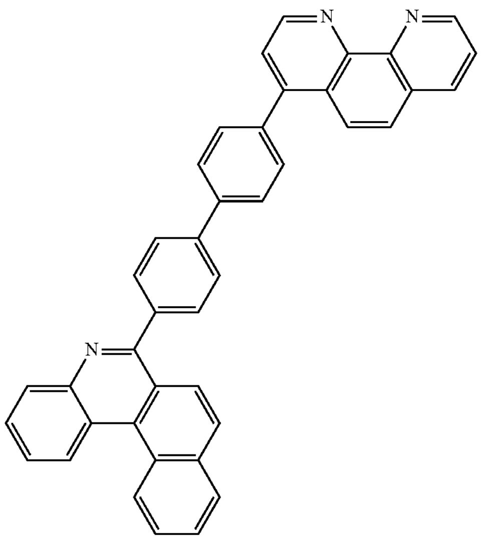
1-27
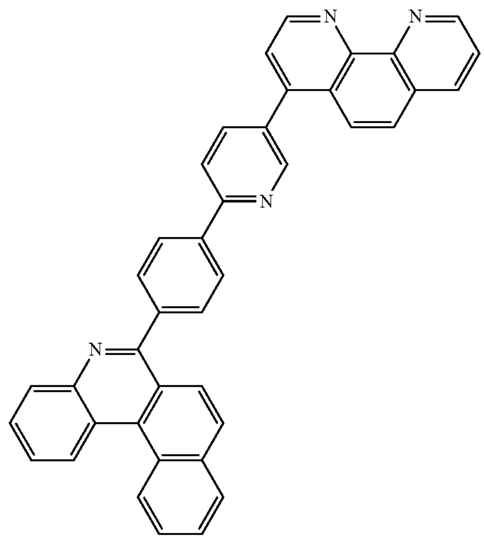
1-28
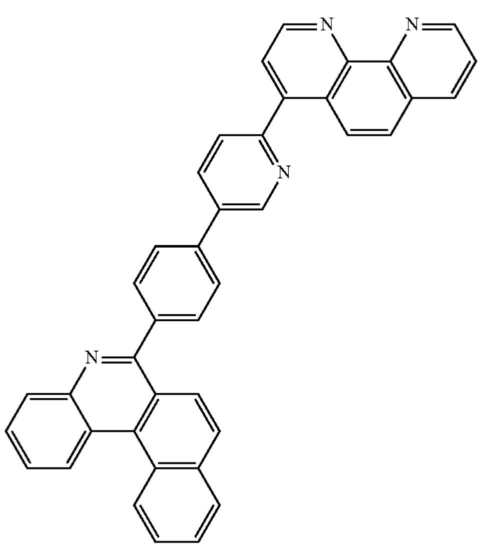
1-29
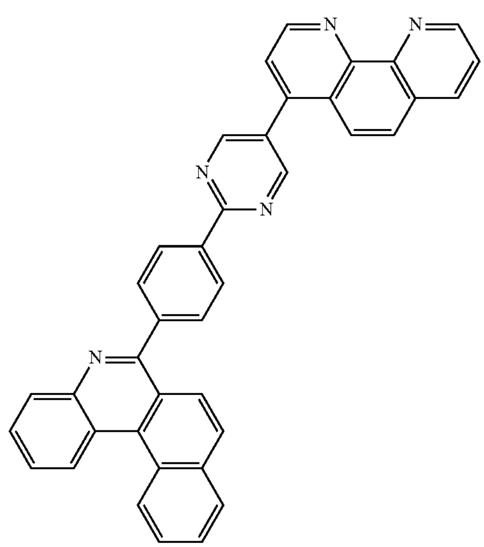
1-30

-continued
1-31
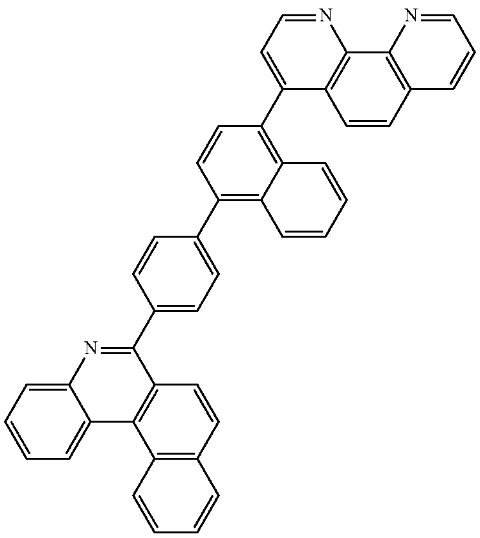
1-32
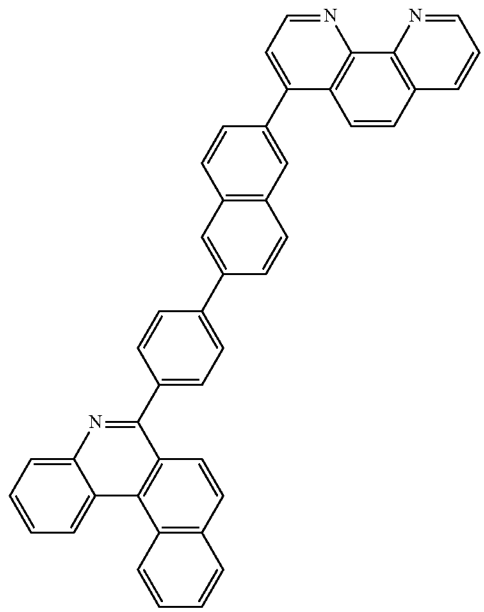
1-33
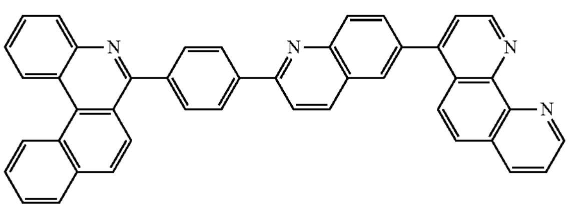
1-34
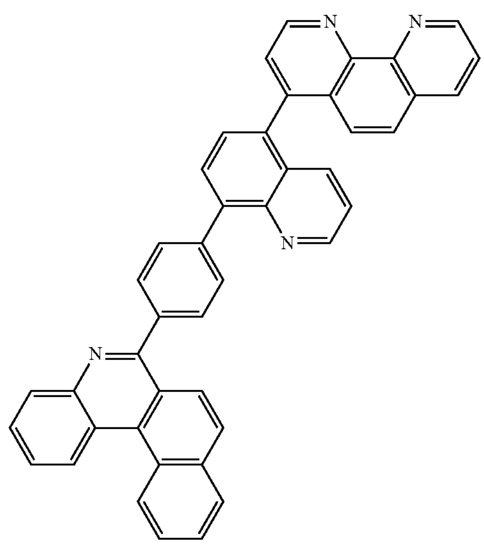
1-35
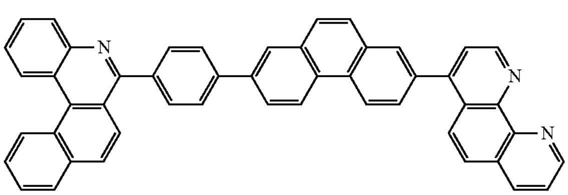
1-36
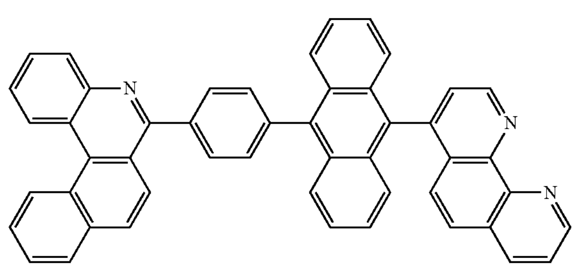

-continued
1-37
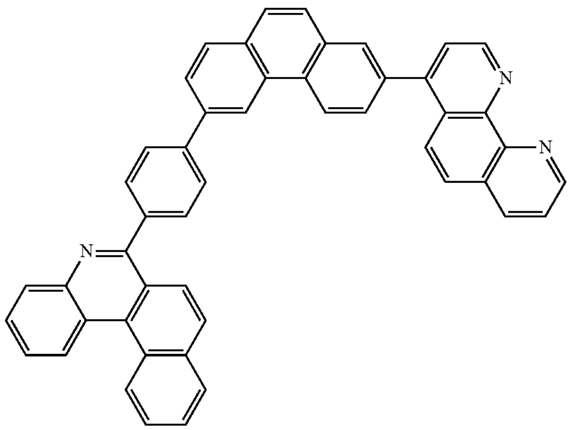
1-38
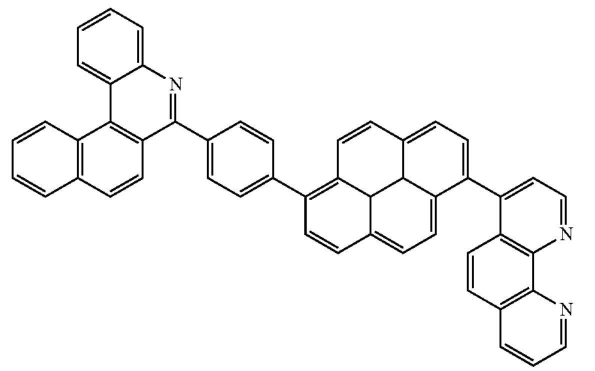
1-39
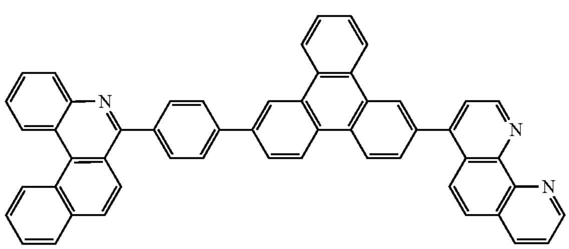
2-1
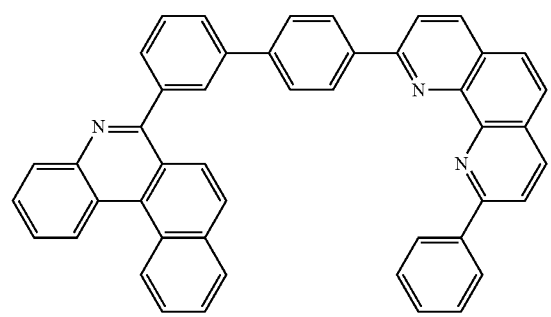
2-2
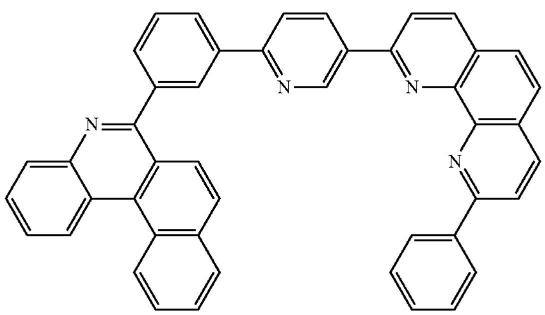
2-3
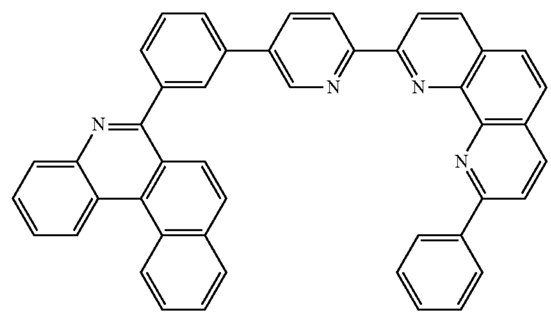
2-4
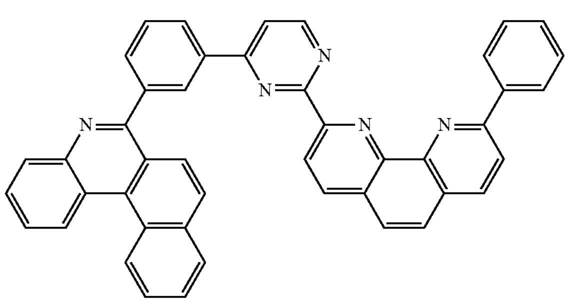
2-5
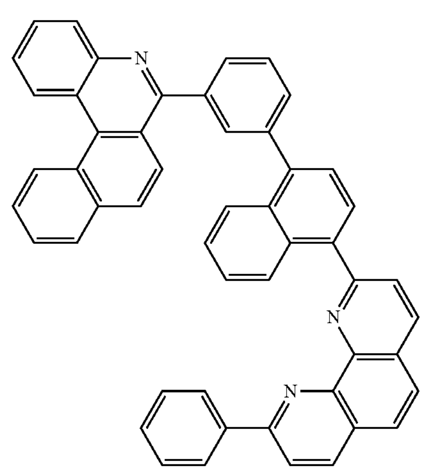

-continued
2-6
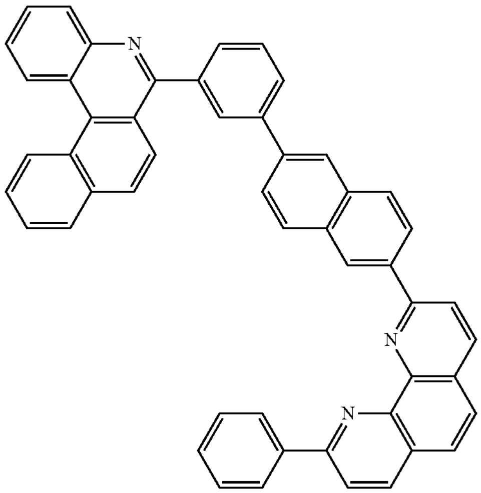
2-7
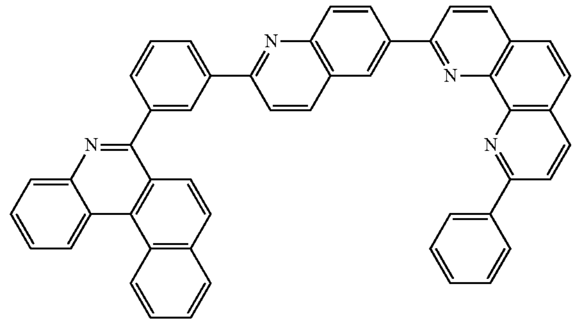
2-8
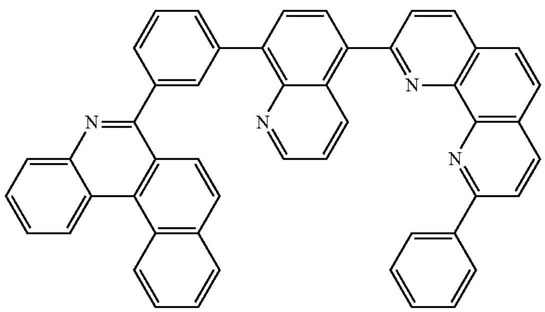
2-9
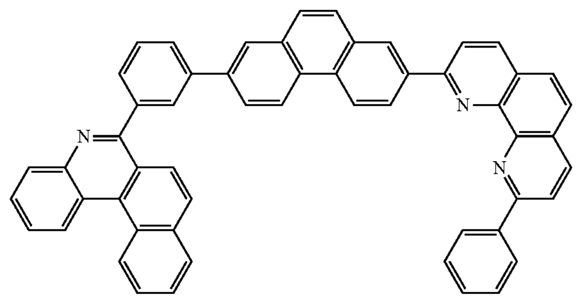
2-10
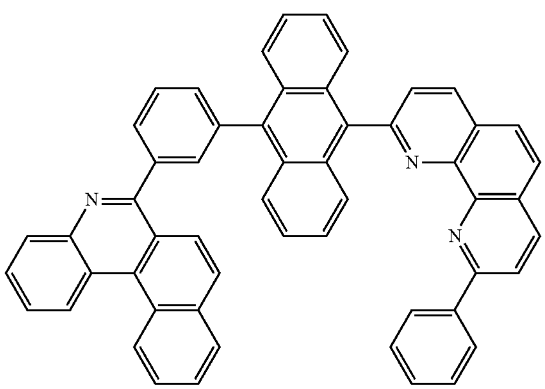
2-11
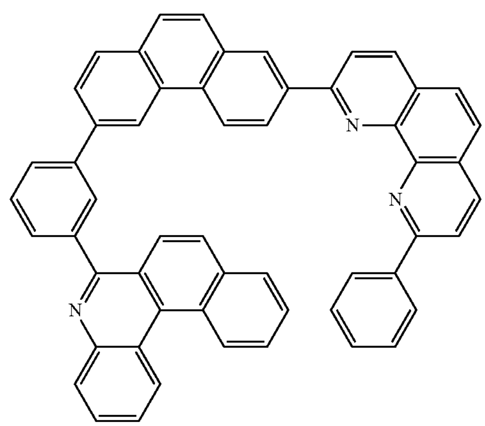
2-12
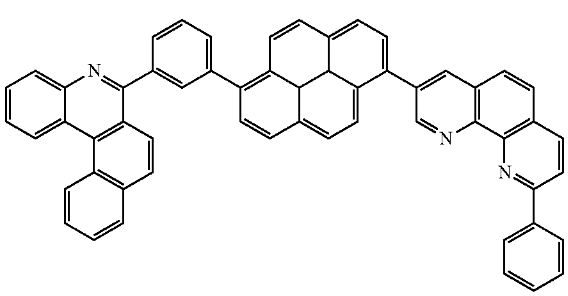
2-13
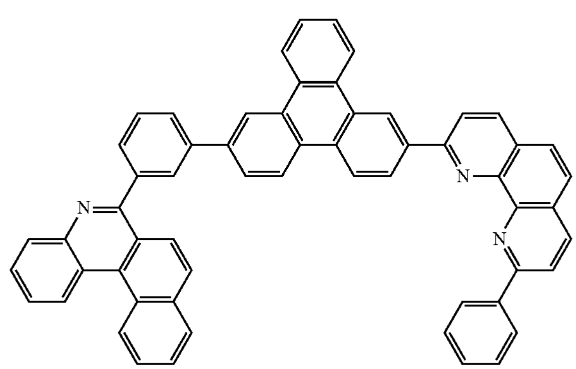

-continued
2-14
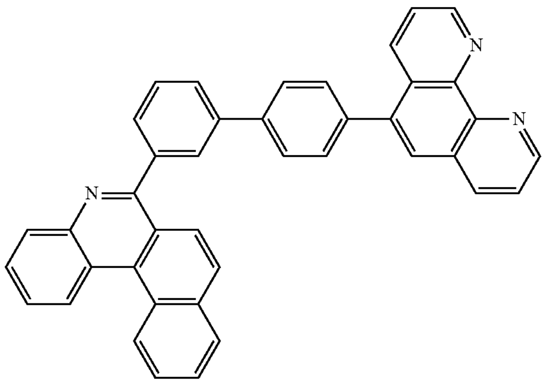
2-15
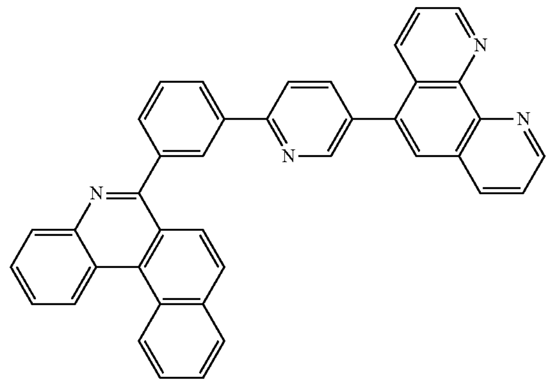
2-16
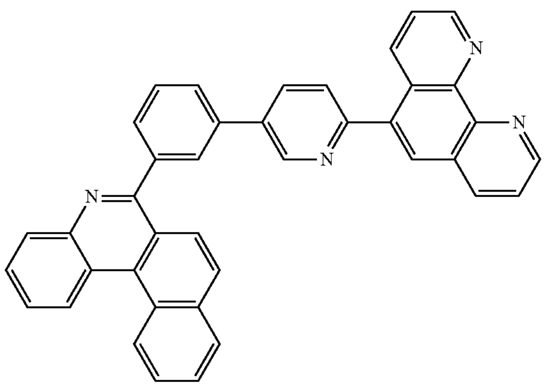
2-17
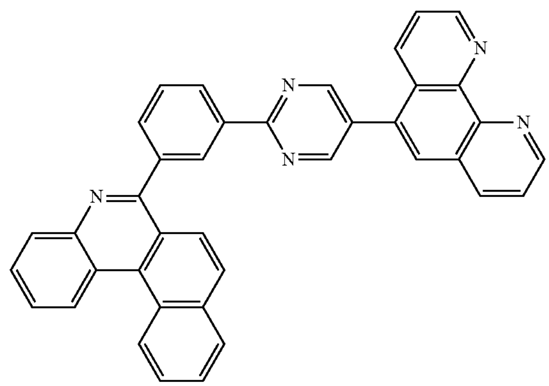
2-18
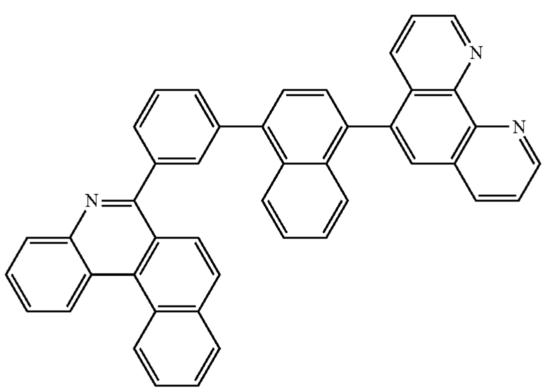
2-19
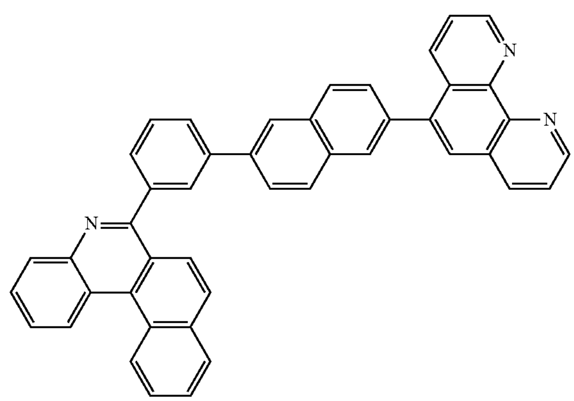
2-20
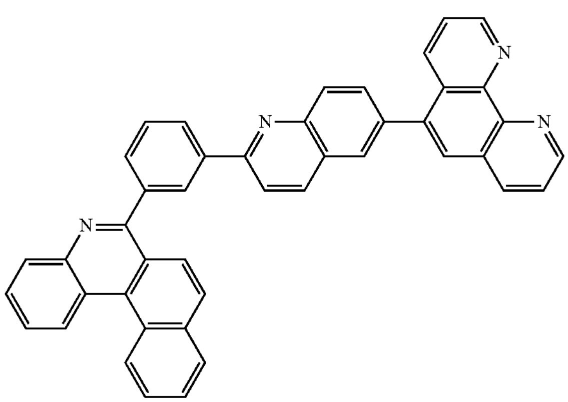
2-21
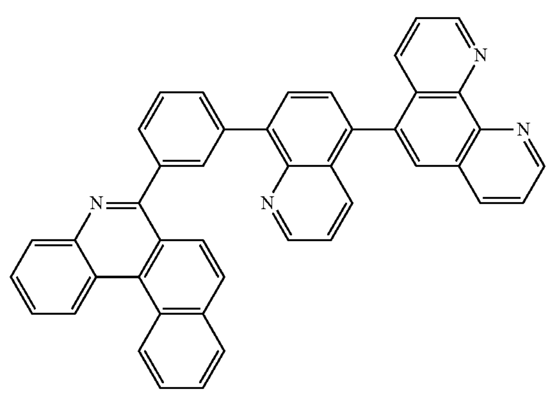

-continued
2-22
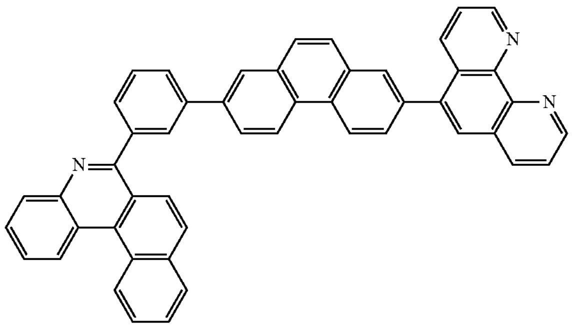
2-23
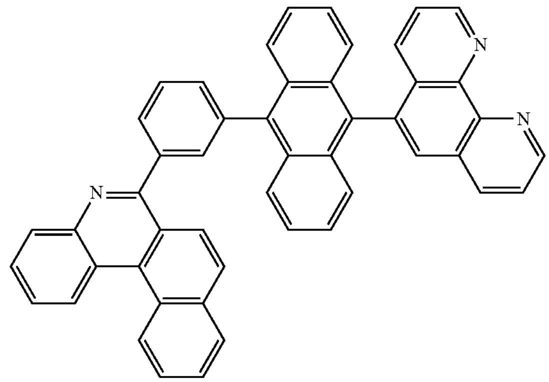
2-24
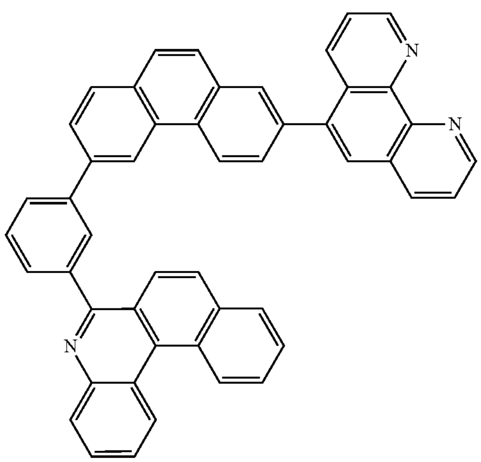
2-25
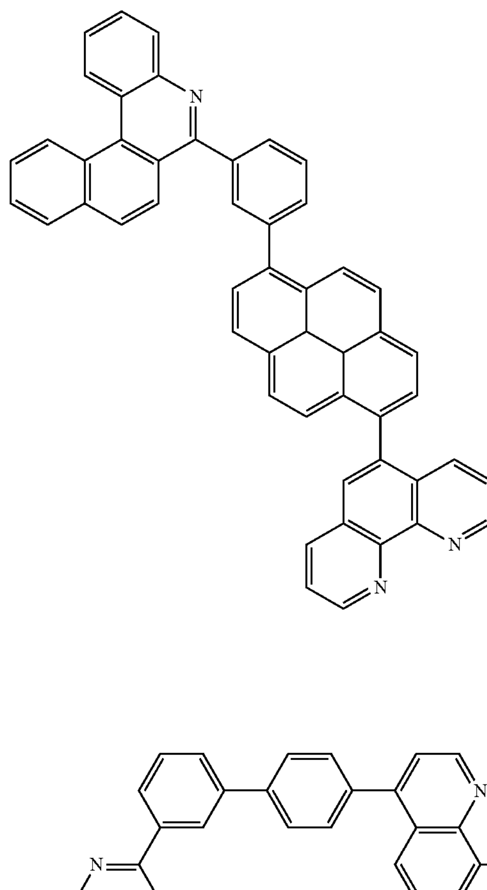
2-26
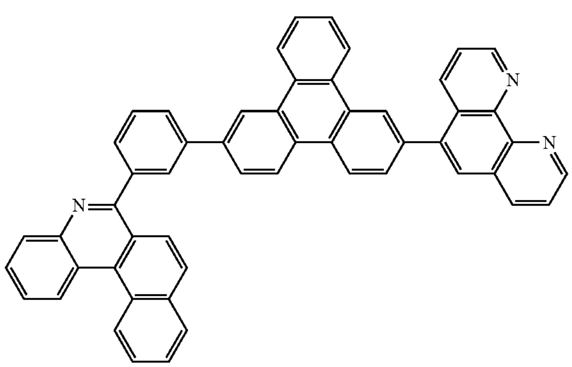
2-27
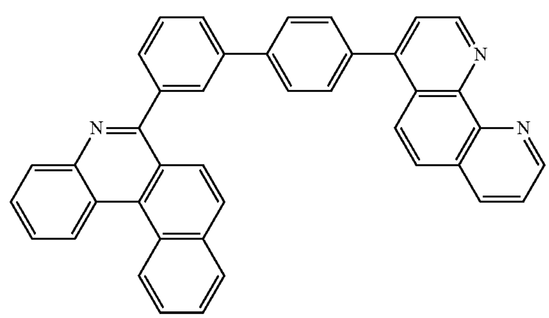

-continued
2-28
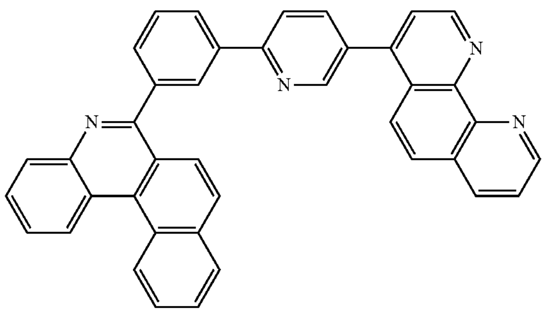
2-29
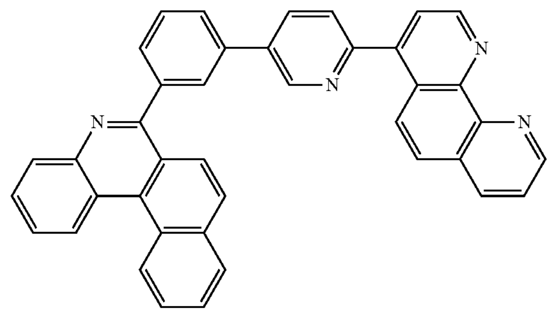
2-30
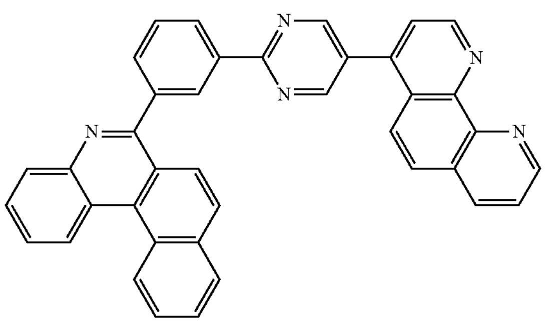
2-31
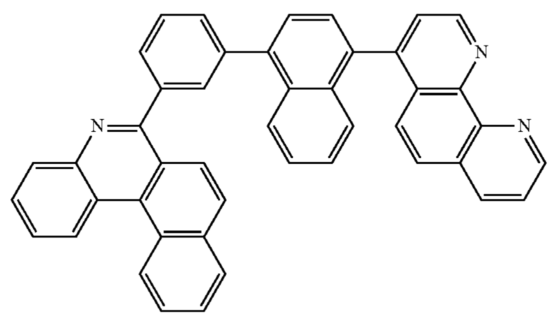
2-32
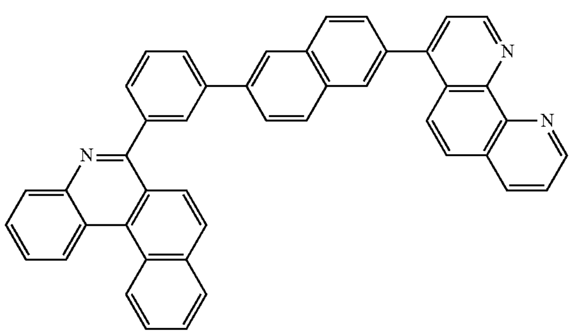
2-33
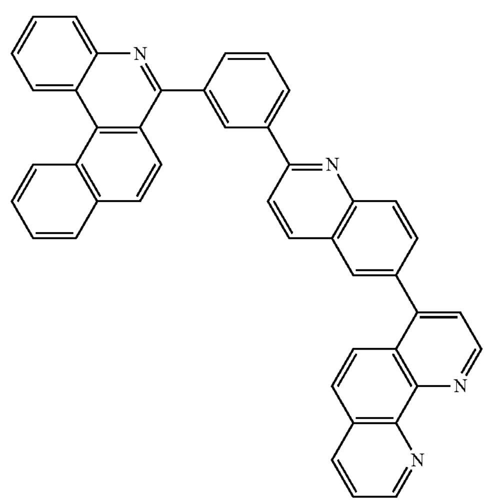
2-34
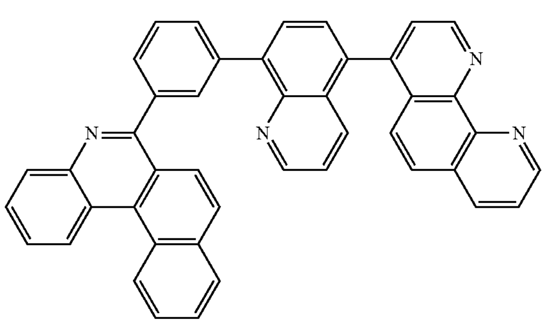
2-35
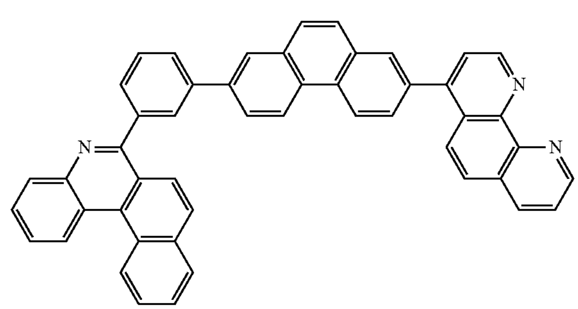

-continued
2-36
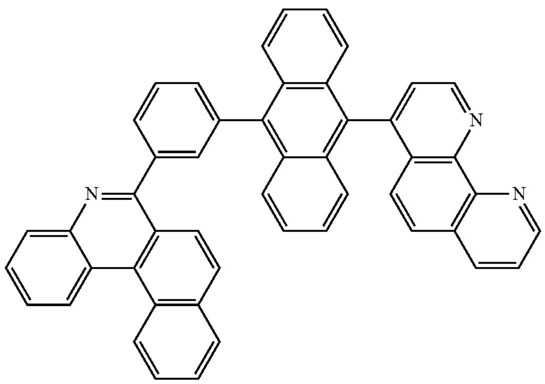
2-37
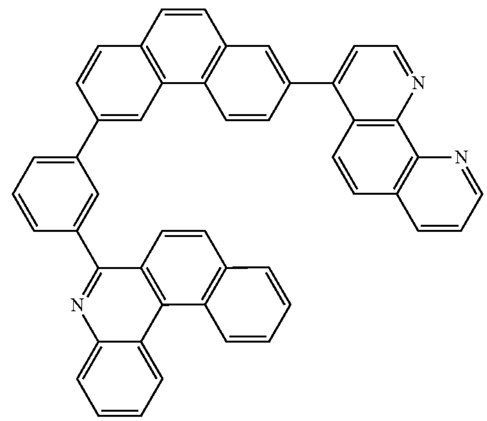
2-38
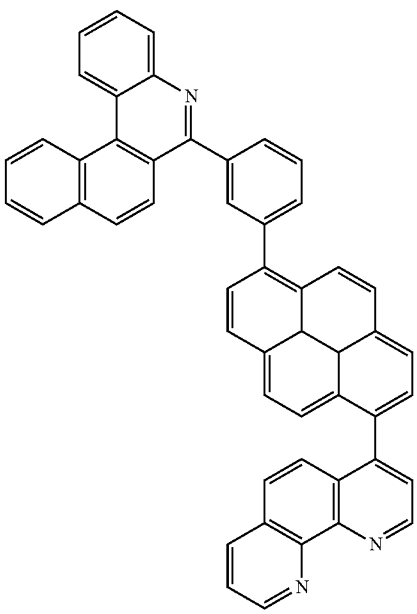
2-39
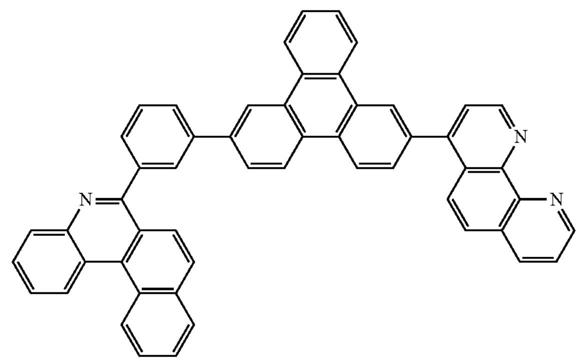
3-1
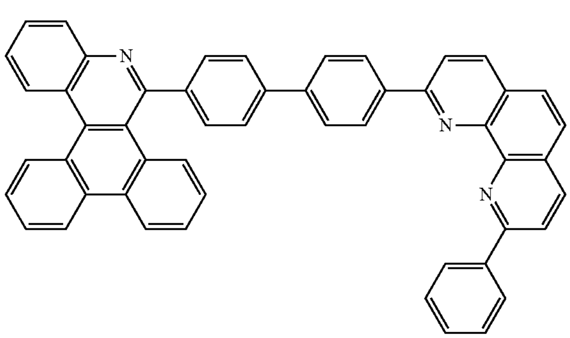
3-2
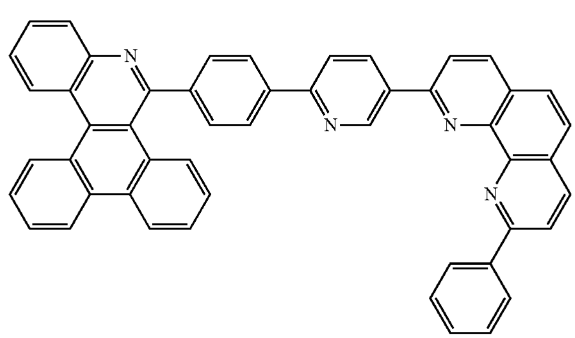

-continued
3-3
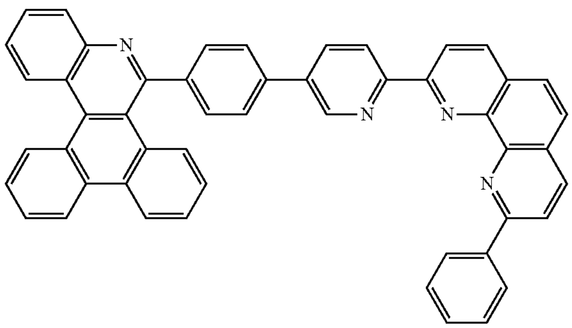
3-4
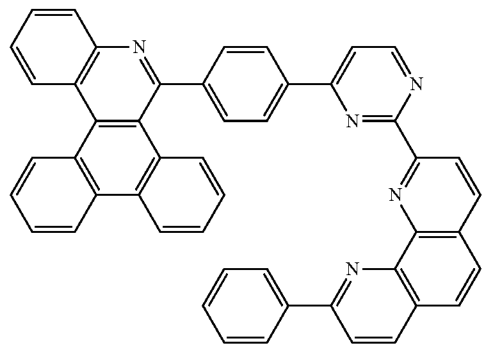
3-5
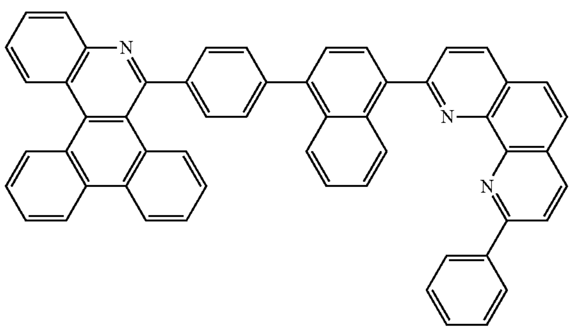
3-6
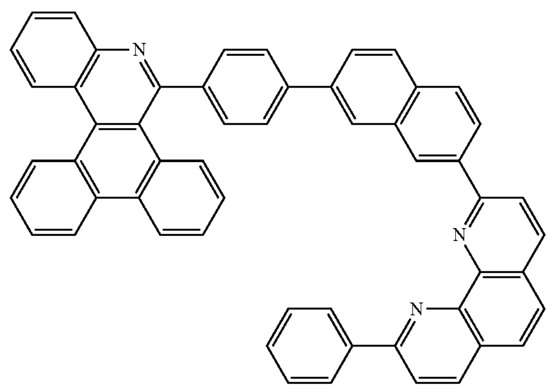
3-7
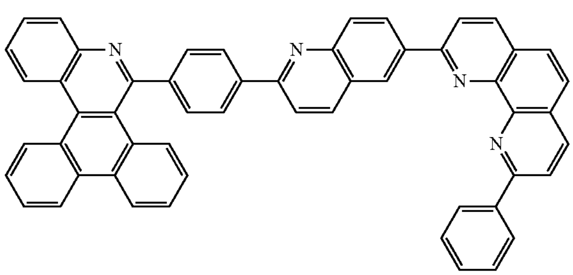
3-8
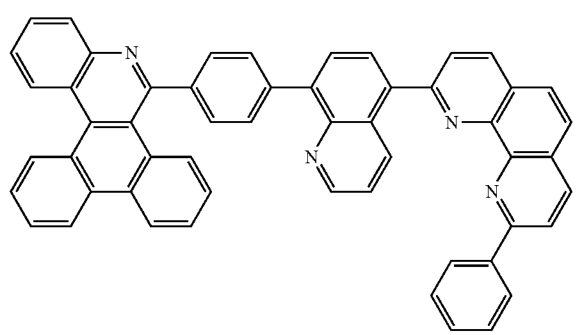
3-9
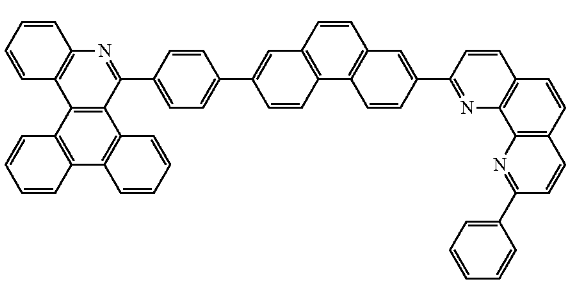
3-10
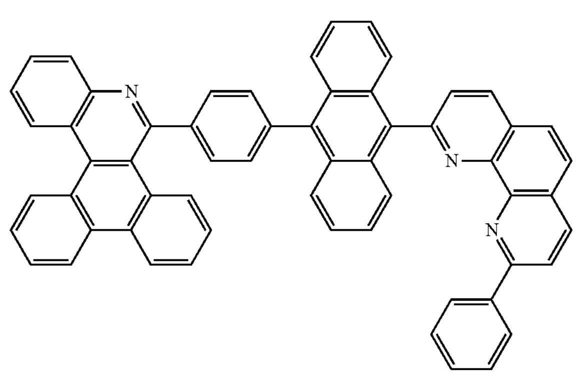

-continued
3-11
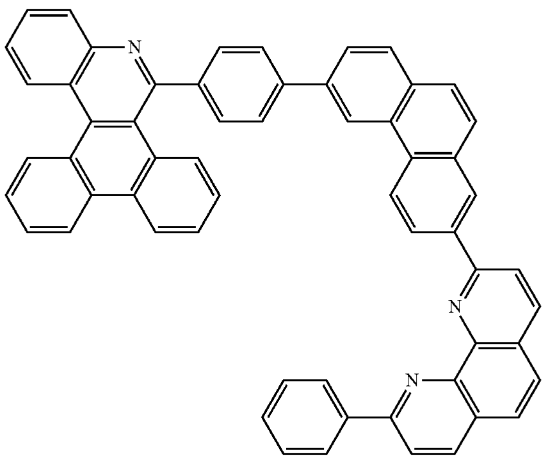
3-12
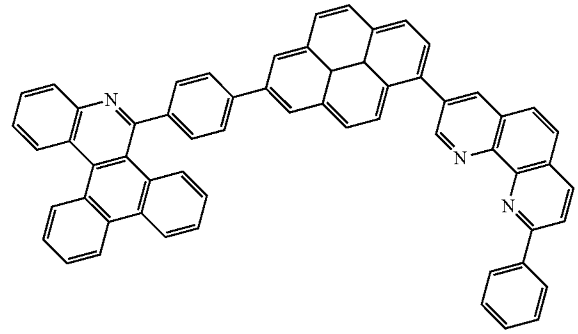
3-13
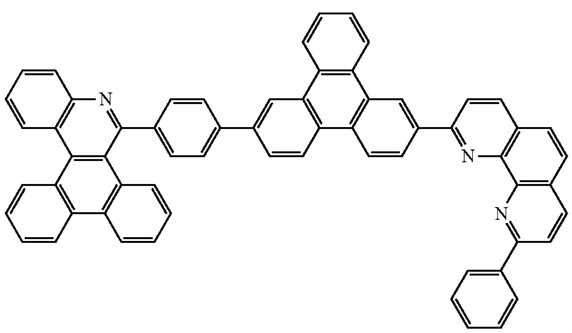
3-14
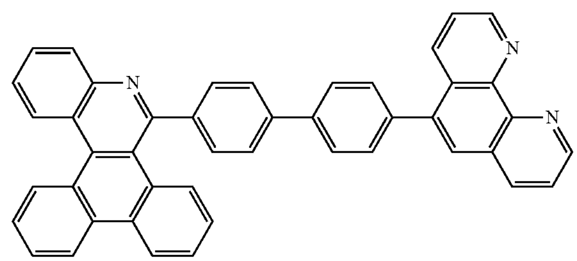
3-15
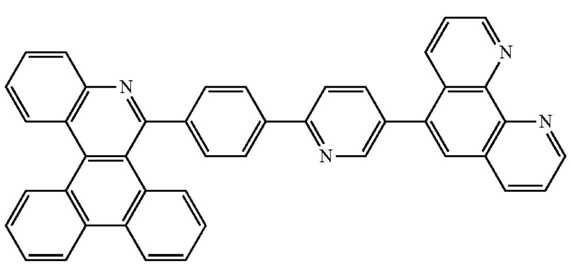
3-16
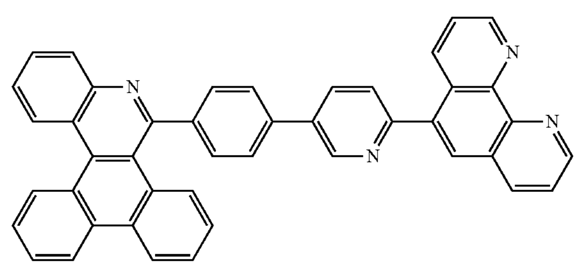
3-17
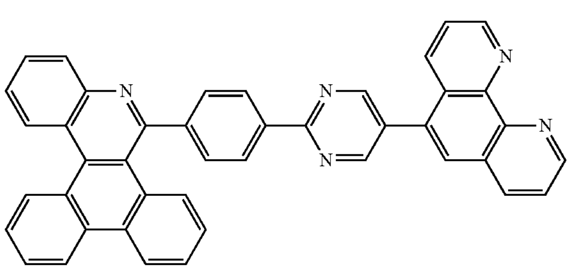
3-18
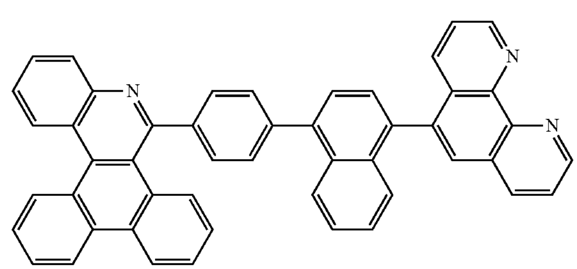

-continued
3-19
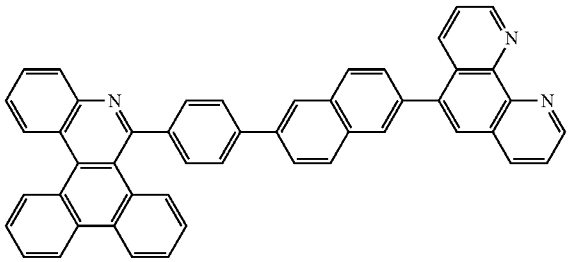
3-20
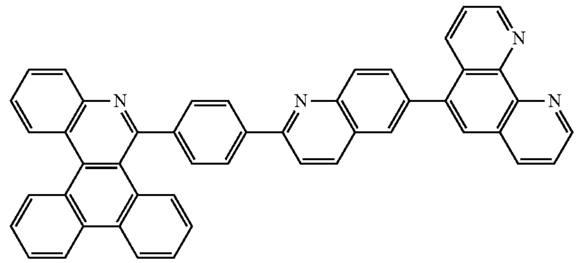
3-21
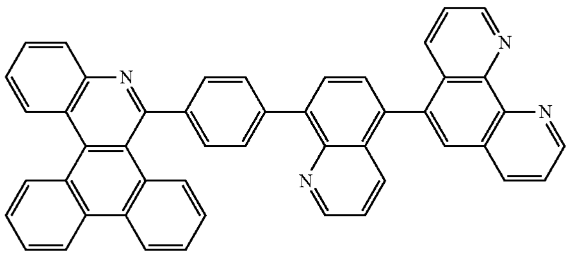
3-22
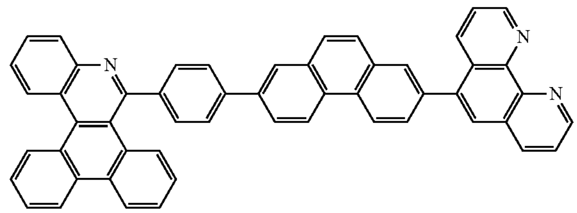
3-23
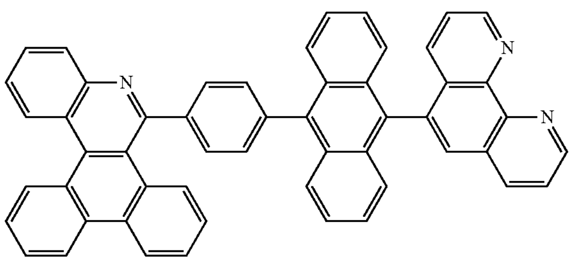
3-24
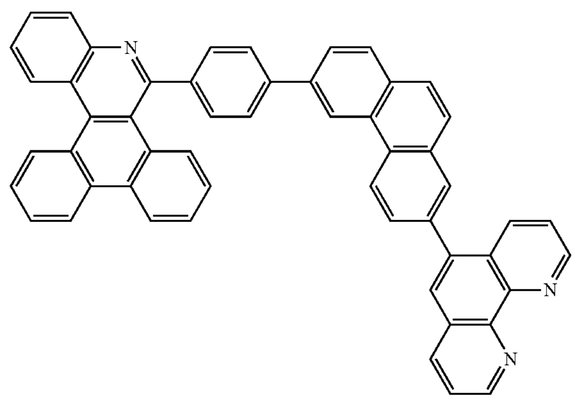
3-25
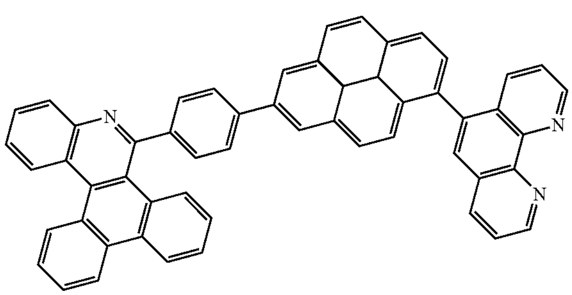
3-26
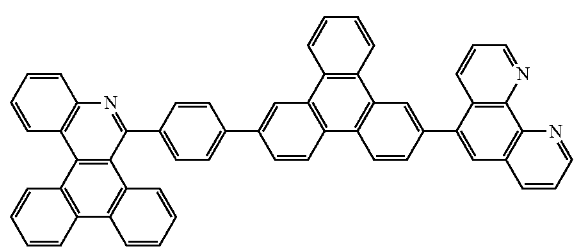
3-27
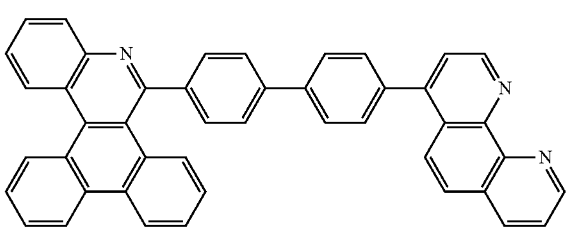
3-28
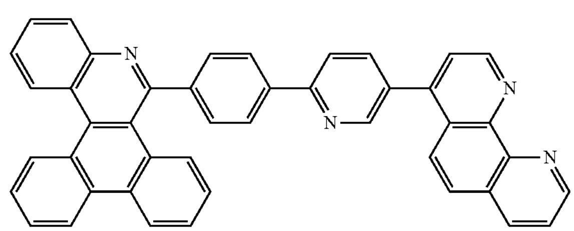

-continued
3-29
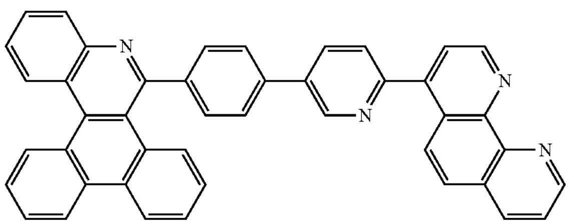
3-30
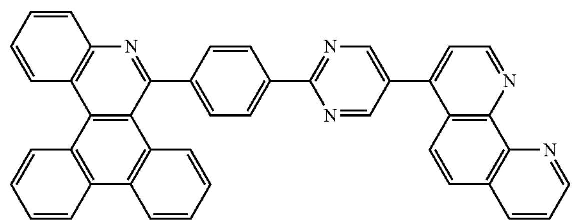
3-31
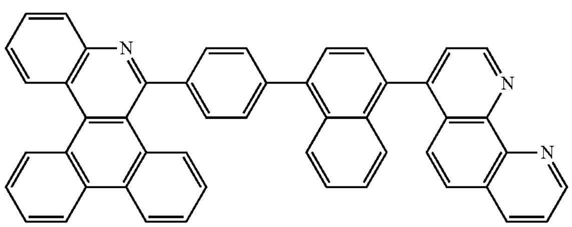
3-32
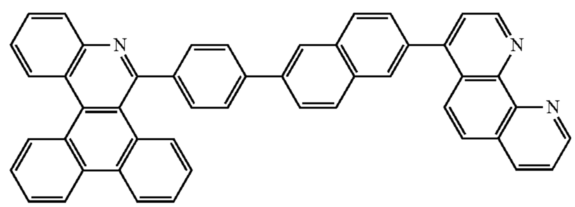
3-33
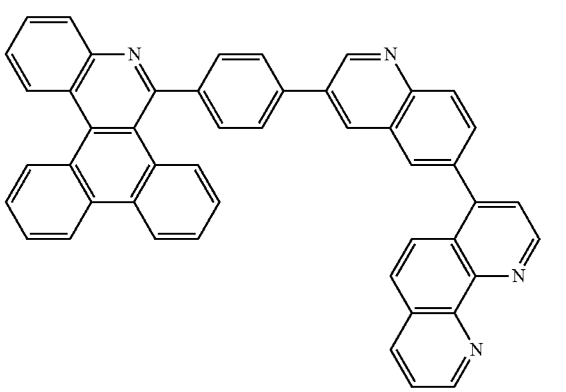
3-34
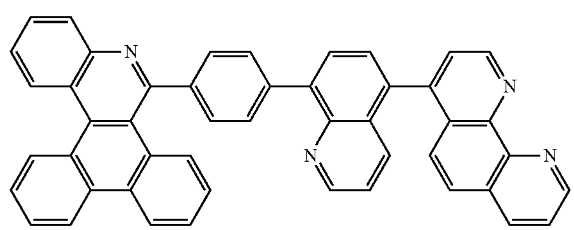
3-35
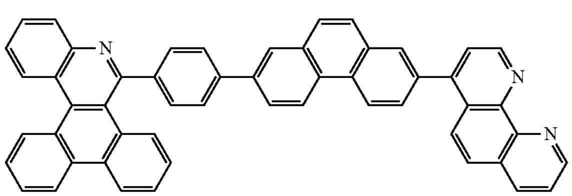
3-36
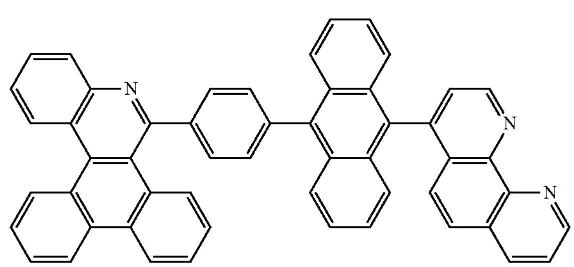
3-37
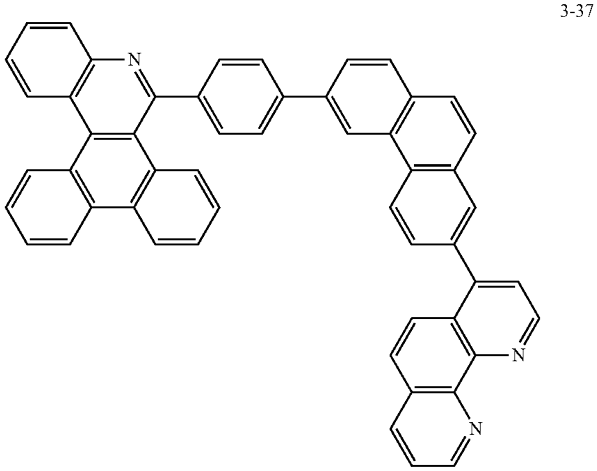
3-38
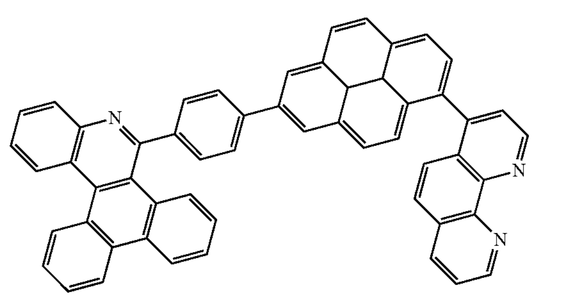

-continued
3-39
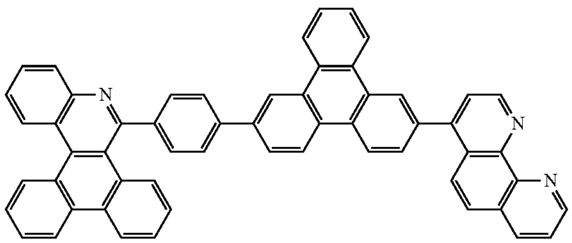
4-1
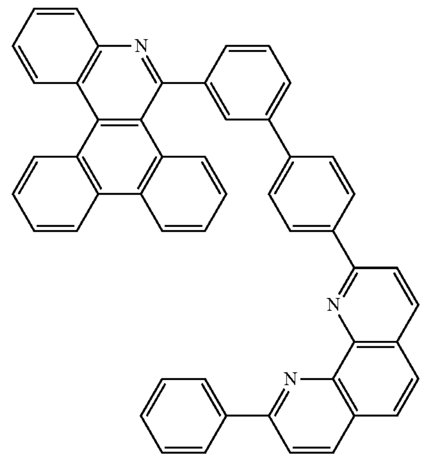
4-2
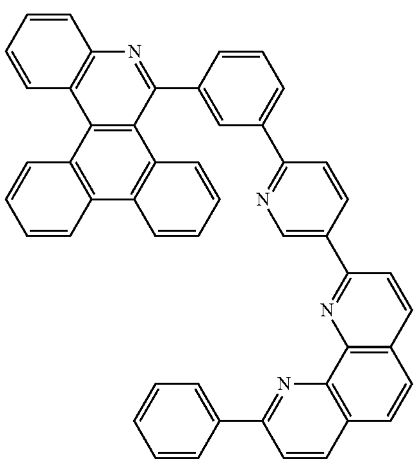
4-3
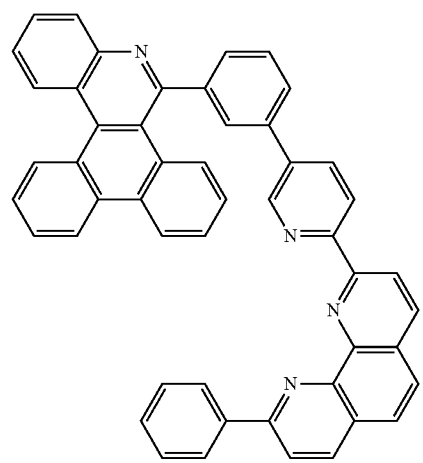
4-4
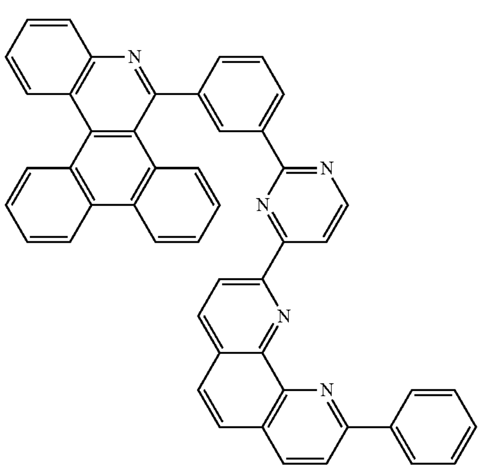
4-5
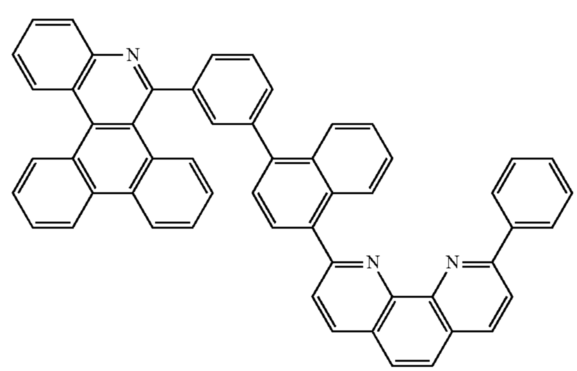

-continued
4-6
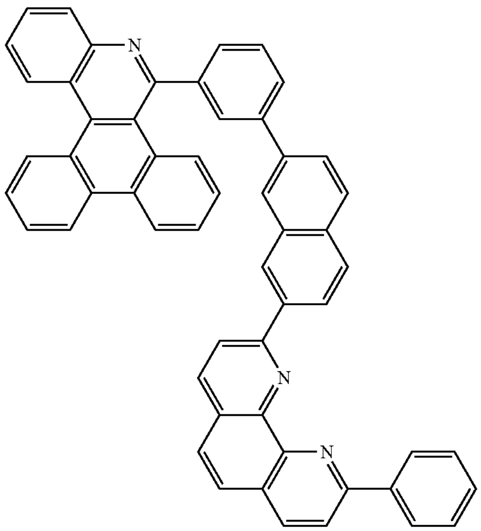
4-7
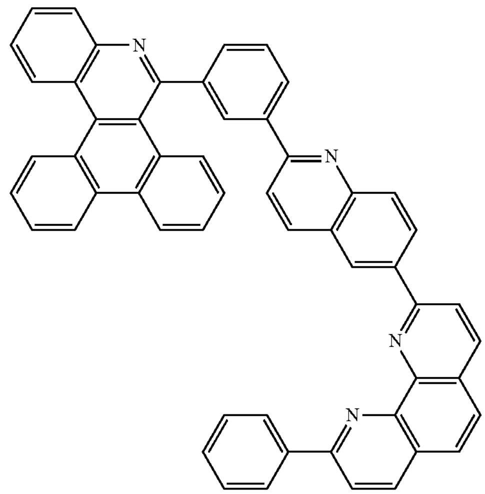
4-8
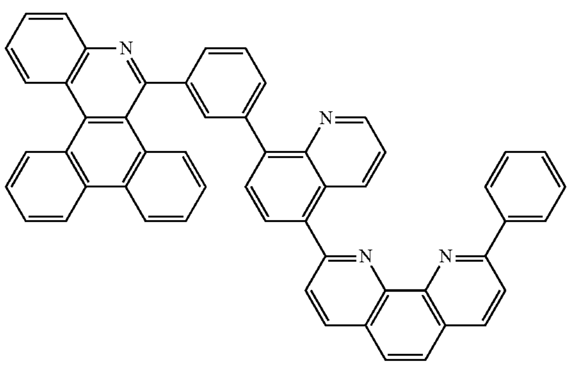
4-9
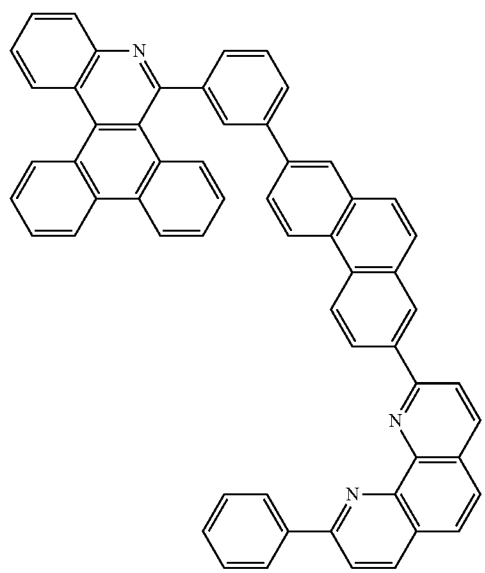
4-10
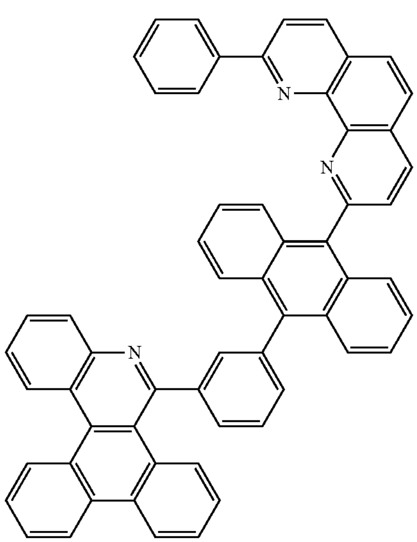
4-11
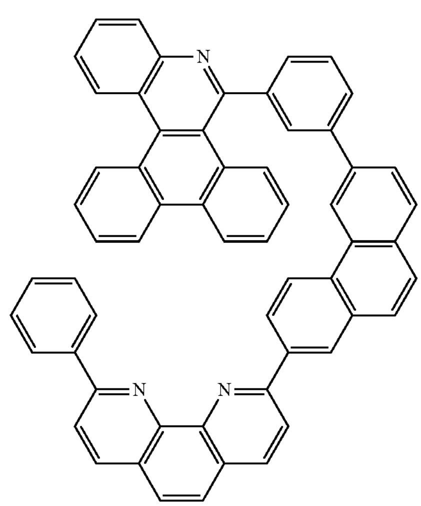

-continued
4-12
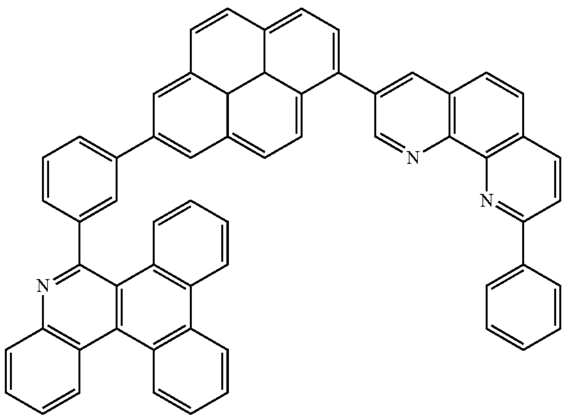
4-13
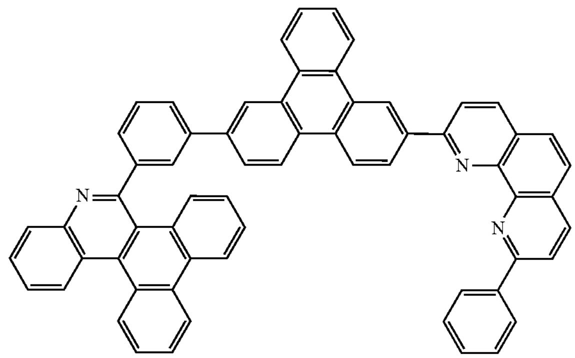
4-14
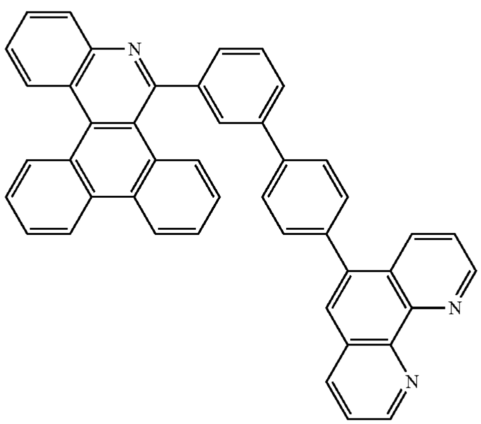
4-15
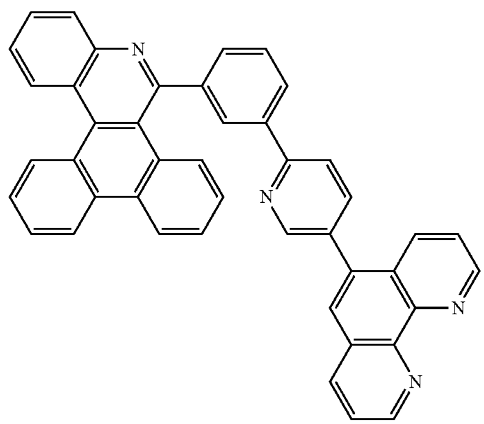
4-16
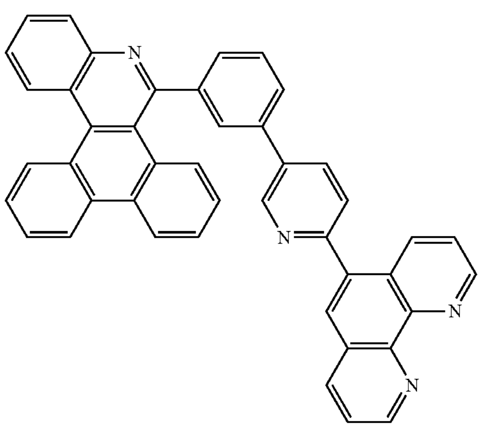
4-17
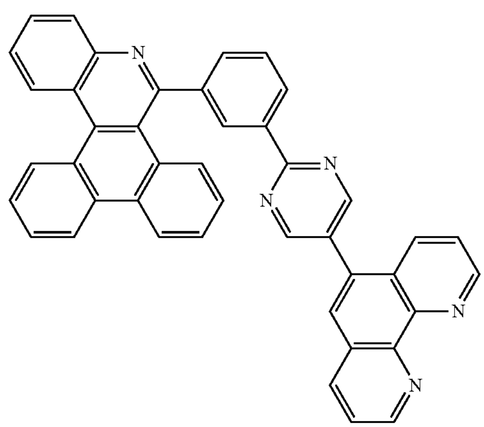

-continued
4-18
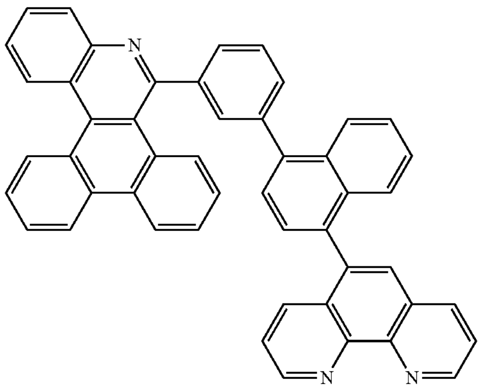
4-19
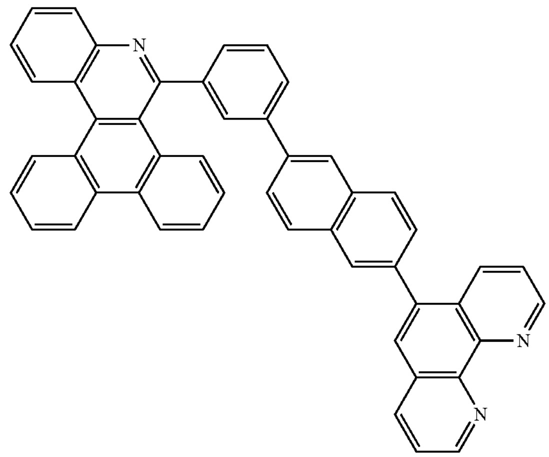
4-20
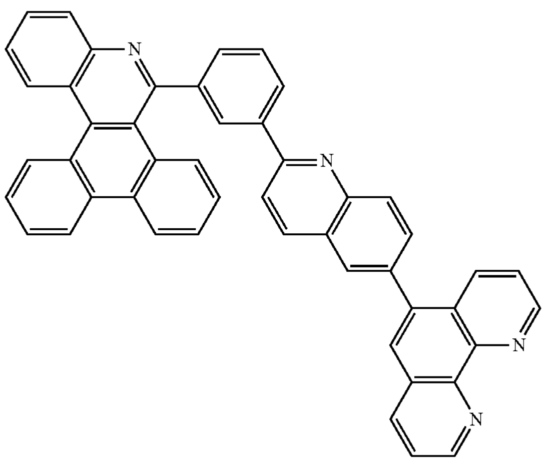
4-21
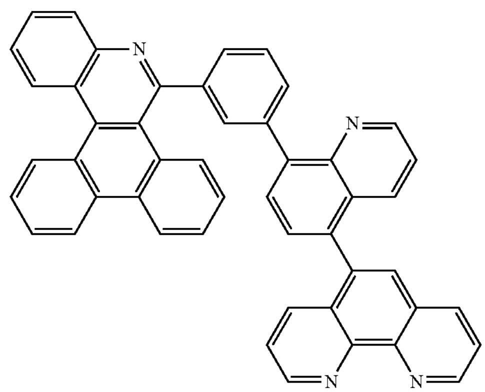
4-22
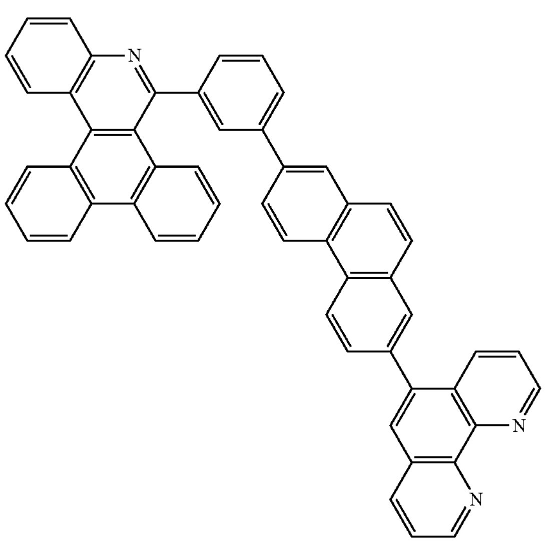
4-23
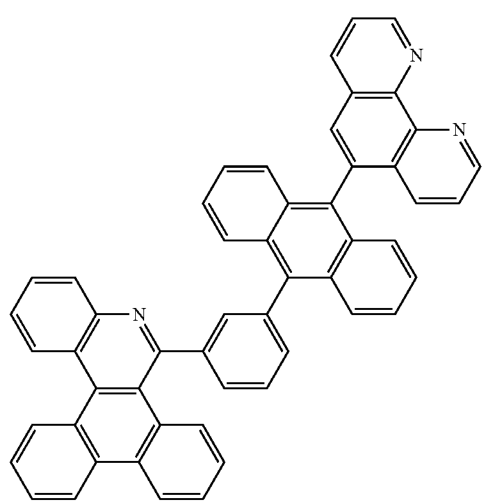

-continued
4-24
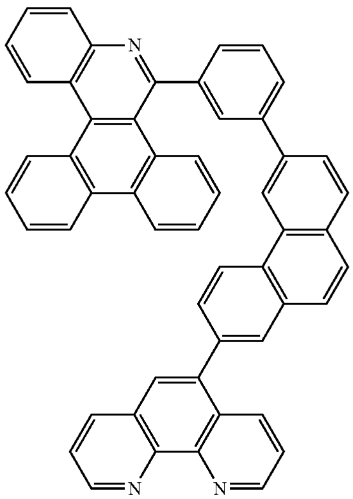
4-25
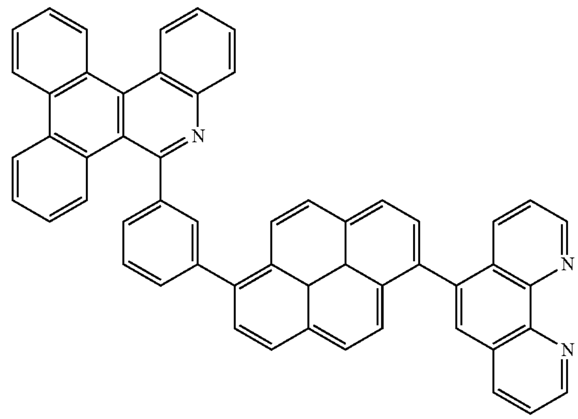
4-26
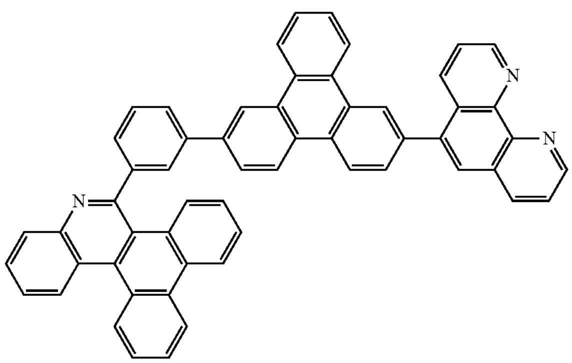
4-27
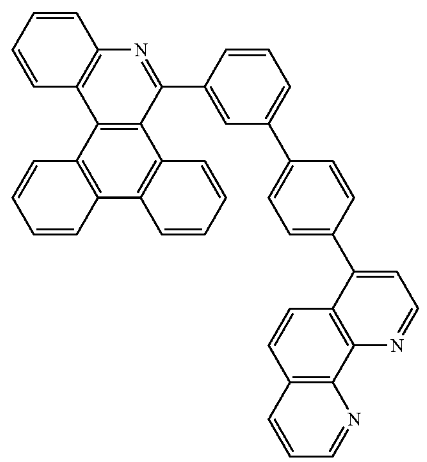
4-28
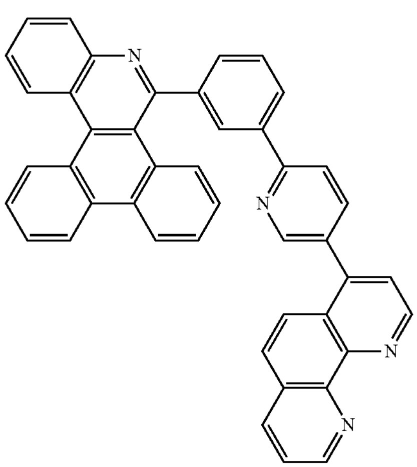
4-29
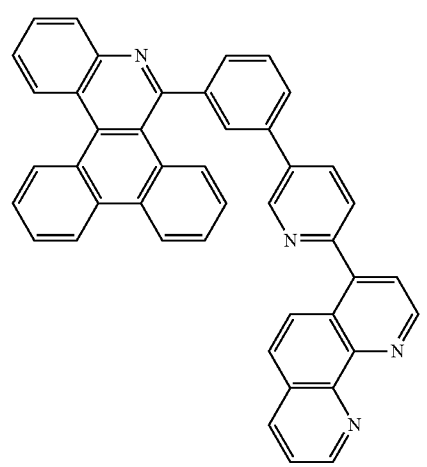

-continued
4-30
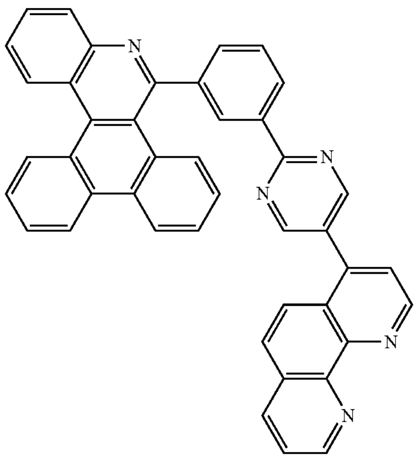
4-31
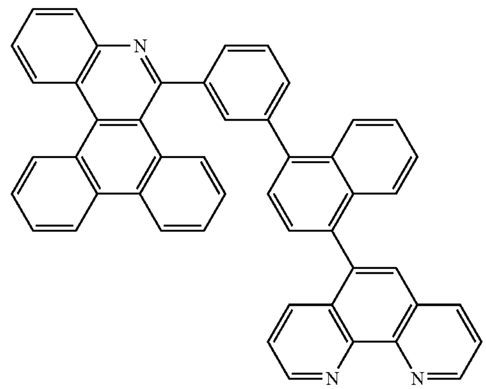
4-32
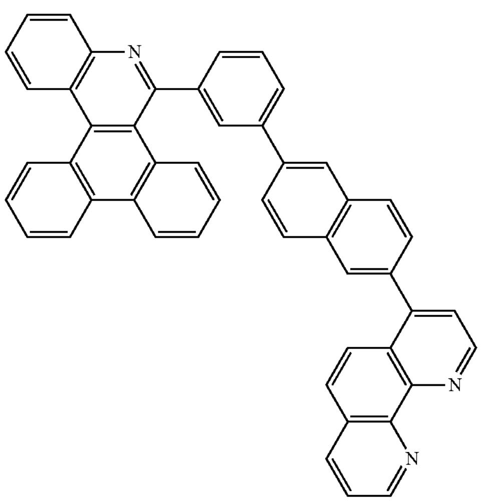
4-33
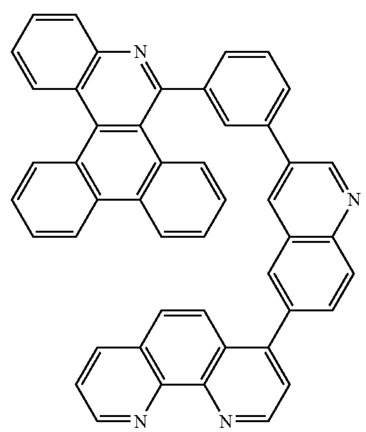
4-34
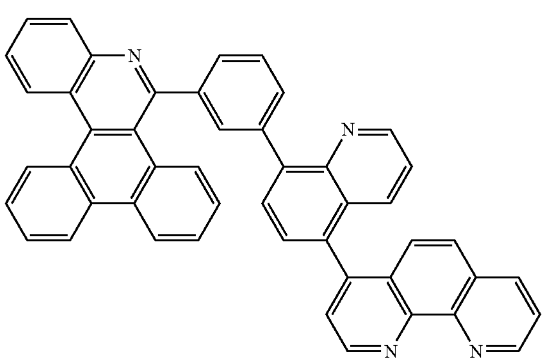
4-35
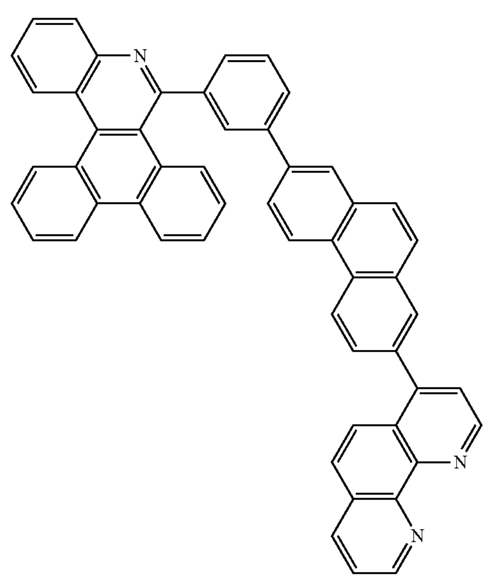

-continued
4-36
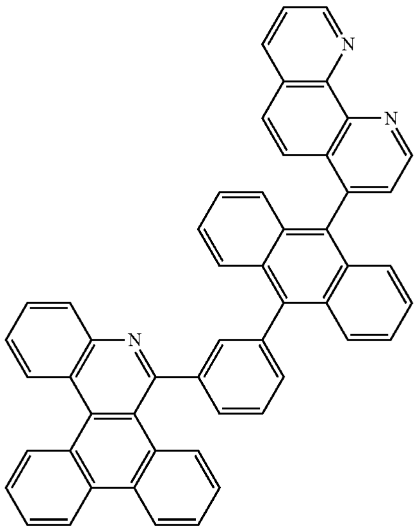
4-37
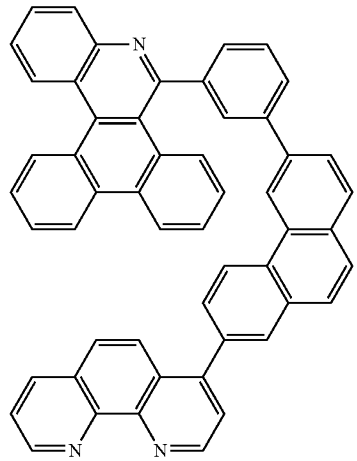
4-38
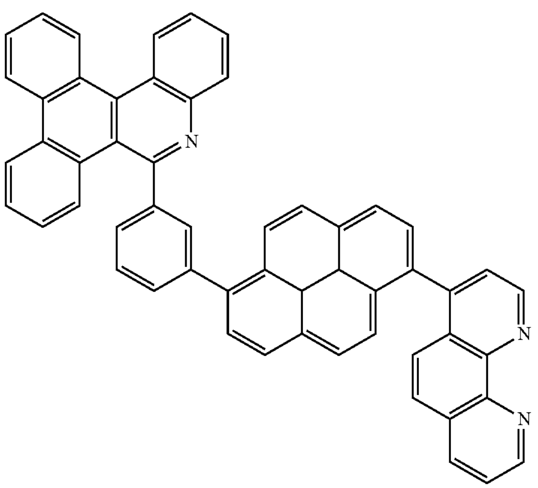
4-39
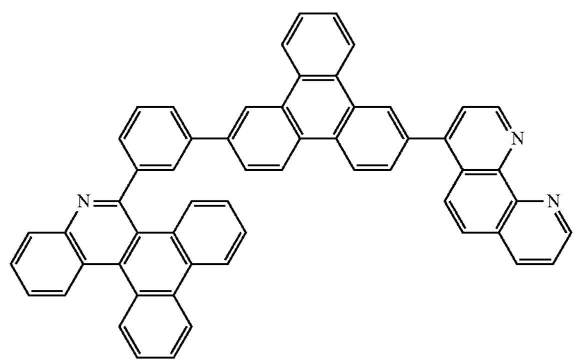
5-1
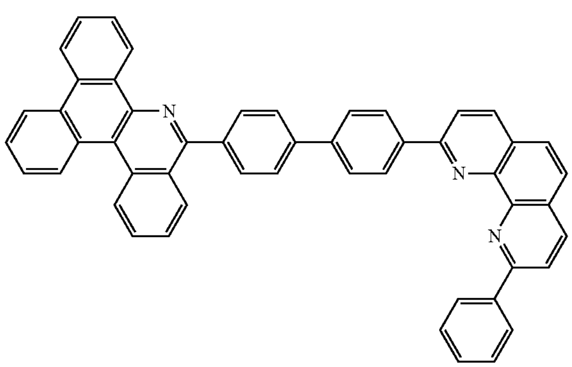
5-2
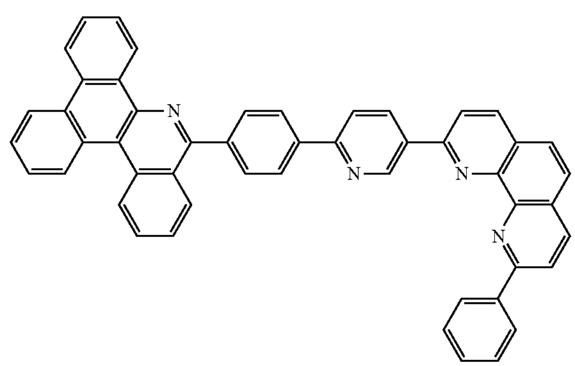

-continued
5-3
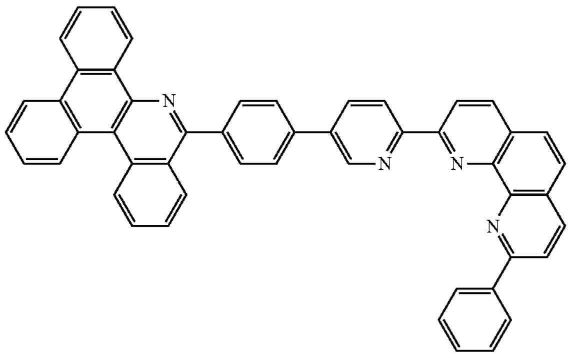
5-4
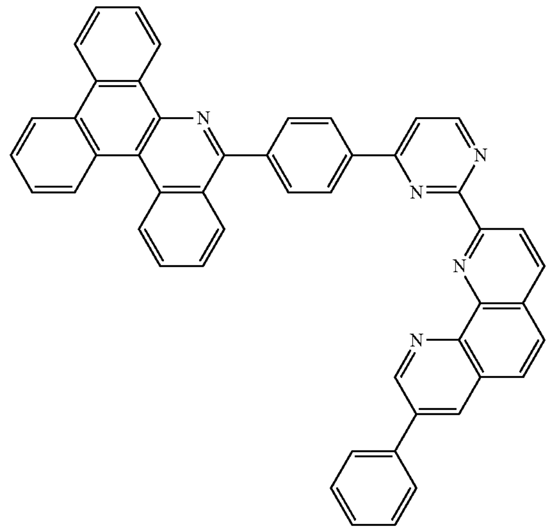
5-5
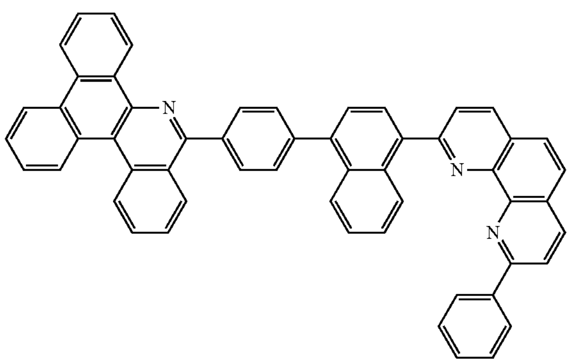
5-6
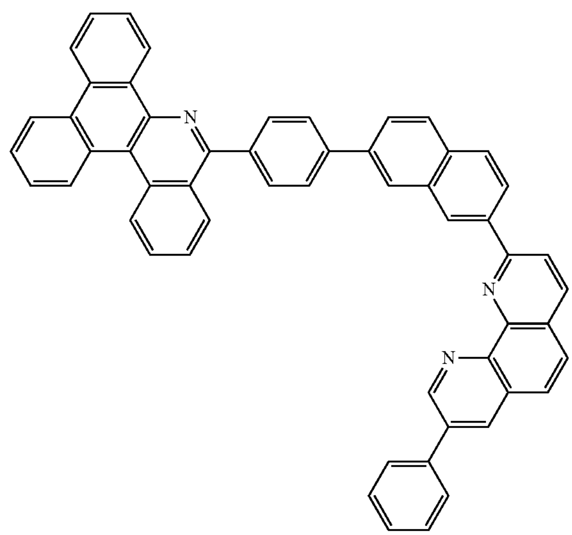
5-7
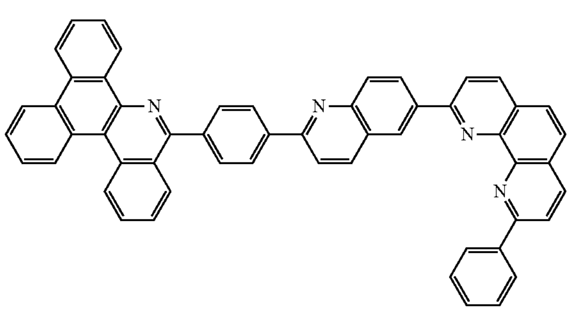
5-8
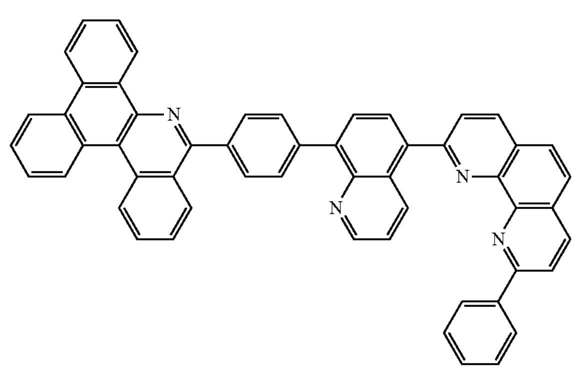

-continued
5-9
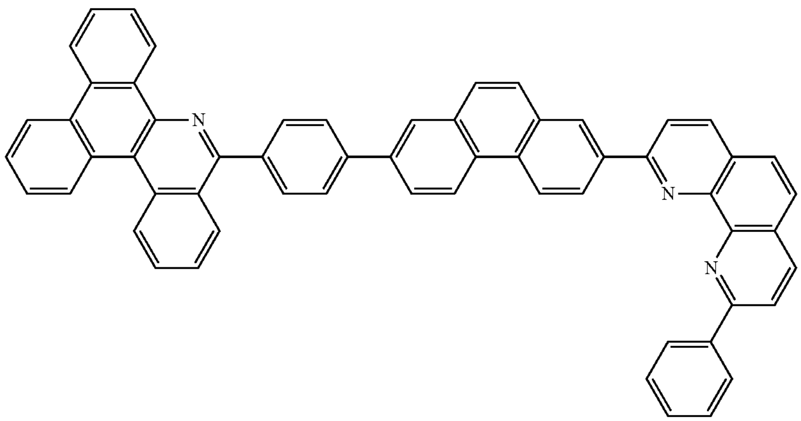
5-10
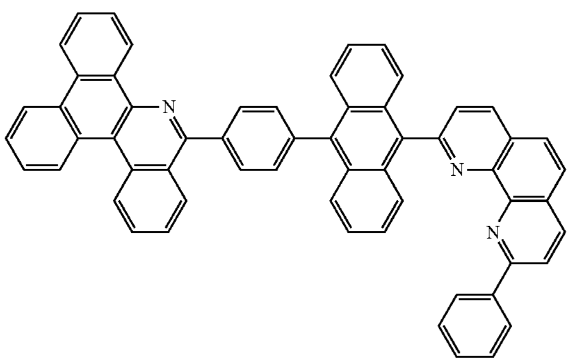
5-11
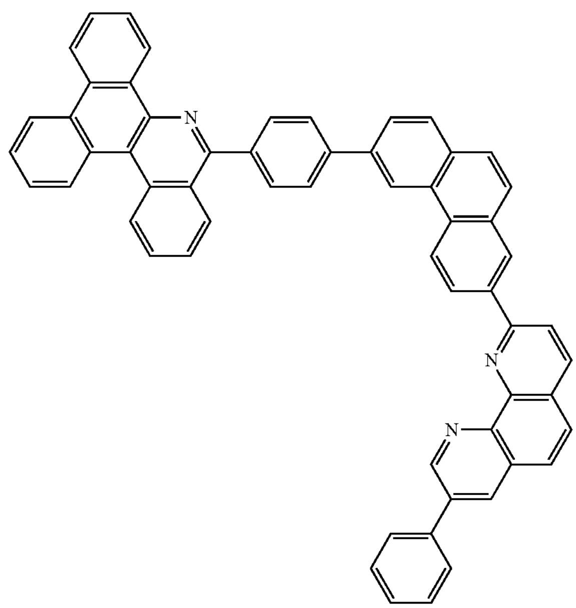
5-12
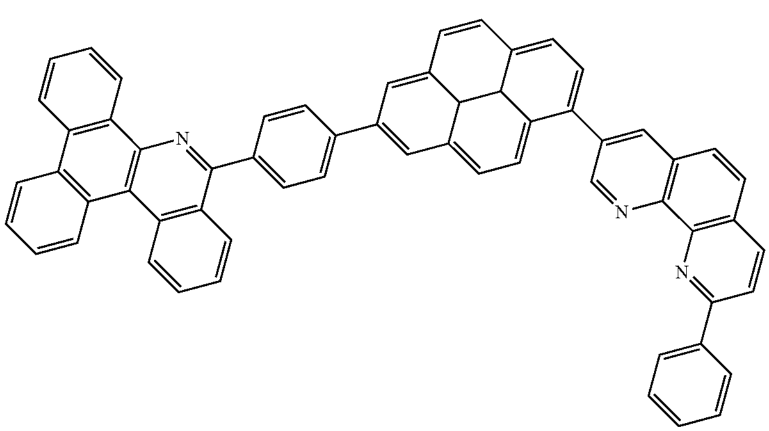

-continued
5-13
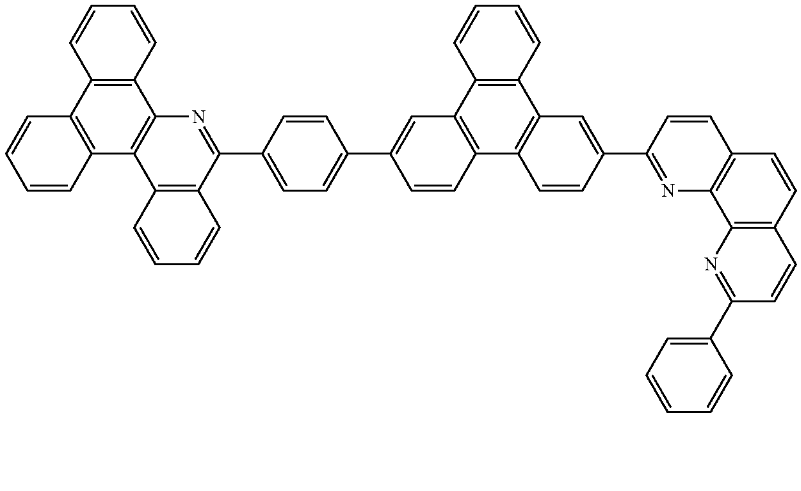
5-14
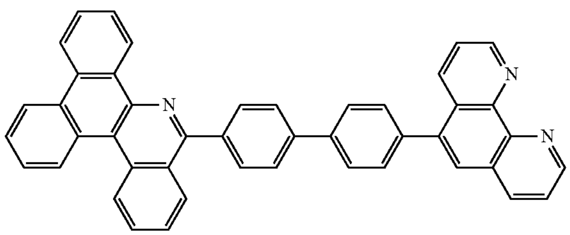
5-15
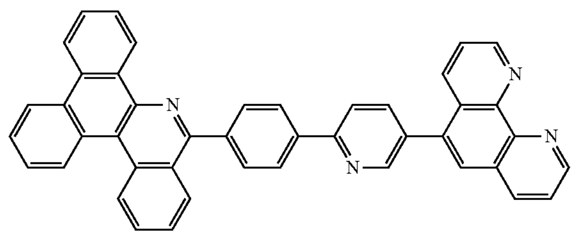
5-16
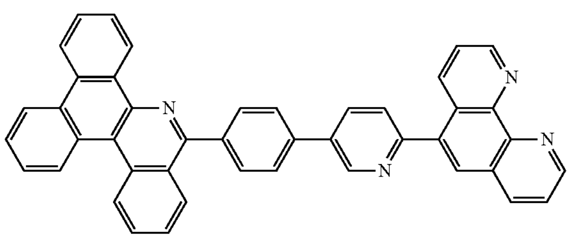
5-17
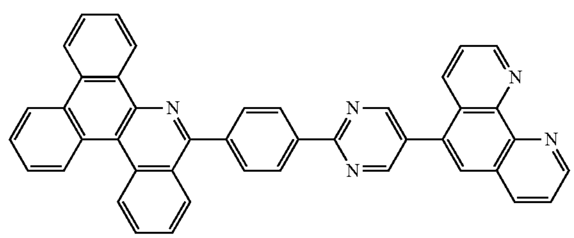
5-18
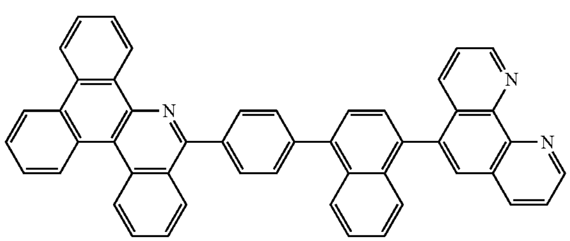
5-19
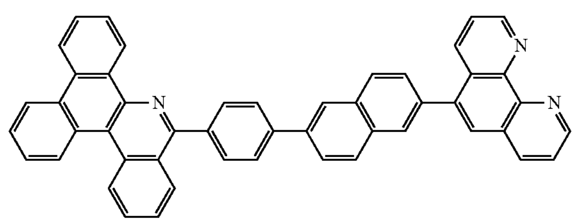
5-20
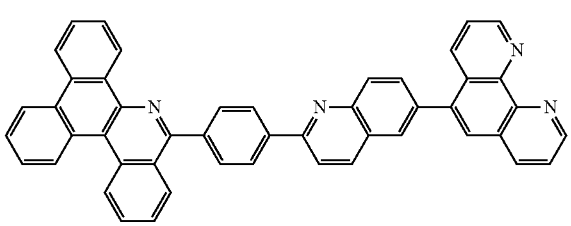
5-21
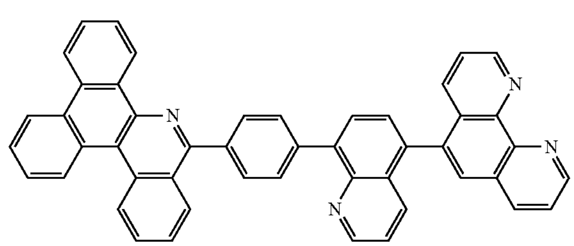

-continued
5-22
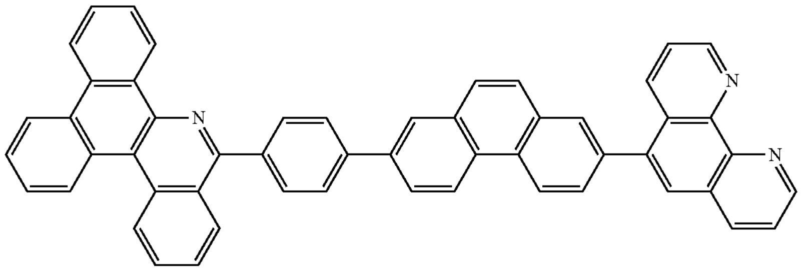
5-23
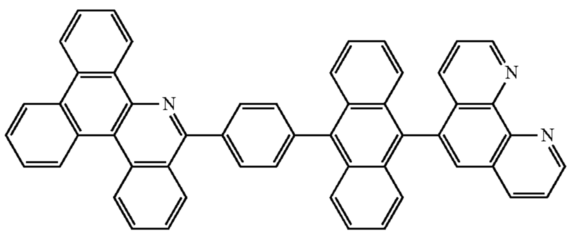
5-24
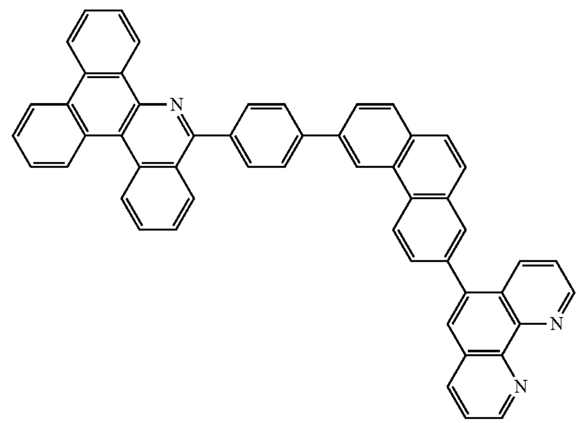
5-25
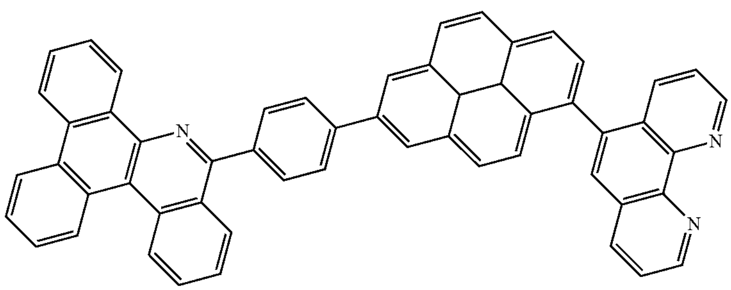
5-26
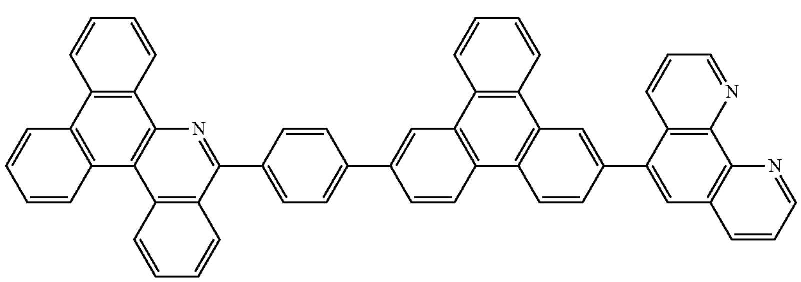
5-27
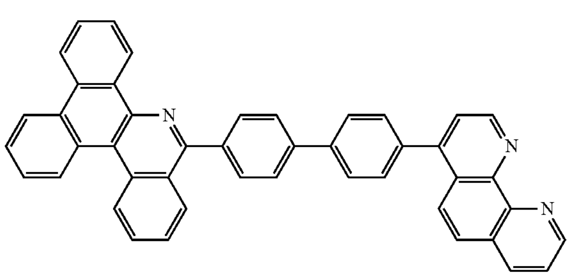
5-28
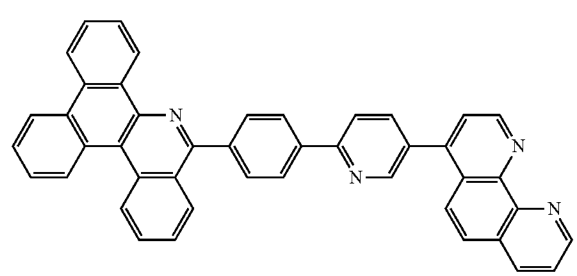

-continued
5-29
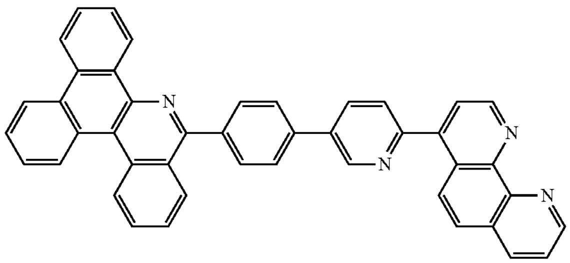
5-30
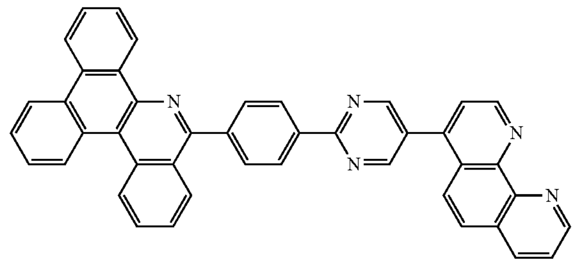
5-31
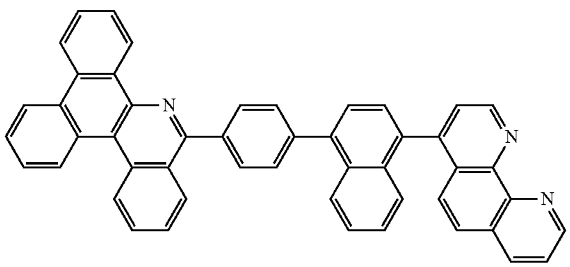
5-32
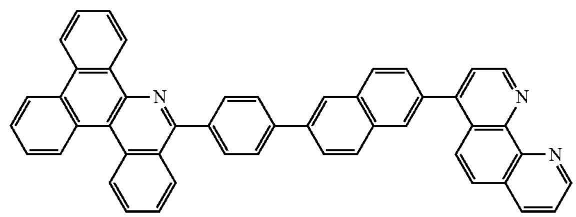
5-33
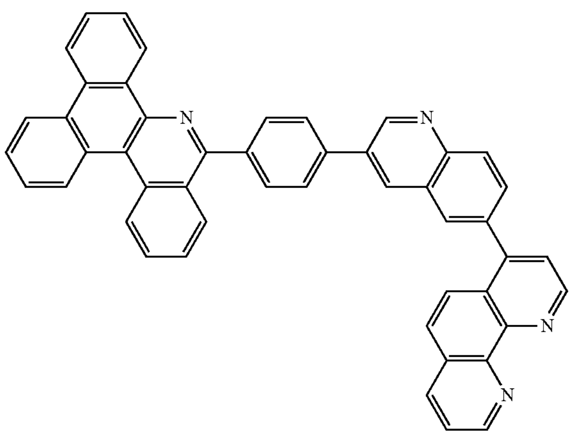
5-34
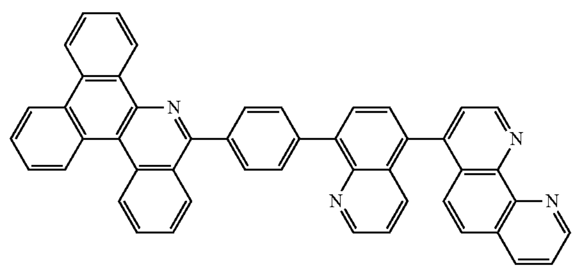
5-35
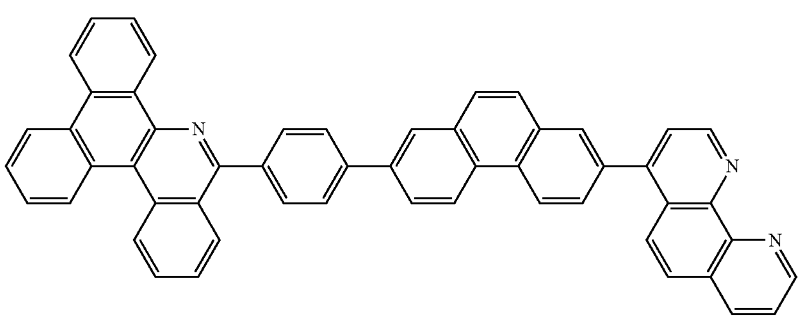

-continued
5-36
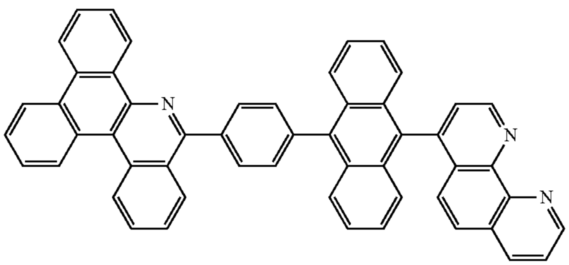
5-37
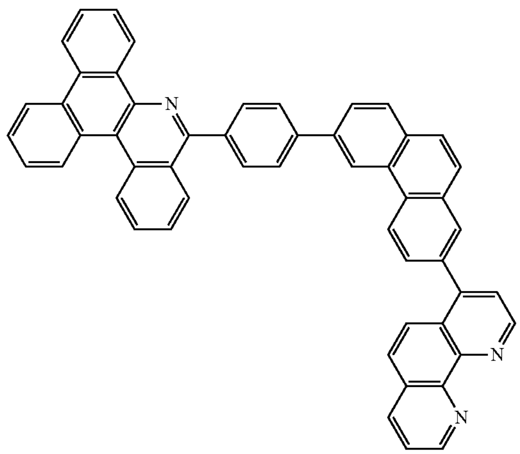
5-38
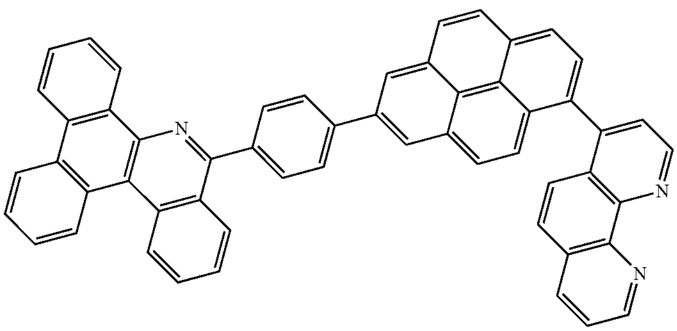
5-39
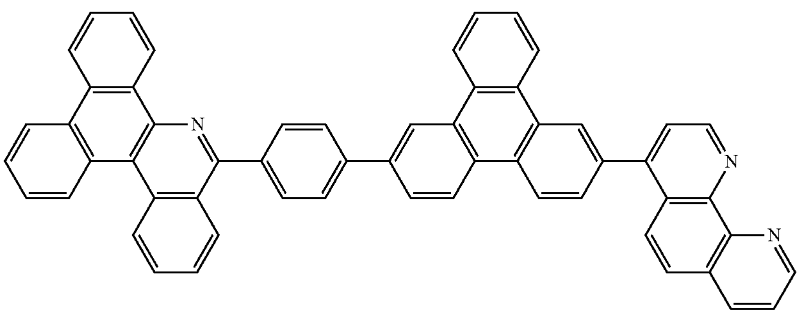
6-1
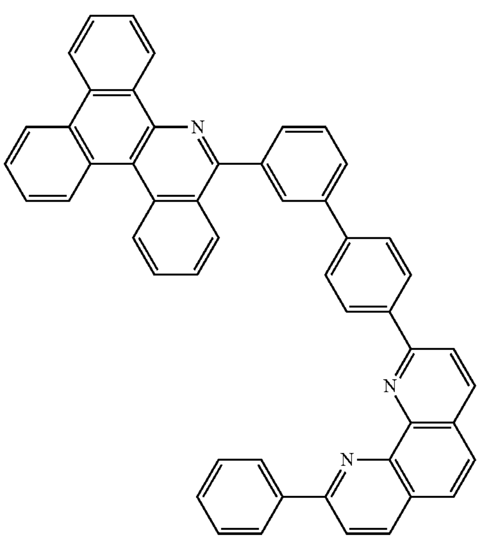
6-2
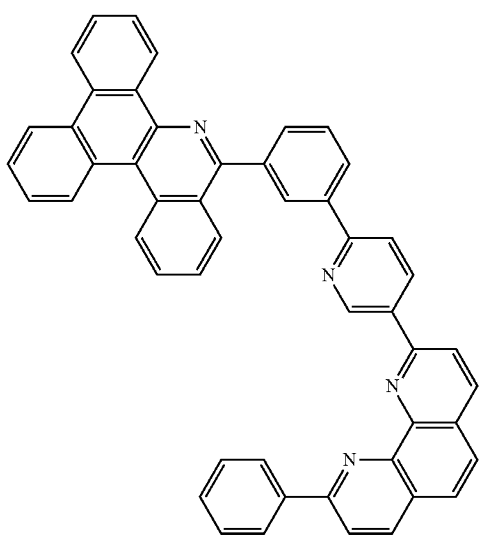

-continued
6-3
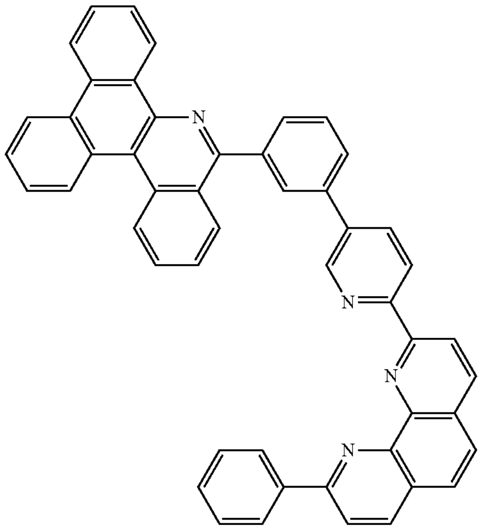
6-4
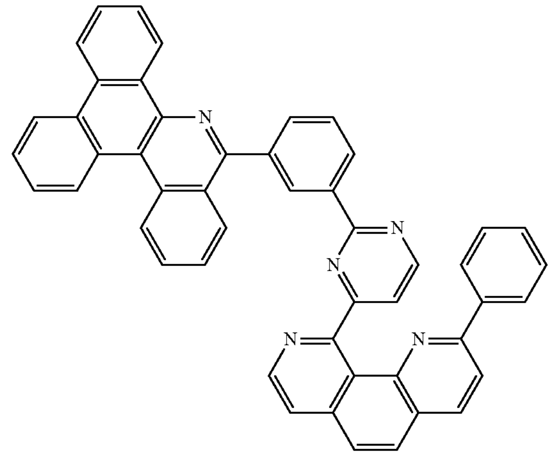
6-5
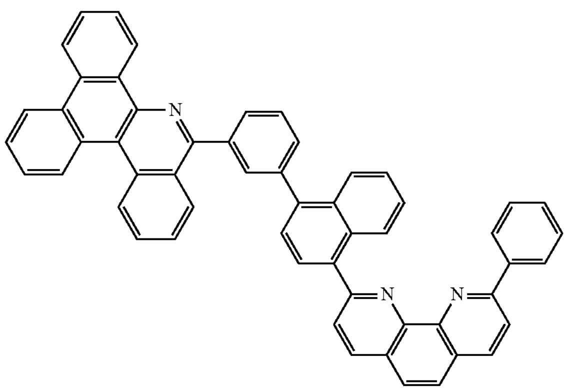
6-6
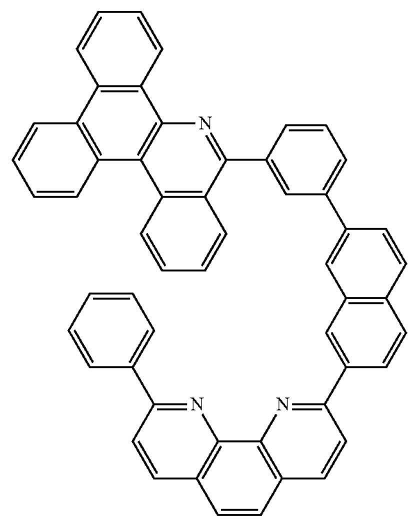
6-7
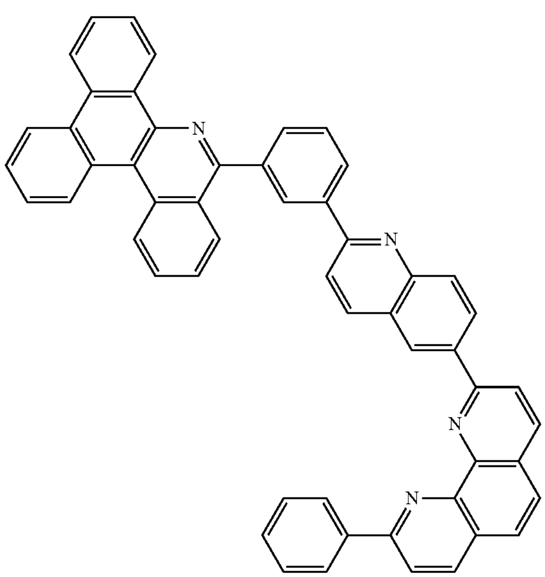
6-8
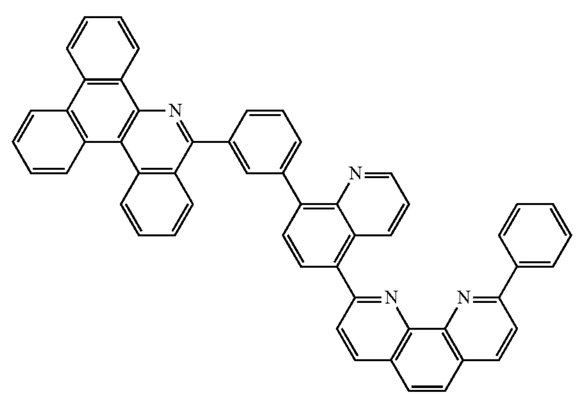

-continued
6-9
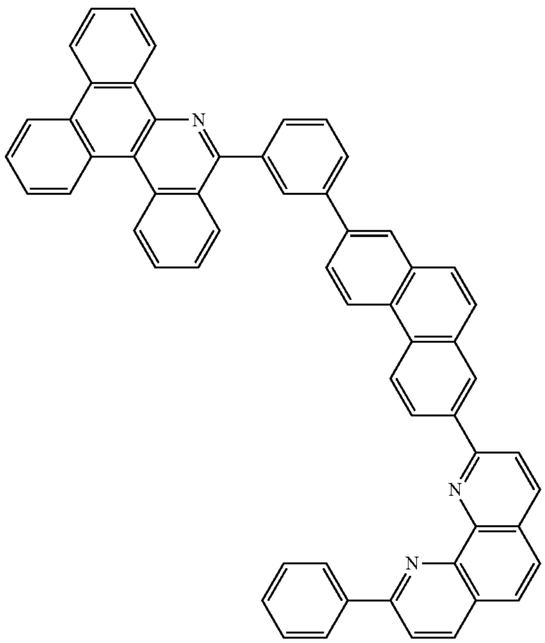
6-10
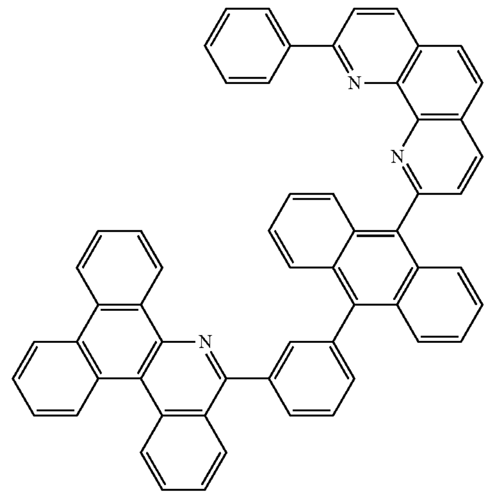
6-11
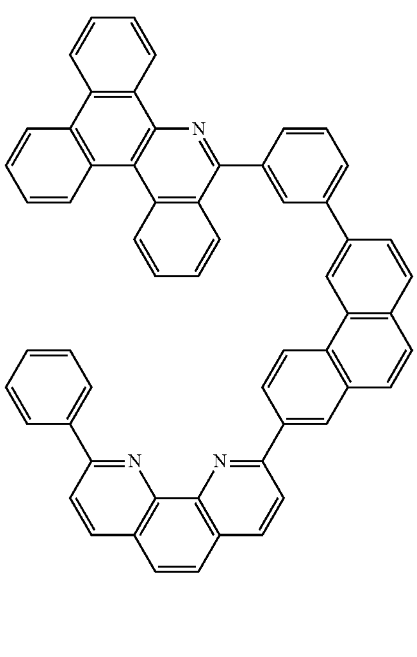
6-12
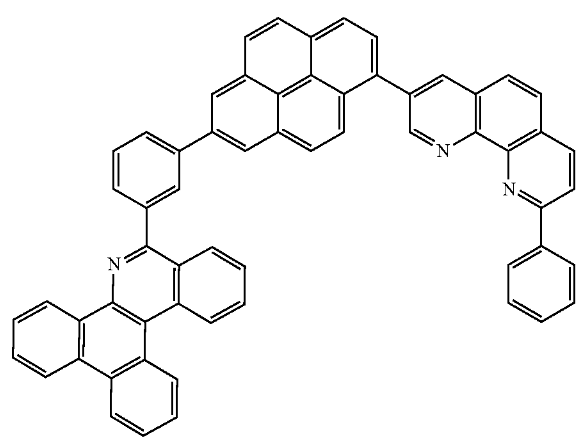

-continued
6-13
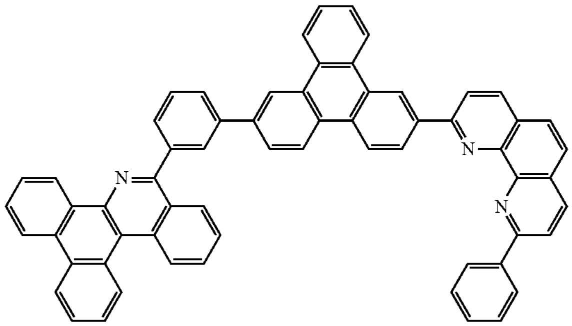
6-14
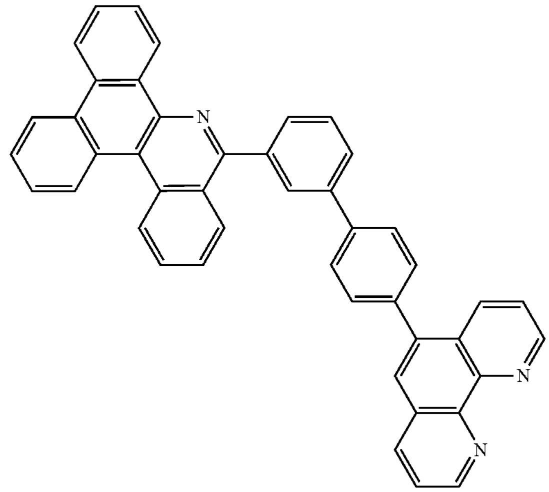
6-15
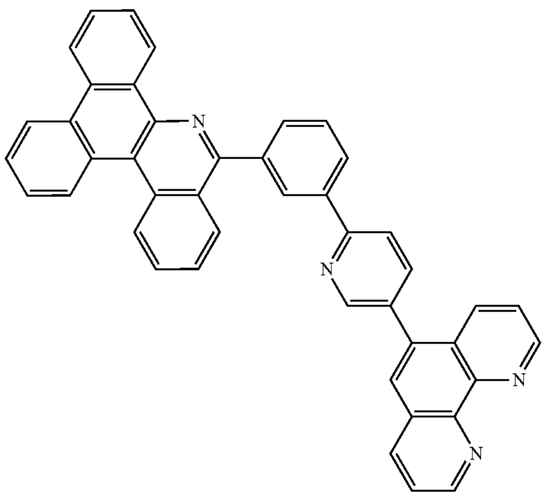
6-16
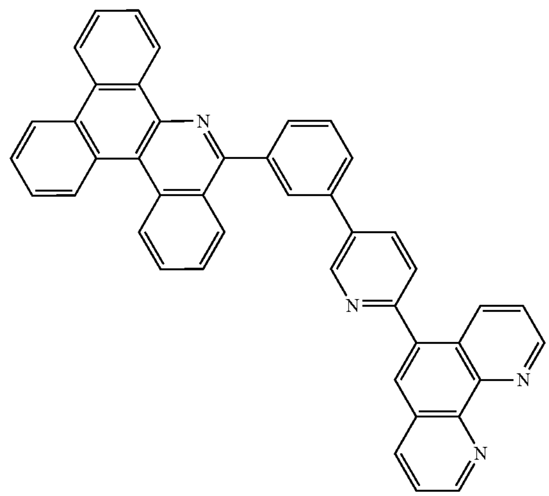
6-17
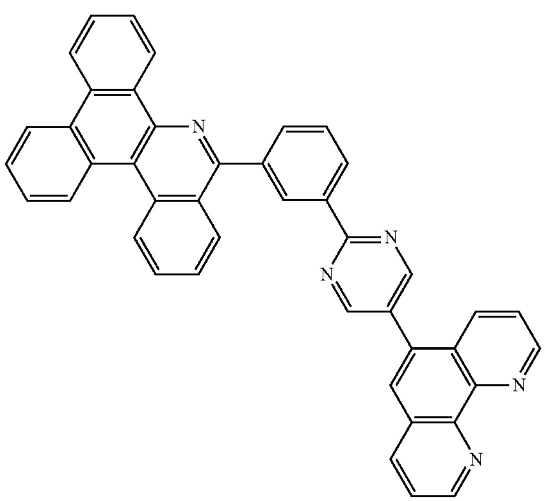
6-18
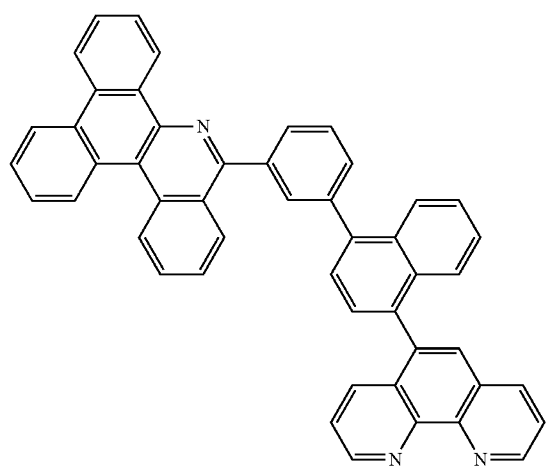

-continued
6-19
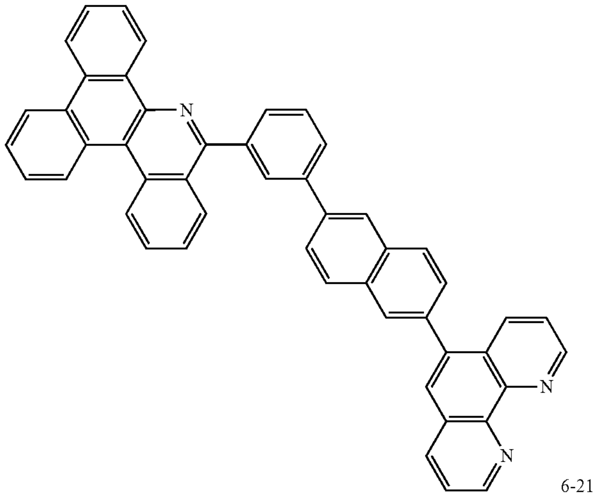
6-20
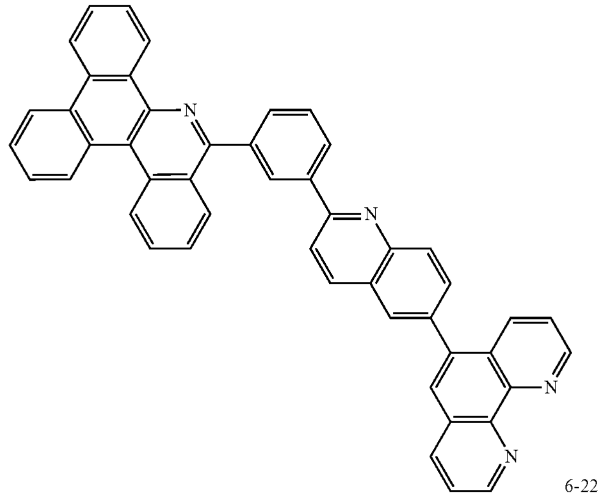
6-21
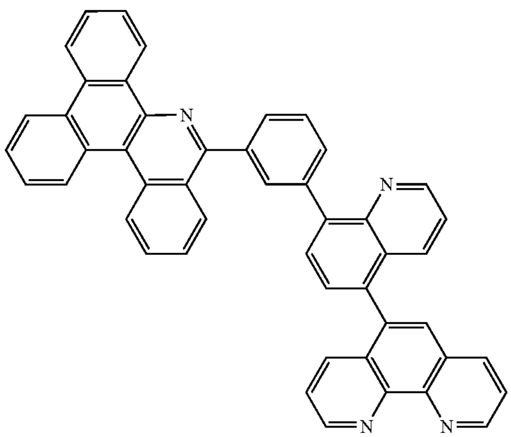
6-22
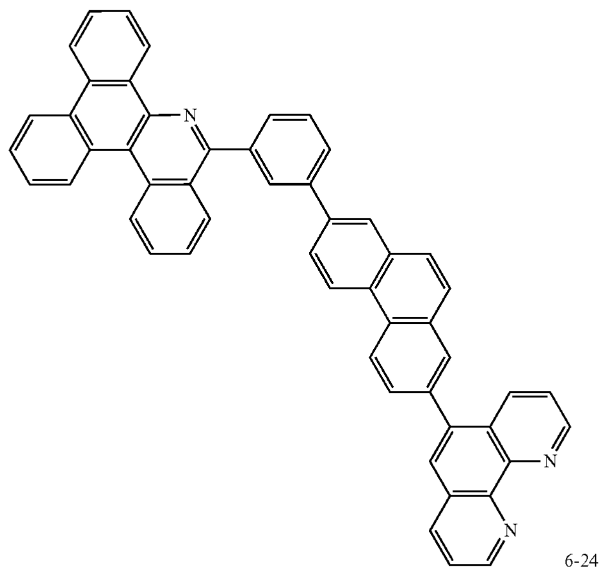
6-23
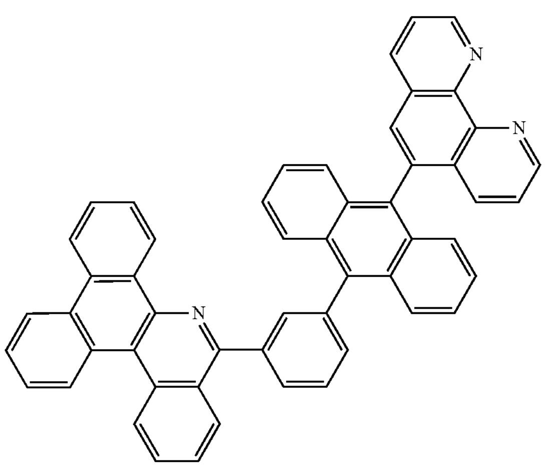
6-24
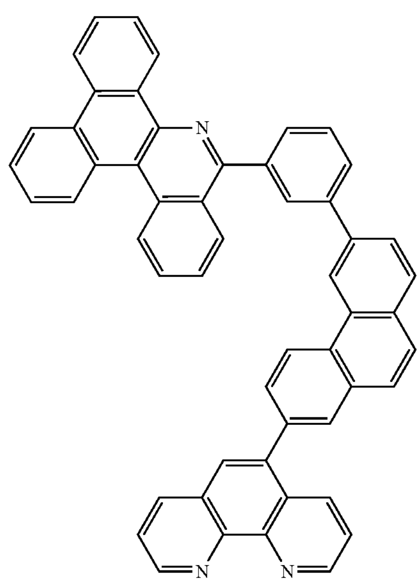

-continued
6-25
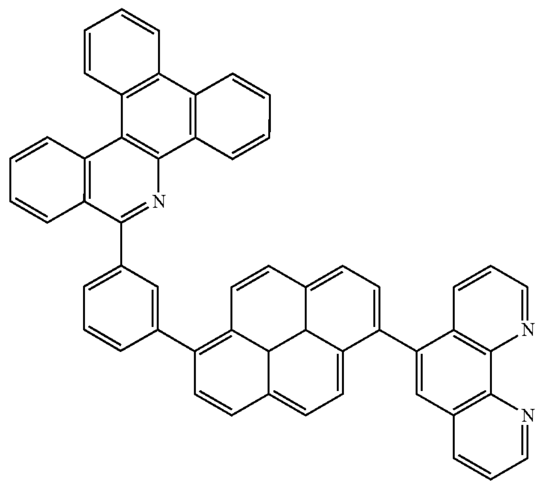
6-26
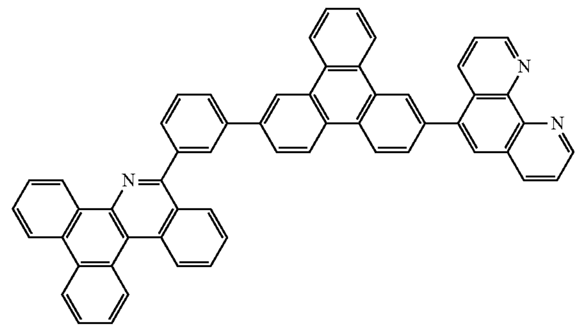
6-27
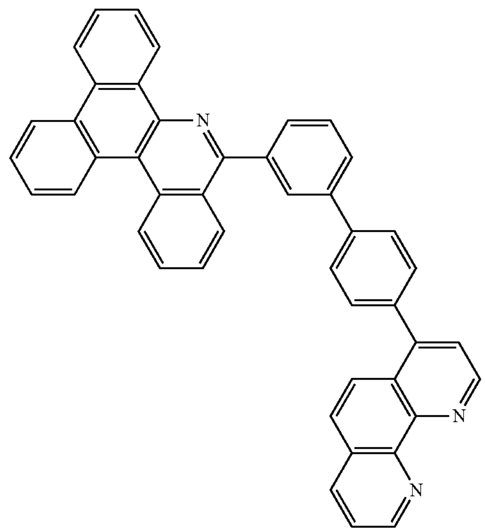
6-28
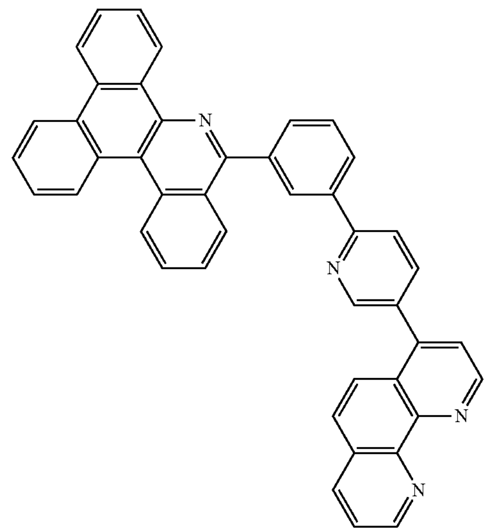
6-29
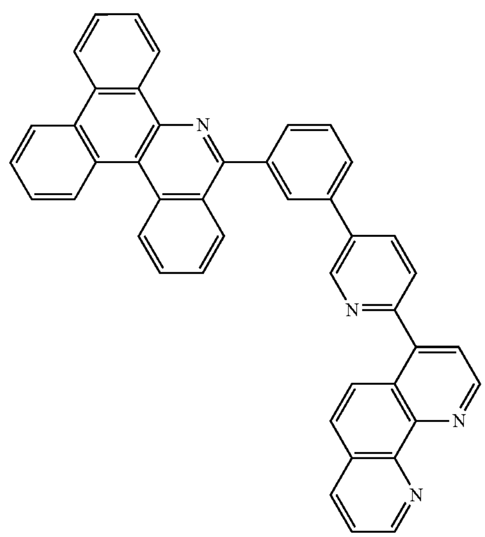
6-30
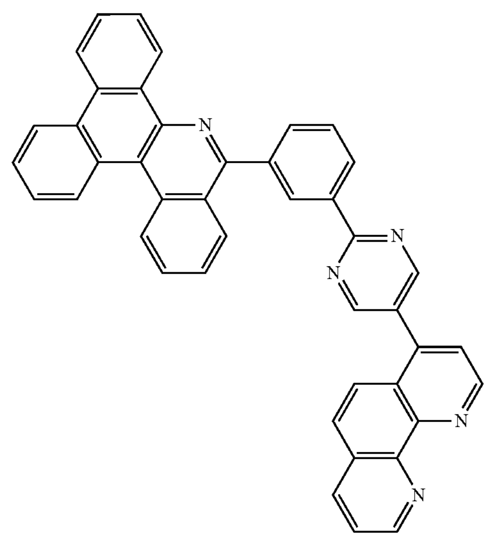

-continued
6-31
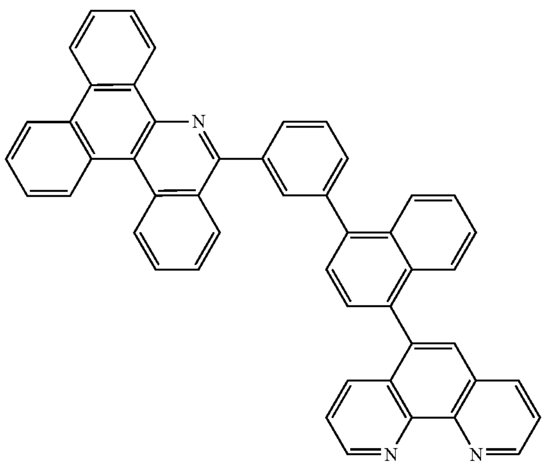
6-32
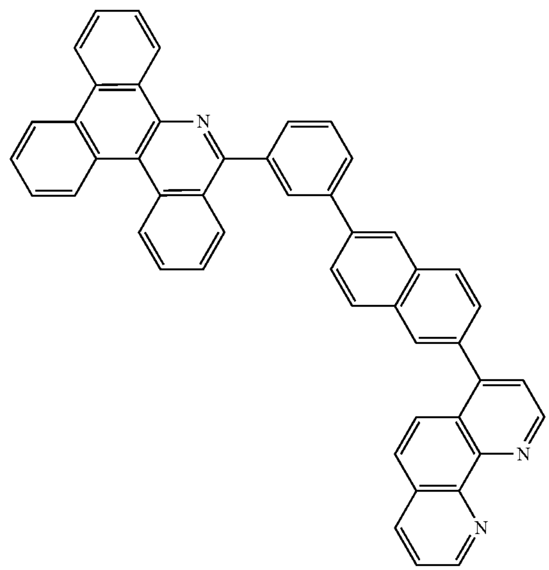
6-33
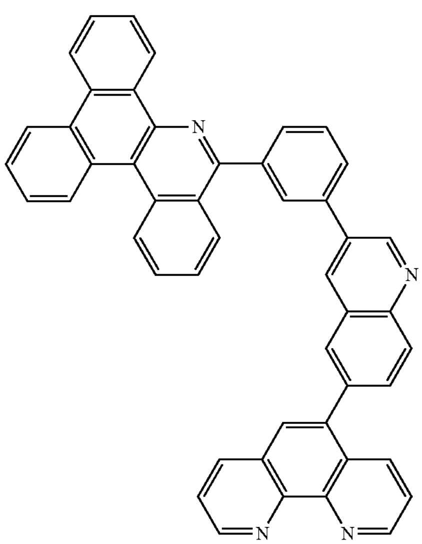
6-34
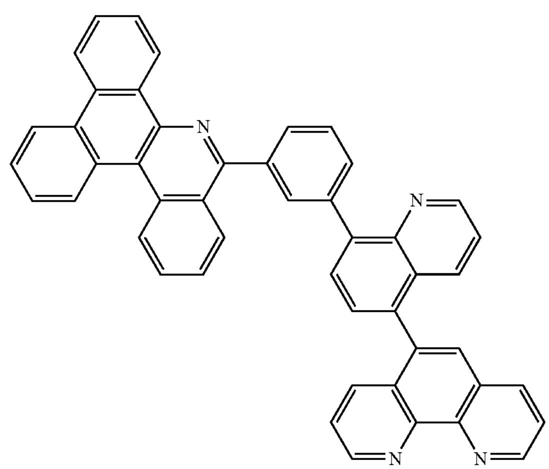

-continued
6-35
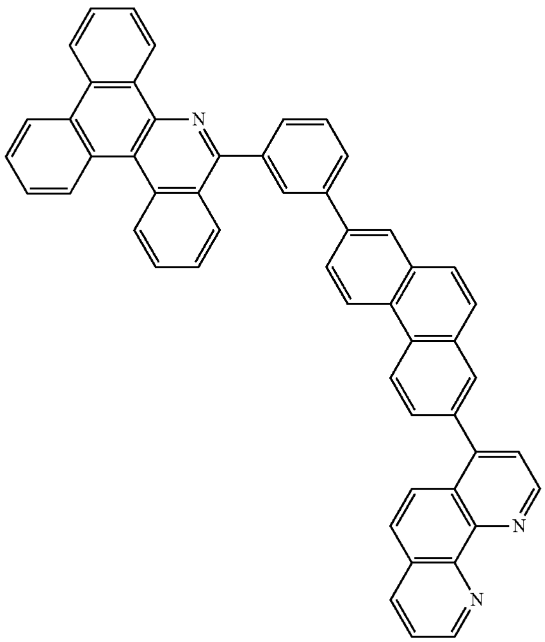
6-36
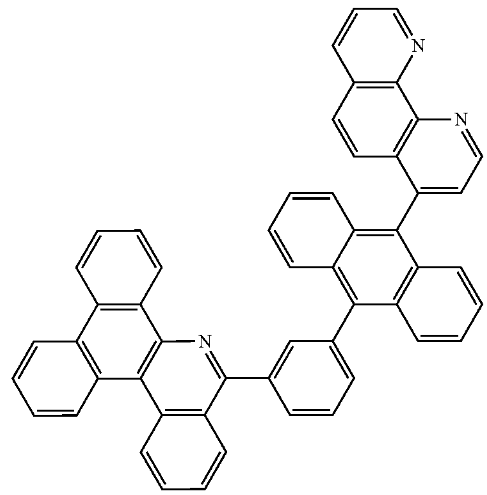
6-37
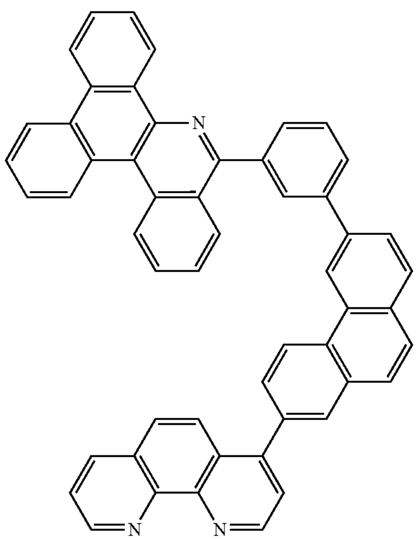
6-38
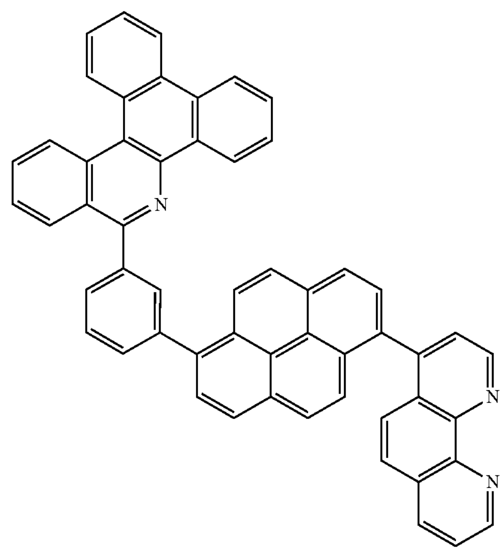
6-39
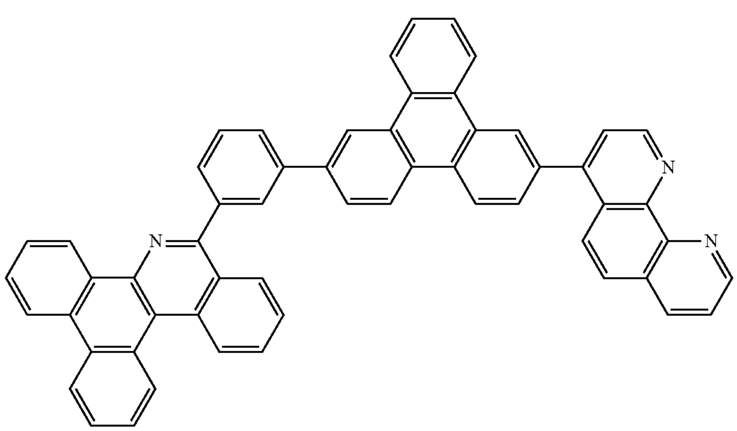

-continued
7-1
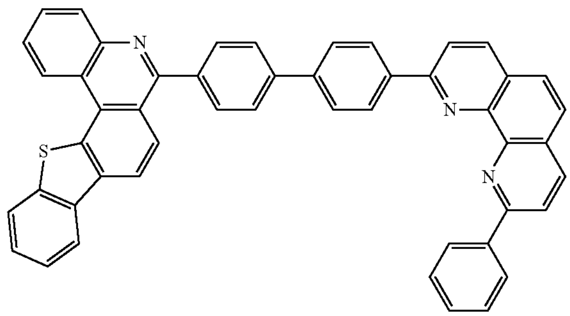
7-2
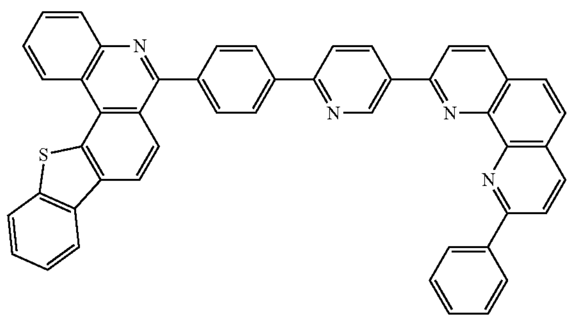
7-3
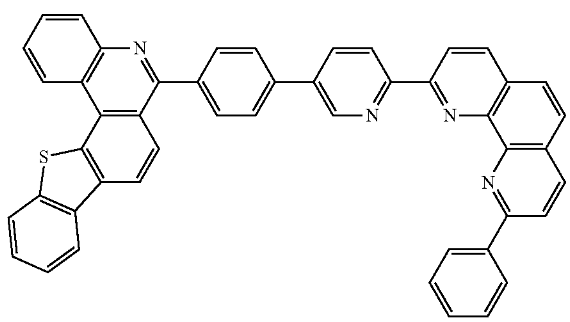
7-4
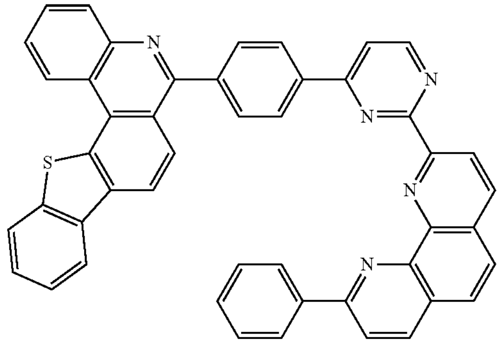
7-5
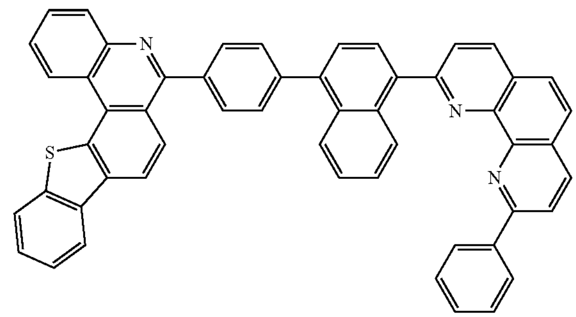
7-6
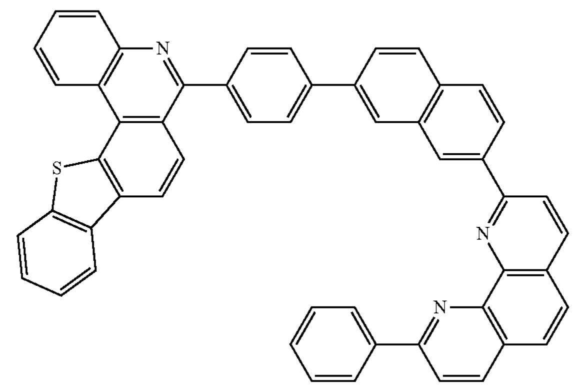
7-7
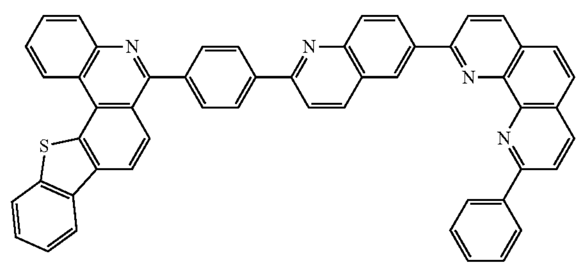
7-8
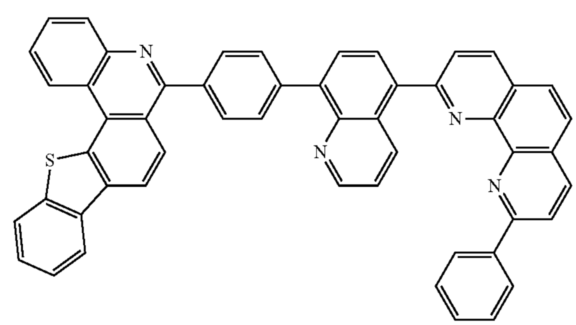
7-9
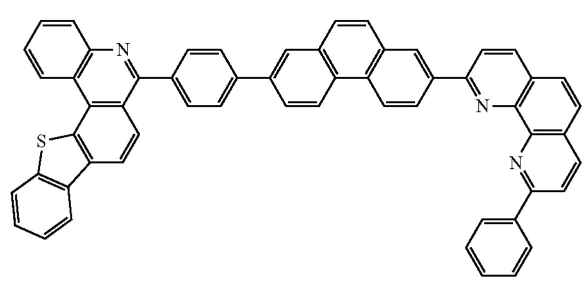

-continued
7-10
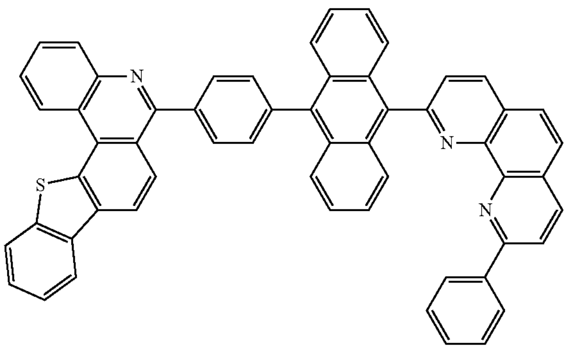
7-11
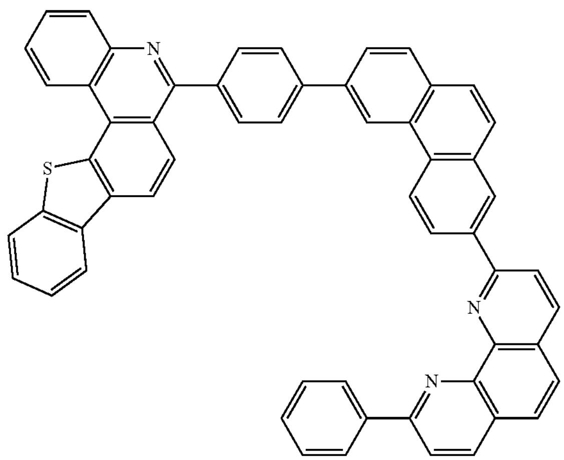
7-12
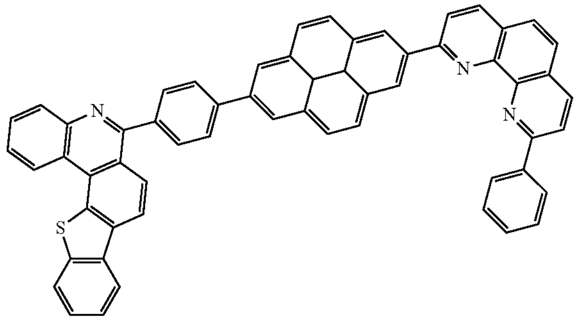
7-13
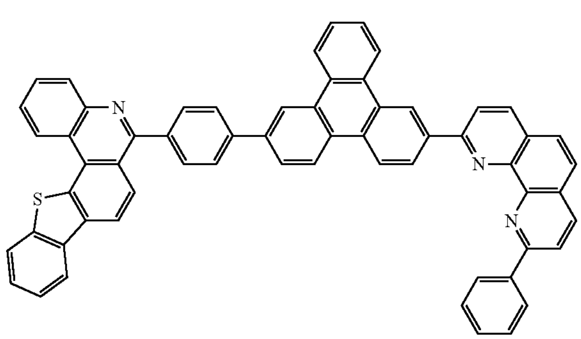
-continued
7-14
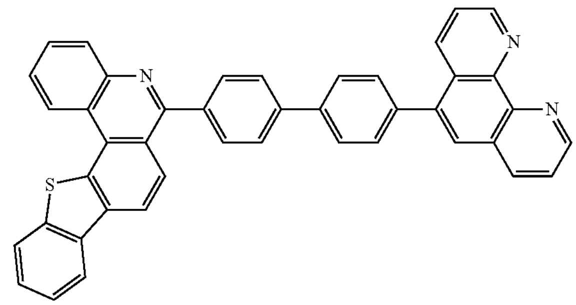
7-15
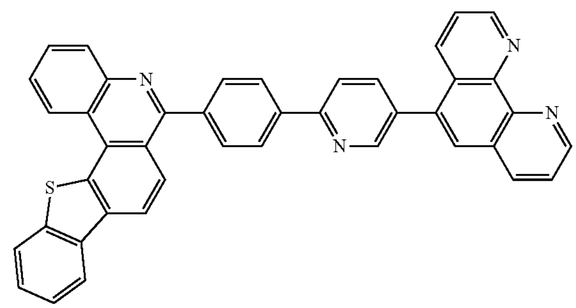
7-16
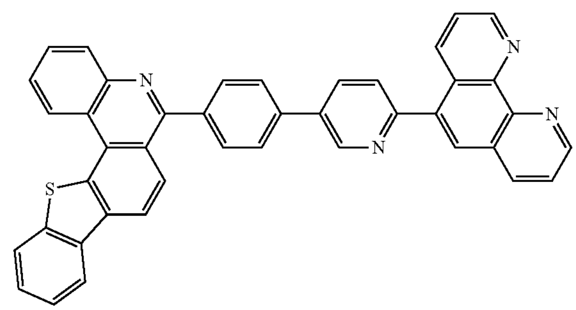
7-17
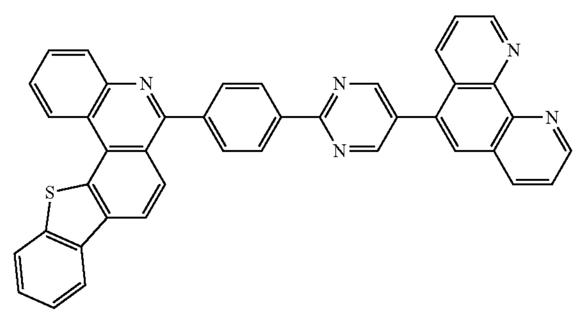
7-18
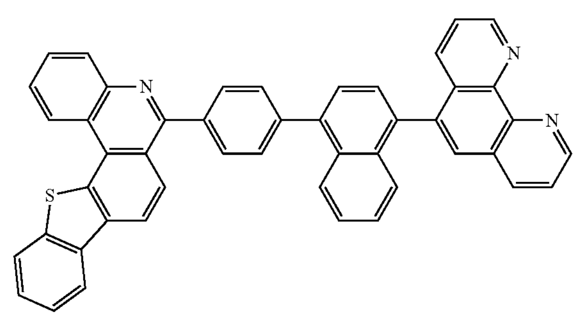

-continued
7-19
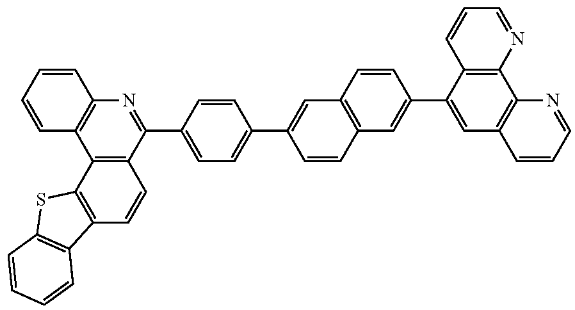
7-20
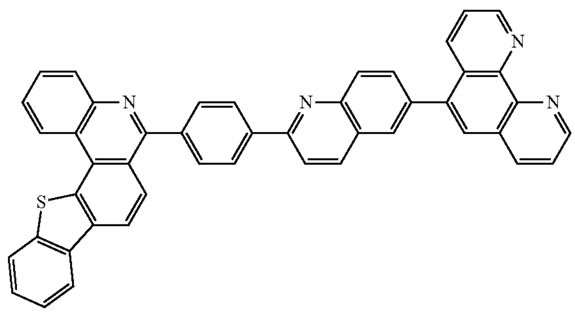
7-21
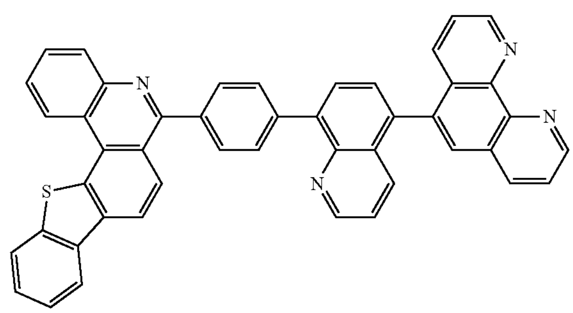
7-22
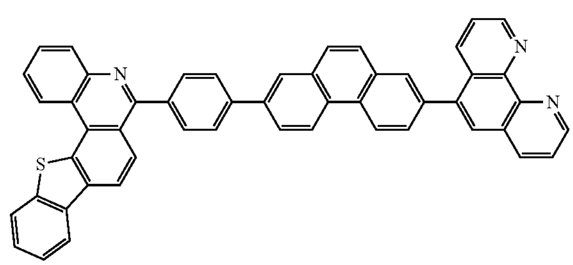
7-23
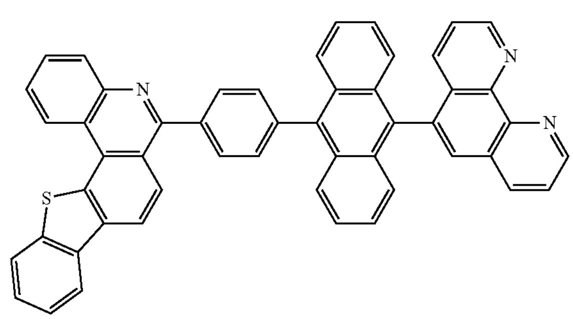
-continued
7-24
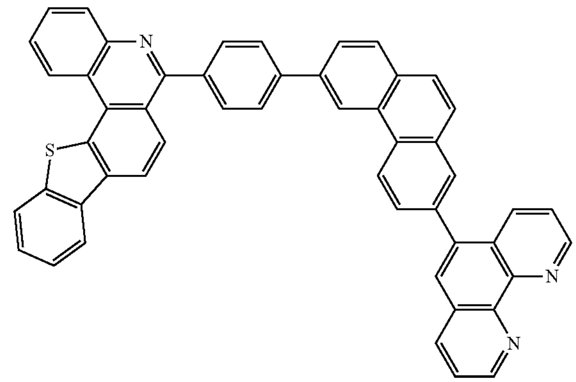
7-25
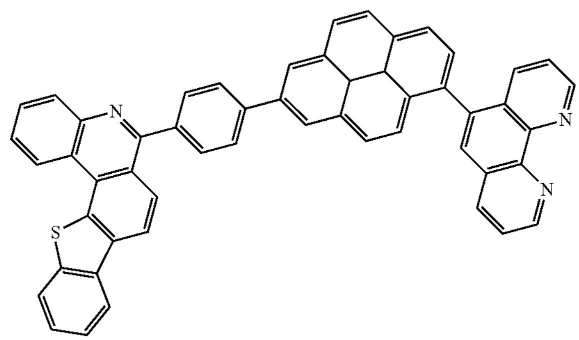
7-26
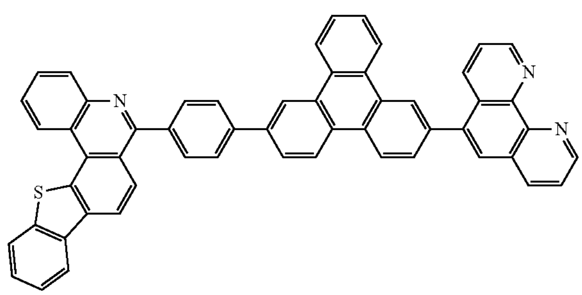
7-27
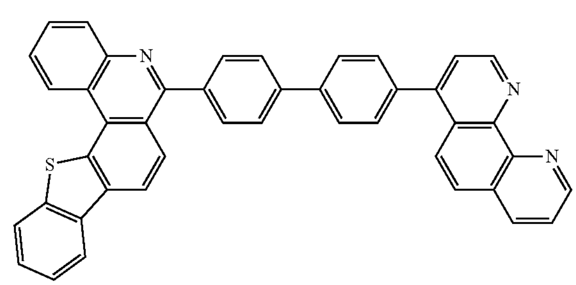

-continued
7-28
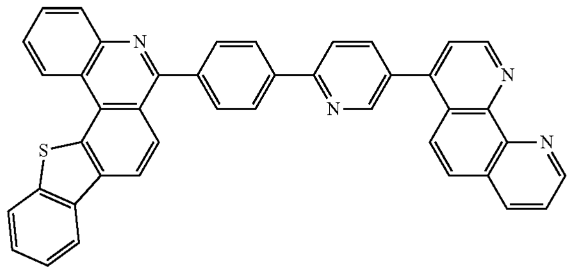
7-29
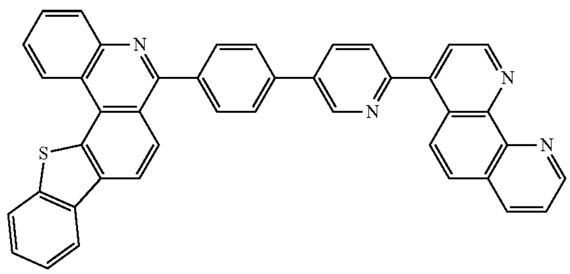
7-30
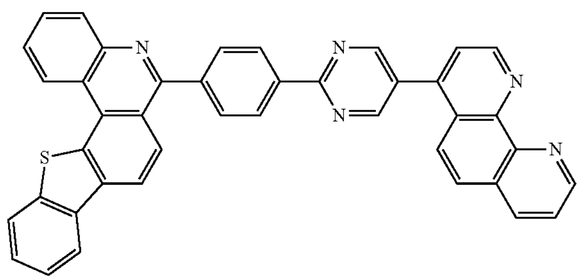
7-31
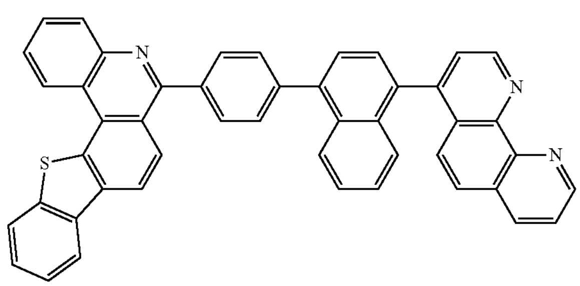
7-32
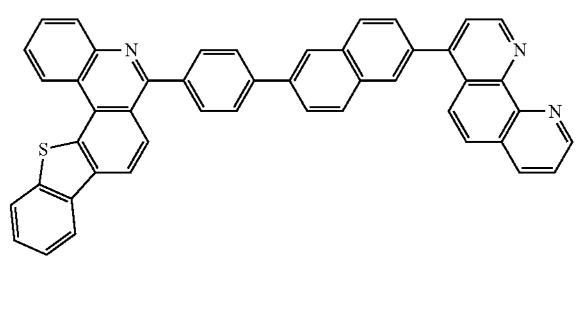
-continued
7-33
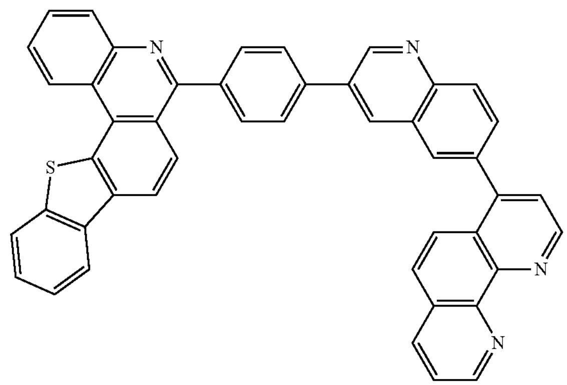
7-34
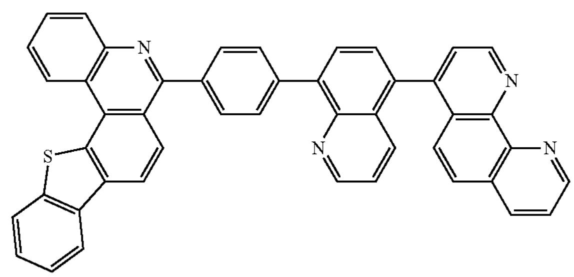
7-35
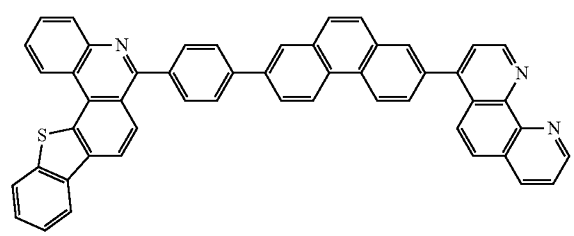
7-36
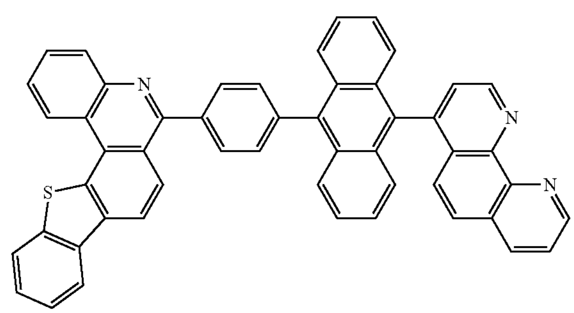

7-37
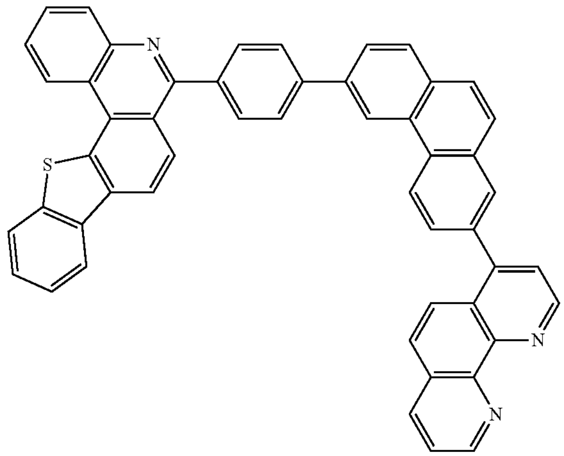
7-38
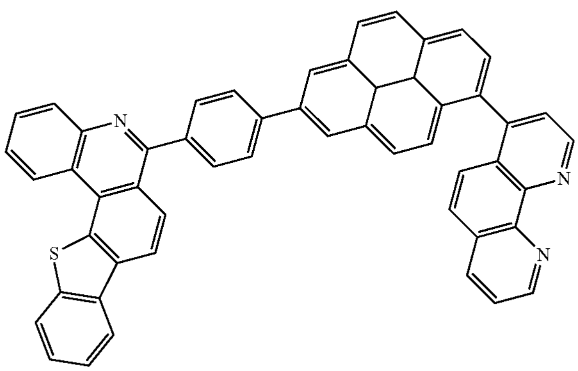
7-39
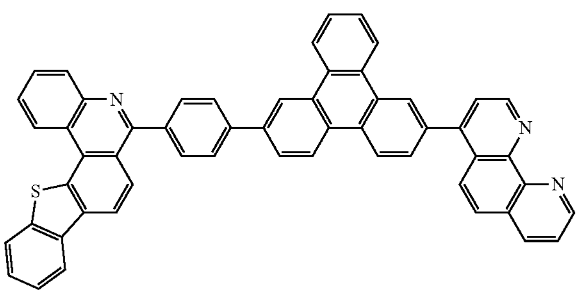
8-1
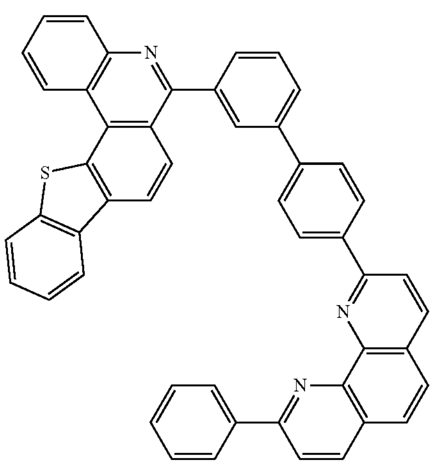
8-2
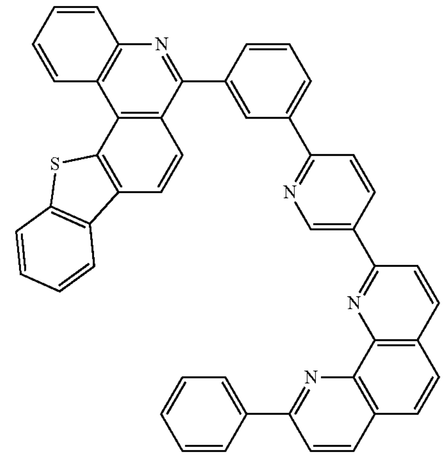
8-3
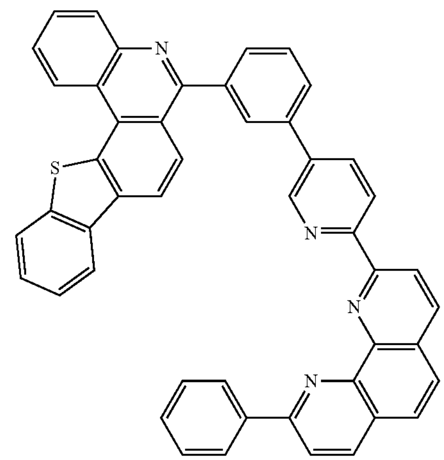
8-4
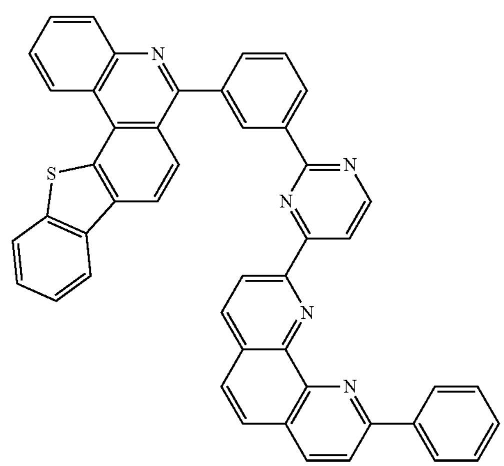

-continued
8-5
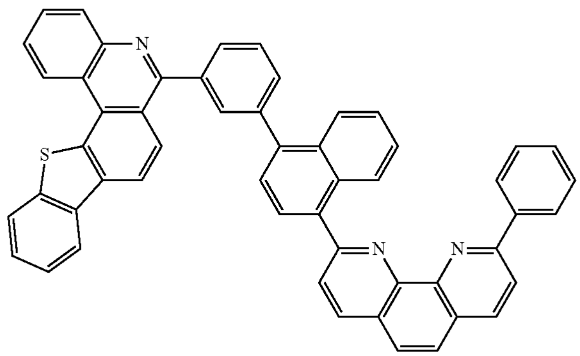
8-6
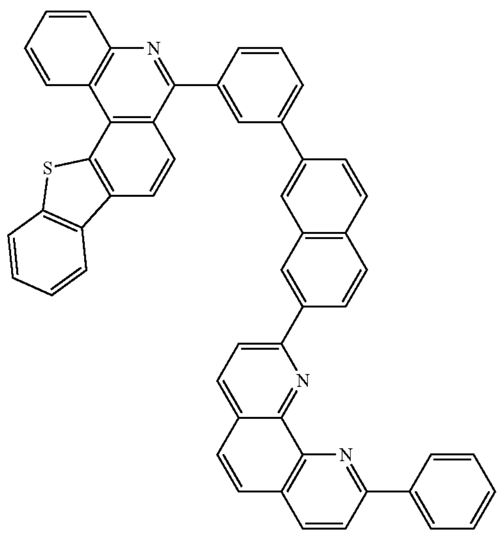
8-7
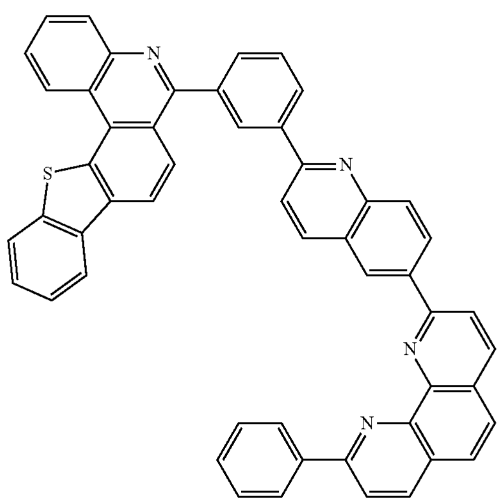
-continued
8-8
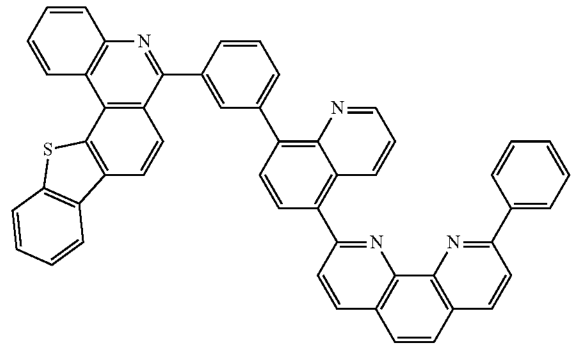
8-9
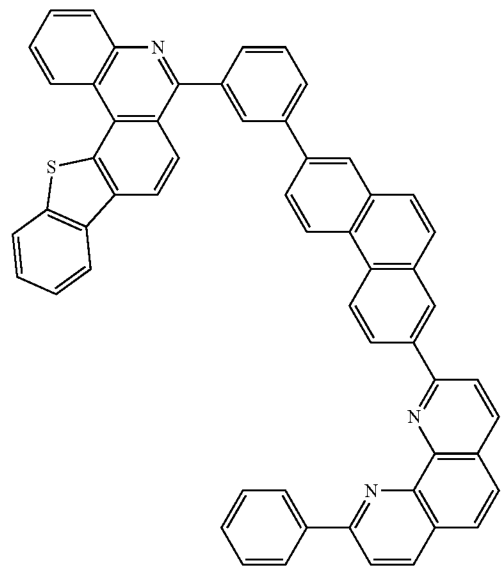
8-10
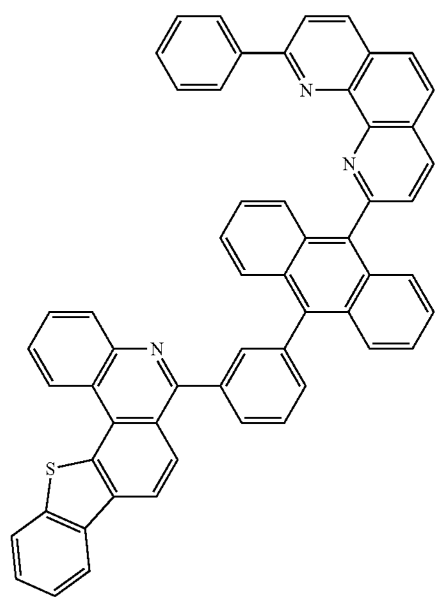

8-11
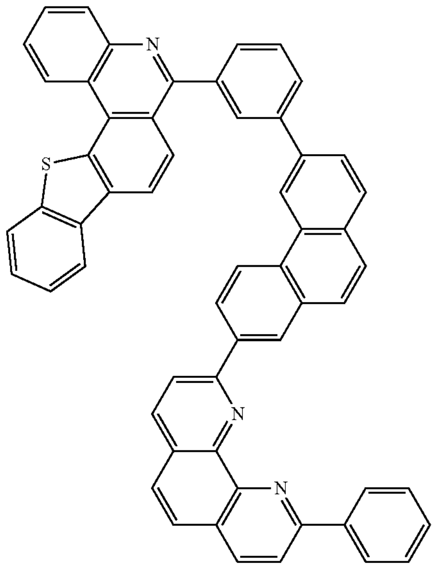
8-12
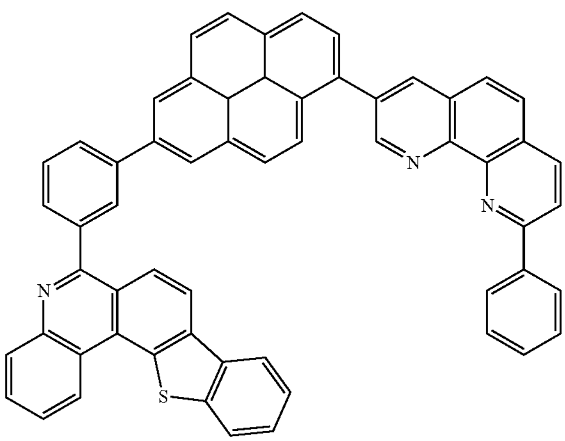
8-13
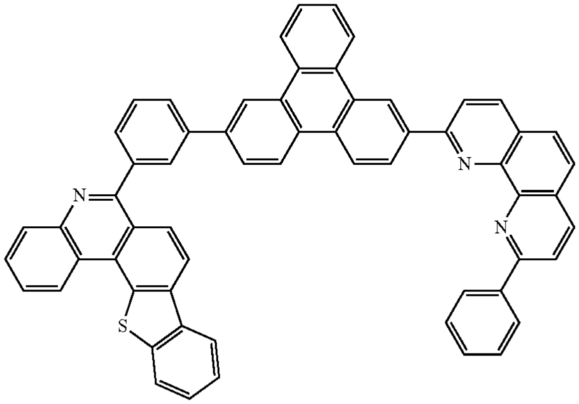
8-14
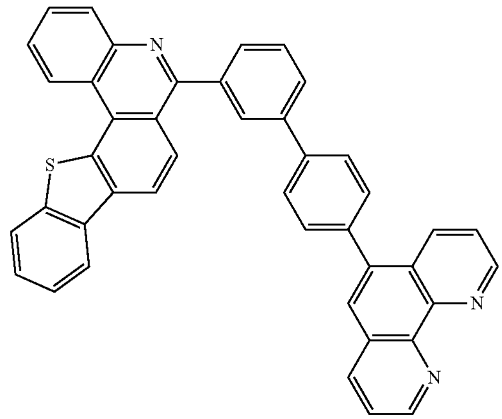
8-15
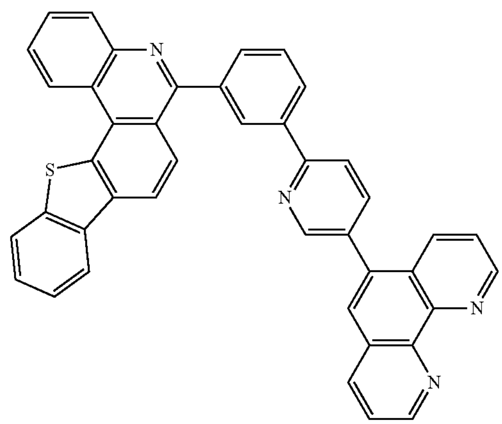
8-16
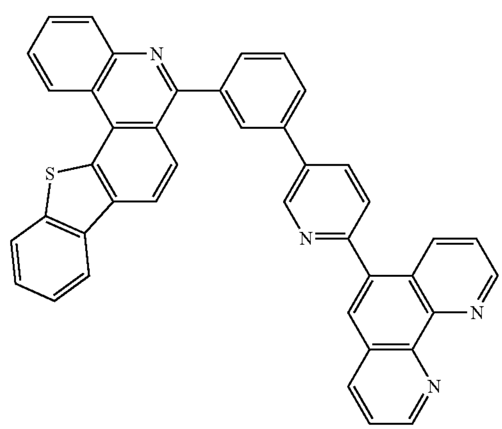

8-17
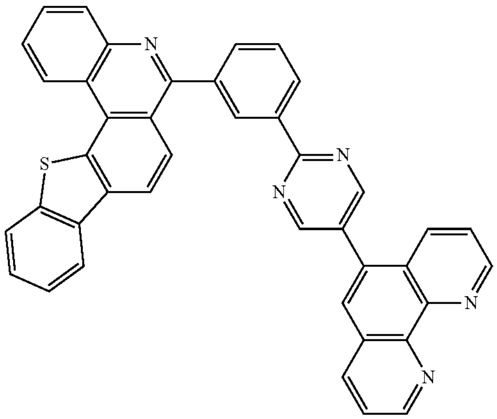
8-18
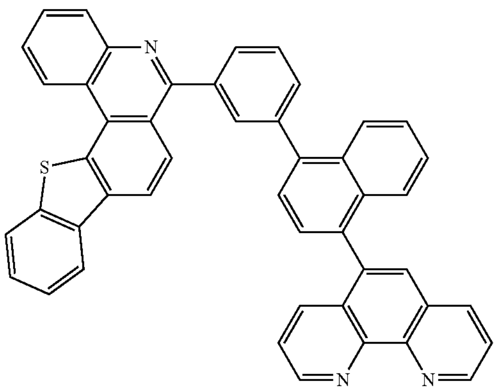
8-19
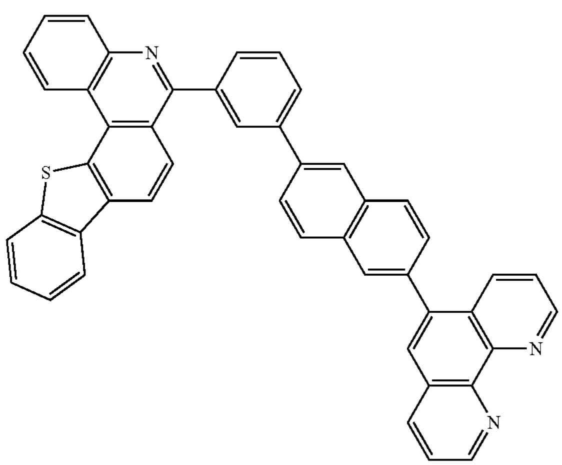
8-20
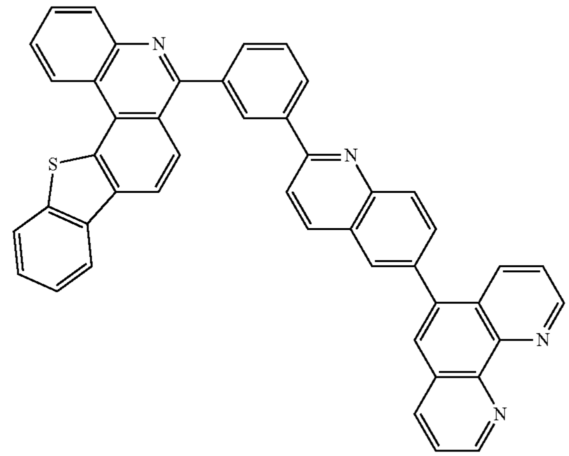
8-21
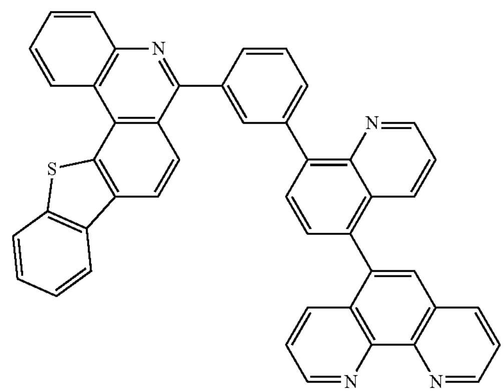
8-22
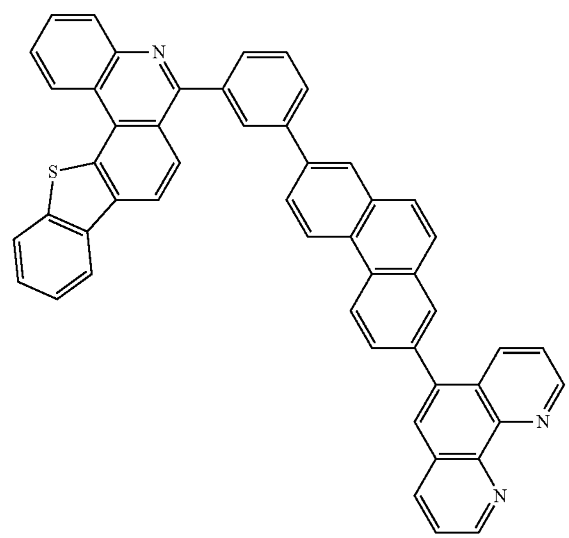

8-23
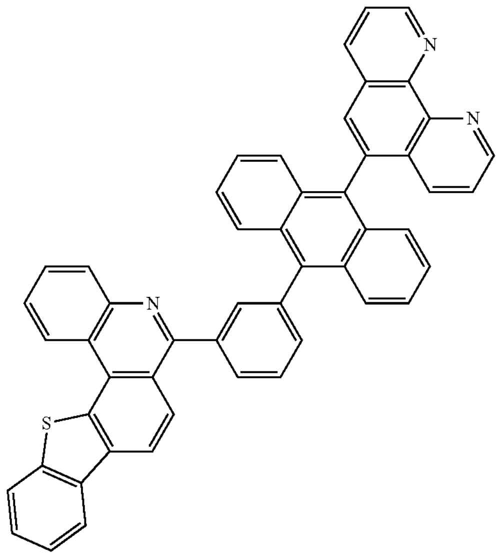
8-24
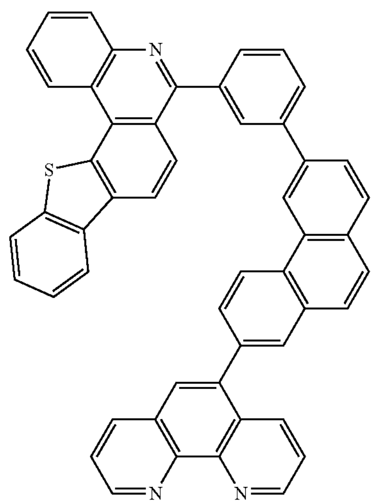
8-25
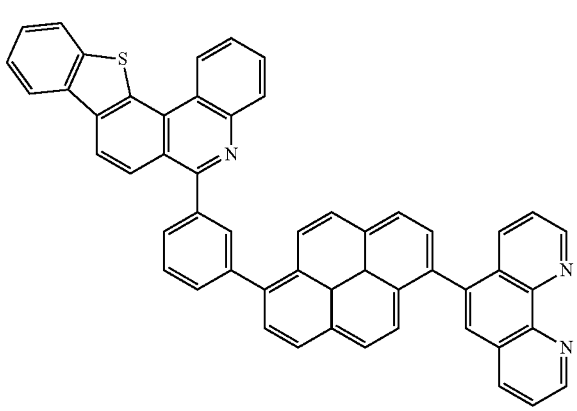
8-26
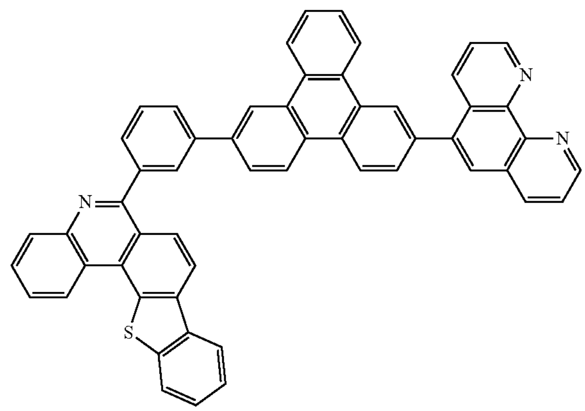
8-27
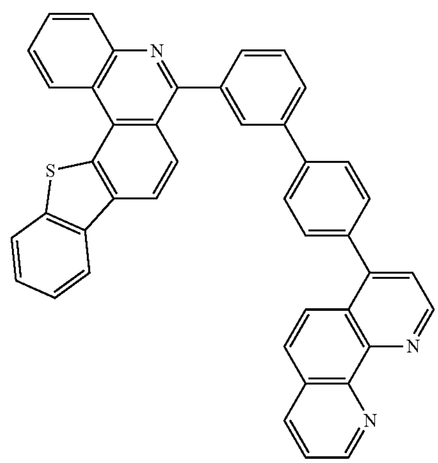
8-28
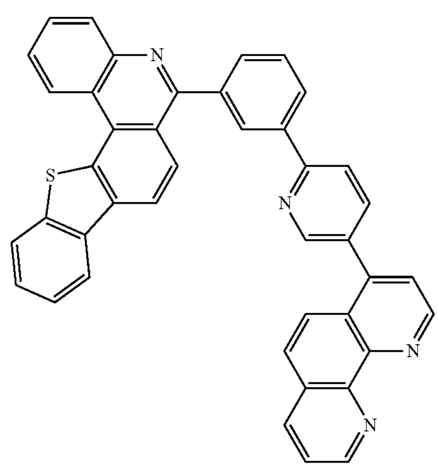

-continued
8-29
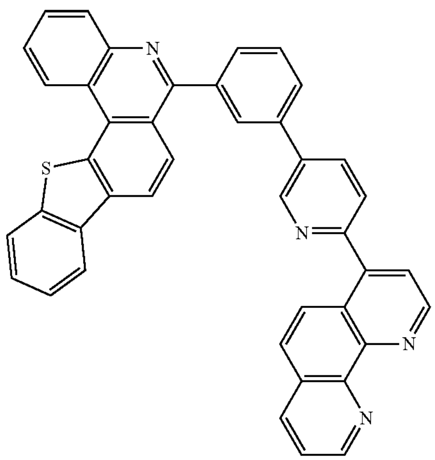
8-30
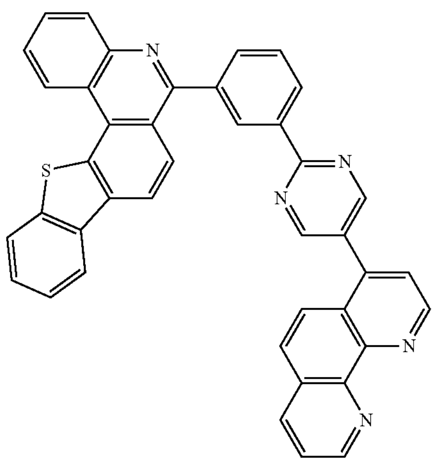
8-31
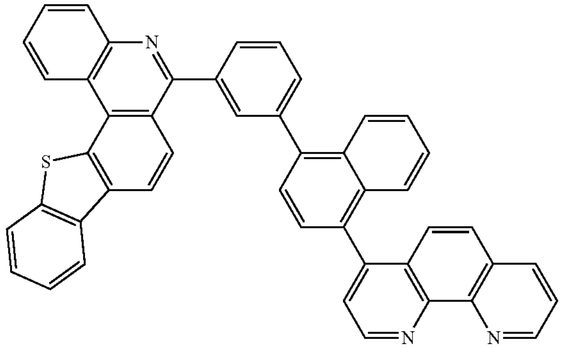
-continued
8-32
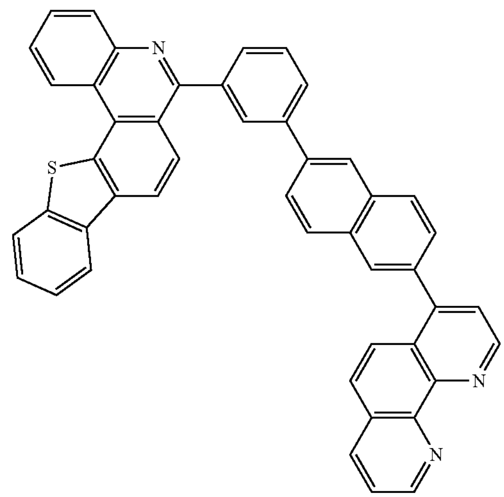
8-33
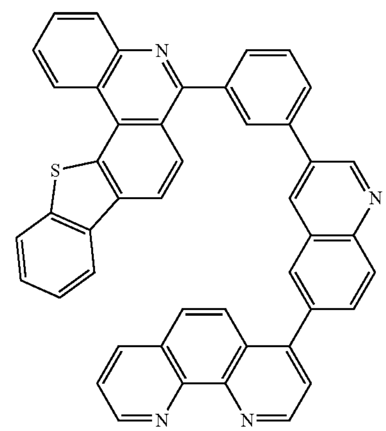
8-34
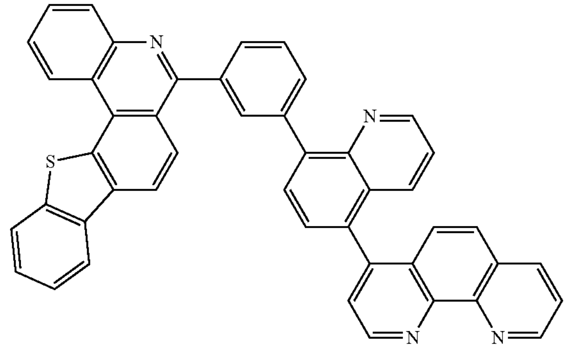

-continued
8-35
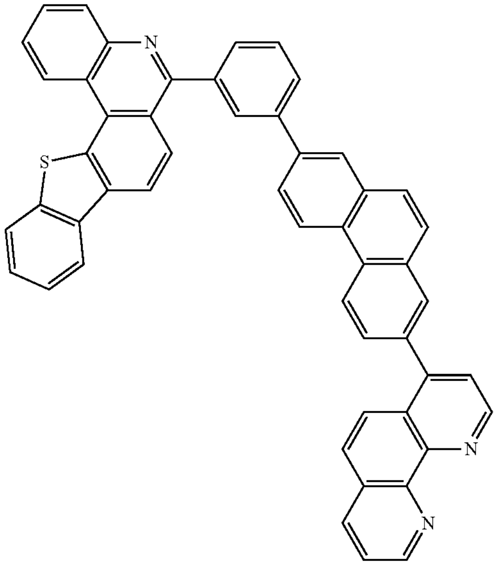
8-36
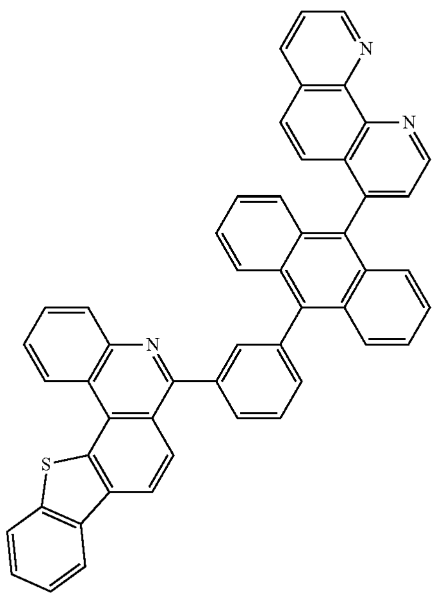
8-37
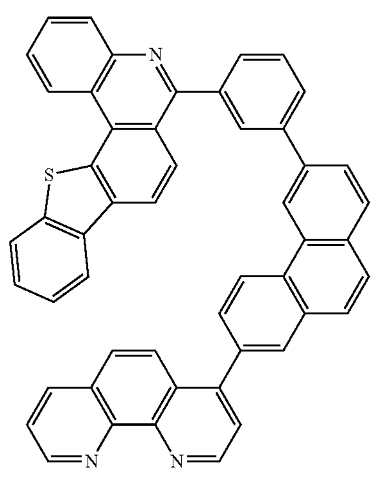
-continued
8-38
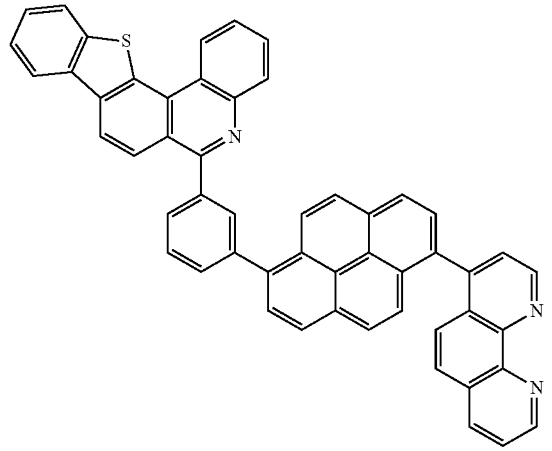
8-39
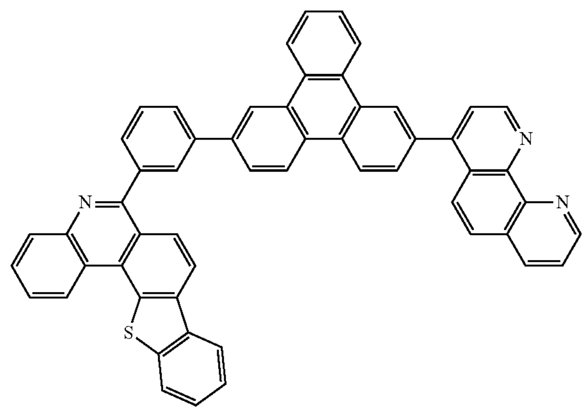
9-1
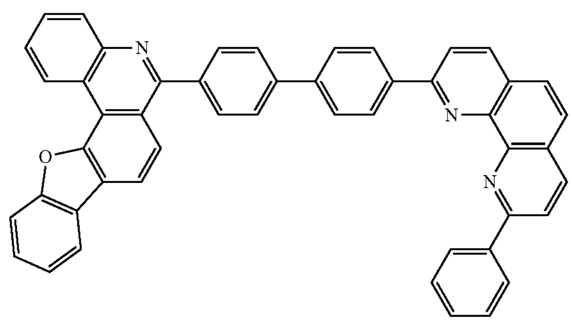
9-2
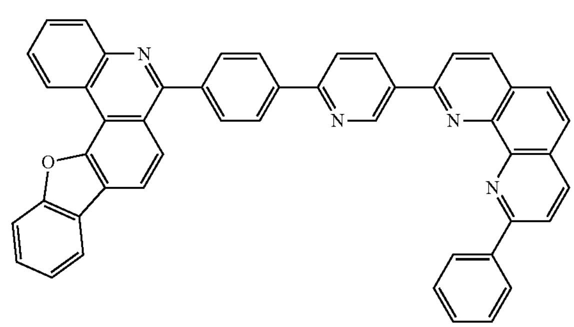

-continued
9-3
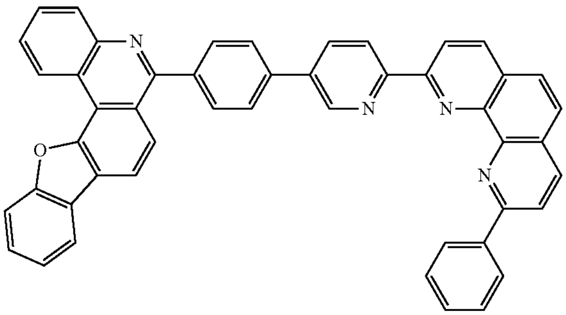
9-4
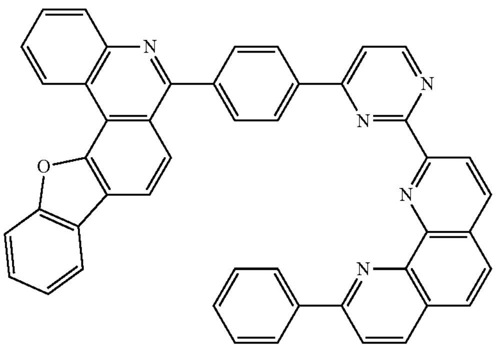
9-5
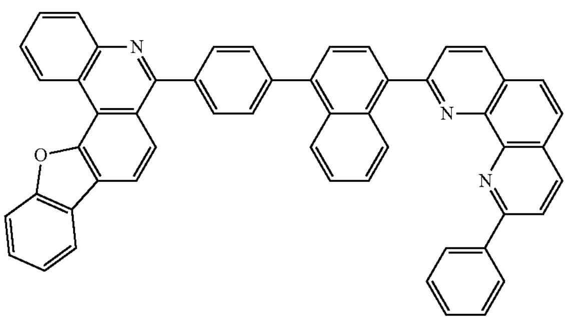
9-6
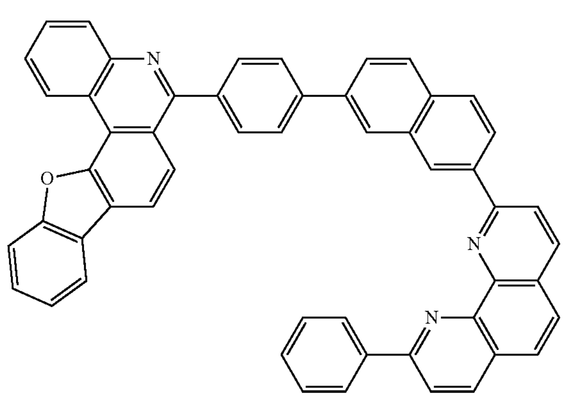
-continued
9-7
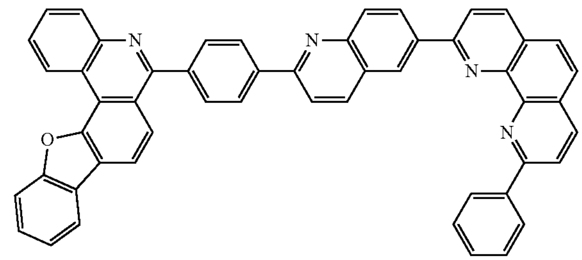
9-8
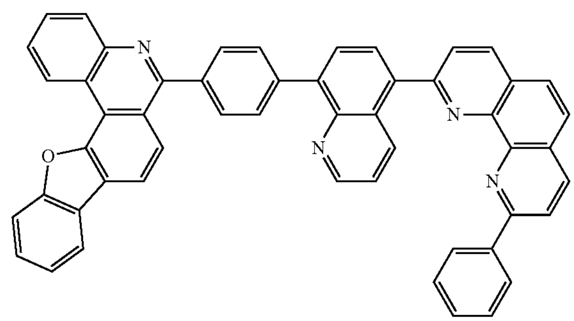
9-9
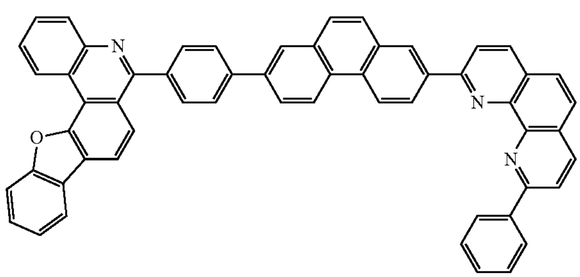
9-10
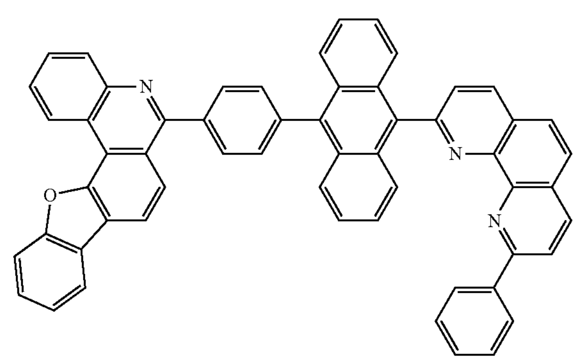

-continued
9-11
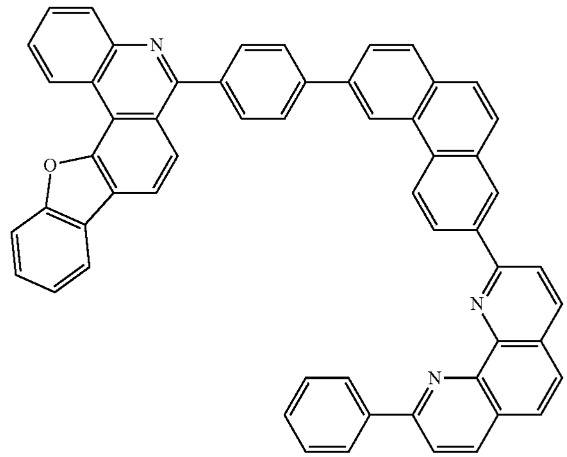
9-12
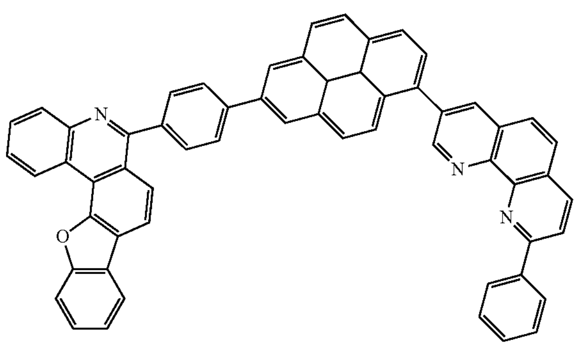
9-13
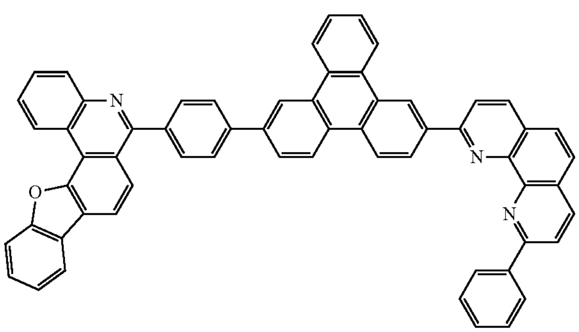
9-14
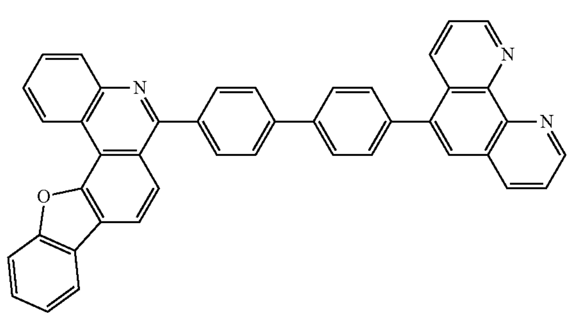
-continued
9-15
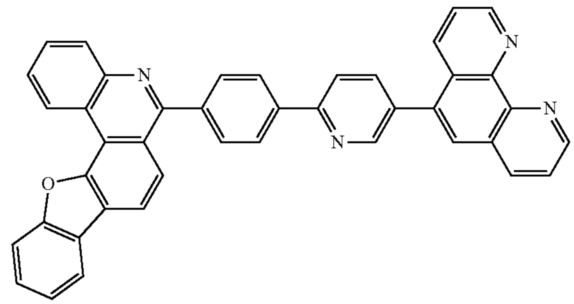
9-16
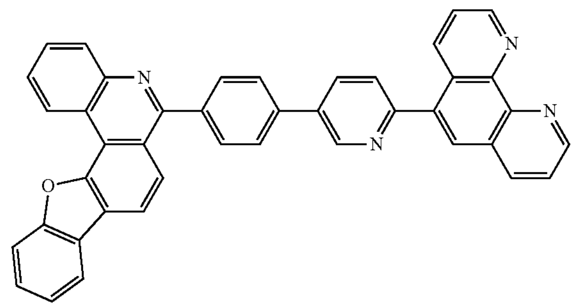
9-17
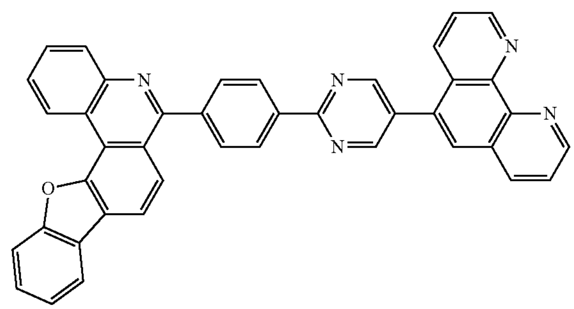
9-18
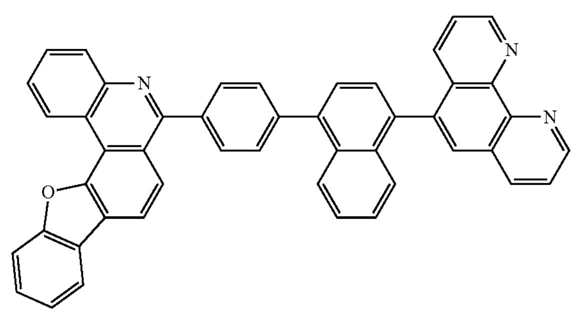
9-19
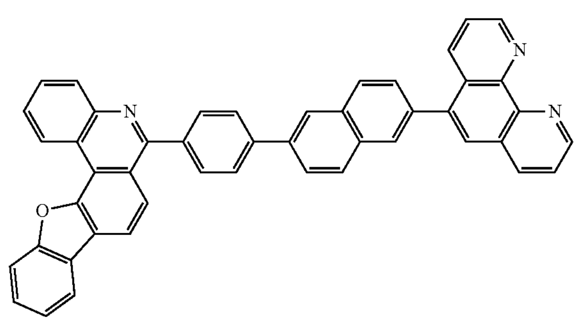

-continued
9-20
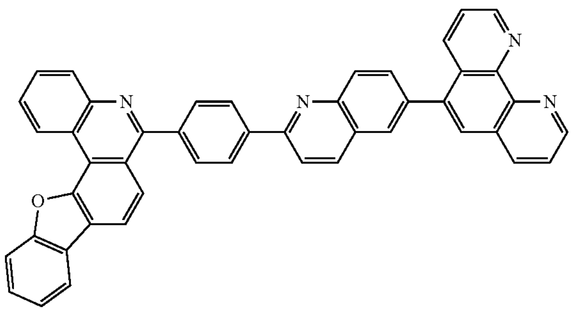
9-21
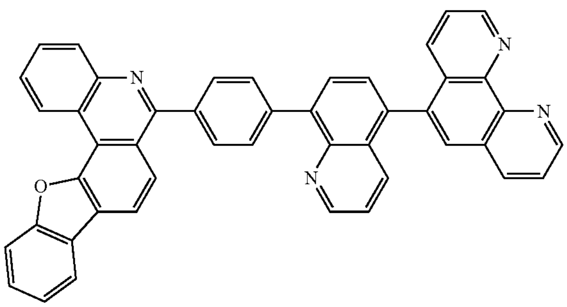
9-22
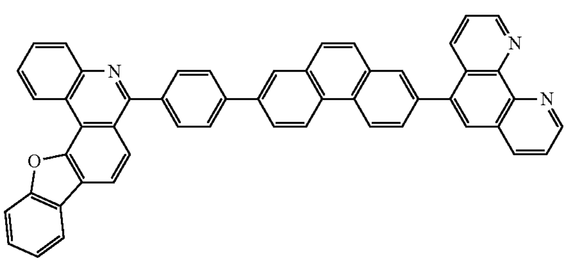
9-23
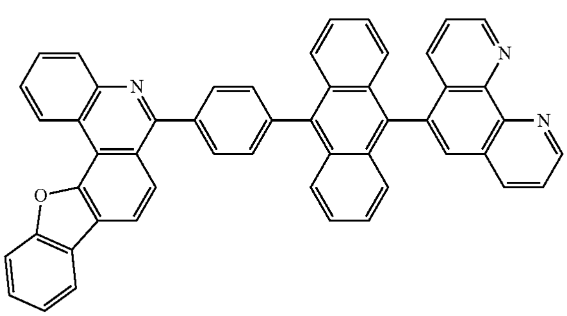
-continued
9-24
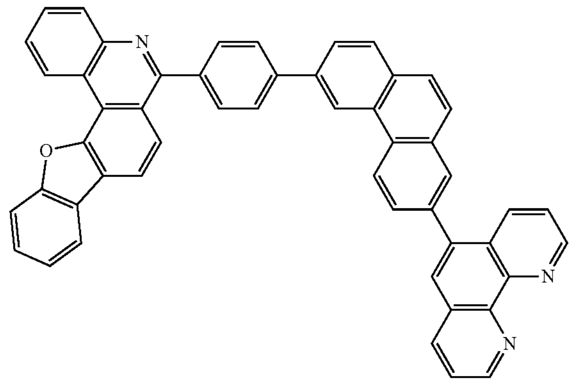
9-25
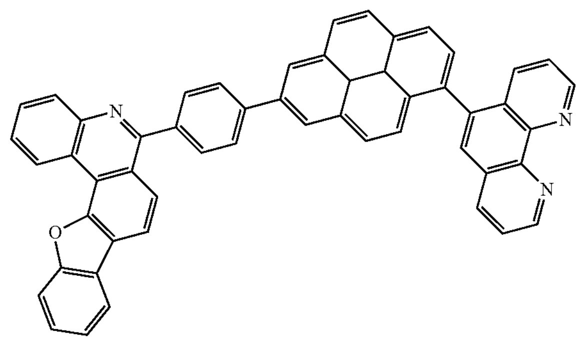
9-26
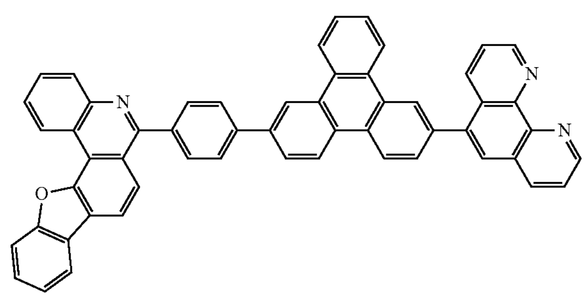
9-27
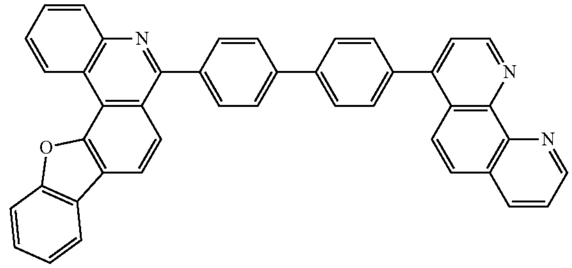

-continued
9-28
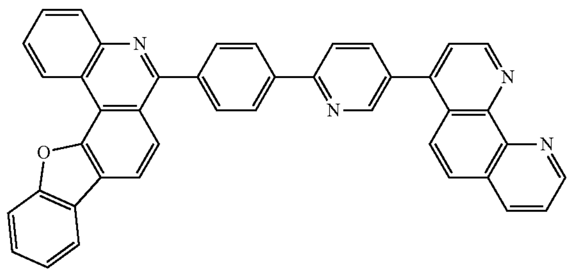
9-29
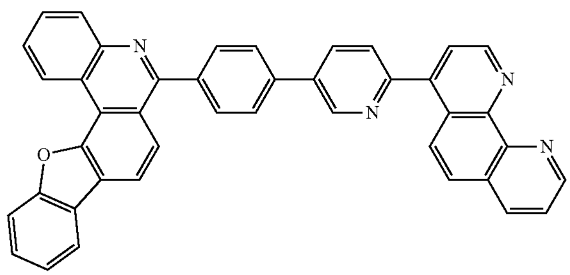
9-30
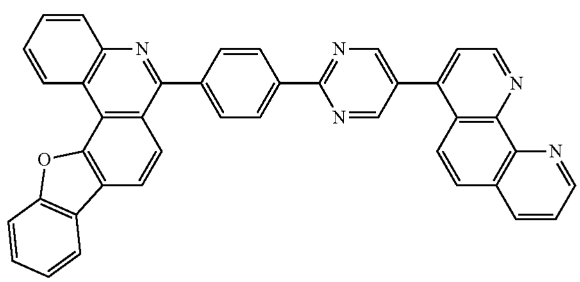
9-31
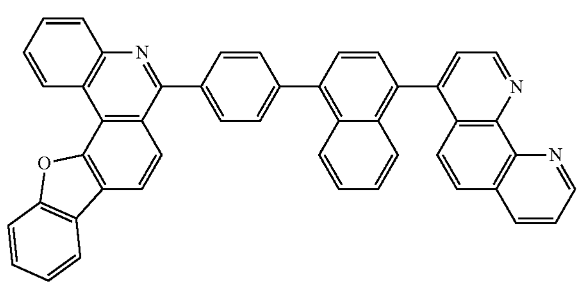
9-32
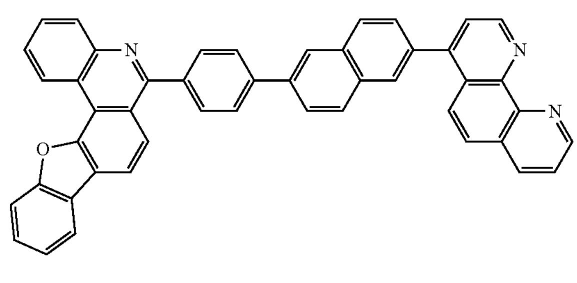
-continued
9-33
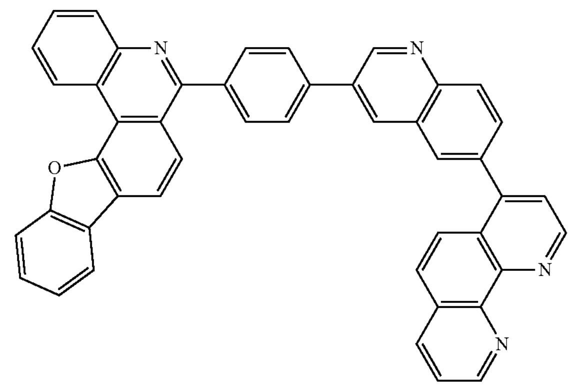
9-34
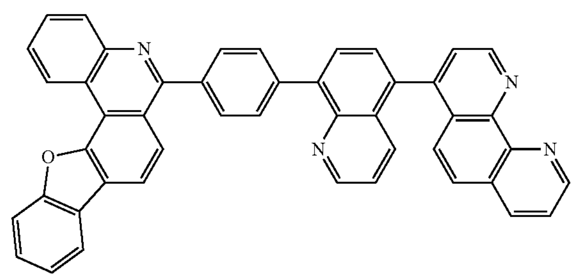
9-35
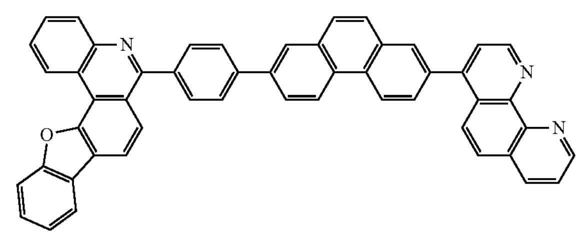
9-36
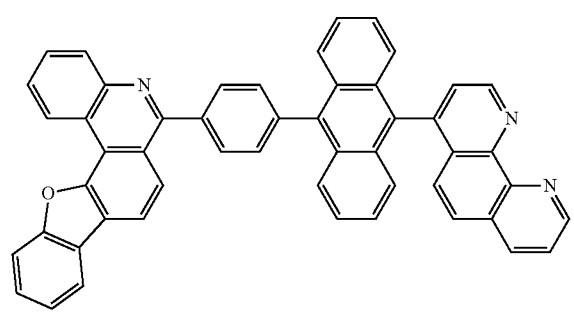

9-37
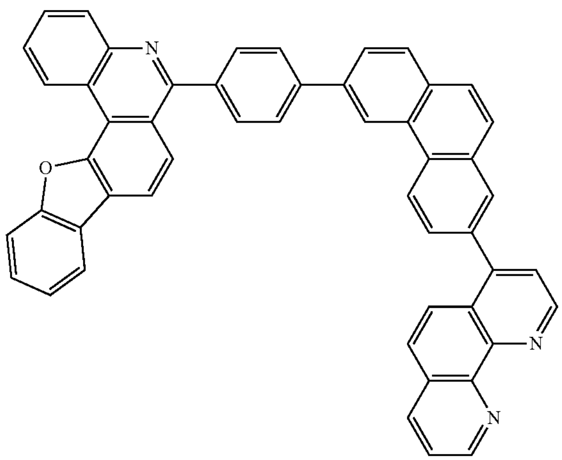
9-38
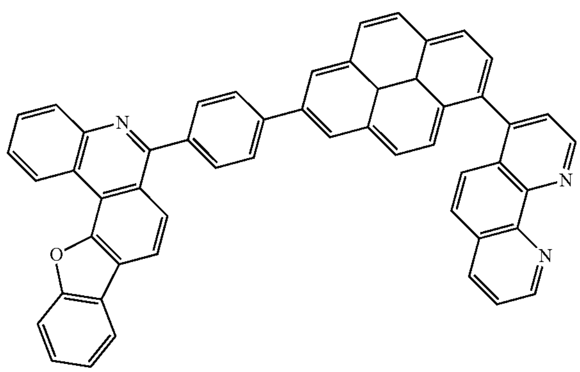
9-39
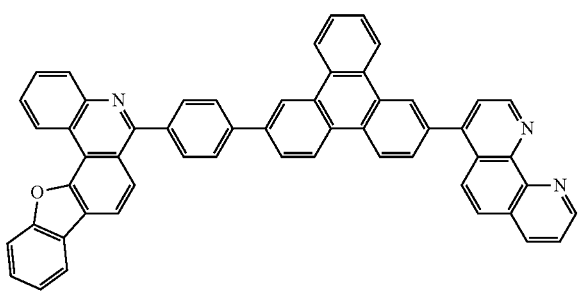
10-1
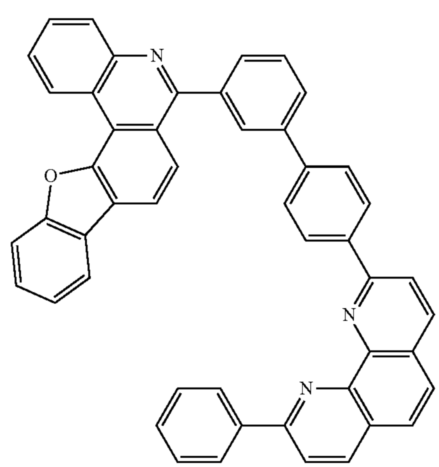
10-2
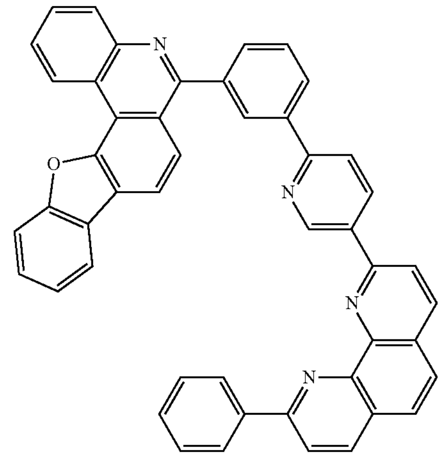
10-3
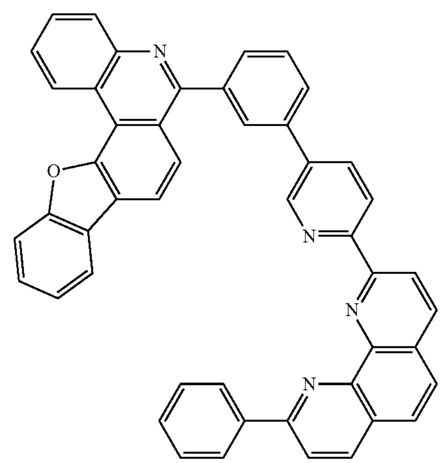
10-4
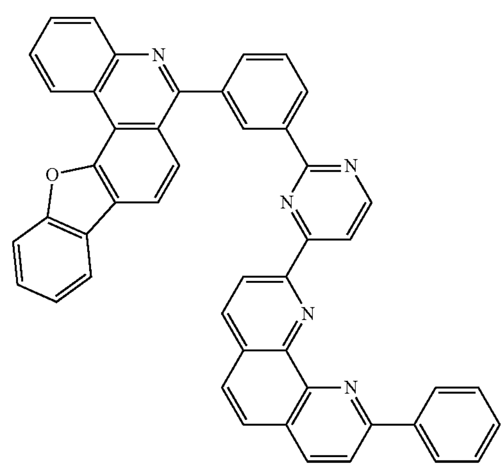

-continued
10-5
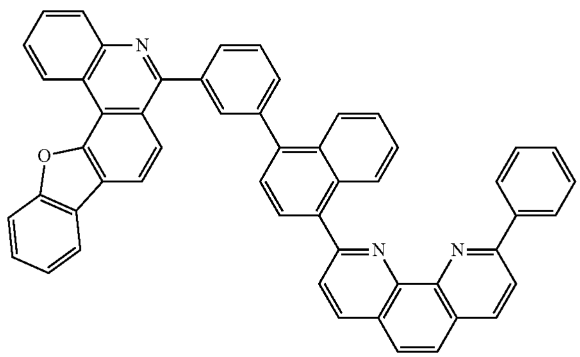
10-6
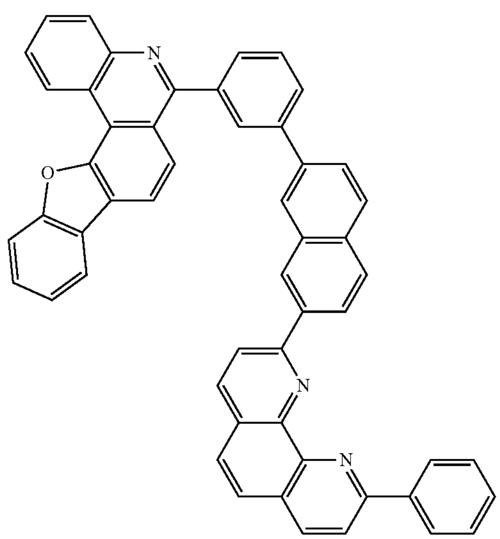
10-7
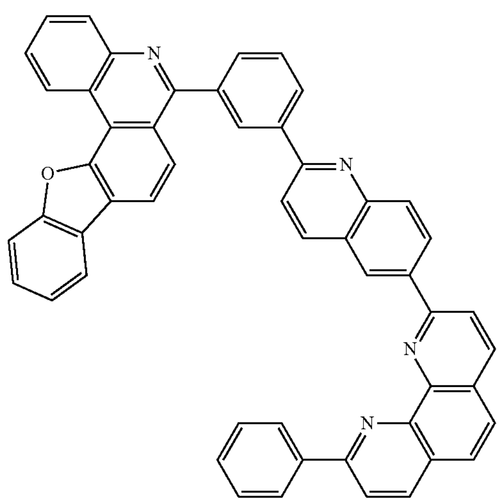
-continued
10-8
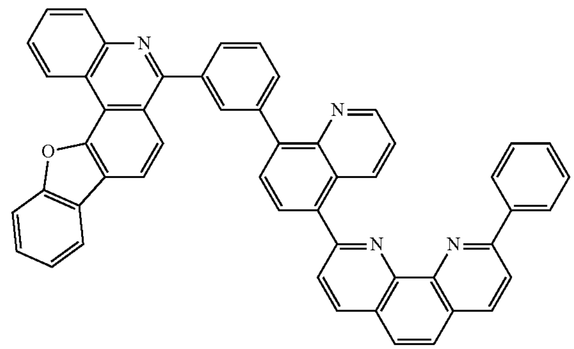
10-9
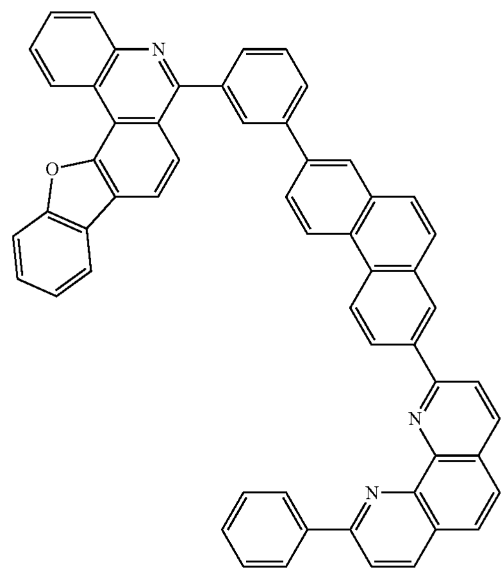
10-10
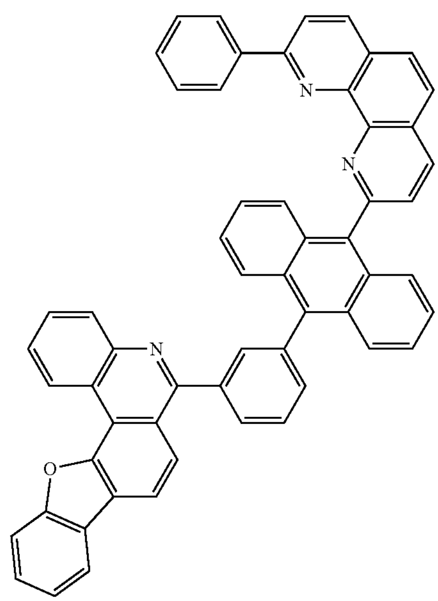

-continued
10-11
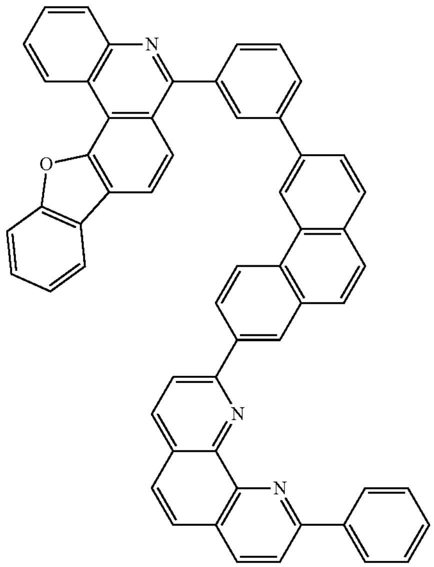
10-12
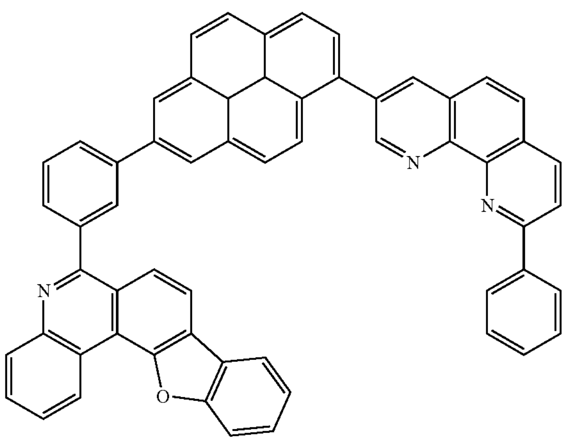
10-13
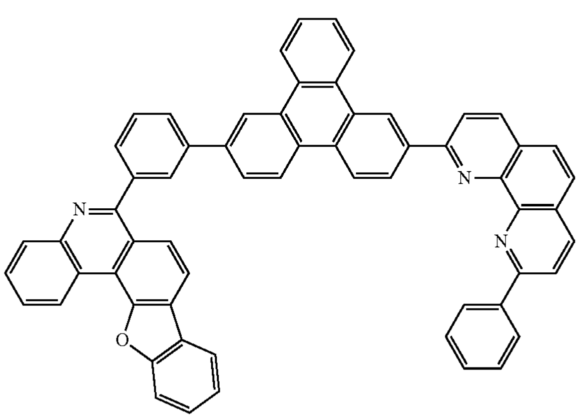
-continued
10-14
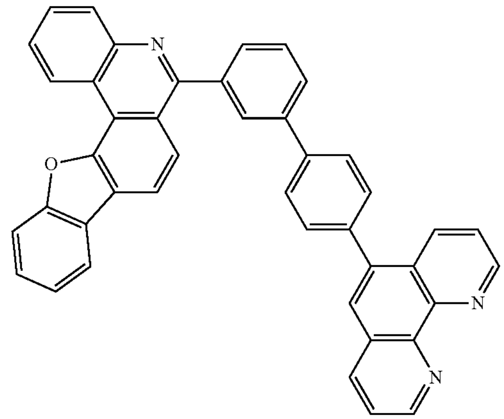
10-15
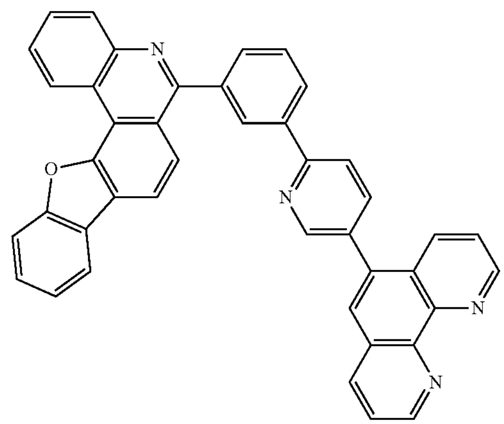
10-16
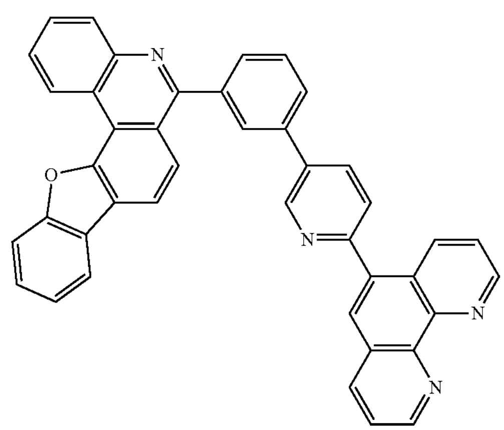

10-17
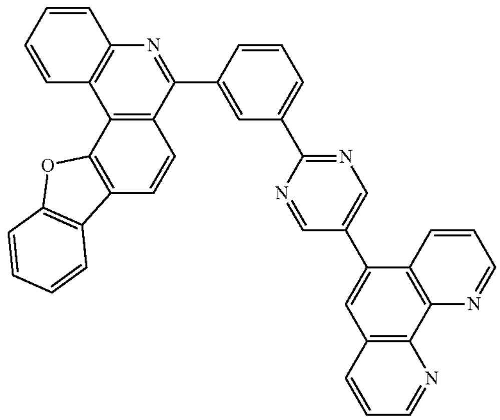
10-18
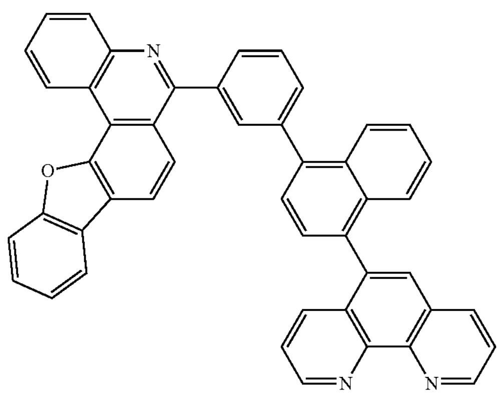
10-19
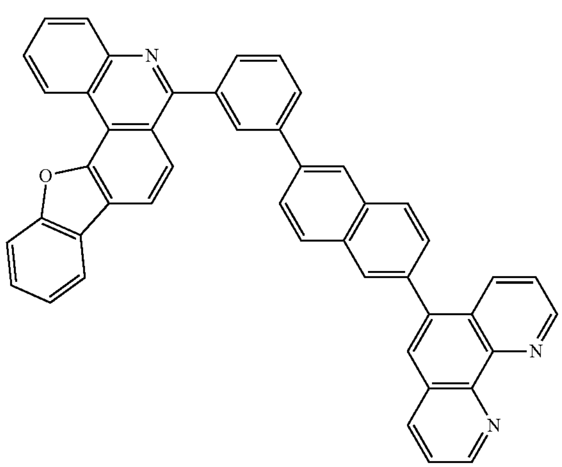
10-20
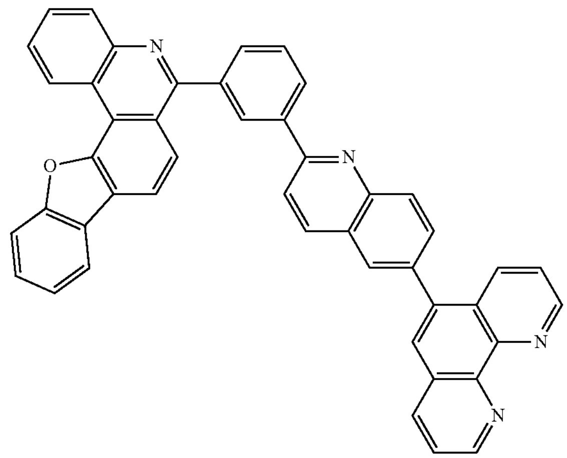
10-21
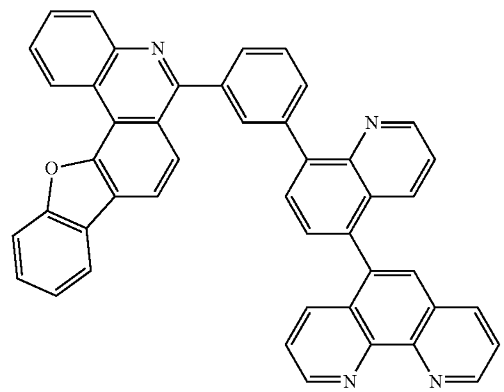
10-22
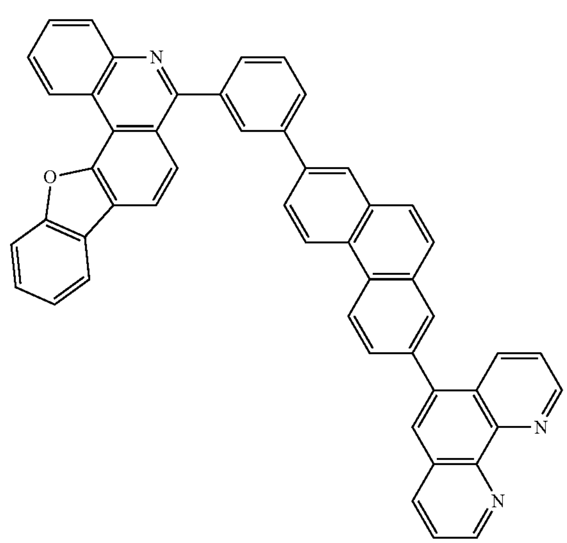

-continued
10-23
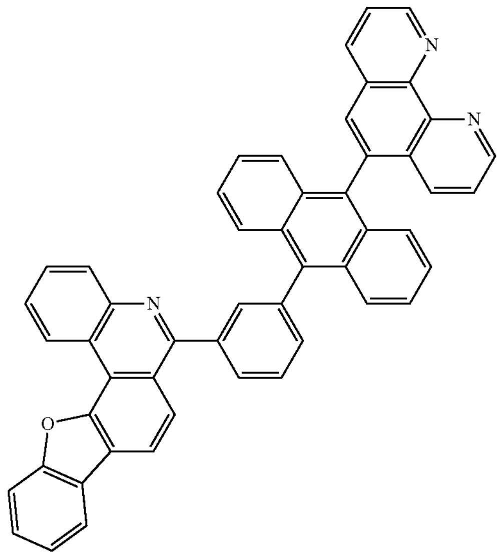
10-24
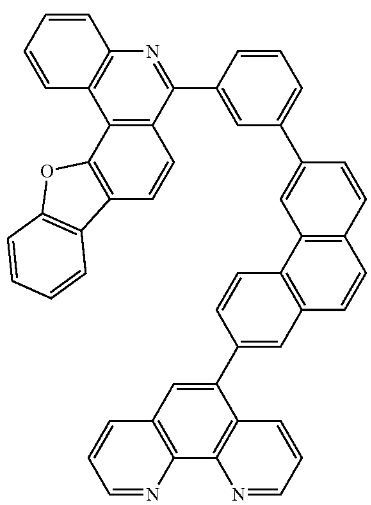
10-25
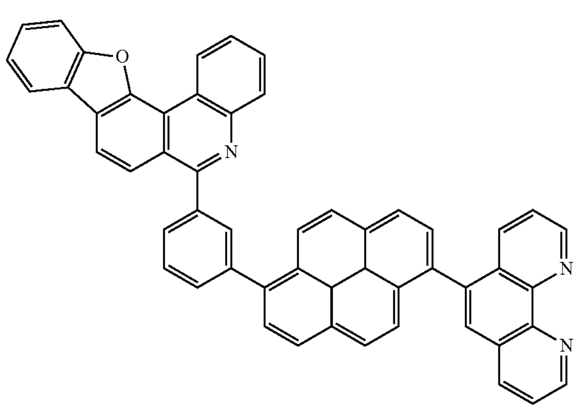
-continued
10-26
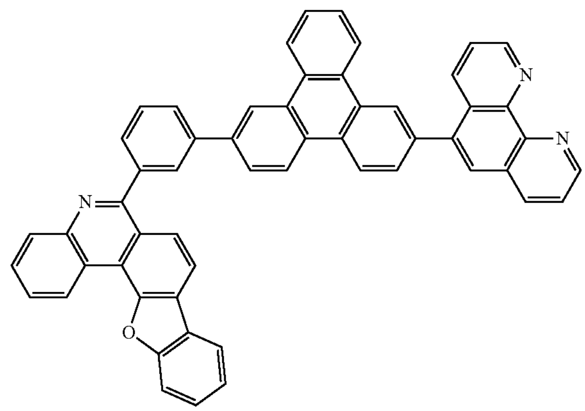
10-27
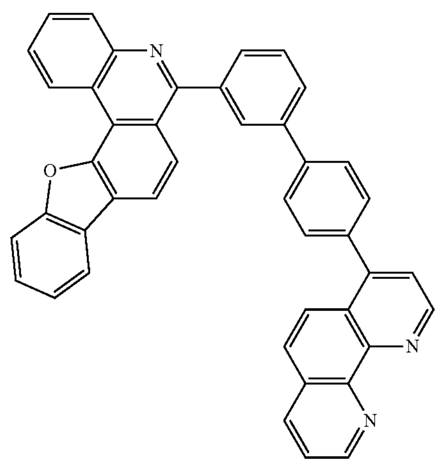
10-28
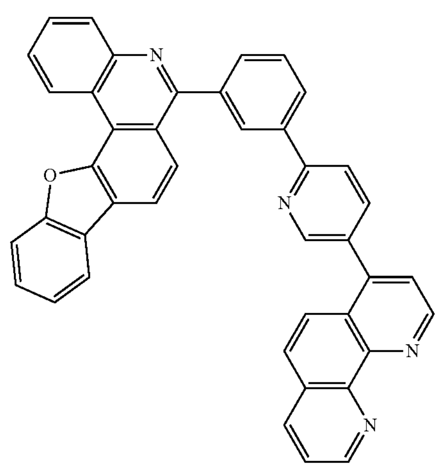

-continued
10-29
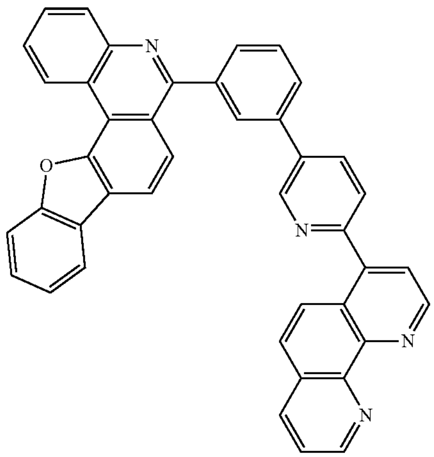
10-30
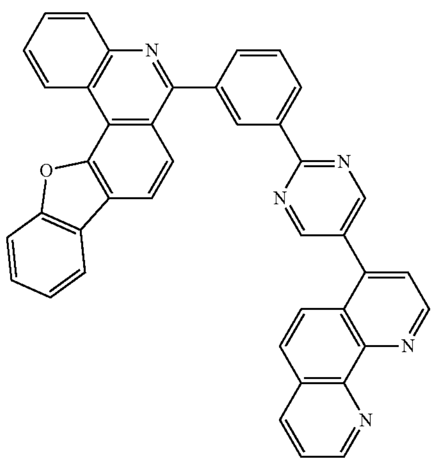
10-31
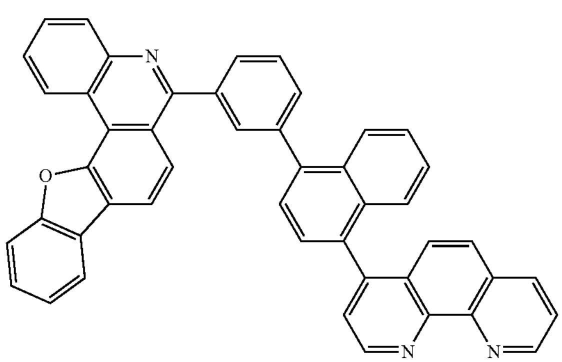
-continued
10-32
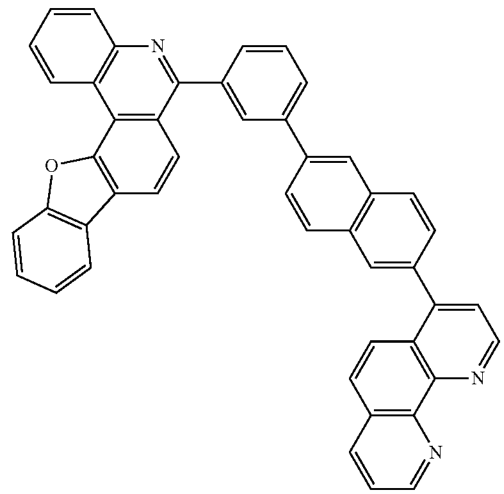
10-33
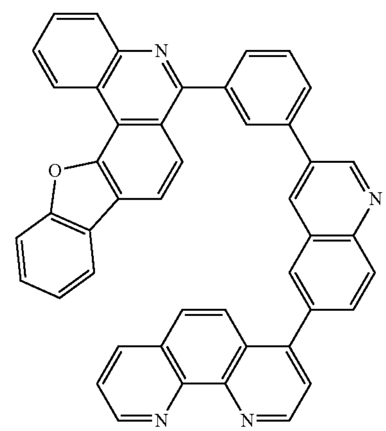
10-34
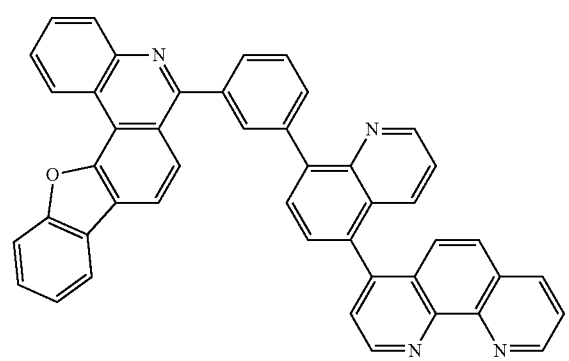

10-35
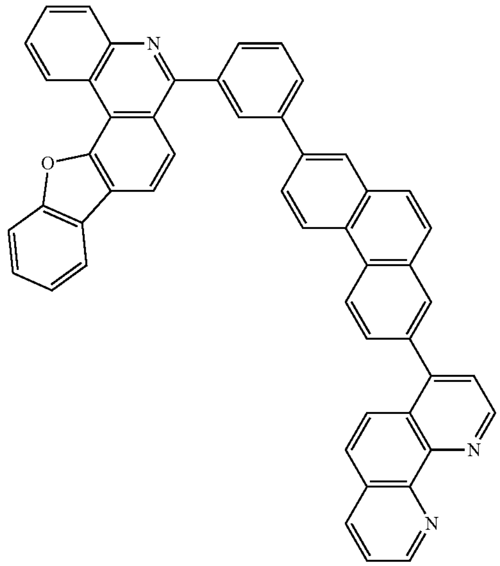
10-36
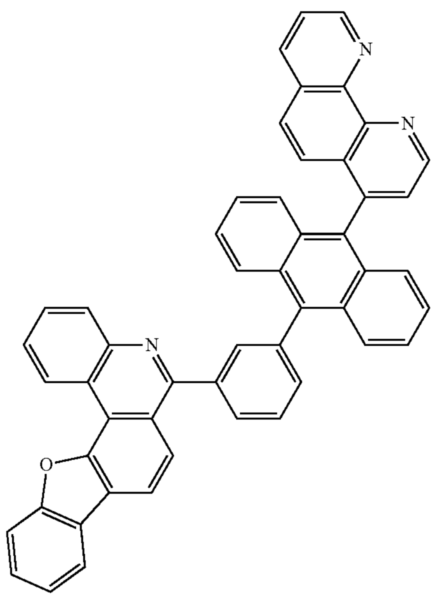
10-37
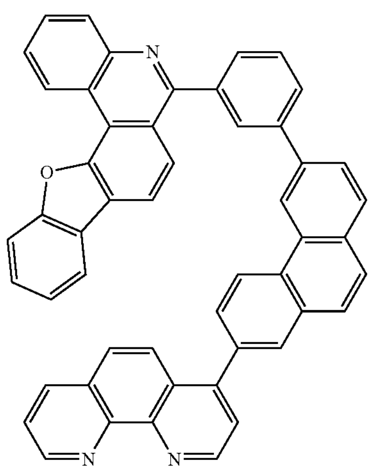
10-38
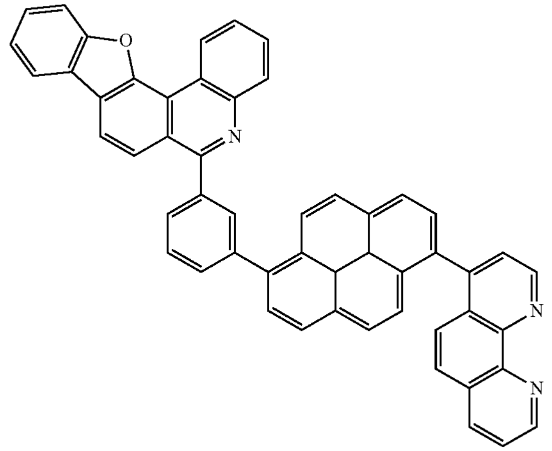
10-39
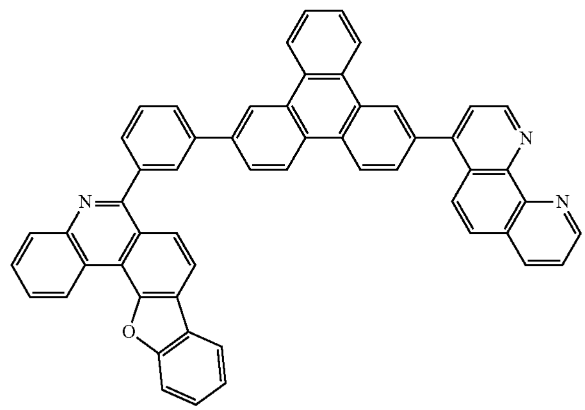
11-1
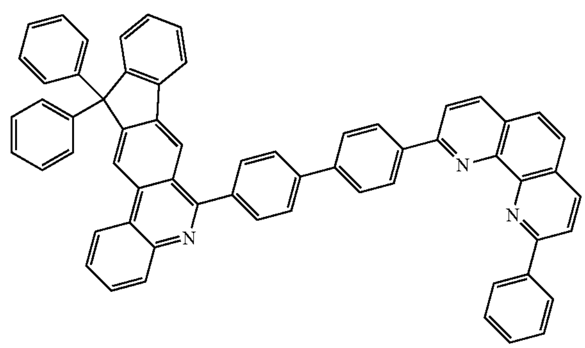
11-2
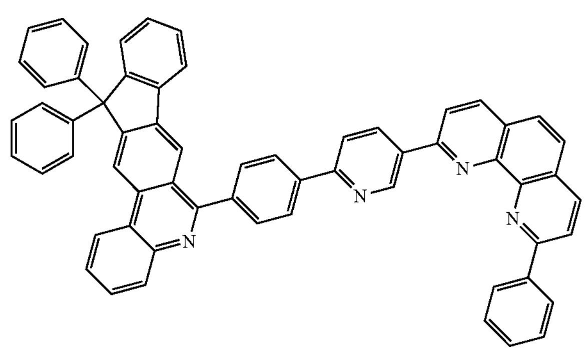

-continued
11-3
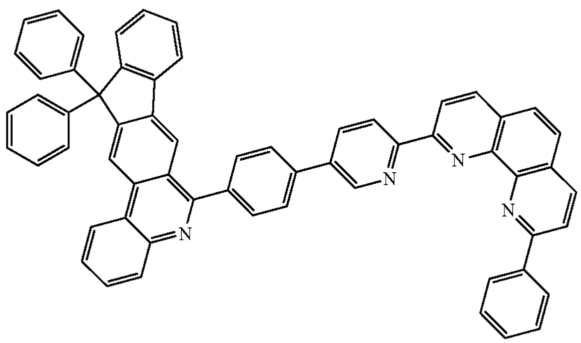
11-4
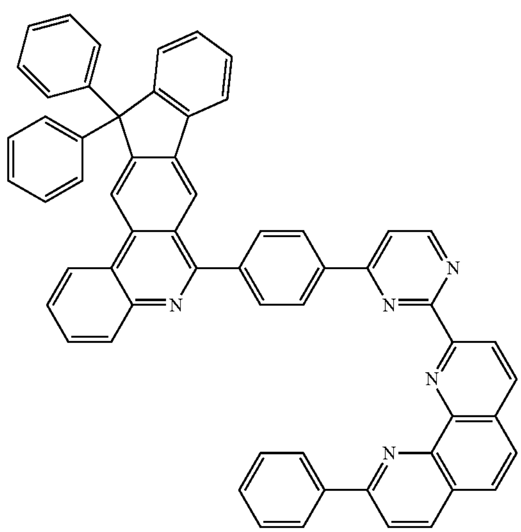
11-5
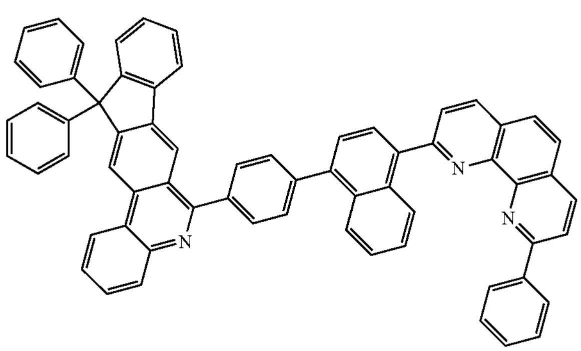
-continued
11-6
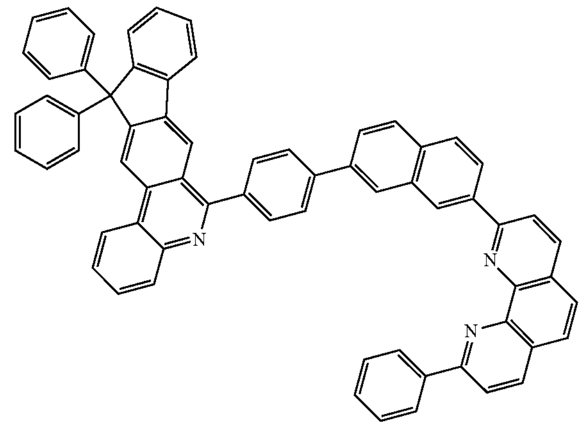
11-7
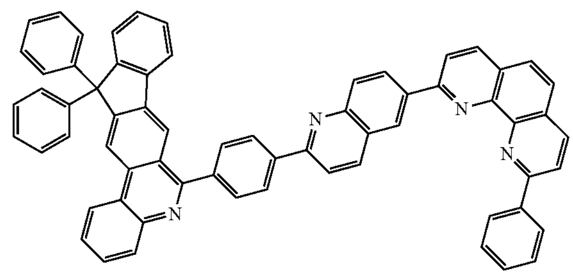
11-8
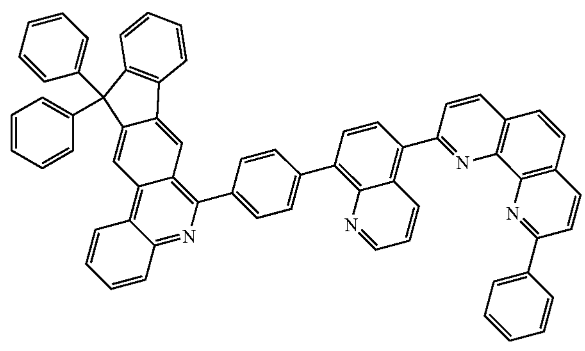
11-9
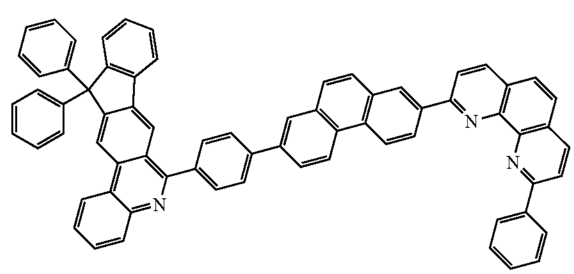

-continued
11-10
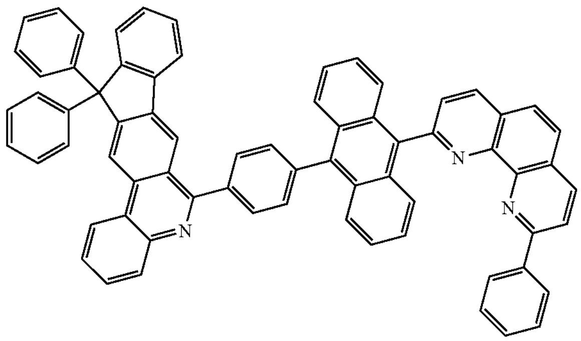
11-11
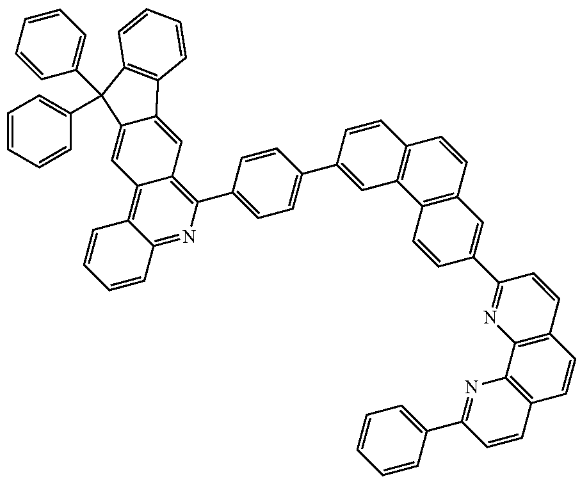
11-12
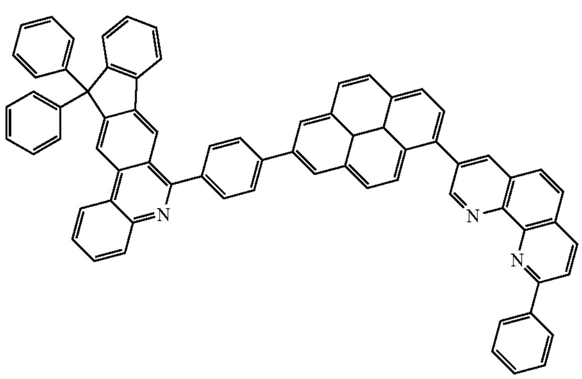
11-13
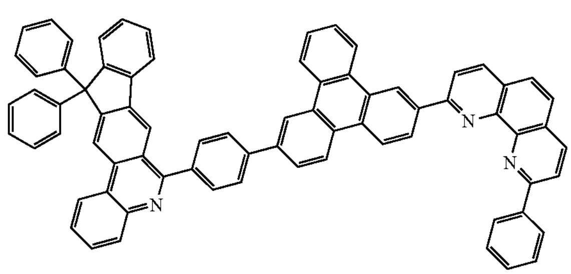
-continued
11-14
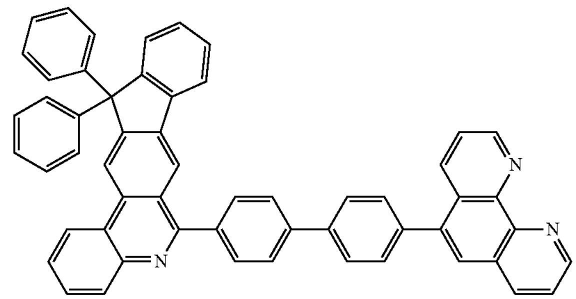
11-15
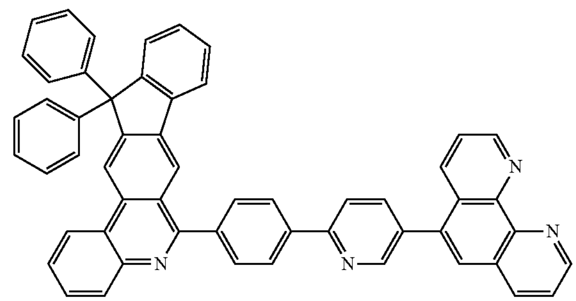
11-16
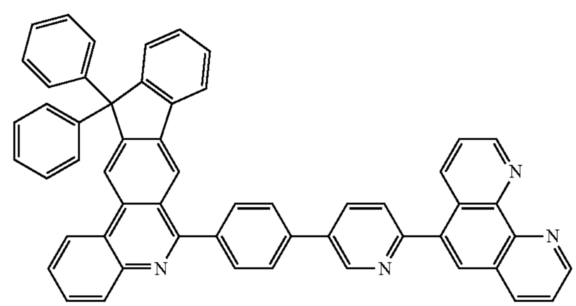
11-17
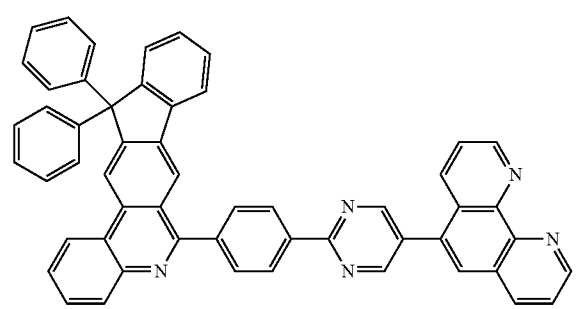
11-18
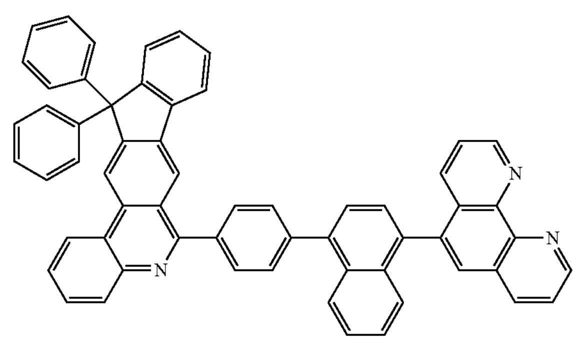

11-19
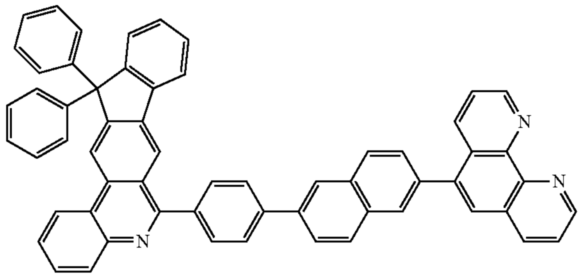
11-20
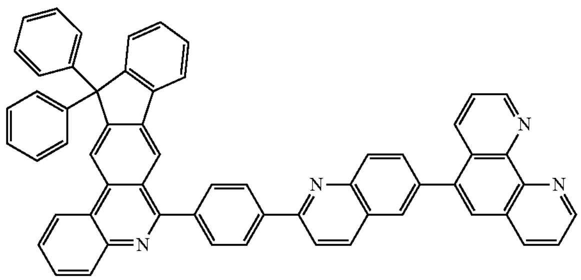
11-21
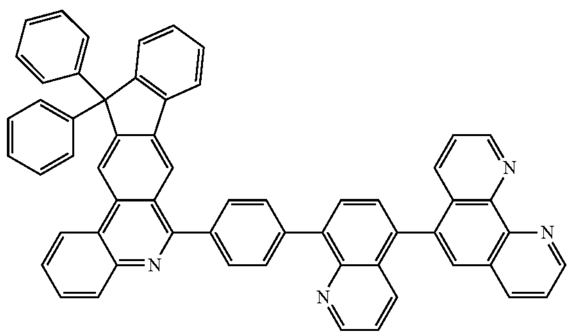
11-22
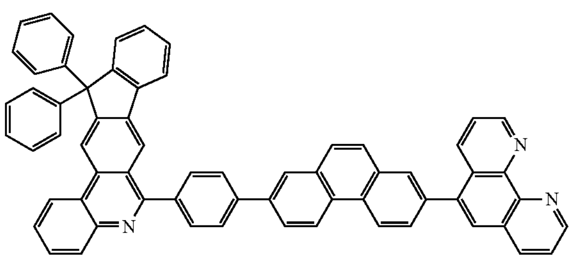
11-23
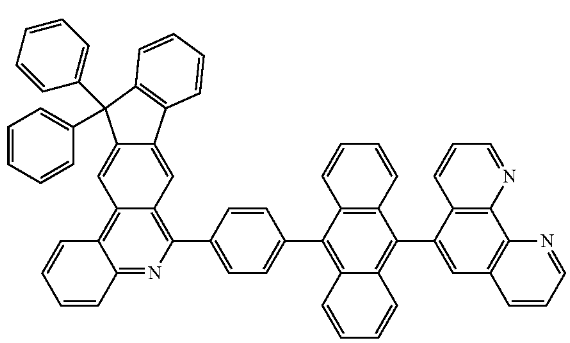
11-24
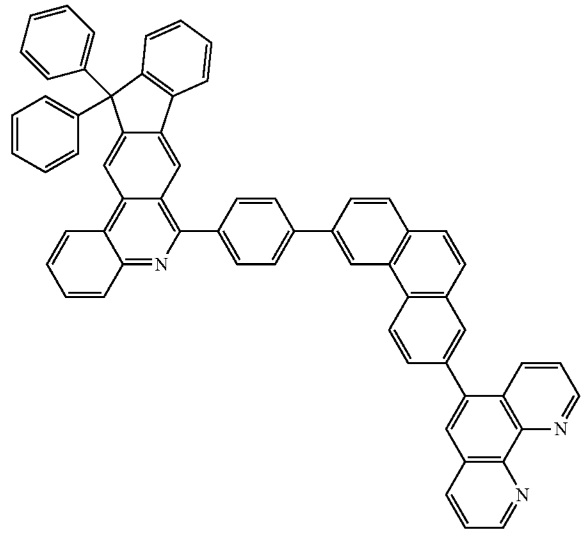
11-25
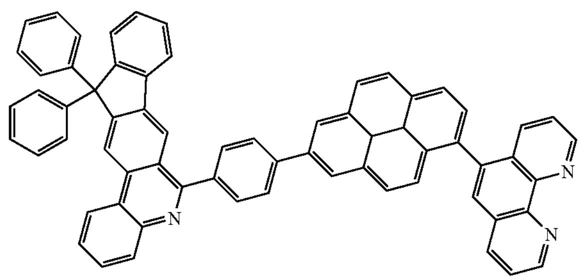
11-26
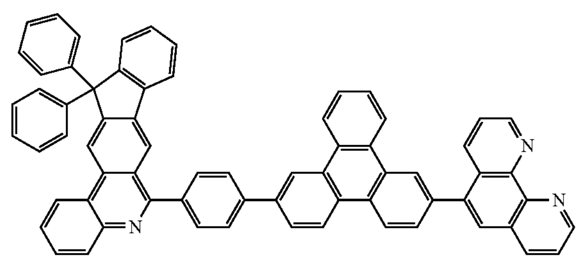
11-27
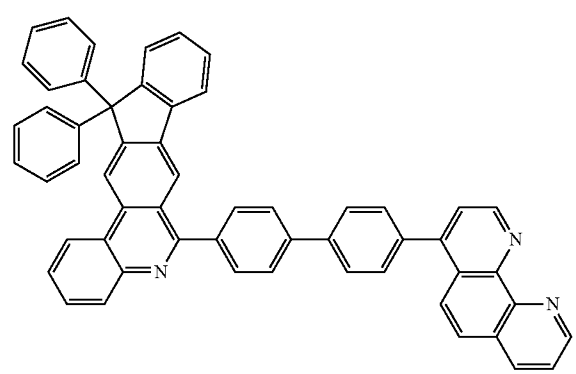

-continued
11-28
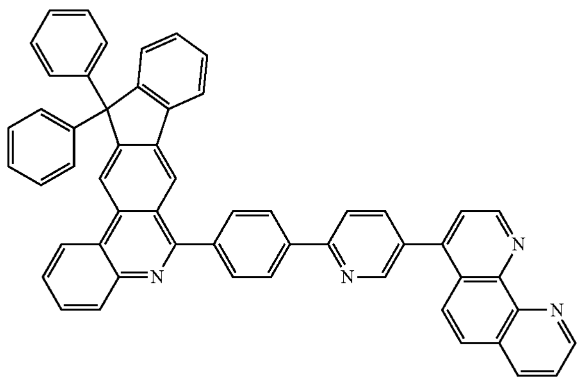
11-29
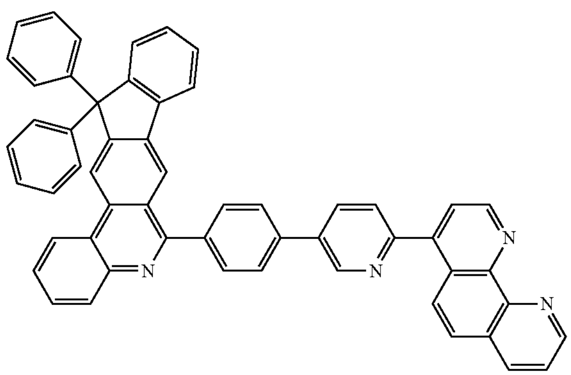
11-30
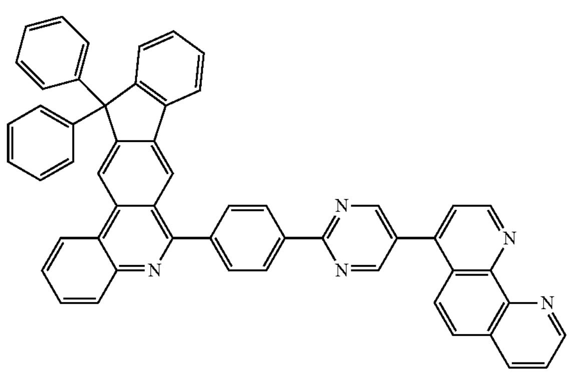
11-31
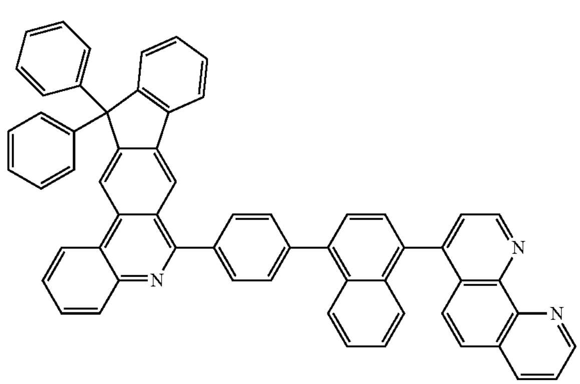
-continued
11-32
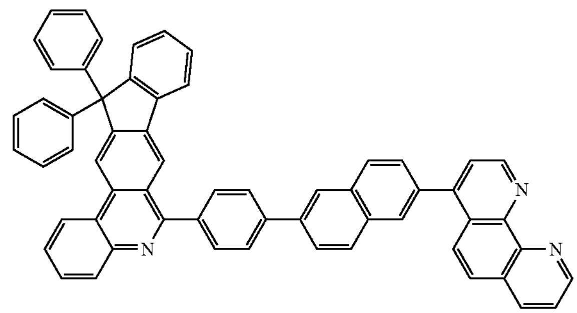
11-33
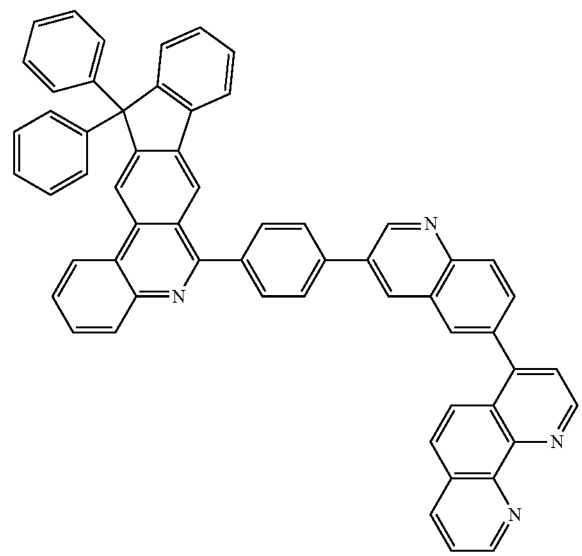
11-34
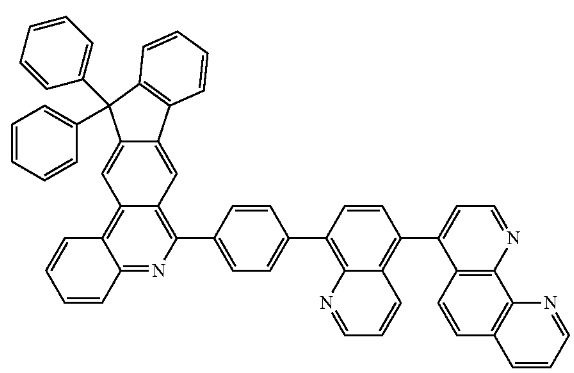
11-35
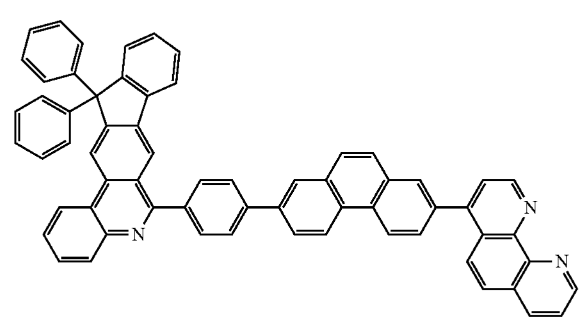

-continued
11-36
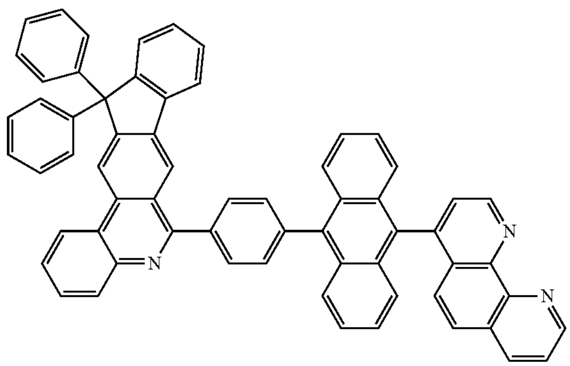
11-37
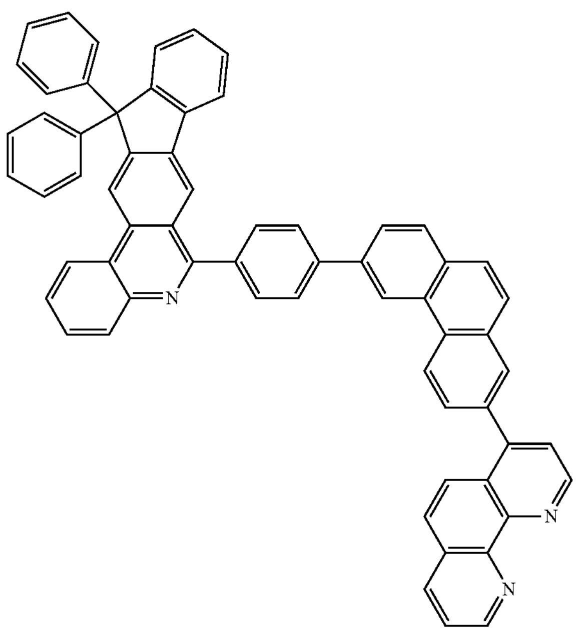
11-38
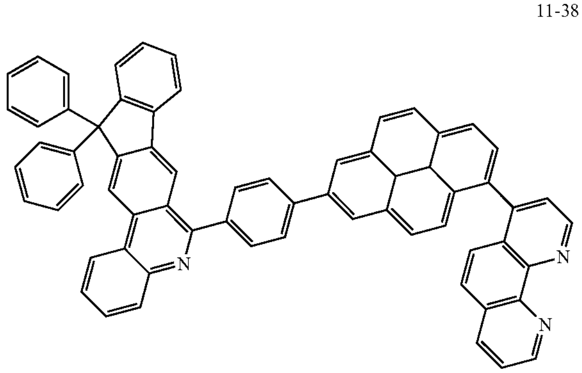
-continued
11-39
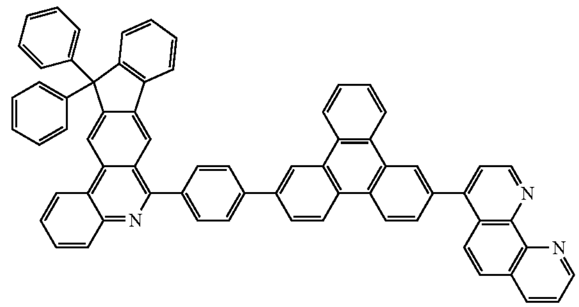
12-1
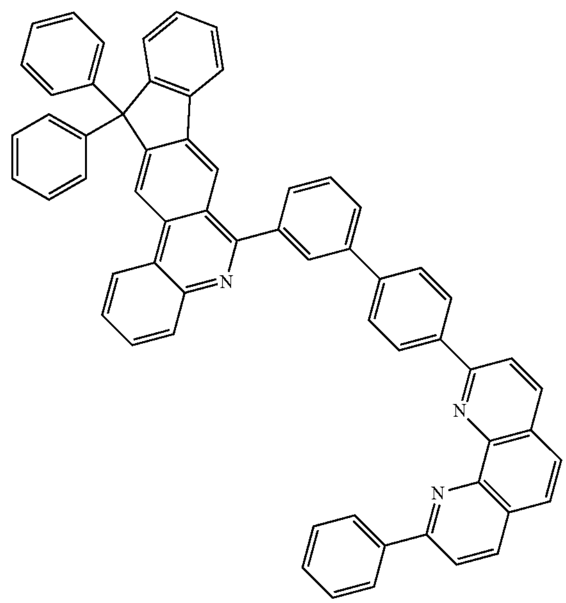
12-2
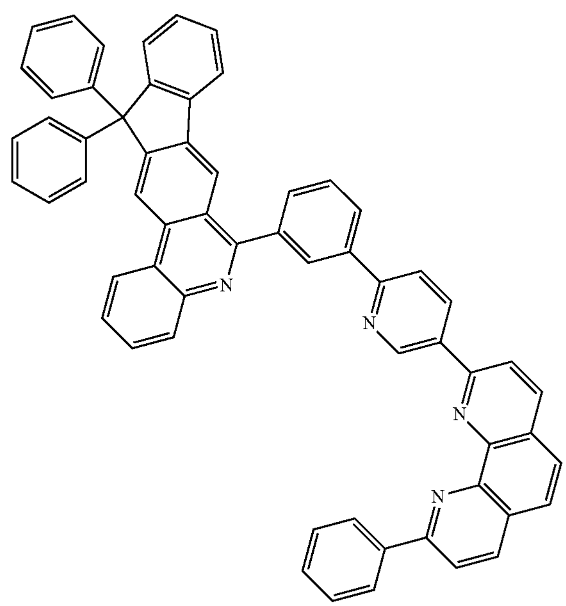

-continued
12-3
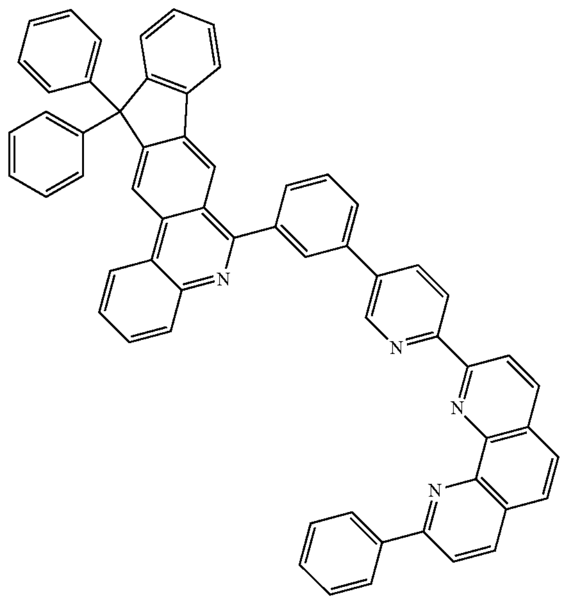
12-4
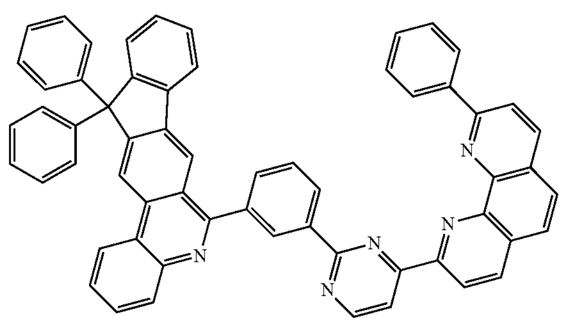
12-5
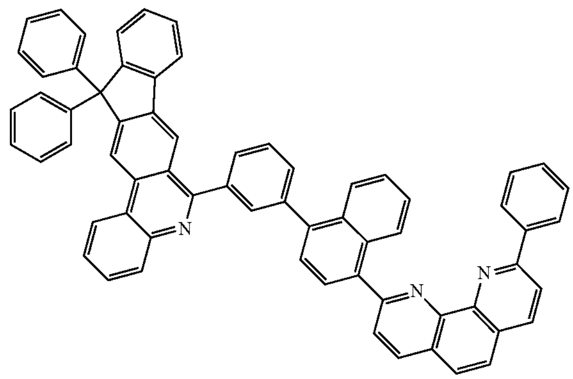
-continued
12-6
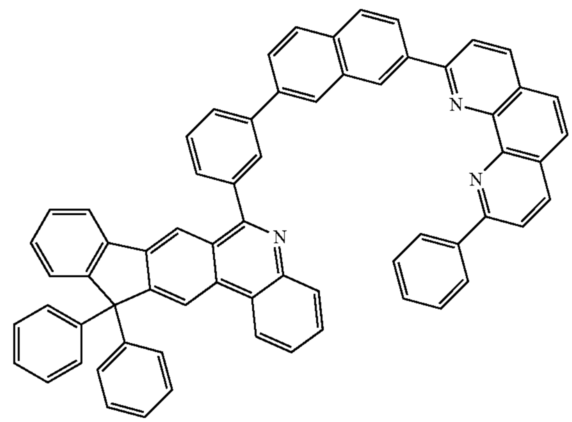
12-7
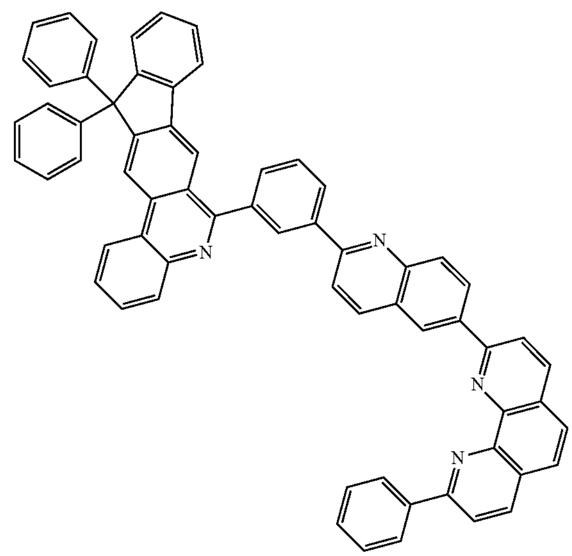
12-8
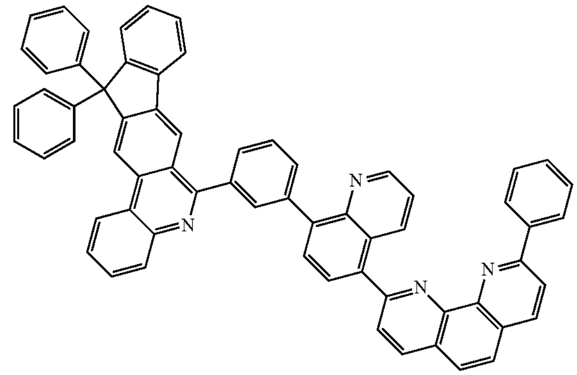

-continued
12-9
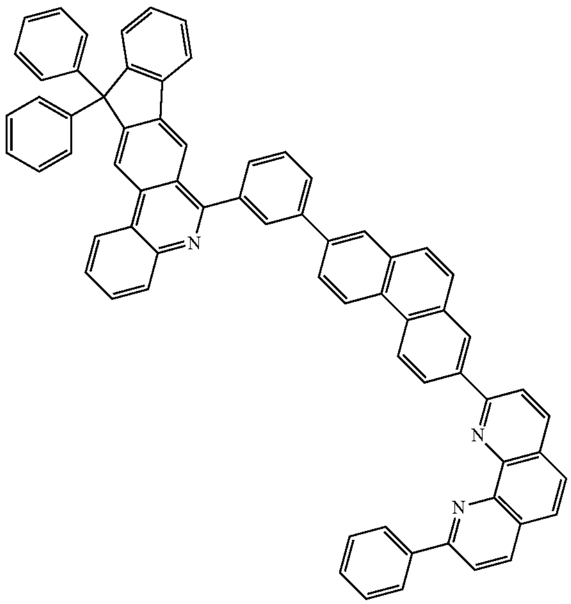
12-10
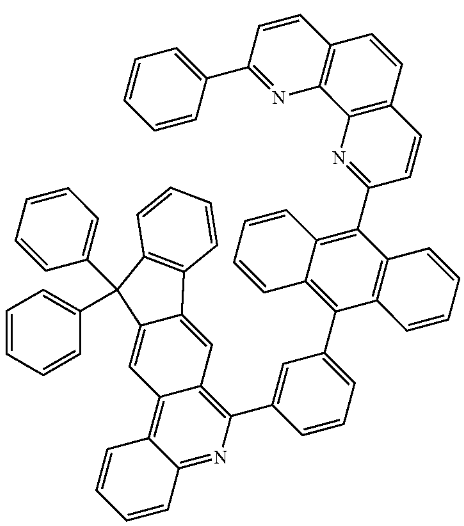
-continued
12-11
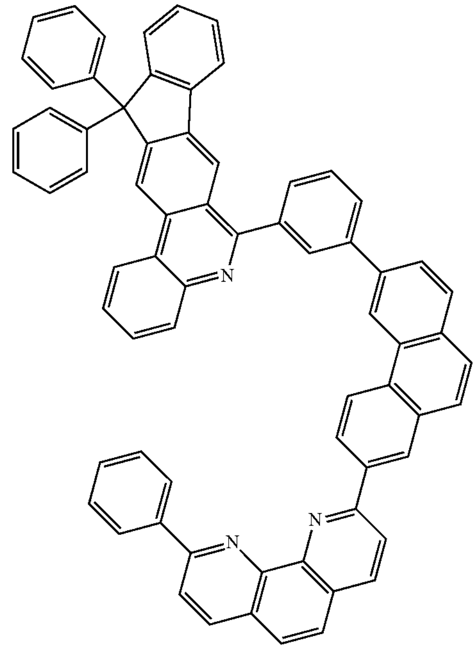
12-12
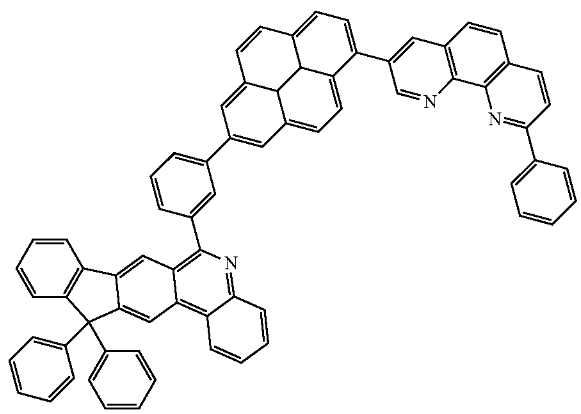
12-13
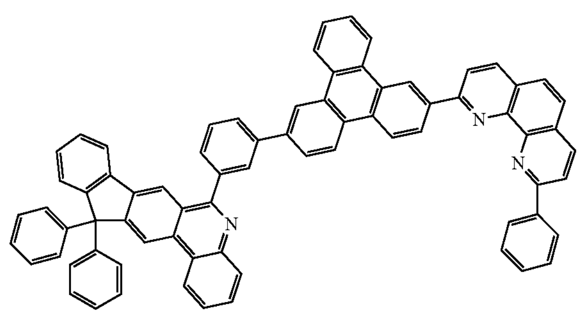

12-14
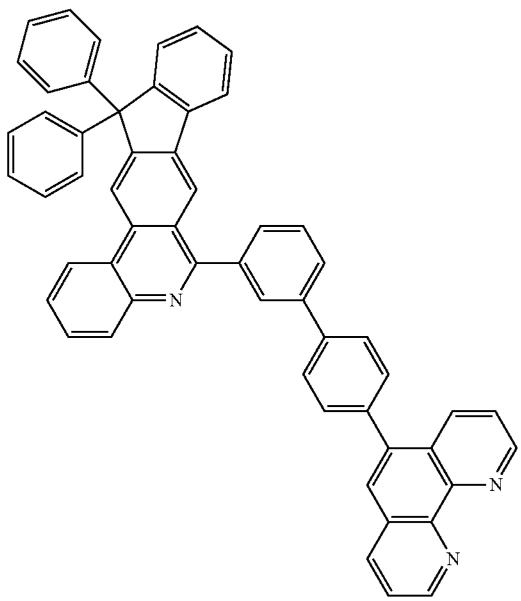
12-15
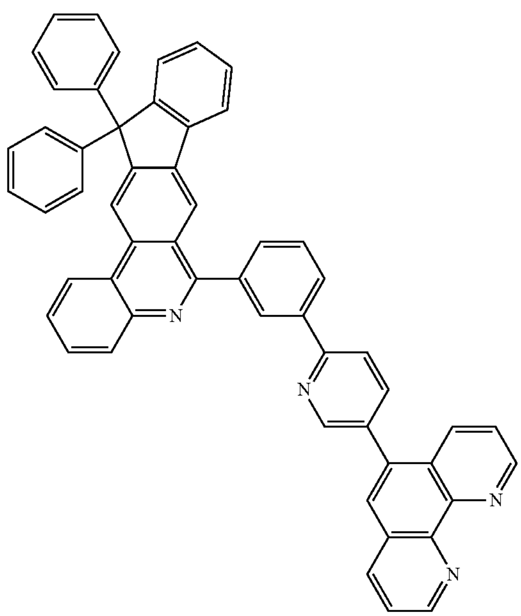
12-16
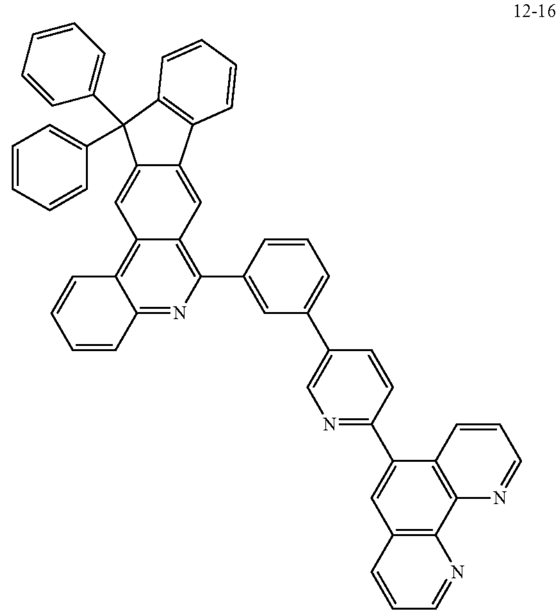
12-17
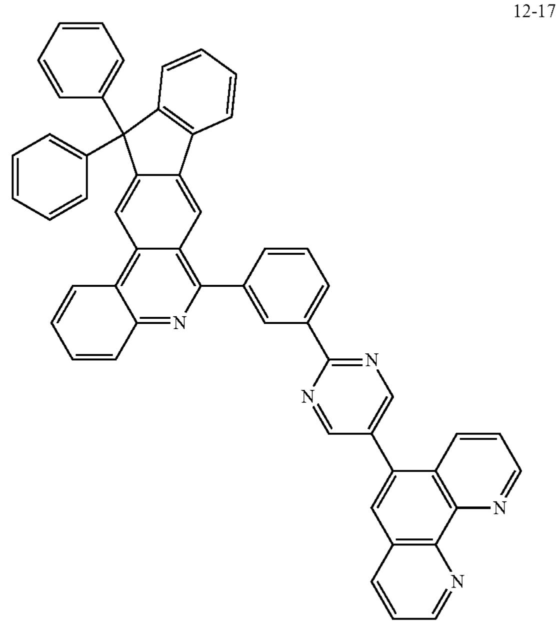

-continued
12-18
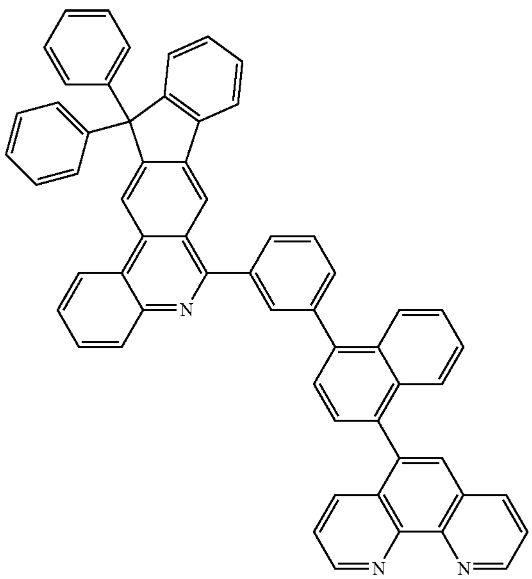
12-19
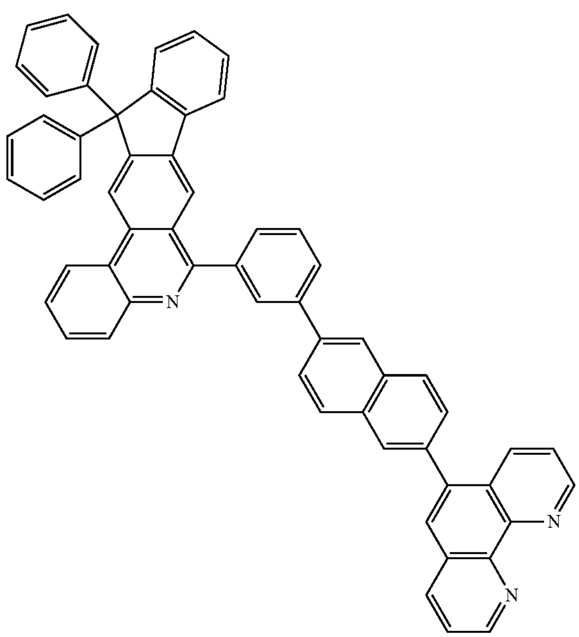
-continued
12-20
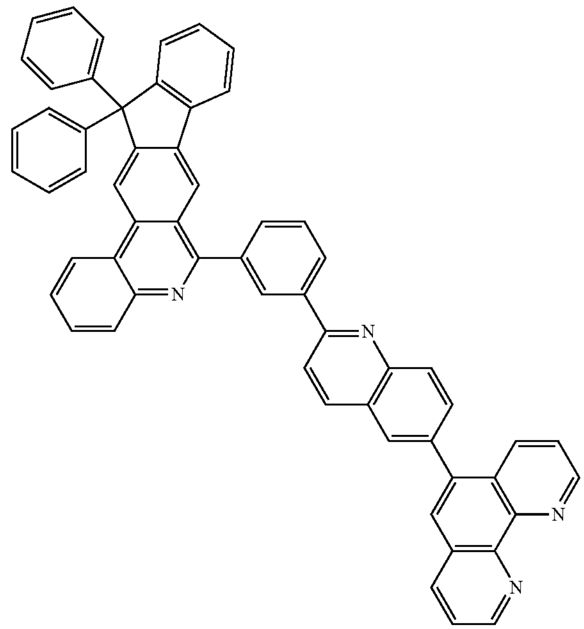
12-21
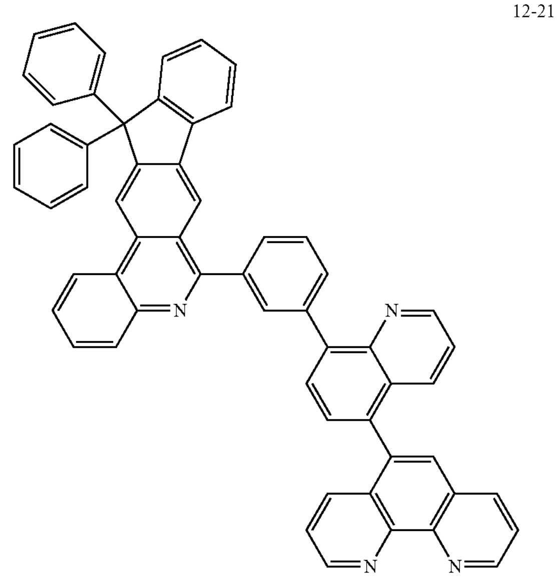

-continued
12-22
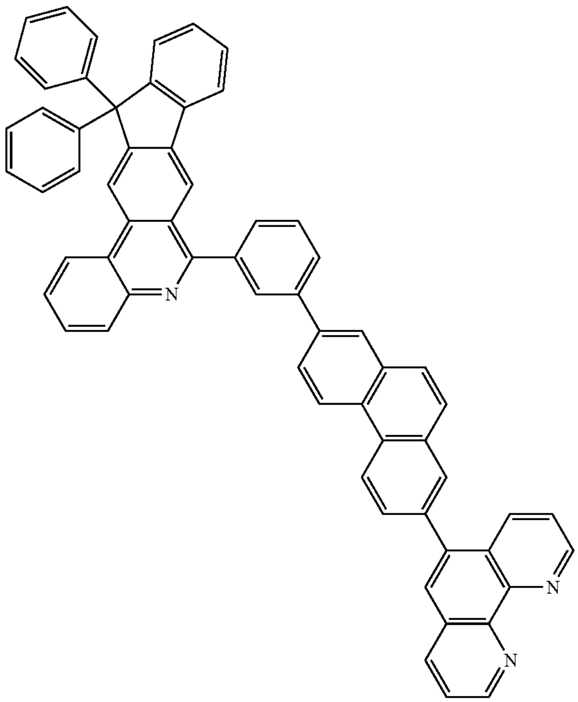
12-23
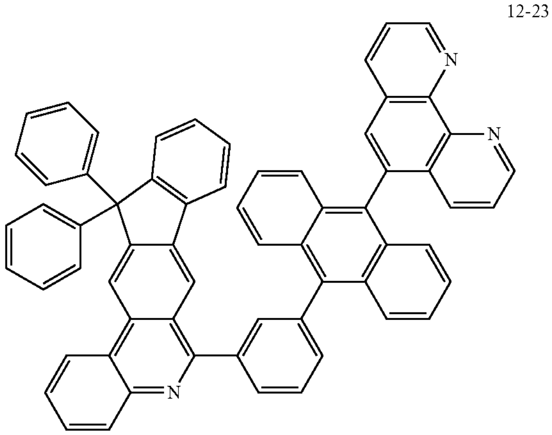
-continued
12-24
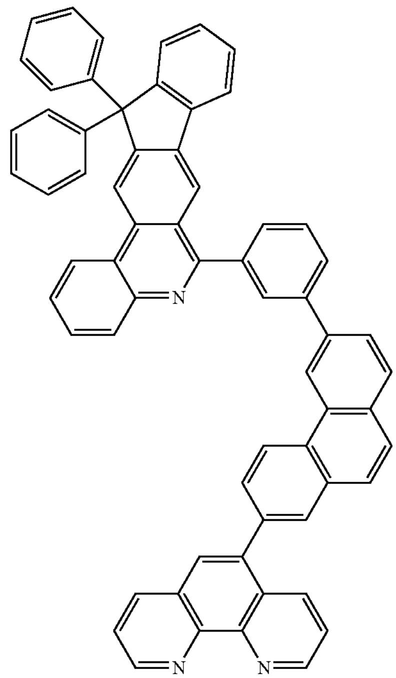
12-25
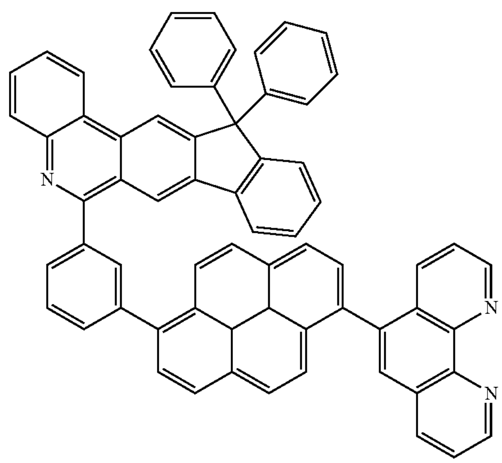
12-26
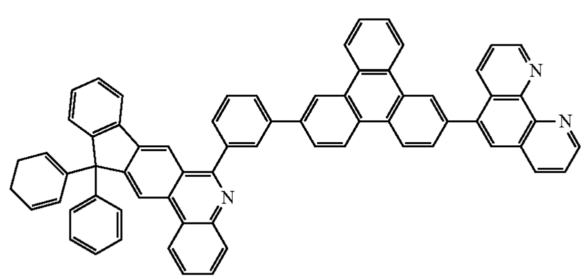

12-27
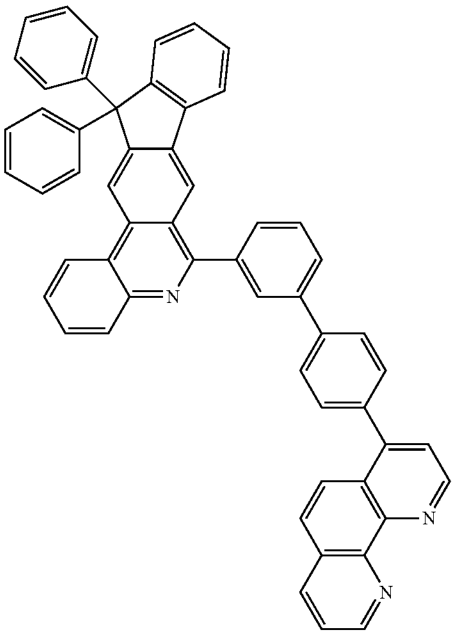
12-28
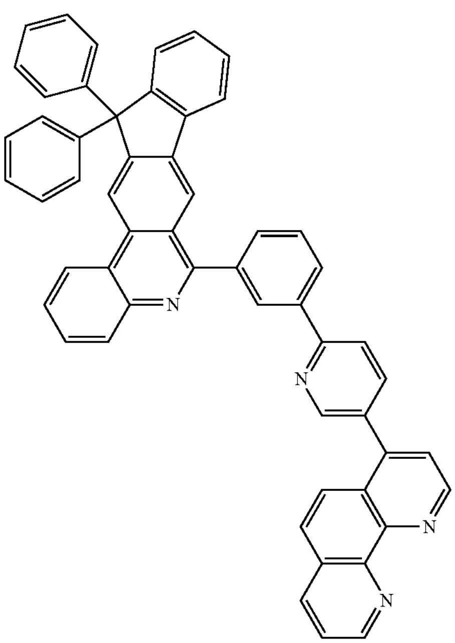
12-29
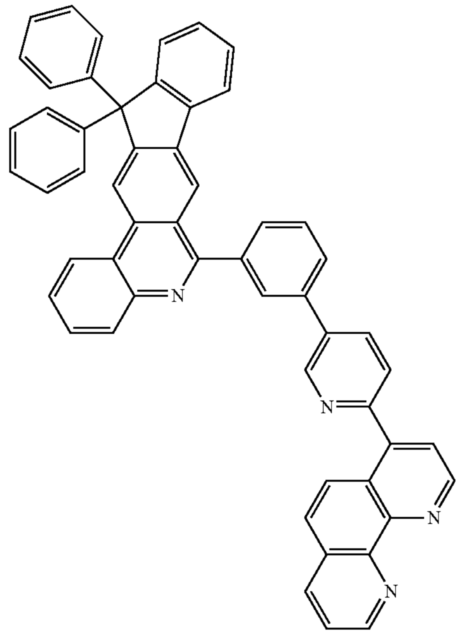
12-30
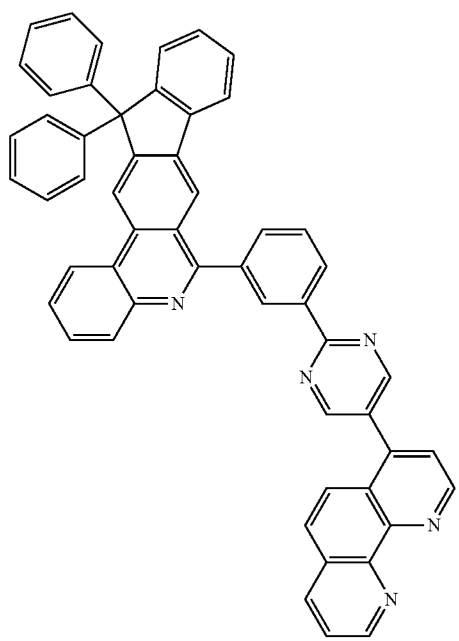

-continued
12-31
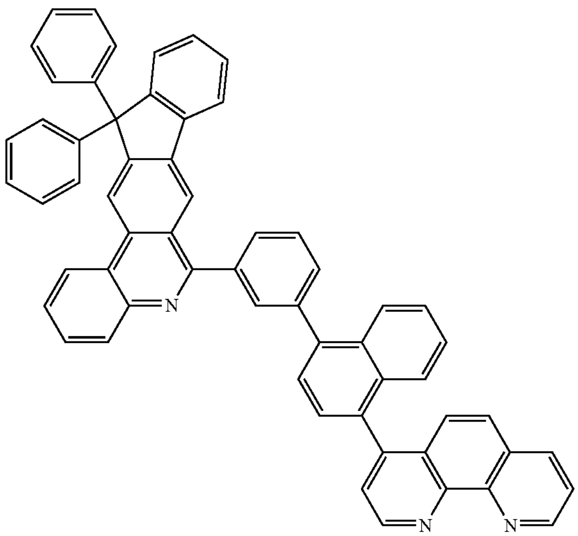
12-32
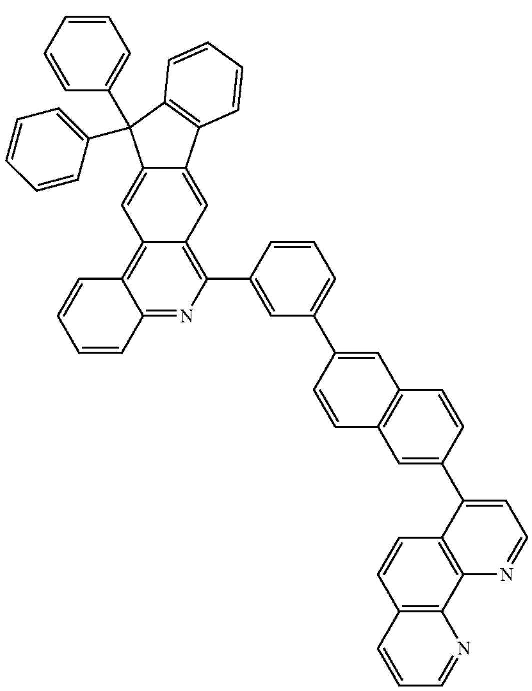
-continued
12-33
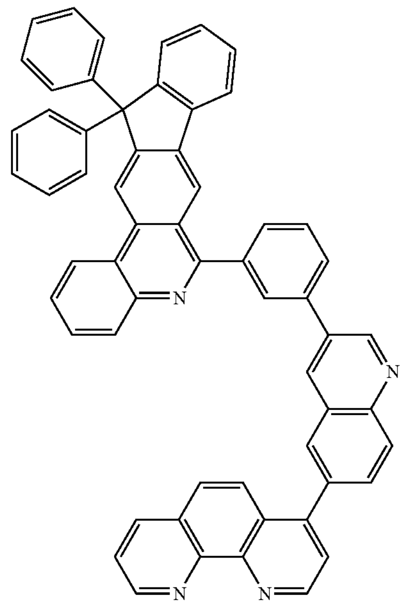
12-34
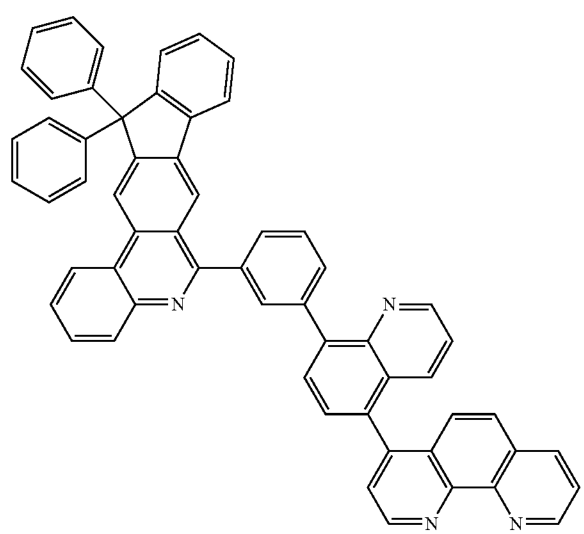

12-35
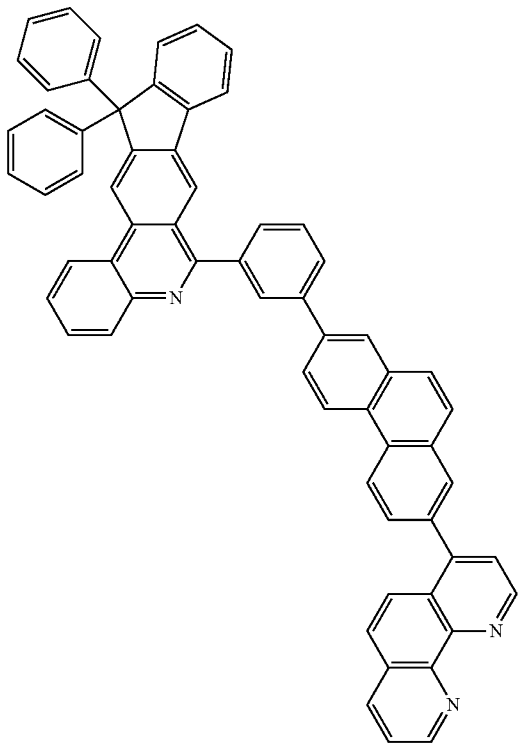
12-36
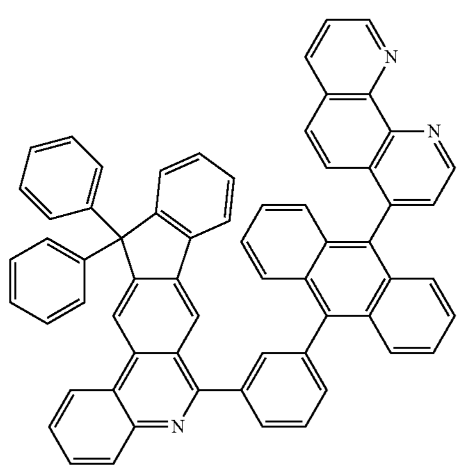
12-37
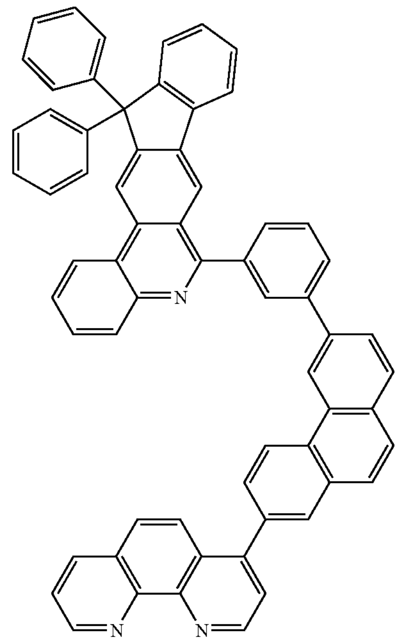
12-38
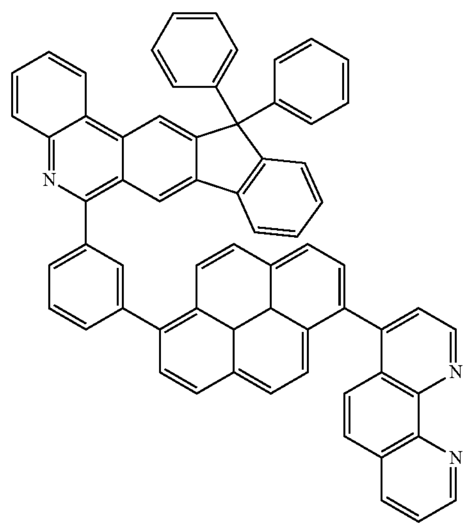
12-39
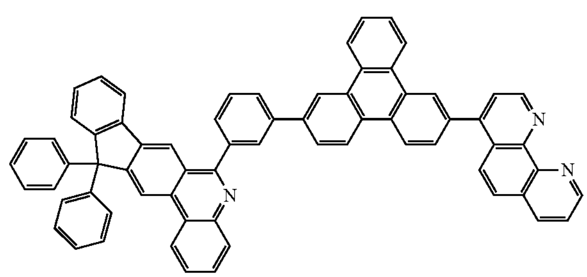

-continued
13-1
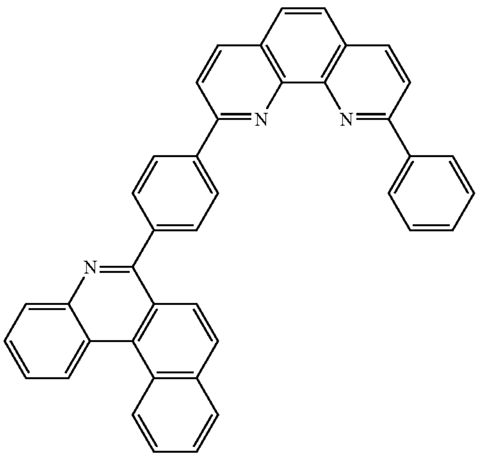
13-2
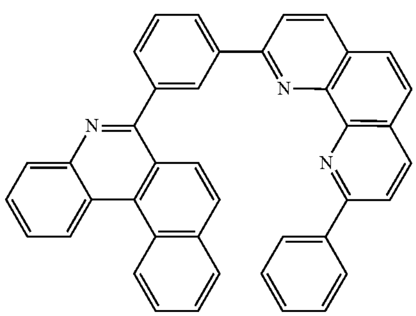
13-3
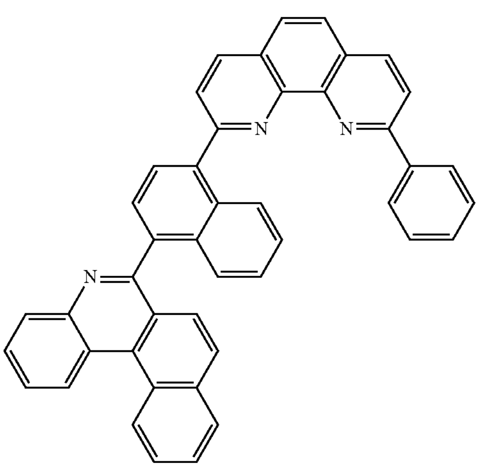
-continued
13-4
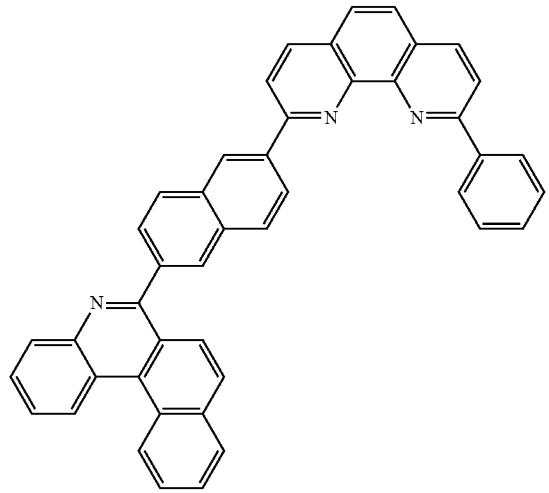
13-5
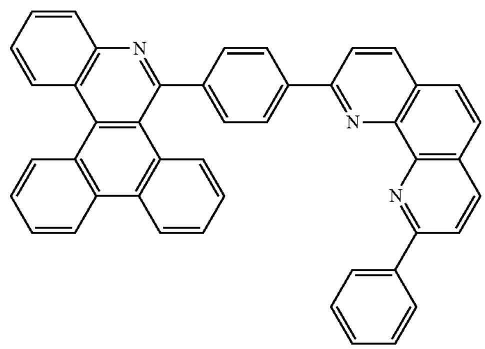
13-6
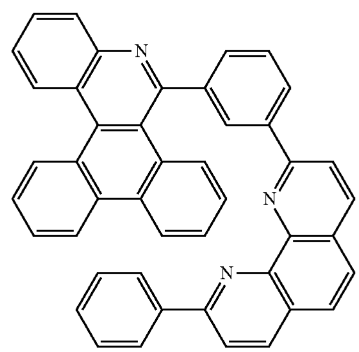
13-7
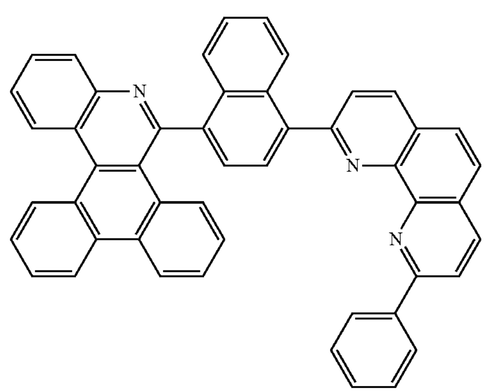

-continued
13-8
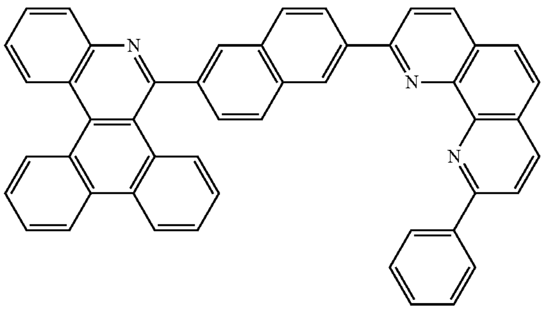
13-9
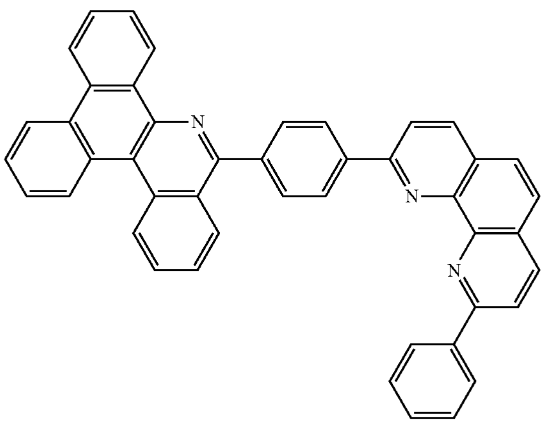
13-10
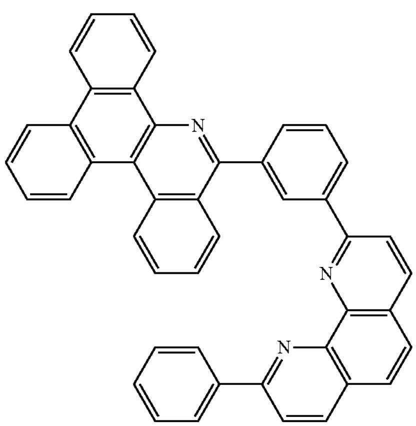
13-11
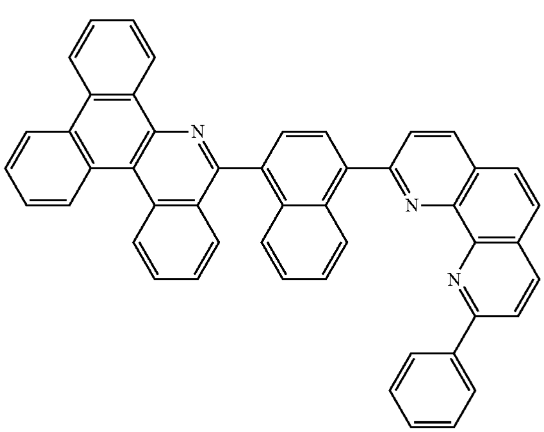
-continued
13-12
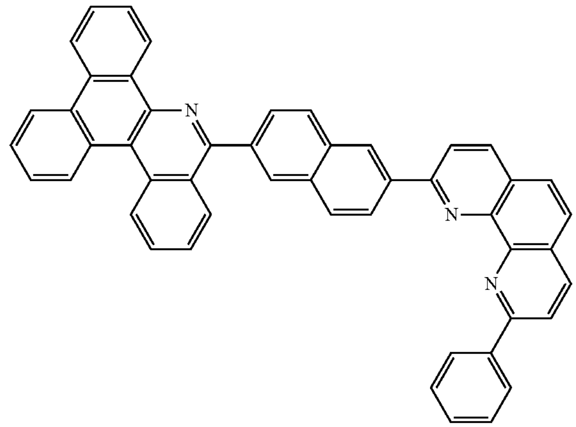
13-13
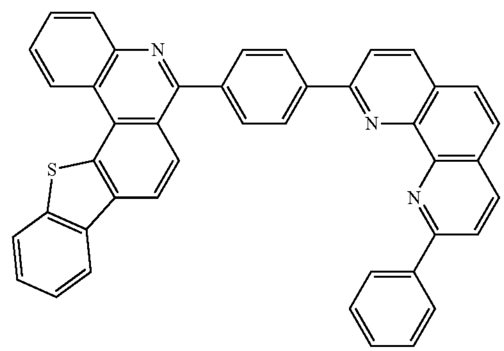
13-14
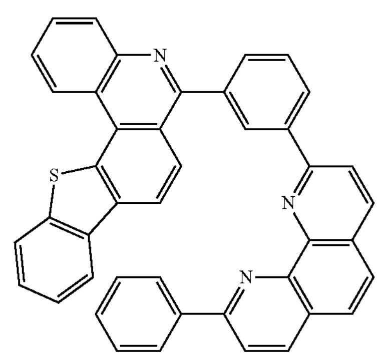
13-15
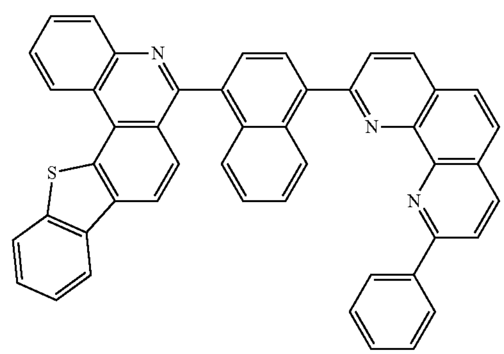

-continued
13-16
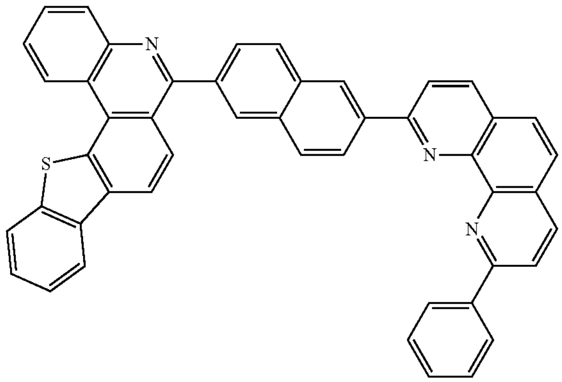
13-17
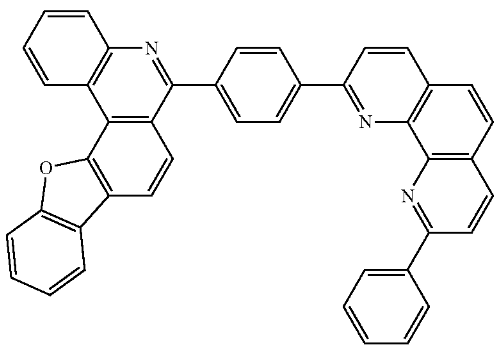
13-18
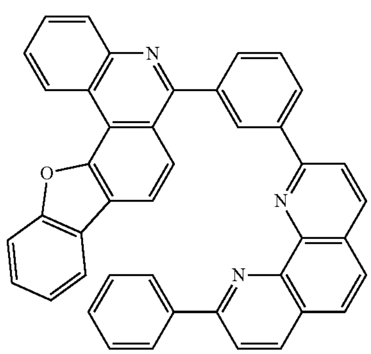
13-19
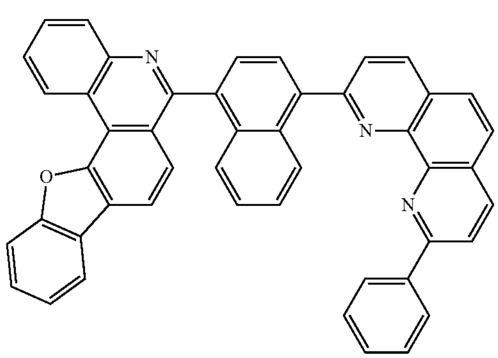
-continued
13-20
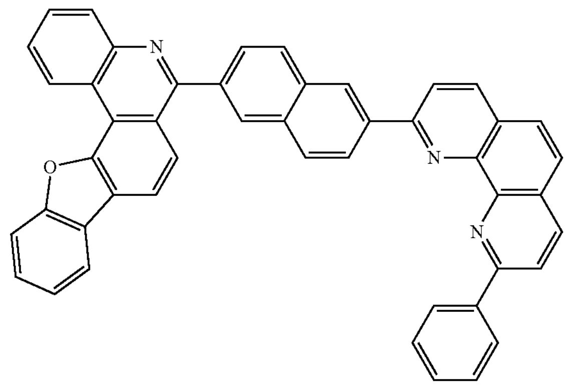
13-21
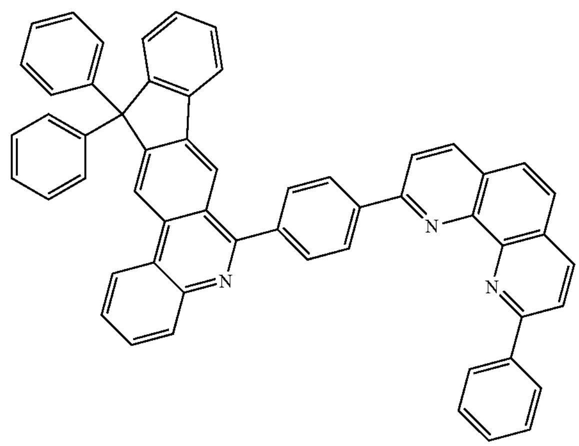
13-22
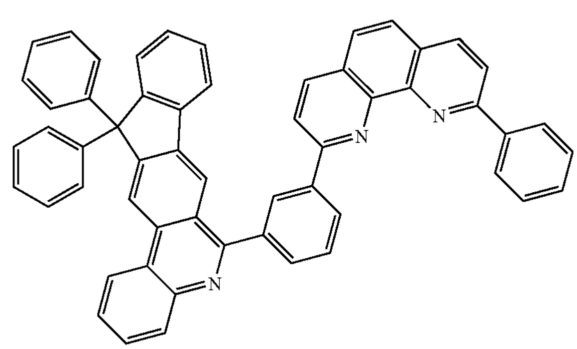

-continued 13-23

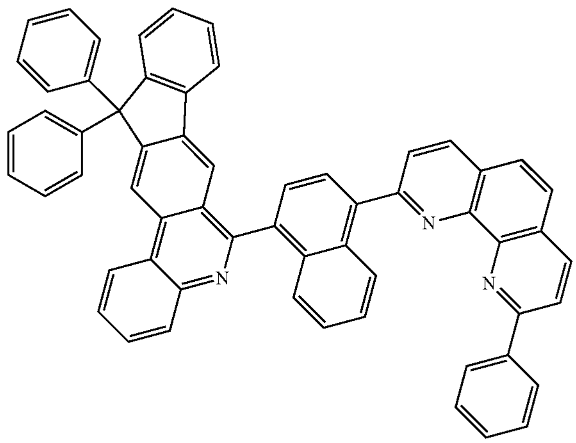

13-24

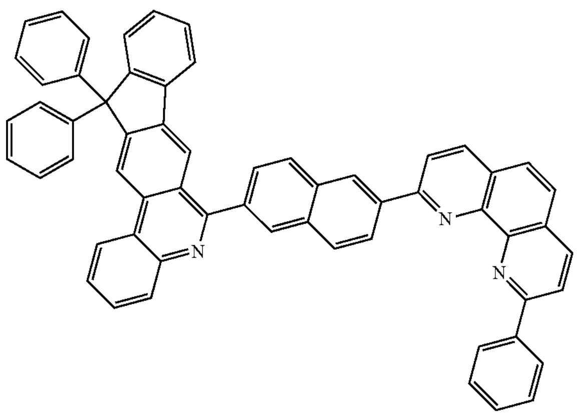

In addition, by introducing various substituents to the structure of Chemical Formula 1, compounds having unique properties of the introduced substituents may be synthesized. For example, by introducing substituents normally used as a hole injection layer material, a hole transfer layer material, a light emitting layer material, an electron transfer layer material and a charge generation layer material used for manufacturing an organic light emitting device to the core structure, materials satisfying conditions required for each organic material layer may be synthesized.

In addition, by introducing various substituents to the structure of Chemical Formula 1, the energy band gap may be finely controlled, and meanwhile, properties at interfaces between organic materials are enhanced, and material applications may become diverse.

Meanwhile, the hetero-cyclic compound has excellent thermal stability with a high glass transition temperature (Tg). Such an increase in the thermal stability becomes an important factor in providing driving stability to a device.

The hetero-cyclic compound according to one embodiment of the present application may be prepared through a multistep chemical reaction. Some intermediate compounds are prepared first, and the compound of Chemical Formula 1 may be prepared from the intermediate compounds. More specifically, the hetero-cyclic compound according to one embodiment of the present application may be prepared based on preparation examples to be described below.

Another embodiment of the present application provides an organic light emitting device comprising the hetero-cyclic compound represented by Chemical Formula 1.

The organic light emitting device according to one embodiment of the present application may be manufactured using common organic light emitting device manufacturing methods and materials except that one or more organic material layers are formed using the hetero-cyclic compound described above.

The hetero-cyclic compound may be formed into an organic material layer through a solution coating method as well as a vacuum deposition method when manufacturing the organic light emitting device. Herein, the solution coating method means spin coating, dip coating, inkjet printing, screen printing, a spray method, roll coating and the like, but is not limited thereto.

Specifically, the organic light emitting device according to one embodiment of the present application comprises an anode, a cathode, and one or more organic material layers provided between the anode and the cathode, wherein one or more layers of the organic material layers comprise the hetero-cyclic compound represented by Chemical Formula 1.

FIGS. 1 to 3 illustrate a lamination order of electrodes and organic material layers of an organic light emitting device according to one embodiment of the present application. However, the scope of the present application is not limited to these diagrams, and structures of organic light emitting devices known in the art may also be used in the present application.

FIG. 1 illustrates an organic light emitting device in which an anode (200), an organic material layer (300) and a cathode (400) are consecutively laminated on a substrate (100). However, the structure is not limited to such a structure, and as illustrated in FIG. 2, an organic light emitting device in which a cathode, an organic material layer and an anode are consecutively laminated on a substrate may also be obtained.

FIG. 3 illustrates a case of the organic material layer being a multilayer. The organic light emitting device according to FIG. 3 comprises a hole injection layer (301), a hole transfer layer (302), a light emitting layer (303), a hole blocking layer (304), an electron transfer layer (305) and an electron injection layer (306). However, the scope of the present application is not limited to such a lamination structure, and as necessary, other layers except the light emitting layer may not be included, and other necessary functional layers may be further included.

In addition, the organic light emitting device according to one embodiment of the present application comprises an anode, a cathode, and two or more stacks provided between the anode and the cathode, wherein the two or more stacks each independently comprise a light emitting layer, a charge generation layer is included between the two or more stacks, and the charge generation layer includes the hetero-cyclic compound represented by Chemical Formula 1.

In addition, the organic light emitting device according to one embodiment of the present application comprises an anode, a first stack provided on the anode and comprising a first light emitting layer, a charge generation layer provided on the first stack, a second stack provided on the charge generation layer and comprising a second light emitting layer, and a cathode provided on the second stack. Herein, the charge generation layer may comprise the hetero-cyclic compound represented by Chemical Formula 1. In addition, the first stack and the second stack may each independently further comprise one or more types of the hole injection layer, the hole transfer layer, the hole blocking layer, the electron transfer layer, the electron injection layer described above and the like.

The charge generation layer may be an N-type charge generation layer, and the charge generation layer may further comprise a dopant known in the art in addition to the hetero-cyclic compound represented by Chemical Formula 1.

As the organic light emitting device according to one embodiment of the present application, an organic light emitting device having a 2-stack tandem structure is schematically illustrated in FIG. 4.

Herein, the first electron blocking layer, the first bole blocking layer, the second hole blocking layer and the like described in FIG. 4 may not be included in some cases.

The organic light emitting device according to the present specification may be manufactured using materials and methods known in the art except that one or more layers of the organic material layers comprise the hetero-cyclic compound represented by Chemical Formula 1.

The hetero-cyclic compound represented by Chemical Formula 1 may form one or more layers of the organic material layers of the organic light emitting device alone. However, as necessary, the hetero-cyclic compound represented by Chemical Formula 1 may be mixed with other materials to form the organic material layers.

The hetero-cyclic compound represented by Chemical Formula 1 may be used as a material of the charge generation layer in the organic light emitting device.

The hetero-cyclic compound represented by Chemical Formula 1 may be used as a material of the electron transfer layer, the hole blocking layer, the light emitting layer or the like in the organic light emitting device. As one example, the hetero-cyclic compound represented by Chemical Formula 1 may be used as a material of the electron transfer layer, the hole transfer layer or the light emitting layer in the organic light emitting device.

In addition, the hetero-cyclic compound represented by Chemical Formula 1 may be used as a material of the light emitting layer in the organic light emitting device. As one example, the hetero-cyclic compound represented by Chemical Formula 1 may be used as a phosphorescent host material of the light emitting layer in the organic light emitting device.

In the organic light emitting device according to one embodiment of the present application, materials other than the hetero-cyclic compound of Chemical Formula 1 are illustrated below, however, these are for illustrative purposes only and not for limiting the scope of the present application, and may be replaced by materials known in the art.

As the anode material, materials having relatively large work function may be used, and transparent conductive oxides, metals, conductive polymers or the like may be used. Specific examples of the anode material comprise metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or SnO2:Sb; conductive polymers such as poly(3-methylthiophene), poly[3,4-(ethylene-1,2-dioxy)thiophene] (PEDOT), polypyrrole and polyaniline, and the like, but are not limited thereto.

As the cathode material, materials having relatively small work function may be used, and metals, metal oxides, conductive polymers or the like may be used. Specific examples of the cathode material comprise metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

As the hole injection material, known hole injection materials may be used, and for example, phthalocyanine compounds such as copper phthalocyanine disclosed in U.S. Pat. No. 4,356,429, or starburst-type amine derivatives such as tris(4-carbazoyl-9-ylphenyl)amine (TCTA), 4,4',4"-tri[phenyl(m-tolyl)amino]triphenylamine (m-MTDATA) or 1,3,5-tris[4-(3-methylphenylphenylamino)phenyl] benzene (m-MTDAPB) described in the literature [Advanced Material, 6, p. 677 (1994)], polyaniline/dodecylbenzene sulfonic acid, poly(3,4-ethylenedioxythiophene)/poly(4-styrene-sulfonate), polyaniline/camphor sulfonic acid or polyaniline/poly(4-styrene-sulfonate) that are conductive polymers having solubility, and the like, may be used.

As the hole transfer material, pyrazoline derivatives, arylamine-based derivatives, stilbene derivatives, triphenyldiamine derivatives and the like may be used, and low molecular or high molecular materials may also be used.

As the electron transfer material, metal complexes of oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, 8-hydroxyquinoline and derivatives thereof, and the like, may be used, and high molecular materials may also be used as well as low molecular materials.

As examples of the electron injection material, LiF is typically used in the art, however, the present application is not limited thereto.

As the light emitting material, red, green or blue light emitting materials may be used, and as necessary, two or more light emitting materials may be mixed and used. In addition, fluorescent materials may also be used as the light emitting material, however, phosphorescent materials may also be used. As the light emitting material, materials emitting light by bonding electrons and holes injected from an anode and a cathode, respectively, may be used alone, however, materials having a host material and a dopant material involved in light emission together may also be used.

The organic light emitting device according to one embodiment of the present application may be a top-emission type, a bottom-emission type or a dual-emission type depending on the materials used.

The hetero-cyclic compound according to one embodiment of the present application may also be used in an organic electronic device comprising an organic solar cell, an organic photo conductor, an organic transistor and the like under a similar principle used in the organic light emitting device.

MODE FOR DISCLOSURE

Hereinafter, the present specification will be described in more detail with reference to examples, however, these are for illustrative purposes only, and the scope of the present application is not limited thereto.

EXAMPLE

<Preparation Example 1> Preparation of Compound 1-1

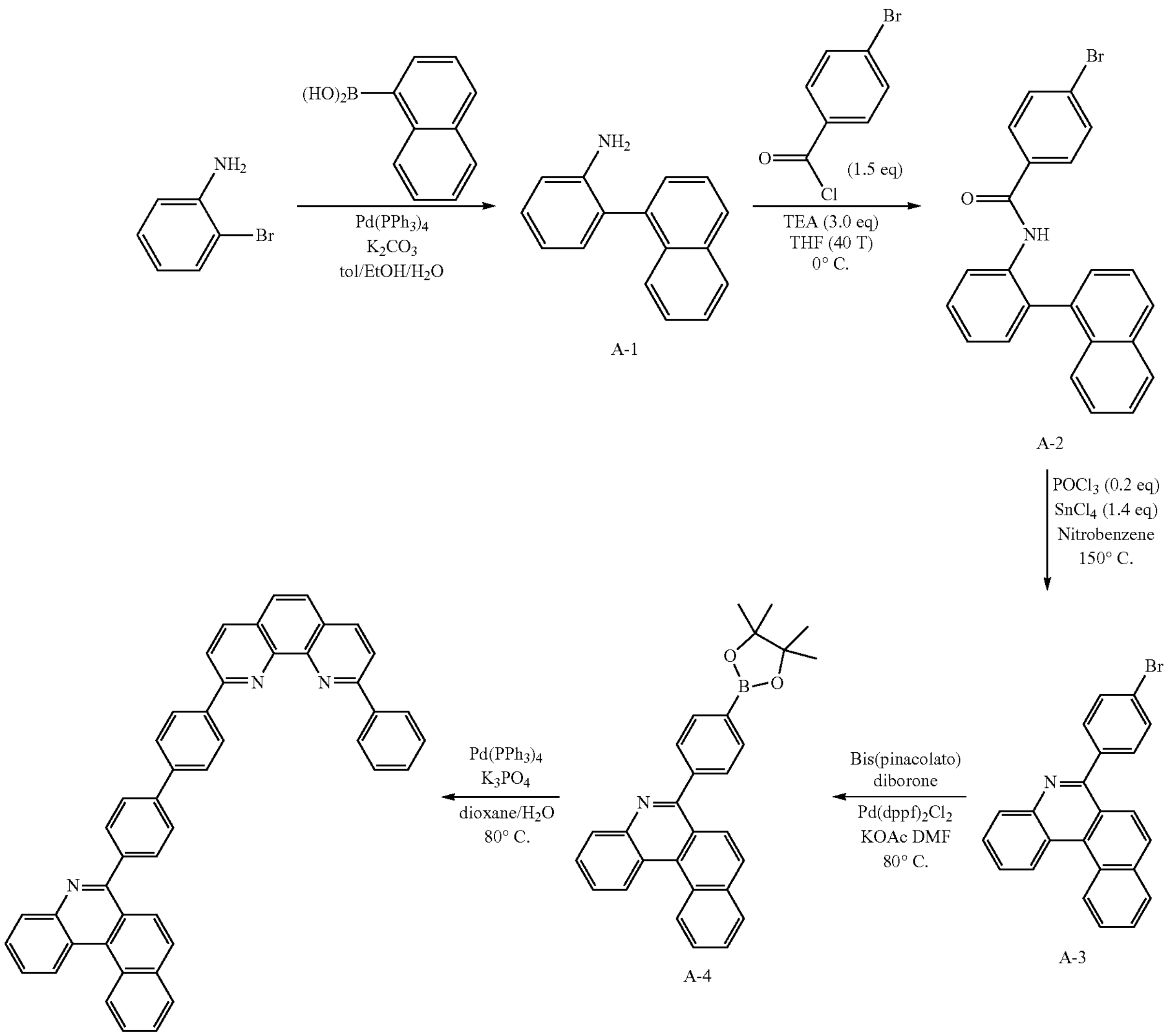

1-1

Preparation of Compound A-1

To a flask, 2-bromoaniline (80.0 g, 0.465 mol, 1 eq.) and Tol/EtOH/$H_2O$=5:1:1 (1600, 320, 320) were introduced, and then 1-naphthylboronic acid (95.98 g, 0.558 mol, 1.2 eq.), $Pd(PPh_3)_4$ (26.87 g, 0.0233 mol, 0.05 eq.) and $K_2CO_3$ (192.82 g, 1.39 mol, 3 eq.) were introduced thereto. The result was stirred for 18 hours at 90° C. When the reaction was completed, the temperature was lowered to room temperature, then $H_2O$ and EA were introduced thereto, and the result was stirred. The produced yellow solids were filtered and removed. The mixture was extracted with ethyl acetate (EA), moisture in the organic layer was removed using $Na_2SO_4$, the result was filtered, and the solvent was concentrated. Solid Compound A-1 was obtained (84.0 g, 82%).

Preparation of Compound A-2

To a flask, 2-(naphthalen-1-yl)aniline (83.62 g, 0.381 mol, 1 eq.) and then tetrahydrofuran (THF, 1672 mL) were introduced. After that, TEA (158.6 ml, 1.71 mol, 3 eq.), and 4-bromobenzoyl chloride (125.5 g, 0.572 mol) dissolved in THF (50 ml) were added thereto at 0° C., and the result was stirred for 2 hours at room temperature. After the reaction was completed, EA and $H_2O$ were layer separated, and the organic layer was washed several times with $H_2O$. Moisture in the organic layer was removed using $Na_2SO_4$, the result was filtered, and the solvent was concentrated. After adding methylene chloride (MC, 100 ml) to the (brown oil) concentrated residue, the result was filtered to remove white solids, and then concentrated. Compound A-2 was obtained (162.0 g, 99%).

Preparation of Compound A-3

To a flask, 4-bromo-N-(2-(naphthalen-1-yl)phenyl)benzamide (151.9 g, 0.507 mol, 1 eq.) and then nitrobenzene (1519 mL) were introduced, and $POCl_3$ (28.64 ml, 0.234 mol, 0.5 eq.) was introduced thereto. After that, the result was stirred for 18 hours at 150° C. After removing the nitrobenzene using a rotary evaporator, the organic layer dissolved in MC was neutralized by washing several times with a saturated $NaHCO_3$ solution, then dried using $MgSO_4$ and concentrated. EA was added to the concentrated residue for precipitation. After adding a small amount of EA thereto, the result was stirred for 1 hour at room temperature and then filtered (removing side spot). After that, hexane was added thereto, the result was stirred for 1 hour, filtered (removing residual nitrobenzene), and then dried. Solid Compound A-3 was obtained (82.5 g, 61%).

Preparation of Compound A-4

After dissolving A-3 (50.0 g, 130.0 mmol, 1 eq.) in DMF, bis(pinacolato)diborone (40.0 g, 156.0 mmol, 1.2 eq.), $Pd(dppf)_2Cl_2$ (5.3 g, 6.5 mmol, 0.05 eq.) and KOAc (38.0 g, 390.0 mmol, 3 eq.) were added thereto at room temperature, and the result was stirred for 18 hours at 80° C. After the reaction was completed, the layers were separated with purified water and ethyl acetate. The organic solvent layer was washed several times with purified water and brine, dehydrated and then vacuum dried. After dissolving the residue with dichloromethane, florosil was added thereto, and the result was stirred for 30 minutes. The result was passed through silica gel/celite. Solid Compound A-4 was obtained (55.0 g, 98%).

Preparation of Compound 1-1

After dissolving A-4 (10.0 g, 23.18 mmol, 1 eq.) in dioxane/$H_2O$ (5:1), 2-(4-bromophenyl)-9-phenyl-1,10-phenanthroline (9.2 g, 23.18 mmol, 1 eq.), $Pd(PPh_3)_4$ (1.34 g, 1.159 mmol, 0.05 eq.) and $K_3PO_4$ (14.76 g, 69.54 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 1-1 was obtained (12.97 g, 77%).

<Preparation Example 2> Preparation of Compound 1-6

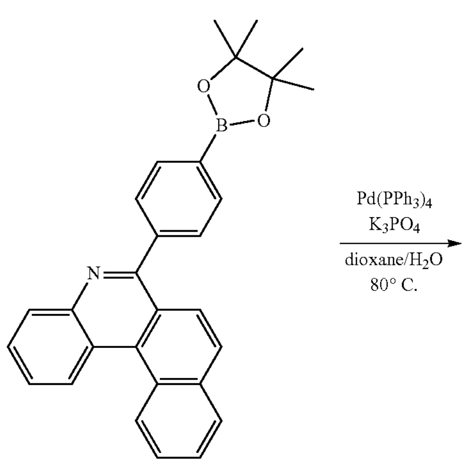

A-4

-continued

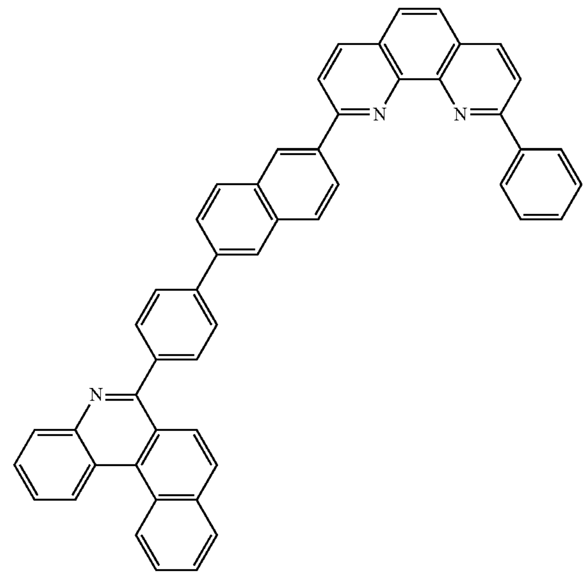

1-6

After dissolving A-4 (10.0 g, 23.18 mmol, 1 eq.) in dioxane/$H_2O$ (5:1), 2-(6-bromonaphthalen-2-yl)-9-phenyl-1,10-phenanthroline (10.69 g, 23.18 mmol, 1 eq.), $Pd(PPh_3)_4$ (1.34 g, 1.159 mmol, 0.05 eq.) and $K_3PO_4$ (14.76 g, 69.54 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 1-6 was obtained (8.62 g, 61%).

<Preparation Example 3> Preparation of Compound 1-14

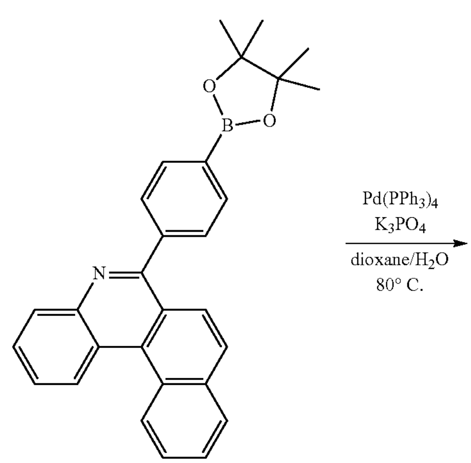

A-4

-continued

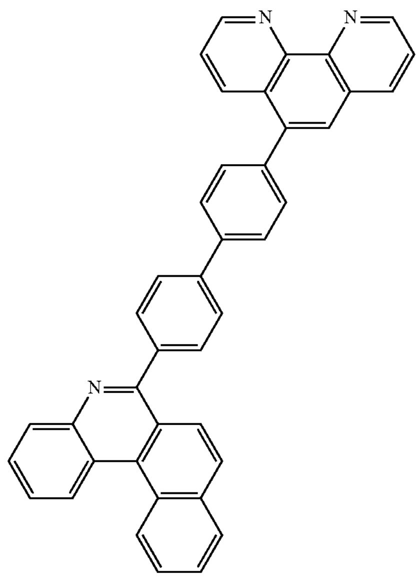

1-14

After dissolving A-4 (10.0 g, 23.18 mmol, 1 eq.) in dioxane/$H_2O$ (5:1), 5-(4-bromophenyl)-1,10-phenanthroline (7.77 g, 23.18 mmol, 1 eq.), $Pd(PPh_3)_4$ (1.34 g, 1.159 mmol, 0.05 eq.) and $K_3PO_4$ (14.76 g, 69.54 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 1-14 was obtained (13.64 g, 81%).

<Preparation Example 4> Preparation of Compound 1-26

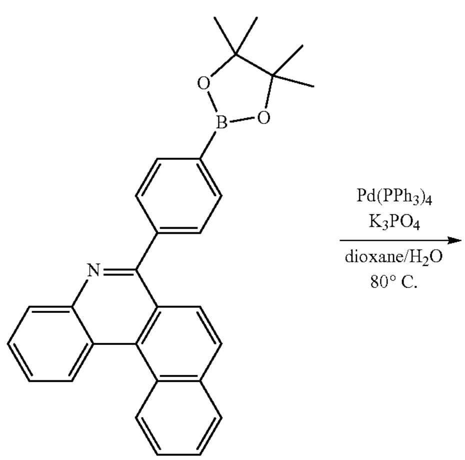

A-4

-continued

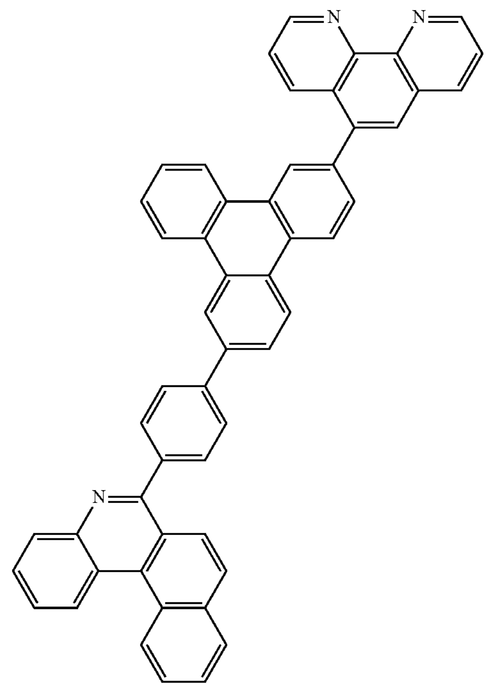

1-26

After dissolving A-4 (10.0 g, 23.18 mmol, 1 eq.) in dioxane/$H_2O$ (5:1), 5-(7-bromotriphenylen-2-yl)-1,10-phenanthroline (13 g, 23.18 mmol, 1 eq.), $Pd(PPh_3)_4$ (1.34 g, 1.159 mmol, 0.05 eq.) and $K_3PO_4$ (14.76 g, 69.54 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 1-26 was obtained (16.46 g, 70%).

<Preparation Example 5> Preparation of Compound 1-27

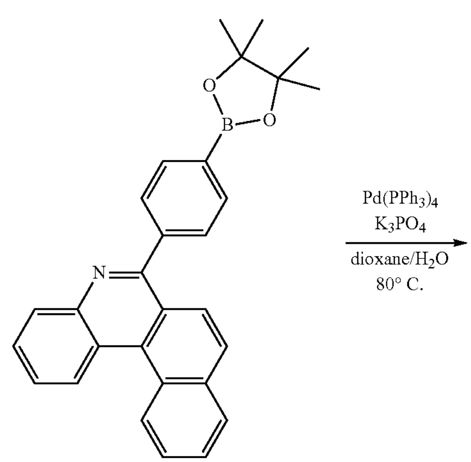

A-4

-continued

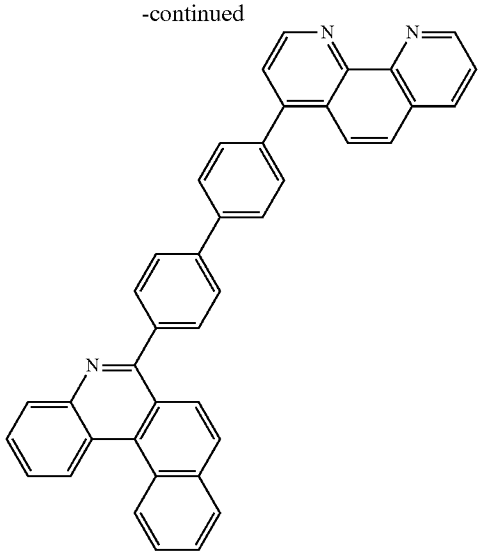

1-27

After dissolving A-4 (10.0 g, 1 eq.) in dioxane/$H_2O$ (5:1), 4-(4-bromophenyl)-1,10-phenanthroline (7.7 g, 1 eq.), $Pd(PPh_3)_4$ (1.34 g, 1.159 mmol, 0.05 eq.) and $K_3PO_4$ (14.76 g, 69.54 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 1-27 was obtained (10.27 g, 61%).

<Preparation Example 6> Preparation of Compound 2-1

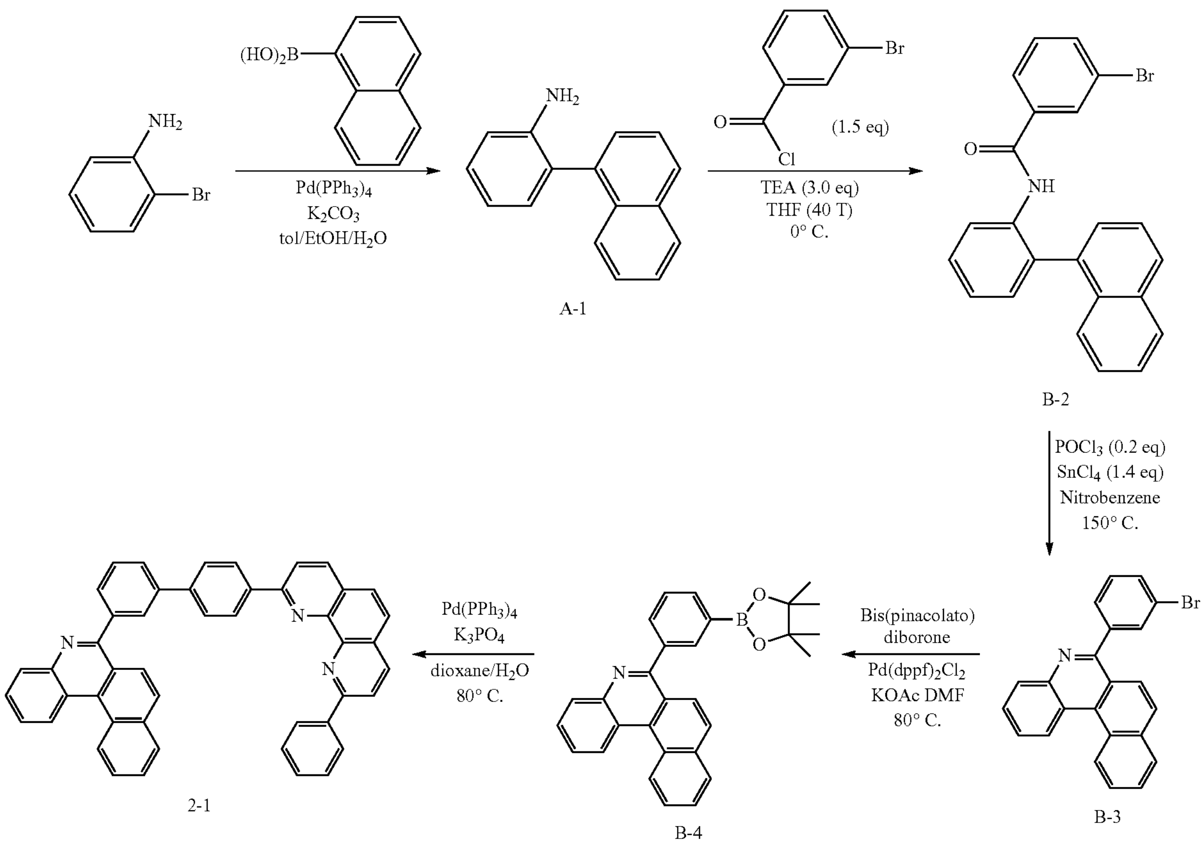

Preparation of Compound A-1

To a flask, 2-bromoaniline (80.0 g, 0.465 mol, 1 eq.) and Tol/EtOH/$H_2O$=5:1:1 (1600, 320, 320) were introduced, and then 1-naphthylboronic acid (95.98 g, 0.558 mol, 1.2 eq.), $Pd(PPh_3)_4$ (26.87 g, 0.0233 mol, 0.05 eq.) and $K_2CO_3$ (192.82 g, 1.39 mol, 3 eq.) were introduced thereto. The result was stirred for 18 hours at 90° C. When the reaction was completed, the temperature was lowered to room temperature, then $H_2O$ and EA were introduced thereto, and the result was stirred. The produced yellow solids were filtered and removed. The mixture was extracted with ethyl acetate (EA), moisture in the organic layer was removed using $Na_2SO_4$, the result was filtered, and the solvent was concentrated. Solid Compound A-1 was obtained (84.0 g, 82%).

Preparation of Compound B-2

To a flask, 2-(naphthalen-1-yl)aniline (83.62 g, 0.381 mol, 1 eq.) and then THF (1672 mL) were introduced. After that, TEA (158.6 ml, 1.71 mol, 3 eq.), and 3-bromobenzoyl chloride (125.5 g, 0.572 mol) dissolved in THF (50 ml) were added thereto at 0° C., and the result was stirred for 2 hours at room temperature. After the reaction was completed, layers were separated with EA and $H_2O$, and the organic layer was washed several times with $H_2O$. Moisture in the organic layer was removed using $Na_2SO_4$, the result was filtered, and the solvent was concentrated. After adding MC (100 ml) to the (brown oil) concentrated residue, the result was filtered to remove white solids, and then concentrated. Solid Compound B-2 was obtained (162.0 g, 99%).

Preparation of Compound B-3

To a flask, 3-bromo-N-(2-(naphthalen-1-yl)phenyl)benzamide (151.9 g, 0.507 mol, 1 eq.) and then nitrobenzene (1519 mL) were introduced, and $POCl_3$ (28.64 ml, 0.234 mol, 0.5 eq.) was introduced thereto. After that, the result was stirred for 18 hours at 150° C. After removing the nitrobenzene using a rotary evaporator, the organic layer dissolved in MC was neutralized by washing several times with a saturated $NaHCO_3$ solution, then dried using $MgSO_4$ and concentrated. EA was added to the concentrated residue for precipitation. After adding a small amount of EA thereto, the result was stirred for 1 hour at room temperature and then filtered (removing side spot). After that, hexane was added thereto, the result was stirred for 1 hour, filtered (removing residual nitrobenzene), and then dried. Solid Compound B-3 was obtained (104.1 g, 77%).

Preparation of Compound B-4

After dissolving B-3 (50.0 g, 130.0 mmol, 1 eq.) in DMF, bis(pinacolato)diborone (40.0 g, 156.0 mmol, 1.2 eq.), $Pd(dppf)_2Cl_2$ (5.3 g, 6.5 mmol, 0.05 eq.) and KOAc (38.0 g, 390.0 mmol, 3 eq.) were added thereto at room temperature, and the result was stirred for 18 hours at 80° C. After the reaction was completed, the layers were separated with purified water and ethyl acetate. The organic solvent layer was washed several times with purified water and brine, dehydrated and then vacuum dried. After dissolving the residue with dichloromethane, florosil was added thereto, and the result was stirred for 30 minutes. The result was passed through silica gel/celite. Solid Compound B-4 was obtained (53.9 g, 96%).

Preparation of Compound 2-1

After dissolving B-4 (10.0 g, 23.18 mmol, 1 eq.) in dioxane/$H_2O$ (5:1), 2-(4-bromophenyl)-9-phenyl-1,10-phenanthroline (9.2 g, 23.18 mmol, 1 eq.), $Pd(PPh_3)_4$ (1.34 g, 1.159 mmol, 0.05 eq.) and $K_3PO_4$ (14.76 g, 69.54 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 2-1 was obtained (10.61 g, 63%).

<Preparation Example 7> Preparation of Compound 2-14

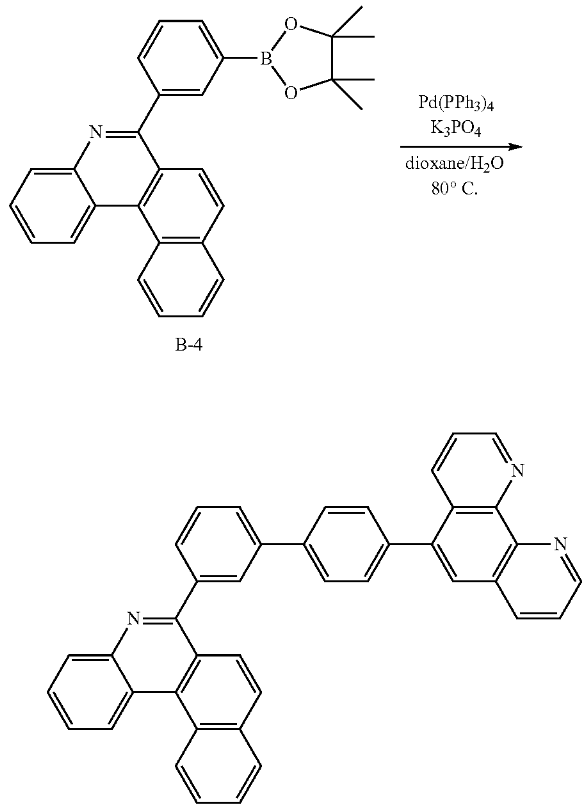

B-4

2-14

After dissolving B-4 (10.0 g, 23.18 mmol, 1 eq.) in dioxane/$H_2O$ (5:1), 5-(4-bromophenyl)-1,10-phenanthroline (7.77 g, 23.18 mmol, 1 eq.), $Pd(PPh_3)_4$ (1.34 g, 1.159 mmol, 0.05 eq.) and $K_3PO_4$ (14.76 g, 69.54 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 2-14 was obtained (14.82 g, 88%).

<Preparation Example 8> Preparation of Compound 2-27

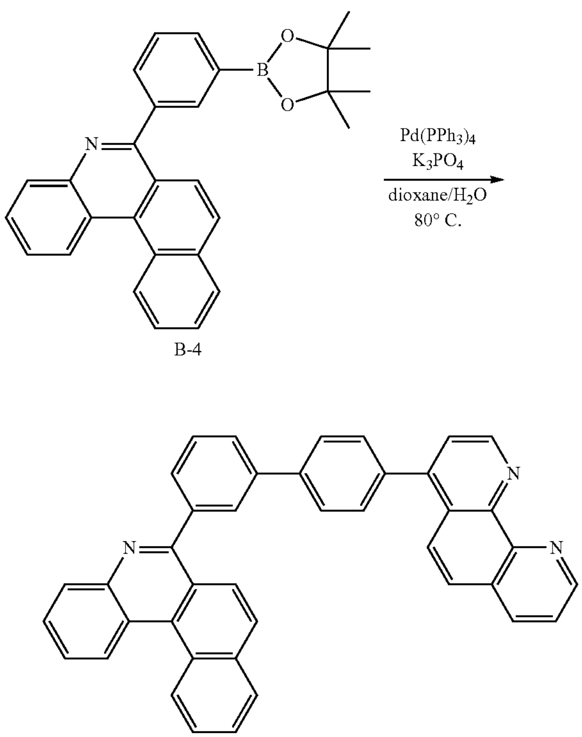

B-4

2-27

After dissolving B-4 (10.0 g, 23.18 mmol, 1 eq.) in dioxane/$H_2O$ (5:1), 4-(4-bromophenyl)-1,10-phenanthroline (7.77 g, 23.18 mmol, 1 eq.), $Pd(PPh_3)_4$ (1.34 g, 1.159 mmol, 0.05 eq.) and $K_3PO_4$ (14.76 g, 69.54 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 2-27 was obtained (11.78 g, 70%).

<Preparation Example 9> Preparation of Compound 3-1

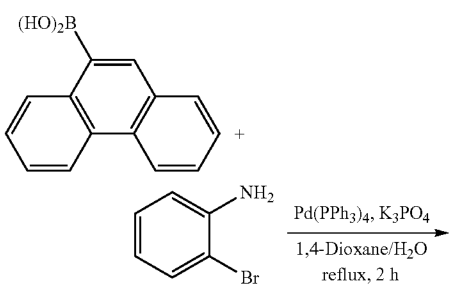

-continued

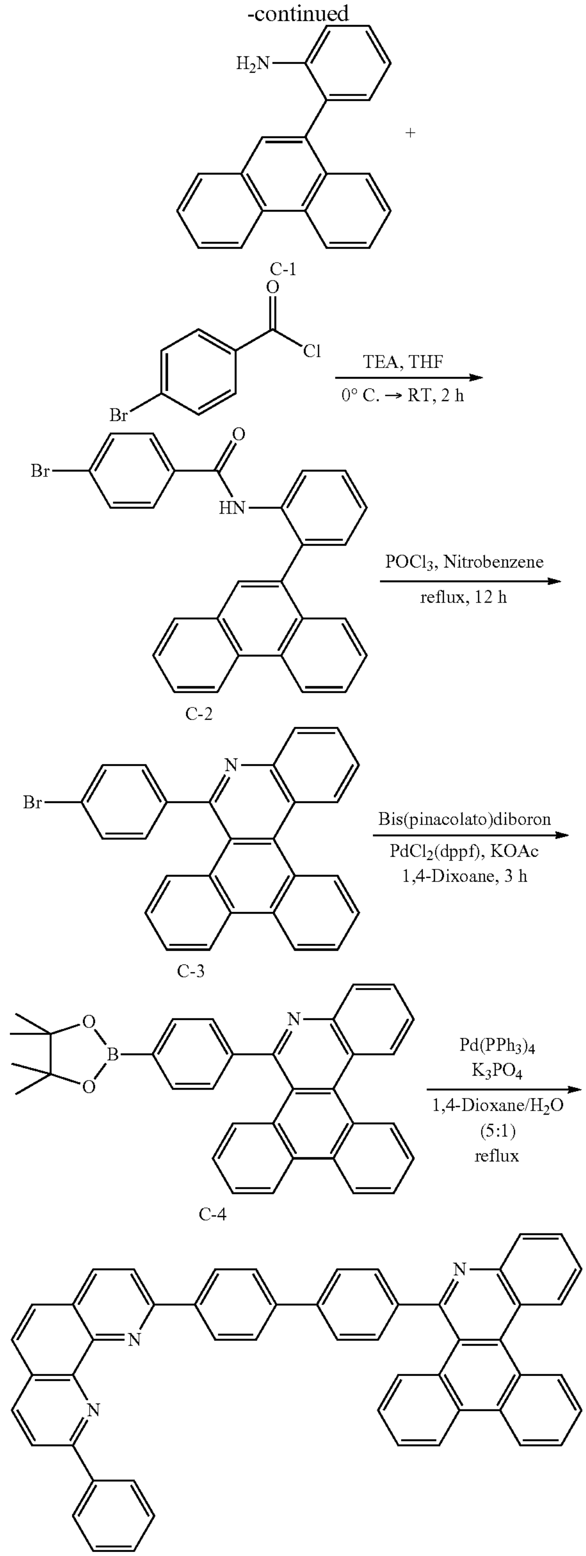

C-1

C-2

C-3

C-4

3-1

Preparation of Compound C-1

To a 3000 mL 2-neck round bottomed flask, 2-bromoaniline (55.0 g, 0.3197 mol, 1 eq.) and phenanthren-9-yl boronic acid (106.5 g, 0.479 mol, 1.5 eq.) were introduced, and dissolved in 1,4-dioxane (1000 ml). To the round bottomed flask, $Pd(PPh_3)_4$ (18.5 g, 0.016 mol, 0.05 eq.) and $K_3PO_4$ (203.6 g, 0.9591 mol, 3.0 eq.) were introduced. To the flask of 2), $H_2O$ (200 ml) was slowly introduced, and the result was stirred for 2 hours under reflux. After cooling the mixed solution to room temperature, the organic layer was extracted with MC. The result was column purified using a mixed solvent of MC:hexane=1:2 to obtain white solid Compound C-1 (63 g, 73%).

Preparation of Compound C-2

White solid Compound C-2 was obtained (85 g, 99%) in the same synthesis manner as A-2.

Preparation of Compound C-3

White solid Compound C-3 was obtained (71 g, 87%) in the same synthesis manner as A-3.

Preparation of Compound C-4

White solid Compound C-4 was obtained (66 g, 99%) in the same synthesis manner as A-4.

Preparation of Compound 3-1

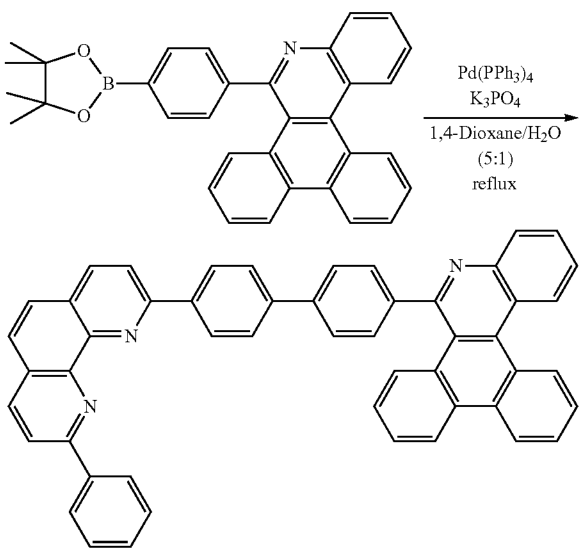

After dissolving C-4 (10.0 g, 20.77 mmol, 1 eq.) in dioxane/$H_2O$ (5:1), 2-(4-bromophenyl)-9-phenyl-1,10-phenanthroline (8.5 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 3-1 was obtained (10.13 g, 80%).

<Preparation Example 10> Preparation of Compound 3-10

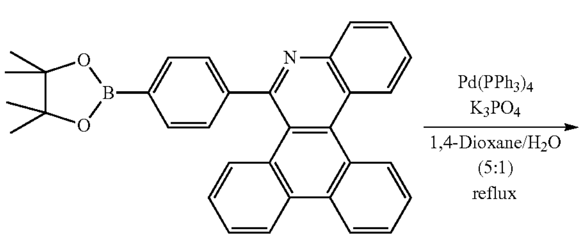

-continued

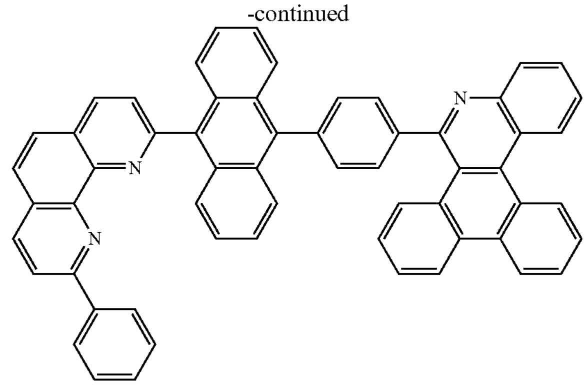

After dissolving C-4 (10.0 g, 20.77 mmol, 1 eq.) in dioxane/$H_2O$ (5:1), 2-(10-bromoanthracen-9-yl)-9-phenyl-1,10-phenanthroline (10.6 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 3-10 was obtained (9.14 g, 62%).

<Preparation Example 11> Preparation of Compound 3-14

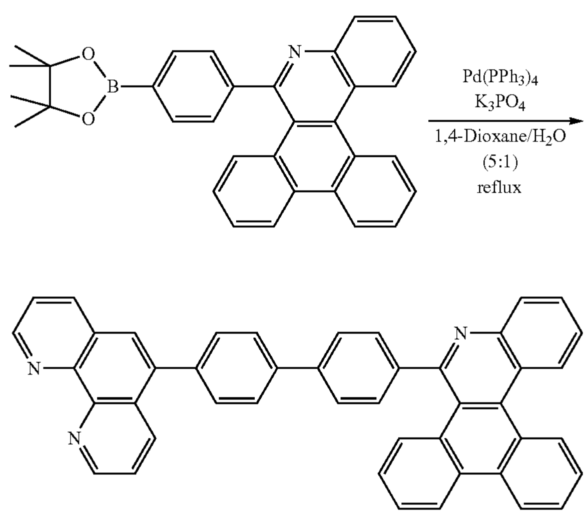 [SMILES: CC1(C)OB(c2ccc(-c3nc4ccccc4c4c5ccccc5c5ccccc5c34)cc2)OC1(C)C ; c1cnc2c(c1)cc(-c1ccc(-c3ccc(-c4nc5ccccc5c5c6ccccc6c6ccccc6c45)cc3)cc1)c1cccnc12]

After dissolving C-4 (10.0 g, 20.77 mmol, 1 eq.) in dioxane/$H_2O$ (5:1), 5-(4-bromophenyl)-1,10-phenanthroline (6.96 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 3-14 was obtained (7.34 g, 58%).

<Preparation Example 12> Preparation of Compound 3-27

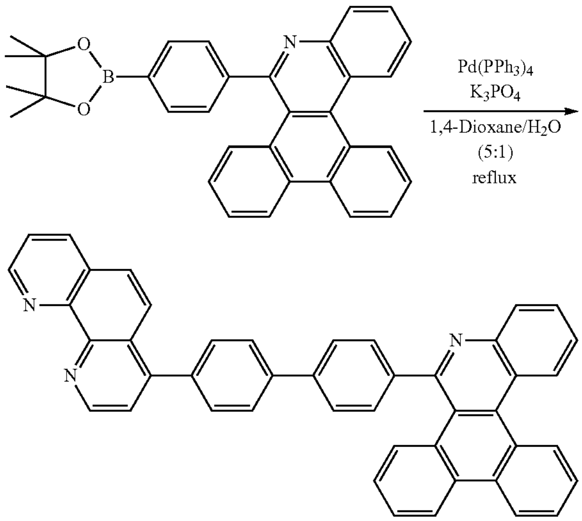

After dissolving C-4 (10.0 g, 20.77 mmol, 1 eq.) in dioxane/$H_2O$ (5:1), 4-(4-bromophenyl)-1,10-phenanthroline (6.96 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 3-27 was obtained (88.6 g, 70%).

<Preparation Example 13> Preparation of Compound 4-1

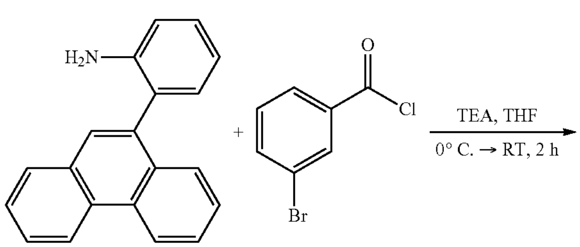

C-1

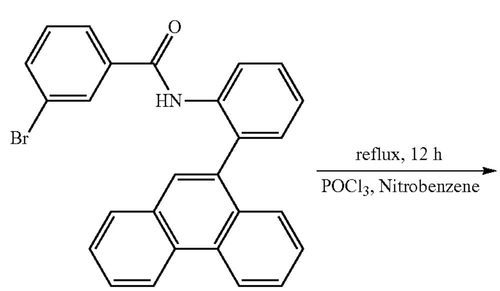

D-2

-continued

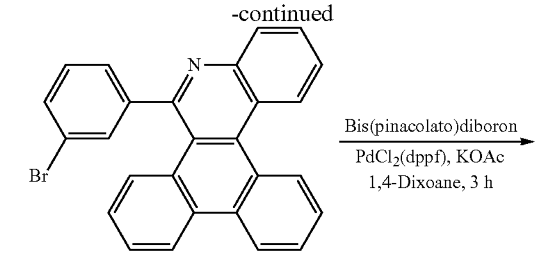

D-3

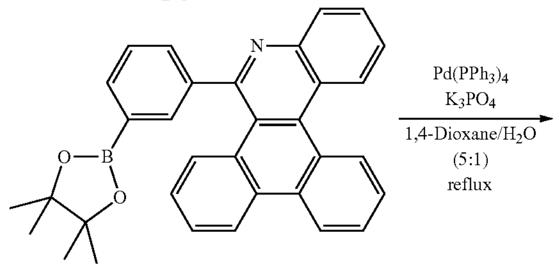

D-4

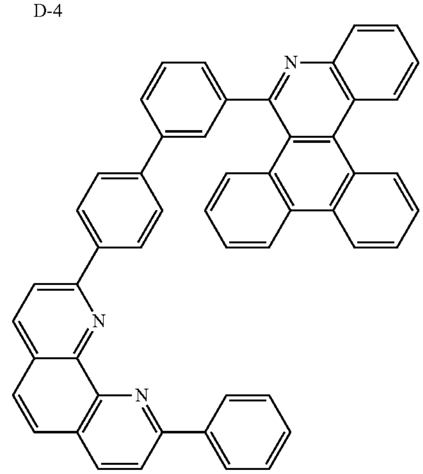

4-1

Preparation of Compound D-2

White solid Compound D-2 was obtained (85 g, 99%) in the same synthesis manner as A-2.

Preparation of Compound D-3

White solid Compound D-3 was obtained (71 g, 87%) in the same synthesis manner as A-3.

Preparation of Compound D-4

White solid Compound D-4 was obtained (66 g, 99%) in the same synthesis manner as A-4.

Preparation of Compound 4-1

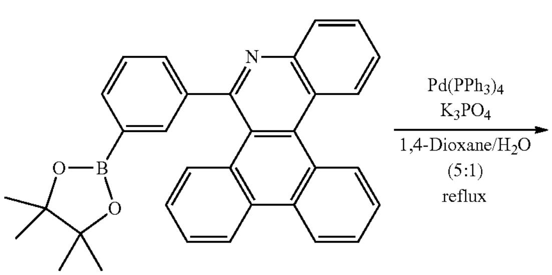

-continued

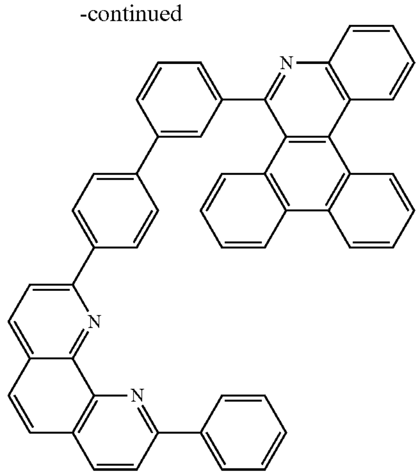

4-1

After dissolving D-4 (10.0 g, 20.77 mmol, 1 eq.) in dioxane/$H_2O$ (5:1), 2-(4-bromophenyl)-9-phenyl-1,10-phenanthroline (8.5 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 4-1 was obtained (11.1 g, 88%).

<Preparation Example 14> Preparation of Compound 4-5

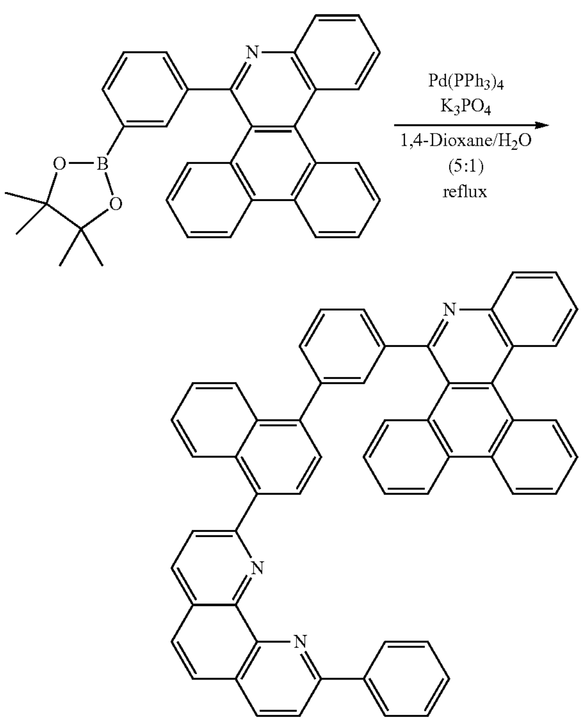

4-5

After dissolving D-4 (10.0 g, 20.77 mmol, 1 eq.) in dioxane/$H_2O$ (5:1), 2-(4-bromophenyl)-9-phenyl-1,10-phenanthroline (8.5 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 4-5 was obtained (10.96 g, 80%).

<Preparation Example 15> Preparation of Compound 4-17

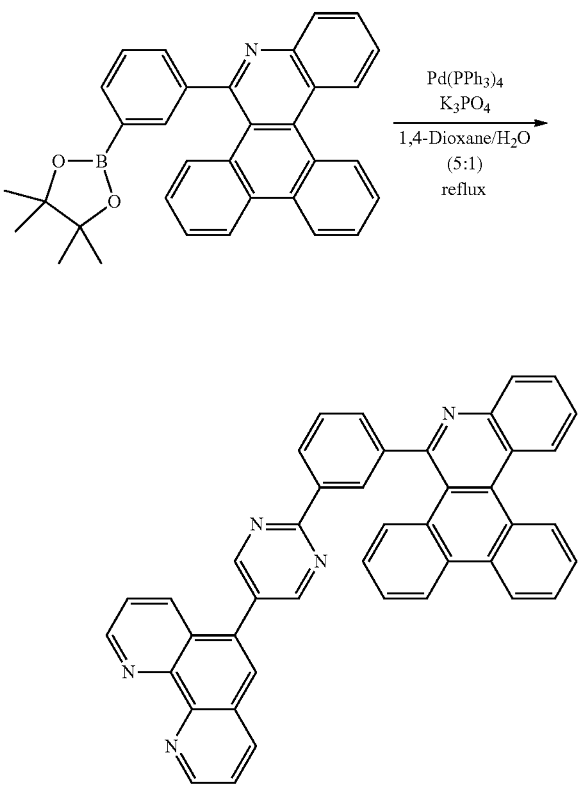

4-17

After dissolving D-4 (10.0 g, 20.77 mmol, 1 eq.) in dioxane/$H_2O$ (5:1), 5-(2-bromopyrimidin-5-yl)-1,10-phenanthroline (7 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 7 hours at 80° C. After adding purified water and ethyl acetate thereto, the result was solidified, stirred for 1 hour, and then filtered. The filtered solids were heated with ethyl acetate, toluene and MeOH, and stirred. Solid Compound 4-17 was obtained (6.99 g, 55%).

<Preparation Example 16> Preparation of Compound 4-27

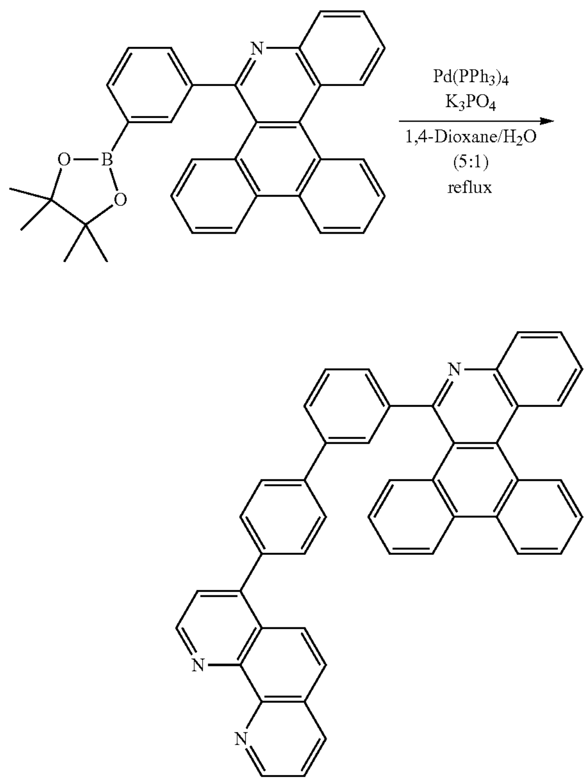

4-27

After dissolving D-4 (10.0 g, 20.77 mmol, 1 eq.) in dioxane/$H_2O$ (5:1), 2-(4-bromophenyl)-1,10-phenanthroline (6.96 g, 20.77 mmol, 1 eq.), $Pd(PPh_3)_4$ (1.2 g, 1.039 mmol, 0.05 eq.) and $K_3PO_4$ 13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 4-27 was obtained (8.83 g, 77.7%).

<Preparation Example 17> Preparation of Compound 5-1

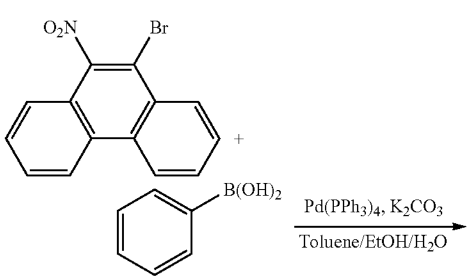

-continued

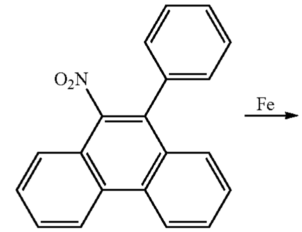

E-1

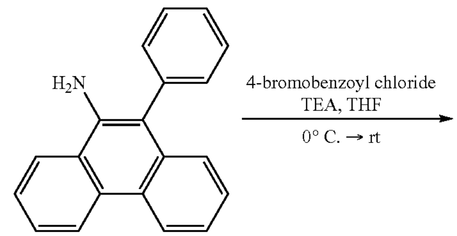

E-2

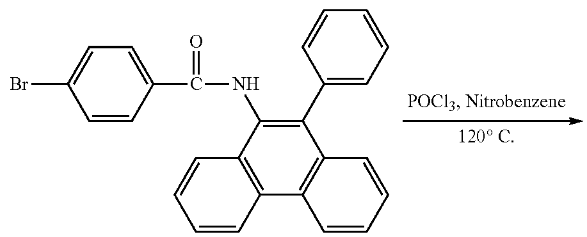

E-3

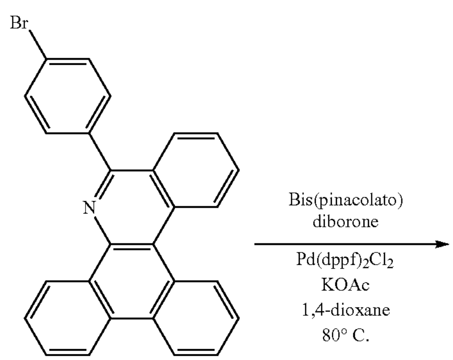

Molecular Weight: 434.34
E-4

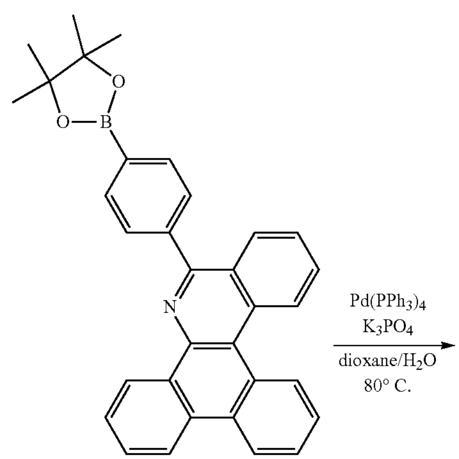

E-5

-continued

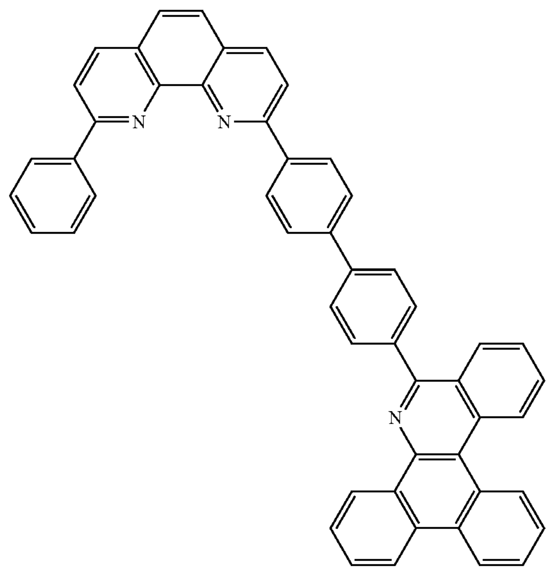

5-1

Preparation of Compound E-1

To two 5000 ml 3-neck round bottomed flasks, SM1 (160 g, 0.53 mol, 1 eq.) and SM2 (77.5 g, 0.635 mol, 1.2 eq.) were introduced each in half. 1,4-Dioxane was introduced thereto in 1600 ml each, and the results were stirred. To the round bottomed flasks, $Pd(PPh_3)_4$ (30.6 g, 0.026 mol, 0.05 eq.) and $K_3PO_4$ (337 g, 1.59 mol, 3.0 eq.) were introduced dividing in half. To the round bottomed flask, $H_2O$ (400 ml) was slowly introduced, and the result was stirred for 3 hours under reflux. The mixed solution was cooled to room temperature, and then extracted with MC/$H_2O$ (separated into black organic layer+red water layer). The organic layer was concentrated and then filtered using methanol. The result was all dissolved in toluene, then passed through silica gel, and the filtrate was separated and then concentrated. Solid Compound E-1 was obtained (92.4 g, 58.4%).

Preparation of Compound E-2

To a 3000 ml 2-neck round bottomed flask, E-1 Compound (92.4 g, 0.31 mol, 1.0 eq.) was introduced, and dissolved by introducing acetic acid (460 ml) and ethanol (1800 ml) thereto. Iron powder (86 g, 1.54 mol, 5.0 eq.) was slowly added thereto, and the result was stirred for 12 hours under reflux. Attention needed to be given so that the stirring bar was not hardened. After cooling the solution to room temperature, distilled water was added in excess (approximately 1000 ml). The result was neutralized with $NaHCO_3$ (pH 7 to 8). Black solids floating on the solution was filtered, and the filtrate was concentrated. The concentrate was extracted with MC/$H_2O$, and then washed with brine. After concentrating the organic solvent of the extract, the result was recrystallized with MC/Hex. Solid Compound E-2 was obtained (54 g, 65%).

Preparation of Compound E-3

After dissolving E-2 product (42.0 g, 0.156 mol, 1 eq.) in THF (300 ml) in a 3000 ml 1-neck round bottomed flask, triethylamine (64 ml, 0.468 mol, 3.0 eq.) was introduced thereto. The round bottomed flask was cooled to 0° C. (ice bath), and 4-bromobenzoyl chloride (40.7 g, 0.18 mol, 1.2 eq.) dissolved in THF (200 ml) was slowly added dropwise thereto. After stirring the result for approximately 10 minutes at 0° C., the temperature was slowly raised to room temperature, and the result was stirred for 2 hours. The result was stirred for a few minutes after adding $H_2O$ (200 ml) thereto, and the solvent was vacuum distilled. After dissolving the concentrate in MC (minimum amount), EA was added in excess (approximately 1000 ml). Solid Compound E-3 was obtained (80 g, 88%).

Preparation of Compound E-4

To a 2000 ml 2-neck round bottomed flask, E-3 (80 g, 0.177 mol, 1 eq.) was introduced and dissolved in nitrobenzene (1600 ml). To the round bottomed flask, $POCl_3$ (10 ml, 0.106 mol, 0.6 eq.) was added dropwise at room temperature, and the result was stirred for 1 hour at an external temperature of 160° C. The solvent (nitrobenzene) of the reaction mixture was removed through distillation. After dissolving the concentrate in MC, the result was neutralized with saturated $NaHCO_3$ (pH=8). The result was extracted with MC/$H_2O$, and the organic solvent was concentrated. The result was slurried with EA, and then filtered. Solid Compound E-4 was obtained (85.6 g, 73%).

Preparation of Compound E-5

Compound E-4 (56.0 g, 0.129 mol, 1.0 eq.), bis(pinacolato) diboron (39.3 g, 0.155 mol, 1.2 eq.), potassium acetate (38 g, 0.387 mol, 3.0 eq.) and $PdCl_2$(dppf) (4.7 g, 0.00645 mol, 0.05 eq.) were introduced to 1,4-dioxane (1000 ml) in a 2000 ml round bottomed flask, and the result was stirred for 1 hour under a reflux condition. After cooling the reaction mixture to room temperature, the solids were filtered while washing the filtration substance with MC. After extracting the filtrate with MC/$H_2O$, the organic layer was dried using $MgSO_4$. After concentrating the organic solvent, the solution dissolved in toluene was passed through silica gel (partially washed with toluene, and washed with MC and MC:EA=9:1 to obtain orange filtrate). After concentrating the filtrate, the result was recrystallized with EA in a small amount and hexane in excess to filter solids. Solid Compound E-5 was obtained (49 g, 79%).

Preparation of Compound 5-1

After dissolving E-5 (10.0 g, 20.77 mmol, 1 eq.) in dioxane/$H_2O$ (5:1), 2-(4-bromophenyl)-9-phenyl-1,10-phenanthroline (8.55 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 5-1 was obtained (8.74 g, 69%).

<Preparation Example 18> Preparation of Compound 5-7

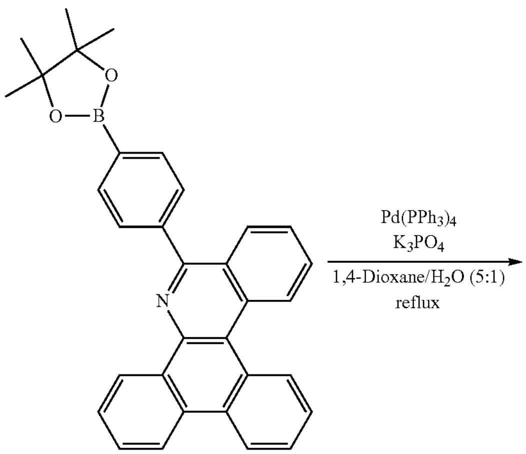

E-5

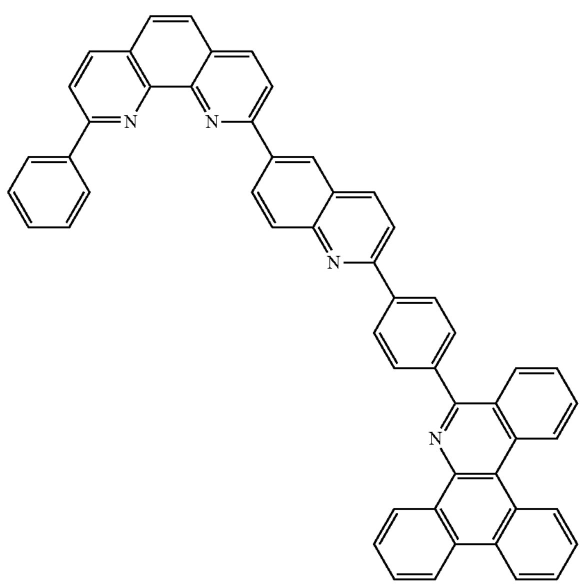

5-7

After dissolving E-5 (10.0 g, 20.77 mmol, 1 eq.) in dioxane/$H_2O$ (5:1), 2-(2-bromoquinolin-6-yl)-9-phenyl-1,10-phenanthroline (9.6 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 5-7 was obtained (11.4 g, 83%).

<Preparation Example 19> Preparation of Compound 5-21

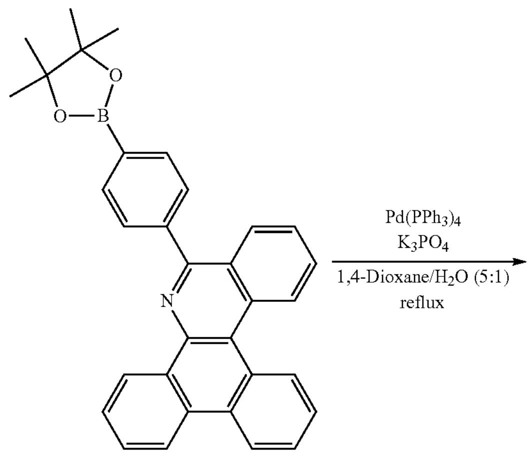

E-5

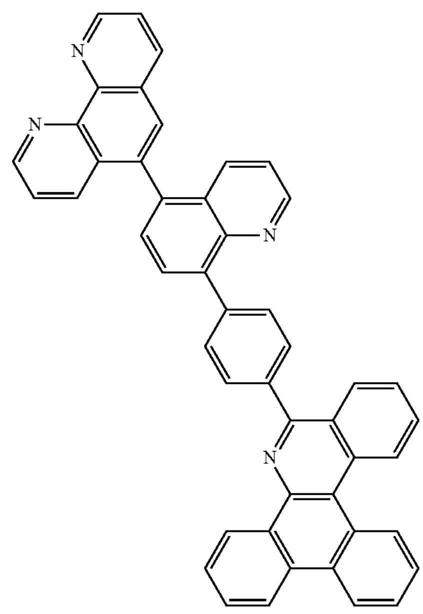

5-21

After dissolving E-5 (10.0 g, 20.77 mmol, 1 eq.) in dioxane/$H_2O$ (5:1), 5-(8-bromoquinolin-5-yl)-1,10-phenanthroline (8 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 5-21 was obtained (7.7 g, 56%).

<Preparation Example 20> Preparation of Compound 5-38

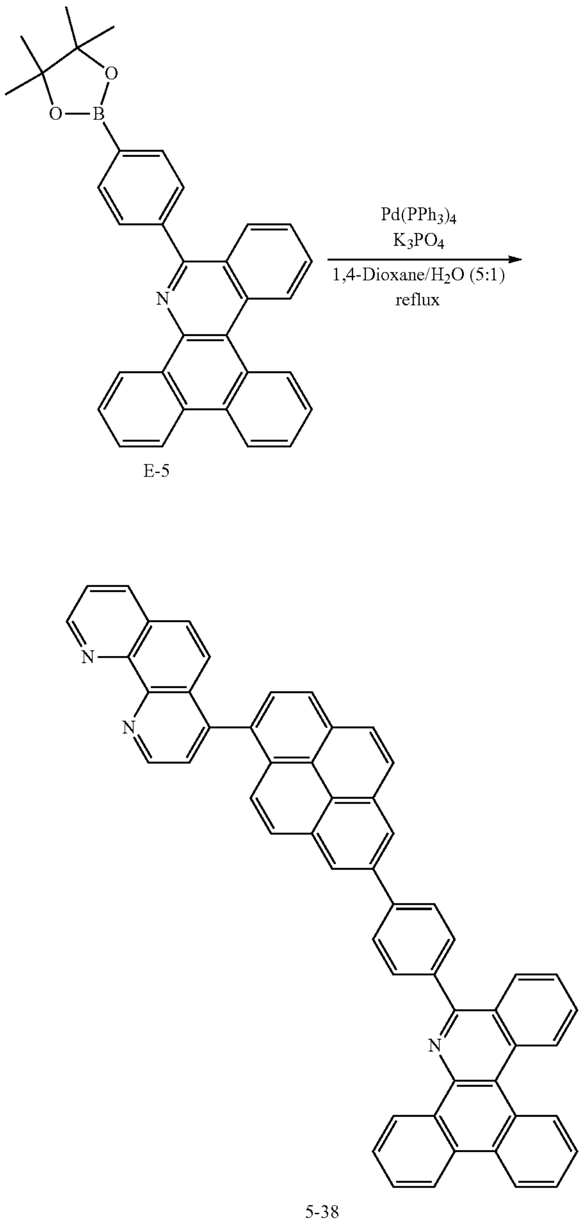

After dissolving E-5 (10.0 g, 20.77 mmol, 1 eq.) in dioxane/$H_2O$ (5:1), 4-(7-bromopyren-1-yl)-1,10-phenanthroline (9.54 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 5-38 was obtained (10.8 g, 71%).

<Preparation Example 21> Preparation of Compound 6-1

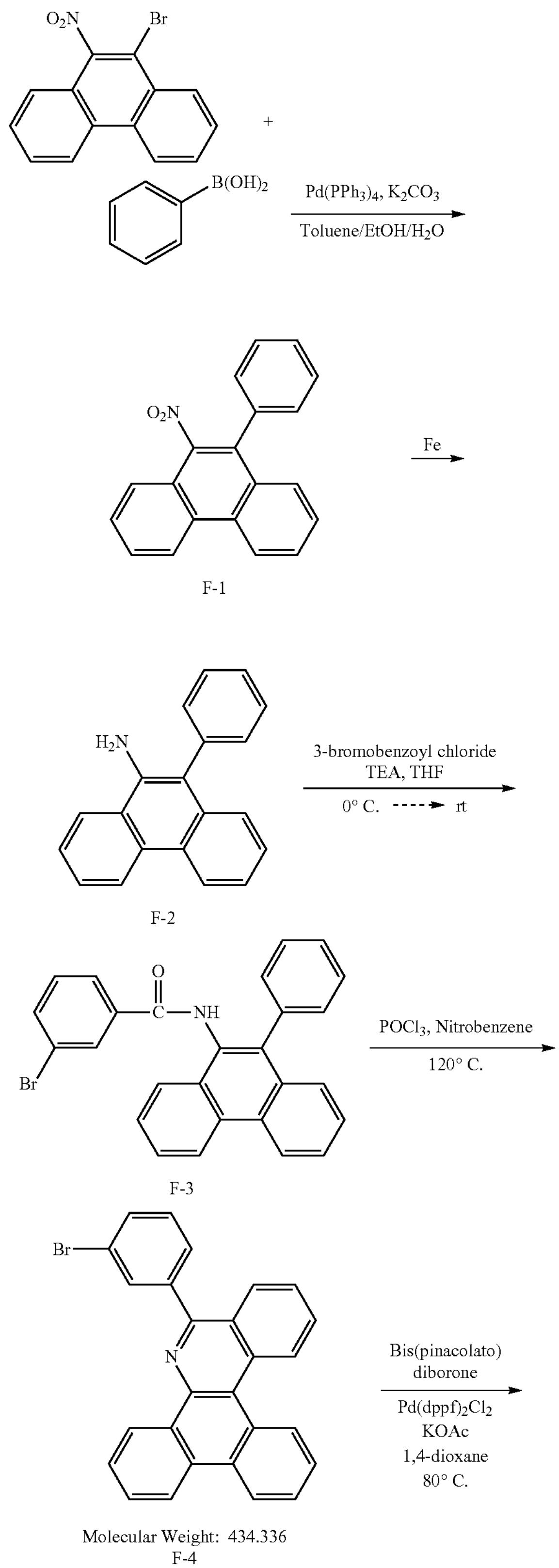

-continued

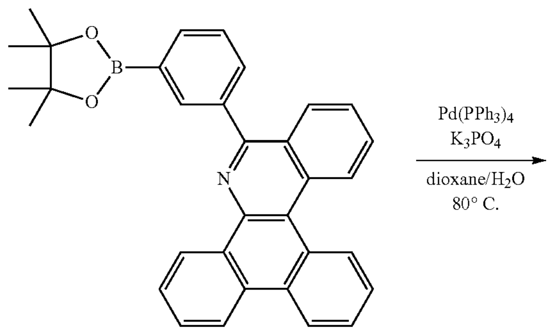

F-5

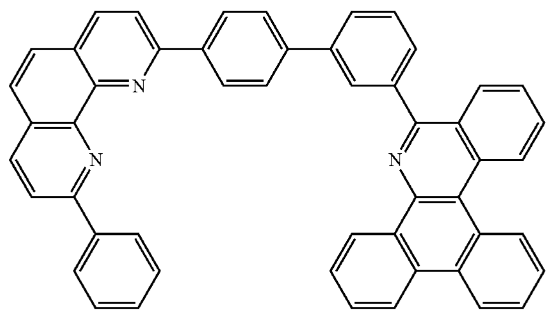

6-1

Preparation of Compound F-1

White solid Compound F-1 was obtained (92.4 g, 58.4%) in the same synthesis manner as E-1.

Preparation of Compound F-2

White Solid Compound F-2 was obtained (54 g, 65%) in the same synthesis manner as E-2.

Preparation of Compound F-3

White solid Compound F-3 was obtained (80 g, 88%) in the same synthesis manner as E-3.

Preparation of Compound F-4

White solid Compound F-4 was obtained (85.6 g, 73%) in the same synthesis manner as E-4.

Preparation of Compound F-5

White solid Compound F-5 was obtained (49 g, 79%) in the same synthesis manner as E-5.

Preparation of Compound 6-1

After dissolving F-5 (10.0 g, 20.77 mmol, 1 eq.) in dioxane/$H_2O$ (5:1), 2-(4-bromophenyl)-9-phenyl-1,10-phenanthroline (8.55 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 6-1 was obtained (9.74 g, 69%).

<Preparation Example 22> Preparation of Compound 6-5

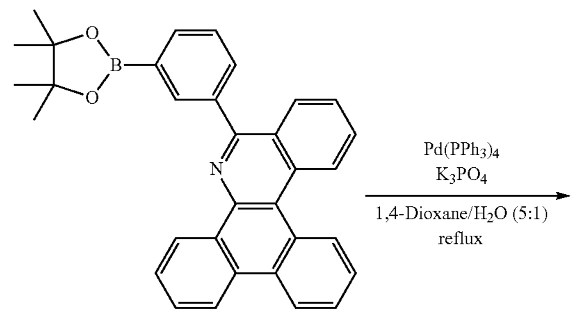

F-5

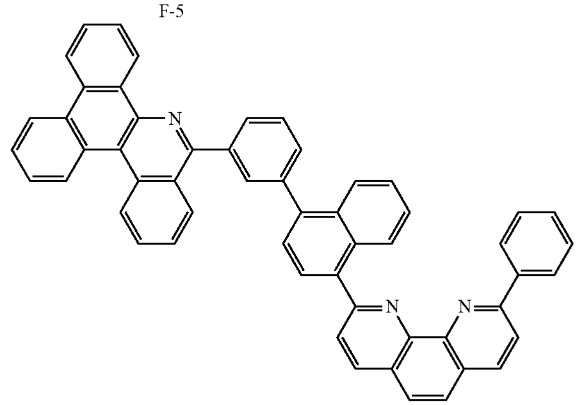

6-5

After dissolving F-5 (10.0 g, 20.77 mmol, 1 eq.) in dioxane/$H_2O$ (5:1), 2-(4-bromonaphthalen-1-yl)-9-phenyl-1,10-phenanthroline (9.57 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 6-5 was obtained (10.5 g, 69%).

<Preparation Example 23> Preparation of Compound 6-10

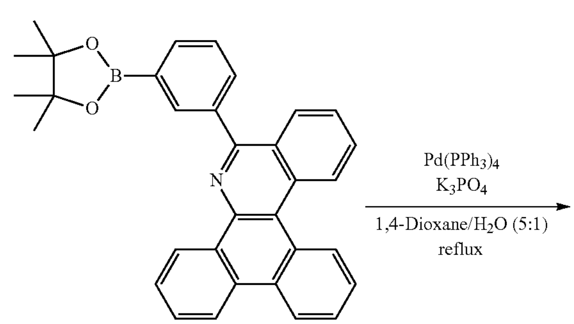

F-5

-continued

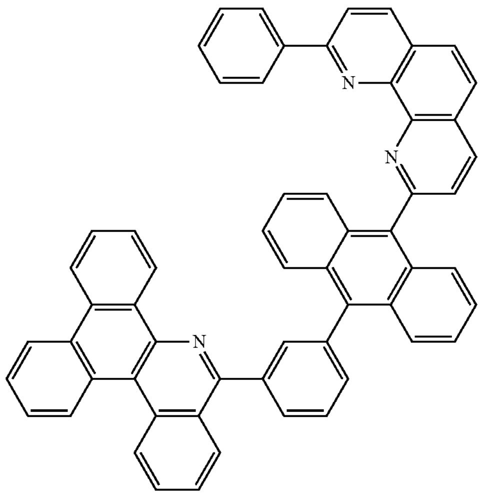

6-10

After dissolving F-5 (10.0 g, 20.77 mmol, 1 eq.) in dioxane/$H_2O$ (5:1), 2-(10-bromoanthracen-9-yl)-9-phenyl-1,10-phenanthroline (10.6 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 6-10 was obtained (8.8 g, 54%).

<Preparation Example 24> Preparation of Compound 6-14

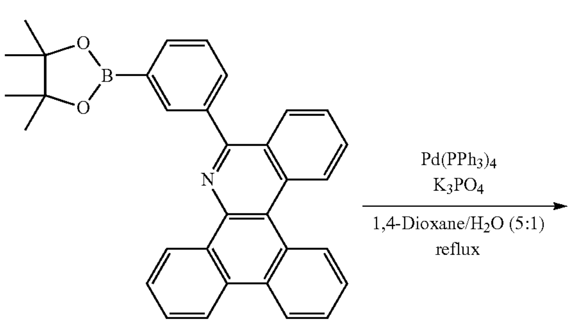

F-5

-continued

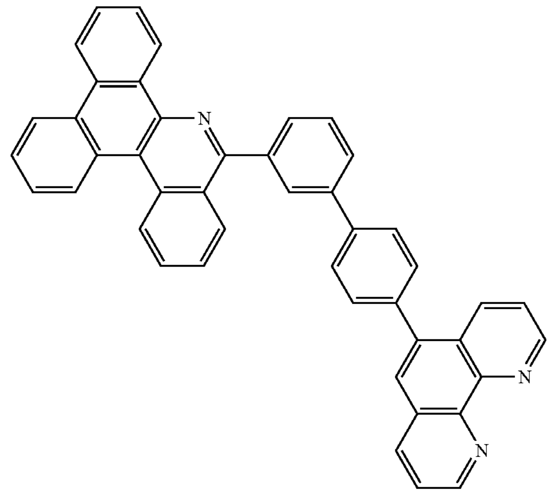

6-14

After dissolving F-5 (10.0 g, 20.77 mmol, 1 eq.) in dioxane/$H_2O$ (5:1), 5-(4-bromophenyl)-1,10-phenanthroline (6.9 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 6-14 was obtained (7.5 g, 60%).

<Preparation Example 25> Preparation of Compound 6-38

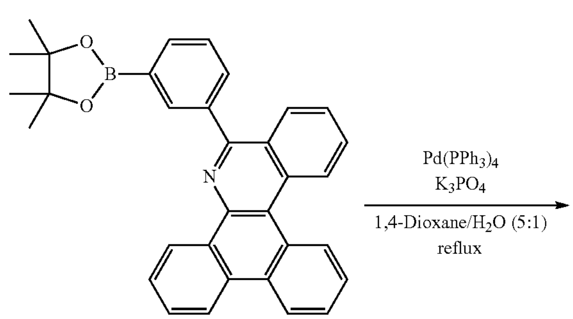

F-5

-continued

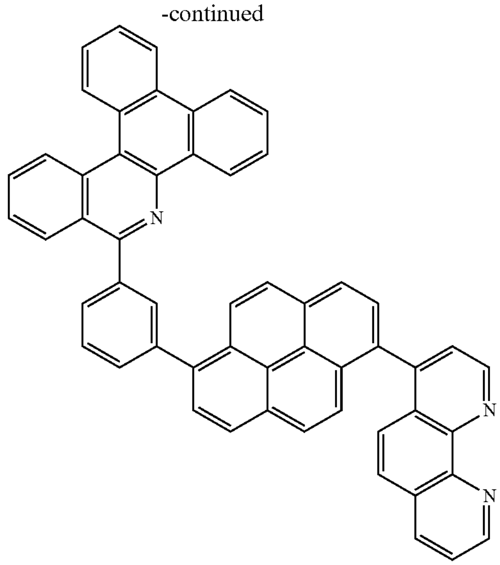

6-38

After dissolving F-5 (10.0 g, 20.77 mmol, 1 eq.) in dioxane/$H_2O$ (5:1), 4-(6-bromopyren-1-yl)-1,10-phenanthroline (9.54 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 6-38 was obtained (10 g, 65%).

<Preparation Example 26> Preparation of Compound 7-1

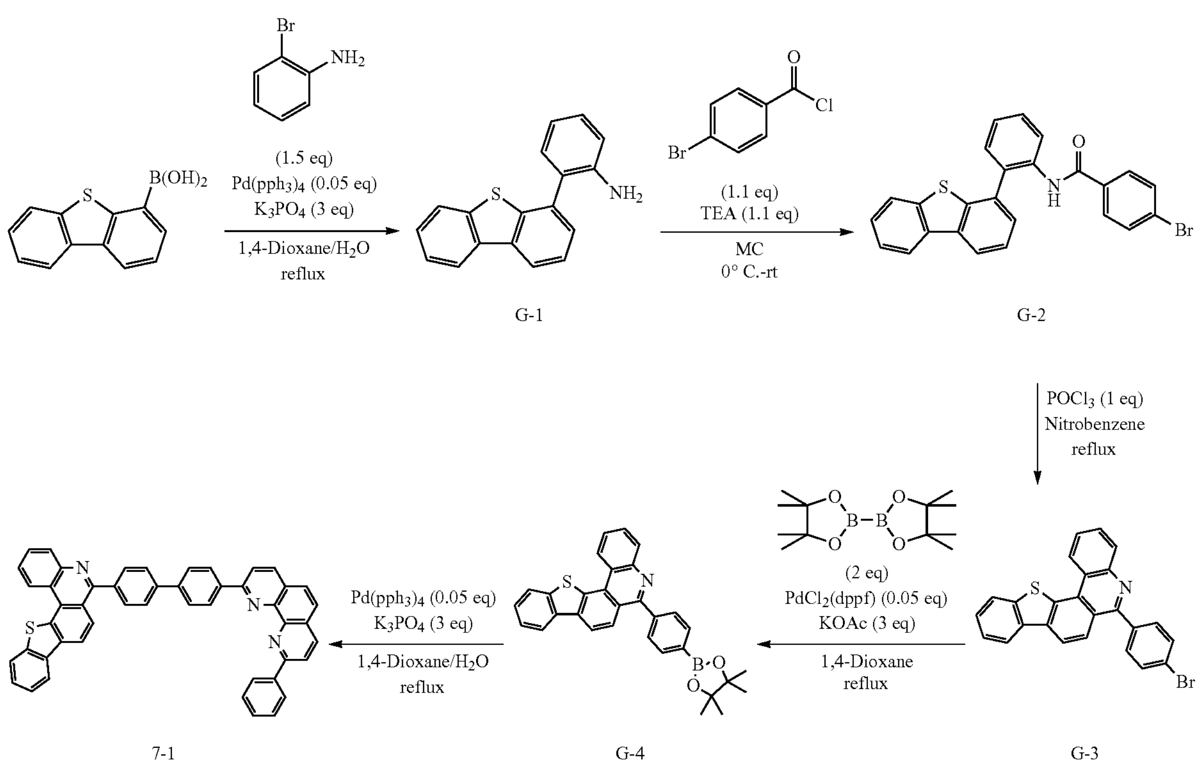

Preparation of Compound G-1

To a 3000 ml 3-neck round bottomed flask, SM1 (100 g, 0.438 mol, 1 eq.) and SM2 (113 g, 0.635 mol, 1.5 eq.) were introduced, and stirred after introducing 1,4-dioxane (1500 ml) thereto. To the round bottomed flask, $Pd(PPh_3)_4$ (25.3 g, 0.021 mol, 0.05 eq.) and $K_3PO_4$ (280 g, 1.315 mol, 3.0 eq.) were introduced. $H_2O$ (200 ml) was slowly added to the round bottomed flask, and the result was stirred for 3 hours under reflux. The mixed solution was cooled to room temperature, and then extracted with EA/$H_2O$. After concentrating the organic layer, the result was silica gel columned (eluent MC:Hex=1:3) for separation, and then concentrated. Liquid Compound G-1 was obtained (76 g, 63.3%).

Preparation of Compound G-2

After dissolving G-1 product (76 g, 0.276 mol, 1 eq.) in MC (800 ml) in a 2000 ml 1-neck round bottomed flask, triethylamine (41 ml, 0.295 mol, 1.1 eq.) was introduced thereto. The round bottomed flask was cooled to 0° C. (ice bath), and 4-bromobenzoyl chloride (38 ml, 0.295 mol, 1.1 eq.) dissolved in MC (150 ml) was slowly added dropwise thereto. After stirring the result for approximately 10 minutes at 0° C., the temperature was slowly raised to room temperature, and the result was stirred for 2 hours. The result was stirred for a few minutes after adding $H_2O$ (200 ml) thereto, and the solvent was vacuum distilled and concentrated. Liquid Compound G-2 was obtained (133 g, 100%).

Preparation of Compound G-3

To a 3000 ml 2-neck round bottomed flask, G-2 (133 g, 0.290 mol, 1 eq.) was introduced and dissolved in nitrobenzene (1300 ml). To the round bottomed flask, $POCl_3$ (31 ml, 0.275 mol, 0.95 eq.) was added dropwise at room temperature, and the result was stirred for 4 hours at an external temperature of 150° C. Saturated $NaHCO_3$ and EA were added in excess to produce yellow solids. After that, only the solids were collected through filtration, and the solids were washed with $H_2O$, MeOH, EA and hexane. Solid Compound G-3 was obtained (93 g, 76%).

Preparation of Compound G-4 Compound G-3 (93 g, 0.211 mol, 1.0 eq.), bis(pinacolato) diboron (107 g, 0.422 mol, 2 eq.), potassium acetate (62 g, 0.633 mol, 3.0 eq.) and $PdCl_2$(dppf) (7.8 g, 0.0105 mol, 0.05 eq.) were introduced to 1,4-dioxane (1000 ml) in a 2000 ml round bottomed flask, and the result was stirred for 2 hours under a reflux condition. After cooling the reaction mixture to room temperature, the solids were filtered while washing the filtration substance with MC. After concentrating the organic solvent, the solution dissolved in 1,2-dichlorobenzene while hot was passed through silica gel. After concentrating the filtrate, the result was dissolved in MC and filtered using silica gel. Solid Compound G-4 was obtained (82 g, 79%).

Preparation of Compound 7-1

After dissolving G-4 (10.1 g, 2.77 mmol, 1 eq.) in dioxane/$H_2O$ (5:1), 2-(4-bromophenyl)-9-phenyl-1,10-phenanthroline (8.55 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 7-1 was obtained (9.32 g, 65%).

<Preparation Example 27> Preparation of Compound 7-5

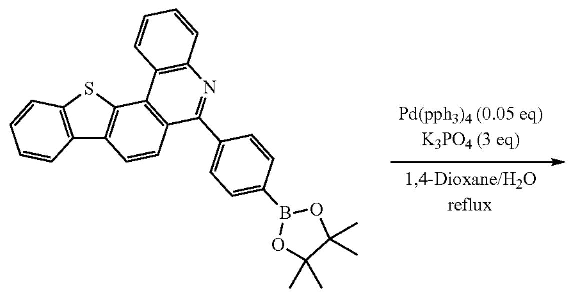

G-4

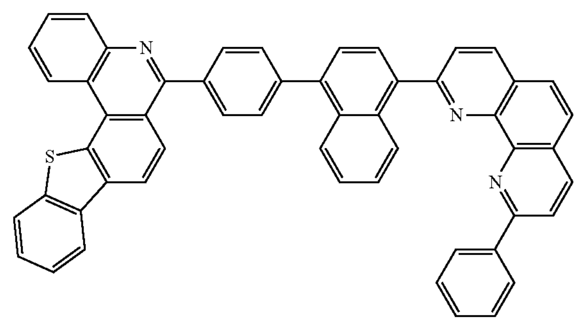

7-5

After dissolving G-4 (10.1 g, 20.77 mmol, 1 eq.) in dioxane/$H_2O$ (5:1), 2-(4-bromonaphthalen-1-yl)-9-phenyl-1,10-phenanthroline (9.7 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 7-5 was obtained (8.9 g, 58%).

<Preparation Example 28> Preparation of Compound 7-17

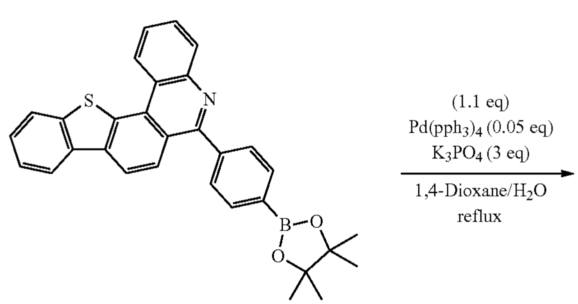

G-4

-continued

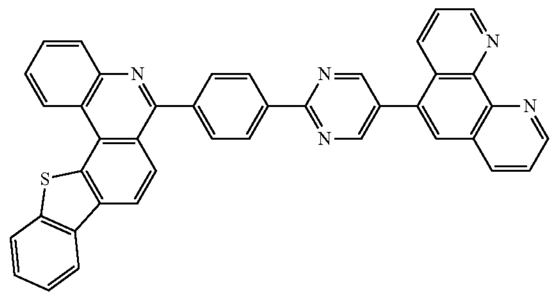

7-17

After dissolving G-4 (10.1 g, 20.77 mmol, 1 eq.) in dioxane/$H_2O$ (5:1), 5-(2-bromopyrimidin-5-yl)-1,10-phenanthroline (6.9 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 7-17 was obtained (6.4 g, 50%).

<Preparation Example 29> Preparation of Compound 7-34

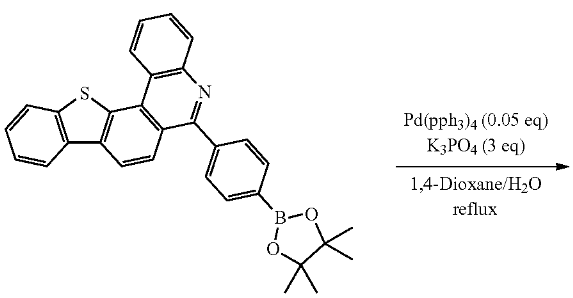

G-4

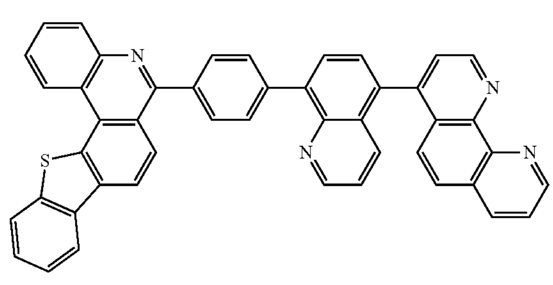

7-34

After dissolving G-4 (10.1 g, 20.77 mmol, 1 eq.) in dioxane/$H_2O$ (5:1), 4-(8-bromoquinolin-5-yl)-1,10-phenanthroline (8.1 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 7-34 was obtained (6.5 g, 47%).

<Preparation Example 30> Preparation of Compound 7-39

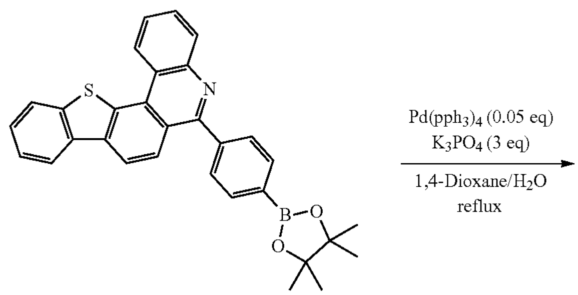

G-4

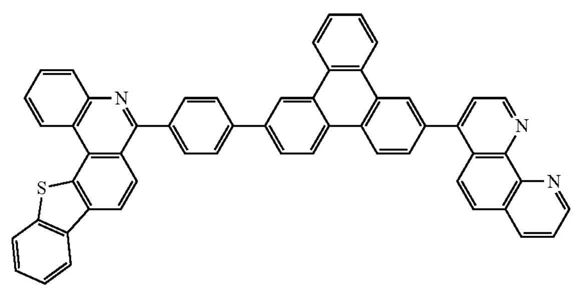

7-39

After dissolving G-4 (10.1 g, 20.77 mmol, 1 eq.) in dioxane/$H_2O$ (5:1), 4-(7-bromotriphenylen-2-yl)-1,10-phenanthroline (10.1 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 7-39 was obtained (8.4 g, 53%).

<Preparation Example 31> Preparation of Compound 8-1

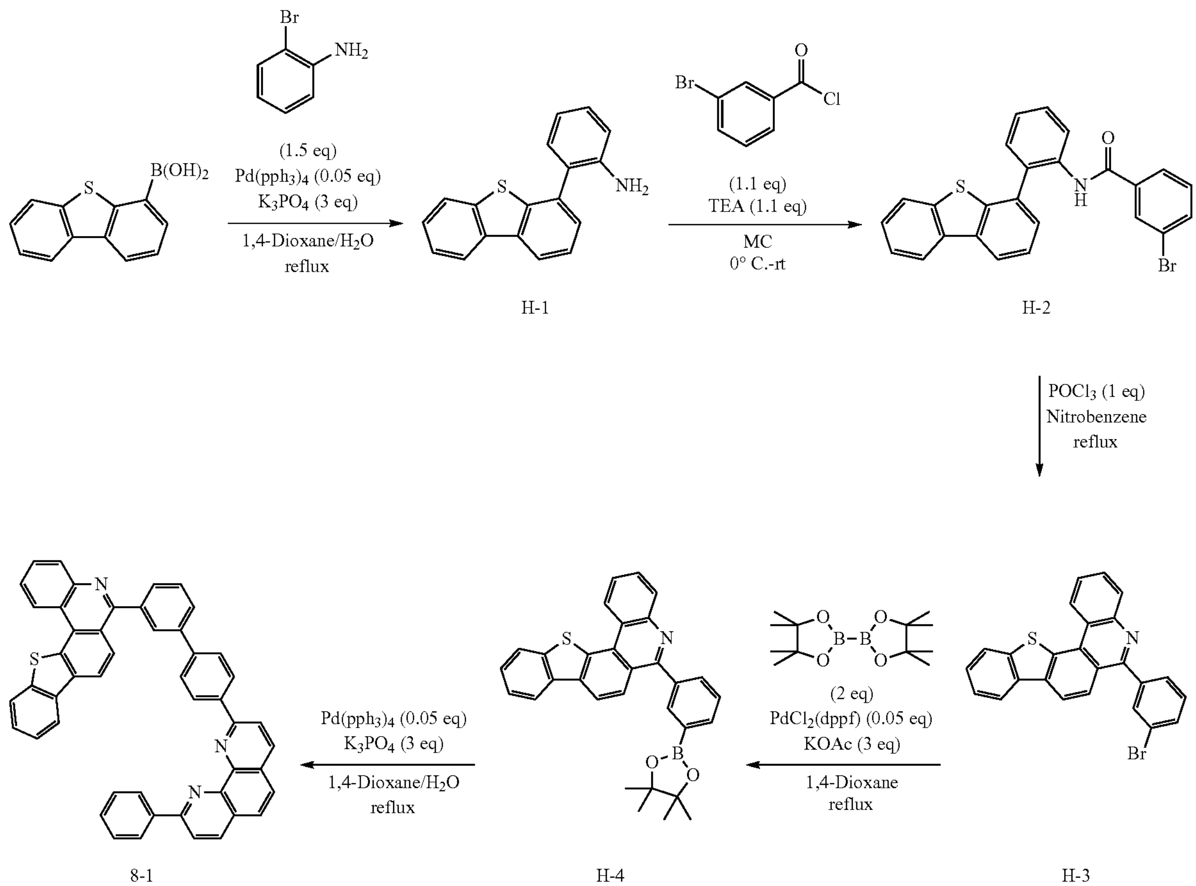

Preparation of Compound H-1

Liquid Compound H-1 was obtained (76 g, 63.3%) in the same synthesis manner as G-1.

Preparation of Compound H-2

Liquid Compound H-2 was obtained (133 g, 100%) in the same synthesis manner as G-2.

Preparation of Compound H-3

Solid Compound H-3 was obtained (93 g, 76%) in the same synthesis manner as G-3.

Preparation of Compound H-4

Solid Compound H-4 was obtained (82 g, 79%) in the same synthesis manner as G-4.

Preparation of Compound 8-1

After dissolving H-4 (10.1 g, 2.77 mmol, 1 eq.) in dioxane/$H_2O$ (5:1), 2-(4-bromophenyl)-9-phenyl-, 10-phenanthroline (8.55 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 8-1 was obtained (9.32 g, 65%).

<Preparation Example 32> Preparation of Compound 8-5

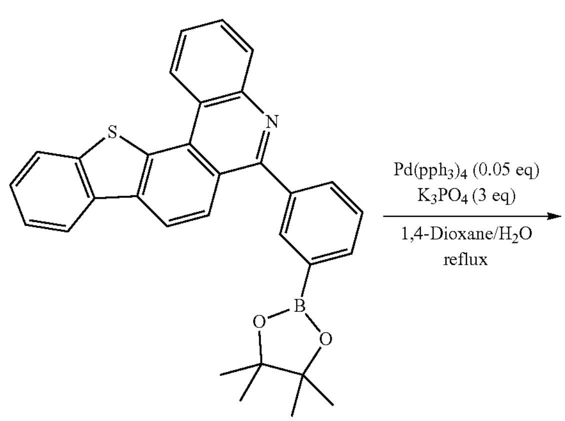

H-4

-continued

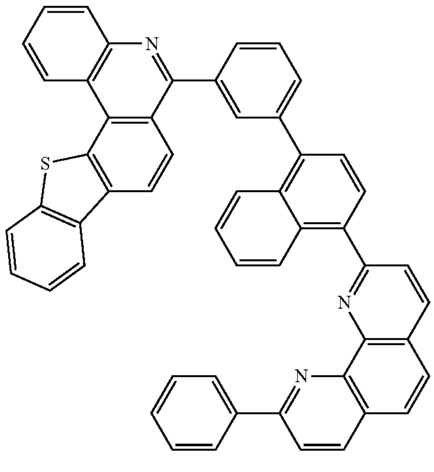

8-5

After dissolving H-4 (10.1 g, 20.77 mmol, 1 eq.) in dioxane/$H_2O$ (5:1), 2-(4-bromonaphthalen-1-yl)-9-phenyl-1,10-phenanthroline (9.5 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 8-5 was obtained (8.6 g, 56%).

<Preparation Example 33> Preparation of Compound 8-6

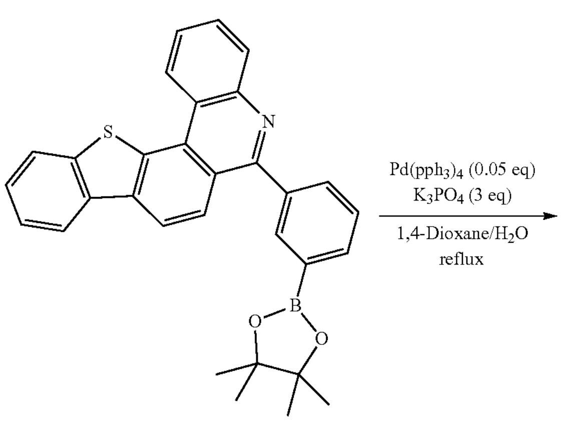

H-4

-continued

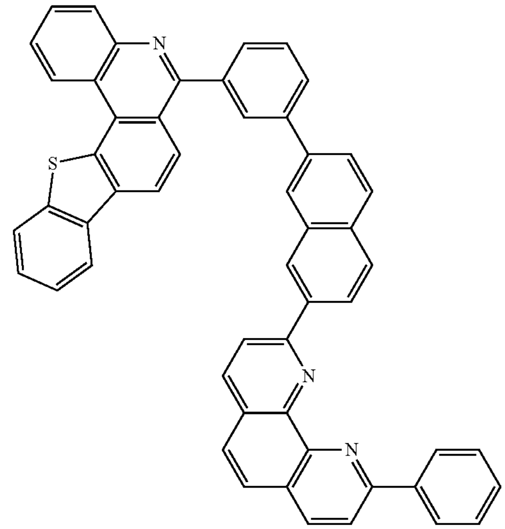

8-6

After dissolving H-4 (10.1 g, 20.77 mmol, 1 eq.) in dioxane/$H_2O$ (5:1), 2-(7-bromonaphthalen-2-yl)-9-phenyl-1,10-phenanthroline (9.5 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 8-6 was obtained (7.6 g, 50%).

<Preparation Example 34> Preparation of Compound 8-19

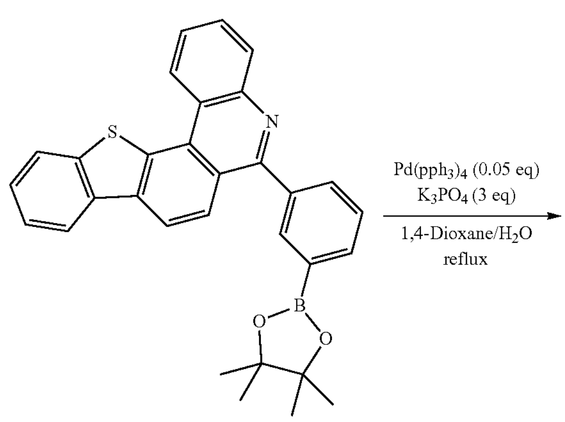

H-4

-continued

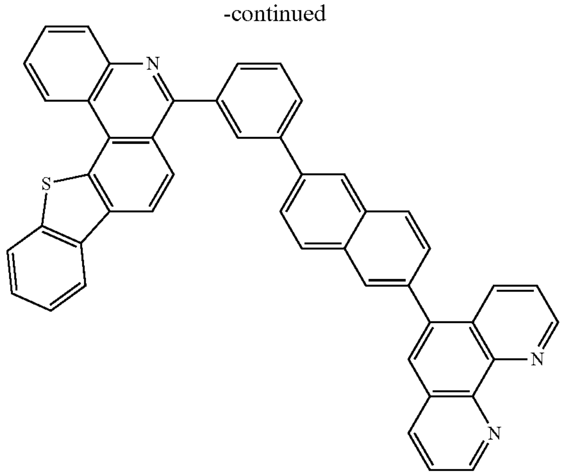

8-19

After dissolving H-4 (10.1 g, 20.77 mmol, 1 eq.) in dioxane/$H_2O$ (5:1), 5-(6-bromonaphthalen-2-yl)-1,10-phenanthroline (7.9 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 8-19 was obtained (7.8 g, 57%).

<Preparation Example 35> Preparation of Compound 8-38

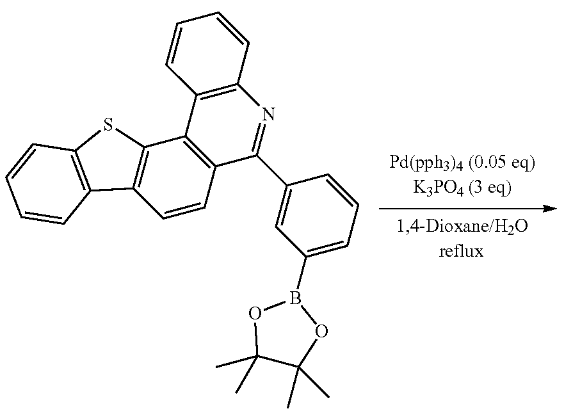

H-4

-continued

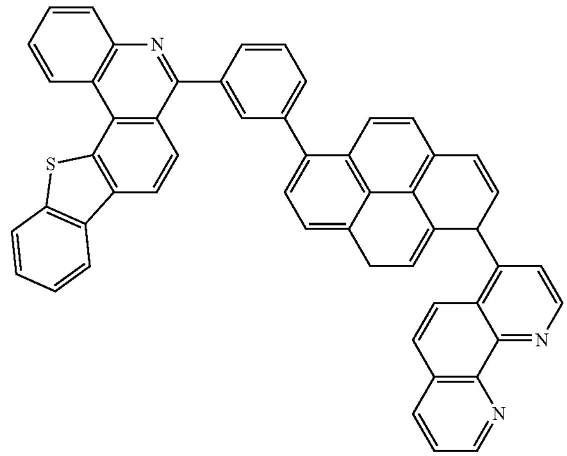

8-38

After dissolving H-4 (10.1 g, 20.77 mmol, 1 eq.) in dioxane/$H_2O$ (5:1), 4-(6-bromopyren-1-yl)-1,10-phenanthroline (9.5 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 8-38 was obtained (7.7 g, 50%).

<Preparation Example 36> Preparation of Compound 9-1

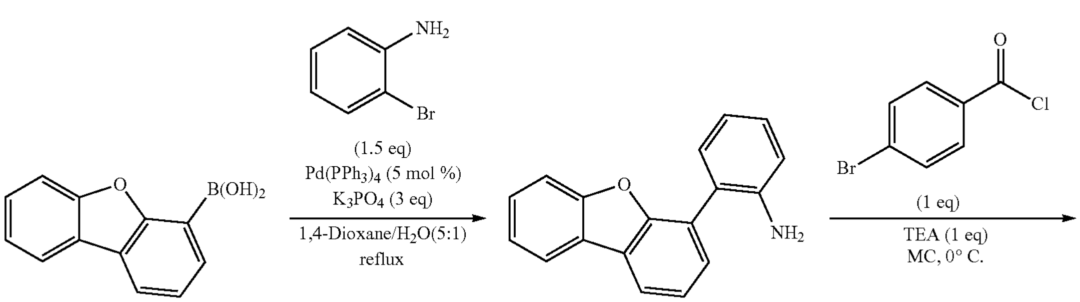

I-1

-continued

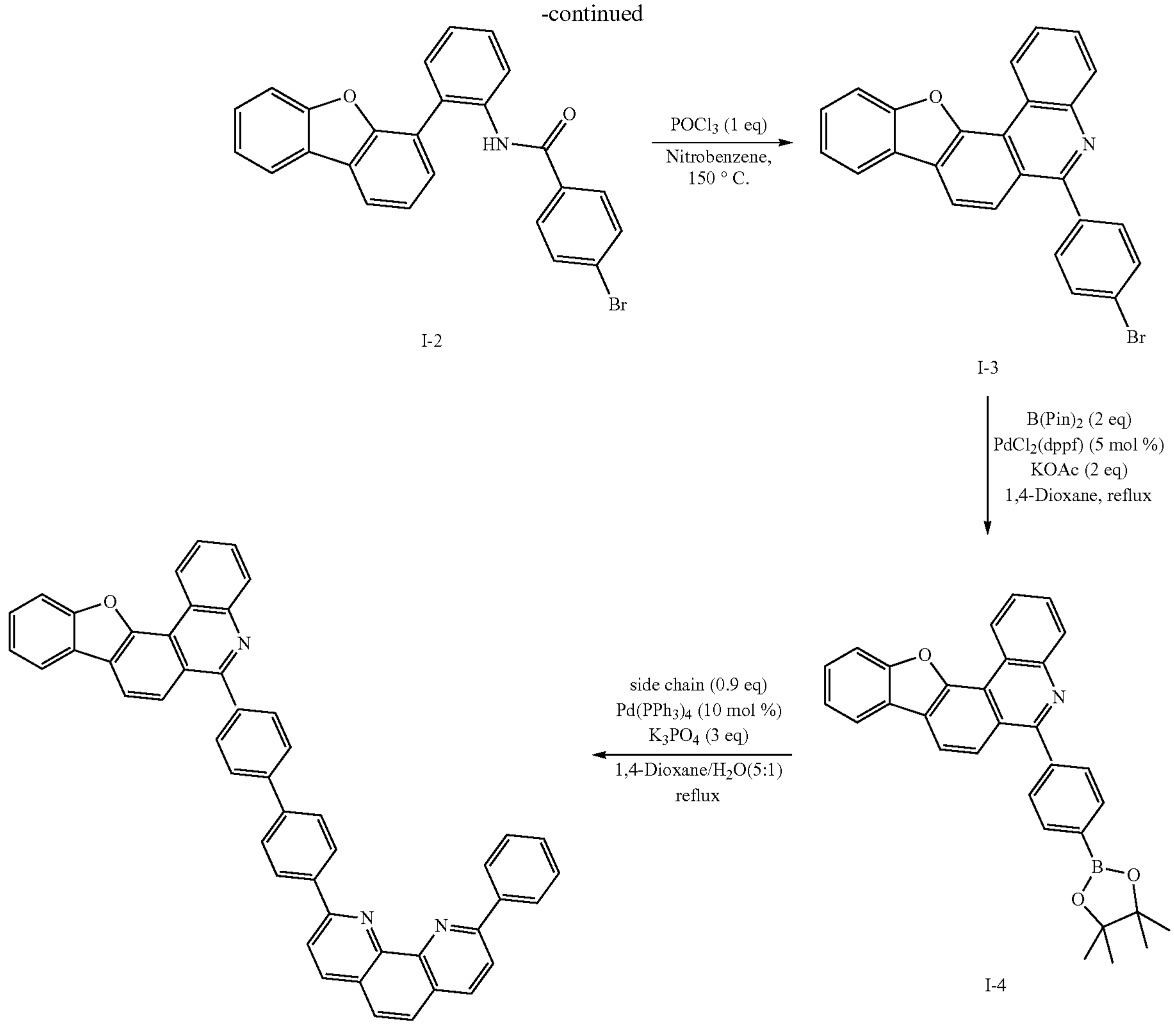

I-2

I-3

I-4

9-1

To a flask, dibenzo[b,d]furan-4-ylboronic acid (80 g, 377.3 mmol, 1 eq.), 2-bromoaniline (77.9 g, 452.8 mmol, 1.2 eq.), $Pd(PPh_3)_4$ (13.1 g, 11.3 mmol, 0.03 eq.), $K_3PO_4$ (240.3 g, 1131.9 mmol, 3 eq.) and 1,4-dioxane/$H_2O$=5:1 (800, 160) were introduced, and the result was stirred for 1 hour at 120° C. When the reaction was completed, the temperature was lowered to room temperature, then $H_2O$ and MC were introduced thereto, and the result was stirred. The mixture was extracted with MC, moisture in the organic layer was removed using $MgSO_4$, the result was filtered, and the solvent was concentrated. The concentration-completed mixture was column separated using MC:Hex (1:4, 1:3, 1:1). Solid Compound I-1 (27 g, 55%) was obtained.

Preparation of Compound I-2

To a flask, I-1 (27 g, 104.1 mmol, 1.0 eq.) was introduced, and was all dissolved in MC (250 mL). After that, TEA (14.6 ml, 104.1 mmol, 1.0 eq.) was introduced thereto, and the result was stirred for approximately 15 minutes. After adding 4-bromobenzoyl chloride (25.1 g, 114.5 mmol, 1.0 eq.) dissolved in a small amount of MC thereto at 0° C., the result was stirred for 1 hour while maintaining the temperature. After the reaction was completed, hexane was added in excess thereto to produce solids, and the result was filtered. The filtered solids were washed with hexane. Solid Compound I-2 was obtained (47 g, 99%).

Preparation of Compound I-3

To a flask, 3-bromo-N-(2-(dibenzo[b,d]furan-4-yl)phenyl)benzamide (47.5 g, 107.46 mmol, 1.0 eq.) and then nitrobenzene (400 mL) were introduced, and $POCl_3$ (12.1 ml, 107.46 mmol, 1.0 eq.) was introduced thereto. After that, the result was stirred for 12 hours at 150° C. When the reaction was completed, the temperature was lowered to room temperature, and then sodium bicarbonate was slowly added thereto. The organic material was extracted with MC, and after removing the solvent, MeOH was added to the concentrated residue, and the result was stirred and filtered to obtain target Compound I-3 (71%).

Preparation of Compound I-4

To a flask, 6-(4-bromophenyl)benzofuro[3,2-k]phenanthridine (18.3 g, 43.1 mmol, 1.0 eq.), bis(pinacolato) diboron (21.9 g, 86.3 mmol, 2.0 eq.), $Pd(dppf)Cl_2$ (1.58 g, 2.15 mmol, 0.05 eq.) and KOAc (12.7 g, 129.3 mmol, 3.0 eq.) were introduced, the result was stirred for 2 hours at 120° C. after introducing 1,4-dioxane (150 mL) thereto. When the reaction was completed, the result was extracted with MC and $H_2O$, and the organic layer was dried with $MgSO_4$. The result was filtered and concentrated. Solids produced after the concentration were slurried with MeOH, and then washed with a small amount of MeOH and hexane to obtain target Compound I-4 (84%).

Preparation of Compound 9-1

To a flask, 6-(4-(4,4,5,5-tetramethyl-1,3,2-dioxaborolan-2-yl)phenyl)benzofuro[3,2-k]phenanthridine (10 g, 21.2 mmol, 1 eq.), 2-(4-bromophenyl)-9-phenyl-1,10-phenanthroline (0.9 eq.), $Pd(PPh_3)_4$ (0.10 eq.), $K_3PO_4$ (3 eq.) and 1,4-dioxane/$H_2O$=5:1 (200, 40) were introduced, and the result was stirred for 1 hour at 120° C. When the reaction was completed, the temperature was lowered to room temperature, then $H_2O$ and MC were introduced thereto, and the result was stirred. The mixture was extracted with MC, moisture in the organic layer was removed using $MgSO_4$, the result was filtered, and the solvent was concentrated. The concentration-completed mixture was column separated using MC:Hex. Solid Compound 9-1 (12 g, 86%) was obtained.

<Preparation Example 37> Preparation of Compound 9-5

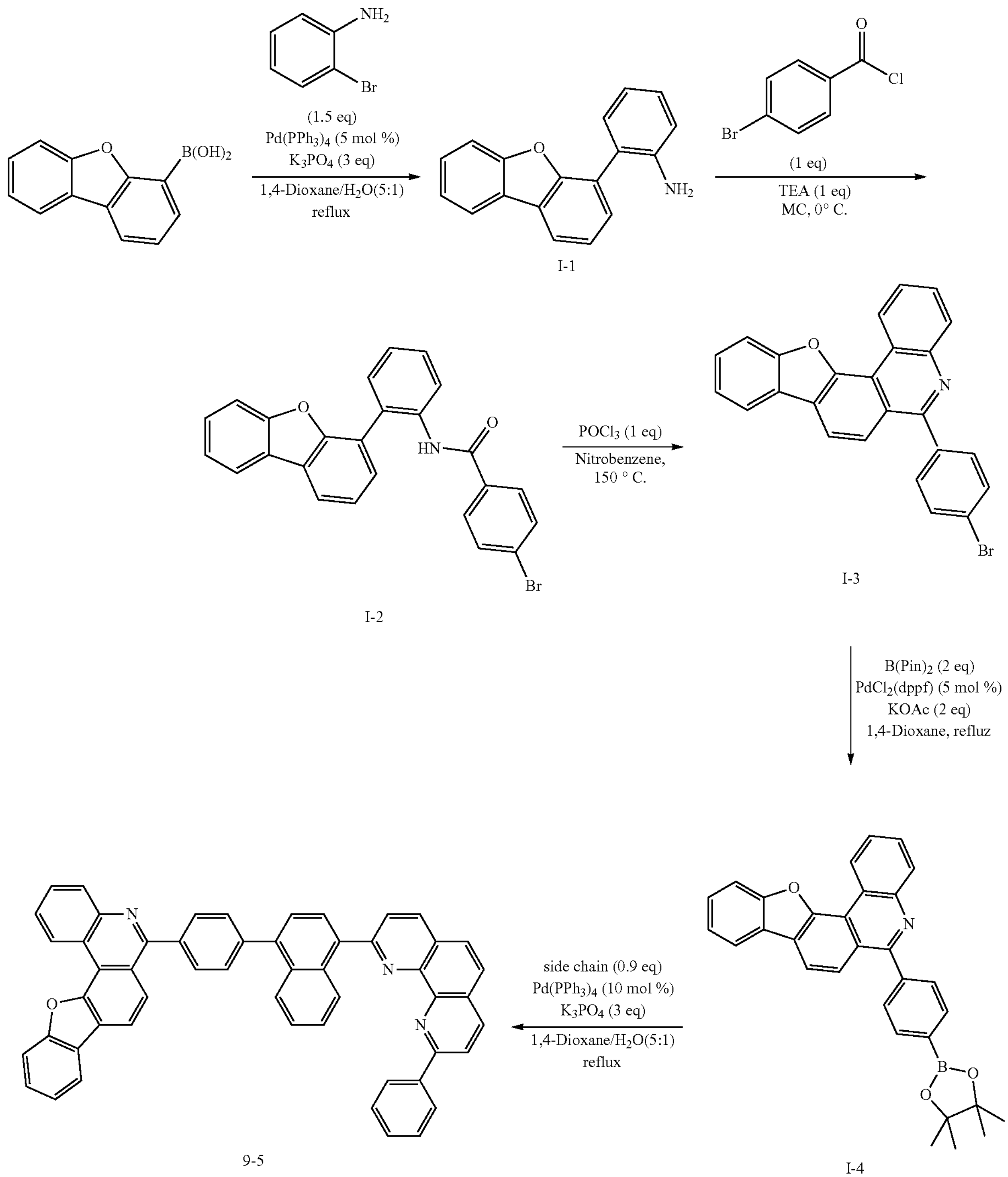

To a flask, 6-(4-(4,4,5,5-tetramethyl-1,3,2-dioxaborolan-2-yl)phenyl)benzofuro[3,2-k]phenanthridine (10 g, 21.2 mmol, 1 eq.), 2-(4-bromonaphthalen-1-yl)-9-phenyl-1,10-phenanthroline (0.9 eq.), $Pd(PPh_3)_4$ (0.10 eq.), $K_3PO_4$ (3 eq.) and 1,4-dioxane/$H_2O$=5:1 (200, 40) were introduced, and the result was stirred for 1 hour at 120° C. When the reaction was completed, the temperature was lowered to room temperature, then $H_2O$ and MC were introduced thereto, and the result was stirred. The mixture was extracted with MC, moisture in the organic layer was removed using $MgSO_4$, the result was filtered, and the solvent was concentrated. The concentration-completed mixture was column separated using MC:Hex. Solid Compound 9-5 (11 g, 75%) was obtained.

<Preparation Example 38> Preparation of Compound 9-14

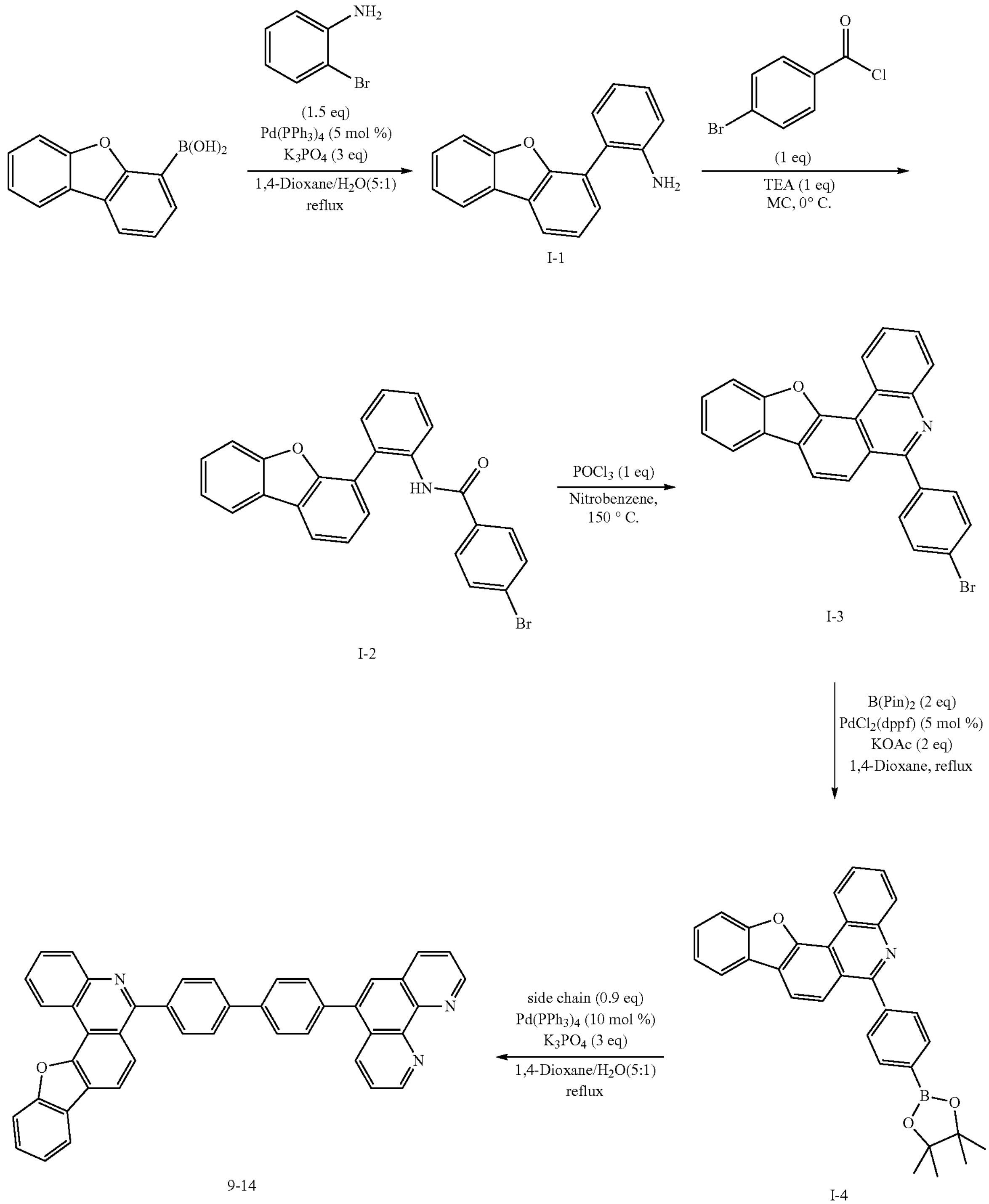

To a flask, 6-(4-(4,4,5,5-tetramethyl-1,3,2-dioxaborolan-2-yl)phenyl)benzofuro[3,2-k]phenanthridine (10 g, 21.2 mmol, 1 eq.), 5-(4-bromophenyl)-1,10-phenanthroline (0.9 eq.), $Pd(PPh_3)_4$ (0.10 eq.), $K_3PO_4$ (3 eq.) and 1,4-dioxane/$H_2O$=5:1 (200, 40) were introduced, and the result was stirred for 1 hour at 120° C. When the reaction was completed, the temperature was lowered to room temperature, then $H_2O$ and MC were introduced thereto, and the result was stirred. The mixture was extracted with MC, moisture in the organic layer was removed using $MgSO_4$, the result was filtered, and the solvent was concentrated. The concentration-completed mixture was column separated using MC:Hex. Solid Compound 9-14 (9.3 g, 73%) was obtained.

<Preparation Example 39> Preparation of Compound 9-18

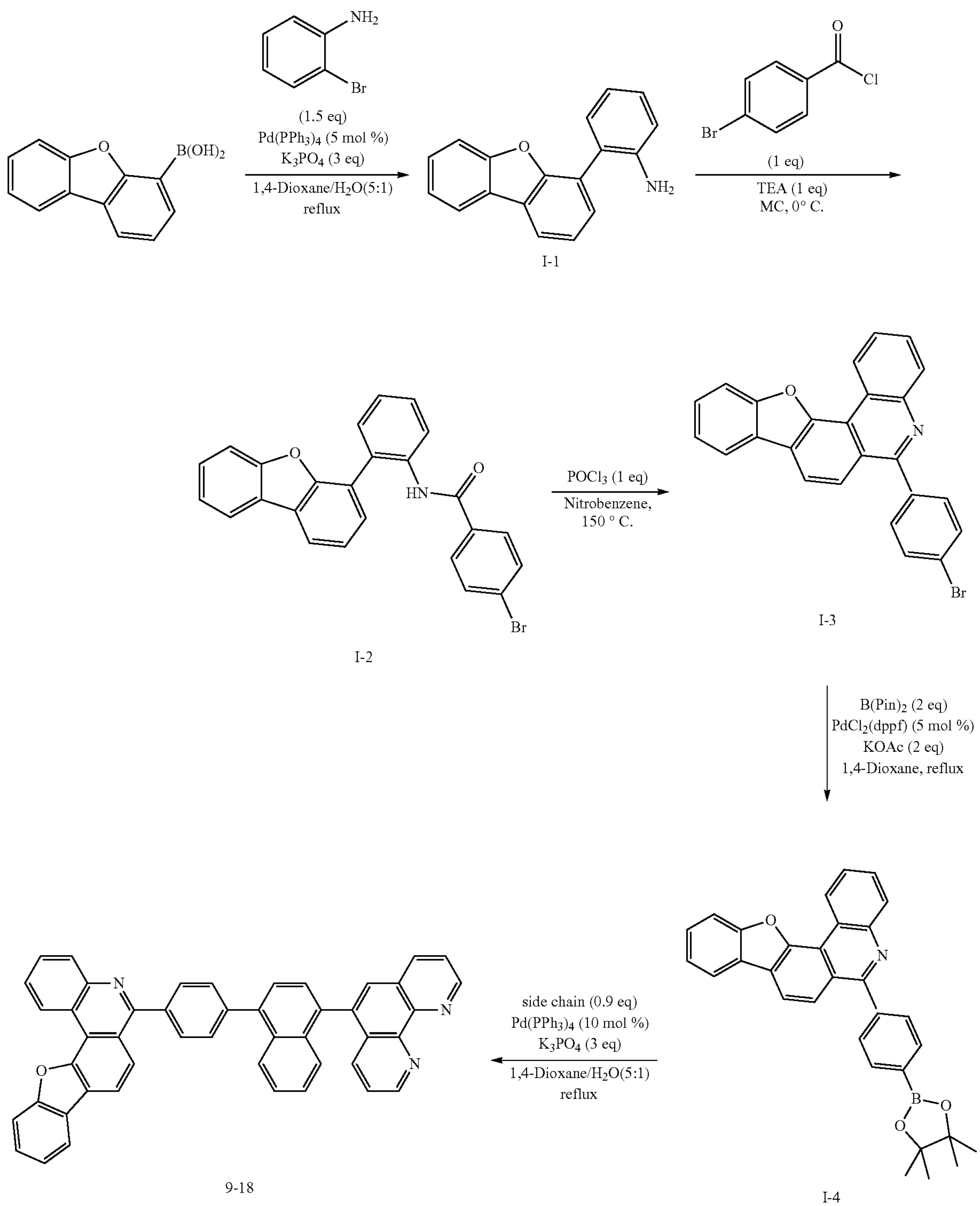

To a flask, 6-(4-(4,4,5,5-tetramethyl-1,3,2-dioxaborolan-2-yl)phenyl)benzofuro[3,2-k]phenanthridine (10 g, 21.2 mmol, 1 eq.), 5-(4-bromonaphthalen-1-yl)-1,10-phenanthroline (0.9 eq.), $Pd(PPh_3)_4$ (0.10 eq.), $K_3PO_4$ (3 eq.) and 1,4-dioxane/$H_2O$=5:1 (200, 40) were introduced, and the result was stirred for 1 hour at 120° C. When the reaction was completed, the temperature was lowered to room temperature, then $H_2O$ and MC were introduced thereto, and the result was stirred. The mixture was extracted with MC, moisture in the organic layer was removed using $MgSO_4$, the result was filtered, and the solvent was concentrated. The concentration-completed mixture was column separated using MC:Hex. Solid Compound 9-18 (11.2 g, 81%) was obtained.

<Preparation Example 40> Preparation of Compound 10-1

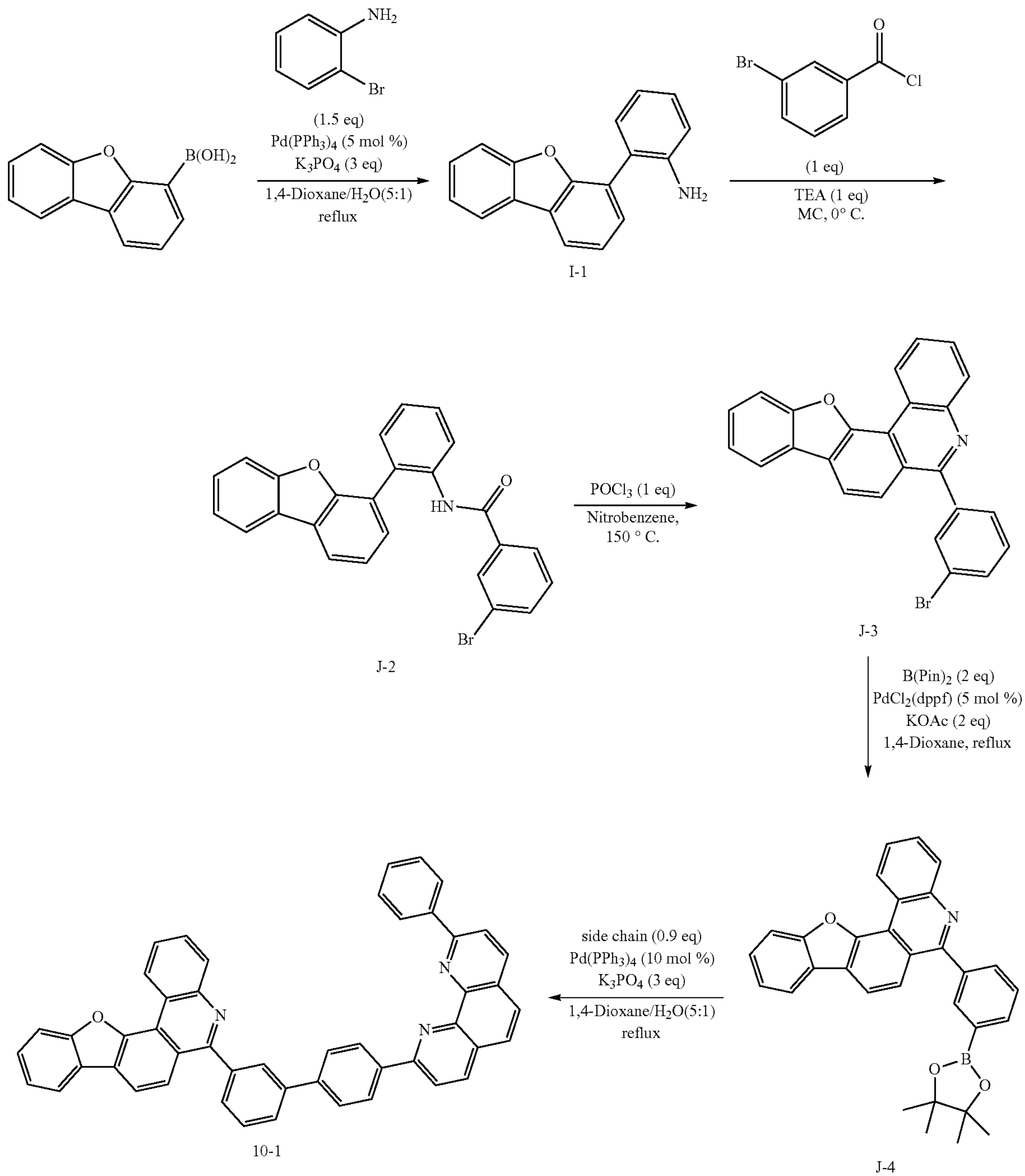

Preparation of Compound J-2

To a flask, I-1 (27 g, 104.1 mmol, 1.0 eq.) was introduced, and was all dissolved in MC (250 mL). After that, TEA (14.6 ml, 104.1 mmol, 1.0 eq.) was introduced thereto, and the result was stirred for approximately 15 minutes. After adding 4-bromobenzoyl chloride (25.1 g, 114.5 mmol, 1.0 eq.) dissolved in a small amount of MC thereto at 0° C., the result was stirred for 1 hour while maintaining the temperature. After the reaction was completed, hexane was added in excess thereto to produce solids, and the result was filtered. The filtered solids were washed with hexane. Solid Compound J-2 (47 g, 99%) was obtained.

Preparation of Compound J-3

To a flask, J-2 (47 g, 103.0 mmol, 1.0 eq.) and then nitrobenzene (400 mL) were introduced, and $POCl_3$ (1.0 eq.) was introduced thereto. After that, the result was stirred for 12 hours at 150° C. When the reaction was completed, the temperature was lowered to room temperature, and then sodium bicarbonate was slowly added thereto. The organic material was extracted with MC, and after removing the solvent, MeOH was added to the concentrated residue, and the result was stirred and filtered to obtain target Compound J-3 (32 g, 73%).

Preparation of Compound J-4

To a flask, J-3 (32 g, 75.2 mmol, 1.0 eq.), bis(pinacolato) diboron (2.0 eq.), $Pd(dppf)Cl_2$ (0.05 eq.) and KOAc (3.0 eq.) were introduced, the result was stirred for 2 hours at 120° C. after introducing 1,4-dioxane (150 mL) thereto. When the reaction was completed, the result was extracted with MC and $H_2O$, and the organic layer was dried with $MgSO_4$. The result was filtered and concentrated. Solids produced after the concentration were slurried with MeOH, and then washed with a small amount of MeOH and hexane to obtain target Compound J-4 (29 g, 61.6 mmol, 82%).

Preparation of Compound 10-1

To a flask, 6-(3-(4,4,5,5-tetramethyl-1,3,2-dioxaborolan-2-yl)phenyl)benzofuro[3,2-k]phenanthridine (10 g, 21.2 mmol, 1 eq.), 2-(4-bromophenyl)-9-phenyl-1,10-phenanthroline (0.9 eq.), $Pd(PPh_3)_4$ (0.10 eq.), $K_3PO_4$ (3 eq.) and 1,4-dioxane/$H_2O$=5:1 (200, 40) were introduced, and the result was stirred for 1 hour at 120° C. When the reaction was completed, the temperature was lowered to room temperature, then $H_2O$ and MC were introduced thereto, and the result was stirred. The mixture was extracted with MC, moisture in the organic layer was removed using $MgSO_4$, the result was filtered, and the solvent was concentrated. The concentration-completed mixture was column separated using MC:Hex. Solid Compound 10-1 (12 g, 84%) was obtained.

<Preparation Example 41> Preparation of Compound 10-5

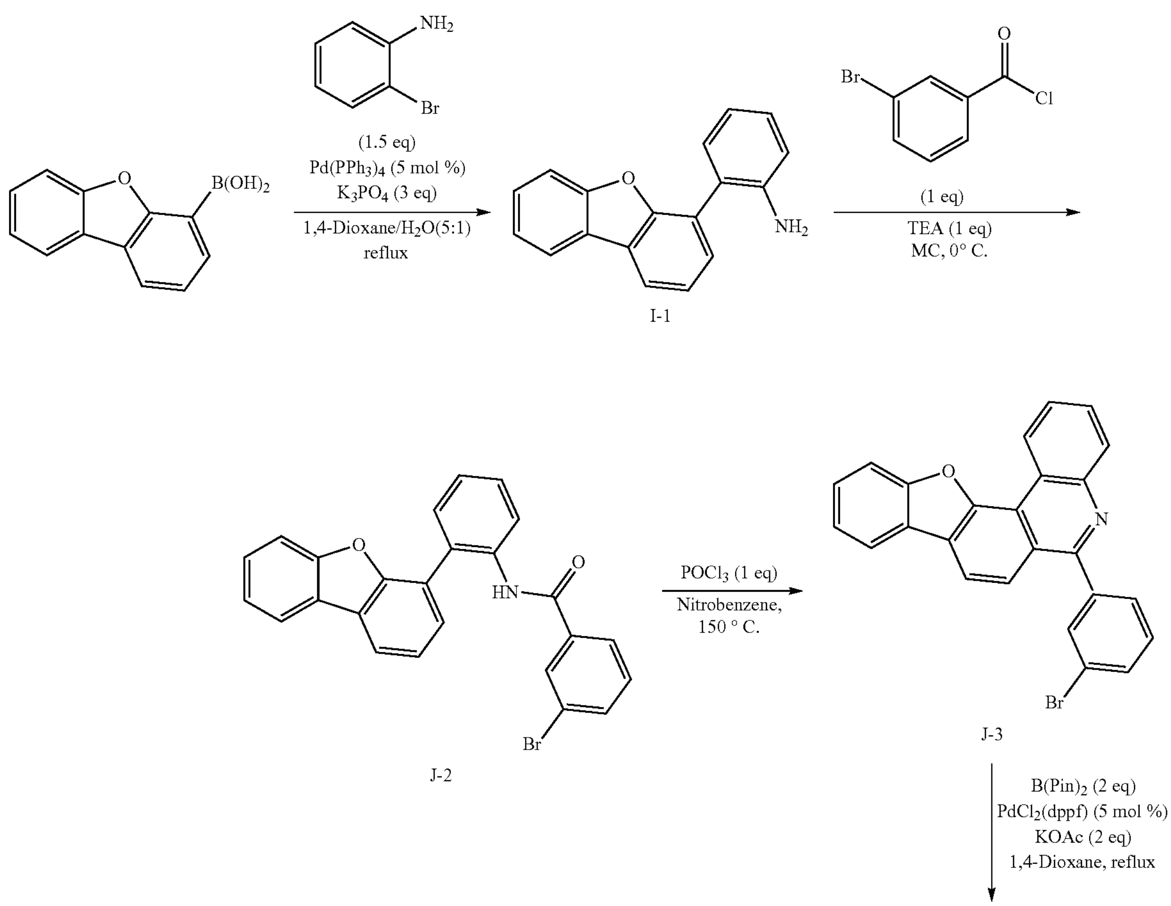

-continued

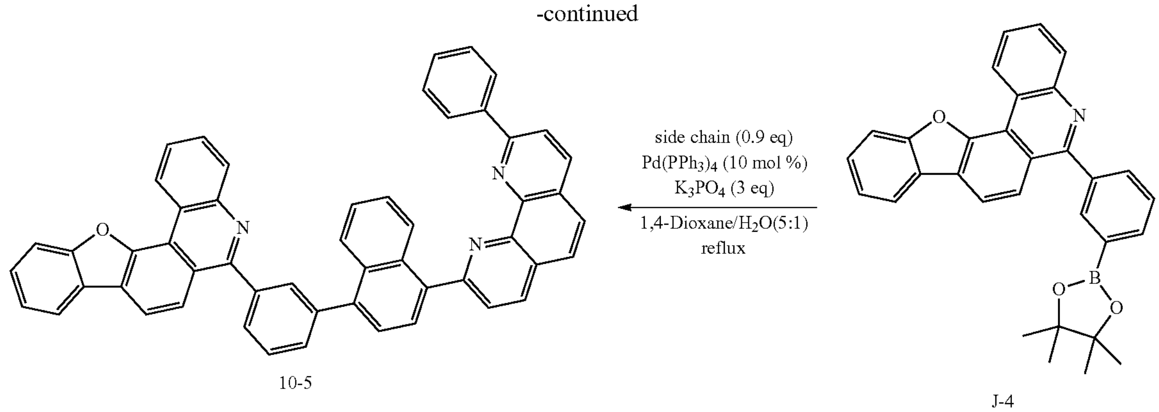

To a flask, 6-(3-(4,4,5,5-tetramethyl-1,3,2-dioxaborolan-2-yl)phenyl)benzofuro[3,2-k]phenanthridine (10 g, 21.2 mmol, 1 eq.), 2-(4-bromonaphthalen-1-yl)-9-phenyl-1,10-phenanthroline (0.9 eq.), $Pd(PPh_3)_4$ (0.10 eq.), $K_3PO_4$ (3 eq.) and 1,4-dioxane/$H_2O$=5:1 (200, 40) were introduced, and the result was stirred for 1 hour at 120° C. When the reaction was completed, the temperature was lowered to room temperature, then $H_2O$ and MC were introduced thereto, and the result was stirred. The mixture was extracted with MC, moisture in the organic layer was removed using $MgSO_4$, the result was filtered, and the solvent was concentrated. The concentration-completed mixture was column separated using MC:Hex. Solid Compound 10-5 (12.5 g, 81%) was obtained.

<Preparation Example 42> Preparation of Compound 10-14

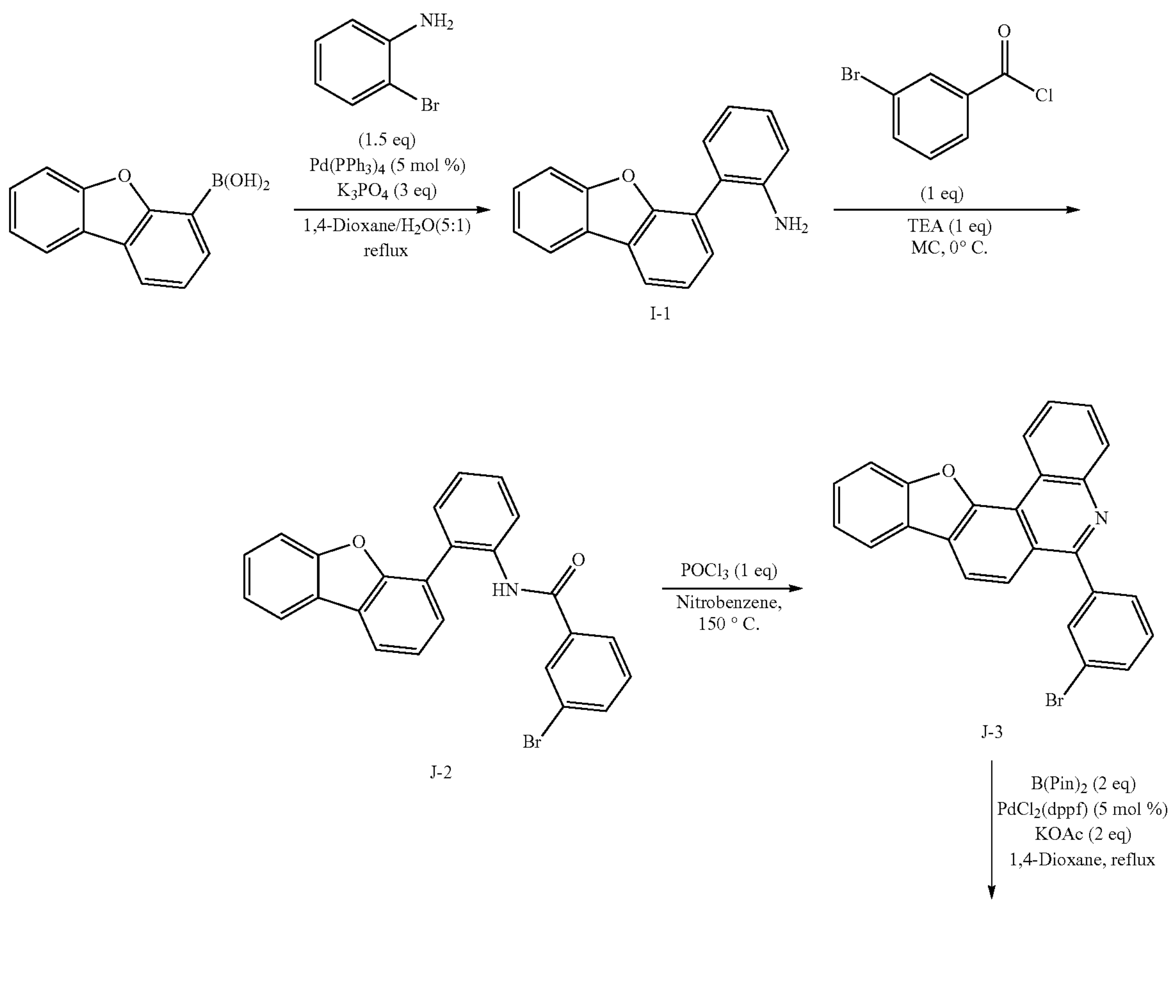

-continued

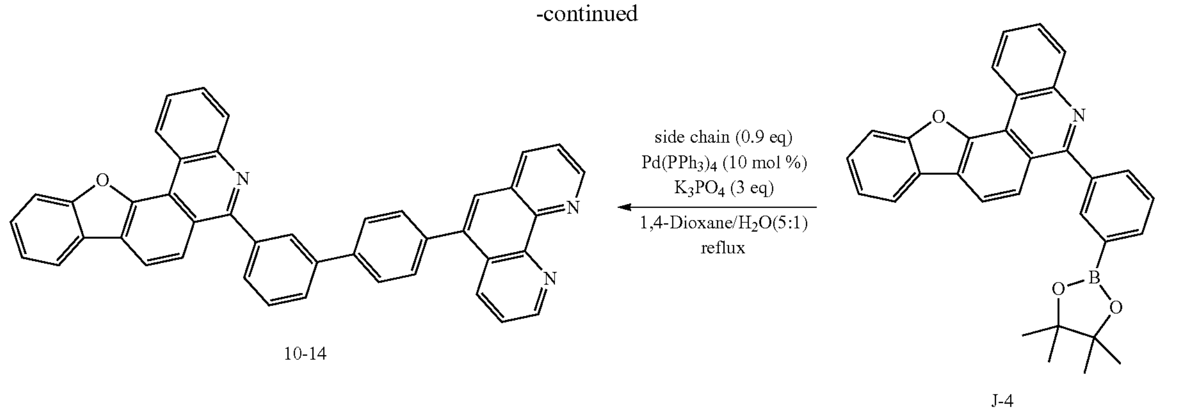

To a flask, 6-(3-(4,4,5,5-tetramethyl-1,3,2-dioxaborolan-2-yl)phenyl)benzofuro[3,2-k]phenanthridine (10 g, 21.2 mmol, 1 eq.), 5-(4-bromophenyl)-1,10-phenanthroline (0.9 eq.), $Pd(PPh_3)_4$ (0.10 eq.), $K_3PO_4$ (3 eq.) and 1,4-dioxane/$H_2O$=5:1 (200, 40) were introduced, and the result was stirred for 1 hour at 120° C. When the reaction was completed, the temperature was lowered to room temperature, then $H_2O$ and MC were introduced thereto, and the result was stirred. The mixture was extracted with MC, moisture in the organic layer was removed using $MgSO_4$, the result was filtered, and the solvent was concentrated. The concentration-completed mixture was column separated using MC:Hex. Solid Compound 10-14 (9.8 g, 77%) was obtained.

<Preparation Example 43> Preparation of Compound 10-18

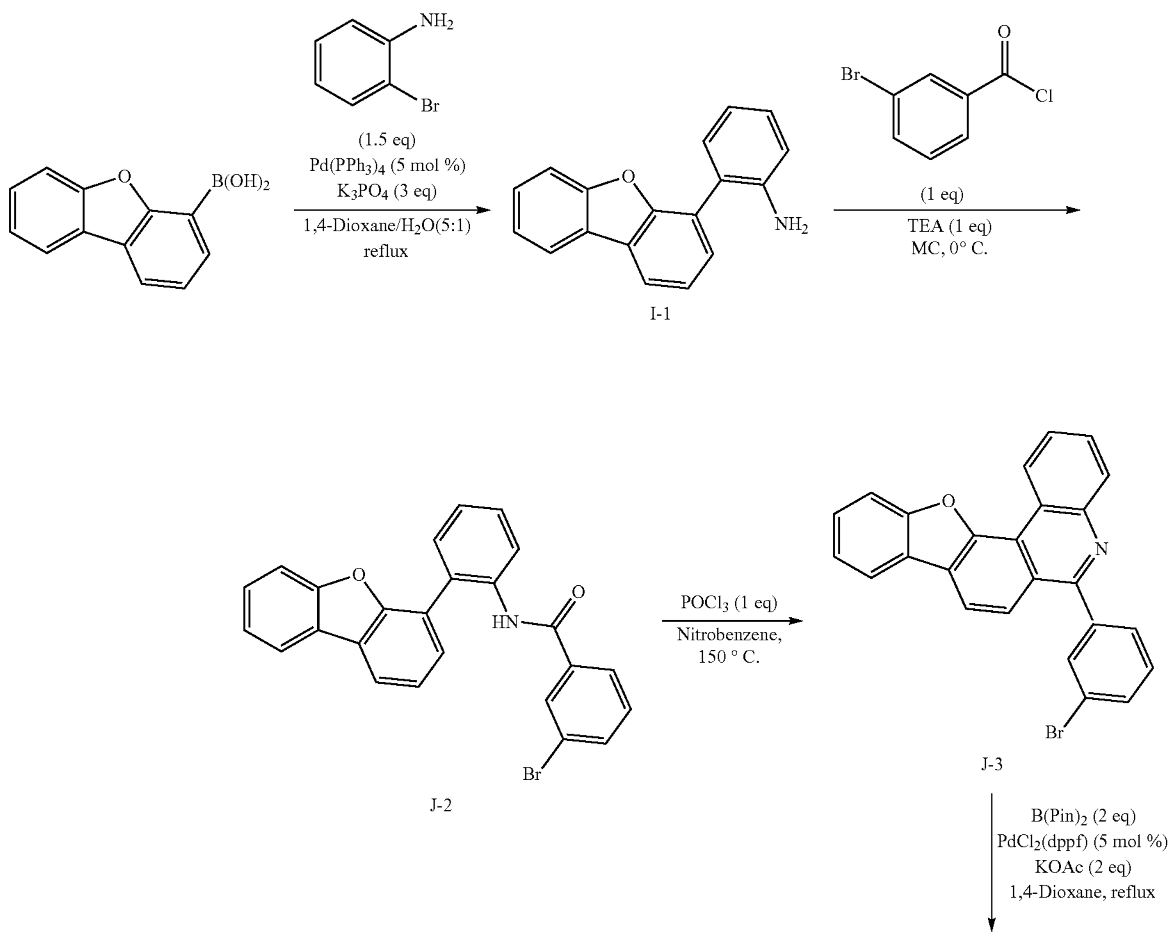

-continued

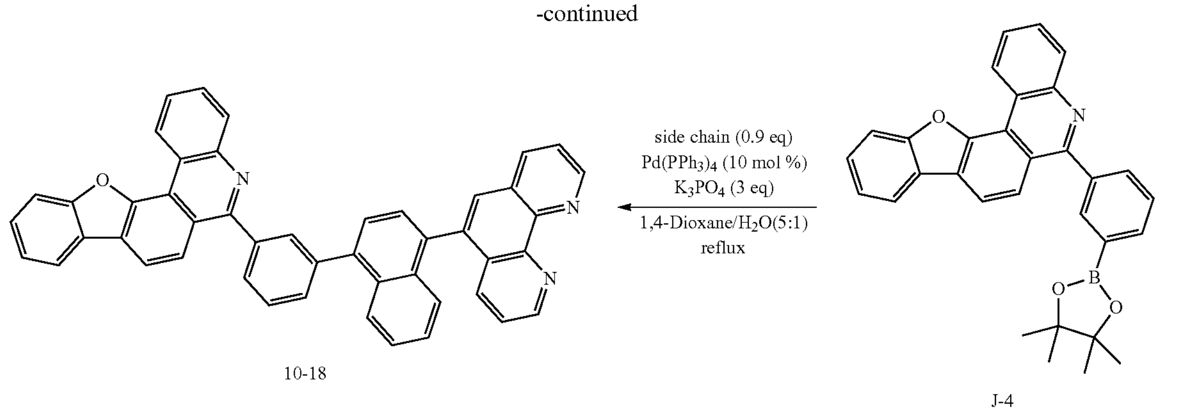

To a flask, 6-(3-(4,4,5,5-tetramethyl-1,3,2-dioxaborolan-2-yl)phenyl)benzofuro[3,2-k]phenanthridine (10 g, 21.2 mmol, 1 eq.), 5-(4-bromonaphthalen-1-yl)-1,10-phenanthroline (0.9 eq.), $Pd(PPh_3)_4$ (0.10 eq.), $K_3PO_4$ (3 eq.) and 1,4-dioxane/$H_2O$=5:1 (200, 40) were introduced, and the result was stirred for 1 hour at 120° C. When the reaction was completed, the temperature was lowered to room temperature, then $H_2O$ and MC were introduced thereto, and the result was stirred. The mixture was extracted with MC, moisture in the organic layer was removed using $MgSO_4$, the result was filtered, and the solvent was concentrated. The concentration-completed mixture was column separated using MC:Hex. Solid Compound 10-18 (10.8 g, 79%) was obtained.

<Preparation Example 44> Preparation of Compound 11-1

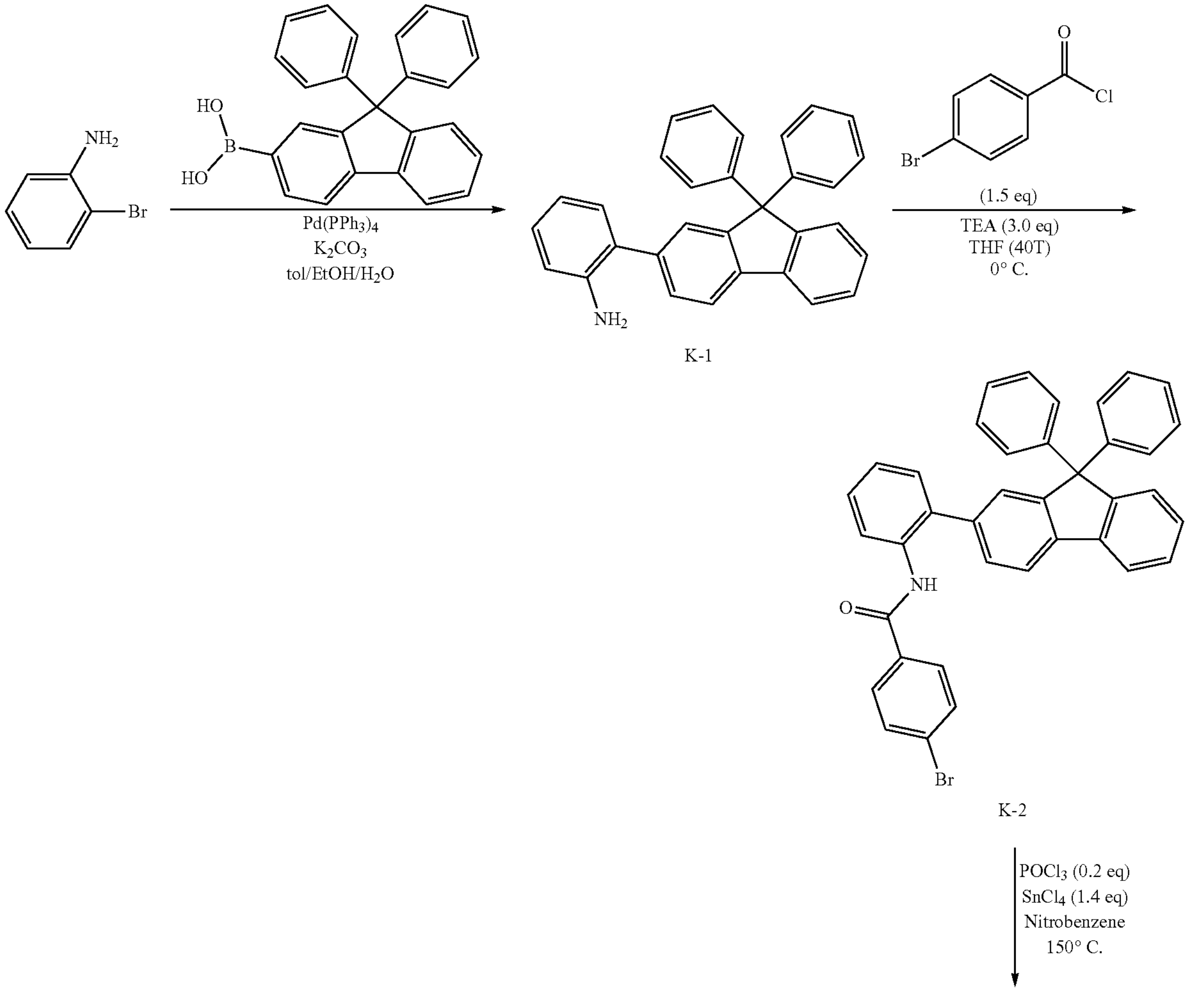

-continued

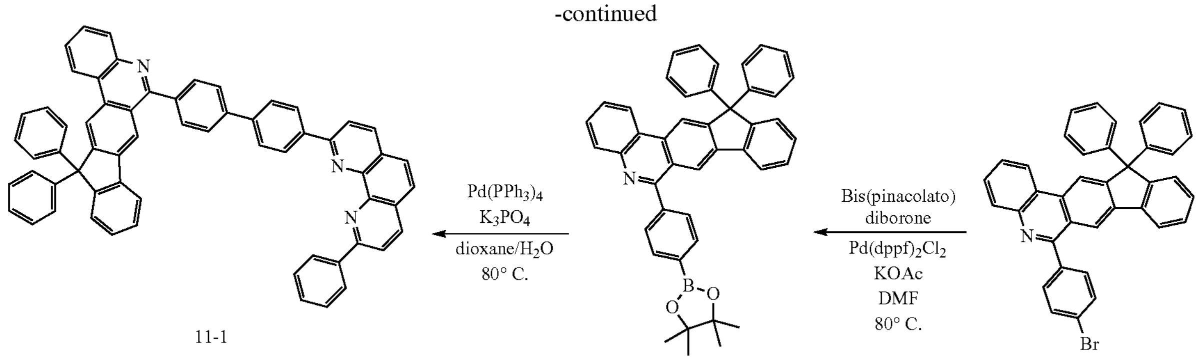

11-1 K-4 K-3

Preparation of Compound K-1

To a flask, 2-bromoaniline (80.0 g, 0.465 mol, 1 eq.) and Tol/EtOH/$H_2O$=5:1:1 (1600, 320, 320) were introduced, and then (9,9-diphenyl-9H-fluoren-2-yl) boronic acid (202.15 g, 0.558 mol, 1.2 eq.), $Pd(PPh_3)_4$ (26.87 g, 0.0233 mol, 0.05 eq.) and $K_2CO_3$ (192.82 g, 1.39 mol, 3 eq.) were introduced thereto. The result was stirred for 18 hours at 90° C. When the reaction was completed, the temperature was lowered to room temperature, then $H_2O$ and EA were introduced thereto, and the result was stirred. The produced yellow solids were filtered and removed. The mixture was extracted with EA, moisture in the organic layer was removed using $Na_2SO_4$, the result was filtered, and the solvent was concentrated. Solid Compound K-1 was obtained (150.0 g, 78.9%).

Preparation of Compound K-2

To a flask, 2-(9,9-diphenyl-9H-fluoren-2-yl)aniline (150 g, 0.366 mol, 1 eq.) and then THF (2000 mL) were introduced. After that, TEA (111 g, 1.09 mol, 3 eq.), and 4-bromobenzoyl chloride (120.5 g, 0.549 mol) dissolved in THF (100 mL) were added thereto at 0° C., and the result was stirred for 2 hours at room temperature. After the reaction was completed, the layers were separated with EA and $H_2O$, and the organic layer was washed several times with $H_2O$. Moisture in the organic layer was removed using $Na_2SO_4$, the result was filtered, and the solvent was concentrated. After adding MC (100 mL) to the (brown oil) concentrated residue, the result was filtered to remove white solids, and then concentrated. Solid Compound K-2 was obtained (200 g, 92.1%).

Preparation of Compound K-3

To a flask, 4-bromo-N-(2-(9,9-diphenyl-9H-fluoren-2-yl) phenyl)benzamide (200 g, 0.337 mol, 1 eq.) and then nitrobenzene (2000 mL) were introduced, and $POCl_3$ (25.8 g, 0.168 mol, 0.5 eq.) was introduced thereto. After that, the result was stirred for 18 hours at 150° C. After removing the nitrobenzene using a rotary evaporator, the organic layer dissolved in MC was neutralized by washing several times with a saturated $NaHCO_3$ solution, then dried using $MgSO_4$ and concentrated. EA was added to the concentrated residue for precipitation. After adding a small amount of EA thereto, the result was stirred for 1 hour at room temperature and then filtered (removing side spot). After that, hexane was added thereto, the result was stirred for 1 hour, filtered (removing residual nitrobenzene), and then dried. Solid Compound K-3 was obtained (120 g, 61.8%).

Preparation of Compound K-4

After dissolving 6-(4-bromophenyl)-12,12-diphenyl-12H-indeno[1,2-j]phenanthridine (120 g, 0.208 mol, 1 eq.) in DMF, bis(pinacolato)diborone (63.4 g, 0.250 mol, 1.2 eq.), $Pd(dppf)_2Cl_2$ (7.6 g, 0.010 mol, 0.05 eq.) and KOAc (61.5 g, 0.626 mol, 3 eq.) were added thereto at room temperature, and the result was stirred for 18 hours at 80° C. After the reaction was completed, the layers were separated with purified water and ethyl acetate. The organic solvent layer was washed several times with purified water and brine, dehydrated and then vacuum dried. After dissolving the residue with dichloromethane, florosil was added thereto, and the result was stirred for 30 minutes. The result was passed through silica gel/celite. Solid Compound K-4 was obtained (100 g, 77.0%).

Preparation of Compound 11-1

After dissolving 12,12-diphenyl-6-(4-(4,4,5,5-tetramethyl-1,3,2-dioxaborolan-2-yl)phenyl)-12H-indeno[1,2-j] phenanthridine (10.0 g, 0.016 mol, 1 eq.) in dioxane/$H_2O$ (5:1), 2-(4-bromophenyl)-9-phenyl-1,10-phenanthroline (7.27 g, 0.017 mol, 1.1 eq.), $Pd(PPh_3)_4$ (1.0 g, 0.0009 mol, 0.05 eq.) and $K_3PO_4$ (10.24 g, 0.048 mol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred.

Solid Compound 11-1 was obtained (10.5 g, 79.0%).

<Preparation Example 45> Preparation of Compound 11-5

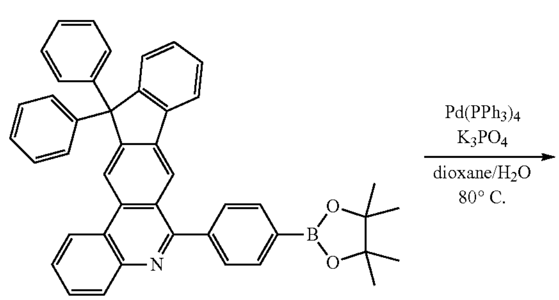

K-4

-continued

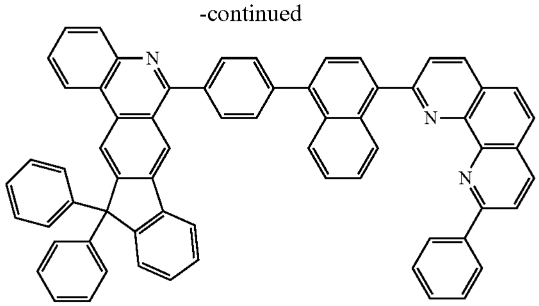

11-5

After dissolving 12,12-diphenyl-6-(4-(4,4,5,5-tetramethyl-1,3,2-dioxaborolan-2-yl)phenyl)-12H-indeno[1,2-j] phenanthridine (10.0 g, 0.016 mol, 1 eq.) in dioxane/$H_2O$ (5:1), 2-(4-bromonaphthalen-1-yl)-9-phenyl-1,10-phenanthroline (8.16 g, 0.017 mol, 1.1 eq.), $Pd(PPh_3)_4$ (1.0 g, 0.0009 mol, 0.05 eq.) and $K_3PO_4$ (10.24 g, 0.048 mol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 11-5 was obtained (11 g, 78.0%).

<Preparation Example 46> Preparation of Compound 11-10

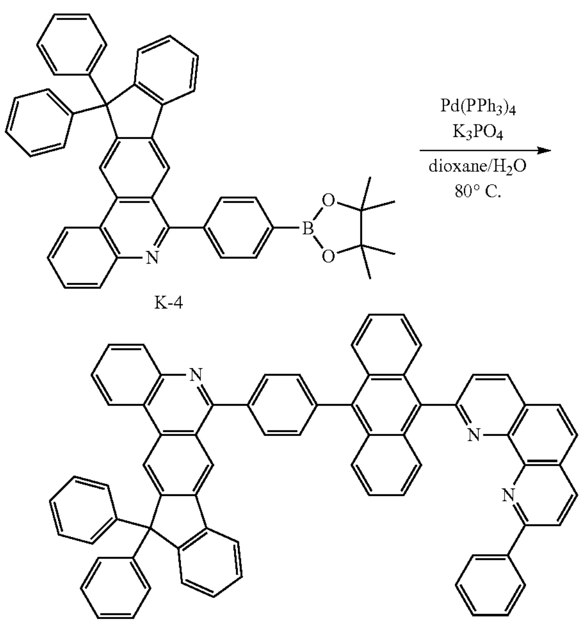

K-4

11-10

After dissolving 12,12-diphenyl-6-(4-(4,4,5,5-tetramethyl-1,3,2-dioxaborolan-2-yl)phenyl)-12H-indeno[1,2-j] phenanthridine (10.0 g, 0.016 mol, 1 eq.) in dioxane/$H_2O$ (5:1), 2-(10-bromoanthracen-9-yl)-9-phenyl-1,10-phenanthroline (9.05 g, 0.017 mol, 1.1 eq.), $Pd(PPh_3)_4$ (1.0 g, 0.0009 mol, 0.05 eq.) and $K_3PO_4$ (10.24 g, 0.048 mol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 11-10 was obtained (10 g, 67.1%).

<Preparation Example 47> Preparation of Compound 11-14

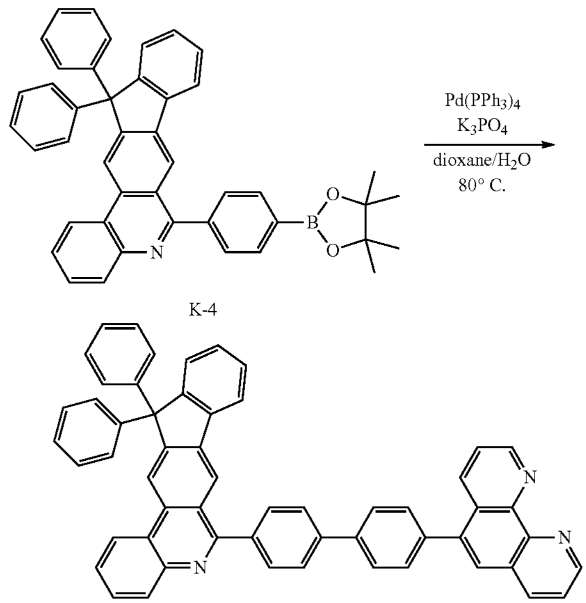

K-4

11-14

After dissolving 12,12-diphenyl-6-(4-(4,4,5,5-tetramethyl-1,3,2-dioxaborolan-2-yl)phenyl)-12H-indeno[1,2-j] phenanthridine (10.0 g, 0.016 mol, 1 eq.) in dioxane/$H_2O$ (5:1), 5-(4-bromophenyl)-1,10-phenanthroline (5.93 g, 0.017 mol, 1.1 eq.), $Pd(PPh_3)_4$ (1.0 g, 0.0009 mol, 0.05 eq.) and $K_3PO_4$ (10.24 g, 0.048 mol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 11-14 was obtained (9 g, 74.6%).

<Preparation Example 48> Preparation of Compound 11-27

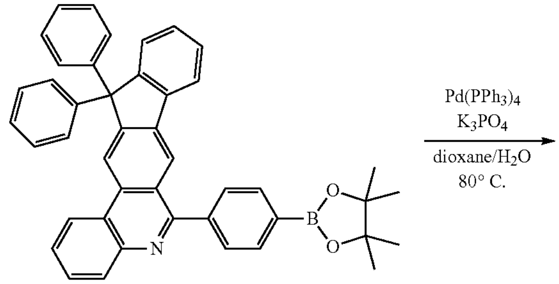

K-4

-continued

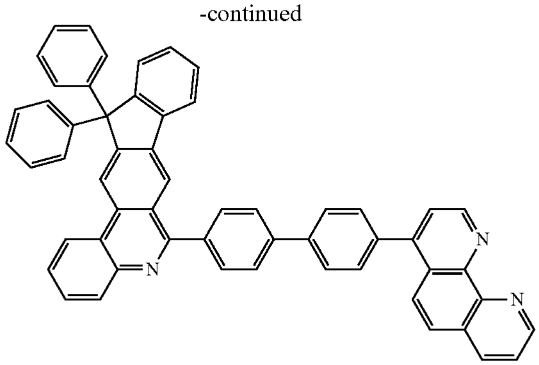

11-27

After dissolving 12,12-diphenyl-6-(4-(4,4,5,5-tetramethyl-1,3,2-dioxaborolan-2-yl)phenyl)-12H-indeno[1,2-j]phenanthridine (10.0 g, 0.016 mol, 1 eq.) in dioxane/$H_2O$ (5:1), 4-(4-bromophenyl)-1,10-phenanthroline (5.93 g, 0.017 mol, 1.1 eq.), $Pd(PPh_3)_4$ (1.0 g, 0.0009 mol, 0.05 eq.) and $K_3PO_4$ (10.24 g, 0.048 mol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 11-27 was obtained (8.5 g, 70.3%).

<Preparation Example 49> Preparation of Compound 12-1

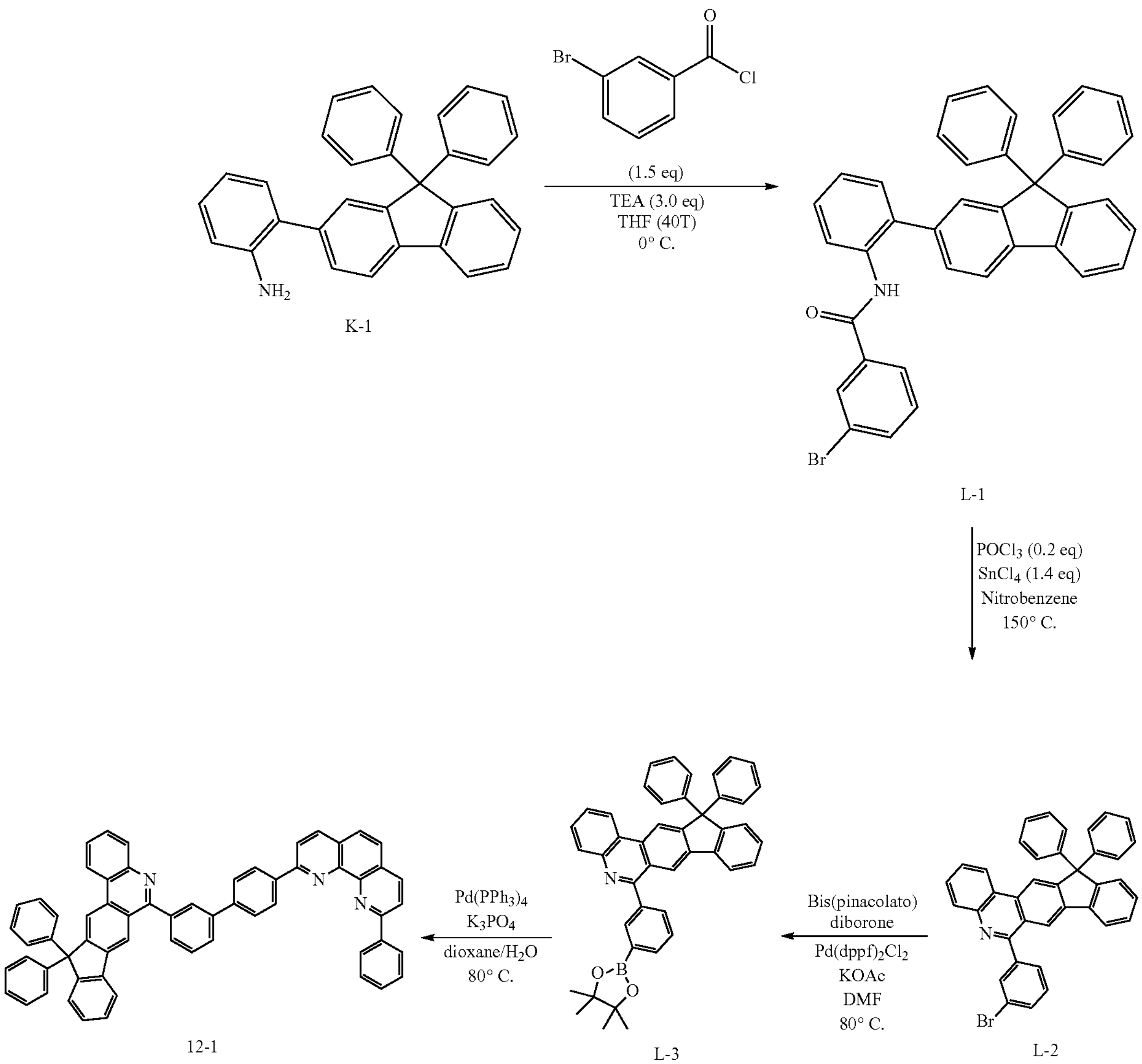

Preparation of Compound L-1

To a flask, 2-(9,9-diphenyl-9H-fluoren-2-yl)aniline (150 g, 0.366 mol, 1 eq.) and then THF (2000 mL) were introduced. After that, TEA (111 g, 1.09 mol, 3 eq.), and 3-bromobenzoyl chloride (120.5 g, 0.549 mol) dissolved in THF (100 mL) were added thereto at 0° C., and the result was stirred for 2 hours at room temperature. After the reaction was completed, the layers were separated with EA and $H_2O$, and the organic layer was washed several times with $H_2O$. Moisture in the organic layer was removed using $Na_2SO_4$, the result was filtered, and the solvent was concentrated. After adding MC (100 mL) to the (brown oil) concentrated residue, the result was filtered to remove white solids, and then concentrated. Solid Compound L-1 was obtained (185 g, 85.2%).

Preparation of Compound L-2

To a flask, 3-bromo-N-(2-(9,9-diphenyl-9H-fluoren-2-yl)phenyl)benzamide (185 g, 0.312 mol, 1 eq.) and then nitrobenzene (1850 mL) were introduced, and $POCl_3$ (23.9 g, 0.156 mol, 0.5 eq.) was introduced thereto. After that, the result was stirred for 18 hours at 150° C. After removing the nitrobenzene using a rotary evaporator, the organic layer dissolved in MC was neutralized by washing several times with a saturated $NaHCO_3$ solution, then dried using $MgSO_4$ and concentrated. EA was added to the concentrated residue for precipitation. After adding a small amount of EA thereto, the result was stirred for 1 hour at room temperature and then filtered (removing side spot). After that, hexane was added thereto, the result was stirred for 1 hour, filtered (removing residual nitrobenzene), and then dried. Solid Compound L-2 was obtained (106 g, 59.1%).

Preparation of Compound L-3

After dissolving 6-(3-bromophenyl)-12,12-diphenyl-12H-indeno[1,2-j]phenanthridine (106 g, 0.184 mol, 1 eq.) in DMF, bis(pinacolato)diborone (56.2 g, 0.221 mol, 1.2 eq.), $Pd(dppf)_2Cl_2$ (6.7 g, 0.009 mol, 0.05 eq.) and KOAc (54.3 g, 0.553 mol, 3 eq.) were added thereto at room temperature, and the result was stirred for 18 hours at 80° C. After the reaction was completed, the layers were separated with purified water and ethyl acetate. The organic solvent layer was washed several times with purified water and brine, dehydrated and then vacuum dried. After dissolving the residue with dichloromethane, florosil was added thereto, and the result was stirred for 30 minutes. The result was passed through silica gel/celite. Solid Compound L-3 was obtained (95 g, 83.2%).

Preparation of Compound 12-1

After dissolving 12,12-diphenyl-6-(3-(4,4,5,5-tetramethyl-1,3,2-dioxaborolan-2-yl)phenyl)-12H-indeno[1,2-j]phenanthridine (10.0 g, 0.016 mol, 1 eq.) in dioxane/$H_2O$ (5:1), 2-(4-bromophenyl)-9-phenyl-1,10-phenanthroline (7.27 g, 0.017 mol, 1.1 eq.), $Pd(PPh_3)_4$ (1.0 g, 0.0009 mol, 0.05 eq.) and $K_3PO_4$ (10.24 g, 0.048 mol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 12-1 was obtained (11 g, 82.8%).

<Preparation Example 50> Preparation of Compound 12-5

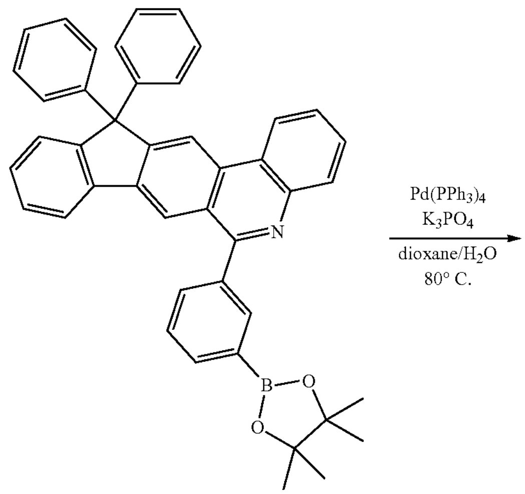

L-3

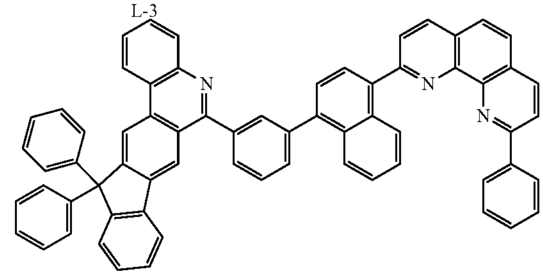

12-5

After dissolving 12,12-diphenyl-6-(3-(4,4,5,5-tetramethyl-1,3,2-dioxaborolan-2-yl)phenyl)-12H-indeno[1,2-j]phenanthridine 10.0 g, 0.016 mol, 1 eq.) in dioxane/$H_2O$ (5:1), 2-(4-bromonaphthalen-1-yl)-9-phenyl-1,10-phenanthroline (8.16 g, 0.017 mol, 1.1 eq.), $Pd(PPh_3)_4$ (1.0 g, 0.0009 mol, 0.05 eq.) and $K_3PO_4$ (10.24 g, 0.048 mol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 12-5 was obtained (10.4 g, 73.8%).

<Preparation Example 51> Preparation of Compound 12-10

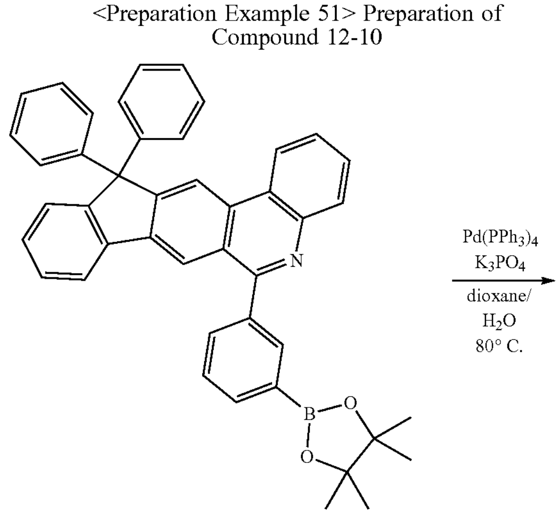

L-3

-continued

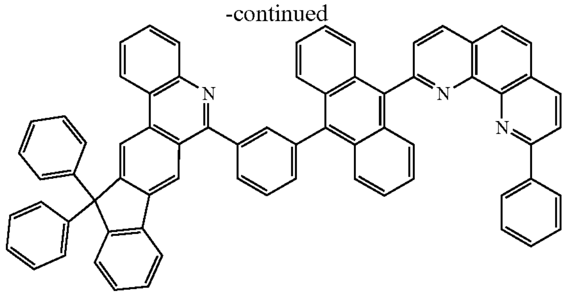

12-10

After dissolving 12,12-diphenyl-6-(3-(4,4,5,5-tetramethyl-1,3,2-dioxaborolan-2-yl)phenyl)-12H-indeno[1,2-j]phenanthridine (10.0 g, 0.016 mol, 1 eq.) in dioxane/$H_2O$ (5:1), 2-(10-bromoanthracen-9-yl)-9-phenyl-1,10-phenanthroline (9.05 g, 0.017 mol, 1.1 eq.), $Pd(PPh_3)_4$ (1.0 g, 0.0009 mol, 0.05 eq.) and $K_3PO_4$ (10.24 g, 0.048 mol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 12-10 was obtained (11 g, 73.8%).

<Preparation Example 52> Preparation of Compound 12-14

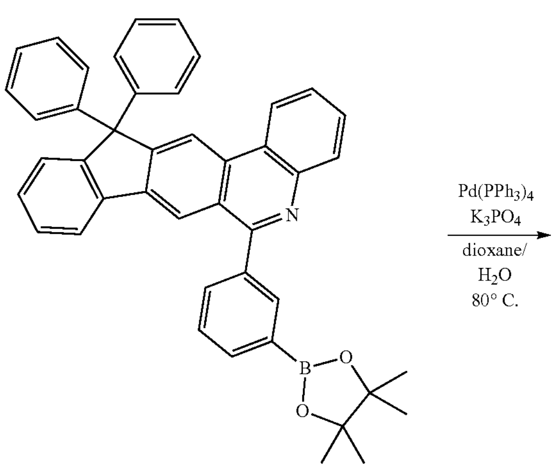

L-3

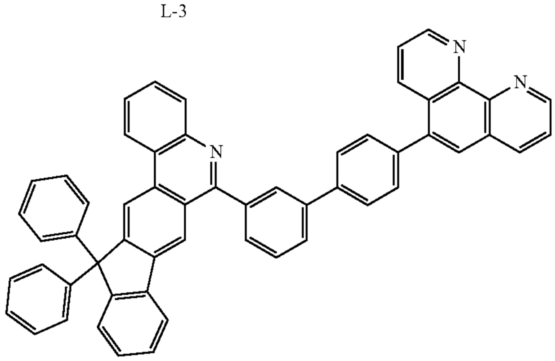

12-14

After dissolving 12,12-diphenyl-6-(3-(4,4,5,5-tetramethyl-1,3,2-dioxaborolan-2-yl)phenyl)-12H-indeno[1,2-j]phenanthridine (10.0 g, 0.016 mol, 1 eq.) in dioxane/$H_2O$ (5:1), 5-(4-bromophenyl)-1,10-phenanthroline (5.93 g, 0.017 mol, 1.1 eq.), $Pd(PPh_3)_4$ (1.0 g, 0.0009 mol, 0.05 eq.) and $K_3PO_4$ (10.24 g, 0.048 mol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 12-14 was obtained (8.8 g, 72.8%).

<Preparation Example 53> Preparation of Compound 12-27

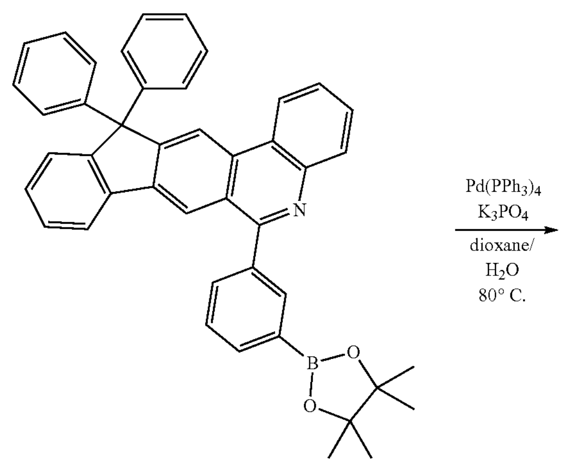

L-3

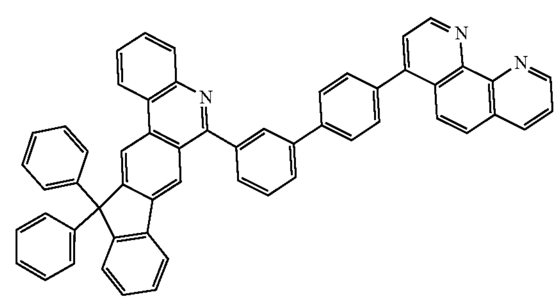

12-27

After dissolving 12,12-diphenyl-6-(3-(4,4,5,5-tetramethyl-1,3,2-dioxaborolan-2-yl)phenyl)-12H-indeno[1,2-j]phenanthridine (10.0 g, 0.016 mol, 1 eq.) in dioxane/$H_2O$ (5:1), 4-(4-bromophenyl)-1,10-phenanthroline (5.93 g, 0.017 mol, 1.1 eq.), $Pd(PPh_3)_4$ (1.0 g, 0.0009 mol, 0.05 eq.) and $K_3PO_4$ (10.24 g, 0.048 mol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 12-27 was obtained (9 g, 74.4%).

<Preparation Example 54> Preparation of Compound 13-1

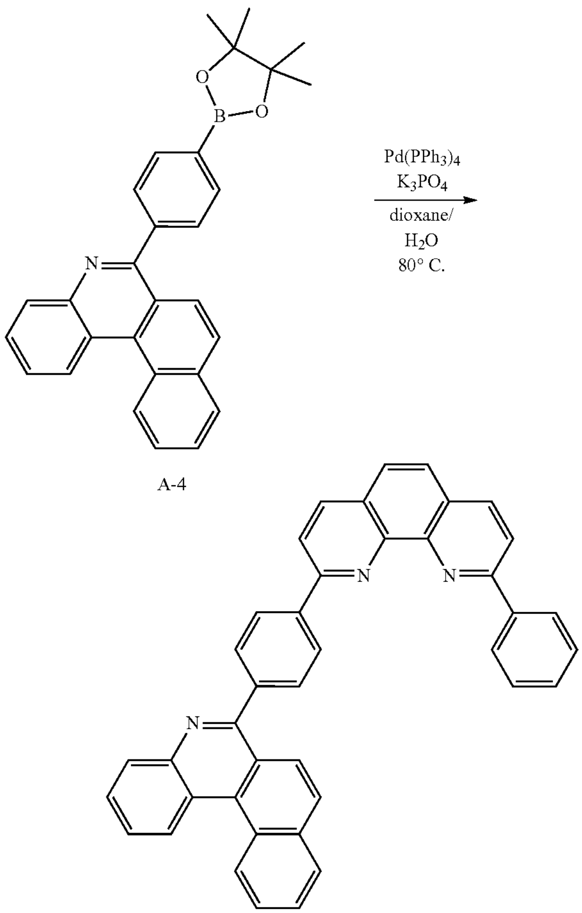

A-4

13-1

After dissolving A-4 (10.0 g, 23.18 mmol, 1 eq.) in dioxane/$H_2O$ (5:1), 2-bromo-9-phenyl-1,10-phenanthroline (7.76 g, 23.18 mmol, 1 eq.), $Pd(PPh_3)_4$ (1.34 g, 1.159 mmol, 0.05 eq.) and $K_3PO_4$ (14.76 g, 69.54 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-1 was obtained (7.9 g, 61%).

<Preparation Example 55> Preparation of Compound 13-2

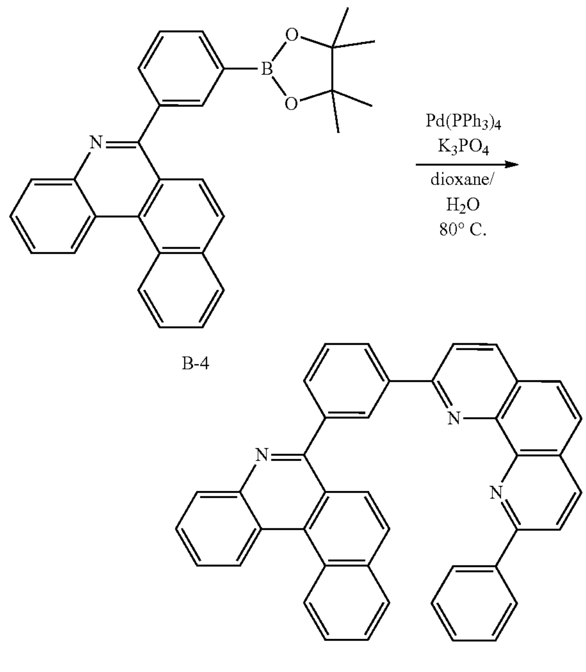

B-4

13-2

After dissolving B-4 (10.0 g, 23.18 mmol, 1 eq.) in dioxane/$H_2O$ (5:1), 2-bromo-9-phenyl-1,10-phenanthroline (7.76 g, 23.18 mmol, 1 eq.), $Pd(PPh_3)_4$ (1.34 g, 1.159 mmol, 0.05 eq.) and $K_3PO_4$ (14.76 g, 69.54 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-2 was obtained (8.8 g, 68%).

<Preparation Example 56> Preparation of Compound 13-3

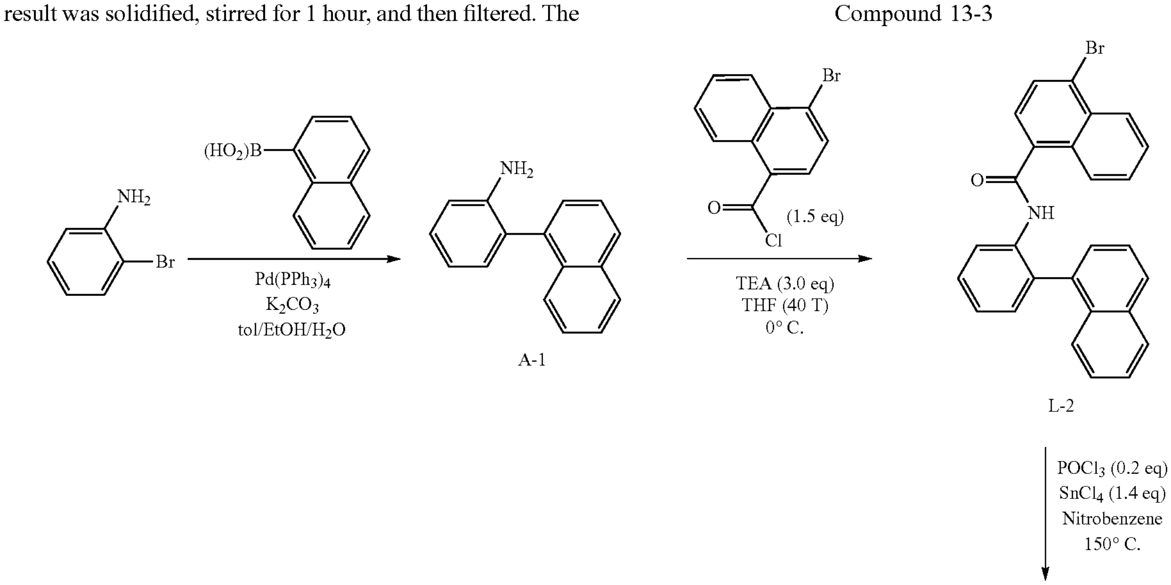

-continued

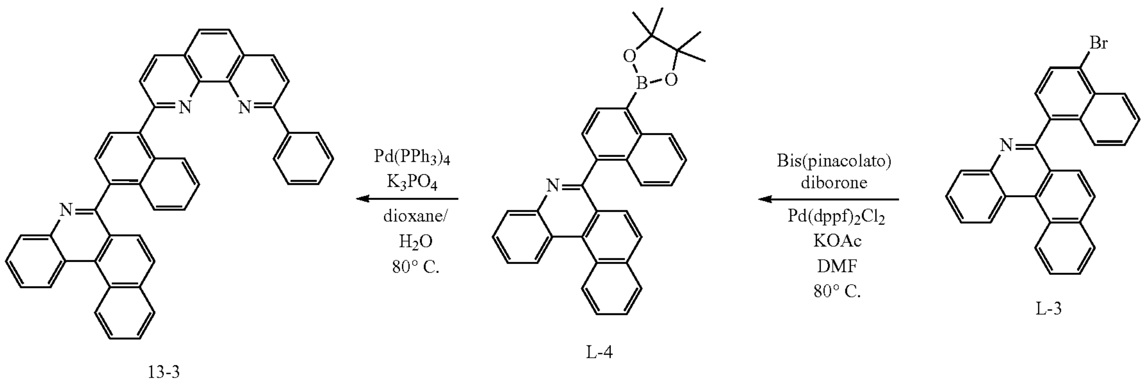

Preparation of Compound L-2

Compound L-2 was obtained (130.9 g, 76%) in the same synthesis manner as A-2.

Preparation of Compound L-3

Solid Compound L-3 was obtained (162.8 g, 74%) in the same synthesis manner as A-3.

Preparation of Compound L-4

Solid Compound L-4 was obtained (52.1 g, 84%) in the same synthesis manner as A-4.

Preparation of Compound 13-3

After dissolving L-4 (11.1 g, 23.18 mmol, 1 eq.) in dioxane/$H_2O$ (5:1), 2-bromo-9-phenyl-1,10-phenanthroline (7.7 g, 23.18 mmol, 1 eq.), $Pd(PPh_3)_4$ (1.34 g, 1.159 mmol, 0.05 eq.) and $K_3PO_4$ (14.76 g, 69.54 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-3 was obtained (8.6 g, 61%).

<Preparation Example 57> Preparation of Compound 13-4

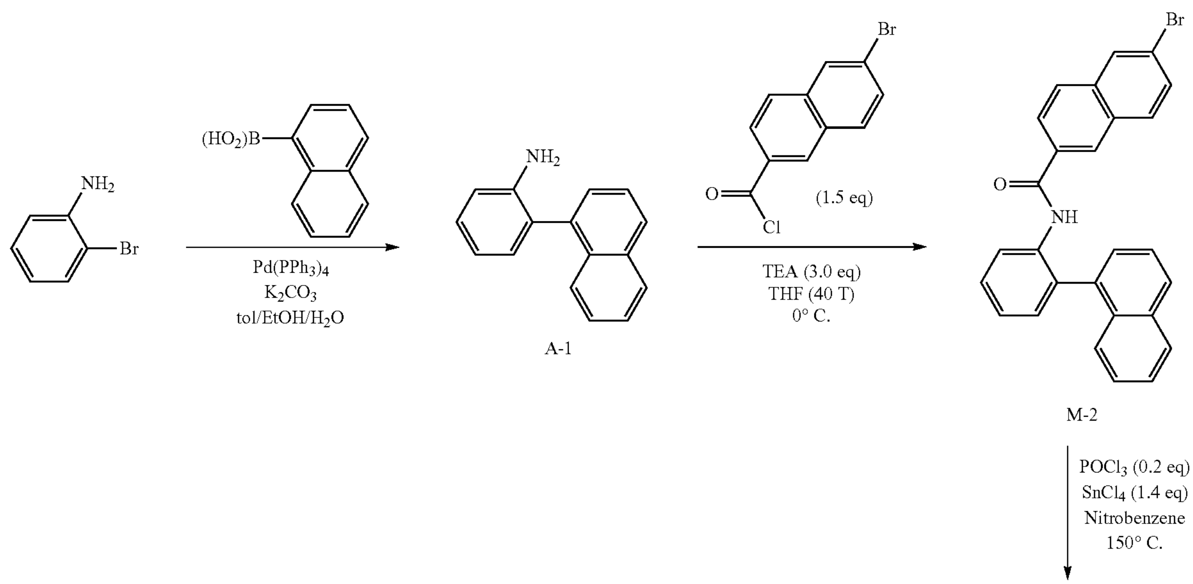

-continued

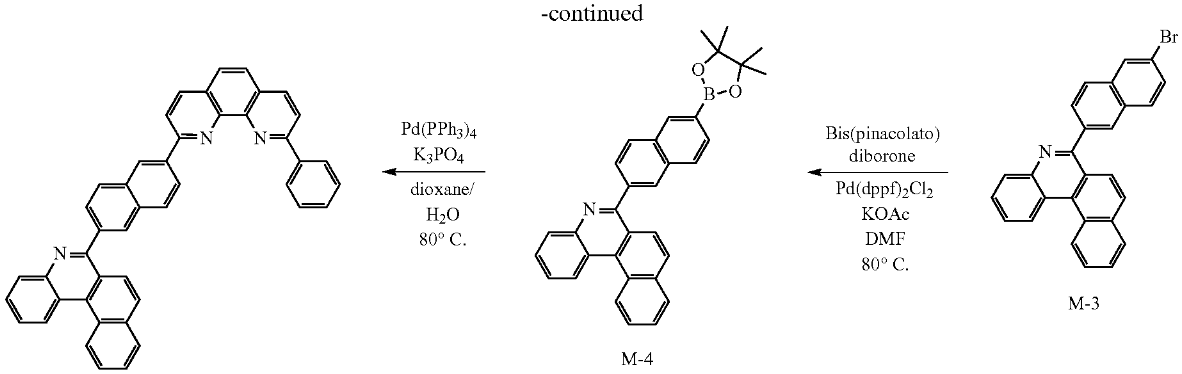

13-4 M-4 M-3

Preparation of Compound M-2

Compound M-2 was obtained (130.9 g, 76%) in the same synthesis manner as A-2.

Preparation of Compound M-3

Solid Compound M-3 was obtained (162.8 g, 74%) in the same synthesis manner as A-3.

Preparation of Compound M-4

Solid Compound M-4 was obtained (52.1 g, 84%) in the same synthesis manner as A-4.

Preparation of Compound 13-4

After dissolving M-4 (11.1 g, 23.18 mmol, 1 eq.) in dioxane/$H_2O$ (5:1), 2-bromo-9-phenyl-1,10-phenanthroline (7.7 g, 23.18 mmol, 1 eq.), $Pd(PPh_3)_4$ (1.34 g, 1.159 mmol, 0.05 eq.) and $K_3PO_4$ (14.76 g, 69.54 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-4 was obtained (9.0 g, 64%).

<Preparation Example 58> Preparation of Compound 13-5

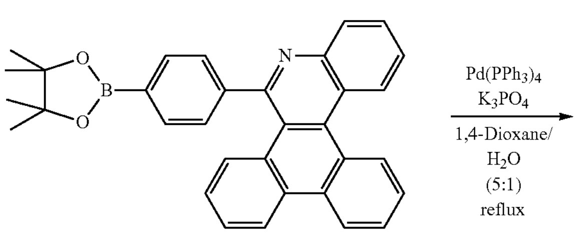

C-4

-continued

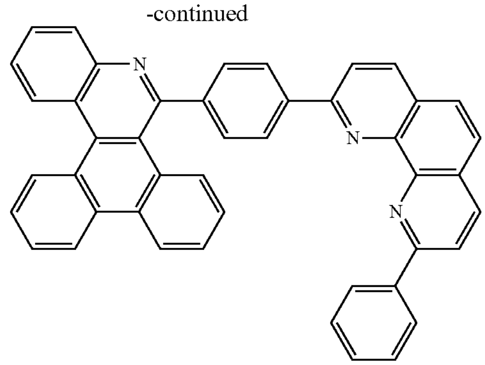

13-5

After dissolving C-4 (10.0 g, 20.77 mmol, 1 eq.) in dioxane/$H_2O$ (5:1), 2-bromo-9-phenyl-1,10-phenanthroline (6.9 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-5 was obtained (8.4 g, 67%).

<Preparation Example 59> Preparation of Compound 13-6

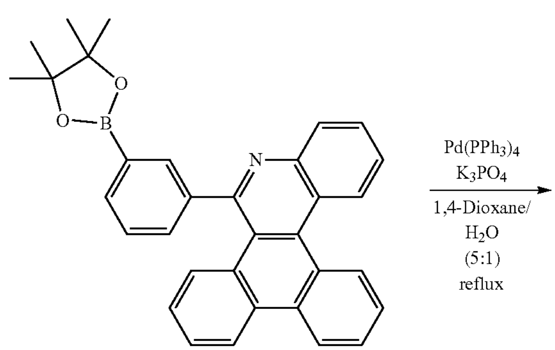

D-5

-continued

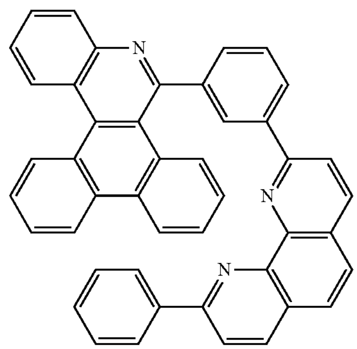

13-6

After dissolving D-5 (10.0 g, 20.77 mmol, 1 eq.) in dioxane/$H_2O$ (5:1), 2-bromo-9-phenyl-1,10-phenanthroline (6.9 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-6 was obtained (10.3 g, 82%).

<Preparation Example 60> Preparation of Compound 13-7

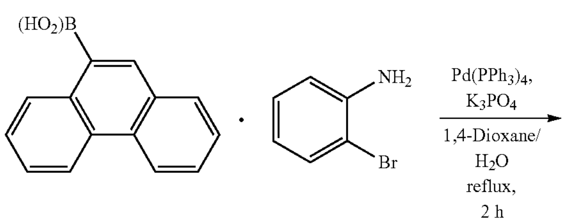

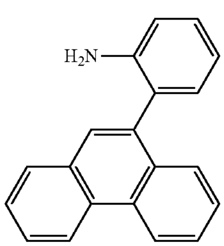

C-1

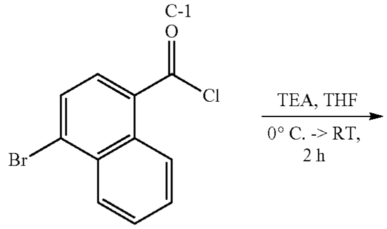

-continued

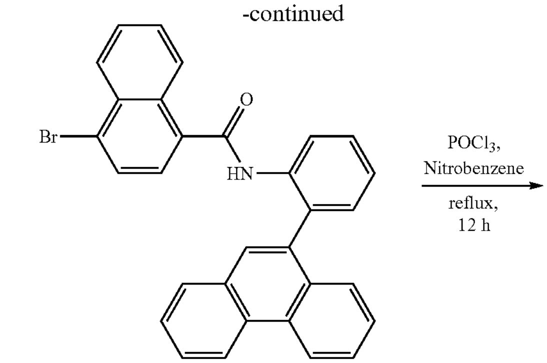

N-2

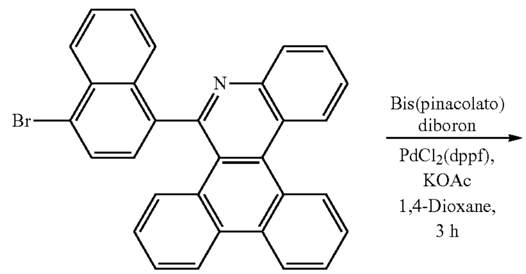

N-3

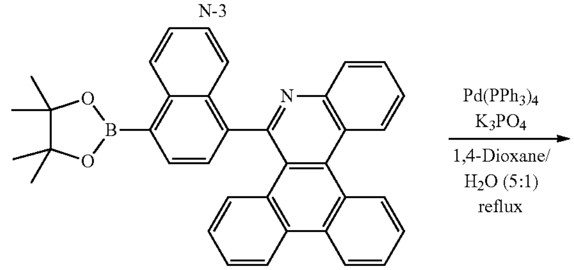

N-4

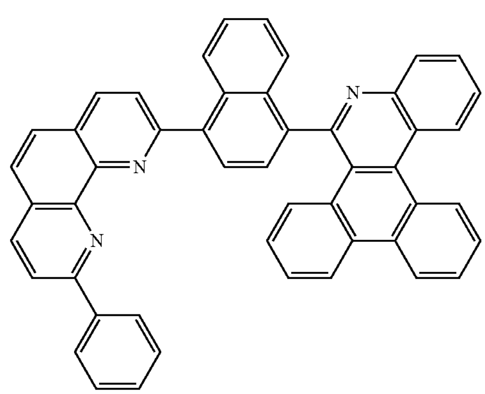

13-7

Preparation of Compound N-2

White solid Compound N-2 was obtained (85 g, 99%) in the same synthesis manner as A-2.

Preparation of Compound N-3

White solid Compound N-3 was obtained (71 g, 87%) in the same synthesis manner as A-3.

Preparation of Compound N-4

White solid Compound N-4 was obtained (66 g, 99%) in the same synthesis manner as A-4.

Preparation of Compound 13-7

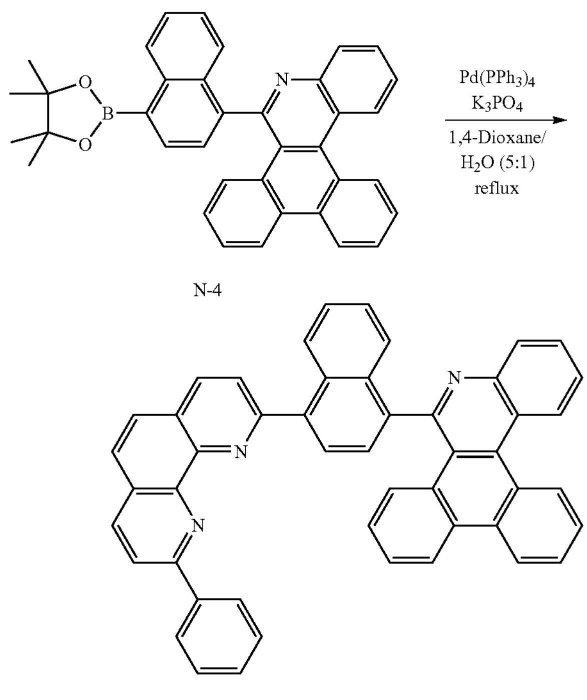

N-4

13-7

After dissolving N-4 (10.9 g, 20.77 mmol, 1 eq.) in dioxane/$H_2O$ (5:1), 2-bromo-9-phenyl-1,10-phenanthroline (6.9 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-7 was obtained (10.9 g, 80%).

<Preparation Example 61> Preparation of Compound 13-8

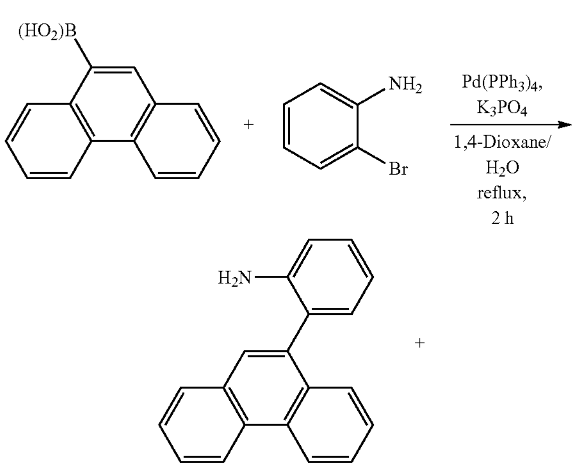

C-1

-continued

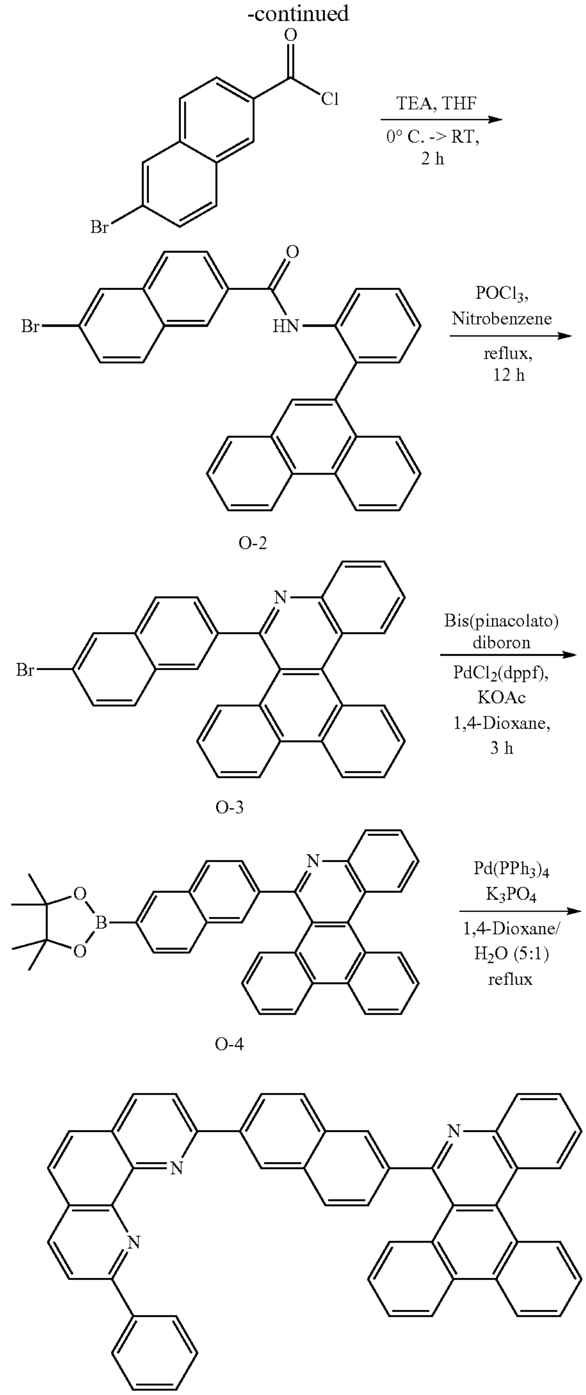

O-2

O-3

O-4

13-8

Preparation of Compound O-2

White solid Compound O-2 was obtained (85 g, 99%) in the same synthesis manner as A-2.

Preparation of Compound O-3

White solid Compound O-3 was obtained (71 g, 87%) in the same synthesis manner as A-3.

Preparation of Compound O-4

White solid Compound O-4 was obtained (66 g, 99%) in the same synthesis manner as A-4.

Preparation of Compound 13-8

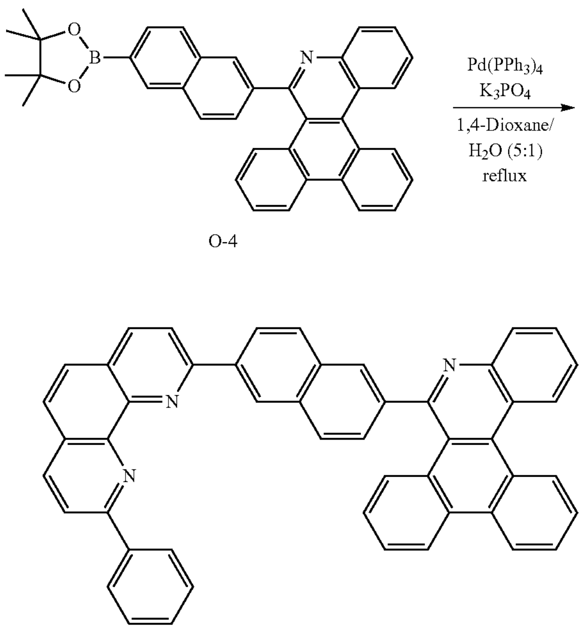

O-4

13-8

After dissolving 0-4 (10.9 g, 20.77 mmol, 1 eq.) in dioxane/$H_2O$ (5:1), 2-bromo-9-phenyl-1,10-phenanthroline (6.9 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-8 was obtained (9.9 g, 73%).

<Preparation Example 62> Preparation of Compound 13-9

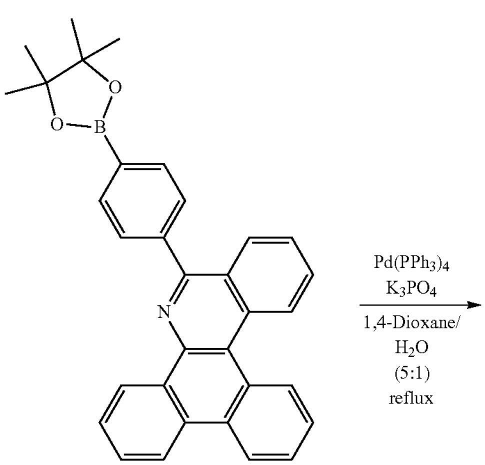

E-5

-continued

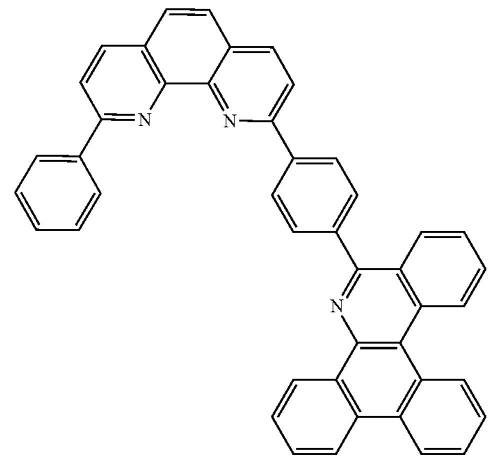

13-9

After dissolving E-5 (10.0 g, 20.77 mmol, 1 eq.) in dioxane/$H_2O$ (5:1), 2-bromo-9-phenyl-1,10-phenanthroline (6.9 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-9 was obtained (10.0 g, 79%).

<Preparation Example 63> Preparation of Compound 13-10

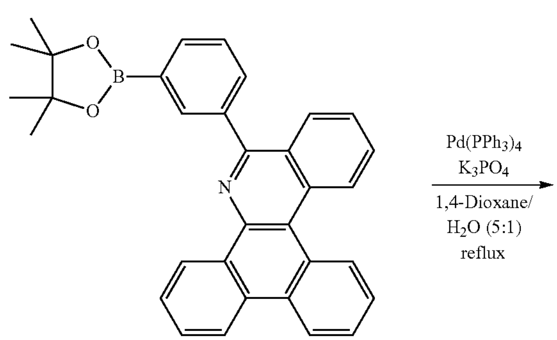

F-5

-continued

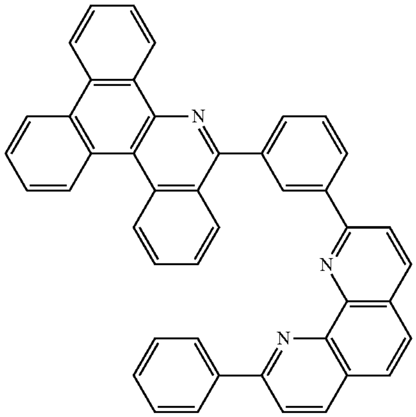

13-10

After dissolving F-5 (10.0 g, 20.77 mmol, 1 eq.) in dioxane/$H_2O$ (5:1), 2-bromo-9-phenyl-1,10-phenanthroline (6.9 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-10 was obtained (8.73 g, 69%).

<Preparation Example 64> Preparation of Compound 13-11

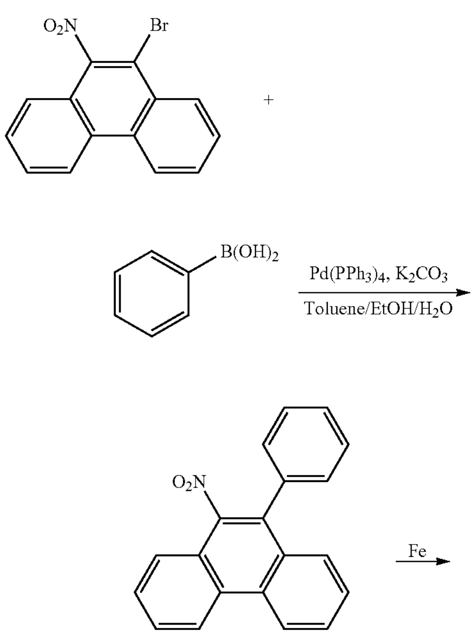

E-1

-continued

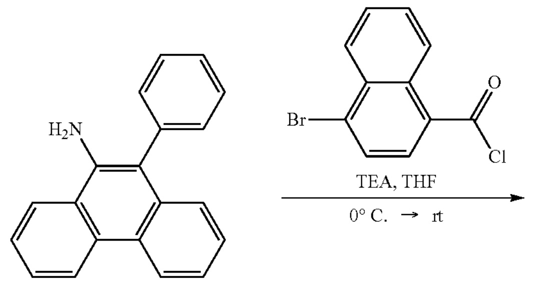

E-2

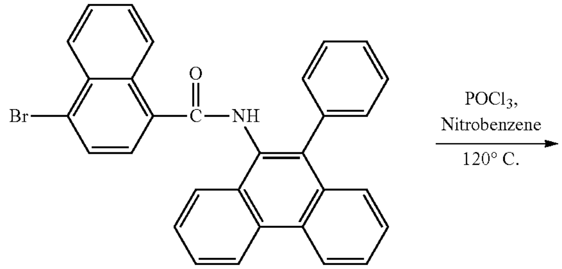

P-3

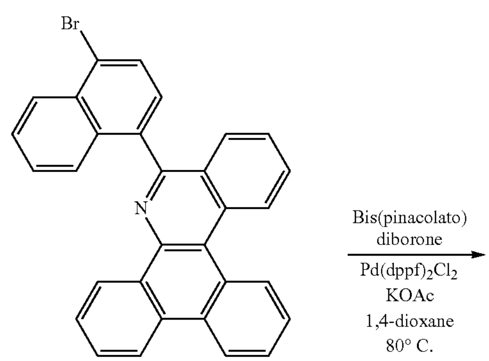

Molecular Weight: 484.396

P-4

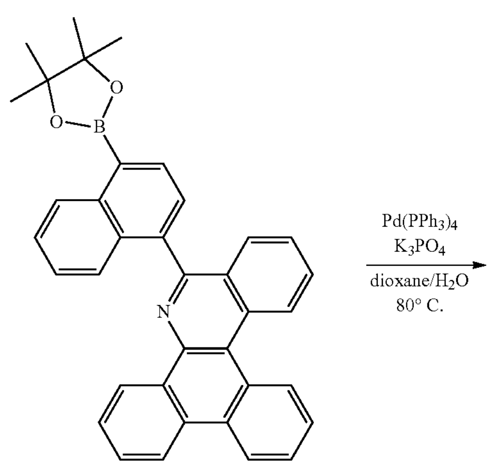

P-5

-continued

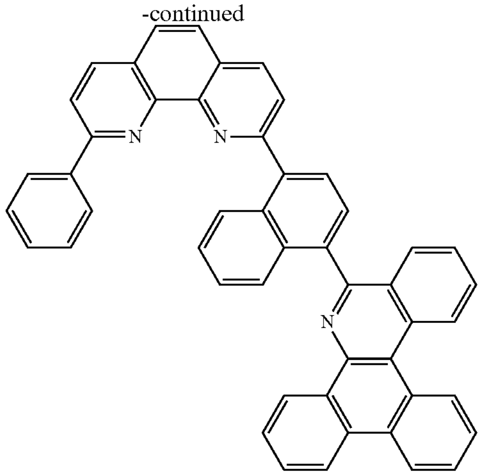

13-11

Preparation of Compound P-3

Solid Compound P-3 was obtained (80 g, 88%) in the same synthesis manner as E-3.

Preparation of Compound P-4

Solid Compound P-4 was obtained (85.6 g, 73%) in the same synthesis manner as E-4.

Preparation of Compound P-5

Solid Compound P-5 was obtained (49 g, 79%) in the same synthesis manner as E-5.

Preparation of Compound 13-11

After dissolving P-5 (10.0 g, 20.77 mmol, 1 eq.) in dioxane/$H_2O$ (5:1), 2-bromo-9-phenyl-1,10-phenanthroline (6.9 g, 20.77 mmol, 1 eq.), $Pd(PPh_3)_4$ (1.2 g, 1.039 mmol, 0.05 eq) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-11 was obtained (7.7 g, 62%).

<Preparation Example 65> Preparation of Compound 13-12

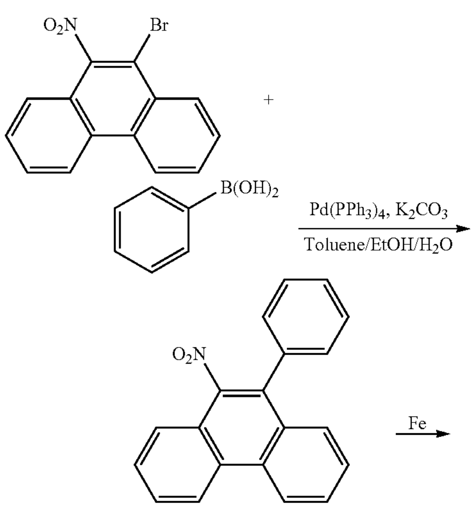

E-1

-continued

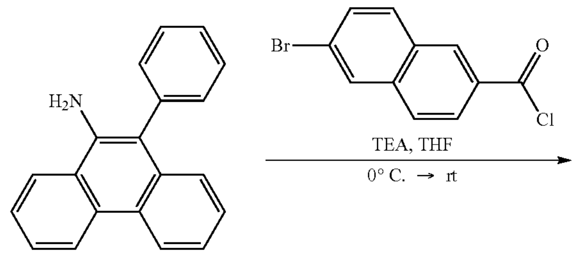

E-2

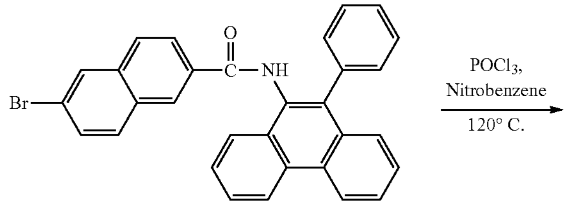

Q-3

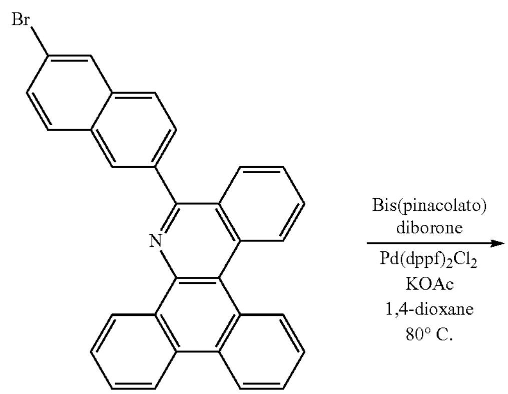

Molecular Weight: 484.396

Q-4

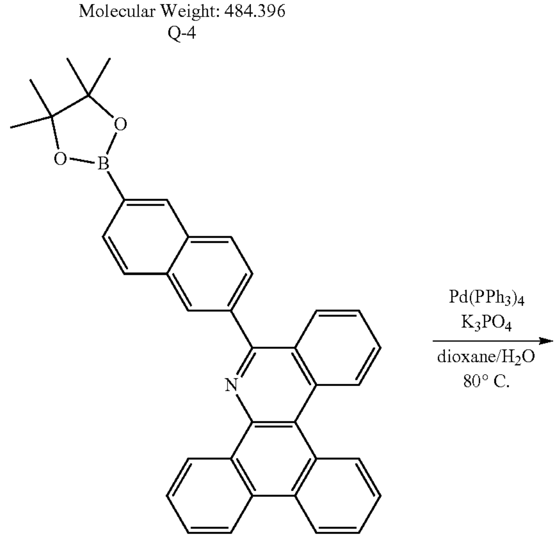

Q-5

-continued

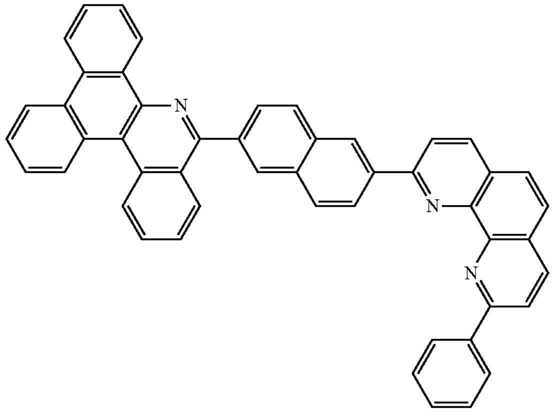

13-12

Preparation of Compound Q-3

Solid Compound Q-3 was obtained (80 g, 88%) in the same synthesis manner as E-3.

Preparation of Compound Q-4

Solid Compound Q-4 was obtained (85.6 g, 73%) in the same synthesis manner as E-4.

Preparation of Compound Q-5

Solid Compound Q-5 was obtained (49 g, 79%) in the same synthesis manner as E-5.

Preparation of Compound 13-12

After dissolving Q-5 (10.0 g, 20.77 mmol, 1 eq.) in dioxane/$H_2O$ (5:1), 2-bromo-9-phenyl-1,10-phenanthroline (6.9 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-12 was obtained (8.77 g, 70%).

<Preparation Example 66> Preparation of Compound 13-13

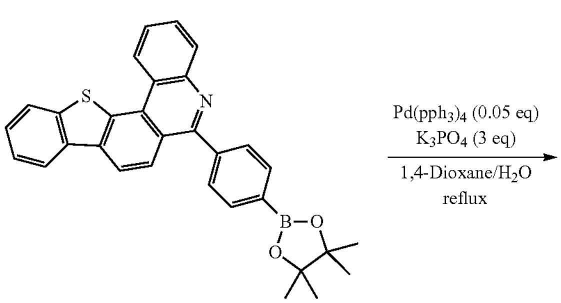

G-4

-continued

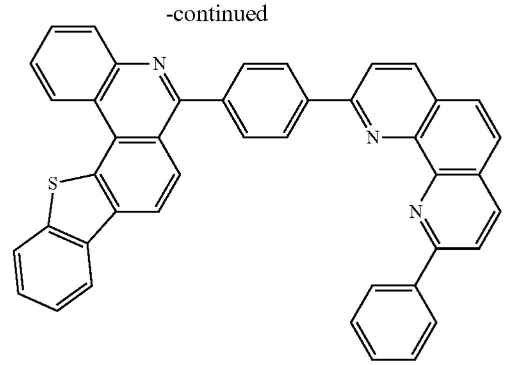

13-13

After dissolving G-4 (10.1 g, 20.77 mmol, 1 eq.) in dioxane/$H_2O$ (5:1), 2-bromo-9-phenyl-1,10-phenanthroline (6.9 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-13 was obtained (8.9 g, 70%).

<Preparation Example 67> Preparation of Compound 13-14

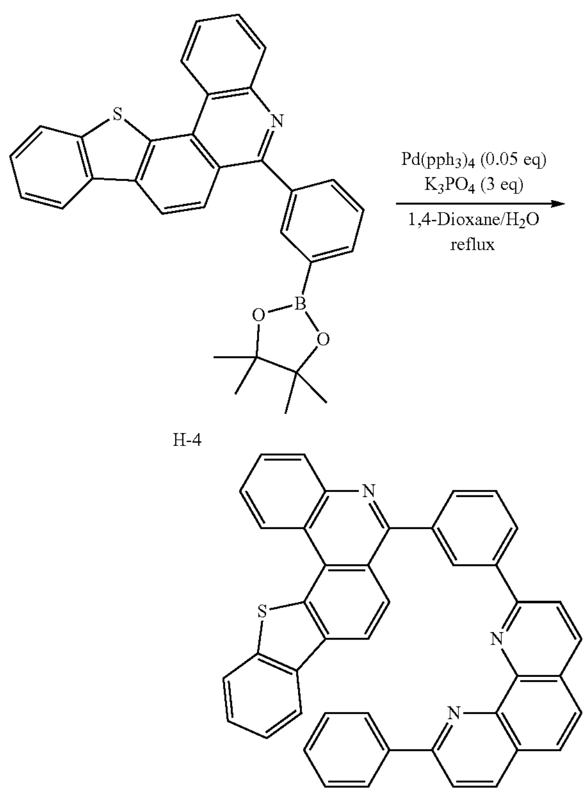

13-14

After dissolving H-4 (10.1 g, 20.77 mmol, 1 eq.) in dioxane/$H_2O$ (5:1), 2-bromo-9-phenyl-1,10-phenanthroline (6.9 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-14 was obtained (7.6 g, 59%).

<Preparation Example 68> Preparation of Compound 13-15

Preparation of Compound R-4

Solid Compound R-4 was obtained (82 g, 79%) in the same synthesis manner as G-4.

Preparation of Compound 13-15

After dissolving R-4 (11.1 g, 20.77 mmol, 1 eq.) in dioxane/$H_2O$ (5:1), 2-bromo-9-phenyl-1,10-phenanthroline (6.9 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added

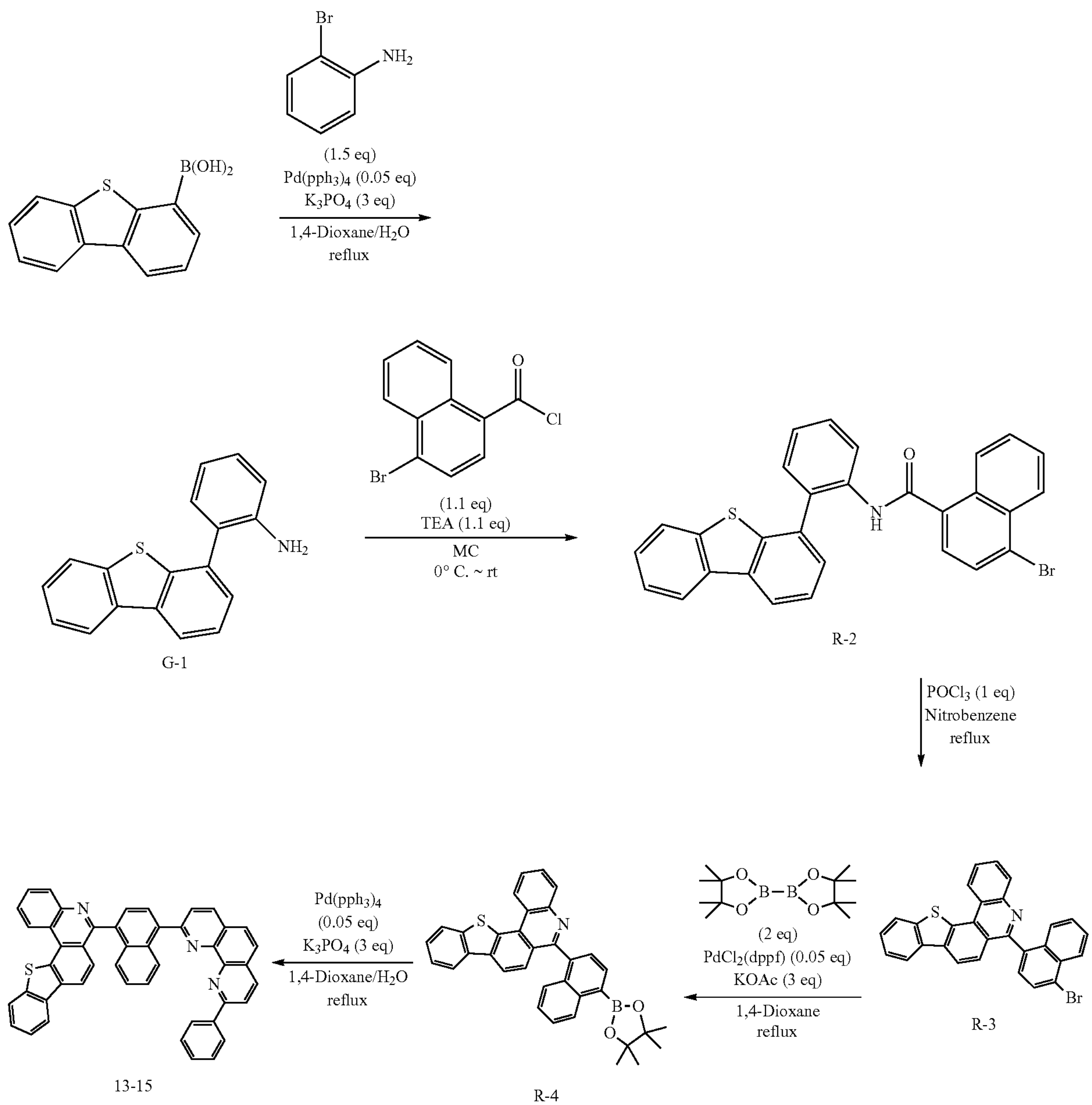

Preparation of Compound R-2

Liquid Compound R-2 was obtained (133 g, 100%) in the same synthesis manner as G-2.

Preparation of Compound R-3

Solid Compound R-3 was obtained (93 g, 76%) in the same synthesis manner as G-3.

thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-15 was obtained (11.9 g, 86%).

<Preparation Example 69> Preparation of Compound 13-16

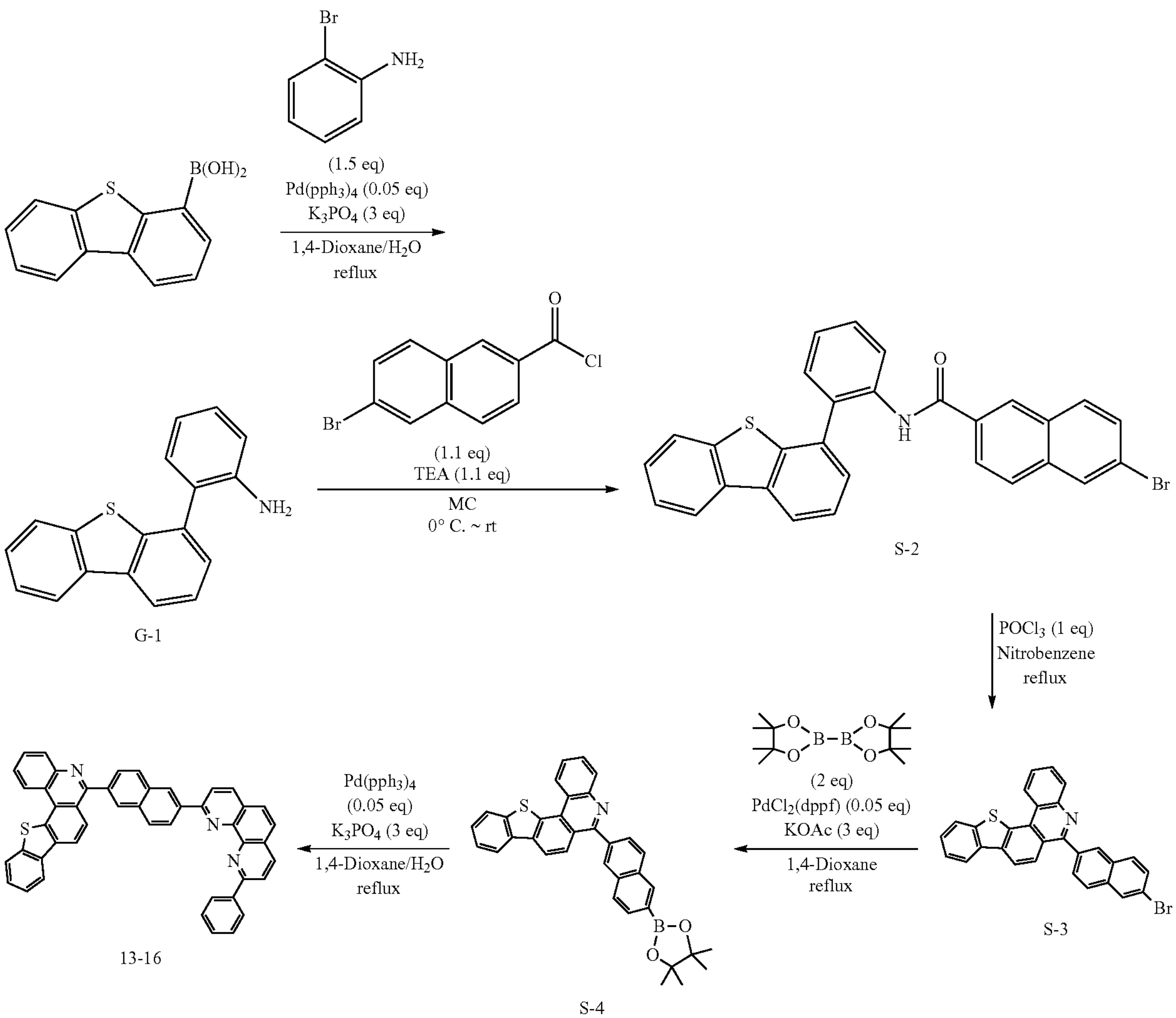

Preparation of Compound S-2

Liquid Compound S-2 was obtained (133 g, 100%) in the same synthesis manner as G-2.

Preparation of Compound S-3

Solid Compound S-3 was obtained (93 g, 76%) in the same synthesis manner as G-3.

Preparation of Compound S-4

Solid Compound S-4 was obtained (82 g, 79%) in the same synthesis manner as G-4.

Preparation of Compound 13-16

After dissolving S-4 (11.1 g, 20.77 mmol, 1 eq.) in dioxane/$H_2O$ (5:1), 2-bromo-9-phenyl-1,10-phenanthroline (6.9 g, 20.77 mmol, 1 eq.), $Pd(PPh_3)_4$ (1.2 g, 1.039 mmol, 0.05 eq.) and $K_3PO_4$ (13.2 g, 62.31 mmol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-16 was obtained (9.1 g, 66%).

<Preparation Example 70> Preparation of Compound 13-17

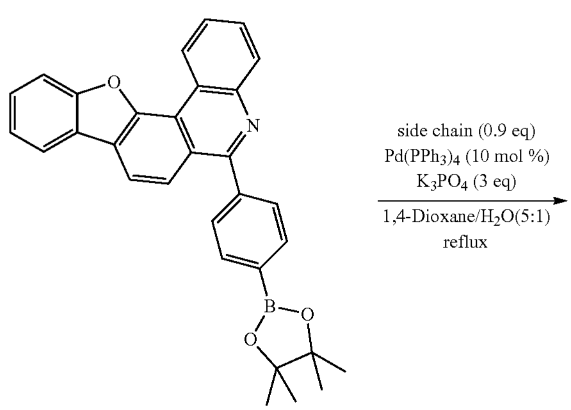

I-4

-continued

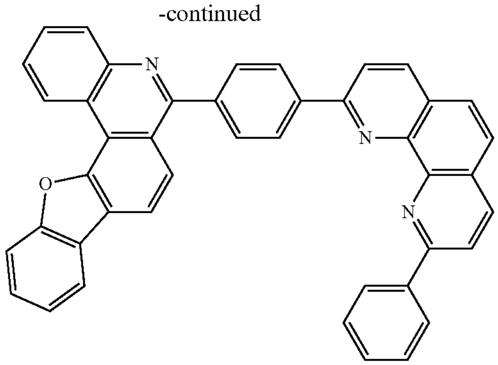

13-17

I-4 (10 g, 0.021 mol, 1 eq.), 2-bromo-9-phenyl-1,10-phenanthroline (7.1 g, 0.021 mol, 1 eq.), $Pd(PPh_3)_4$ (0.05 eq.), $K_3PO_4$ (3 eq.) and 1,4-dioxane/$H_2O$=5:1 (200, 40) were introduced, and the result was stirred for 1 hour at 120° C. When the reaction was completed, the temperature was lowered to room temperature, then $H_2O$ and MC were introduced thereto, and the result was stirred. The mixture was extracted with MC, moisture in the organic layer was removed using $MgSO_4$, the result was filtered, and the solvent was concentrated. The concentration-completed mixture was column separated using MC:Hex. Solid Compound 13-17 (9.5 g, 75%) was obtained.

<Preparation Example 71> Preparation of Compound 13-18

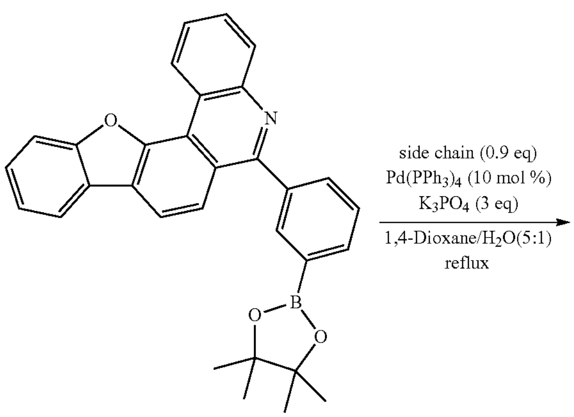

J-4

-continued

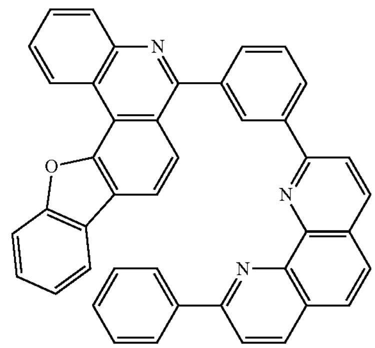

13-18

J-4 (10 g, 0.021 mol, 1 eq.), 2-bromo-9-phenyl-1,10-phenanthroline (7.1 g, 0.021 mol, 1 eq.), $Pd(PPh_3)_4$ (0.05 eq.), $K_3PO_4$ (3 eq.) and 1,4-dioxane/$H_2O$=5:1 (200, 40) were introduced, and the result was stirred for 1 hour at 120° C. When the reaction was completed, the temperature was lowered to room temperature, then $H_2O$ and MC were introduced thereto, and the result was stirred. The mixture was extracted with MC, moisture in the organic layer was removed using $MgSO_4$, the result was filtered, and the solvent was concentrated. The concentration-completed mixture was column separated using MC:Hex. Solid Compound 13-18 (10.2 g, 80%) was obtained.

<Preparation Example 72> Preparation of Compound 13-19

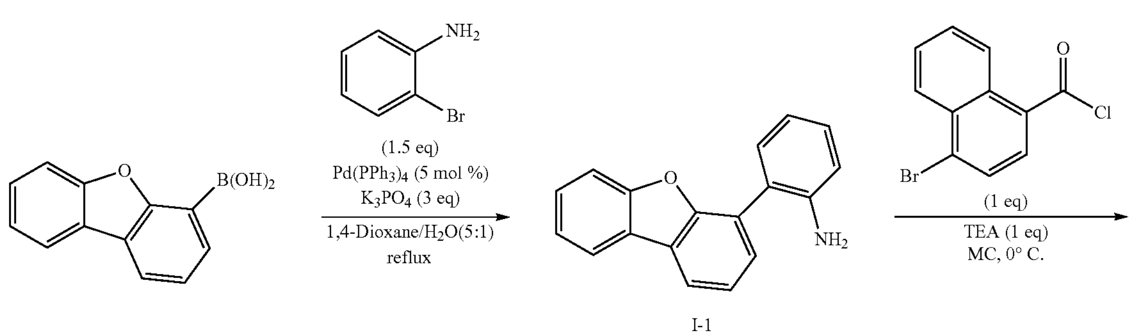

-continued

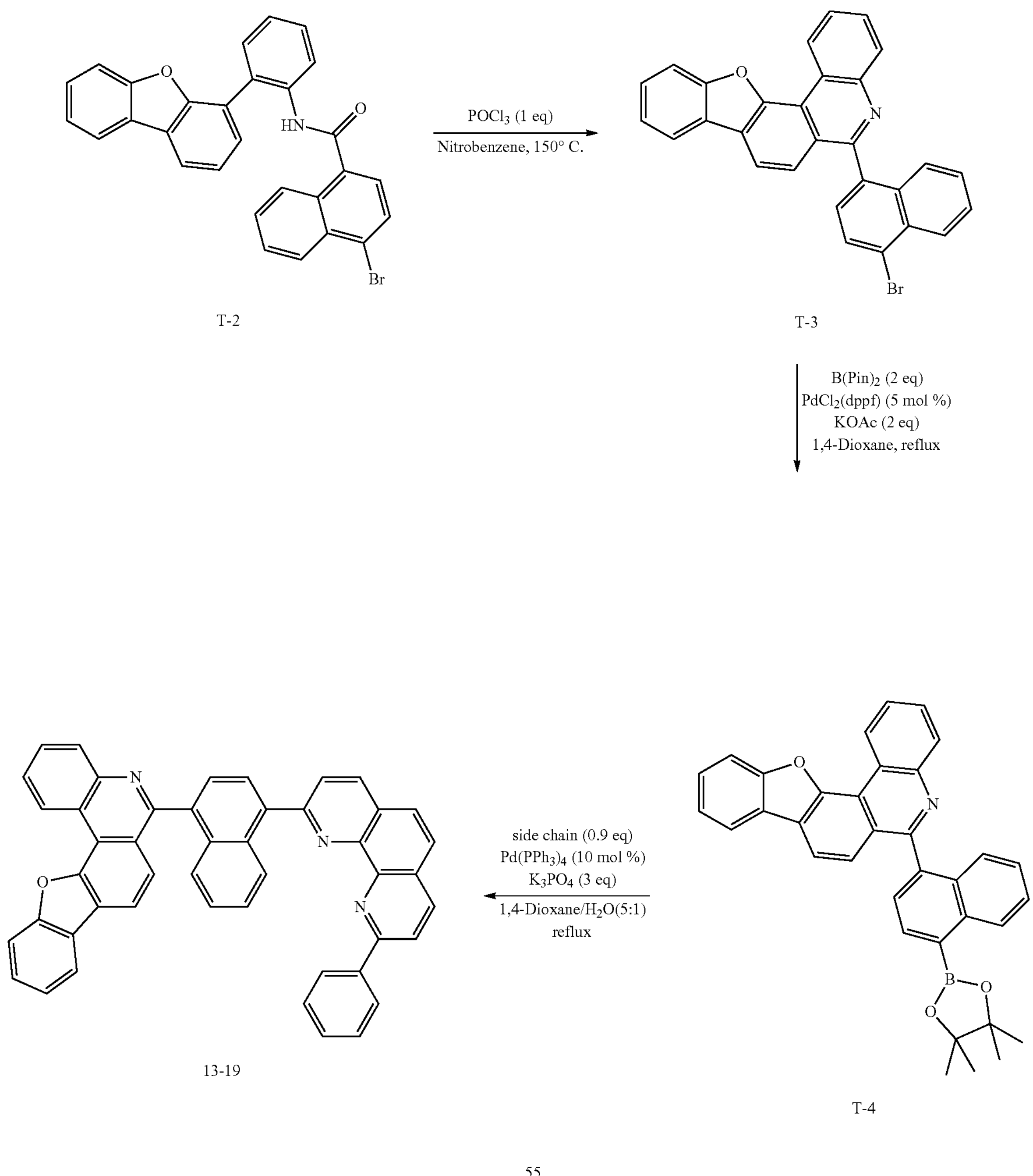

Preparation of Compound T-2

Solid Compound T-2 was obtained (47 g, 99%) in the same synthesis manner as 1-2.

Preparation of Compound T-3

Target Compound T-3 was obtained (71%) in the same synthesis manner as 1-3.

Preparation of Compound T-4

Target Compound T-4 was obtained (84%) in the same synthesis manner as I-4.

Preparation of Compound 13-19

To a flask, T-4 (10 g, 0.019 mol, 1 eq.), 2-bromo-9-phenyl-1,10-phenanthroline (6.5 g, 0.016 mol, 1 eq.), $Pd(PPh_3)_4$ (0.05 eq.), $K_3PO_4$ (3 eq.) and 1,4-dioxane/$H_2O$=5:1 (200, 40) were introduced, and the result was stirred for 1 hour at 120° C. When the reaction was completed, the temperature was lowered to room temperature, then $H_2O$ and MC were introduced thereto, and the result was stirred. The mixture was extracted with MC, moisture in the organic layer was removed using $MgSO_4$, the result was filtered, and the solvent was concentrated. The concentration-completed mixture was column separated using MC:Hex. Solid Compound 13-19 (10 g, 80%) was obtained.

<Preparation Example 73> Preparation of Compound 13-20
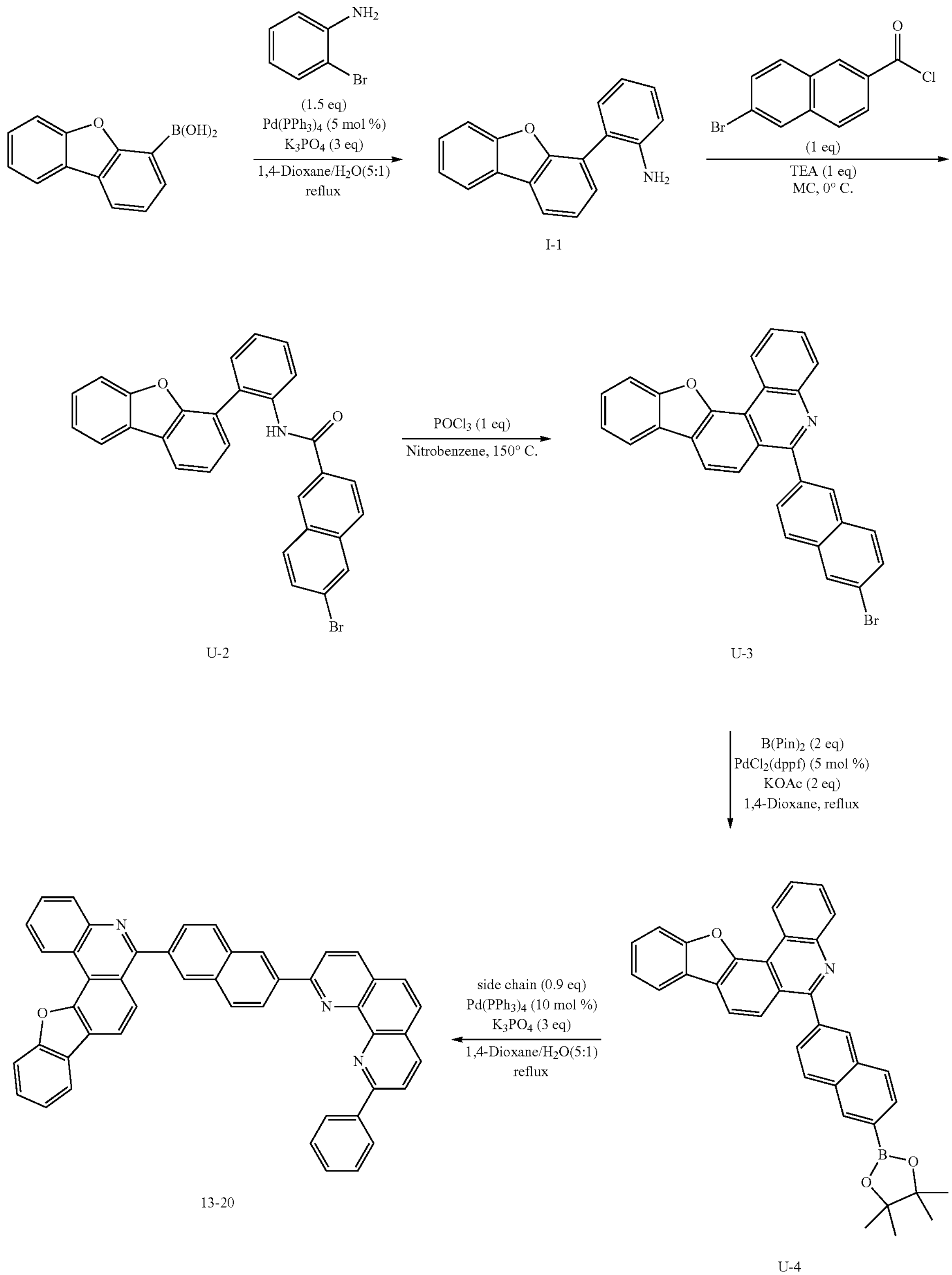

Preparation of Compound U-2

Solid Compound U-2 was obtained (47 g, 99%) in the same synthesis manner as 1-2.

Preparation of Compound U-3

Target Compound U-3 was obtained (71%) in the same synthesis manner as 1-3.

Preparation of Compound U-4

Target Compound U-4 was obtained (84%) in the same synthesis manner as 1-4.

Preparation of Compound 13-20

To a flask, U-4 (10 g, 0.019 mol, 1 eq.), 2-bromo-9-phenyl-1,10-phenanthroline (6.5 g, 0.019 mol. 1 eq.), $Pd(PPh_3)_4$ (0.05 eq.), $K_3PO_4$ (3 eq.) and 1,4-dioxane/$H_2O$=5:1 (200, 40) were introduced, and the result was stirred for 1 hour at 120° C. When the reaction was completed, the temperature was lowered to room temperature, then $H_2O$ and MC were introduced thereto, and the result was stirred. The mixture was extracted with MC, moisture in the organic layer was removed using $MgSO_4$, the result was filtered, and the solvent was concentrated. The concentration-completed mixture was column separated using MC:Hex. Solid Compound 13-20 (11.0 g, 88%) was obtained.

<Preparation Example 74> Preparation of Compound 13-21

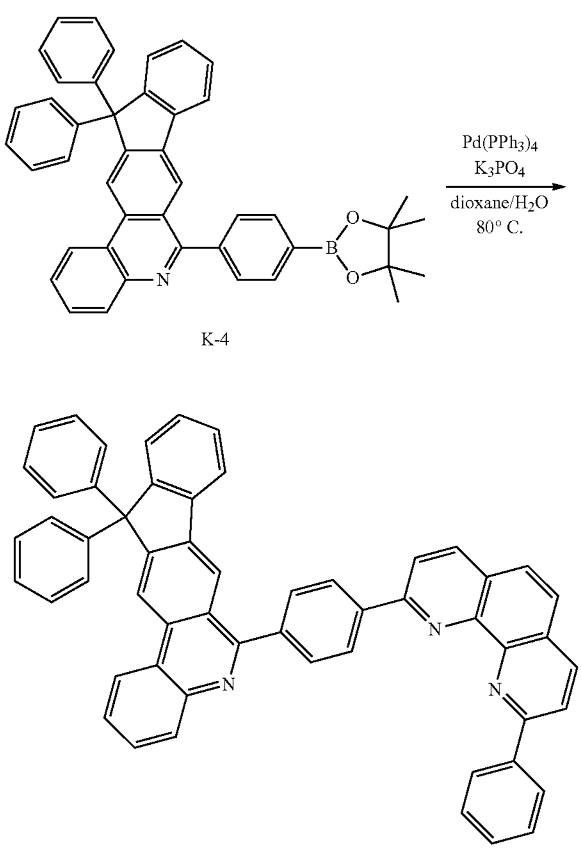

K-4

13-21

After dissolving K-4 (11.0 g, 0.016 mol, 1 eq.) in dioxane/$H_2O$ (5:1), 2-bromo-9-phenyl-1,10-phenanthroline (5.93 g, 0.017 mol, 1 eq.), $Pd(PPh_3)_4$ (1.0 g, 0.0009 mol, 0.05 eq.) and $K_3PO_4$ (10.24 g, 0.048 mol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-21 was obtained (8.0 g, 60.3%).

<Preparation Example 75> Preparation of Compound 13-22

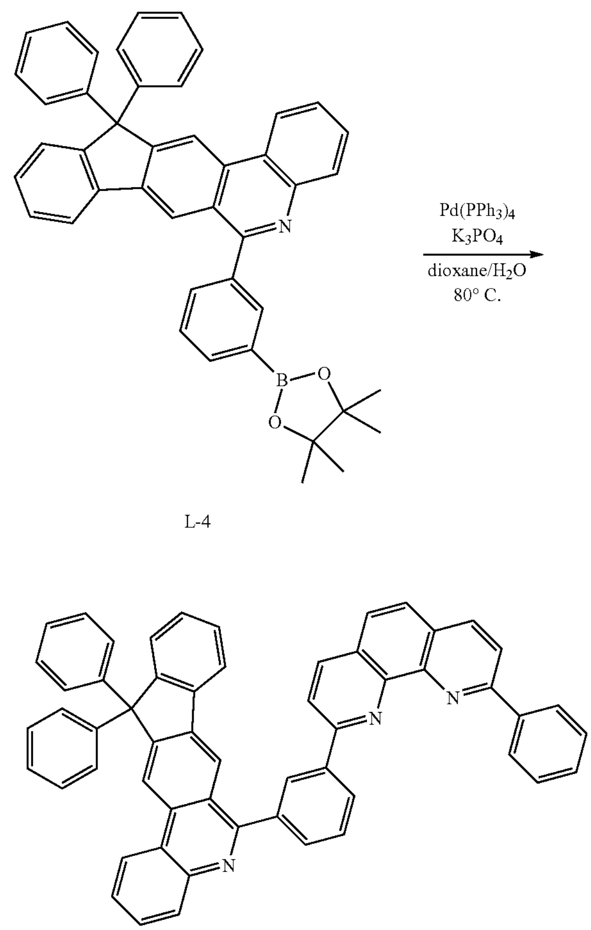

L-4

13-22

After dissolving L-4 (11.0 g, 0.016 mol, 1 eq.) in dioxane/$H_2O$ (5:1), 2-bromo-9-phenyl-1,10-phenanthroline (5.93 g, 0.017 mol, 1 eq.), $Pd(PPh_3)_4$ (1.0 g, 0.0009 mol, 0.05 eq.) and $K_3PO_4$ (10.24 g, 0.048 mol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-22 was obtained (8.4 g, 63.3%).

<Preparation Example 76> Preparation of Compound 13-23

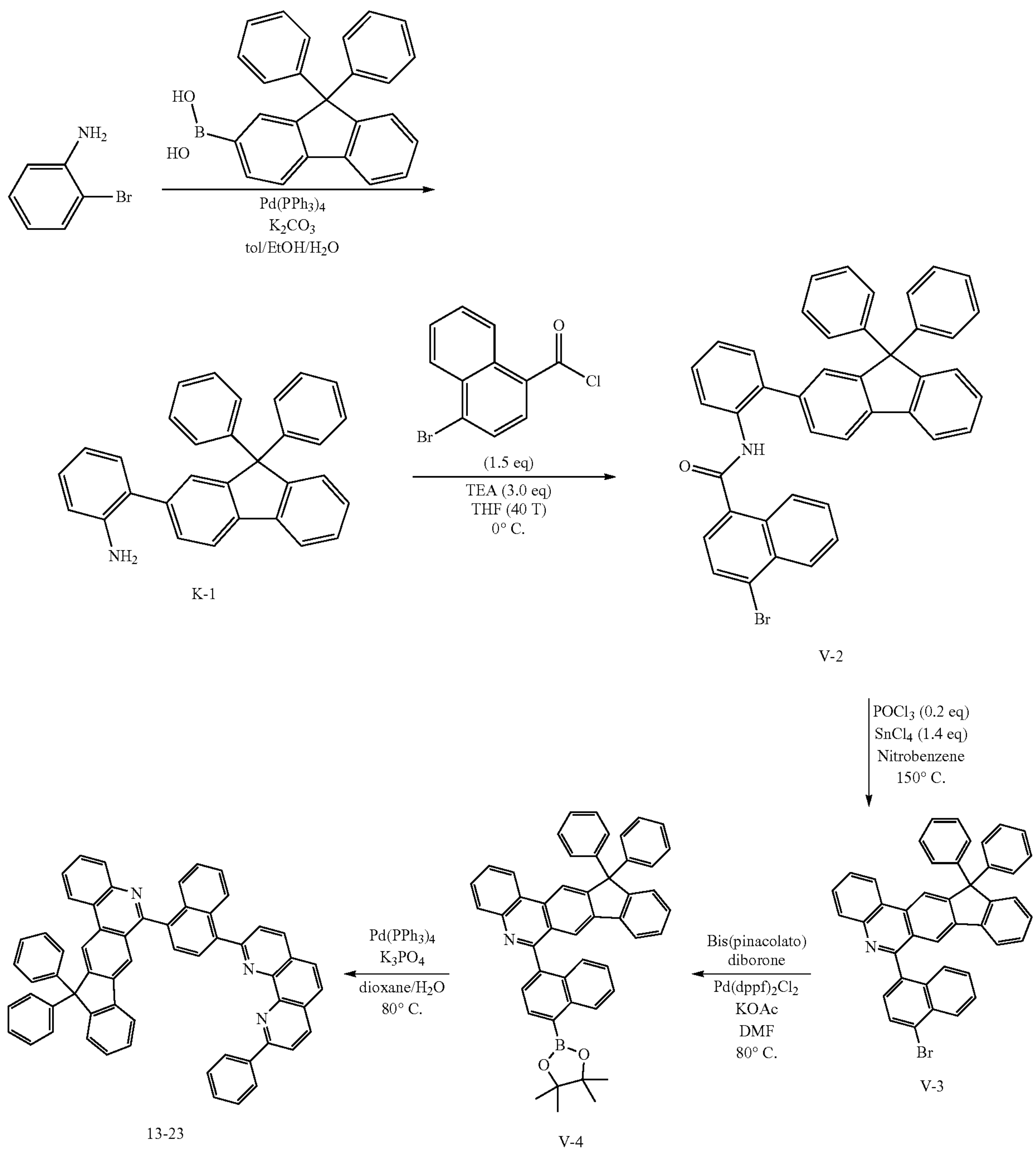

Preparation of Compound V-2

Solid Compound V-2 was obtained (200 g, 92.1%) in the same synthesis manner as K-2.

Preparation of Compound V-3

Solid Compound V-3 was obtained (120 g, 61.8%) in the same synthesis manner as K-3.

Preparation of Compound V-4

Solid Compound V-4 was obtained (100 g, 77.0%) in the same synthesis manner as K-4.

Preparation of Compound 13-23

After dissolving V-4 (11.9 g, 0.016 mol, 1 eq.) in dioxane/$H_2O$ (5:1), 2-bromo-9-phenyl-1,10-phenanthroline (5.93 g, 0.017 mol, 1 eq.), $Pd(PPh_3)_4$ (1.0 g, 0.0009 mol, 0.05 eq.) and $K_3PO_4$ (10.24 g, 0.048 mol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-23 was obtained (10.1 g, 71.3%).

<Preparation Example 77> Preparation of Compound 13-24

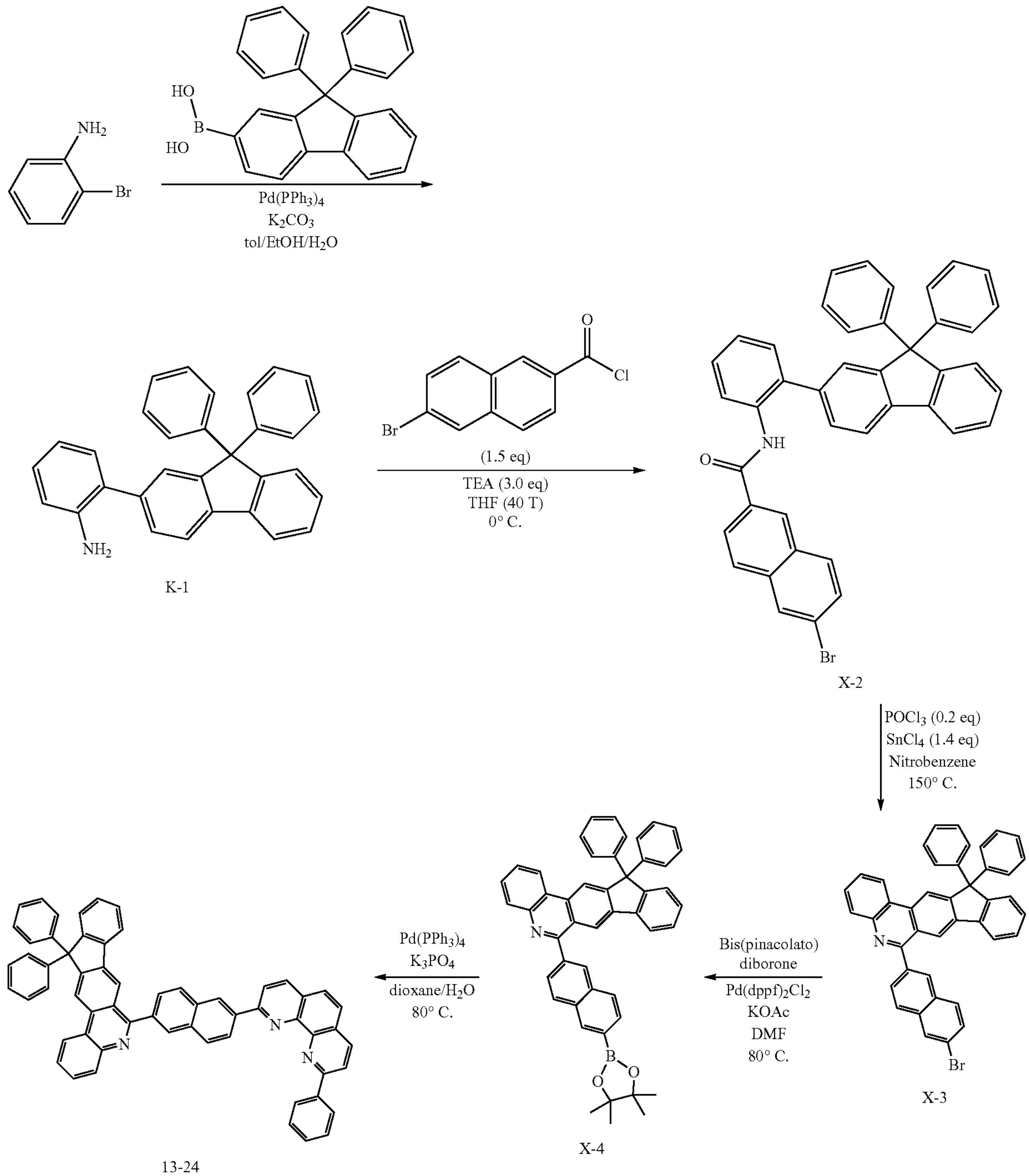

Preparation of Compound X-2

Solid Compound X-2 was obtained (200 g, 92.1%) in the same synthesis manner as K-2.

Preparation of Compound X-3

Solid Compound X-3 was obtained (120 g, 61.8%) in the same synthesis manner as K-3.

Preparation of Compound X-4

Solid Compound X-4 was obtained (100 g, 77.0%) in the same synthesis manner as K-4.

Preparation of Compound 13-24

After dissolving X-4 (11.9 g, 0.014 mol, 1 eq.) in dioxane/$H_2O$ (5:1), 2-bromo-9-phenyl-1,10-phenanthroline (5.93 g, 0.017 mol, 1 eq.), $Pd(PPh_3)_4$ (1.0 g, 0.0009 mol, 0.05 eq.) and $K_3PO_4$ (10.24 g, 0.048 mol, 3 eq.) were added thereto, and the result was stirred for 3 hours at 80° C. After adding purified water and ethyl acetate thereto, the result was solidified, stirred for 1 hour, and then filtered. The filtered solids were heated with ethyl acetate, toluene and MeOH, and stirred. Solid Compound 13-24 was obtained (8.9 g, 62.9%).

Compounds were prepared in the same manner as in the preparation examples, and the synthesis identification results are shown in Table 1 and Table 2.

TABLE 1

| Compound | $^1$H NMR ($CDCl_3$, 200 Mz) |
|---|---|
| 1-1 | δ = 8.71 (d, 2H), 8.69 (d, 4H), 8.54 (d, 1H), 8.33 (d, 2H), 8.20 (d, 2H), 7.99~7.85 (m, 9H), 7.70~7.49 (m, 7H), 7.29 (d, 2H) |
| 1-6 | δ = 8.91 (s, 1H), 8.71 (d, 2H), 8.69 (d, 2H), 8.54 (d, 1H), 8.39 (d, 1H), 8.33 (d, 2H), 8.20 (d, 2H), 7.99~7.85 (m, 9H), 7.70~7.49 (m, 8H), 7.38 (d, 1H), 7.29 (d, 2H) |
| 1-14 | δ = 8.80 (d, 1H), 8.69 (d, 2H), 8.67 (d, 1H), 8.54~8.44 (d, 3H), 8.20 (d, 1H), 7.99~7.94 (m, 3H), 7.85 (t, 3H), 7.70~7.53 (m, 6H), 7.32 (s, 1H), 7.25 (d, 4H) |
| 1-26 | δ = 9.60 (d, 1H), 9.27 (s, 2H), 8.80 (d, 1H), 8.79 (d, 1H), 8.67~8.69 (d, 3H), 8.54~8.30 (m, 7H), 8.20 (d, 1H), 7.99~7.85 (m, 6H),7.70~7.53 (m, 8H), 7.32 (s, 1H) |
| 1-27 | δ = 8.87 (d, 1H), 8.80 (d, 1H), 8.69 (d, 2H), 8.54 (d, 1H), 8.45 (d, 1H), 8.20 (d, 1H), 8.12 (d, 1H), 7.99~7.82 (m, 7H), 7.70~7.53 (m, 5H), 7.25 (d, 4H), 7.15 (d, 1H) |
| 2-1 | δ = 8.71 (d, 2H), 8.69 (d, 2H), 8.54 (d, 1H), 8.33 (d, 2H), 8.20 (D, 2H), 7.99~7.85 (m, 7H), 7.73~7.53 (m, 9H) 7.29 (d, 2H) |
| 2-14 | δ = 8.80 (d, 1H), 8.67 (d, 1H), 8.54~8.44(d, 3H), 8.33 (d, 2H), 8.20 (d, 1H), 7.99 (d, 2H), 7.94 (d, 1H), 7.85 (t, 1H), 7.73~7.53 (m, 8H), 7.32 (d, 1H), 7.25 (d, 4H) |
| 2-27 | δ = 8.87 (d, 1H), 8.80 (d, 1H), 8.54 (d, 1H), 8.45 (d, 1H), 8.33 (d, 2H), 8.20 (d, 1H), 8.12 (d, 1H), 7.99 (d, 2H), 7.94 (d, 1H), 7.85 (t, 1H), 7.82 (d, 1H), 7.70~7.53 (m, 7H), 7.25 (s, 4H), 7.15 (d, 1H) |
| 3-1 | δ = 9.08 (d, 2H), 8.71 (d, 2H), 8.69 (d, 4H), 8.33 (d, 2H), 8.20 (d, 2H), 8.17 (d, 2H), 7.94~7.85 (m, 7H), 7.70~7.49 (m, 8H), 7.29 (d, 2H) |
| 3-10 | δ = 9.08 (d, 2H), 8.71 (d, 2H), 8.69 (d, 2H), 8.33 (d, 2H), 8.22 (d, 2H), 8.20 (d, 2H), 8.19~8.17 (d, 4H), 7.94~7.85 (m, 3H), 7.70~7.40 (m, 12H), 7.29~7.25 (m, 4H) |
| 3-14 | δ = 9.08 (d, 2H), 8.80 (d, 1H), 8.67 (d, 1H), 8.69 (d, 2H), 8.50 (d, 1H), 8.44 (d, 1H), 8.20 (d, 1H), 8.17 (d, 2H), 7.94 (d, 1H), 7.85 (t, 3H), 7.70~7.56 (m, 7H) |
| 3-27 | δ = 9.08 (d, 2H), 8.87 (d, 1H), 8.80 (d, 1H), 8.69 (d, 2H), 8.45 (d, 1H), 8.20 (d, 1H), 8.17 (d, 1H), 8.12 (d, 1H), 7.94 (d, 1H), 7.85 (t, 3H), 7.82 (d, 1H), 7.70 (t, 3H), 7.62 (t, 2H), 7.25 (S, 4H), 7.15 (d, 1H) |
| 4-1 | δ = 9.08 (d, 2H), 8.71 (d, 2H), 8.69 (d, 2H), 8.33 (d, 4H), 8.20 (d, 2H), 8.17 (d, 2H), 7.94 (d, 1H), 7.90 (d, 1H), 7.85 (t, 3H), 7.73~7.49 (m, 10H), 7.29 (d,2H) |
| 4-5 | δ = 9.08 (d, 2H), 9.02 (d, 1H), 8.95 (d, 1H), 8.71 (d, 2H), 8.45 (d, 1H), 8.33 (d, 4H), 8.20~8.17 (m, 4H), 7.94~7.85 (m, 4H), 7.73~7.46 (m, 12H), 7.29 (d, 2H) |
| 4-17 | δ = 9.26 (s, 2H), 9.08 (d, 2H), 8.80 (d, 2H), 8.50 (d, 1H), 8.46 (d, 1H), 8.38~8.33 (d, 3H), 8.20 (d, 1H), 8.17 (d, 2H), 7.94~7.62 (m, 11H) |
| 4-27 | δ = 9.08 (d, 2H), 8.80~8.87 (d, 2H), 8.45 (d, 1H), 8.33 (d, 2H), 8.20~8.12 (d, 4H), 7.94 (d, 1H), 7.85~7.82 (t, 2H), 7.73~7.56 (m, 8H), 7.25 (s, 4H), 7.15 (d, 1H) |
| 5-1 | δ = 9.08 (d, 1H), 8.98 (d, 1H), 8.71~8.69 (m, 6H), 8.33 (d, 2H), 8.20~8.11 (m, 3H), 7.99 (d, 1H), 7.90~7.83 (m, 6H), 7.70~7.49 (m, 9H), 7.29 (d, 2H) |
| 5-7 | δ = 9.08 (d, 1H), 9.89 (d, 1H), 8.82 (d, 1H), 8.71 (d, 2H), 8.69 (d, 4H), 8.47 (s, 1H), 8.33 (d, 2H), 8.25~8.11 (m, 4H), 7.99 (d, 1H), 7.90~7.83 (d, 2H), 7.70~7.55 (m, 9H), 7.29 (d, 3H) |
| 5-21 | δ = 9.08 (d, 1H), 8.89 (d, 1H), 8.80 (d, 1H), 8.74 (d, 1H), 8.69 (d, 2H), 8.67 (d, 1H), 8.50 (d, 1H), 8.44 (d, 1H), 8.49 (d, 1H), 8.17~8.11 (d, 2H), 7.99~7.92 (d, 2H), 7.83 (d, 1H), 7.74~7.56 (m, 9H), 7.43 (t, 1H), 7.32~7.25 (d, 3H) |
| 5-38 | δ = 9.08 (d, 1H), 8.89 (d, 1H), 8.80 (d, 1H), 8.87 (d, 1H), 8.69 (d, 2H), 8.52~8.46 (s, 2H), 8.45 (d, 1H), 8.22~8.08 (m, 6H), 7.99~7.82 (m, 7H), 7.70~7.56 (m, 8H), 7.15 (d, 1H) |
| 6-1 | δ = 9.08 (d, 1H), 8.89 (d, 1H), 8.71 (d, 2H), 8.69 (d, 2H), 8.33 (d, 4H), 8.20 (d, 1H), 8.17 (s, 1H), 8.11 (s, 1H), 7.99 (d, 1H), 7.90~7.85 (m, 4H), 7.73~7.49 (m, 11H), 7.29 (d, 2H) |

TABLE 1-continued

| Compound | $^1$H NMR ($CDCl_3$, 200 Mz) |
|---|---|
| 6-5 | δ = 9.08 (d, 1H), 9.02 (d, 1H), 8.98 (d, 1H), 8.95 (d, 1H), 8.71 (d, 2H), 8.45 (d, 1H), 8.33 (m, 4H), 8.20~8.11 (m, 3H), 7.99 (d, 1H), 7.90 (d, 1H), 7.84 (d, 1H), 7.83 (d, 1H), 7.73~7.46 (m, 13H), 7.29 (d, 2H) |
| 6-10 | δ = 9.08 (d, 1H), 8.89 (d, 1H), 8.71 (d, 2H), 8.33 (d, 4H), 8.22~8.11 (m, 7H), 7.61 (d, 1H), 7.90 (d, 1H), 7.83 (d, 1H), 7.70~7.40 (m, 15H), 7.29 (d, 2H) |
| 6-14 | δ = 9.08 (d, 1H), 8.89 (d, 1H), 8.80 (d, 1H), 8.67 (d, 1H), 8.50 (d, 1H), 8.44 (d, 1H), 8.33 (d, 2H), 8.17 (d, 1H), 8.11 (d, 1H), 7.99 (d, 1H), 7.83 (d, 1H), 7.73~7.56 (m, 10H), 7.32 (s, 1H), 7.25 (d, 4H) |
| 6-38 | δ = 9.08 (d, 1H), 8.89 (d, 1H), 8.87 (d, 1H), 8.80 (d, 1H), 8.52~8.45 (d, 2H), 8.33 (t, 2H), 8.28 (d, 1H), 8.17~8.11 (m, 5H), 7.99-7.92 (d, 3H), 7.83~7.56 (m, 13H), 7.15 (d, 1H) |
| 7-1 | δ = 8.71 (d, 2H), 8.69 (d, 4H), 8.45 (d, 1H), 8.33 (d, 2H), 8.20 (d, 2H), 7.94~7.85 (m, 9H), 7.70 (t, 1H), 7.62~7.49 (m, 6H), 7.29 (d, 2H) |
| 7-5 | δ = 9.02 (d, 1H), 8.95 (d, 1H), 8.71 (d, 2H), 8.69 (d, 2H), 8.45 (d, 2H), 8.33 (d, 2H), 8.20 (d, 2H), 7.99~7.84 (m, 6H), 7.70~7.46 (m, 9H), 7.29 (d, 2H), 7.25 (d, 2H) |
| 7-17 | δ = 9.26 (s, 2H), 8.80 (d, 2H), 8.69 (d, 2H), 8.50 (d, 1H), 8.46 (d, 1H), 8.20 (d, 1H), 7.94~7.56 (m, 13H) |
| 7-34 | δ = 8.80 (d, 1H), 8.87 (d, 2H), 8.69 (d, 2H), 8.45 (d, 3H), 8.20~8.14 (m, 4H), 7.99~7.82 (m, 5H), 7.70~7.49 (m, 6H), 7.25 (d, 2H), 7.15 (d, 1H) |
| 7-39 | δ = 9.60 (d, 1H), 9.27 (s, 2H), 8.87 (d, 1H), 8.80 (d, 1H), 8.79 (d, 1H), 8.69 (d, 2H), 8.45 (d, 2H), 8.37 (d, 2H), 8.30 (d, 2H), 8.20 (d, 1H), 8.12 (d, 1H), 7.99 (d, 1H), 7.94~7.82 (m, 7H), 7.70~7.49 (m, 7H), 7.15 (d, 1H) |
| 8-1 | δ = 8.71 (d, 2H), 8.69 (d, 2H), 8.45 (d, 1H), 8.33 (d, 4H), 8.20 (d, 1H), 7.99~7.85(m, 7H), 7.73~7.49 (m, 9H), 7.29 (d, 2H) |
| 8-5 | δ = 9.02 (d, 1H), 8.95 (d, 1H), 8.71 (d, 2H), 8.45 (d, 2H), 8.33 (d, 4H), 8.20 (d, 2H), 7.94~7.84 (m, 6H), 7.73~7.46 (m, 11H), 7.29 (d, 2H) |
| 8-6 | δ = 8.83 (s, 1H), 8.71 (d, 2H), 8.45 (d, 1H), 8.38~8.33(m, 5H), 8.20 (d, 1H), 8.12(d, 1H), 7.99~7.85 (m, 6H), 7.73~7.49 (m, 10H), 7.38 (d, 1H), 7.29 (d, 2H) |
| 8-19 | δ = 8.80 (d, 1H), 8.67 (d, 1H), 8.50 (d, 1H), 8.45~8.44(d, 2H), 8.33 (d, 2H), 8.20 (d, 1H), 7.99~7.85 (m, 6H), 7.73~7.40 (m, 12H), 7.32 (s, 1H) |
| 8-39 | δ = 8.87 (d, 1H), 8.80 (d, 1H), 8.52 (d, 1H), 8.45 (d, 2H), 8.33~8.15 (m, 7H), 7.99~7.49 (m, 16H), 7.15 (d, 1H) |
| 9-1 | δ = 7.32-7.55 (m, 8H), 7.60 (t, 1H), 7.66 (d, 1H), 7.78 (t, 1H), 7.81-7.89 (m, 6H), 7.92 (d, 1H), 7.98-8.10 (m, 4H), 8.30 (d, 2H), 8.81 (d, 4H) |
| 9-5 | δ = 7.28-7.38 (m, 6H), 7.47 (t, 1H), 7.54-7.55 (m, 5H), 7.60 (t, 1H), 7.66 (d, 1H), 7.78-7.81 (m, 2H), 7.89-7.92 (m, 2H), 7.98 (d, 1H), 8.04-8.10 (m, 5H), 8.30 (d, 2H), 8.52-8.55(m, 3H), 8.81 (d, 2H) |
| 9-14 | δ = 7.25 (m, 4H), 7.32-7.38 (m, 2H), 7.55 (d, 1H), 7.58 (m, 2H), 7.60 (t, 1H), 7.65-7.66 (2H), 7.78 (t, 1H), 7.88-7.89 (m, 3H), 7.92 (d, 1H), 7.98 (d, 1H), 8.06 (d, 1H), 8.38 (d, 2H), 8.81-8.83 (m, 3H) |
| 9-18 | δ = 7.28-7.38 (m, 4H), 7.55-7.58 (m, 5H), 7.60 (t, 1H), 7.65-7.66 (m, 2H), 7.78 (t, 1H), 7.89 (d, 1H), 7.92 (d, 1H), 7.98-8.01 (m, 3H), 8.06 (d, 1H), 8.38 (m, 2H), 8.55 (d, 2H), 8.81-8.83 (m, 4H) |
| 10-1 | δ = 7.32-7.38 (m, 4H), 7.47 (t, 1H), 7.54-7.55 (m, 4H), 7.60 *m, 2H), 7.66 (d, 1H), 7.78 (t, 1H), 7.81 (d, 1H), 7.88 (d, 2H), 7.98-8.10 (m, 4H), 8.06-8.10 (m, 4H), 8.21 (s, 1H), 8.26-8.30 (m, 3H), 8.81 (d, 2H) |
| 10-5 | δ = 7.32-7.38 (m, 4H), 7.47 (t, 1H), 7.54-7.55 (m, 6H), 7.60 (m, 2H), 7.78-7.81 (m, 2H), 7.89 (d, 1H), 7.92 (d, 1H), 7.98 (d, 1H), 8.04-8.06 (m, 3H), 8.10 (d, 2H), 8.21 (s, 1H), 8.26-8.30 (m, 3H), 8.52-8.55 (m, 3H) |
| 10-14 | δ = 7.25 (s, 4H), 7.32-7.38 (m, 2H), 7.54-7.66 (m, 8H), 7.78 (t, 1H), 7.89 (d, 1H), 7.92 (d, 1H), 7.98 (d, 1H), 8.06 (d, 1H), 8.21 (s, 1H), 8.26 (d, 1H), 8.38 (d, 1H), 8.83 (d, 1H) |
| 10-18 | δ = 7.32-7.38 (m, 2H), 7.54-7.66 (m, 10H), 7.78 (t, 1H), 7.89 (d, 1H), 7.92 (s, 2H), 8.01 (s, 2H), 8.06 (d, 1H), 8.21 (s, 1H), 8.26 (d, 1H), 8.38 (d, 2H), 8.55 (d, 2H), 8.83 (d, 2H) |
| 11-1 | δ = 8.81(4H, d), 8.30(2H, d), 8.10~7.98(7H, m), 7.88~7.78 (6H, m), 7.54~7.23(16H, m), 7.11(4H, m) |

TABLE 1-continued

| Compound | $^1$H NMR ($CDCl_3$, 200 Mz) |
|---|---|
| 11-5 | δ = 8.81(2H, d), 8.55(3H, m), 8.30(2H, m), 8.10~7.98(8H, m), 7.81 (2H, m), 7.60~7.24(20H, m), 7.11(4H, m) |
| 11-10 | δ = 8.81(2H, d), 8.30(2H, d), 8.10~7.91(11H, m), 7.81(2H, m), 7.60~7.24(22H, m), 7.11(4H, m) |
| 11-14 | δ = 8.83(4H, m), 8.38(2H, d), 8.09~7.98(4H, m), 7.88(2H, d), 7.78(1H, t), 7.65~7.58(6H, m) 7.44(1H, t) 7.33~7.24 (11H, m), 7.11(4H, m) |
| 11-27 | δ = 8.81(4H, m), 8.38(1H, d), 8.09~7.98(5H, m), 7.88~7.78 (4H, m), 7.58(4H, m) 7.48(2H, m) 7.33~7.24(11H, m), 7.11 (4H, m) |
| 12-1 | δ = 8.81(2H, d), 8.30(4H, m), 8.10~7.98(7H, m), 7.88~7.78 (4H, m), 7.60~7.23(18H, m), 7.11(4H, m) |
| 12-5 | δ = 8.55(3H, m), 8.30(4H, m), 8.10~7.98(8H, m), 7.81 (2H, m), 7.60~7.26(20H, m), 7.11(4H, m) |
| 12-10 | δ = 8.30(4H, m), 8.10~7.91(11H, m), 7.81(2H, m), 7.60~7.24(22H, m), 7.11(4H, m) |
| 12-14 | δ = 8.83(2H, d), 8.38(2H, d), 8.26(2H, d), 8.09~7.98(4H, m), 7.78(1H, t), 7.65~7.54(8H, m) 7.44(1H, t) 7.33~7.25 (11H, m), 7.11(4H, m) |
| 12-27 | δ = 8.82(2H, m), 8.38(1H, d), 8.26(2H, d), 8.09~7.98(5H, m), 7.78(2H, m), 7.60~7.44(8H, m), 7.33~7.25(11H, m), 7.11 (4H, m) |
| 13-1 | δ = 8.71(2H, d), 8.69(4H, d), 8.54(1H, d), 8.33(2H, d), 8.20(2H, d), 7.99~7.85(5H, m), 7.70~7.49(7H, m), 7.29(2H, d) |
| 13-2 | δ = 8.72(1H, s), 8.71(2H, d), 8.54(1H, d), 8.33(4H, d), 8.20(2H, d), 7.99~7.85(5H, m), 7.61~7.49(8H, m), 7.29(2H, d) |
| 13-3 | δ = 8.97(2H, d), 8.71~7.68(4H, m), 8.54(1H, d), 8.33(2H, d),8.20(2H, d), 7.99~7.85(5H, m), 7.70~7.49(9H, m), 7.29 (2H, d) |
| 13-4 | δ = 8.85(2H, s), 8.71(2H, d), 8.54(1H, d), 8.37~8.33(4H, m), 8.20(2H, d), 7.99~7.85(7H, m), 7.70~7.49(7H, m), 7.29 (2H, d) |
| 13-5 | δ = 9.08(2H, d), 8.71~8.69(6H, m), 8.33(2H, d), 8.20~8.17 (4H, m), 7.94~7.85(3H, m), 7.70~7.49(8H, m), 7.29(2H, d) |
| 13-6 | δ = 9.08(2H, d), 8.71(3H, m), 8.33(4H, d), 8.20~8.17(4H, 7.94~7.85(3H, m), 7.73~7.49(9H, m), 7.29(2H, d) |
| 13-7 | δ = 9.08(2H, d), 8.79(2H, d), 8.71~8.68(4H, m), 8.33(2H, d), 8.20~8.17(4H, m), 7.94~7.85(3H, m), 7.70~7.49(10H, m), 7.29(2H, d) |
| 13-8 | δ = 9.08(2H, d), 8.85(2H, s), 8.71(2H, d), 8.37~8.33(4H, m), 8.20~8.17(4H, m), 7.93~7.85(5H, m), 7.70~7.49(8H, m), 7.29(2H, d) |
| 13-9 | δ = 9.08(1H, d), 8.89(1H, d), 8.71~8.69(6H, m), 8.33(2H, d), 8.20~8.11(3H, m), 7.99(1H, d), 7.90~7.83(2H, d), 7.70~7.49(9H, m), 7.29(2H, d) |
| 13-10 | δ = 9.08(1H, d), 8.98(1H, d), 8.72~8.71(3H, d), 8.33(4H, d), 8.20~8.11(3H, m), 7.99(1H, d), 8.90~7.83(2H, d), 7.70~7.49(10H, m), 7.29(2H, d) |
| 13-11 | δ = 9.08(1H, d), 8.98~8.97(3H, d), 8.71~8.68(4H, m), 8.33 (2H, d), 8.20-8.11(3H, m), 7.99(1H, d), 7.90~7.83(2H, d), 7.70~7.49(11H, m), 7.29(2H, d) |
| 13-12 | δ = 9.08(1H, d), 8.98(1H, d), 8.85(2H, d), 8.71(2H, d), 8.37~8.33(4H, m), 8.20~8.11(3H, m), 7.99~7.83(5H, m), 7.70~7.49(9H, m), 7.29(2H, d) |
| 13-13 | δ = 8.71(2H, d), 8.69(4H, d), 8.45(1H, d), 8.33(2H, d), 8.20(2H,d), 7.99~7.85(5H, m), 7.70~7.49(8H, m), 7.29(2H, d) |
| 13-14 | δ = 8.72~8.71(3H, m), 8.45(1H, d), 8.33(4H, d), 8.20(2H, d), 7.99~7.85(5H, m), 7.70~7.49(8H, m), 7.29(2H, d) |
| 13-15 | δ = 8.97(2H, d), 8.71~8.69(4H, m), 8.45(1H, d), 8.33(2H, d), 8.20(2H, d), 7.94~7.85(5H, m), 7.70~7.49(9H, m), , 7.29 (2Hd) |
| 13-16 | δ = 8.85(2H, d), 8.71(2H, d), 8.45~8.33(5H, m), 8.20(2H, d), 7.99~7.85(7H, m), 7.70~7.49(7H, m), 7.29(2H, d) |
| 13-17 | δ = 8.71~8.69(6H, d), 8.33(2H, d), 8.20(2H, d), 7.98~7.85 (5H, m), 7.70~7.49(6H, m), 7.39~7.29(4H, m) |
| 13-18 | δ = 8.72~8.71(3H, m), 8.33(4H, d), 8.20(2H, d), 7.99~7.84 (5H, m), 7.73~7.29(11H, m) |
| 13-19 | δ = 8.97(2H, d), 8.71~8.68(4H, m), 8.33(2H, d), 8.20(2H, d), 7.98~7.85(5H, m), 7.70~7.29(11H, m) |
| 13-20 | δ = 8.85(2H, d), 8.71(2H, d), 8.37~8.33(4H, m), 8.20(2H, d), 7.98~7.85(7H, m), 7.70~7.29(10H, m) |
| 13-21 | δ = 8.71~8.69(6H, m), 8.33(2H, d), 8.24~8.20(3H, m), 7.94~7.85(4H, m), 7.74~7.70(3H, m), 7.57~7.49(4H, m), 7.38(1H, t), 7.26~7.18(12H, m) |
| 13-22 | δ = 8.72~8.71(3H, m), 8.33~8.20(7H, m), 7.94~7.84(4H, m), 7.73~7.70(4H, m), 7.57~7.49(4H, m), 7.38~7.18(13H, m) |
| 13-23 | δ = 8.97(2H, d), 8.71~8.68(3H, m), 8.33(2H, d), 8.24~8.20 (3H, m), 7.94~7.85(4H, m), 7.74~7.70(3H, m), 7.59~7.49 (6H, m), 7.38~7.18(13H, m) |
| 13-24 | δ = 8.85(2H, d), 8.71(2H, d), 8.37~8.33(4H, m), 8.24~8.20 (3H, m), 7.94~7.85(6H, m), 7.74~7.70(3H, m), 7.57~7.49 (4H, m), 7.38~7.18(13H, m) |

TABLE 2

| Compound | FD-MS |
|---|---|
| 1-1 | m/z = 635.77 (C40H29N3 = 635.23) |
| 1-2 | m/z = 636.75 (C46H28N4 = 636.23) |
| 1-3 | m/z = 636.75 (C46H28N4 = 636.23) |
| 1-4 | m/z = 637.74 (C45H27N5 = 637.22) |
| 1-5 | m/z = 685.83 (C51H31N3 = 685.25) |
| 1-6 | m/z = 685.83 (C51H31N3 = 685.25) |
| 1-7 | m/z = 686.81 (C50H30N4 = 686.24) |
| 1-8 | m/z = 686.81 (C50H30N4 = 686.24) |
| 1-9 | m/z = 735.89 (C55H33N3 = 735.26) |
| 1-10 | m/z = 735.89 (C55H33N3 = 735.26) |
| 1-11 | m/z = 735.89 (C55H33N3 = 735.26) |
| 1-12 | m/z = 761.92 (C57H35N3 = 761.28) |
| 1-13 | m/z = 785.95 (C59H35N3 = 785.28) |
| 1-14 | m/z = 559.67 (C41H25N3 = 559.20) |
| 1-15 | m/z = 560.66 (C40H24N4 = 560.20) |
| 1-16 | m/z = 560.66 (C40H24N4 = 560.20) |
| 1-17 | m/z = 561.65 (C39H23N5 = 561.20) |
| 1-18 | m/z = 609.73 (C41H5N3 = 609.22) |
| 1-19 | m/z = 609.73 (C41H25N3 = 609.22) |
| 1-20 | m/z = 610.72 (C44H26N4 = 610.22) |
| 1-21 | m/z = 610.72 (C44H26N4 = 610.22) |
| 1-22 | m/z = 659.79 (C49H29N3 = 659.24) |
| 1-23 | m/z = 659.79 (C49H29N3 = 659.24) |
| 1-24 | m/z = 659.79 (C49H29N3 = 659.24) |
| 1-25 | m/z = 685.83 (C51H31N3 = 685.25) |
| 1-26 | m/z = 685.83 (C51H31N3 = 685.25) |
| 1-27 | m/z = 559.67 (C41H25N3 = 559.20) |
| 1-28 | m/z = 560.66 (C40H24N4 = 560.20) |
| 1-29 | m/z = 560.66 (C40H24N4 = 560.20) |
| 1-30 | m/z = 560.66 (C40H24N4 = 560.20) |
| 1-31 | m/z = 609.73 (C45H27N3 = 609.22) |

TABLE 2-continued

| Compound | FD-MS |
|---|---|
| 1-32 | m/z = 609.73 (C45H27N3 = 609.22) |
| 1-33 | m/z = 610.72 (C44H26N4 = 610.22) |
| 1-34 | m/z = 610.72 (C44H26N4 = 610.22) |
| 1-35 | m/z = 659.79 (C49H29N3 = 659.24) |
| 1-36 | m/z = 659.79 (C49H29N3 = 659.24) |
| 1-37 | m/z = 659.79 (C49H29N3 = 659.24) |
| 1-38 | m/z = 685.83 (C51H31N3 = 685.25) |
| 1-39 | m/z = 709.85 (C53H31N3 = 709.25) |
| 2-1 | m/z = 635.77 (C47H29N3 = 635.23) |
| 2-2 | m/z = 626.75 (C46H28N4 = 636.23) |
| 2-3 | m/z = 636.75 (C46H28N4 = 636.23) |
| 2-4 | m/z = 637.74 (C45H27N5 = 367.22) |
| 2-5 | m/z = 685.83 (C51H31N3 = 685.22) |
| 2-6 | m/z = 685.83 (C51H31N3 = 685.25) |
| 2-7 | m/z = 686.81 (C50H30N4 = 686.24) |
| 2-8 | m/z = 686.81 (C50H30N4 = 686.24) |
| 2-9 | m/z = 735.89 (C55H33N3 = 735.26) |
| 2-10 | m/z = 735.89 (C55H33N3 = 735.26) |
| 2-11 | m/z = 735.89 (C55H33N3 = 735.26) |
| 2-12 | m/z = 761.92 (C57H35N3 = 761.28) |
| 2-13 | m/z = 785.98 (C59H35N3 = 785.28) |
| 2-14 | m/z = 559.67 (C41H25N3 = 559.20) |
| 2-15 | m/z = 560.66 (C40H24N4 = 560.20) |
| 2-16 | m/z = 560.66 (C40H24N4 = 560.20) |
| 2-17 | m/z = 561.65 (C39H23N5 = 561.20) |
| 2-18 | m/z = 609.73 (C41H5N3 = 609.22) |
| 2-19 | m/z = 609.73 (C41H25N3 = 609.22) |
| 2-20 | m/z = 610.72 (C44H26N4 = 610.22) |
| 2-21 | m/z = 610.72 (C44H26N4 = 610.22) |
| 2-22 | m/z = 659.79 (C49H29N3 = 659.24) |
| 2-23 | m/z = 659.79 (C49H29N3 = 659.24) |
| 2-24 | m/z = 659.79 (C49H29N3 = 659.24) |
| 2-25 | m/z = 685.83 (C51H31N3 = 685.25) |
| 2-26 | m/z = 685.83 (C51H31N3 = 685.25) |
| 2-27 | m/z = 559.67 (C41H25N3 = 559.20) |
| 2-28 | m/z = 560.66 (C40H24N4 = 560.20) |
| 2-29 | m/z = 560.66 (C40H24N4 = 560.20) |
| 2-30 | m/z = 560.66 (C40H24N4 = 560.20) |
| 2-31 | m/z = 609.73 (C45H27N3 = 609.22) |

TABLE 2-continued

| Compound | FD-MS |
|---|---|
| 2-32 | m/z = 609.73 (C45H27N3 = 609.22) |
| 2-33 | m/z = 610.72 (C44H26N4 = 610.22) |
| 2-34 | m/z = 610.72 (C44H26N4 = 610.22) |
| 2-35 | m/z = 659.79 (C49H29N3 = 659.24) |
| 2-36 | m/z = 659.79 (C49H29N3 = 659.24) |
| 2-37 | m/z = 659.79 (C49H29N3 = 659.24) |
| 2-38 | m/z = 685.83 (C51H31N3 = 685.25) |
| 2-39 | m/z = 709.85 (C53H31N3 = 709.25) |
| 3-1 | m/z = 685.83 (C51H31N3 = 685.25) |
| 3-2 | m/z = 686.81 (C50H30N4 = 686.24) |
| 3-3 | m/z = 686.81 (C50H30N4 = 686.24) |
| 3-4 | m/z = 687.80 (C49H29N5 = 687.24) |
| 3-5 | m/z = 735.89 (C55H33N3 = 735.26) |
| 3-6 | m/z = 735.89 (C55H33N3 = 735.26) |
| 3-7 | m/z = 736.87 (C54H32N4 = 736.26) |
| 3-8 | m/z = 736.87 (C54H32N4 = 736.26) |
| 3-9 | m/z = 785.95 (C59H35N3 = 785.28) |
| 3-10 | m/z = 785.95 (C59H35N3 = 785.28) |
| 3-11 | m/z = 785.95 (C59H35N3 = 785.28) |
| 3-12 | m/z = 811.98 (C61H37N3 = 811.29) |
| 3-13 | m/z = 836.01 (C63H37N3 = 835.29) |
| 3-14 | m/z = 609.73 (C45H27N3 = 609.22) |
| 3-15 | m/z = 610.72 (C44H26N4 = 610.22) |
| 3-16 | m/z = 610.72 (C44H26N4 = 610.22) |
| 3-17 | m/z = 611.71 (C43H25N5 = 611.21) |
| 3-18 | m/z = 659.79 (C49H29N3 = 659.24) |
| 3-19 | m/z = 659.79 (C49H29N3 = 659.24) |
| 3-20 | m/z = 660.78 (C48H28N4 = 660.23) |
| 3-21 | m/z = 660.78 (C48H28N4 = 660.23) |
| 3-22 | m/z = 709.85 (C53H31N3 = 709.25) |
| 3-23 | m/z = 709.85 (C53H31N3 = 709.25) |
| 3-24 | m/z = 709.85 (C53H31N3 = 709.25) |
| 3-25 | m/z = 735.89 (C55H33N3 = 735.27) |
| 3-26 | m/z = 759.91 (C57H33N3 = 759.27) |
| 3-27 | m/z = 609.73 (C45H27N3 = 609.22) |
| 3-28 | m/z = 610.72 (C44H26N4 = 610.22) |
| 3-29 | m/z = 610.72 (C44H26N4 = 610.22) |
| 3-30 | m/z = 611.71 (C43H25N5 = 611.21) |
| 3-31 | m/z = 659.79 (C49H29N3 = 659.24) |

TABLE 2-continued

| Compound | FD-MS |
|---|---|
| 3-32 | m/z = 659.79 (C49H29N3 = 659.24) |
| 3-33 | m/z = 660.78 (C48H28N4 = 660.23) |
| 3-34 | m/z = 660.78 (C48H28N4 = 660.23) |
| 3-35 | m/z = 709.85 (C53H31N3 = 709.25) |
| 3-36 | m/z = 709.85 (C53H31N3 = 709.25) |
| 3-37 | m/z = 709.85 (C53H31N3 = 709.25) |
| 3-38 | m/z = 735.89 (C55H33N3 = 735.27) |
| 3-39 | m/z = 759.91 (C57H33N3 = 759.27) |
| 4-1 | m/z = 685.83 (C51H31N3 = 685.25) |
| 4-2 | m/z = 686.81 (C50H30N4 = 686.24) |
| 4-3 | m/z = 686.81 (C50H30N4 = 686.24) |
| 4-4 | m/z = 687.80 (C49H29N5 = 687.24) |
| 4-5 | m/z = 735.89 (C55H33N3 = 735.26) |
| 4-6 | m/z = 735.89 (C55H33N3 = 735.26) |
| 4-7 | m/z = 736.87 (C54H32N4 = 736.26) |
| 4-8 | m/z = 736.87 (C54H32N4 = 736.26) |
| 4-9 | m/z = 785.95 (C59H35N3 = 785.28) |
| 4-10 | m/z = 785.95 (C59H35N3 = 785.28) |
| 4-11 | m/z = 785.95 (C59H35N3 = 785.28) |
| 4-12 | m/z = 811.98 (C61H37N3 = 811.29) |
| 4-13 | m/z = 836.01 (C63H37N3 = 835.29) |
| 4-14 | m/z = 609.73 (C45H27N3 = 609.22) |
| 4-15 | m/z = 610.72 (C44H26N4 = 610.22) |
| 4-16 | m/z = 610.72 (C44H26N4 = 610.22) |
| 4-17 | m/z = 611.71 (C43H25N5 = 611.21) |
| 4-18 | m/z = 659.79 (C49H29N3 = 659.24) |
| 4-19 | m/z = 659.79 (C49H29N3 = 659.24) |
| 4-20 | m/z = 660.78 (C48H28N4 = 660.23) |
| 4-21 | m/z = 660.78 (C48H28N4 = 660.23) |
| 4-22 | m/z = 709.85 (C53H31N3 = 709.25) |
| 4-23 | m/z = 709.85 (C53H31N3 = 709.25) |
| 4-24 | m/z = 709.85 (C53H31N3 = 709.25) |
| 4-25 | m/z = 735.89 (C55H33N3 = 735.27) |
| 4-26 | m/z = 759.91 (C57H33N3 = 759.27) |
| 4-27 | m/z = 609.73 (C45H27N3 = 609.22) |
| 4-28 | m/z = 610.72 (C44H26N4 = 610.22) |
| 4-29 | m/z = 610.72 (C44H26N4 = 610.22) |
| 4-30 | m/z = 611.71 (C43H25N5 = 611.21) |
| 4-31 | m/z = 659.79 (C49H29N3 = 659.24) |

TABLE 2-continued

| Compound | FD-MS |
|---|---|
| 4-32 | m/z = 659.79 (C49H29N3 = 659.24) |
| 4-33 | m/z = 660.78 (C48H28N4 = 660.23) |
| 4-34 | m/z = 660.78 (C48H28N4 = 660.23) |
| 4-35 | m/z = 709.85 (C53H31N3 = 709.25) |
| 4-36 | m/z = 709.85 (C53H31N3 = 709.25) |
| 4-37 | m/z = 709.85 (C53H31N3 = 709.25) |
| 4-38 | m/z = 735.89 (C55H33N3 = 735.27) |
| 4-39 | m/z = 759.91 (C57H33N3 = 759.27) |
| 5-1 | m/z = 685.83 (C51H31N3 = 685.25) |
| 5-2 | m/z = 686.81 (C50H30N4 = 686.24) |
| 5-3 | m/z = 686.81 (C50H30N4 = 686.24) |
| 5-4 | m/z = 687.80 (C49H29N5 = 687.24) |
| 5-5 | m/z = 735.89 (C55H33N3 = 737.26) |
| 5-6 | m/z = 735.89 (C55H33m3 = 735.26) |
| 5-7 | m/z = 736.87 (C54H32N4 = 736.26) |
| 5-8 | m/z = 736.87 (C54H32N4 = 736.26) |
| 5-9 | m/z = 785.95 (C59H35N3 = 785.28) |
| 5-10 | m/z = 785.95 (C59H35N3 = 785.28) |
| 5-11 | m/z = 785.95 (C59H35N3 = 785.28) |
| 5-12 | m/z = 811.98 (C61H37N3 = 811.29) |
| 5-13 | m/z = 836.01 (C63H37N3 = 835.29) |
| 5-14 | m/z = 609.73 (C45H27N3 = 609.22) |
| 5-15 | m/z = 610.72 (C44H26N4 = 610.22) |
| 5-16 | m/z = 610.72 (C44H26N4 = 610.22) |
| 5-17 | m/z = 611.71 (C43H25N5 = 611.21) |
| 5-18 | m/z = 659.79 (C49H29N3 = 659.24) |
| 5-19 | m/z = 659.79 (C49H29N3 = 659.24) |
| 5-20 | m/z = 660.78 (C48H28N4 = 660.23) |
| 5-21 | m/z = 660.78 (C48H28N4 = 660.23) |
| 5-22 | m/z = 709.85 (C53H31N3 = 709.25) |
| 5-23 | m/z = 709.85 (C53H31N3 = 709.25) |
| 5-24 | m/z = 709.85 (C53H31N3 = 709.25) |
| 5-25 | m/z = 735.89 (C55H33N3 = 735.27) |
| 5-26 | m/z = 759.91 (C57H33N3 = 759.27) |
| 5-27 | m/z = 609.73 (C45H27N3 = 609.22) |
| 5-28 | m/z = 610.72 (C44H26N4 = 610.22) |
| 5-29 | m/z = 610.72 (C44H26N4 = 610.22) |
| 5-30 | m/z = 611.71 (C43H25N5 = 611.21) |
| 5-31 | m/z = 659.79 (C49H29N3 = 659.24) |

TABLE 2-continued

| Compound | FD-MS |
|---|---|
| 5-32 | m/z = 659.79 (C49H29N3 = 659.24) |
| 5-33 | m/z = 660.78 (C48H28N4 = 660.23) |
| 5-34 | m/z = 660.78 (C48H28N4 = 660.23) |
| 5-35 | m/z = 709.85 (C53H31N3 = 709.25) |
| 5-36 | m/z = 709.85 (C53H31N3 = 709.25) |
| 5-37 | m/z = 709.85 (C53H31N3 = 709.25) |
| 5-38 | m/z = 735.89 (C55H33N3 = 735.27) |
| 5-39 | m/z = 759.91 (C57H33N3 = 759.27) |
| 6-1 | m/z = 685.83 (C51H31N3 = 685.25) |
| 6-2 | m/z = 686.81 (C50H30N4 = 686.24) |
| 6-3 | m/z = 686.81 (C50H3ON4 = 686.24) |
| 6-4 | m/z = 687.80 (C49H29N5 = 687.24) |
| 6-5 | m/z = 735.89 (C55H33N3 = 735.26) |
| 6-6 | m/z = 735.89 (C55H33N3 = 735.26) |
| 6-7 | m/z = 736.87 (C54H32N4 = 736.26) |
| 6-8 | m/z = 736.87 (C54H32N4 = 736.26) |
| 6-9 | m/z = 785.95 (C59H35N3 = 785.28) |
| 6-10 | m/z = 785.95 (C59H35N3 = 785.28) |
| 6-11 | m/z = 785.95 (C59H35N3 = 785.28) |
| 6-12 | m/z = 811.98 (C61H37N3 = 811.29) |
| 6-13 | m/z = 836.01 (C63H37N3 = 835.29) |
| 6-14 | m/z = 609.73 (C45H27N3 = 609.22) |
| 6-15 | m/z = 610.72 (C44H26N4 = 610.22) |
| 6-16 | m/z = 610.72 (C44H26N4 = 610.22) |
| 6-17 | m/z = 611.71 (C43H25N5 = 611.21) |
| 6-18 | m/z = 659.79 (C49H29N3 = 659.24) |
| 6-19 | m/z = 659.79 (C49H29N3 = 659.24) |
| 6-20 | m/z = 660.78 (C48H28N4 = 660.23) |
| 6-21 | m/z = 660.78 (C48H28N4 = 660.23) |
| 6-22 | m/z = 709.85 (C53H31N3 = 709.25) |
| 6-23 | m/z = 709.85 (C53H31N3 = 709.25) |
| 6-24 | m/z = 709.85 (C53H31N3 = 709.25) |
| 6-25 | m/z = 735.89 (C55H33N3 = 735.27) |
| 6-26 | m/z = 759.91 (C57H33N3 = 759.27) |
| 6-27 | m/z = 609.73 (C45H27N3 = 609.22) |
| 6-28 | m/z = 610.72 (C44H26N4 = 610.22) |
| 6-29 | m/z = 610.72 (C44H26N4 = 610.22) |
| 6-30 | m/z = 611.71 (C43H25N5 = 611.21) |
| 6-31 | m/z = 659.79 (C49H29N3 = 659.24) |

TABLE 2-continued

| Compound | FD-MS |
|---|---|
| 6-32 | m/z = 659.79 (C49H29N3 = 659.24) |
| 6-33 | m/z = 660.78 (C48H28N4 = 660.23) |
| 6-34 | m/z = 660.78 (C48H28N4 = 660.23) |
| 6-35 | m/z = 709.85 (C53H31N3 = 709.25) |
| 6-36 | m/z = 709.85 (C53H31N3 = 709.25) |
| 6-37 | m/z = 709.85 (C53H31N3 = 709.25) |
| 6-38 | m/z = 735.89 (C55H33N3 = 735.27) |
| 6-39 | m/z = 759.91 (C57H33N3 = 759.27) |
| 7-1 | m/z = 691.85 (C49H29N3S = 691.20) |
| 7-2 | m/z = 692.84 (C48H28N4S = 692.20) |
| 7-3 | m/z = 692.84 (C48H28N4S = 692.20) |
| 7-4 | m/z = 693.82 (C47H27N5S = 693.19) |
| 7-5 | m/z = 741.91 (C53H31N3S = 741.22) |
| 7-6 | m/z = 741.91 (C53H31N3S = 741.22) |
| 7-7 | m/z = 742.90 (C52H30N4S = 742.21) |
| 7-8 | m/z = 742.90 (C52H30N4S = 742.21) |
| 7-9 | m/z = 791.97 (C57H33N3S = 791.24) |
| 7-10 | m/z = 791.97 (C57H33N3S = 791.24) |
| 7-11 | m/z = 791.97 (C57H33N3S = 791.24) |
| 7-12 | m/z = 818.01 (C59H35N3S = 817.25) |
| 7-13 | m/z = 842.03 (C61H35N3S = 841.25) |
| 7-14 | m/z = 615.75 (C43H25N3S = 615.18) |
| 7-15 | m/z = 616.74 (C42H24N4S = 616.17) |
| 7-16 | m/z = 616.74 (C42H24N4S = 616.17) |
| 7-17 | m/z = 617.73 (C41H23N5S = 617.17) |
| 7-18 | m/z = 665.81 (C47H27N3S = 665.19) |
| 7-19 | m/z = 665.81 (C47H27N3S = 665.19) |
| 7-20 | m/z = 666.80 (C46H26N4S = 666.19) |
| 7-21 | m/z = 666.80 (C46H26N4S = 666.19) |
| 7-22 | m/z = 715.87 (C51H29N3S = 715.21) |
| 7-23 | m/z = 715.87 (C51H29N3S = 715.21) |
| 7-24 | m/z = 715.87 (C51H29N3S = 715.21) |
| 7-25 | m/z = 741.91 (C53H31N3S = 741.22) |
| 7-26 | m/z = 765.93 (C55H31N3S = 765.22) |
| 7-27 | m/z = 615.75 (C43H25N3S = 615.18) |
| 7-28 | m/z = 616.74 (C42H24N4S = 616.17) |
| 7-29 | m/z = 616.74 (C42H24N4S = 616.17) |
| 7-30 | m/z = 617.73 (C41H23N5S = 617.17) |
| 7-31 | m/z = 665.81 (C47H27N3S = 665.19) |

TABLE 2-continued

| Compound | FD-MS |
|---|---|
| 7-32 | m/z = 665.81 (C47H27N3S = 665.19) |
| 7-33 | m/z = 666.80 (C46H26N4S = 666.19) |
| 7-34 | m/z = 666.80 (C46H26N4S = 666.19) |
| 7-35 | m/z = 715.87 (C51H29N3S = 715.21) |
| 7-36 | m/z = 715.87 (C51H29N3S = 715.21) |
| 7-37 | m/z = 715.87 (C51H29N3S = 715.21) |
| 7-38 | m/z = 741.91 (C53H31N3S = 741.22) |
| 7-39 | m/z = 765.93 (C55H31N3S = 765.22) |
| 8-1 | m/z = 691.85 (C49H29N3S = 691.20) |
| 8-2 | m/z = 692.84 (C48H28N4S = 692.20) |
| 8-3 | m/z = 692.84 (C48H28N4S = 692.20) |
| 8-4 | m/z = 693.82 (C47H27N5S = 693.19) |
| 8-5 | m/z = 741.91 (C53H31N3S = 741.22) |
| 8-6 | m/z = 741.91 (C53H31N3S = 741.22) |
| 8-7 | m/z = 742.90 (C52H30N4S = 742.21) |
| 8-8 | m/z = 742.90 (C52H30N4S = 742.21) |
| 8-9 | m/z = 791.97 (C57H33N3S = 791.24) |
| 8-10 | m/z = 791.97 (C57H33N3S = 791.24) |
| 8-11 | m/z = 791.97 (C57H33N3S = 791.24) |
| 8-12 | m/z = 818.01 (C59H35N3S = 817.25) |
| 8-13 | m/z = 842.03 (C61H35N3S = 841.25) |
| 8-14 | m/z = 615.75 (C43H25N3S = 615.18) |
| 8-15 | m/z = 616.74 (C42H24N4S = 616.17) |
| 8-16 | m/z = 616.74 (C42H24N4S = 616.17) |
| 8-17 | m/z = 617.73 (C41H23N5S = 617.17) |
| 8-18 | m/z = 665.81 (C47H27N3S = 665.19) |
| 8-19 | m/z = 665.81 (C47H27N3S = 665.19) |
| 8-20 | m/z = 666.80 (C46H26N4S = 666.19) |
| 8-21 | m/z = 666.80 (C46H26N4S = 666.19) |
| 8-22 | m/z = 715.87 (C51H29N3S = 715.21) |
| 8-23 | m/z = 715.87 (C51H29N3S = 715.21) |
| 8-24 | m/z = 715.87 (C51H29N3S = 715.21) |
| 8-25 | m/z = 741.91 (C53H31N3S = 741.22) |
| 8-26 | m/z = 765.93 (C55H31N3S = 765.22) |
| 8-27 | m/z = 615.75 (C43H25N3S = 615.18) |
| 8-28 | m/z = 616.74 (C42H24N4S = 616.17) |
| 8-29 | m/z = 616.74 (C42H24N4S = 616.17) |
| 8-30 | m/z = 617.73 (C41H23N5S = 617.17) |
| 8-31 | m/z = 665.81 (C47H27N3S = 665.19) |

TABLE 2-continued

| Compound | FD-MS |
|---|---|
| 8-32 | m/z = 665.81 (C47H27N3S = 665.19) |
| 8-33 | m/z = 666.80 (C46H26N4S = 666.19) |
| 8-34 | m/z = 666.80 (C46H26N4S = 666.19) |
| 8-35 | m/z = 715.87 (C51H29N3S = 715.21) |
| 8-36 | m/z = 715.87 (C51H29N3S = 715.21) |
| 8-37 | m/z = 715.87 (C51H29N3S = 715.21) |
| 8-38 | m/z = 741.91 (C53H31N3S = 741.22) |
| 8-39 | m/z = 765.93 (C55H31N3S = 765.22) |
| 9-1 | m/z = 675.79 (C49H29N30 = 675.23) |
| 9-2 | m/z = 676.77 (C48H28N40 = 676.22) |
| 9-3 | m/z = 676.77 (C48H28N40 = 676.22) |
| 9-4 | m/z = 677.76 (C47H27N50 = 677.22) |
| 9-5 | m/z = 725.85 (C53H31N30 = 725.24) |
| 9-6 | m/z = 725.85 (C53H31N30 = 725.24) |
| 9-7 | m/z = 726.83 (C52H30N40 = 726.24) |
| 9-8 | m/z = 726.83 (C52H30N40 = 726.24) |
| 9-9 | m/z = 775.91 (C57H33N30 = 775.26) |
| 9-10 | m/z = 775.91 (C57H33N30 = 775.26) |
| 9-11 | m/z = 775.91 (C57H33N30 = 775.26) |
| 9-12 | m/z = 801.94 (C59H35H30 = 801.27) |
| 9-13 | m/z = 825.97 (C61H35N30 = 825.27) |
| 9-14 | m/z = 599.69 (C43H25N30 = 599.20) |
| 9-15 | m/z = 600.68 (C42H24N40 = 600.20) |
| 9-16 | m/z = 600.68 (C42H24N40 = 600.20) |
| 9-17 | m/z = 601.67 (C41H23N50 = 601.19) |
| 9-18 | m/z = 649.75 (C47H27N30 = 649.22) |
| 9-19 | m/z = 649.75 (C47H27N30 = 649.22) |
| 9-20 | m/z = 650.74 (C46H26N40 = 650.21) |
| 99-21 | m/z = 650.74 (C46H26N40 = 650.21) |
| 9-22 | m/z = 699.81 (C51H29N30 = 699.23) |
| 9-23 | m/z = 699.81 (C51H29N30 = 699.23) |
| 9-24 | m/z = 699.81 (C51H29N30 = 699.23) |
| 9-25 | m/z = 725.85 (C53H31N30 = 725.25) |
| 9-26 | m/z = 749.87 (C55H31N30 = 749.25) |
| 9-27 | m/z = 599.69 (C43H25N30 = 599.20) |
| 9-28 | m/z = 600.68 (C42H24N40 = 600.20) |
| 9-29 | m/z = 600.68 (C42H24N40 = 600.20) |
| 9-30 | m/z = 601.67 (C41H23N50 = 601.19) |
| 9-31 | m/z = 649.75 (C47H27N30 = 649.22) |

TABLE 2-continued

| Compound | FD-MS |
|---|---|
| 9-32 | m/z = 649.75 (C47H27N3O = 649.22) |
| 9-33 | m/z = 650.74 (C46H26N4O = 650.21) |
| 9-34 | m/z = 650.74 (C46H26N4O = 650.21) |
| 9-35 | m/z = 699.81 (C51H29N3O = 699.23) |
| 9-36 | m/z = 699.81 (C51H29N3O = 699.23) |
| 9-37 | m/z = 699.81 (C51H29N3O = 699.23) |
| 9-38 | m/z = 725.85 (C53H31N3O = 725.25) |
| 9-39 | m/z = 749.87 (C55H31N3O = 749.25) |
| 10-1 | m/z = 675.79 (C49H29N3O = 675.23) |
| 10-2 | m/z = 676.77 (C48H28N4O = 676.22) |
| 10-3 | m/z = 676.77 (C48H28N4O = 676.22) |
| 10-4 | m/z = 677.76 (C47H27N5O = 677.22) |
| 10-5 | m/z = 725.85 (C53H31N3O = 725.24) |
| 10-6 | m/z = 725.85 (C53H31N3O = 725.24) |
| 10-7 | m/z = 726.83 (C52H30N4O = 726.24) |
| 10-8 | m/z = 726.83 (C52H30N4O = 726.24) |
| 10-9 | m/z = 775.91 (C57H33N3O = 775.26) |
| 10-10 | m/z = 775.91 (C57H33N3O = 775.26) |
| 10-11 | m/z = 775.91 (C57H33N3O = 775.26) |
| 10-12 | m/z = 801.94 (C59H35N3O = 801.27) |
| 10-13 | m/z = 825.97 (C61H35N3O = 825.27) |
| 10-14 | m/z = 599.69 (C43H25N3O = 599.20) |
| 10-15 | m/z = 600.68 (C42H24N4O = 600.20) |
| 10-16 | m/z = 600.68 (C42H24N4O = 600.20) |
| 10-17 | m/z = 601.67 (C41H23N5O = 601.19) |
| 10-18 | m/z = 649.75 (C47H27N3O = 649.22) |
| 10-19 | m/z = 649.75 (C47H27N3O = 649.22) |
| 10-20 | m/z = 650.74 (C46H26N4O = 650.21) |
| 10-21 | m/z = 650.74 (C46H26N4O = 650.21) |
| 10-22 | m/z = 699.81 (C51H29N3O = 699.23) |
| 10-23 | m/z = 699.81 (C51H29N3O = 699.23) |
| 10-24 | m/z = 699.81 (C51H29N3O = 699.23) |
| 10-25 | m/z = 725.85 (C53H31N3O = 725.25) |
| 10-26 | m/z = 749.87 (C55H31N3O = 749.25) |
| 10-27 | m/z = 599.69 (C43H25N3O = 599.20) |
| 10-28 | m/z = 600.68 (C42H24N4O = 600.20) |
| 10-29 | m/z = 600.68 (C42H24N4O = 600.20) |
| 10-30 | m/z = 601.67 (C41H23N5O = 601.19) |
| 10-31 | m/z = 649.75 (C47H27N3O = 649.22) |

TABLE 2-continued

| Compound | FD-MS |
|---|---|
| 10-32 | m/z = 649.75 (C47H27N3O = 649.22) |
| 10-33 | m/z = 650.74 (C46H26N4O = 650.21) |
| 10-34 | m/z = 650.74 (C46H26N4O = 650.21) |
| 10-35 | m/z = 699.81 (C51H29N3O = 699.23) |
| 10-36 | m/z = 699.81 (C51H29N3O = 699.23) |
| 10-37 | m/z = 699.81 (C51H29N3O = 699.23) |
| 10-38 | m/z = 725.85 (C53H31N3O = 725.25) |
| 10-39 | m/z = 749.87 (C55H31N3O = 749.25) |
| 11-1 | m/z = 826.01 (C62H38N3 = 825.31) |
| 11-2 | m/z = 827.00 (C61H38N4 = 826.31) |
| 11-3 | m/z = 827.00 (C61H38N4 = 826.31) |
| 11-4 | m/z = 827.99 (C60H37N5 = 827.30) |
| 11-5 | m/z = 876.07 (C66H41N3 = 875.33) |
| 11-6 | m/z = 876.07 (C66H41N3 = 875.33) |
| 11-7 | m/z = 877.06 (C65H40N4 = 876.32) |
| 11-8 | m/z = 877.06 (C65H40N4 = 876.32) |
| 11-9 | m/z = 926.13 (C70H43N3 = 925.34) |
| 11-10 | m/z = 926.13 (C70N43N3 = 925.34) |
| 11-11 | m/z = 926.13 (C70H43N3 = 925.34) |
| 11-12 | m/z = 952.17 (C72H45N3 = 951.36) |
| 11-13 | m/z = 976.19 (C74H45N3 = 975.36) |
| 11-14 | m/z = 749.92 (C56H35N3 = 749.28) |
| 11-15 | m/z = 750.90 (C55H34N3 = 750.28) |
| 11-16 | m/z = 750.90 (C55H34N3 = 750.28) |
| 11-17 | m/z = 751.89 (C54H33N5 = 751.27) |
| 11-18 | m/z = 799.98 (C60H37N3 = 799.30) |
| 11-19 | m/z = 799.98 (C60H37N3 = 799.30) |
| 11-20 | m/z = 800.97 (C59H36N4 = 800.29) |
| 11-21 | m/z = 800.97 (C59H36N4 = 800.29) |
| 11-22 | m/z = 850.04 (C64H39N3 = 849.31) |
| 11-23 | m/z = 850.04 (C64H39N3 = 849.31) |
| 11-24 | m/z = 850.04 (C64H39N3 = 849.31) |
| 11-25 | m/z = 876.07 (C66H41N3 = 875.33) |
| 11-26 | m/z = 900.10 (C68H41N3 = 899.33) |
| 11-27 | m/z = 749.92 (C56H35N3 = 749.28) |
| 11-28 | m/z = 750.90 (C55H34N3 = 750.28) |
| 11-29 | m/z = 750.90 (C55H34N3 = 750.28) |
| 11-30 | m/z = 751.89 (C54H33N5 = 751.27) |
| 11-31 | m/z = 799.98 (C60H37N3 = 799.30) |

TABLE 2-continued

| Compound | FD-MS |
|---|---|
| 11-32 | m/z = 799.98 (C60H37N3 = 799.30) |
| 11-33 | m/z = 800.97 (C59H36N4 = 800.29) |
| 11-34 | m/z-800.97 (C59H36N4 = 800.29) |
| 11-35 | m/z = 850.04 (C64H39N3 = 849.31) |
| 11-36 | m/z = 850.04 (C64H39N3 = 849.31) |
| 11-37 | m/z = 850.04 (C64H39N3 = 849.31) |
| 11-38 | m/z = 876.07 (C66H41N3 = 875.33) |
| 11-39 | m/z = 900.10 (C68H41N3 = 899.33) |
| 12-1 | m/z = 826.01 (C62H39N3 = 825.31) |
| 12-2 | m/z = 827.00 (C61H38N4 = 826.31) |
| 12-3 | m/z = 827.00 (C61H38N4 = 826.31) |
| 12-4 | m/z = 827.99 (C60H37N5 = 827.30) |
| 12-5 | m/z = 876.07 (C66H41N3 = 875.33) |
| 12-6 | m/z = 876.07 (C66H41N3 = 875.33) |
| 12-7 | m/z = 877.06 (C65H40N4 = 876.32) |
| 12-8 | m/z = 877.06 (C65H40N4 = 876.32) |
| 12-9 | m/z = 926.13 (C70H43N3 = 925.34) |
| 12-10 | m/z = 926.13 (C70H43N3 = 925.34) |
| 12-11 | m/z = 926.13 (C70H43N3 = 925.34) |
| 12-12 | m/z = 952.17 (C72H45N3 = 951.36) |
| 12-13 | m/z = 976.19 (C74H45N3 = 975.36) |
| 12-14 | m/z = 749.92 (C56H35N3 = 749.28) |
| 12-15 | m/z = 750.90 (C55H34N3 = 750.28) |
| 12-16 | m/z = 750.90 (C55H34N3 = 750.28) |
| 12-17 | m/z = 751.89 (C54H33N5 = 751.27) |
| 12-18 | m/z = 799.98 (C60H37N3 = 799.30) |
| 12-19 | m/z = 799.98 (C60H37N3 = 799.30) |
| 12-20 | m/z = 800.97 (C59H36N4 = 800.29) |
| 12-21 | m/z = 800.97 (C59H36N4 = 800.29) |
| 12-22 | m/z = 850.04 (C64H39N3 = 849.31) |
| 12-23 | m/z = 850.04 (C64H39N3 = 849.31) |
| 12-24 | m/z = 850.04 (C64H39N3 = 849.31) |
| 12-25 | m/z = 876.07 (C66H41N3 = 875.33) |
| 12-26 | m/z = 900.10 (C68H41N3 = 899.33) |
| 12-27 | m/z = 749.92 (C56H35N3 = 749.28) |
| 12-28 | m/z = 750.90 (C55H34N3 = 750.28) |
| 12-29 | m/z = 750.90 (C55H34N3 = 750.28) |
| 12-30 | m/z = 751.89 (C54H33N5 = 751.27) |
| 12-31 | m/z = 799.98 (C60H37N3 = 799.30) |

TABLE 2-continued

| Compound | FD-MS |
|---|---|
| 12-32 | m/z = 799.98 (C60H37N3 = 799.30) |
| 12-33 | m/z = 800.97 (C59H36N4 = 800.29) |
| 12-34 | m/z = 800.97 (C59H36N4 = 800.29) |
| 12-35 | m/z = 850.04 (C64H39N3 = 849.31) |
| 12-36 | m/z = 850.04 (C64H39N3 = 849.31) |
| 12-37 | m/z = 850.04 (C64H39N3 = 849.31) |
| 12-38 | m/z = 876.07 (C66H41N3 = 875.33) |
| 12-39 | m/z = 900.10 (C68H41N3 = 899.33) |
| 13-1 | m/z = 559.67 (C41H25N3 = 599.20) |
| 13-2 | m/z = 559.67 (C41H25N3 = 559.20) |
| 13-3 | m/z = 609.73 (C45H27N3 = 609.22) |
| 13-4 | m/z = 609.73 (C45H27N3 = 609.22) |
| 13-5 | m/z = 609.73 (C45H27N3 = 609.22) |
| 13-6 | m/z = 609.73 (C45H27N3 = 609.22) |
| 13-7 | m/z = 659.79 (C49H29N3 = 659.23) |
| 13-8 | m/z = 659.79 (C49H29N3 = 659.23) |
| 13-9 | m/z = 609.73 (C45H27N3 = 609.22) |
| 13-10 | m/z = 609.73 (C45H27N3 = 609.22) |
| 13-11 | m/z = 659.79 (C49H29N3 = 659.23) |
| 13-12 | m/z = 659.79 (C49H29N3 = 659.23) |
| 13-13 | m/z = 614.75 (C43H25N3S = 614.17) |
| 13-14 | m/z = 615.75 (C43H25N3S = 615.17) |
| 13-15 | m/z = 665.81 (C47H27N3S = 665.19) |
| 13-16 | m/z = 665.81 (C47H27N3S = 665.19) |
| 13-17 | m/z = 599.69 (C43H25N3) = 599.20) |
| 13-18 | m/z = 599.69 (C43H25N3) = 599.20) |
| 13-19 | m/z = 649.75 (C47H27N30 = 649.21) |
| 13-20 | m/z = 649.75 (C47H27N30 = 649.21) |
| 13-21 | m/z = 749.91 (C56H35N3 = 749.28) |
| 13-22 | m/z = 749.91 (C56H35N3 = 749.28) |
| 13-23 | m/z = 799.97 (C60H37N3 = 799.29) |
| 13-24 | m/z = 799.97 (C60H37N3 = 799.29) |

EXPERIMENTAL EXAMPLE

Experimental Example 1

1) Manufacture of Organic Light Emitting Device

A glass substrate on which ITO was coated as a thin film to a thickness of 1500 Å was cleaned with distilled water ultrasonic waves. After the cleaning with distilled water was finished, the substrate was ultrasonic cleaned with solvents such as acetone, methanol and isopropyl alcohol, then dried, and UVO treatment was carried out for 5 minutes in a UV cleaner using UV. After that, the substrate was transferred to a plasma cleaner (PT), and plasma treatment was carried out under vacuum for ITO work function and remaining film removal, and the substrate was transferred to a thermal deposition apparatus for organic deposition.

On the transparent ITO electrode (anode), organic materials were formed in a two-stack white organic light emitting device (WOLED) structure. As for the first stack, a hole transfer layer was formed first by thermal vacuum depositing TAPC to a thickness of 300 Å. After forming the hole transfer layer, a light emitting layer was thermal vacuum deposited thereon as follows. The light emitting layer was deposited to 300 Å by doping FIrpic in 8% as a blue phosphorescent dopant to TCzl, a host. An electron transfer layer was formed to 400 Å using TmPyPB, and then a charge generation layer was formed to 100 Å by doping $Cs_2CO_3$ in 20% to a compound described in the following Table 3.

As for the second stack, a hole injection layer was formed first by thermal vacuum depositing $MoO_3$ to a thickness of 50 Å. A hole transfer layer, a common layer, was formed by doping $MoO_3$ to TAPC in 20% and forming to 100 Å, and then depositing TAPC to 300 Å. After depositing a light emitting layer to 300 Å thereon by doping $Ir(ppy)_3$, a green phosphorescent dopant, in 8% to TCzl, a host, an electron transfer layer was formed to 600 Å using TmPyPB. Lastly, an electron injection layer was formed on the electron transfer layer by depositing lithium fluoride (LiF) to a thickness of 10 Å, and then a cathode was formed on the electron injection layer by depositing an aluminum (Al) cathode to a thickness of 1,200 Å to manufacture an organic light emitting device.

Meanwhile, all the organic compounds required to manufacture the OLED device were vacuum sublimation purified under $10^{-6}$ torr to $10^{-8}$ torr by each material to be used in the OLED manufacture.

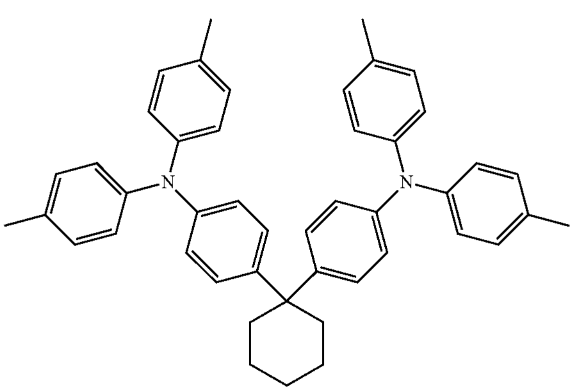

TAPC

-continued

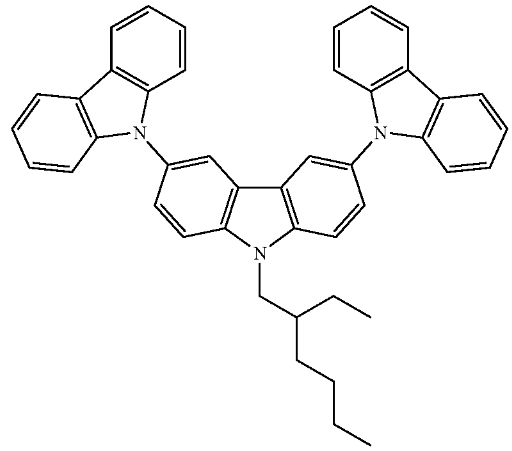

TCz1

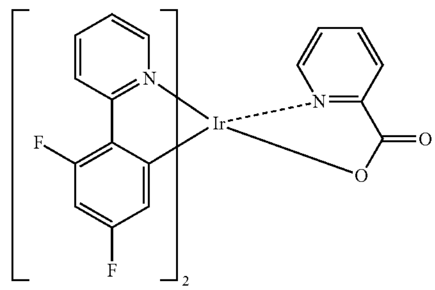

FIrpic

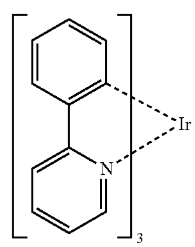

Ir(ppy)3

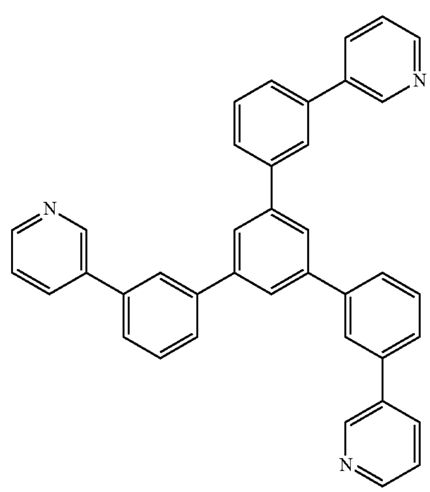

TmPyPB

-continued

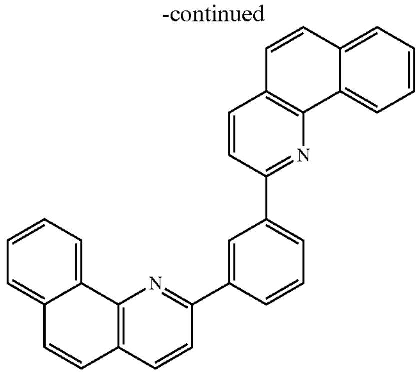

BBQB

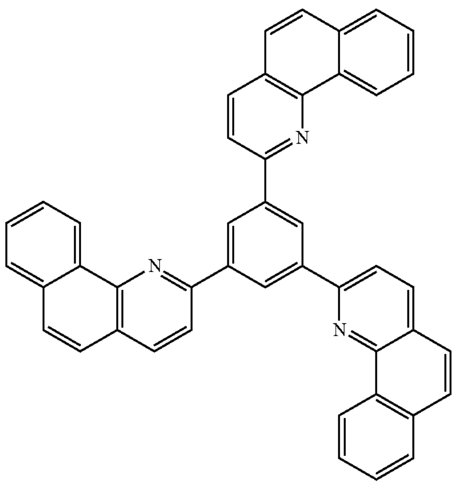

TBQB

2) Driving Voltage and Light Emission Efficiency of Organic Light Emitting Device For the organic light emitting devices manufactured as above, electroluminescent light emission (EL) characteristics were measured using M7000 manufactured by McScience Inc., and with the measurement results, $T_{95}$ when standard luminance was 3,500 cd/m$^2$ was measured using a lifetime test system (M6000) manufactured by McScience Inc. Results of measuring a driving voltage, light emission efficiency, external quantum efficiency and a color coordinate (CIE) of the white organic light emitting devices manufactured according to the present disclosure are as shown in Table 3.

TABLE 3

| | Compound | Driving Voltage (V) | Light Emission Efficiency (cd/A) | CIE (x, y) | Lifetime (T95) |
|---|---|---|---|---|---|
| Example 1 | 1-1 | 7.13 | 69.21 | (0.221, 0.439) | 40 |
| Example 2 | 1-6 | 6.23 | 66.12 | (0.221, 0.428) | 44 |
| Example 3 | 1-14 | 7.55 | 60.25 | (0.225, 0.430) | 30 |
| Example 4 | 1-26 | 7.69 | 61.33 | (0.230, 0.429) | 35 |
| Example 5 | 1-27 | 7.75 | 64.59 | (0.226, 0.429) | 34 |
| Example 6 | 2-1 | 7.57 | 63.70 | (0.222, 0.428) | 29 |
| Example 7 | 2-14 | 7.81 | 61.28 | (0.227, 0.427) | 30 |
| Example 8 | 2-27 | 7.63 | 65.21 | (0.222, 0.431) | 31 |
| Example 9 | 3-1 | 7.33 | 60.00 | (0.225, 0.426) | 33 |
| Example 10 | 3-10 | 7.62 | 71.05 | (0.224, 0.424) | 45 |
| Example 11 | 3-14 | 7.82 | 61.15 | (0.221, 0.425) | 38 |
| Example 12 | 3-27 | 7.74 | 60.32 | (0.220, 0.429) | 36 |
| Example 13 | 4-1 | 7.11 | 70.03 | (0.223, 0.428) | 40 |
| Example 14 | 4-5 | 6.92 | 69.81 | (0.225, 0.428) | 39 |
| Example 15 | 4-17 | 8.23 | 59.90 | (0.224, 0.427) | 29 |
| Example 16 | 4-27 | 7.50 | 61.15 | (0.224, 0.426) | 33 |
| Example 17 | 5-1 | 7.76 | 64.32 | (0.226, 0.423) | 35 |
| Example 18 | 5-7 | 8.01 | 59.05 | (0.224, 0.431) | 28 |
| Example 19 | 5-21 | 7.99 | 60.01 | (0.222, 0.430) | 27 |
| Example 20 | 5-38 | 7.36 | 63.51 | (0.221, 0.431) | 35 |
| Example 21 | 6-1 | 7.87 | 61.21 | (0.224, 0.428) | 36 |
| Example 22 | 6-5 | 7.88 | 64.73 | (0.223, 0.427) | 33 |
| Example 23 | 6-10 | 7.22 | 73.57 | (0.222, 0.426) | 40 |
| Example 24 | 6-14 | 7.43 | 77.06 | (0.222, 0.425) | 44 |
| Example 25 | 6-38 | 7.69 | 63.32 | (0.221, 0.424) | 36 |
| Example 26 | 7-1 | 7.72 | 64.53 | (0.220, 0.428) | 37 |
| Example 27 | 7-5 | 7.60 | 76.55 | (0.219, 0.424) | 41 |
| Example 28 | 7-17 | 8.11 | 60.09 | (0.218, 0.425) | 30 |
| Example 29 | 7-34 | 7.53 | 64.13 | (0.219, 0.423) | 33 |
| Example 30 | 7-39 | 7.77 | 62.11 | (0.220, 0.430) | 36 |
| Example 31 | 8-1 | 7.93 | 60.95 | (0.225, 0.431) | 37 |
| Example 32 | 8-5 | 7.61 | 64.37 | (0.226, 0.433) | 30 |
| Example 33 | 8-6 | 7.84 | 58.09 | (0.227, 0.420) | 31 |
| Example 34 | 8-19 | 8.40 | 59.32 | (0.226 0.429) | 30 |
| Example 35 | 8-39 | 6.88 | 70.05 | (0.223, 0.428) | 44 |
| Example 36 | 9-1 | 7.33 | 68.37 | (0.221, 0.427) | 35 |
| Example 37 | 9-5 | 7.89 | 69.54 | (0.221, 0.426) | 46 |
| Example 38 | 9-14 | 8.42 | 61.37 | (0.223, 0.428) | 27 |
| Example 39 | 9-18 | 8.33 | 60.00 | (0.221, 0.427) | 28 |
| Example 40 | 10-1 | 8.00 | 64.16 | (0.220, 0.428) | 31 |
| Example 41 | 10-5 | 7.77 | 69.13 | (0.223, 0.428) | 49 |
| Example 42 | 10-14 | 8.13 | 59.06 | (0.225, 0.427) | 30 |
| Example 43 | 10-18 | 8.23 | 62.79 | (0.227, 0.428) | 28 |
| Example 44 | 11-1 | 7.89 | 66.56 | (0.226, 0.429) | 37 |

TABLE 3-continued

| | Compound | Driving Voltage (V) | Light Emission Efficiency (cd/A) | CIE (x, y) | Lifetime (T95) |
|---|---|---|---|---|---|
| Example 45 | 11-5 | 7.67 | 67.13 | (0.223, 0.430) | 36 |
| Example 46 | 11-10 | 7.92 | 64.32 | (0.225, 0.431) | 33 |
| Example 47 | 11-14 | 7.99 | 58.00 | (0.222, 0.433) | 24 |
| Example 48 | 11-27 | 8.00 | 59.03 | (0.222, 0.428) | 28 |
| Example 49 | 12-1 | 8.13 | 60.51 | (0.219, 0.428) | 29 |
| Example 50 | 12-5 | 7.01 | 78.11 | (0.218, 0.429) | 44 |
| Example 51 | 12-10 | 7.77 | 68.11 | (0.221, 0.428) | 31 |
| Example 52 | 12-14 | 8.22 | 58.77 | (0.223, 0.430) | 24 |
| Example 53 | 12-27 | 8.31 | 59.15 | (0.223, 0.431) | 27 |
| Example 54 | 13-1 | 7.55 | 63.40 | (0.222, 0.428) | 58 |
| Example 55 | 13-2 | 7.82 | 61.18 | (0.227, 0.427) | 54 |
| Example 56 | 13-3 | 7.88 | 65.21 | (0.222, 0.430) | 55 |
| Example 57 | 13-4 | 7.89 | 65.11 | (0.225, 0.430) | 57 |
| Example 58 | 13-5 | 7.66 | 71.05 | (0.224, 0.424) | 66 |
| Example 59 | 13-6 | 7.60 | 70.16 | (0.220, 0.428) | 67 |
| Example 60 | 13-7 | 7.81 | 69.37 | (0.223, 0.428) | 61 |
| Example 61 | 13-8 | 7.88 | 68.70 | (0.222, 0.428) | 62 |
| Example 62 | 13-9 | 7.81 | 65.28 | (0.227, 0.427) | 57 |
| Example 63 | 13-10 | 7.80 | 65.21 | (0.227, 0.426) | 58 |
| Example 64 | 13-11 | 7.68 | 65.00 | (0.227, 0.426) | 56 |
| Example 65 | 13-12 | 7.62 | 65.05 | (0.227, 0.426) | 57 |
| Example 66 | 13-13 | 7.21 | 72.38 | (0.223, 0.428) | 62 |
| Example 67 | 13-14 | 7.22 | 71.37 | (0.223, 0.428) | 63 |
| Example 68 | 13-15 | 7.34 | 70.22 | (0.222, 0.427) | 63 |
| Example 69 | 13-16 | 7.33 | 70.20 | (0.223, 0.428) | 63 |
| Example 70 | 13-17 | 7.33 | 67.21 | (0.221, 0.427) | 65 |
| Example 71 | 13-18 | 7.32 | 71.25 | (0.220, 0.428) | 66 |
| Example 72 | 13-19 | 7.41 | 72.14 | (0.220, 0.428) | 67 |
| Example 73 | 13-20 | 7.40 | 66.55 | (0.221, 0.427) | 61 |
| Example 74 | 13-21 | 8.00 | 64.16 | (0.223, 0.428) | 51 |
| Example 75 | 13-22 | 8.11 | 64.37 | (0.223, 0.428) | 52 |
| Example 76 | 13-23 | 8.21 | 63.31 | (0.223, 0.427) | 58 |
| Example 77 | 13-24 | 8.20 | 63.11 | (0.223, 0.428) | 58 |
| Comparative Example 1-1 | TmPyP 1B | 8.57 | 54.61 | (0.212, 0.433) | 40 |
| Comparative Example 1-2 | BBQB | 8.43 | 54.11 | (0.220, 0.429) | 46 |
| Comparative Example 1-3 | TBQB | 8.47 | 54.90 | (0.222, 0.430) | 48 |

As shown from the results of Table 3, the organic light emitting devices using the charge generation layer material of the 2-stack white organic light emitting device of the present disclosure had a low driving voltage and improved light emission efficiency compared to Comparative Examples 1. Particularly, it was identified that Compounds 1-1, 1-6, 1-26, 3-10, 4-1, 4-5, 6-10, 6-14, 7-5, 8-39, 9-5, 10-5, 12-5, 13-2, 13-5, 13-13, 13-18, 13-19 were significantly excellent in all of driving, efficiency and lifetime.

The presumed reason for such results is that the compound of the present disclosure used as an N-type charge generation layer formed with an invented skeleton having proper length, strength and flat property and a proper hetero-compound capable of binding with metals is doped with an alkali metal or an alkali-earth metal to form a gap state within the N-type charge generation layer, and electrons produced from a P-type charge generation layer are readily injected to the electron transfer layer through the gap state produced within the N-type charge generation layer. Accordingly, the P-type charge generation layer favorably carried out electron injection and electron transfer to the N-type charge generation layer, and as a result, it is considered that a driving voltage of the organic light emitting device decreased, and efficiency and lifetime were improved.

Experimental Example 2

1) Manufacture of Organic Light Emitting Device

A glass substrate on which ITO was coated as a thin film to a thickness of 1500 Å was cleaned with distilled water ultrasonic waves. After the cleaning with distilled water was finished, the substrate was ultrasonic cleaned with solvents such as acetone, methanol and isopropyl alcohol, then dried, and UVO treatment was carried out for 5 minutes in a UV cleaner using UV. After that, the substrate was transferred to a plasma cleaner (PT), and plasma treatment was carried out under vacuum for ITO work function and remaining film removal, and the substrate was transferred to a thermal deposition apparatus for organic deposition. On the ITO transparent electrode (anode), organic materials were formed in a single-stack structure. As a hole injection layer, HAT-CN was deposited to a thickness of 50 Å, and subsequently, a hole transfer layer was formed by doping DNTPD within 10% to NPD, depositing the result to a thickness of 1500 Å, and continuously depositing TCTA to a thickness of 200 Å. Subsequently, a light emitting layer comprising a t-Bu-perylene dopant in an ADN host was formed to a thickness of 250 Å. Next, $Alq_3$, an electron transfer layer, was formed to a thickness of 250 Å, and an N-type charge transfer layer was formed to a thickness of 100 Å by doping Li, an alkali metal, to a compound described in the following Table 4, and Al, a cathode, was formed to a thickness of approximately 1,000 Å to manufacture an organic light emitting device.

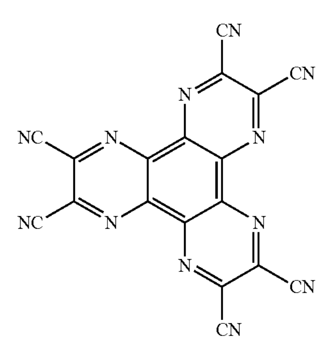

HAT-CN

-continued
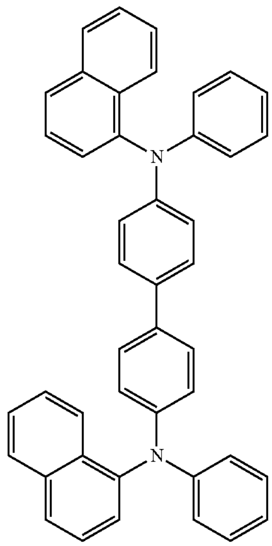
NPD
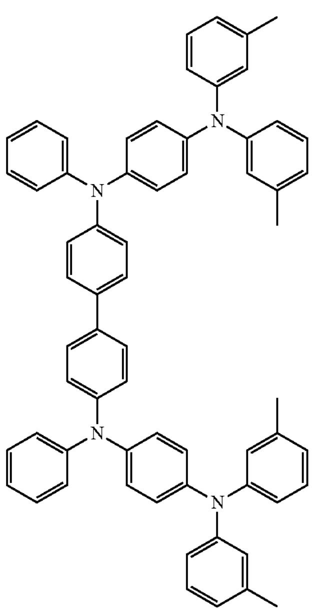
DNTPD
-continued
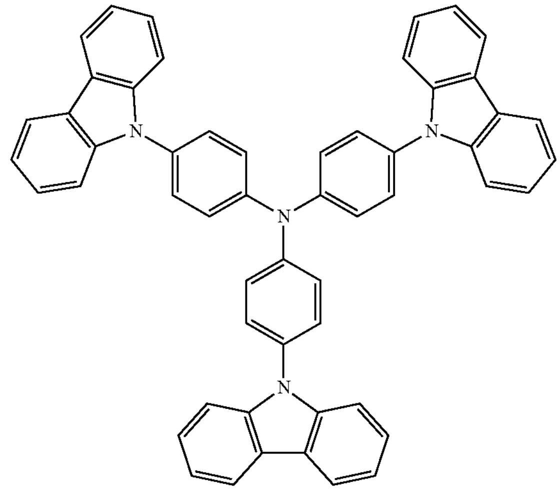
TCTA
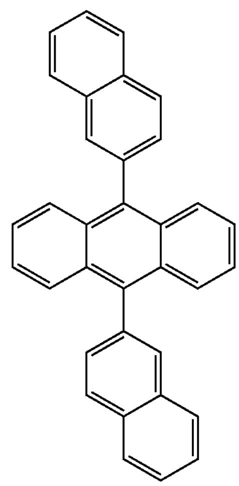
ADN
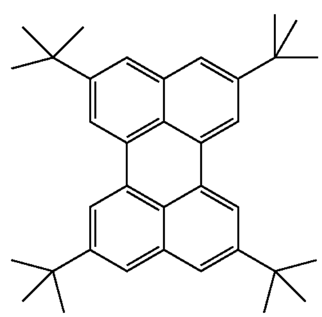
t-Bu-Perylene
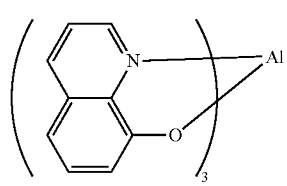
$Alq_3$ -continued

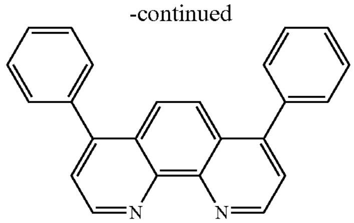

Bphen

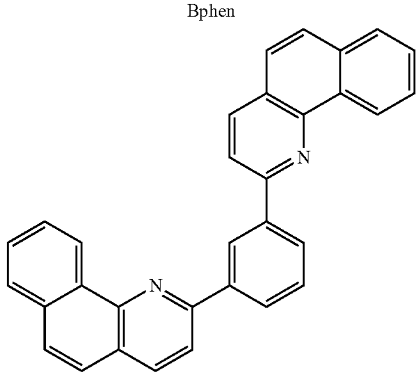

BBQB

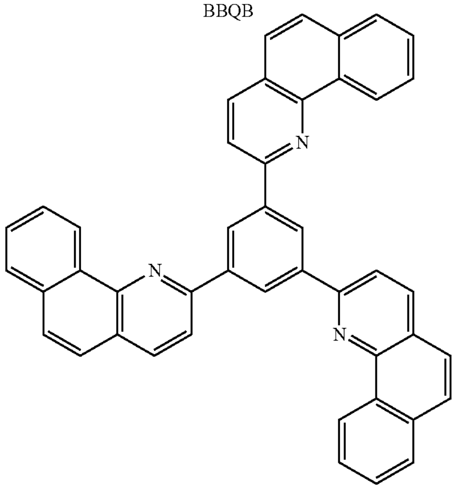

TBQB

2) Driving Voltage and Light Emission Efficiency of Organic Light Emitting Device For the organic light emitting devices manufactured as above, electroluminescent light emission (EL) characteristics were measured using M7000 manufactured by McScience Inc., and with the measurement results, $T_{95}$ when standard luminance was 750 cd/$m^2$ was measured using a lifetime test system (M6000) manufactured by McScience Inc. Results of measuring a driving voltage, light emission efficiency, external quantum efficiency and a color coordinate (CIE) of the blue organic electroluminescent devices manufactured according to the present disclosure are as shown in Table 4.

TABLE 4

| | Compound | Driving Voltage (V) | Light Emission Efficiency (cd/A) | CIE (x, y) | Lifetime (T95) |
|---|---|---|---|---|---|
| Example 54 | 1-1 | 4.32 | 8.23 | (0.135 0.111) | 41 |

TABLE 4-continued

| | Compound | Driving Voltage (V) | Light Emission Efficiency (cd/A) | CIE (x, y) | Lifetime (T95) |
|---|---|---|---|---|---|
| Example 55 | 1-6 | 4.42 | 8.03 | (0.133 0.113) | 43 |
| Example 56 | 1-14 | 4.92 | 6.46 | (0.134 0.112) | 31 |
| Example 57 | 1-26 | 4.99 | 6.55 | (0.135 0.111) | 34 |
| Example 58 | 1-27 | 5.03 | 6.62 | (0.132 0.109) | 33 |
| Example 59 | 2-1 | 5.32 | 7.10 | (0.131 0.111) | 30 |
| Example 60 | 2-14 | 5.35 | 7.55 | (0.134 0.111) | 31 |
| Example 61 | 2-27 | 4.90 | 7.63 | (0.135 0.110) | 31 |
| Example 62 | 3-1 | 5.13 | 7.76 | (0.134 0.113) | 33 |
| Example 63 | 3-10 | 4.55 | 7.97 | (0.135 0.112) | 44 |
| Example 64 | 3-14 | 5.13 | 7.23 | (0.135 0.111) | 38 |
| Example 65 | 3-27 | 5.03 | 6.97 | (0.136 0.115) | 36 |
| Example 66 | 4-1 | 4.62 | 7.99 | (0.137 0.108) | 39 |
| Example 67 | 4-5 | 4.72 | 8.08 | (0.130 0.107) | 40 |
| Example 68 | 4-17 | 5.63 | 6.46 | (0.131 0.108) | 28 |
| Example 69 | 4-27 | 5.45 | 6.77 | (0.132 0.111) | 32 |
| Example 70 | 5-1 | 5.40 | 7.11 | (0.133 0.110) | 35 |
| Example 71 | 5-7 | 5.77 | 6.75 | (0.134 0.108) | 28 |
| Example 72 | 5-21 | 5.65 | 6.55 | (0.132 0.113) | 27 |
| Example 73 | 5-38 | 5.03 | 6.97 | (0.131 0.115) | 35 |
| Example 74 | 6-1 | 5.45 | 7.11 | (0.136 0.117) | 36 |
| Example 75 | 6-5 | 5.21 | 6.90 | (0.134 0.119) | 33 |
| Example 76 | 6-10 | 4.32 | 7.99 | (0.135 0.111) | 41 |
| Example 77 | 6-14 | 4.17 | 8.03 | (0.137 0.111) | 46 |
| Example 78 | 6-38 | 5.55 | 7.73 | (0.134 0.106) | 35 |
| Example 79 | 7-1 | 5.28 | 7.66 | (0.135 0.115) | 35 |
| Example 80 | 7-5 | 4.38 | 8.32 | (0.132 0.114) | 40 |
| Example 81 | 7-17 | 5.71 | 6.44 | (0.134 0.112) | 30 |
| Example 82 | 7-34 | 5.55 | 7.10 | (0.134 0.111) | 33 |
| Example 83 | 7-39 | 5.46 | 7.09 | (0.136 0.111) | 36 |
| Example 84 | 8-1 | 5.67 | 7.11 | (0.131 0.113) | 37 |
| Example 85 | 8-5 | 5.66 | 7.35 | (0.132 0.109) | 30 |
| Example 86 | 8-6 | 5.73 | 6.44 | (0.135 0.108) | 31 |
| Example 87 | 8-19 | 5.76 | 6.46 | (0.134 0.117) | 30 |
| Example 88 | 8-39 | 4.69 | 7.98 | (0.134 0.116) | 43 |
| Example 89 | 9-1 | 5.76 | 7.54 | (0.133 0.112) | 34 |
| Example 90 | 9-5 | 4.62 | 7.66 | (0.133 0.111) | 44 |
| Example 91 | 9-14 | 5.77 | 6.59 | (0.135 0.108) | 26 |
| Example 92 | 9-18 | 5.71 | 6.95 | (0.133 0.111) | 27 |

TABLE 4-continued

| | Compound | Driving Voltage (V) | Light Emission Efficiency (cd/A) | CIE (x, y) | Lifetime (T95) |
|---|---|---|---|---|---|
| Example 93 | 10-1 | 5.54 | 7.08 | (0.131 0.110) | 32 |
| Example 94 | 10-5 | 4.41 | 8.00 | (0.132 0.110) | 49 |
| Example 95 | 10-14 | 5.77 | 6.50 | (0.130 0.113) | 30 |
| Example 96 | 10-18 | 5.80 | 6.23 | (0.136 0.112) | 28 |
| Example 97 | 11-1 | 5.19 | 7.11 | (0.134 0.111) | 37 |
| Example 98 | 11-5 | 5.68 | 7.00 | (0.139 0.109) | 36 |
| Example 99 | 11-10 | 5.16 | 7.62 | (0.135 0.109) | 33 |
| Example 100 | 11-14 | 5.75 | 6.29 | (0.131 0.111) | 24 |
| Example 101 | 11-27 | 5.83 | 6.35 | (0.132 0.110) | 30 |
| Example 102 | 12-1 | 5.81 | 6.67 | (0.133 0.110) | 33 |
| Example 103 | 12-5 | 4.72 | 7.90 | (0.133 0.113) | 44 |
| Example 104 | 12-10 | 5.53 | 7.61 | (0.133 0.112) | 32 |
| Example 105 | 12-14 | 5.69 | 6.13 | (0.134 0.111) | 25 |
| Example 106 | 12-27 | 5.79 | 6.37 | (0.135 0.110) | 26 |
| Example 107 | 13-1 | 4.90 | 7.00 | (0.133, 0.113) | 37 |
| Example 108 | 13-2 | 4.72 | 7.44 | (0.134, 0.111) | 45 |
| Example 109 | 13-3 | 5.11 | 6.85 | (0.135, 0.113) | 30 |
| Example 110 | 13-4 | 5.08 | 6.99 | (0.134, 0.113) | 30 |
| Example 112 | 13-5 | 5.01 | 6.81 | (0.134, 0.113) | 29 |
| Example 113 | 13-6 | 4.88 | 7.91 | (0.134, 0.110) | 43 |
| Example 114 | 13-7 | 5.21 | 6.67 | (0.133, 0.111) | 29 |
| Example 115 | 13-8 | 5.16 | 6.81 | (0.133, 0.111) | 29 |
| Example 116 | 13-9 | 4.61 | 7.44 | (0.132, 0.110) | 40 |
| Example 117 | 13-10 | 4.71 | 7.30 | (0.134, 0.110) | 37 |
| Example 118 | 13-11 | 4.90 | 6.90 | (0.135, 0.112) | 36 |
| Example 119 | 13-12 | 4.71 | 7.41 | (0.134, 0.110) | 41 |
| Example 120 | 13-13 | 4.71 | 7.41 | (0.135, 0.110) | 41 |
| Example 121 | 13-14 | 4.72 | 7.45 | (0.135, 0.110) | 37 |
| Example 122 | 13-15 | 5.01 | 6.90 | (0.132, 0.110) | 38 |
| Example 123 | 13-16 | 5.01 | 7.01 | (0.133, 0.111) | 37 |
| Example 124 | 13-17 | 4.90 | 7.44 | (0.134, 0.111) | 42 |
| Example 125 | 13-18 | 5.01 | 6.90 | (0.132, 0.110) | 38 |
| Example 126 | 13-19 | 5.01 | 7.01 | (0.132, 0.111) | 37 |
| Example 127 | 13-20 | 5.01 | 7.01 | (0.133, 0.111) | 37 |
| Example 128 | 13-21 | 4.89 | 7.90 | (0.133, 0.110) | 40 |
| Example 129 | 13-22 | 5.03 | 6.90 | (0.132, 0.110) | 38 |
| Example 130 | 13-23 | 5.41 | 6.51 | (0.134, 0.111) | 34 |
| Example 131 | 13-24 | 5.39 | 6.60 | (0.134, 0.111) | 32 |

TABLE 4-continued

| | Compound | Driving Voltage (V) | Light Emission Efficiency (cd/A) | CIE (x, y) | Lifetime (T95) |
|---|---|---|---|---|---|
| Comparative Example 2-1 | Bphen | 5.82 | 6.23 | (0.136, 0.110) | 27 |
| Comparative Example 2-2 | BBQB | 5.80 | 6.12 | (0.134, 0.111) | 26 |
| Comparative Example 2-3 | TBQB | 5.84 | 6.19 | (0.134, 0111) | 26 |

As shown from the results of Table 4, the organic light emitting devices using the charge generation layer material of the blue organic light emitting device of the present disclosure had a low driving voltage and improved light emission efficiency compared to Comparative Examples 2. Particularly, it was identified that Compounds 1-1, 1-6, 1-26, 3-10, 4-1, 4-5, 6-10, 6-14, 7-5, 8-39, 9-5, 10-5, 12-5, 13-2, 13-6, 13-9, 13-13, 13-14, 13-17, 13-21 were significantly excellent in all of driving, efficiency and lifetime.

The presumed reason for such results is that the compound of the present disclosure used as an N-type charge generation layer formed with an invented skeleton having proper length, strength and flat property and a proper hetero-compound capable of binding with metals is doped with an alkali metal or an alkali-earth metal to form a gap state within the N-type charge generation layer, and electrons produced from a P-type charge generation layer are readily injected to the electron transfer layer through the gap state produced within the N-type charge generation layer. Accordingly, the P-type charge generation layer favorably carried out electron injection and electron transfer to the N-type charge generation layer, and as a result, it is considered that a driving voltage of the organic light emitting device decreased, and efficiency and lifetime were improved.

The invention claimed is:

1. An organic light emitting device comprising:

an anode;

a cathode; and one or more organic material layers provided between the anode and the cathode, wherein one or more layers of the organic material layers comprise a hetero-cyclic compound represented by the following Chemical Formula 1:

[Chemical Formula 1]

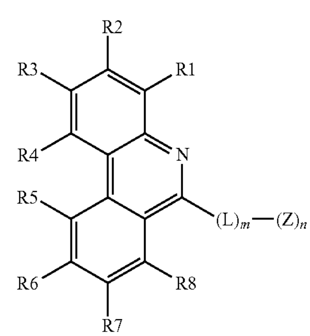

in Chemical Formula 1, at least one of R1 and R2, R3 and R4, R5 and R6, R6 and R7, and R7 and R8 bond to each other to form a hydrocarbon fused ring or a hetero fused ring;

the rest are the same as or different from each other, and each independently selected from the group consisting of hydrogen; deuterium; a halogen group; —CN; a substituted or unsubstituted $C_1$ to $C_{60}$ alkyl group; a substituted or unsubstituted $C_2$ to $C_{60}$ alkenyl group; a substituted or unsubstituted $C_2$ to $C_{60}$ alkynyl group; a substituted or unsubstituted $C_1$ to $C_{60}$ alkoxy group; a substituted or unsubstituted $C_3$ to $C_{60}$ cycloalkyl group; a substituted or unsubstituted $C_2$ to $C_{60}$ heterocycloalkyl group; a substituted or unsubstituted $C_6$ to $C_{60}$ aryl group; a substituted or unsubstituted $C_2$ to $C_{60}$ heteroaryl group; —SiRR'R"; —P(═O)RR'; and an amine group unsubstituted or substituted with a $C_1$ to $C_{20}$ alkyl group, a $C_6$ to $C_{60}$ aryl group, or a $C_2$ to $C_{60}$ heteroaryl group;

L is a direct bond, a substituted or unsubstituted $C_6$ to $C_{60}$ arylene group, or a $C_2$ to $C_{60}$ heteroarylene group;

Z of Chemical Formula 1 is selected from among the following structural formulae:

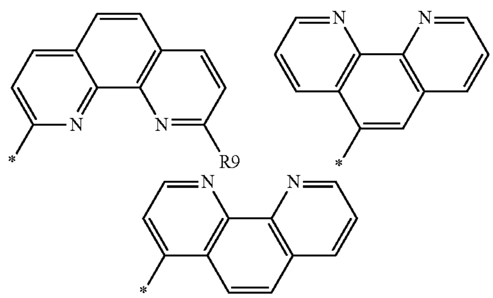

in the structural formulae, R9 is a C6 to C60 aryl group, m is an integer of 0 to 4;

n is an integer of 1 to 4; and

R, R' and R" are the same as or different from each other, and each independently hydrogen; deuterium; —CN; a substituted or unsubstituted $C_1$ to $C_{60}$ alkyl group; a substituted or unsubstituted $C_3$ to $C_{60}$ cycloalkyl group; a substituted or unsubstituted $C_6$ to $C_{60}$ aryl group; or a substituted or unsubstituted $C_2$ to $C_{60}$ heteroaryl group.

2. The organic light emitting device of claim 1, wherein the groups that do not form a hydrocarbon fused ring or a hetero fused ring among R1 to R8 of Chemical Formula 1 are each independently hydrogen or deuterium.

3. The organic light emitting device of claim 1, wherein Chemical Formula 1 is represented by any one of the following Chemical Formulae 2 to 6:

[Chemical Formula 2]

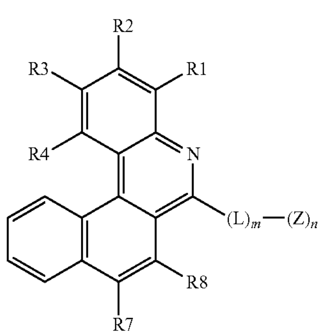

-continued

[Chemical Formula 3]

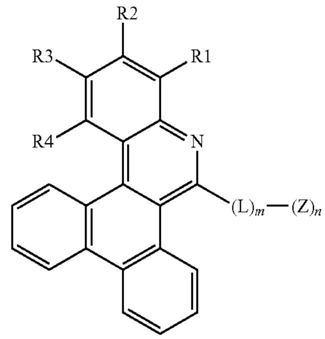

[Chemical Formula 4]

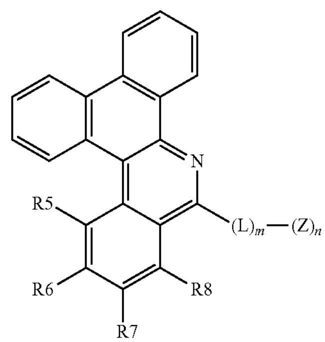

[Chemical Formula 5]

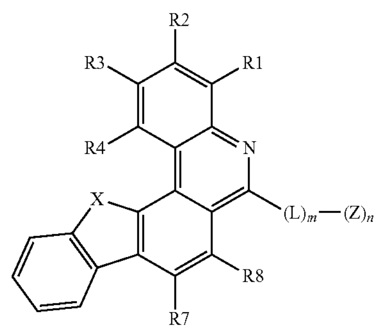

[Chemical Formula 6]

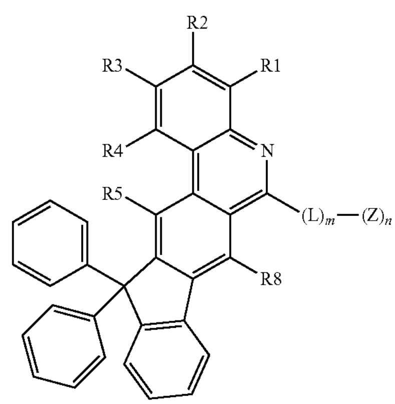

in Chemical Formulae 2 to 6,

R1 to R8 are the same as or different from each other, and each independently hydrogen; deuterium; a halogen group; —CN; a substituted or unsubstituted $C_1$ to $C_{60}$ alkyl group; a substituted or unsubstituted $C_2$ to $C_{60}$ alkenyl group; a substituted or unsubstituted $C_2$ to $C_{60}$ alkynyl group; a substituted or unsubstituted $C_1$ to $C_{60}$ alkoxy group; a substituted or unsubstituted $C_3$ to $C_{60}$ cycloalkyl group; a substituted or unsubstituted $C_2$ to $C_{60}$ heterocycloalkyl group; a substituted or unsubstituted $C_6$ to $C_{60}$ aryl group; a substituted or unsubstituted $C_2$ to $C_{60}$ heteroaryl group; -SiRR'R"; —P(=O)RR'; and an amine group unsubstituted or substituted with a $C_1$ to $C_{20}$ alkyl group, a $C_6$ to $C_{60}$ aryl group, or a $C_2$ to $C_{60}$ heteroaryl group;

L is a direct bond, a substituted or unsubstituted $C_6$ to $C_{60}$ arylene group, or a $C_2$ to $C_{60}$ heteroarylene group;

Z of Chemical Formula 1 is selected from among the following structural formulae:

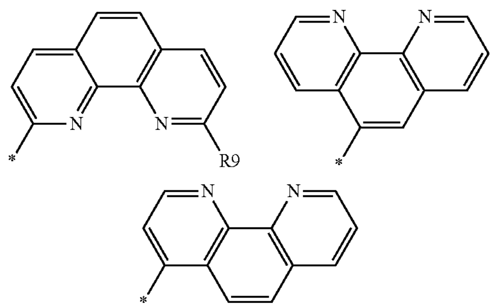

in the structural formulae, R9 is a C6 to C60 aryl group,

X is S; O; NR; or CR'R";

m is an integer of 0 to 4;

n is an integer of 1 to 4; and

R, R' and R" are the same as or different from each other, and each independently hydrogen; deuterium; —CN; a substituted or unsubstituted $C_1$ to $C_{60}$ alkyl group; a substituted or unsubstituted $C_3$ to $C_{60}$ cycloalkyl group; a substituted or unsubstituted $C_6$ to $C_{60}$ aryl group; or a substituted or unsubstituted $C_2$ to $C_{60}$ heteroaryl group.

4. The organic light emitting device of claim 1, wherein L of Chemical Formula 1 is selected from among the following structural formulae:

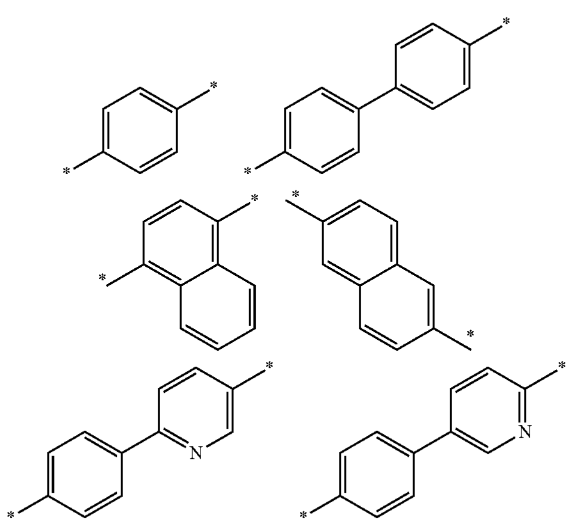

-continued

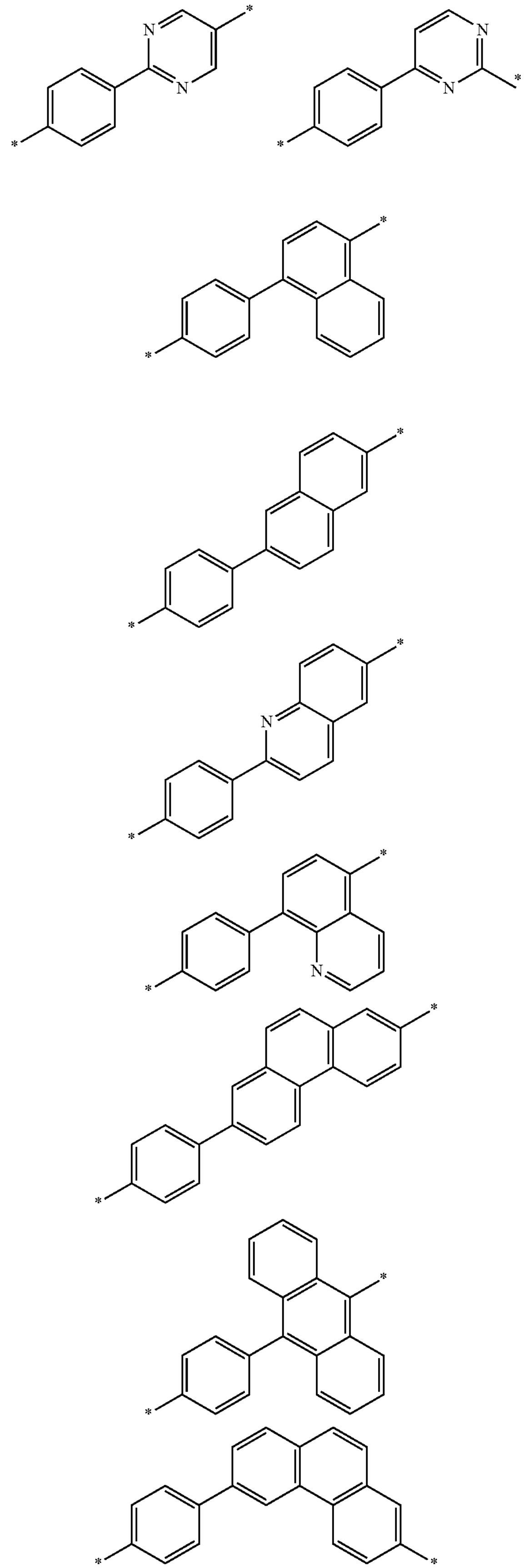

-continued
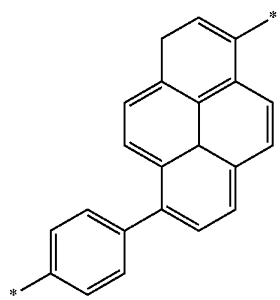
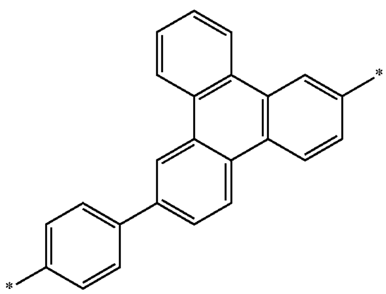
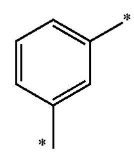
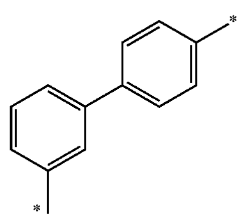
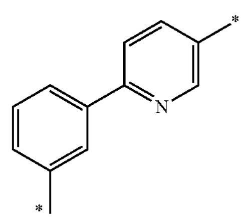
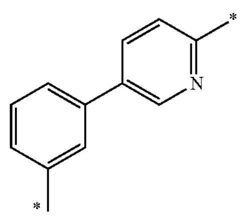
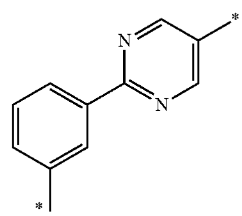
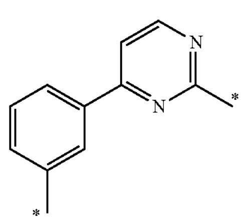
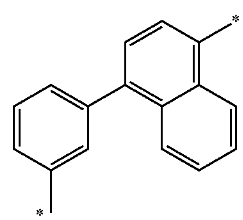
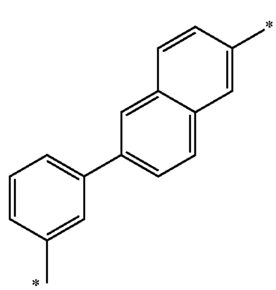
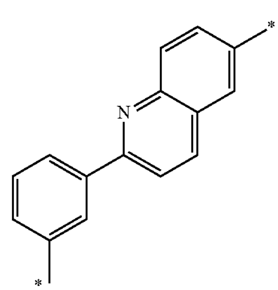
-continued
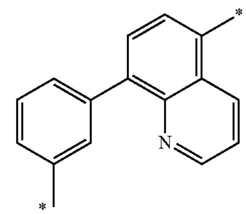
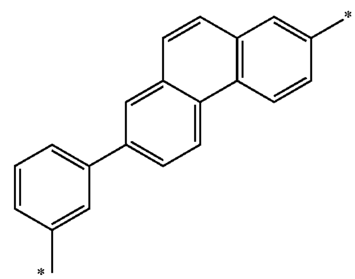
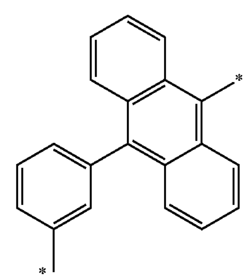
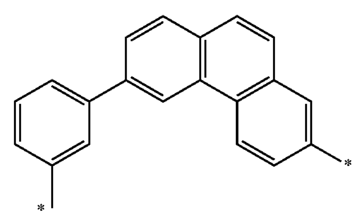
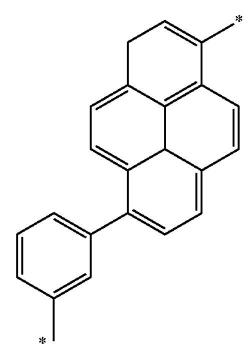
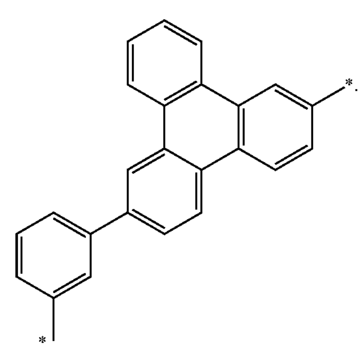

5. The organic light emitting device of claim 1, wherein Chemical Formula 1 is represented by any one of the following compounds:
1-1
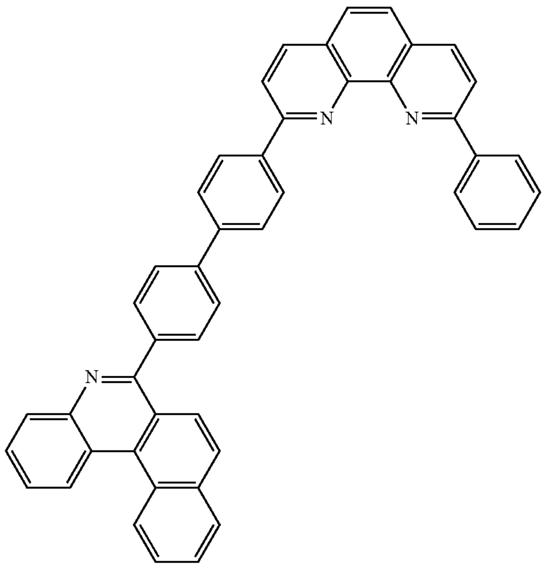
1-2
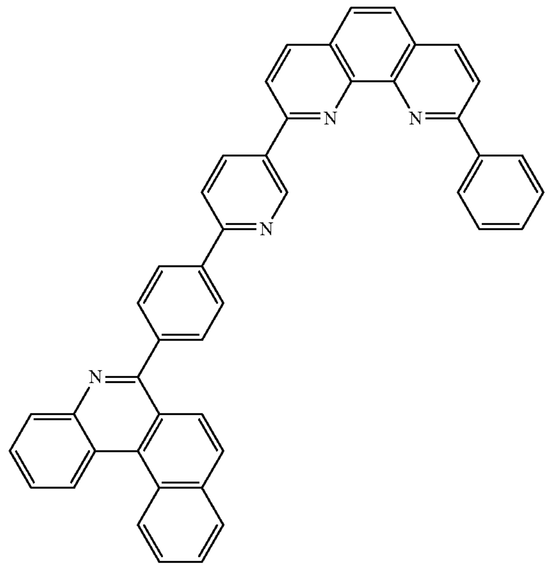
1-3
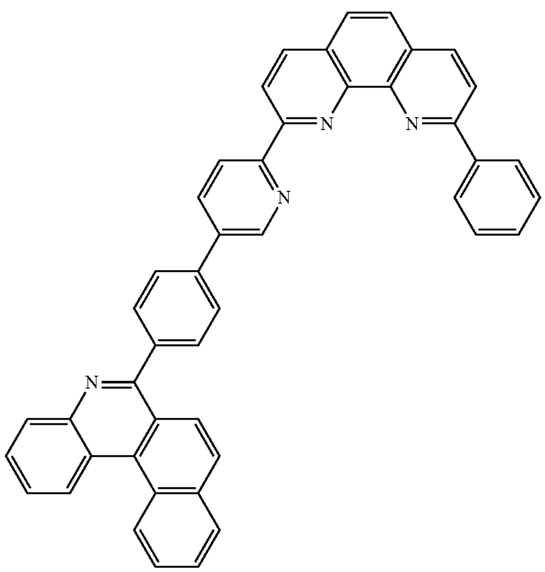
1-4
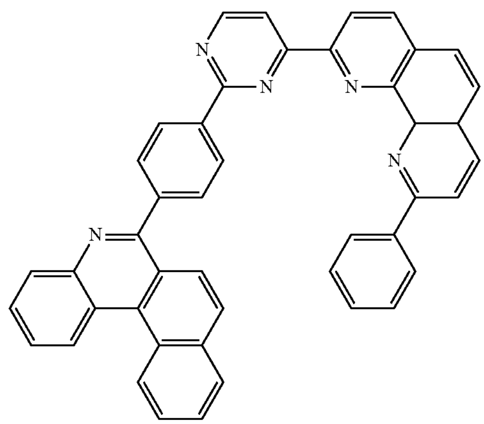
1-5
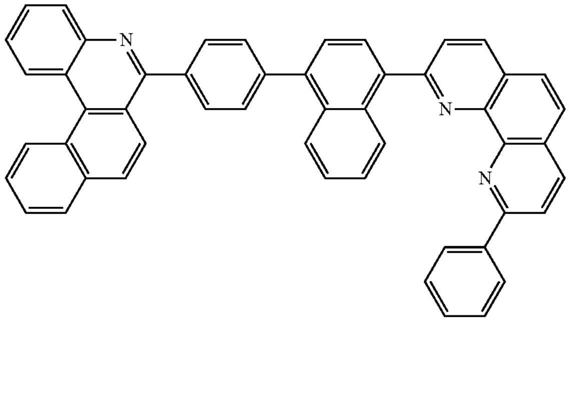
1-6
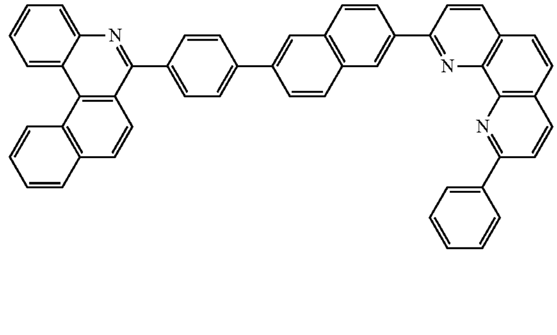

-continued
1-7
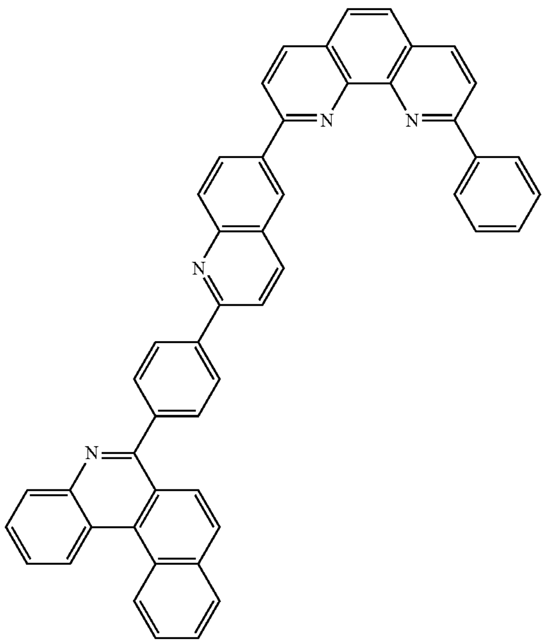
1-8
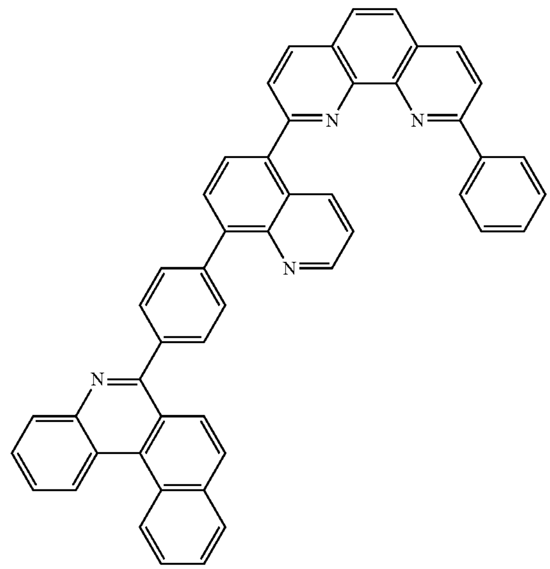
1-9
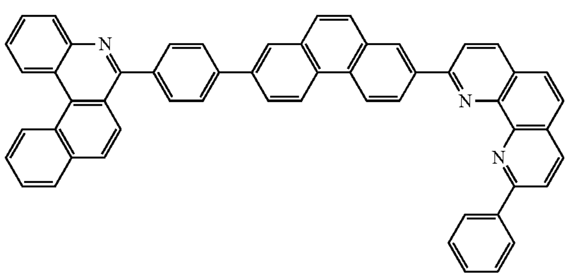
1-10
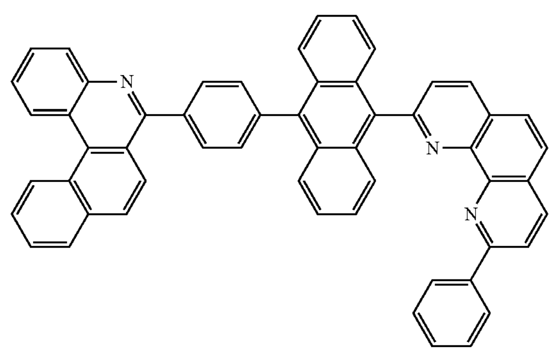
1-11
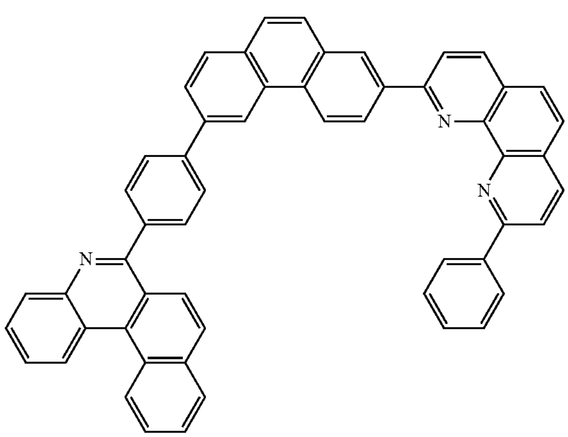
1-13
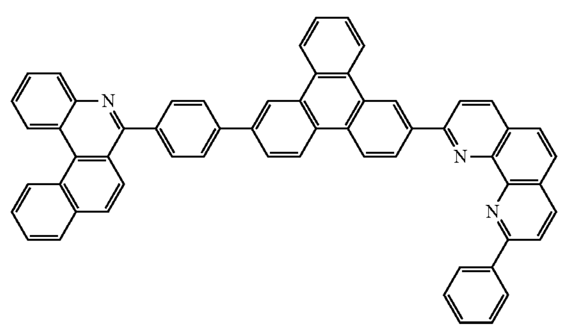

-continued
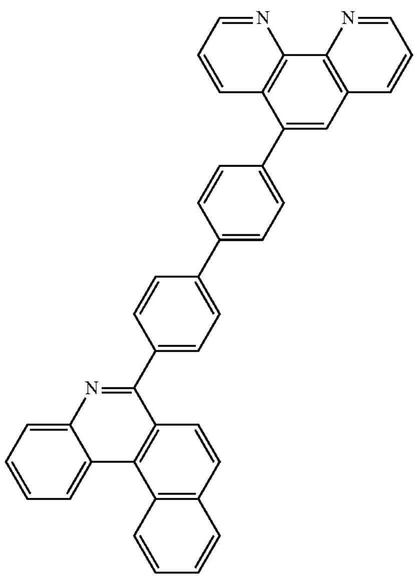
1-14
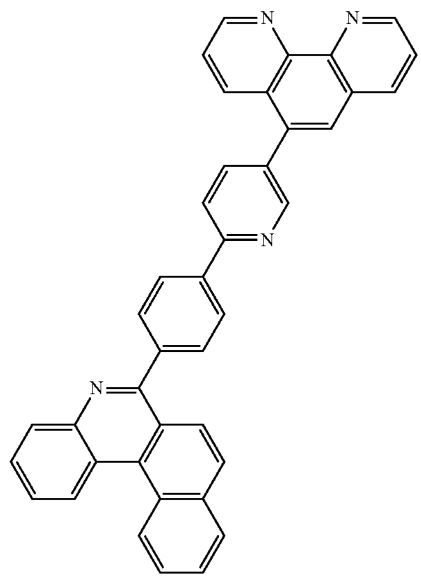
1-15
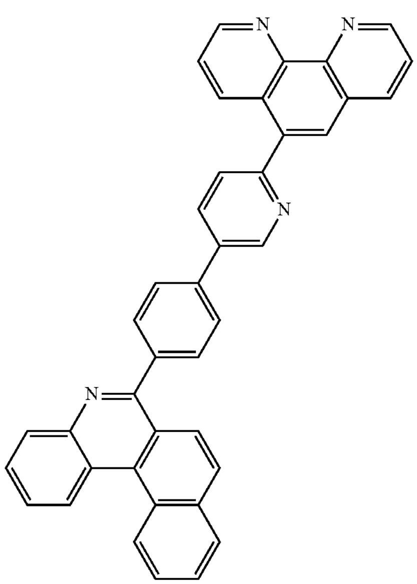
1-16
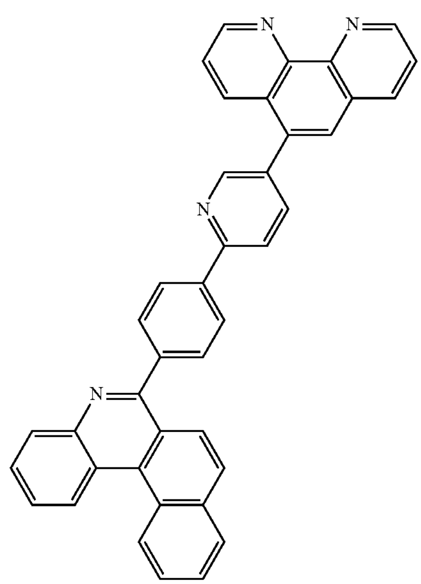
1-17

-continued
1-18
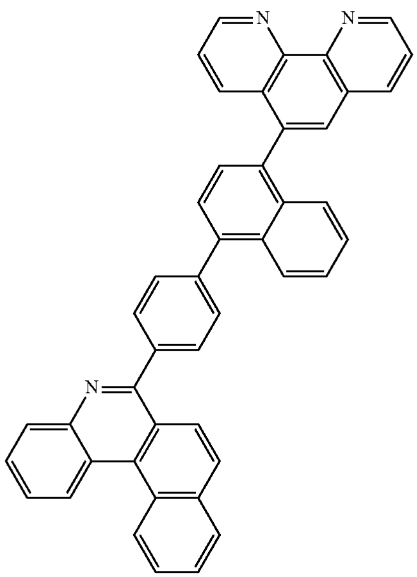
1-19
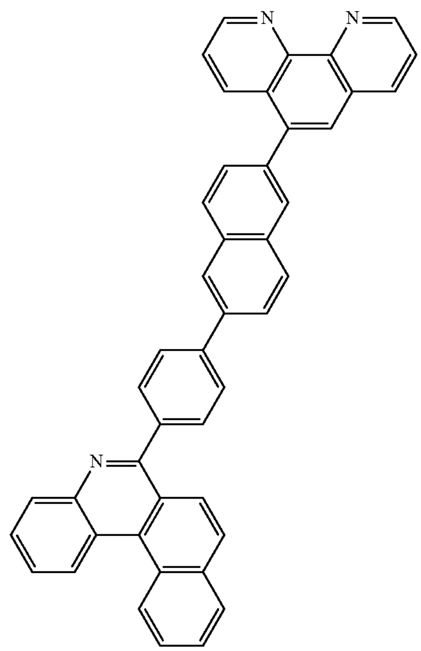
1-20
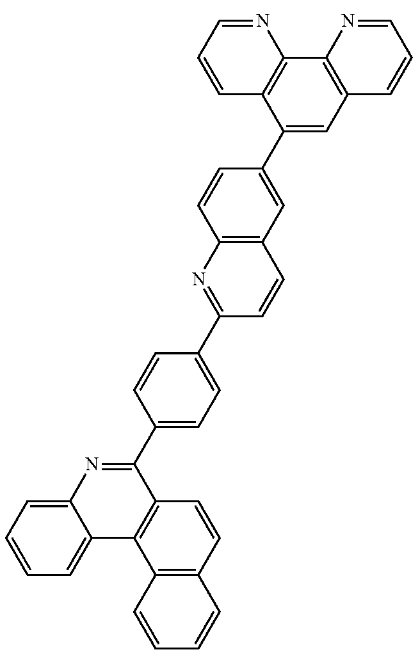
1-21
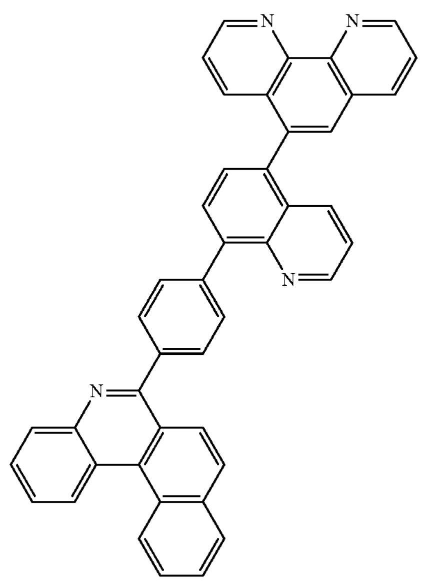
1-22
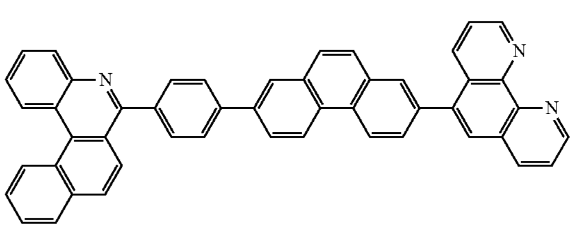
1-23
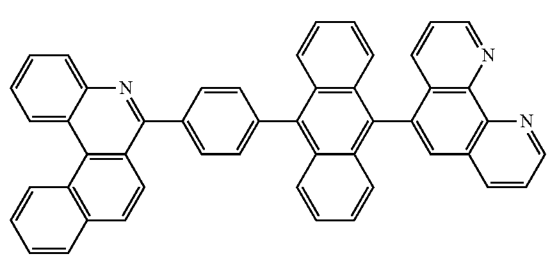

-continued
1-24
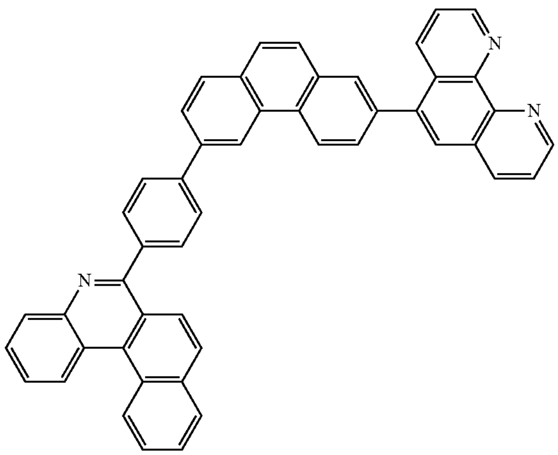
1-25
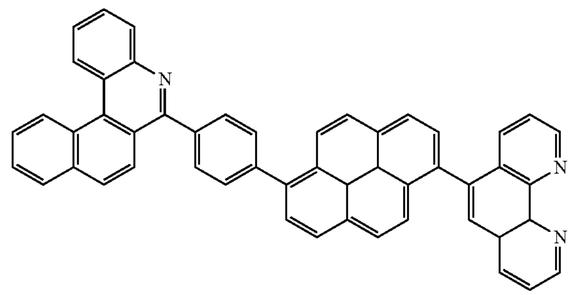
1-26
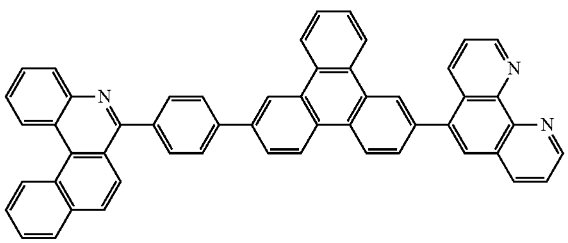
1-27
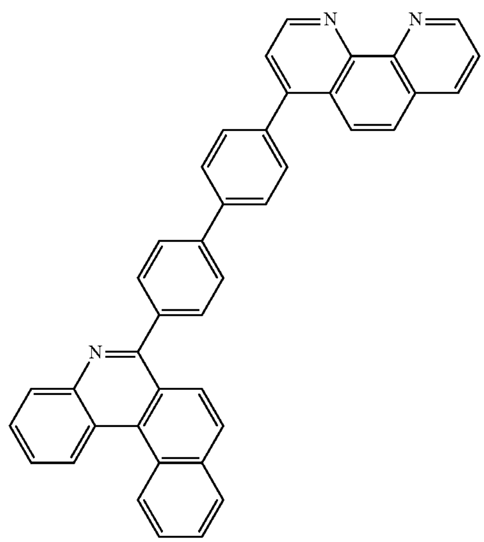
1-28
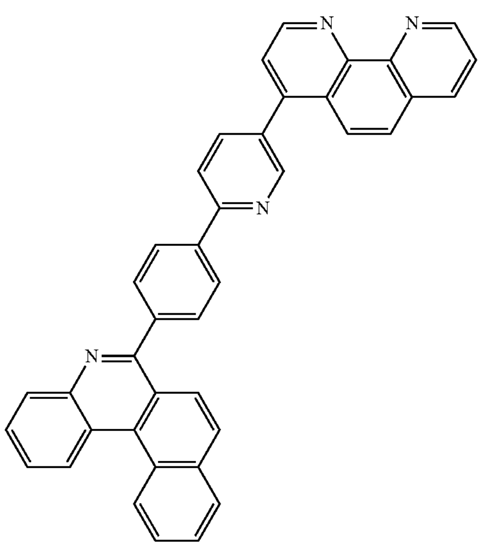
1-29
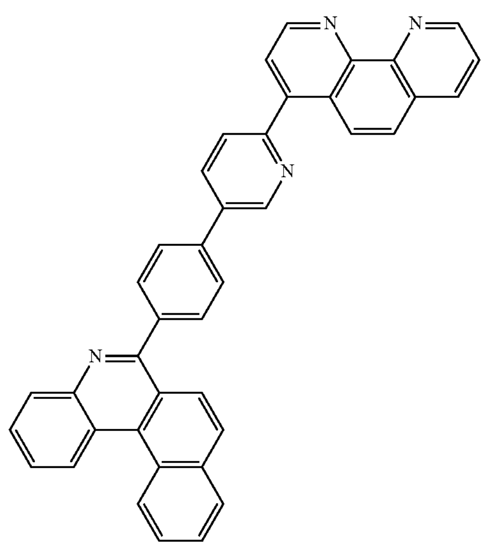

-continued
1-30
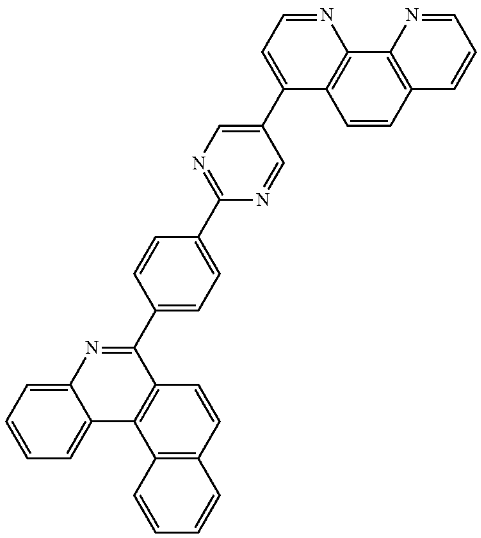
1-31
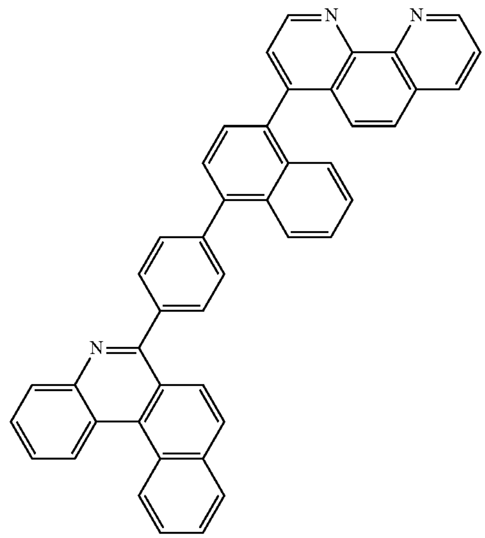
1-32
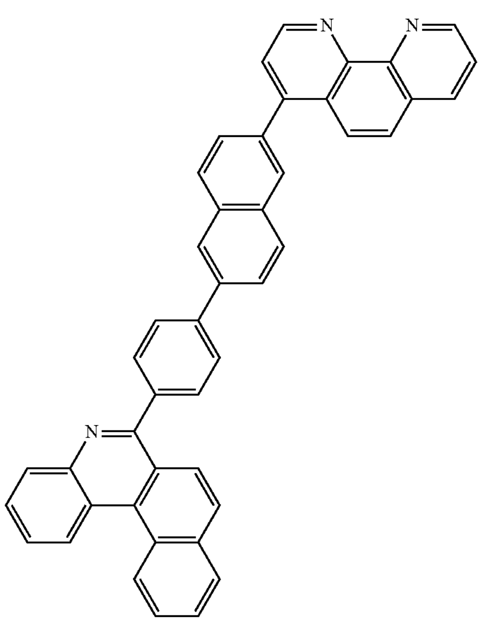
1-33
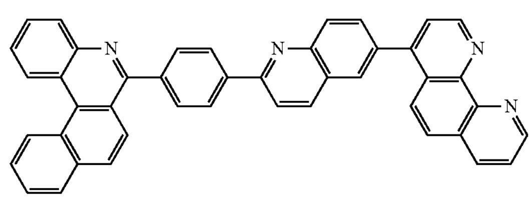

-continued
1-34
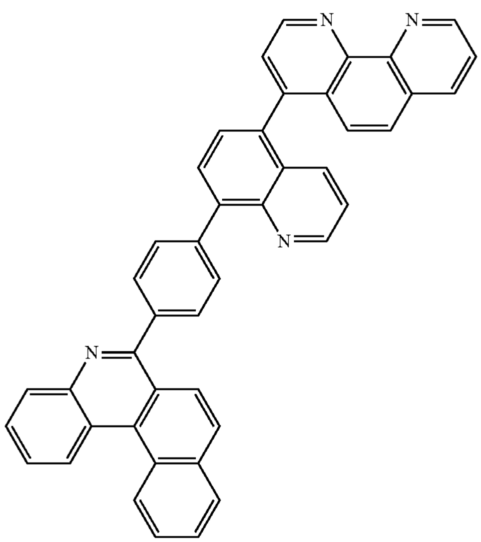
1-35
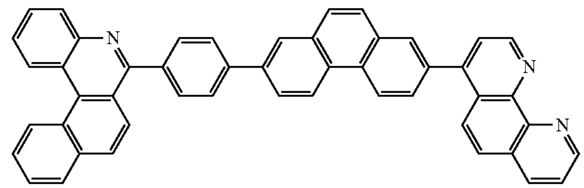
1-36
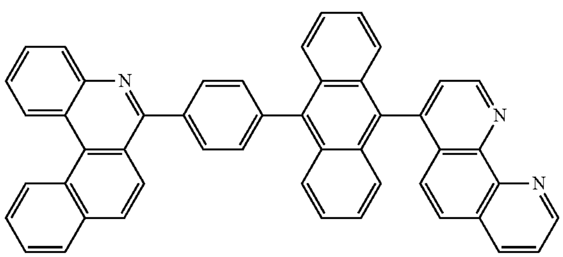
1-37
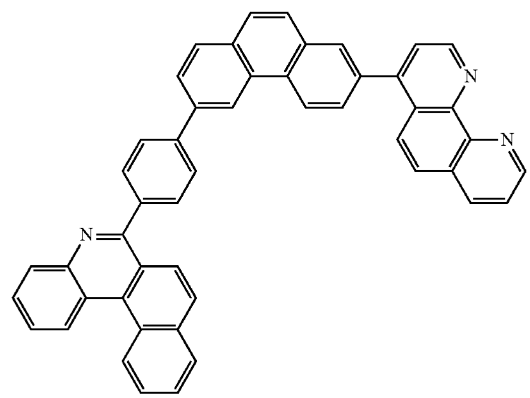
1-38
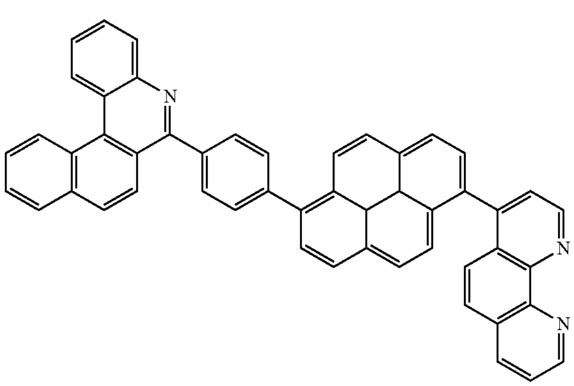
1-39
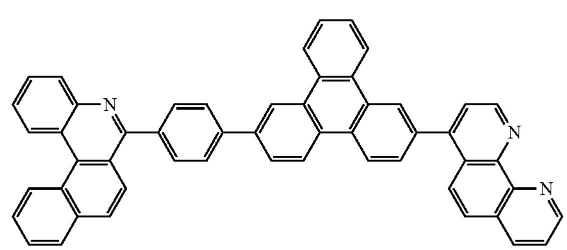

-continued
2-1
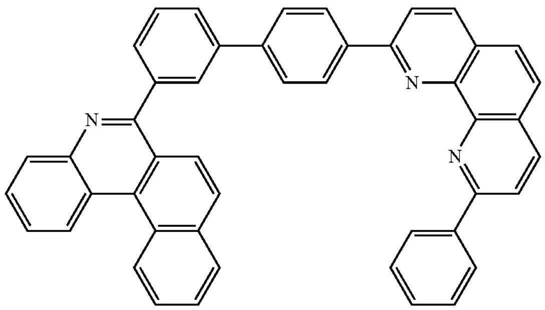
2-2
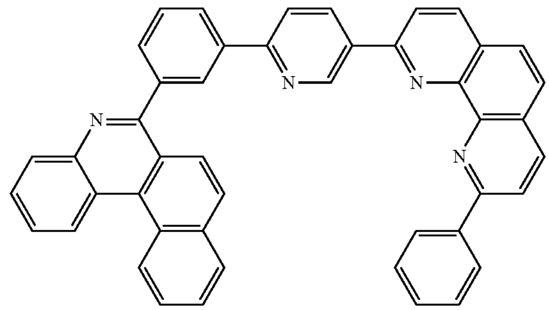
2-3
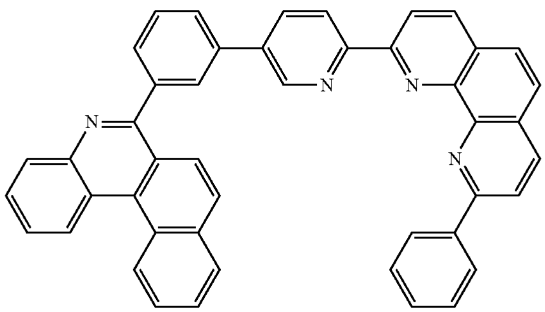
2-4
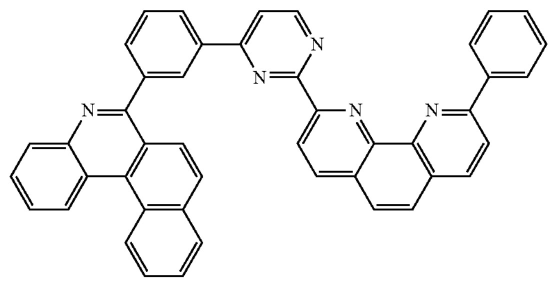
2-5
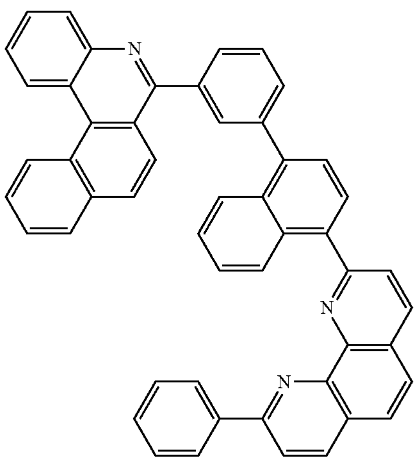
2-6
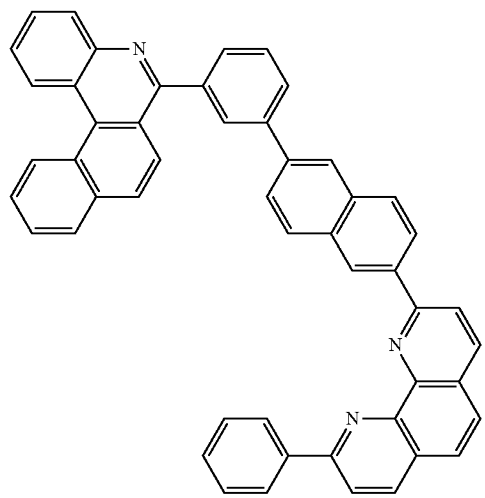
2-7
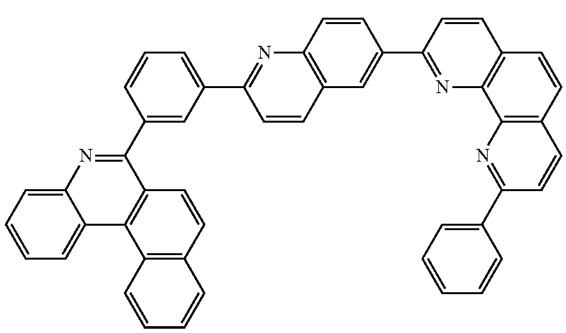
2-8
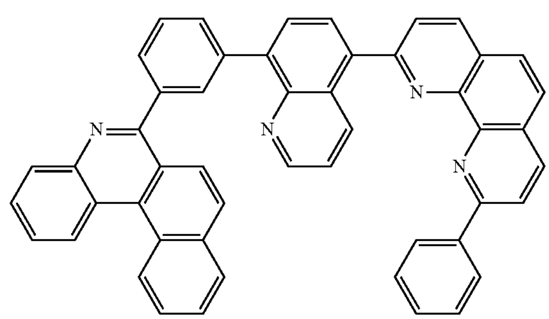

-continued
2-9
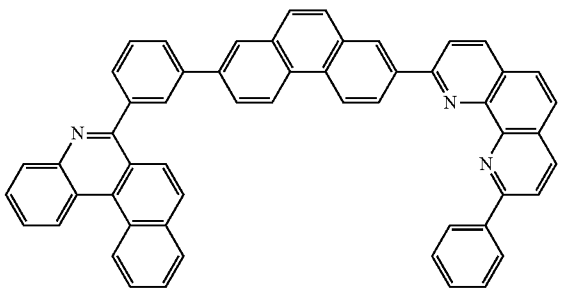
2-10
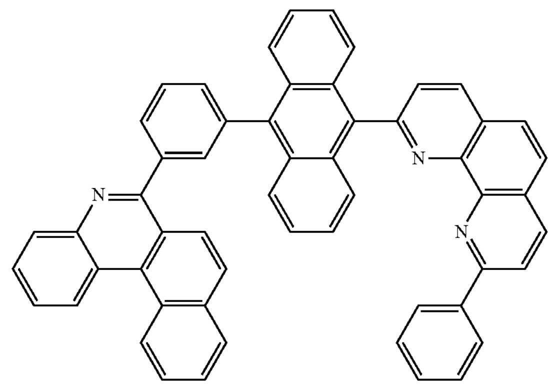
2-11
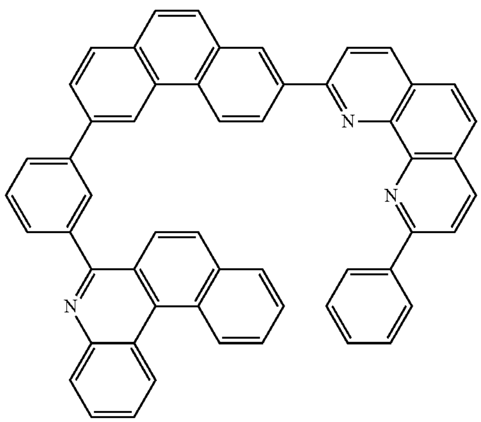
2-13
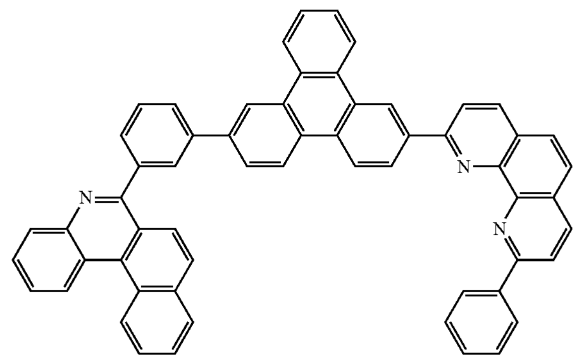
2-14
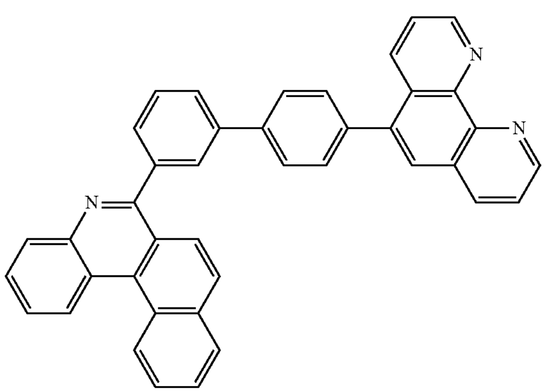
2-15
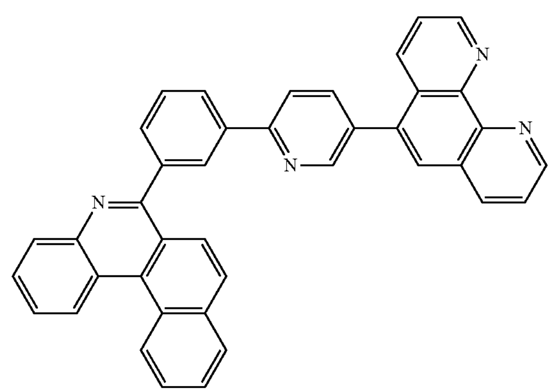
2-16
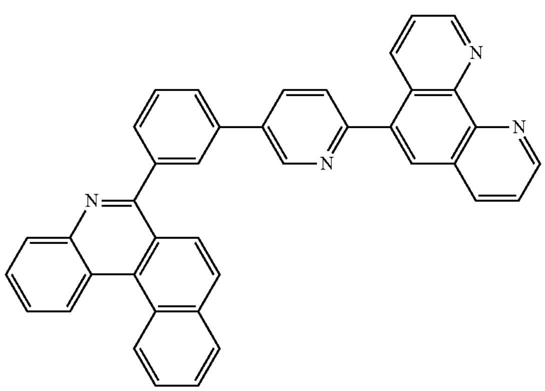
2-17
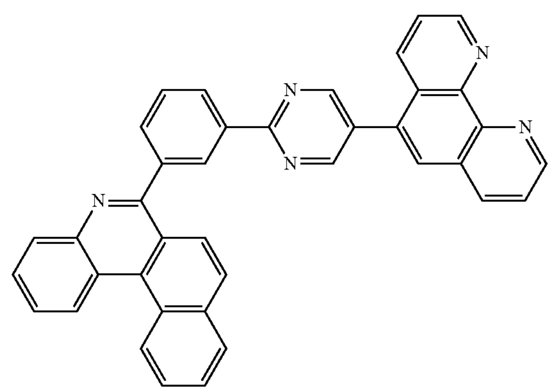

-continued
2-18
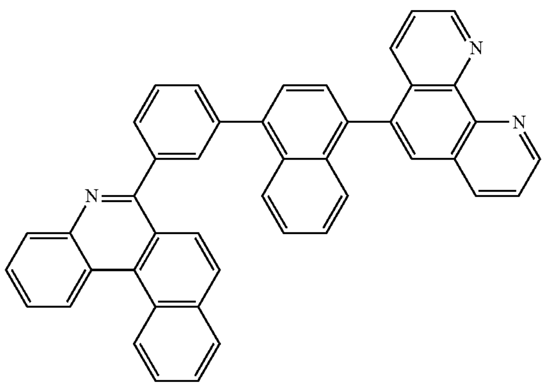
1-19
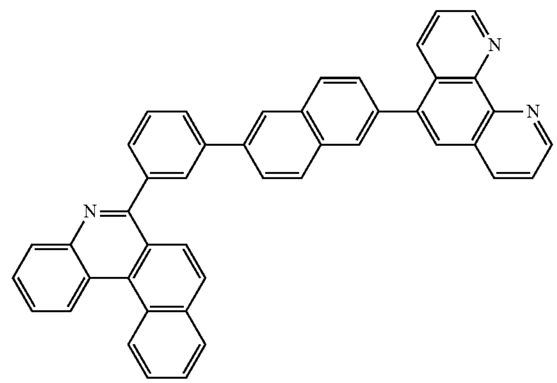
2-20
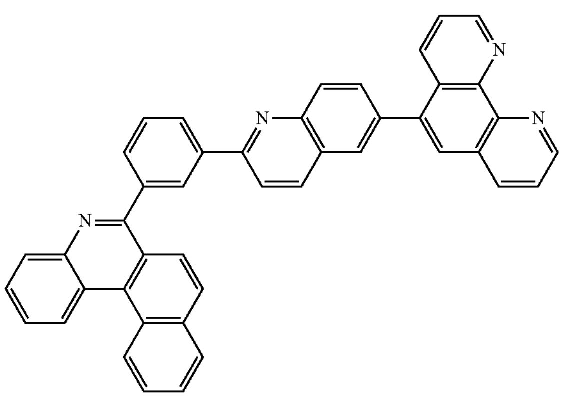
2-21
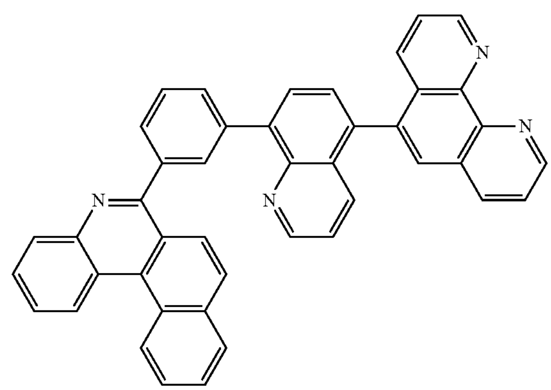
2-22
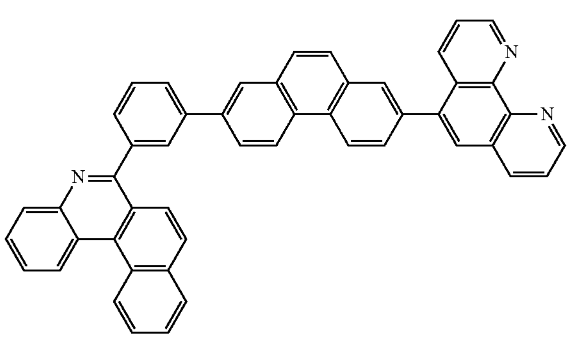
2-23
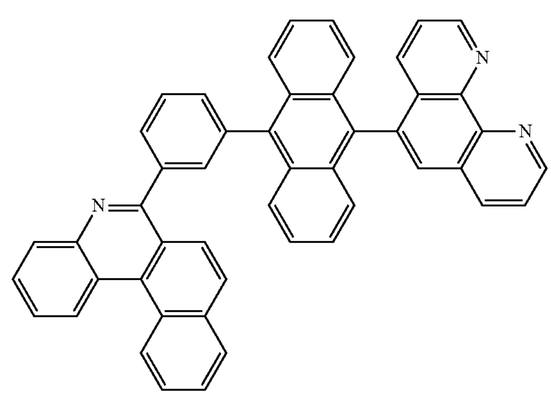

-continued
2-24
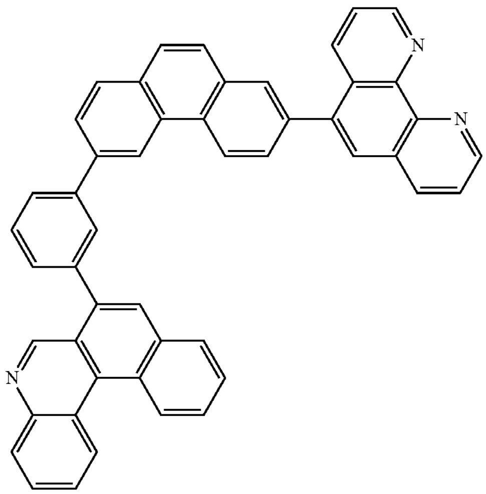
2-25
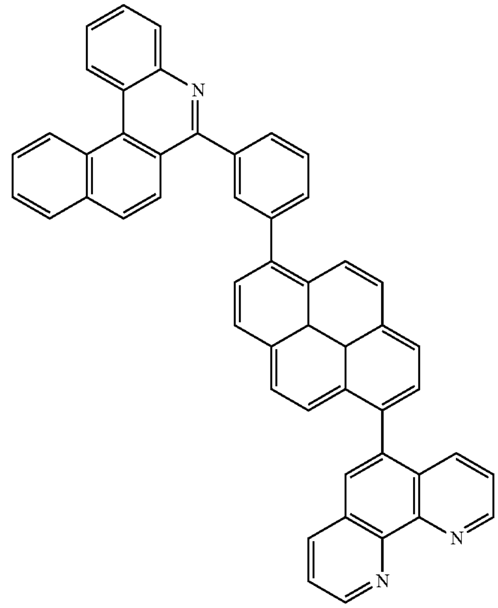
2-26
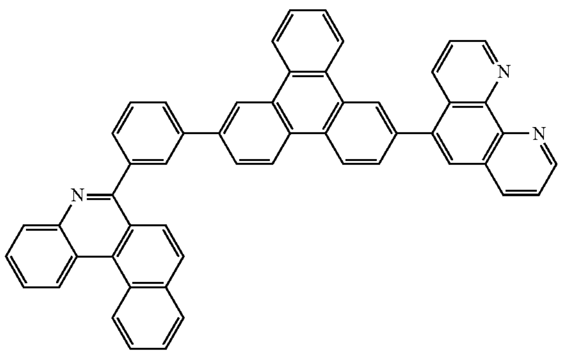
2-27
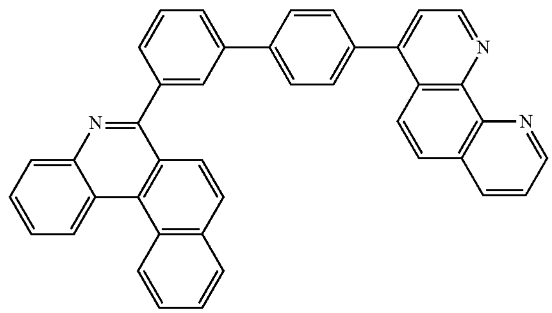
2-28
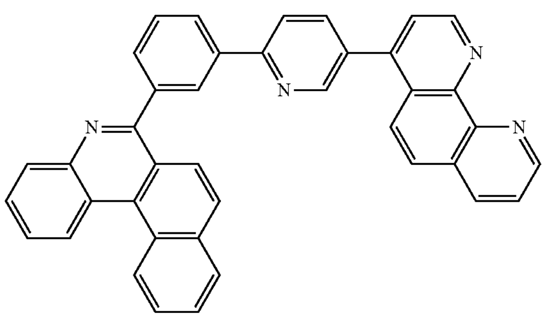
2-29
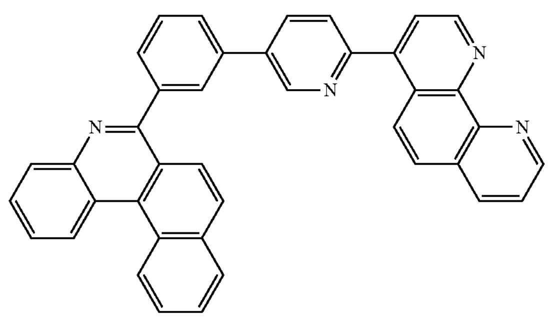
2-30
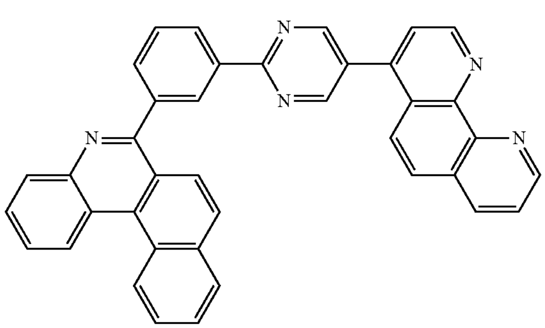
2-31
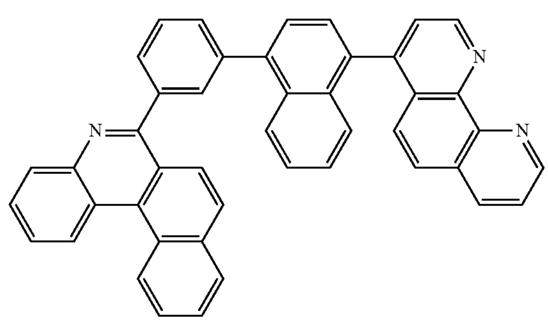

-continued
2-32
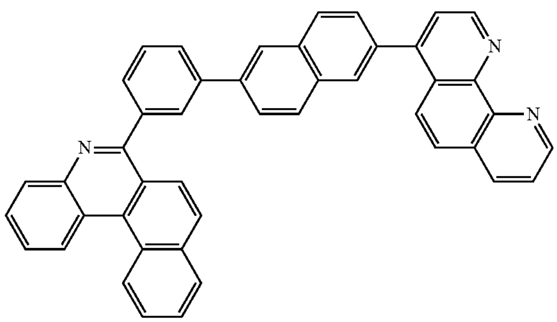
2-33
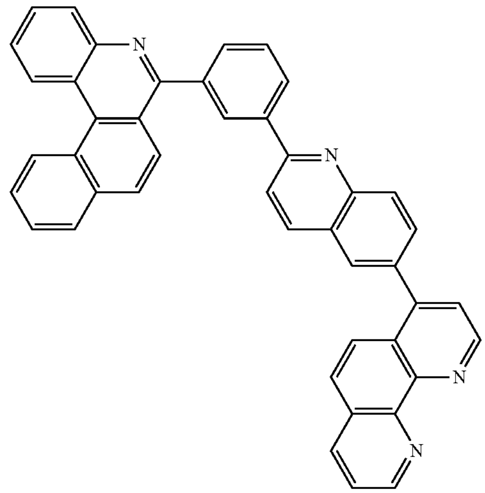
2-34
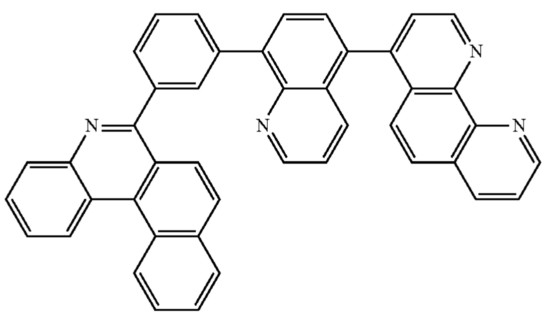
2-35
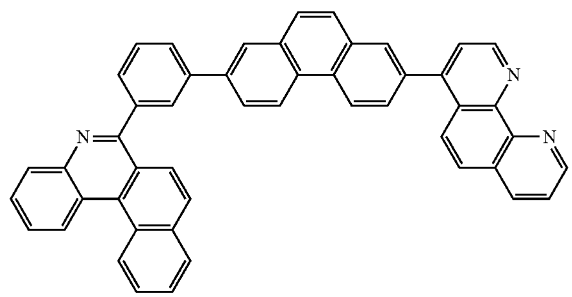
2-36
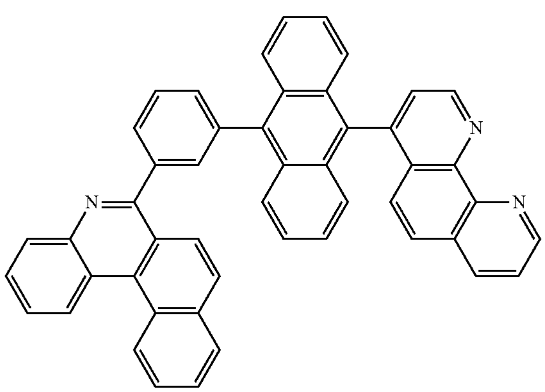
2-37
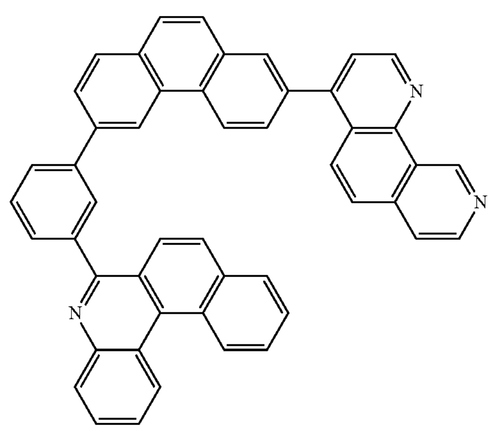

-continued
2-38
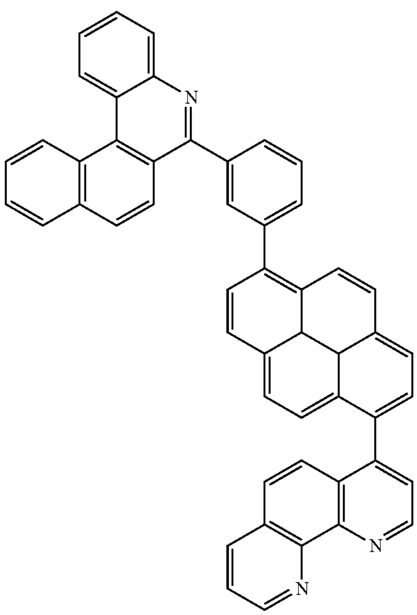
2-39
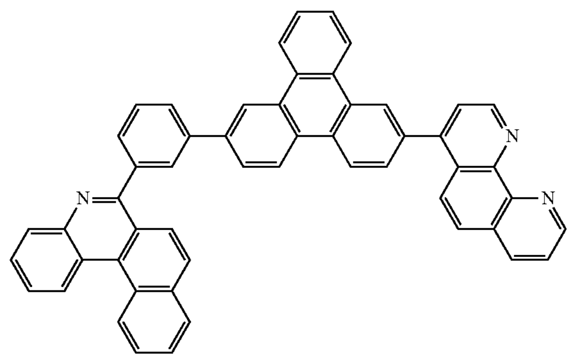
3-1
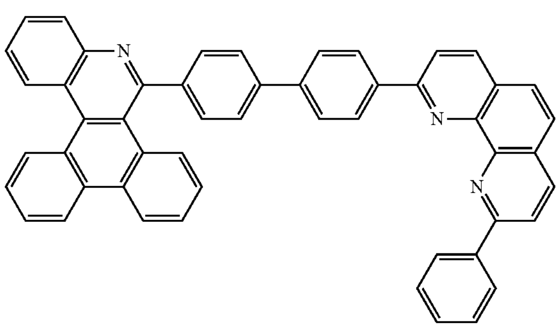
3-2
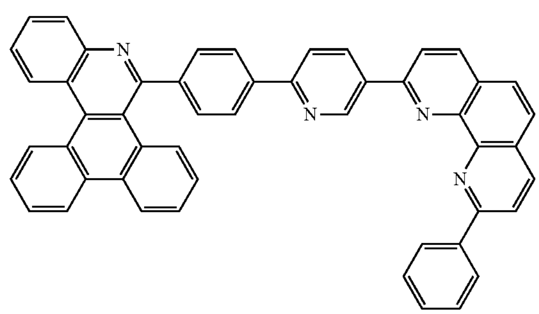
3-3
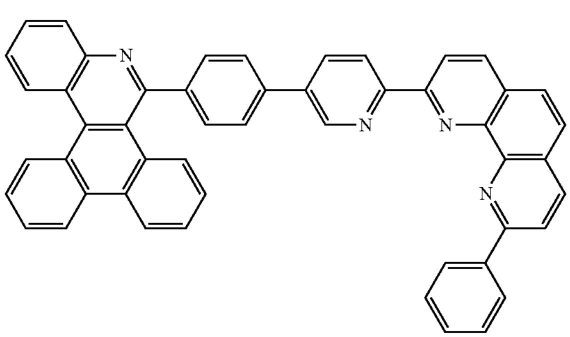
3-4
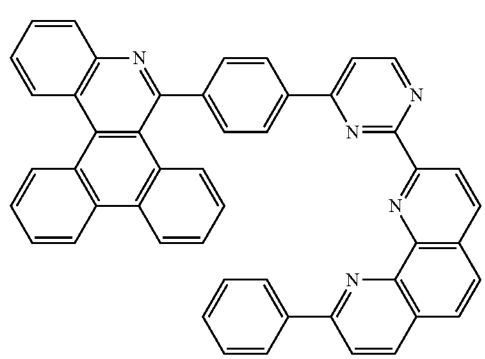

-continued
3-5
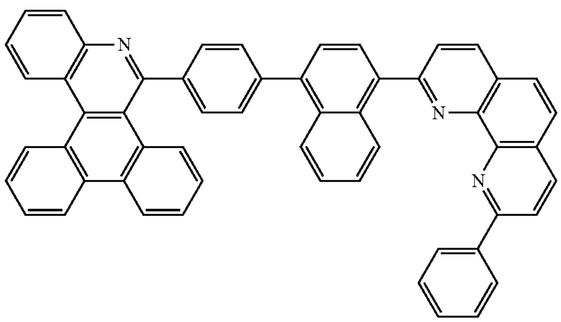
3-6
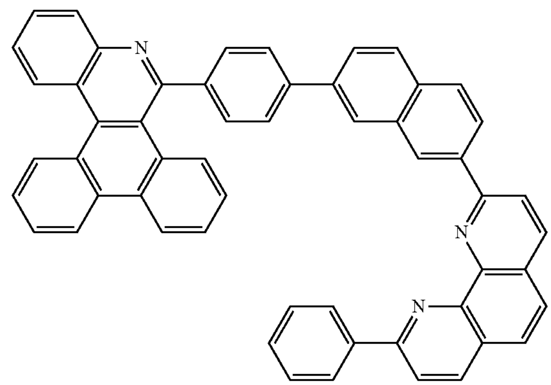
3-7
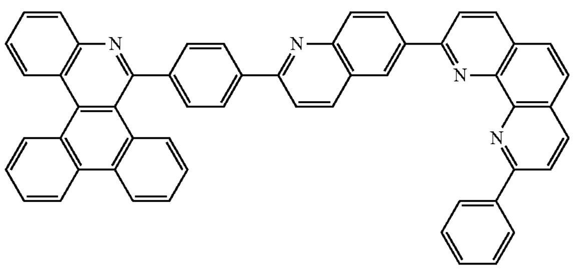
3-8
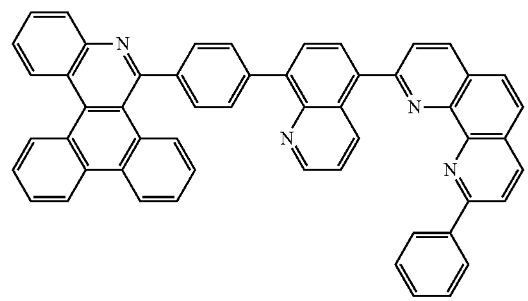
3-9
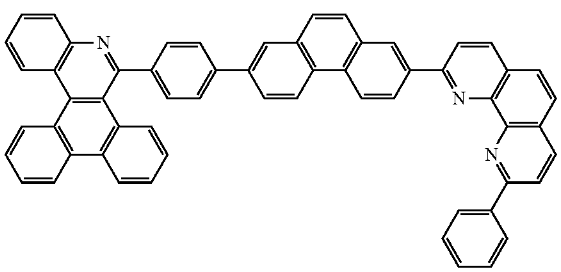
3-10
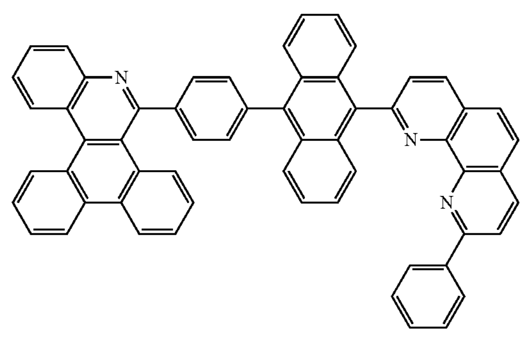
3-11
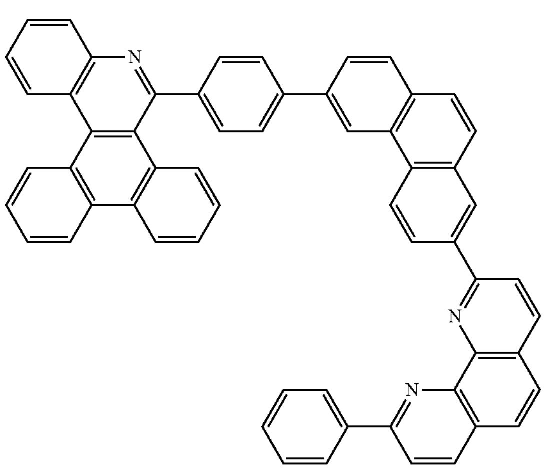
3-13
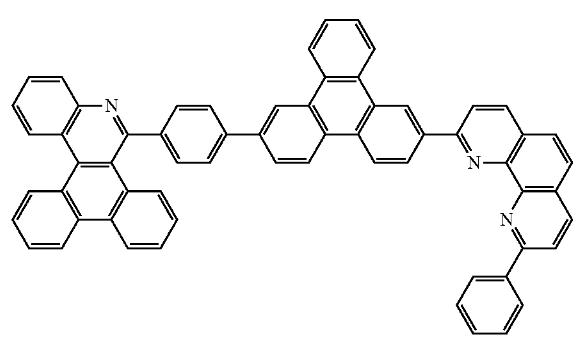

-continued
3-14
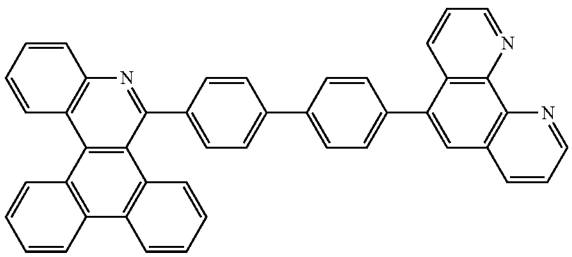
3-15
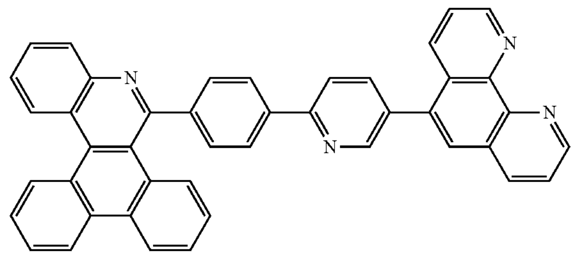
3-16
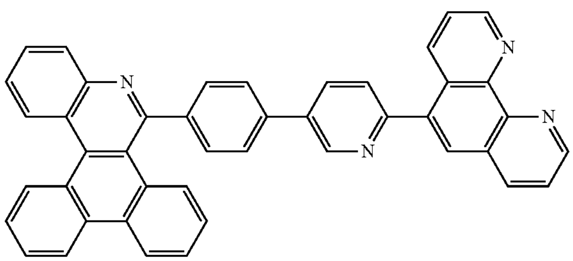
3-17
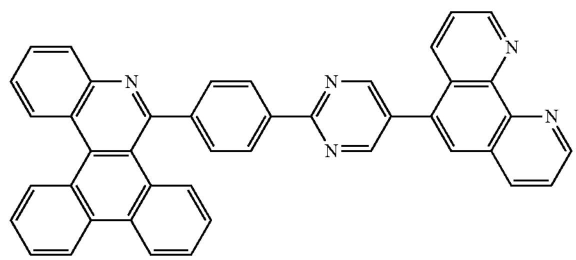
3-18
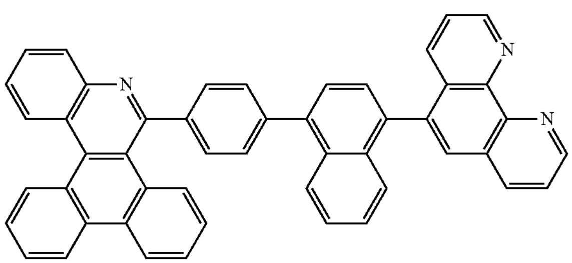
3-19
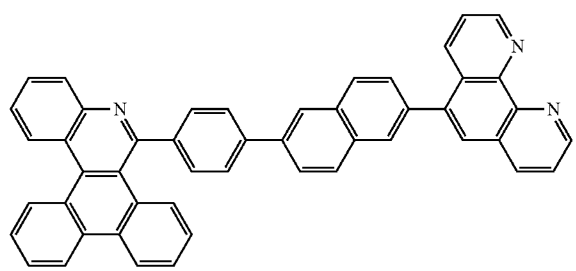
3-20
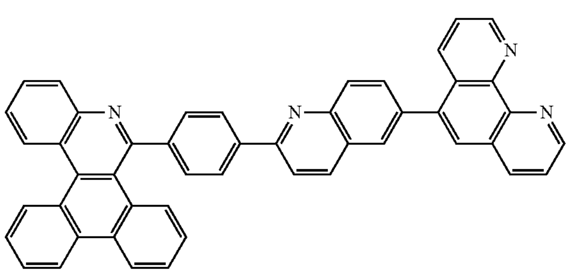
3-21
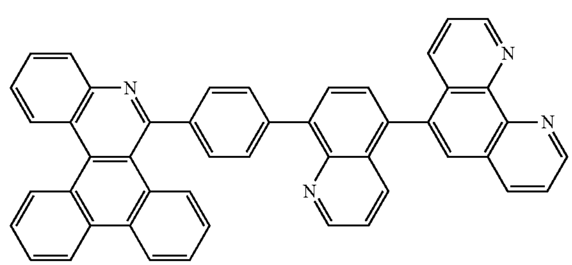
3-22
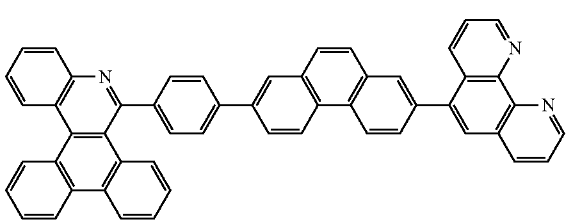
3-23
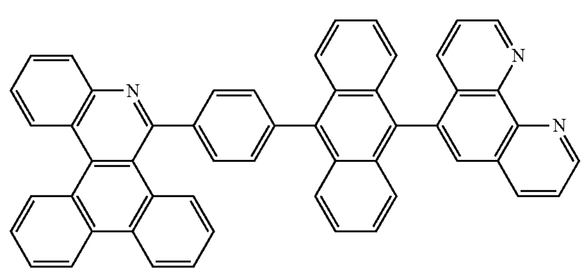

-continued
3-24
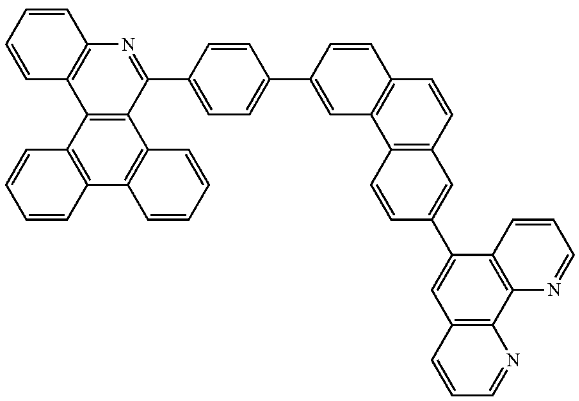
3-25
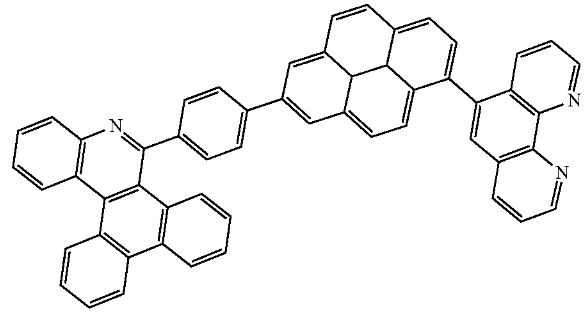
3-26
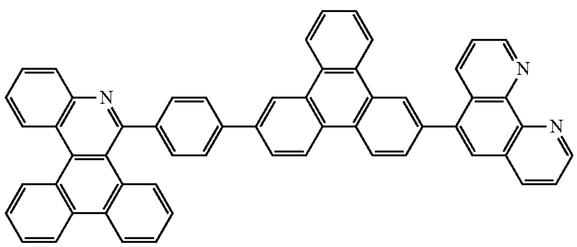
3-27
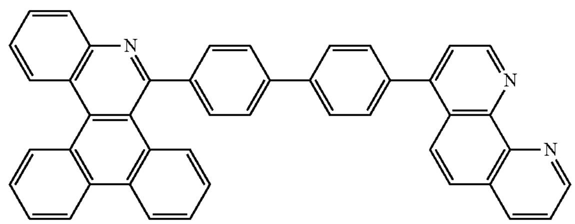
3-28
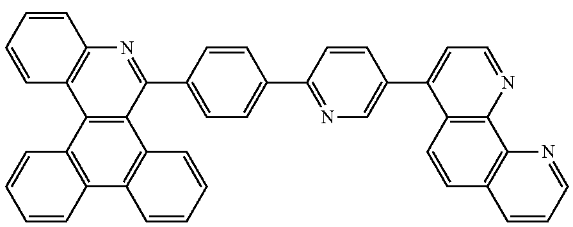
3-29
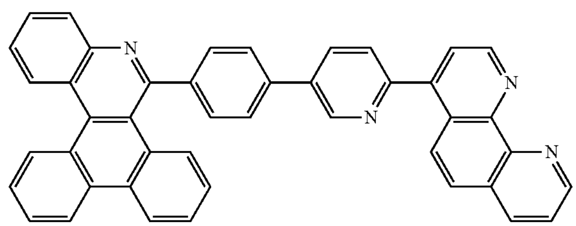
3-30
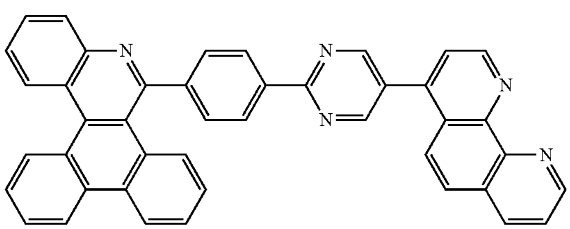
3-31
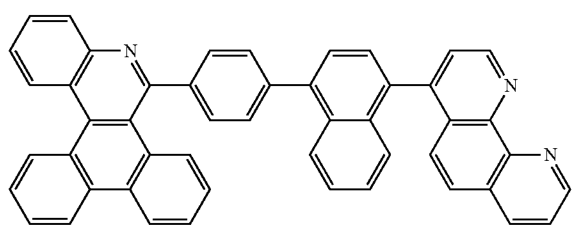
3-32
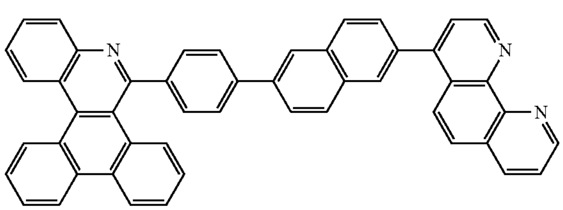
3-33
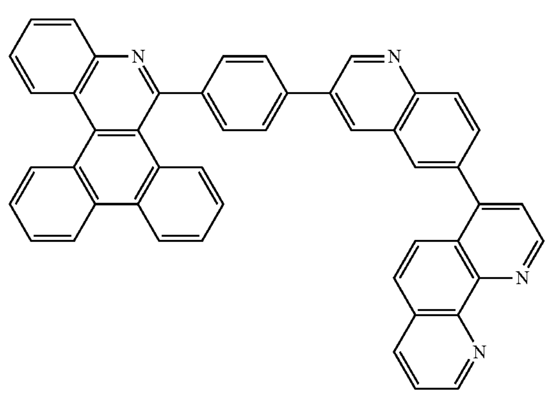

-continued
3-34
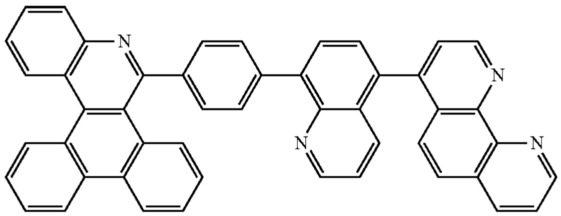
3-35
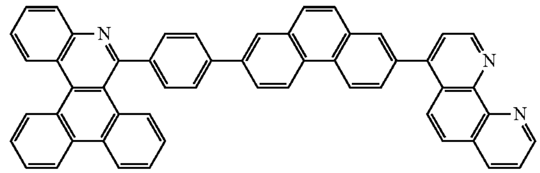
3-36
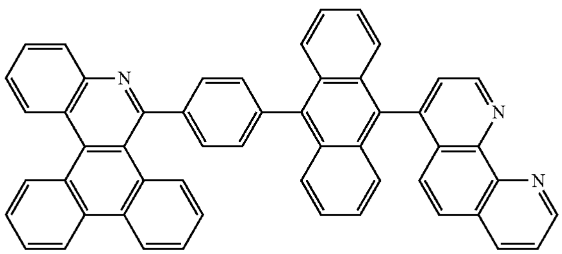
3-37
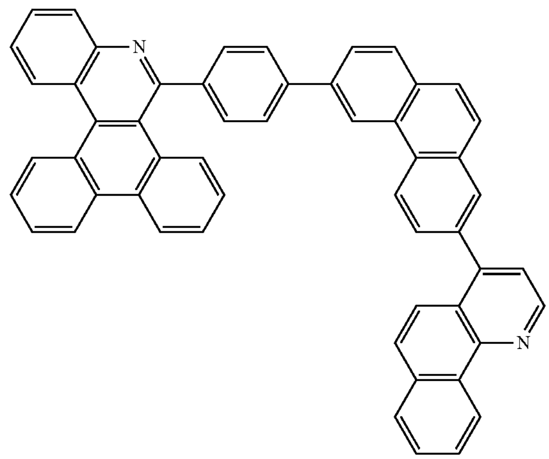
3-38
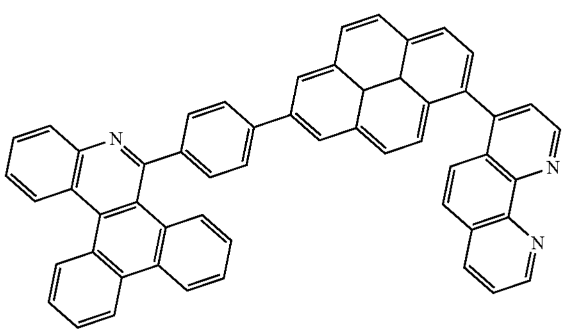
3-39
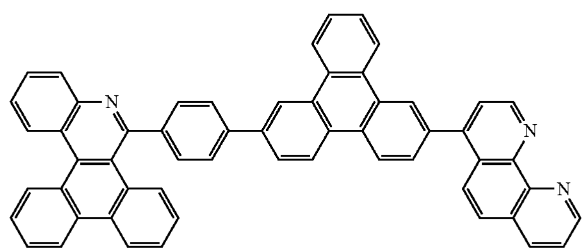
4-1
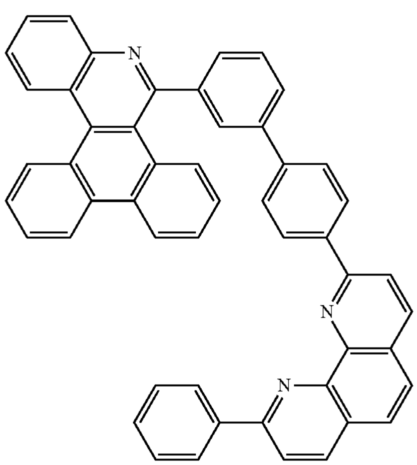
4-2
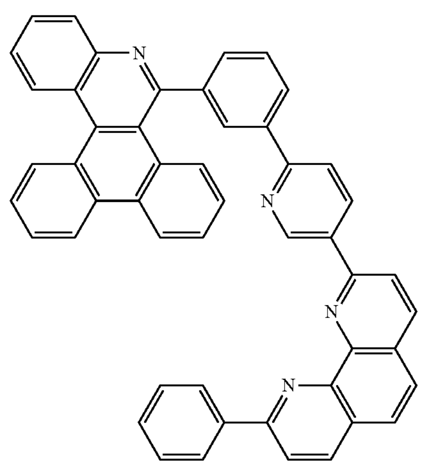

-continued
4-3
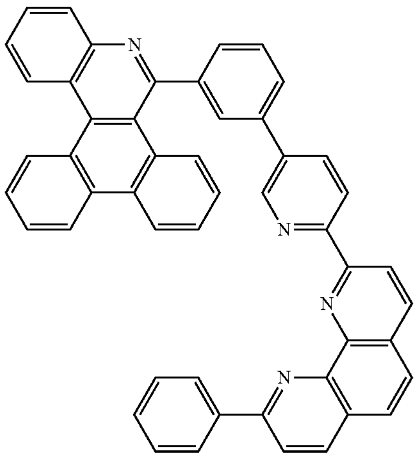
4-4
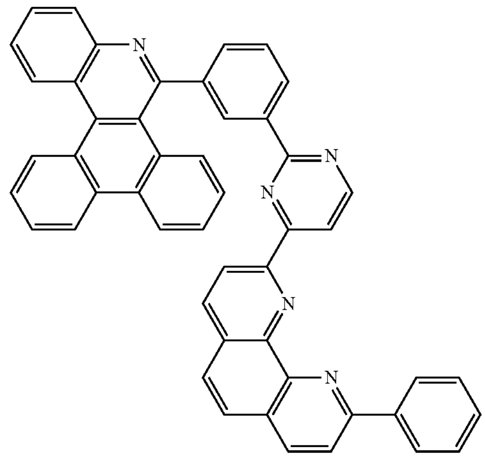
4-5
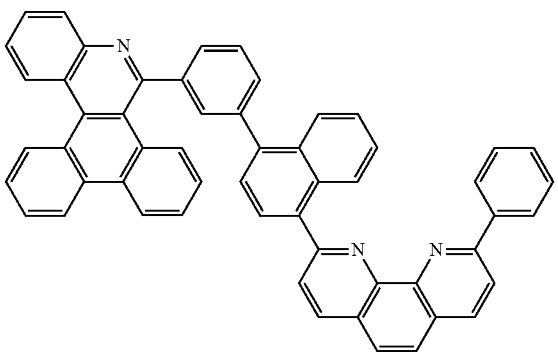
4-6
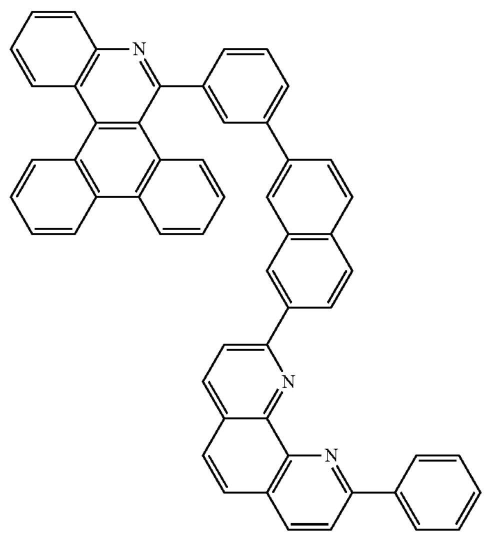
4-7
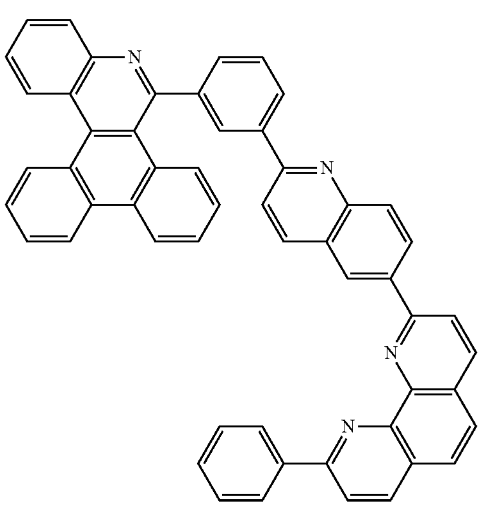
4-8
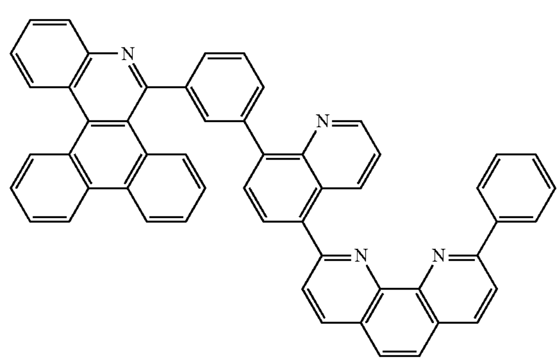

-continued
4-9
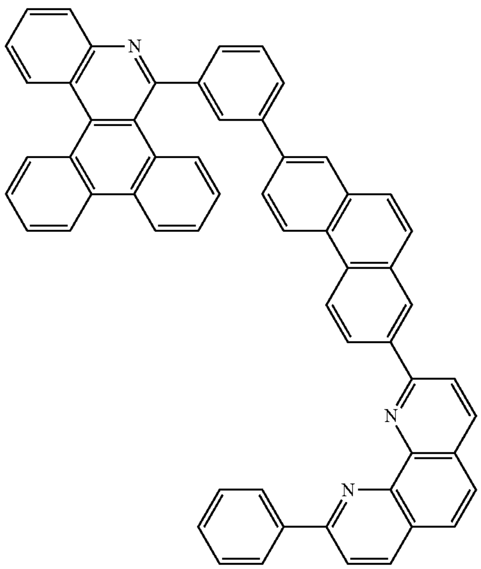
4-10
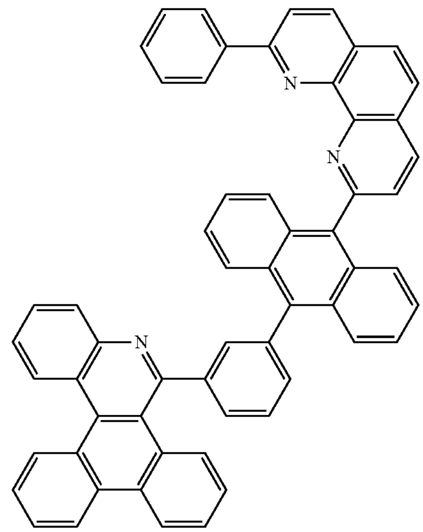
4-11
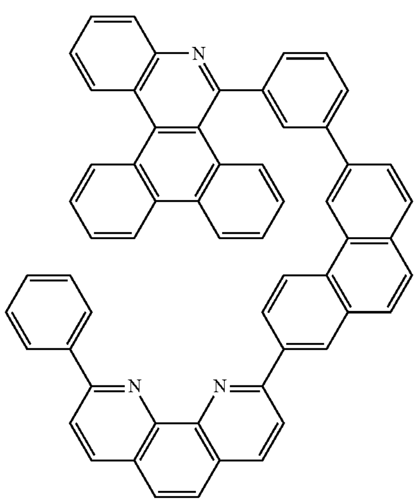
4-13
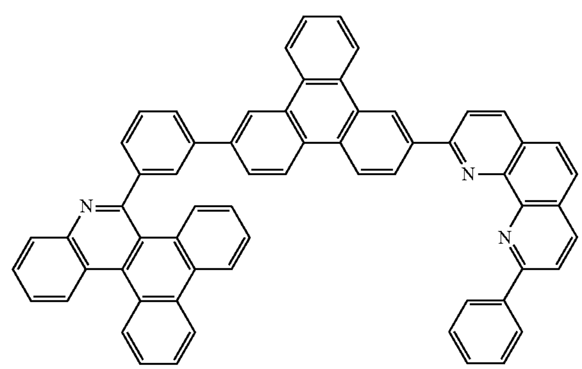
4-14
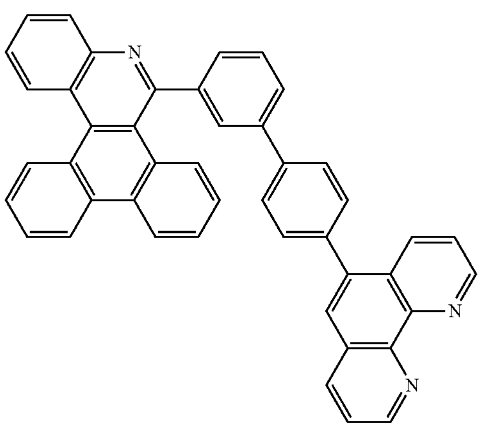
4-15
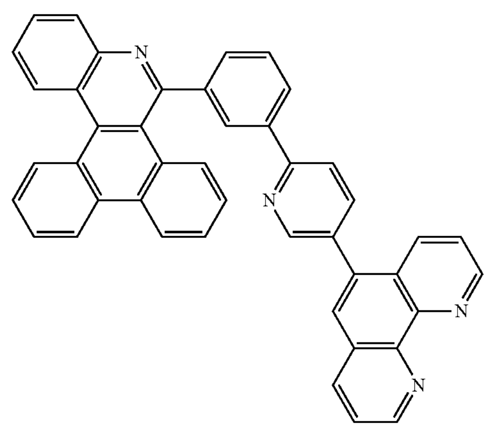

-continued
4-16
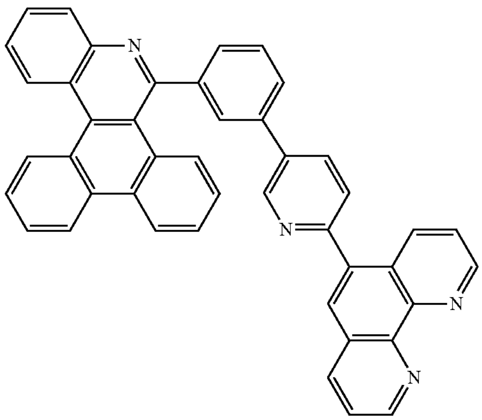
4-17
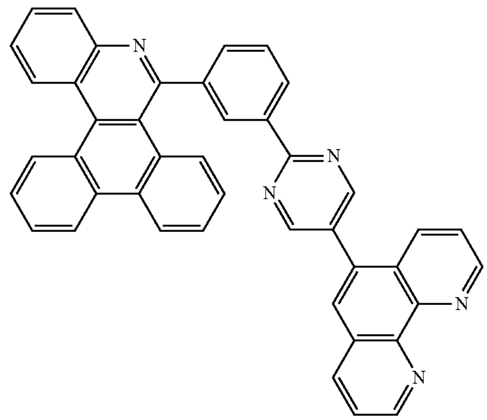
4-18
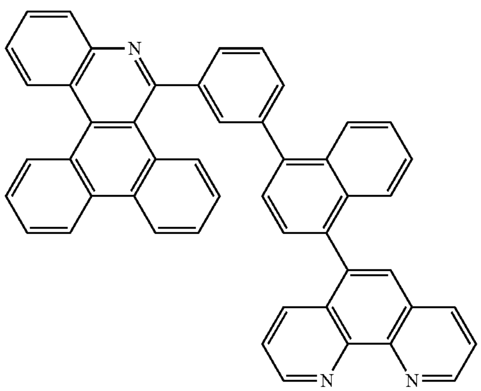
4-19
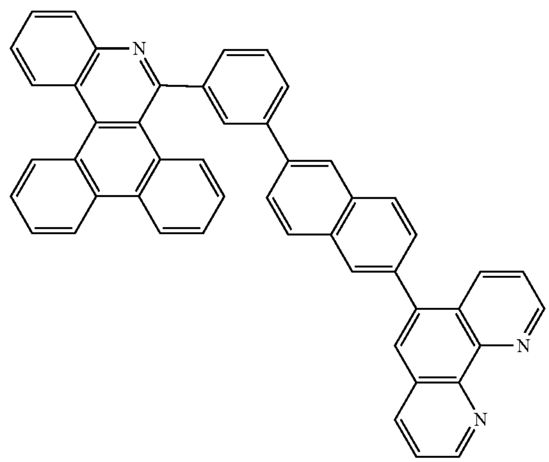
4-20
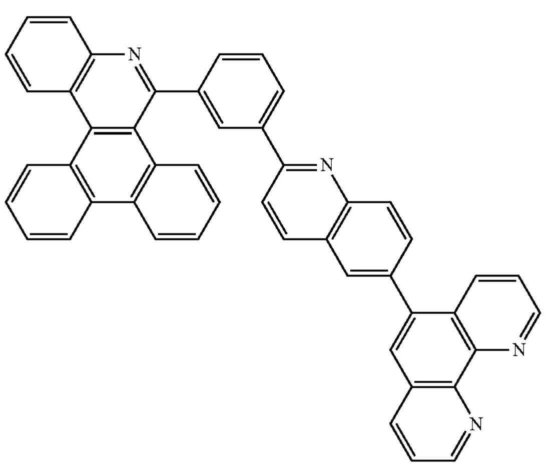
4-21
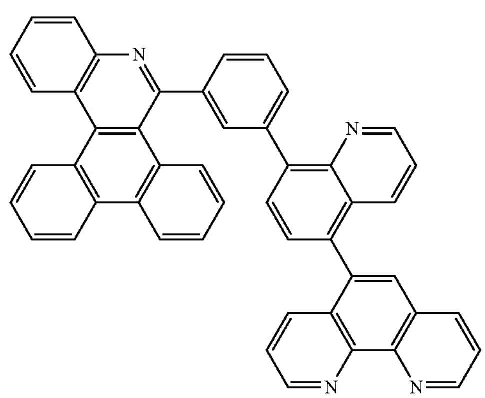

-continued
4-22
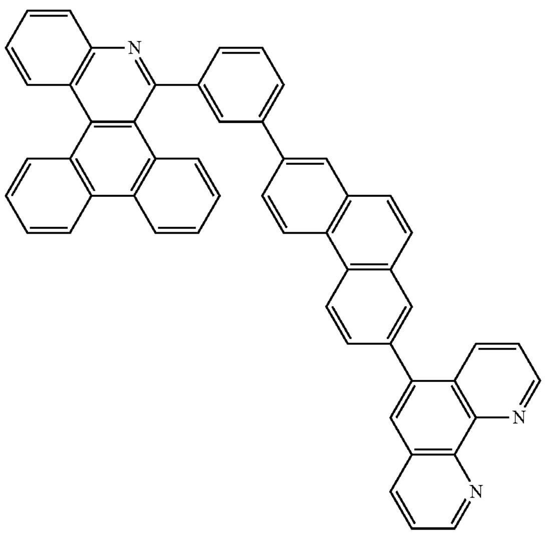
4-23
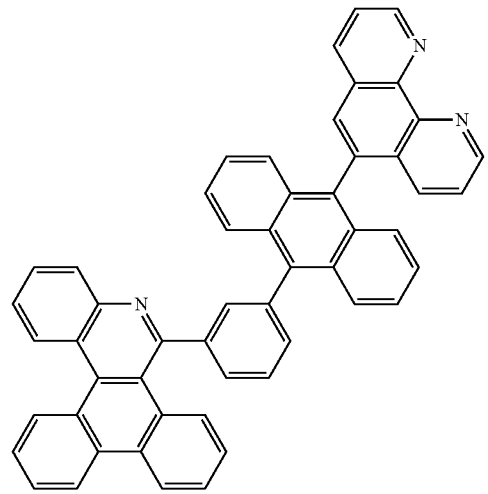
4-24
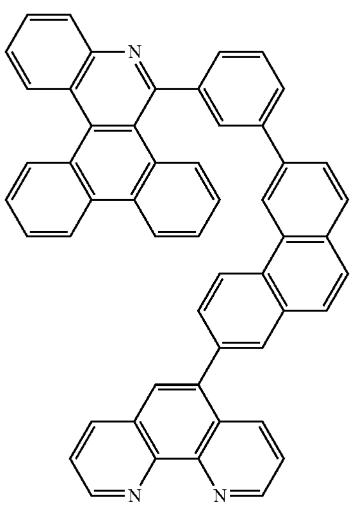
4-25
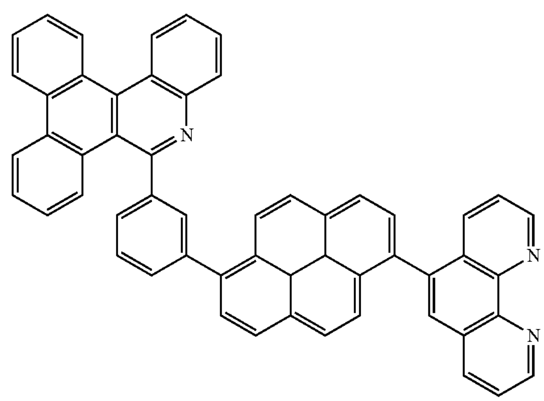
4-26
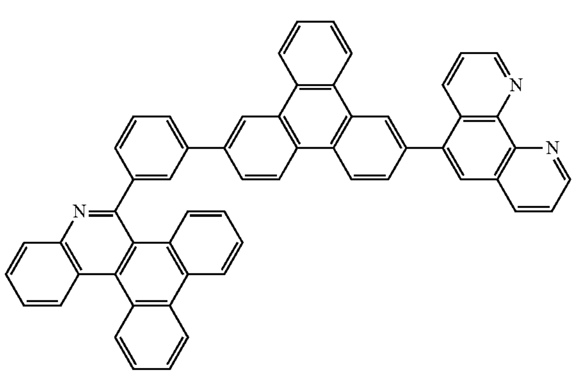
4-27
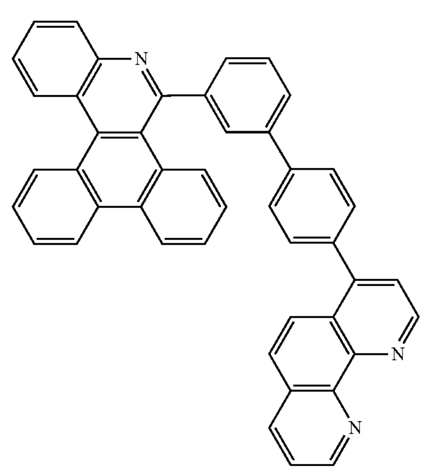

-continued
4-28
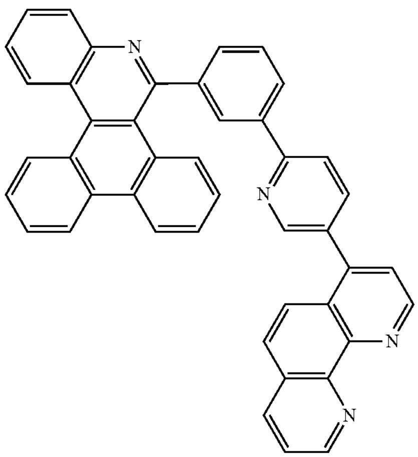
4-29
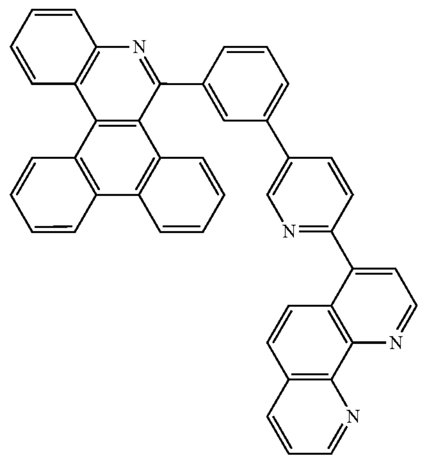
4-30
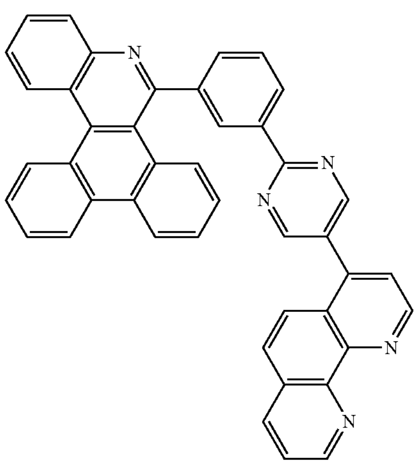
4-31
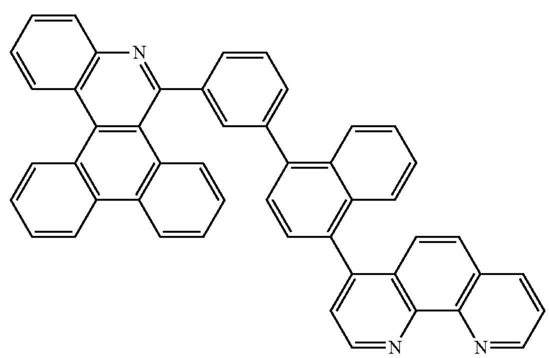
4-32
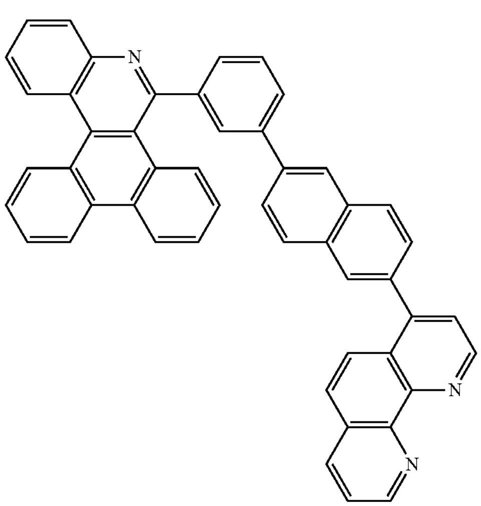
4-33
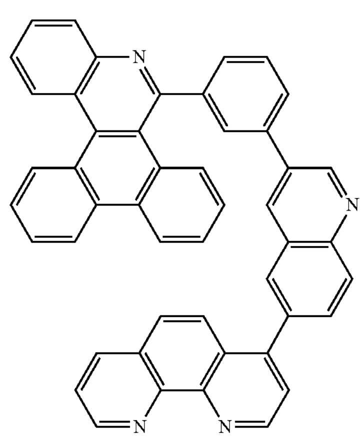

-continued
4-34
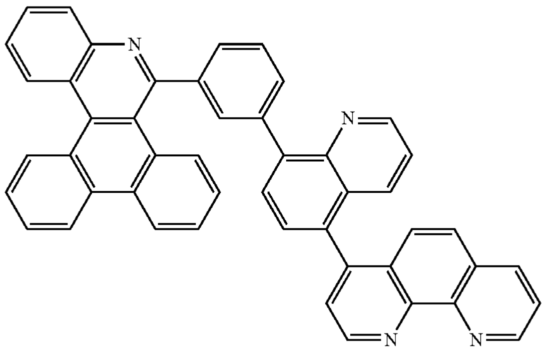
4-35
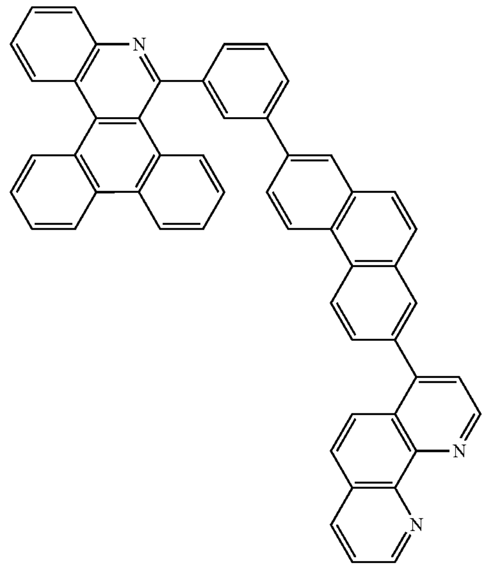
4-36
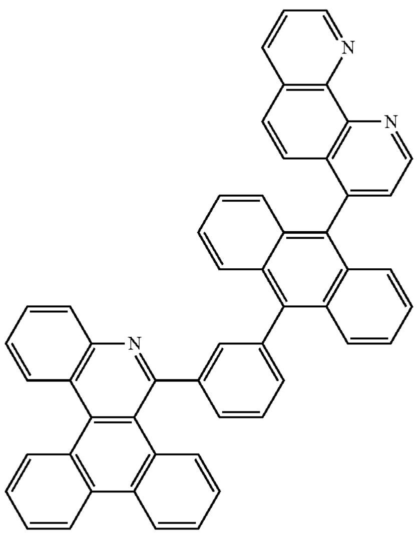
4-37
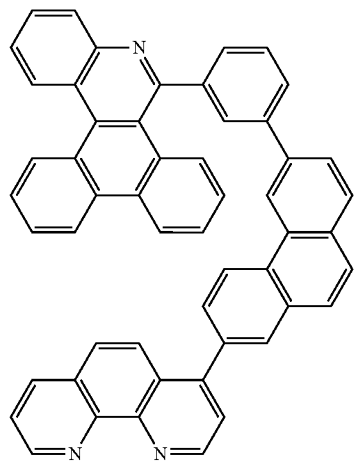
4-38
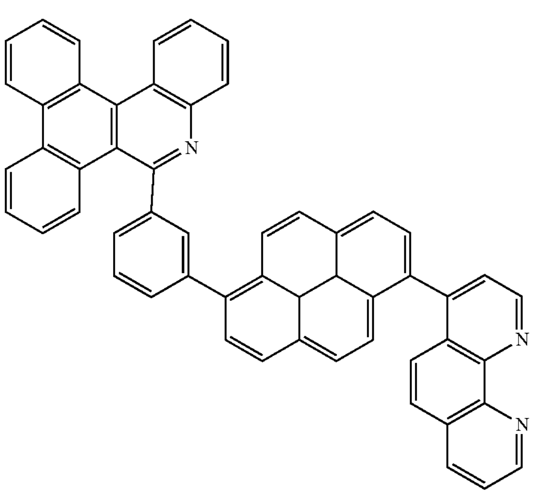
4-39
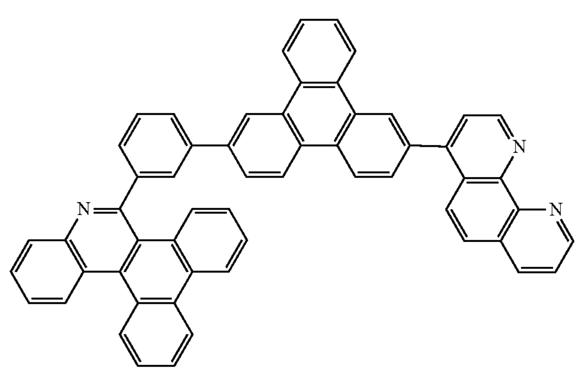

-continued
5-1
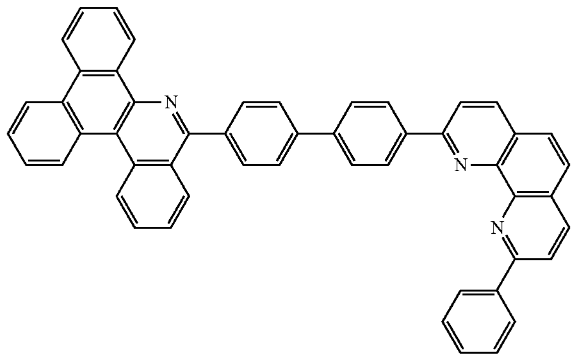
5-2
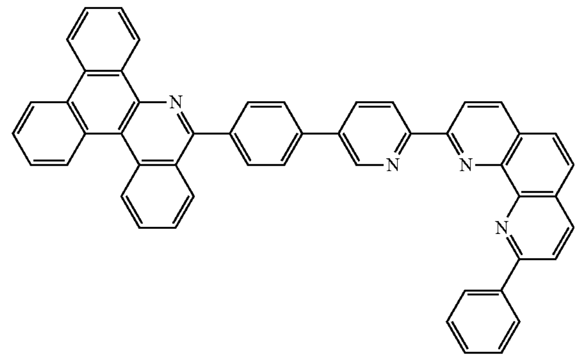
5-3
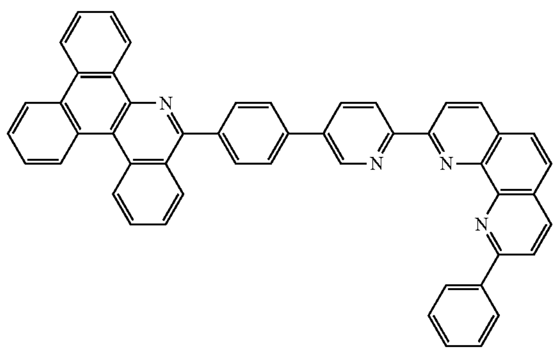
5-5
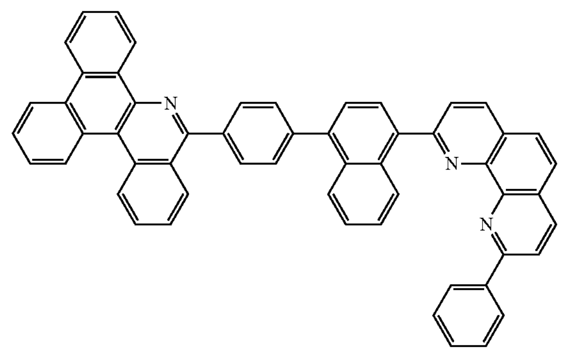
5-7
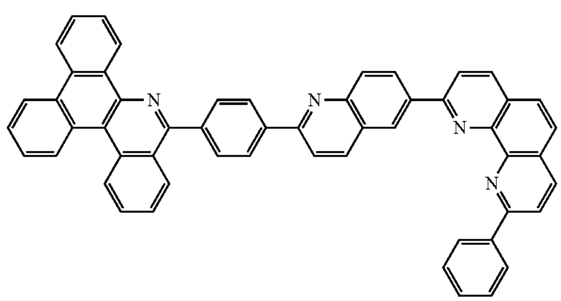
5-8
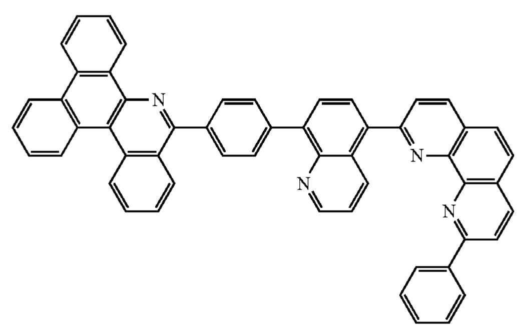
5-9
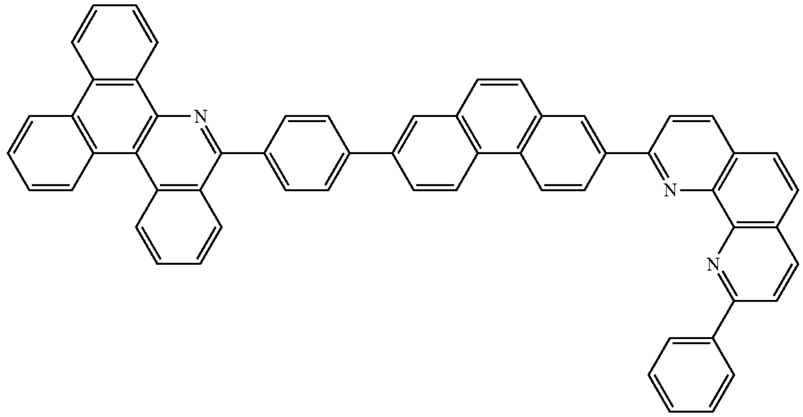

-continued
5-10
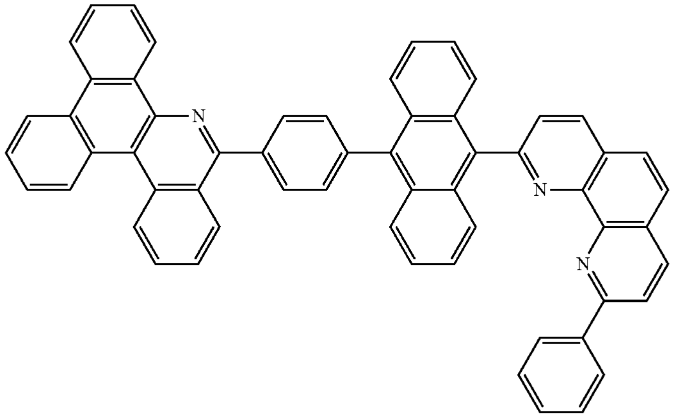
5-13
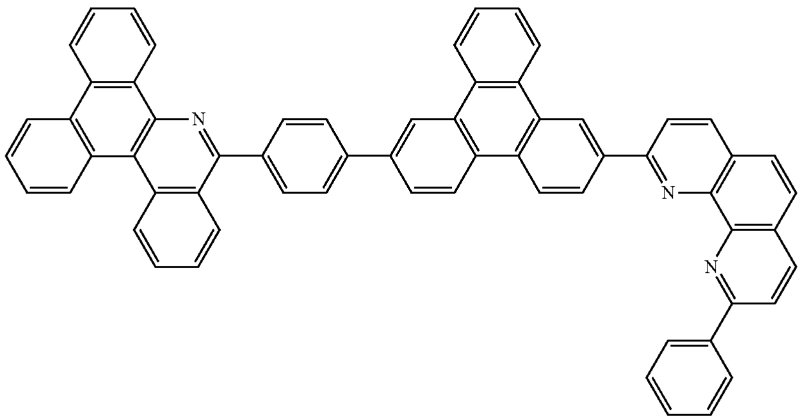
5-14
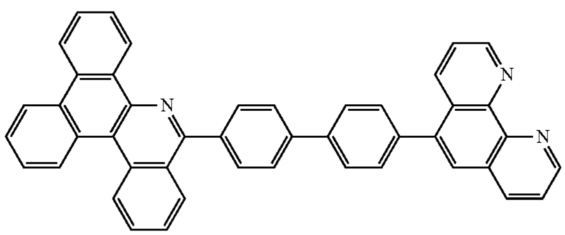
5-15
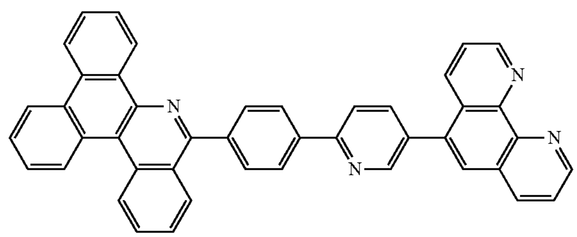
5-16
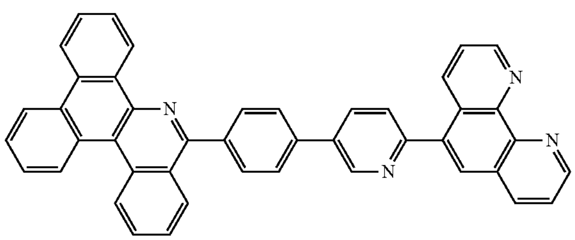
5-17
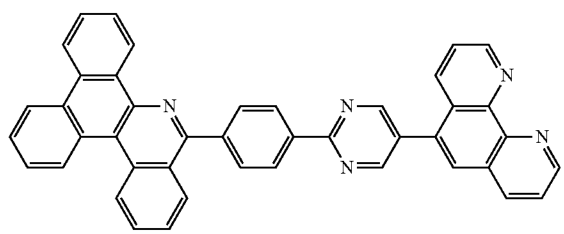
5-18
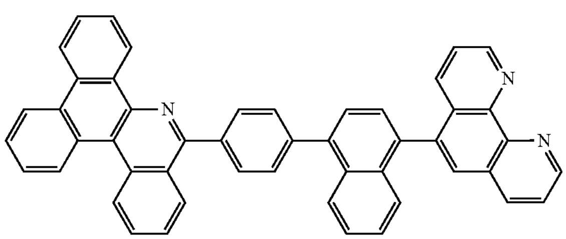
5-19
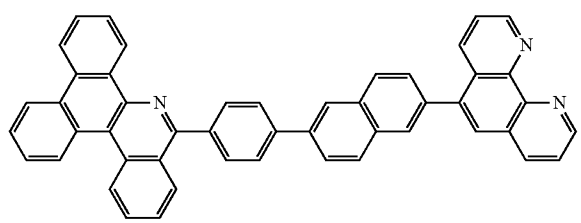

-continued
5-20
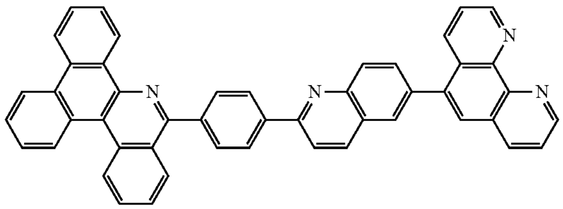
5-21
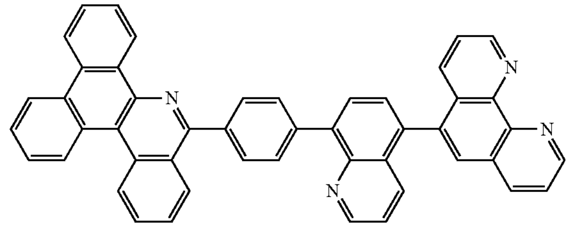
5-22
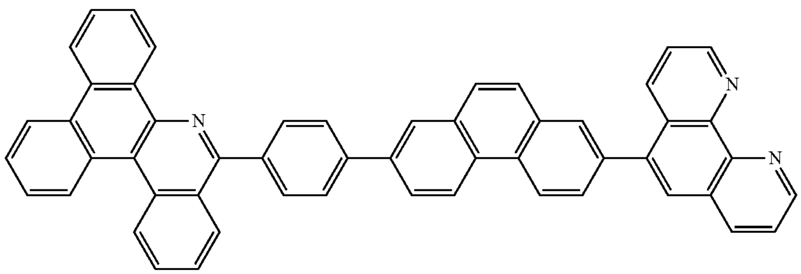
5-23
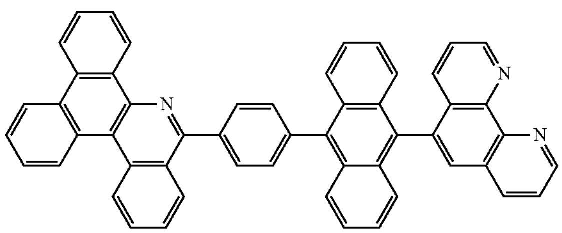
5-24
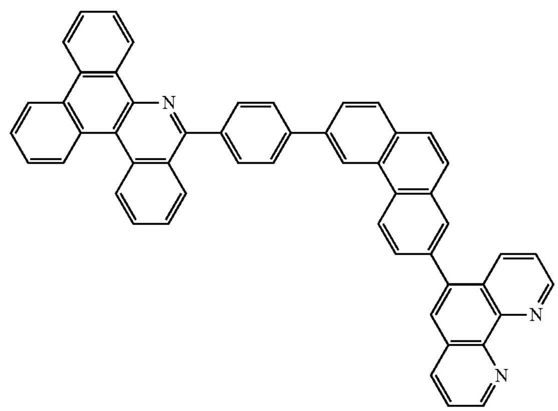
5-25
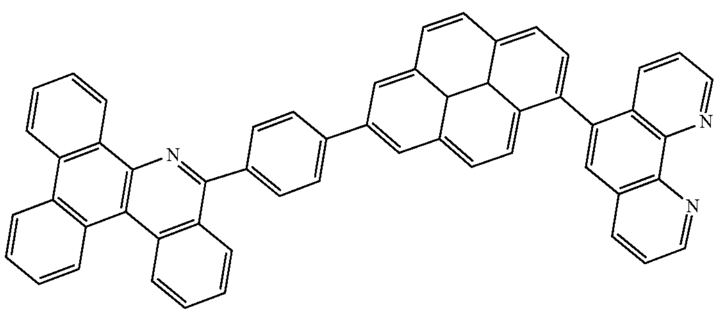
5-26
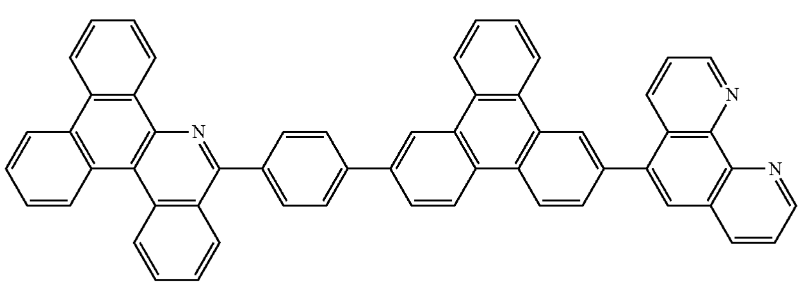

-continued
5-27
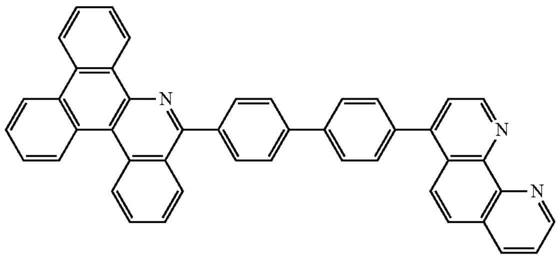
5-28
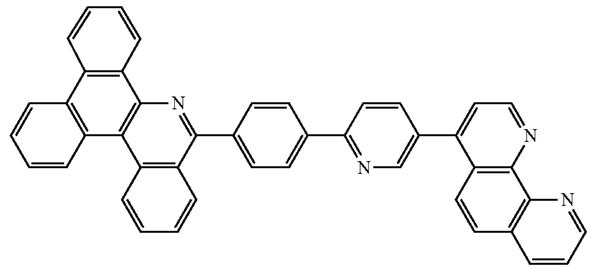
5-29
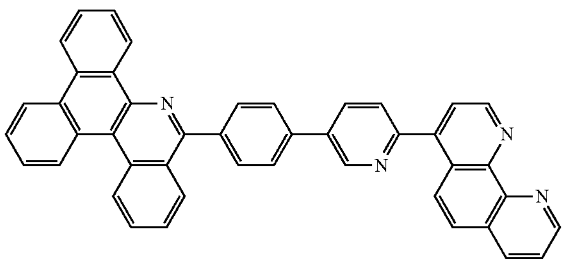
5-30
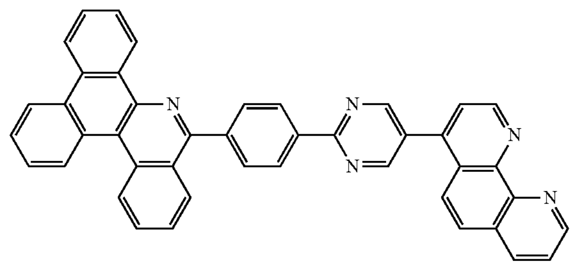
5-31
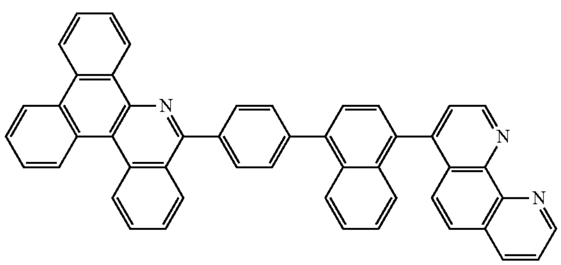
5-32
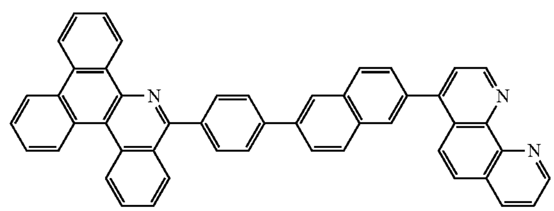
5-33
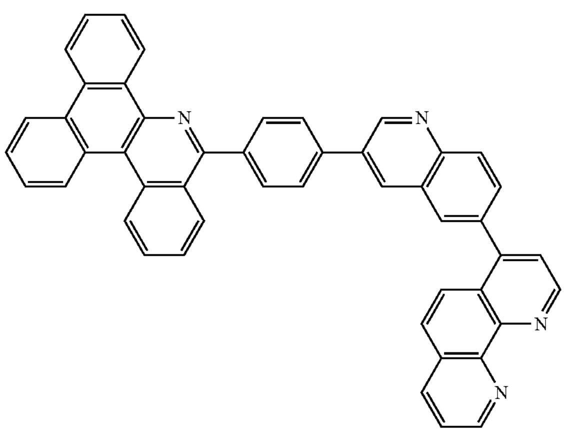
5-34
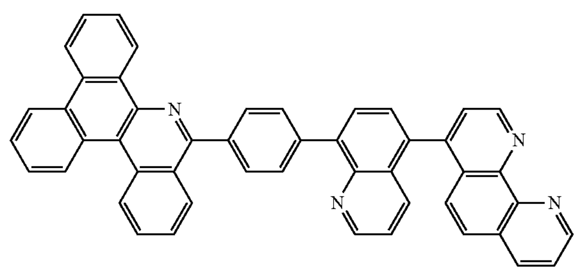
5-35
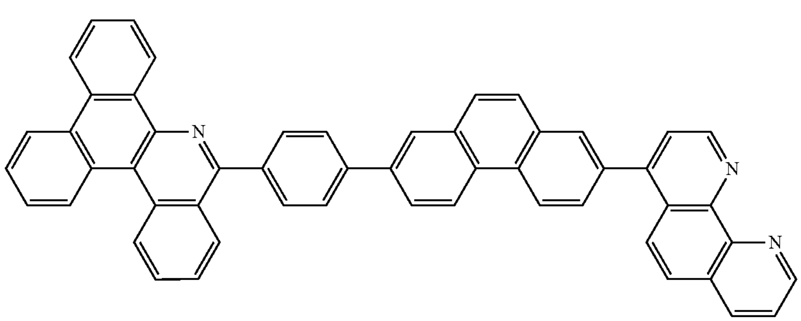

-continued
5-36
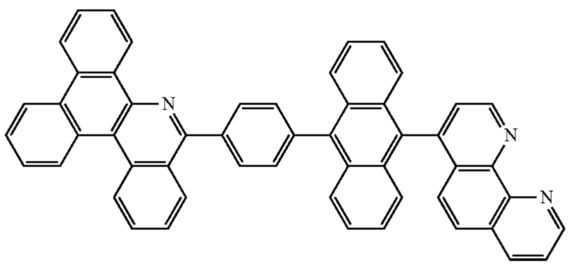
5-37
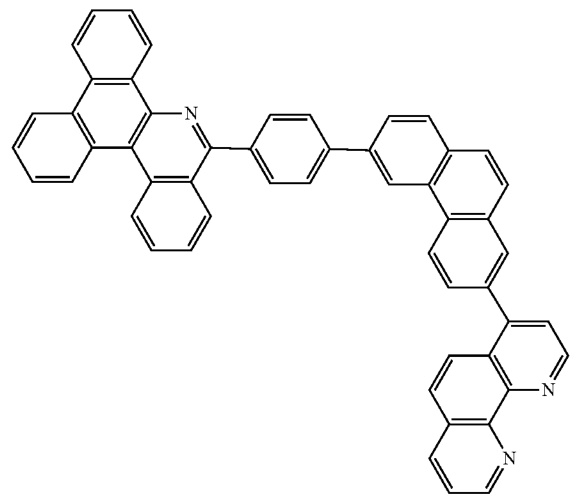
5-38
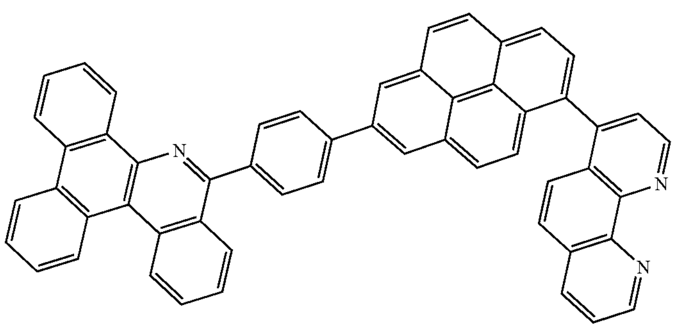
5-39
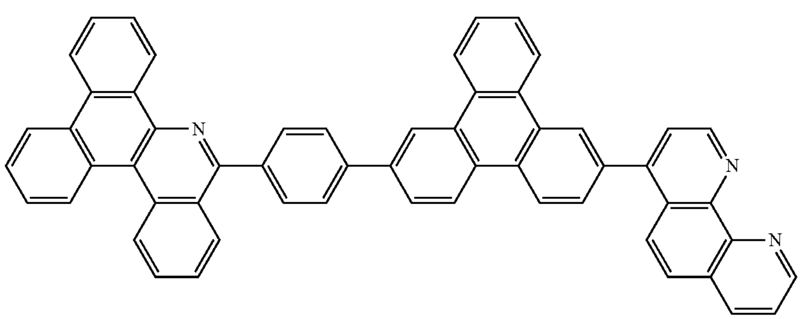

-continued
6-1
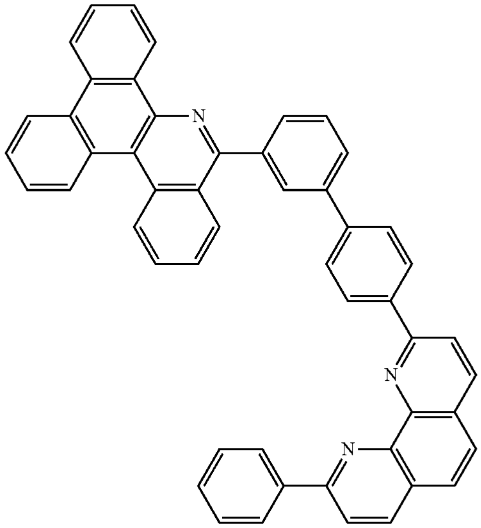
6-2
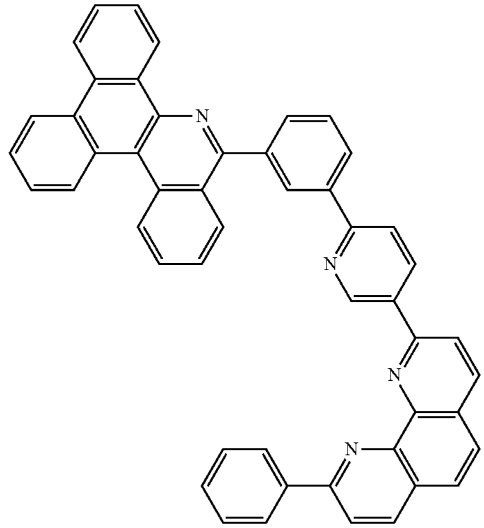
6-3
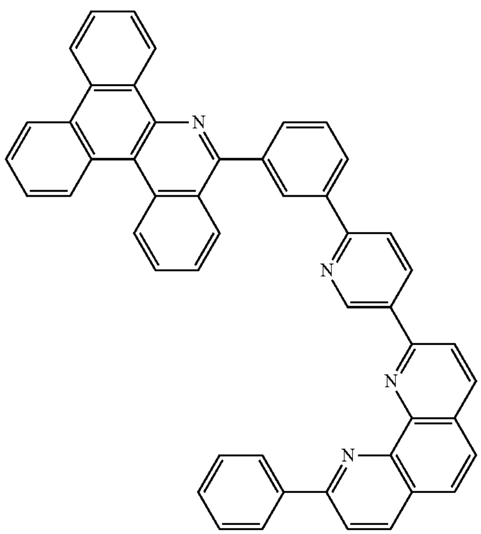
6-5
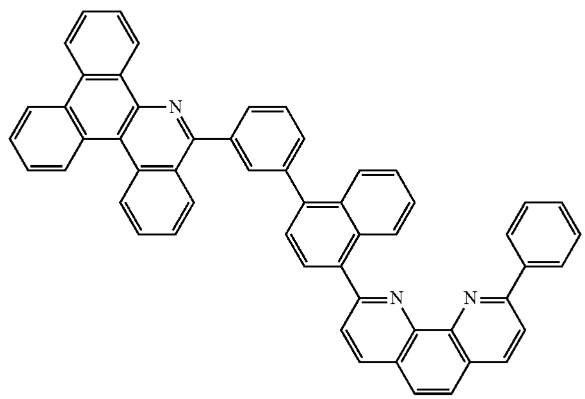
6-6
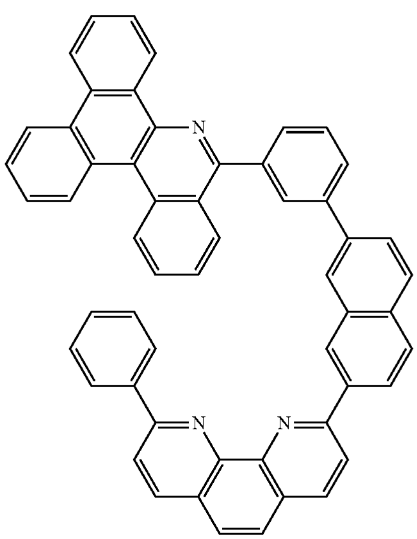
6-7
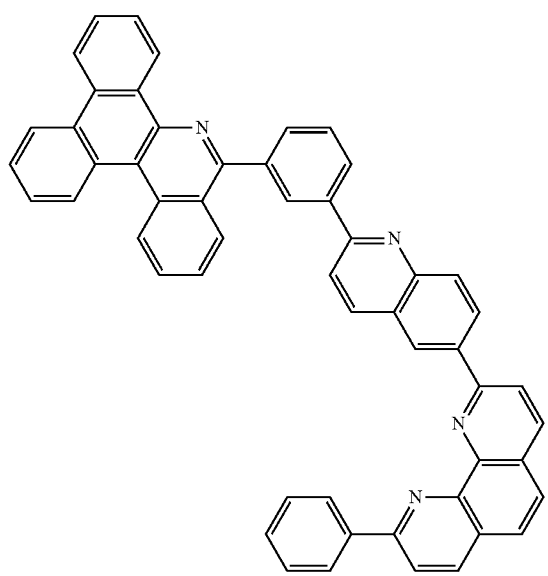

-continued
6-8
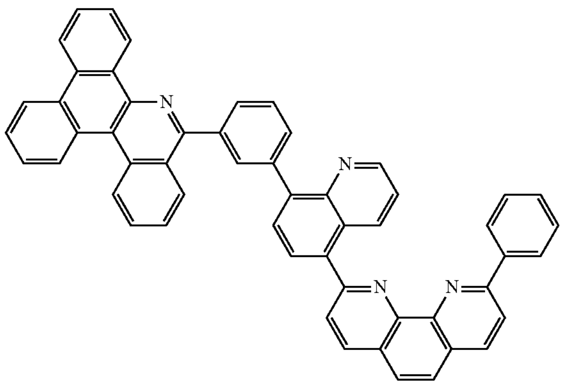
6-9
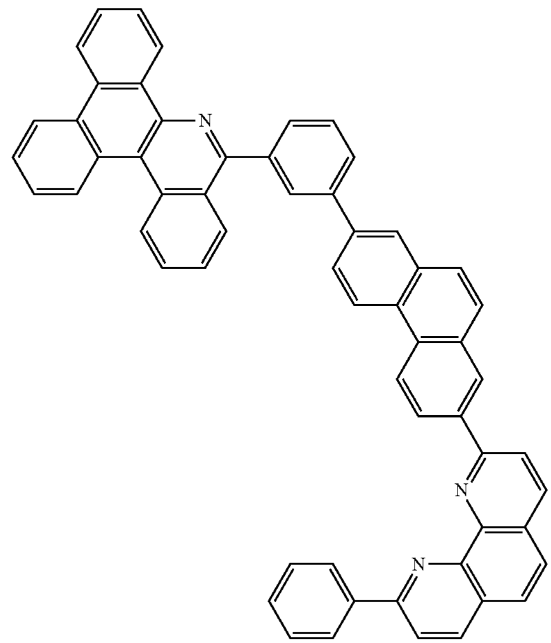
6-10
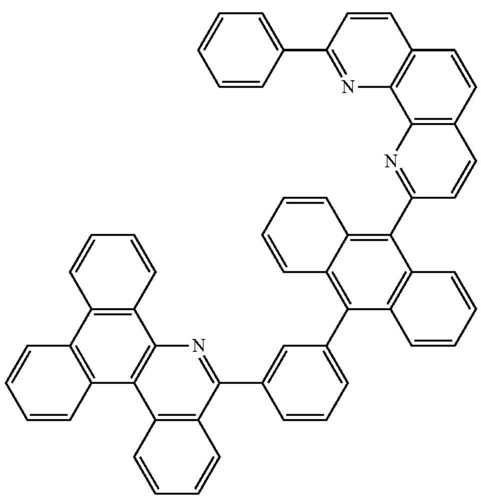
6-11
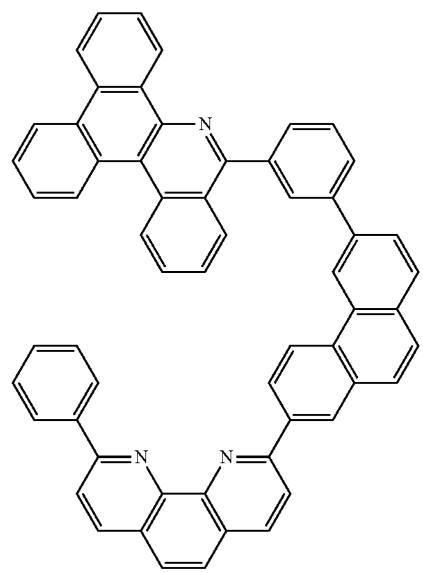
6-13
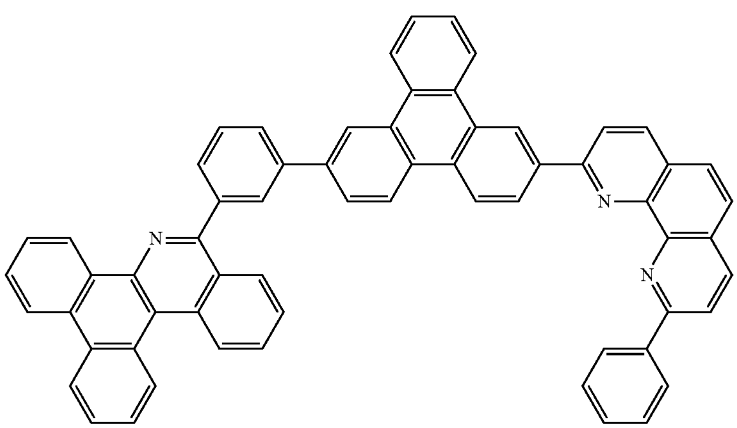

-continued
6-14
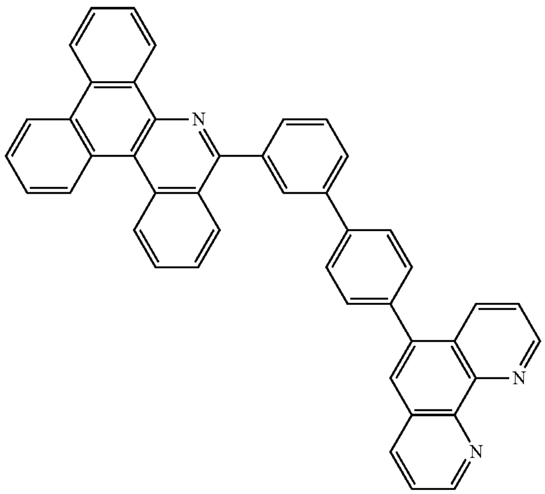
6-15
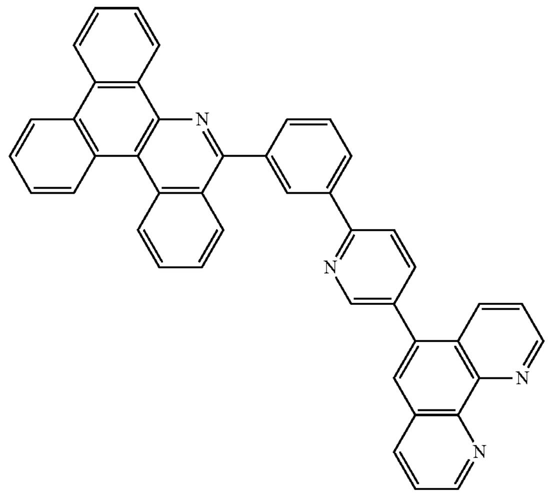
6-16
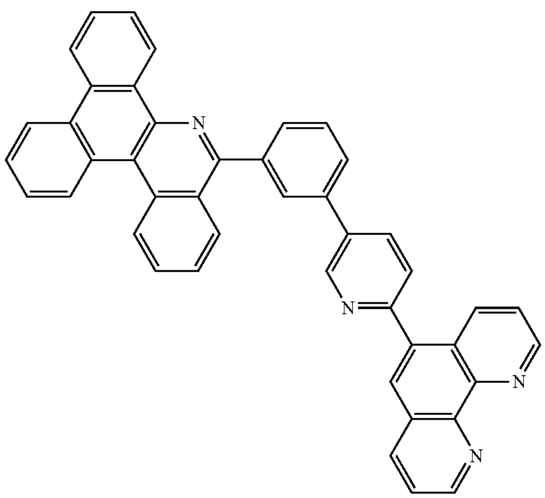
6-17
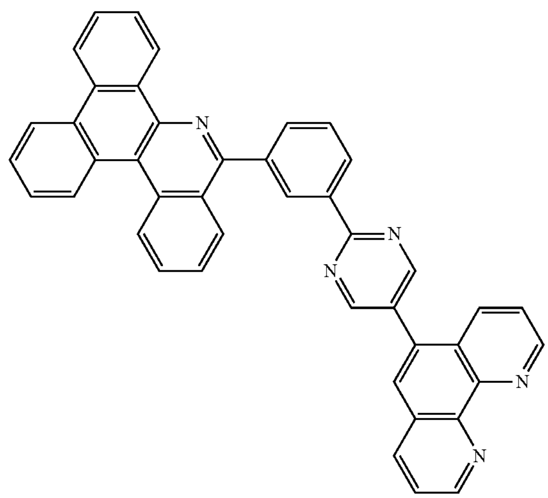
6-18
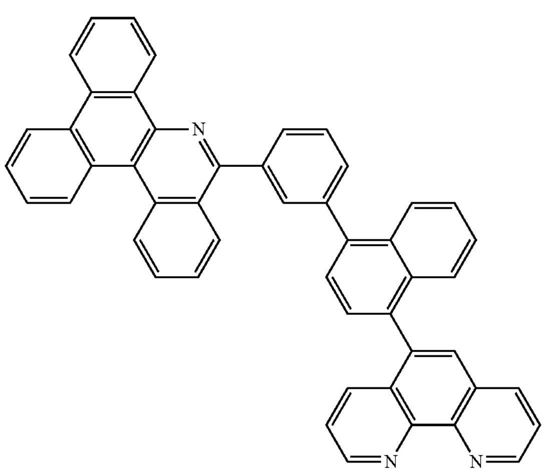
6-19
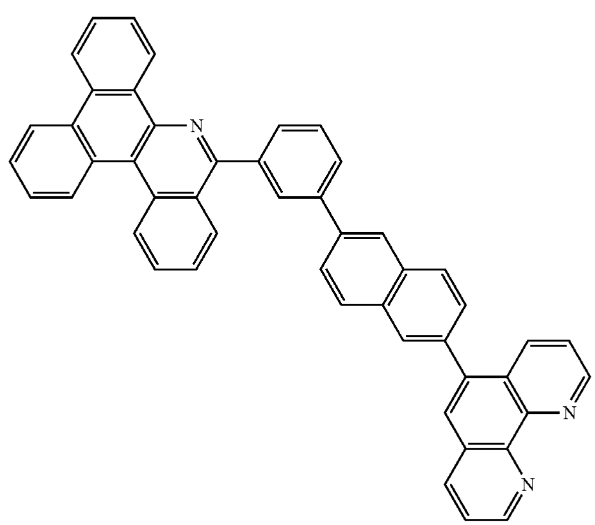

-continued
6-20
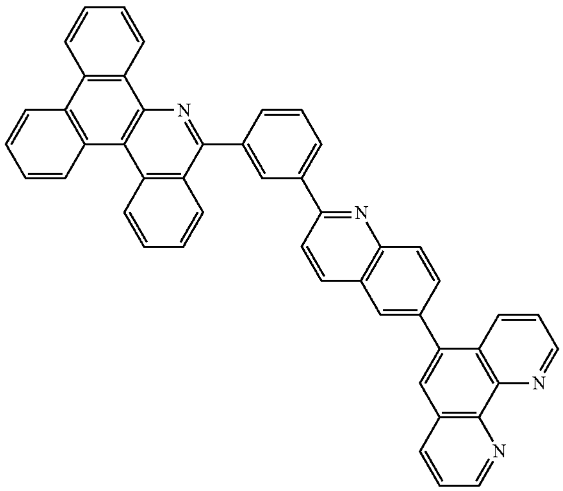
6-21
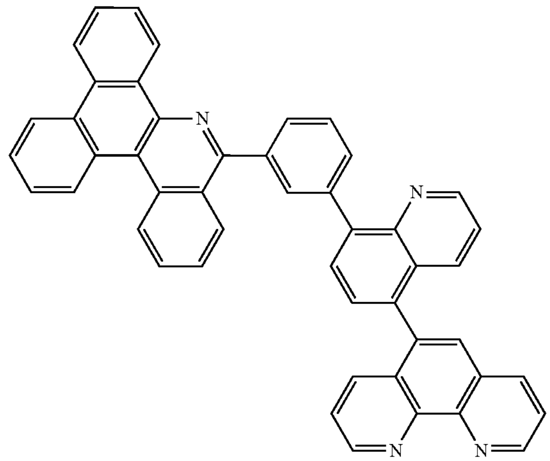
6-22
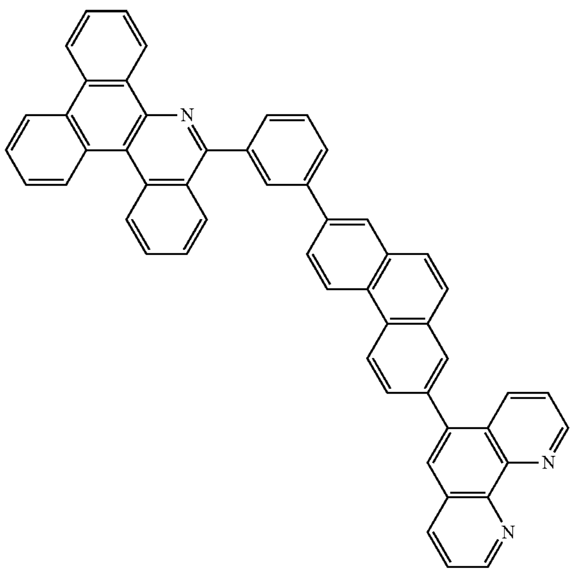
6-23
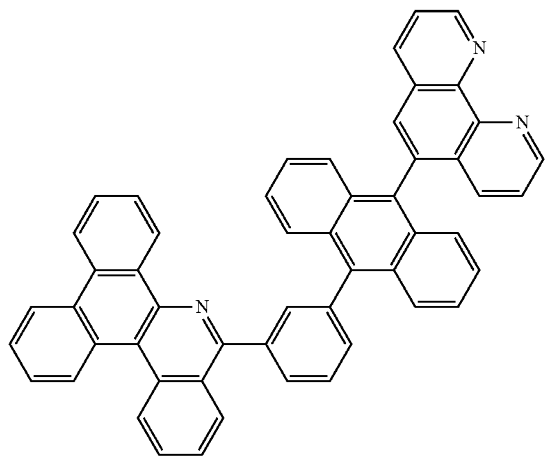
6-24
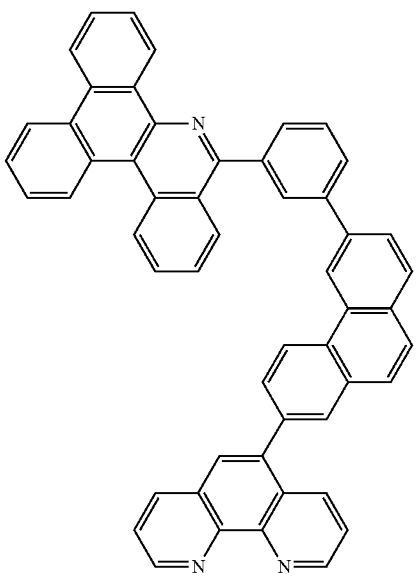
6-25
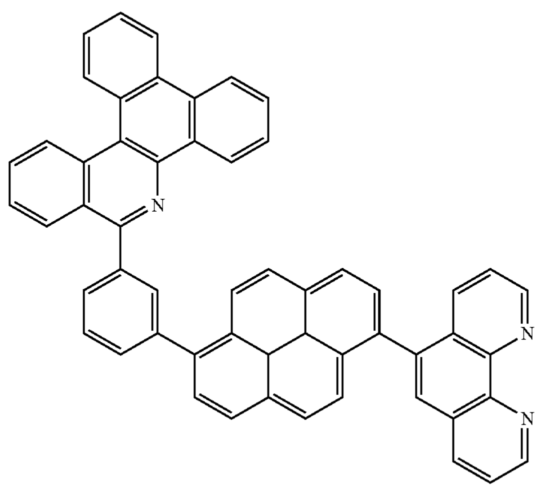

-continued
6-26
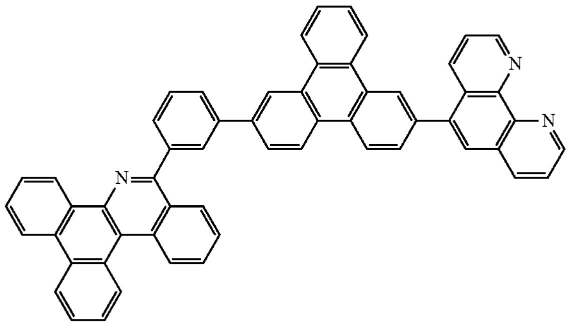
6-27
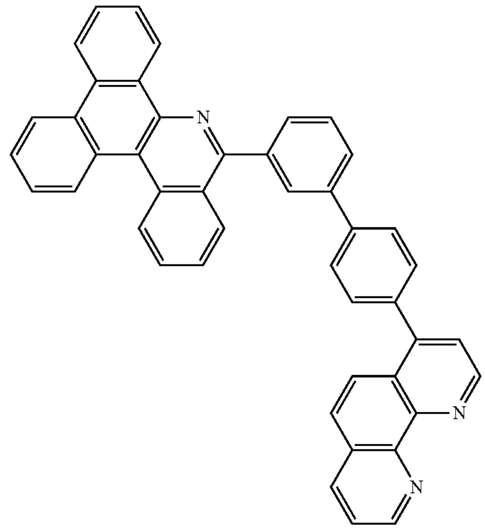
6-28
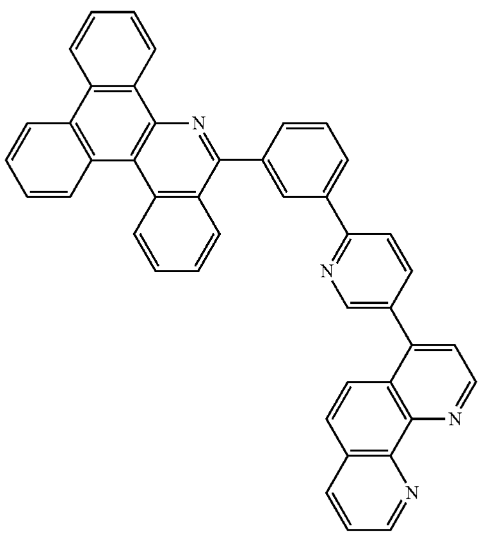
6-29
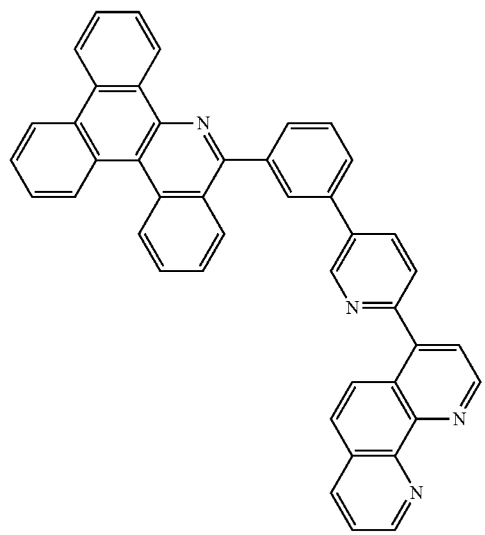
6-30
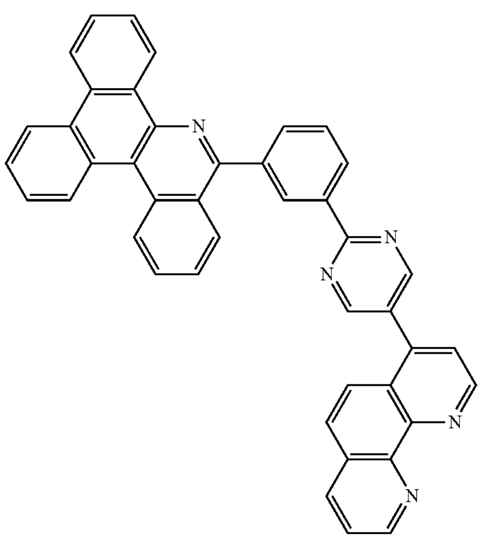
6-31
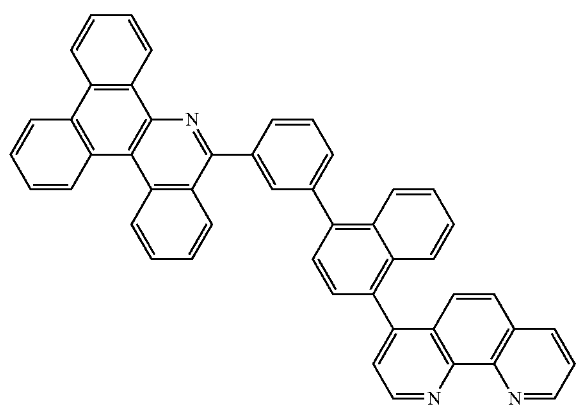

-continued
6-32
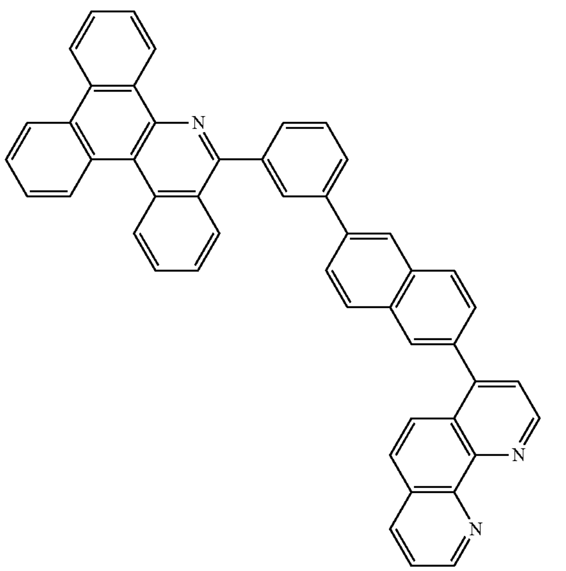
6-33
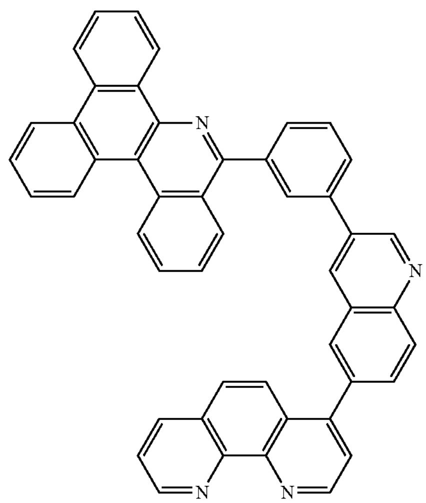
6-34
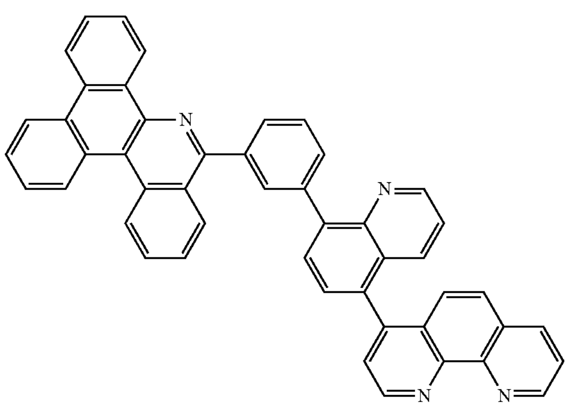
6-35
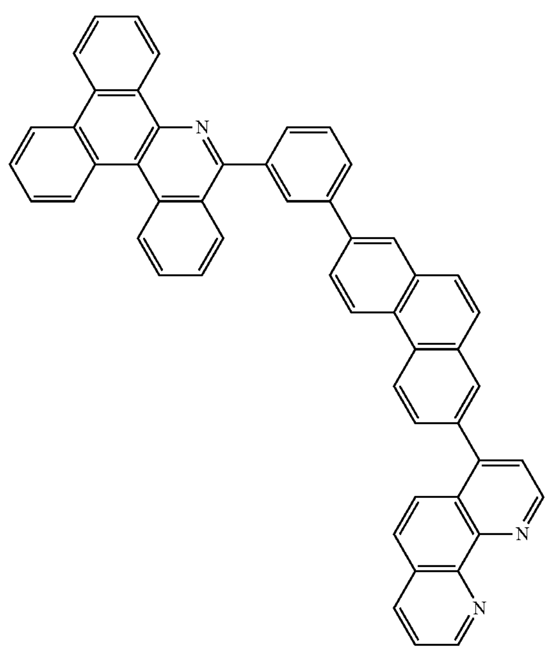

-continued
6-36
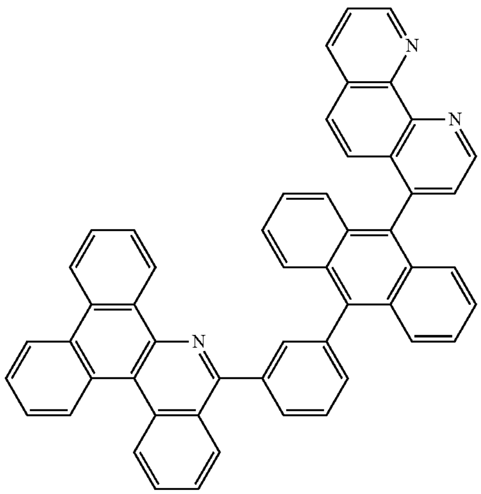
6-37
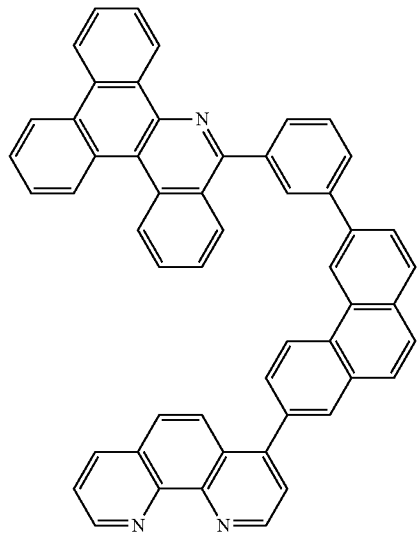
6-38
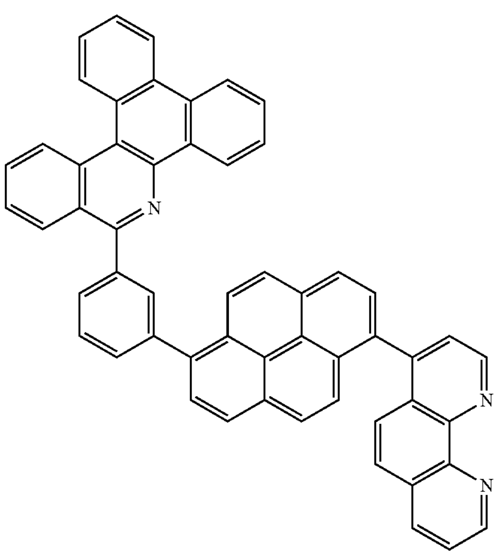
6-39
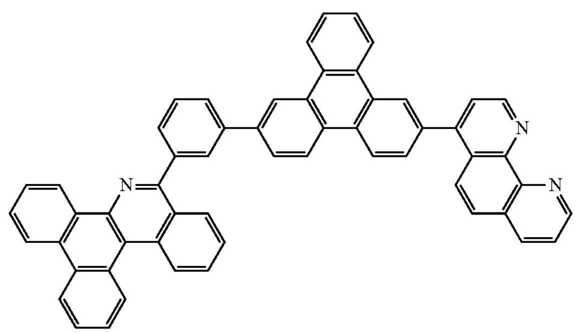
7-1
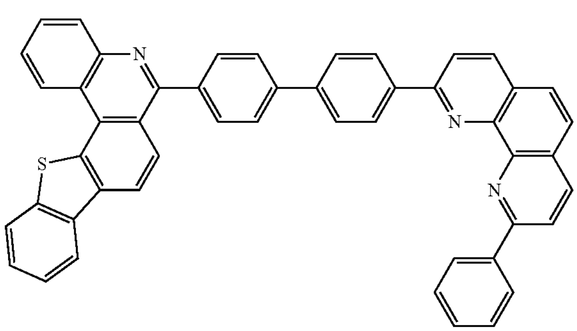
7-2
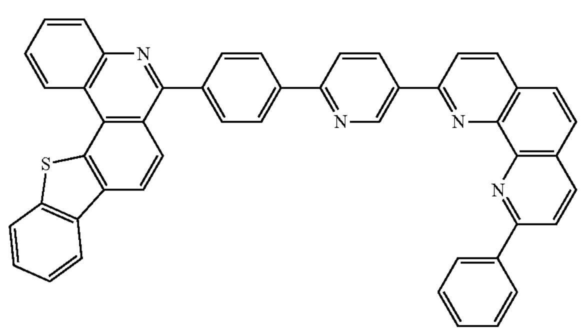

-continued
7-3
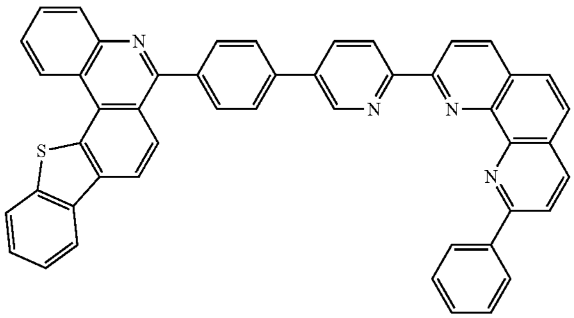
7-4
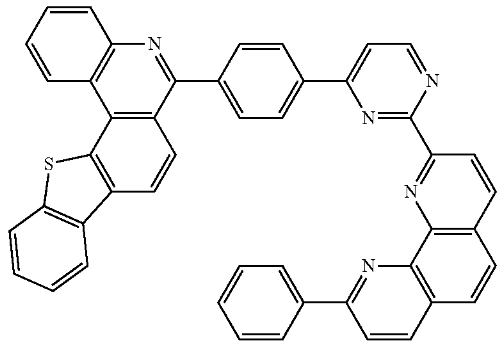
7-5
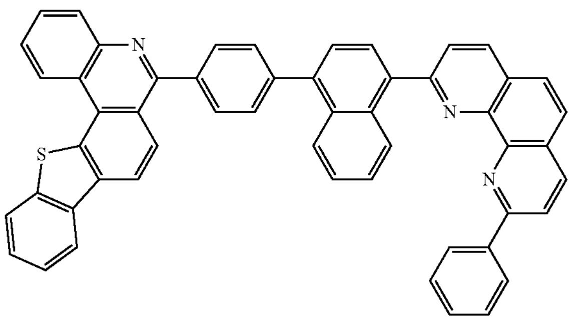
7-6
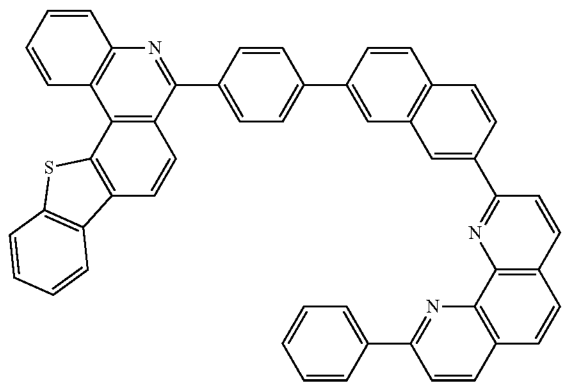
7-7
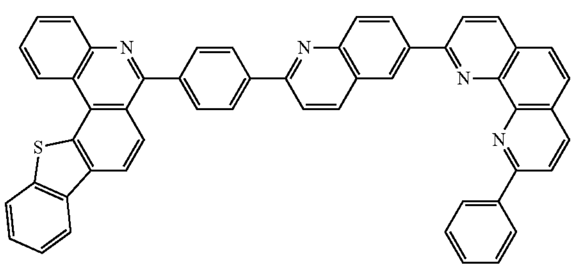
7-8
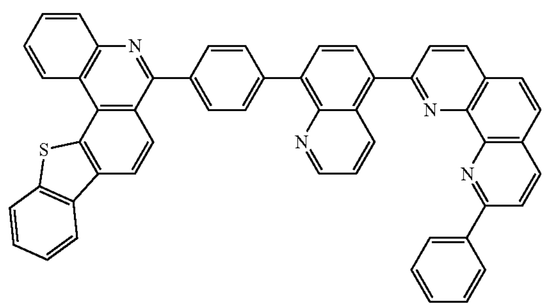
7-9
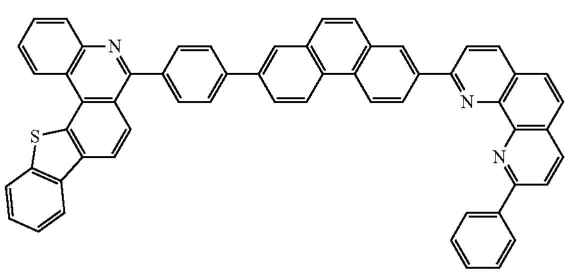
7-10
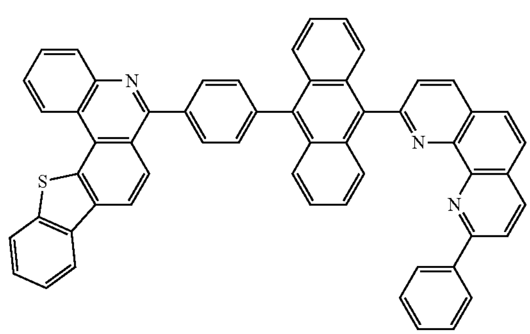

-continued
7-11
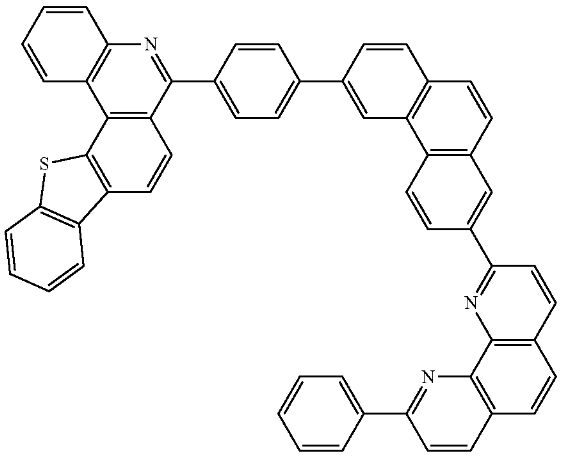
7-12
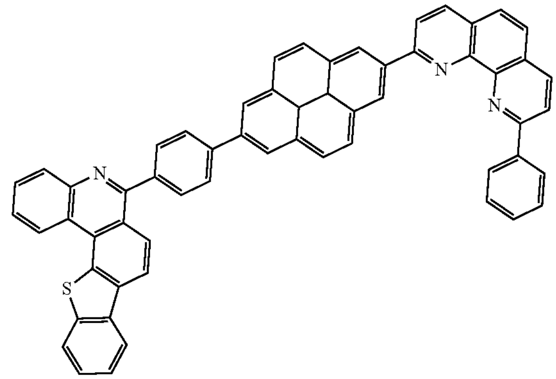
7-13
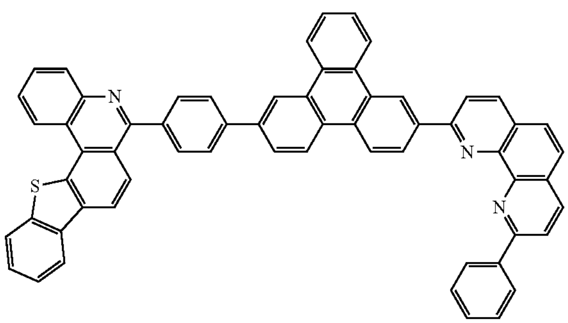
7-14
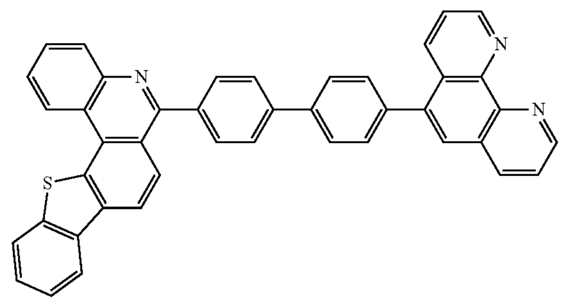
7-15
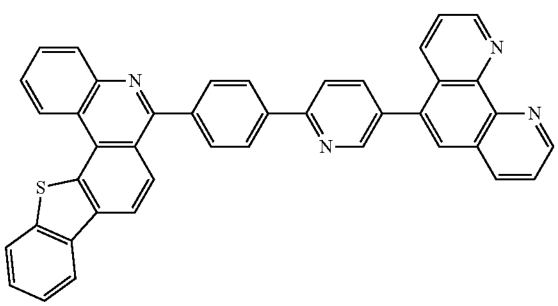
7-16
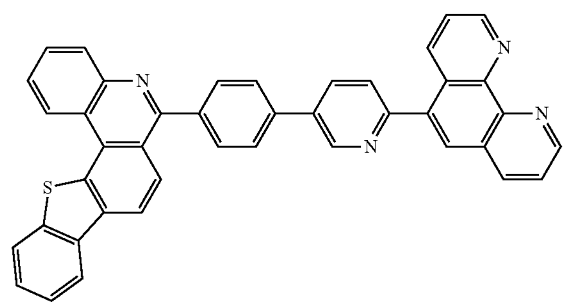
7-17
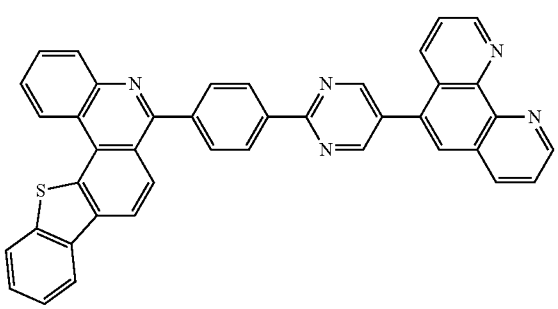
7-18
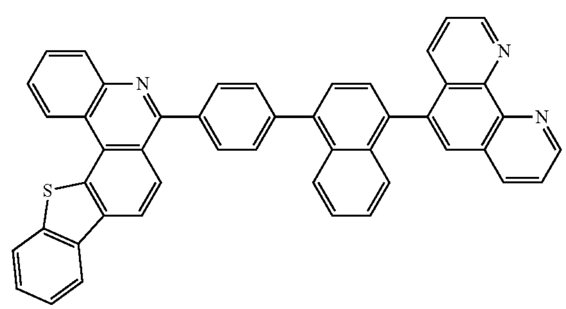

-continued
7-19
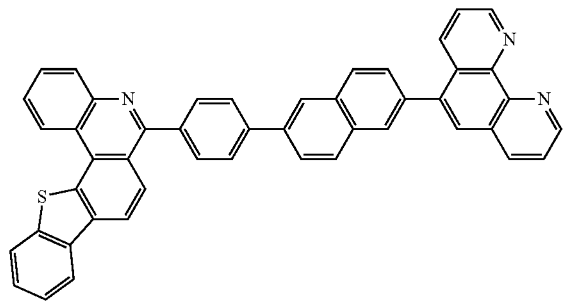
7-20
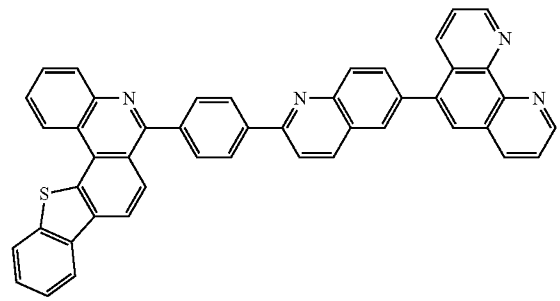
7-21
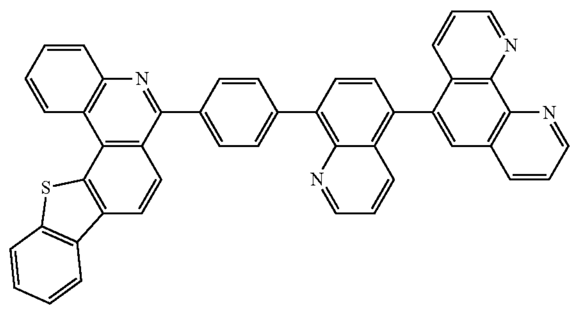
7-22
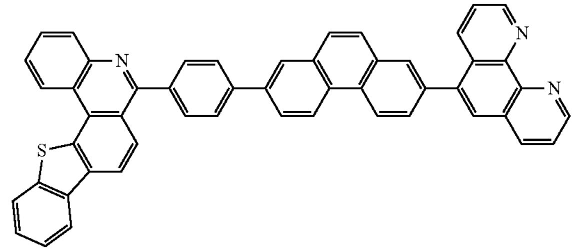
7-23
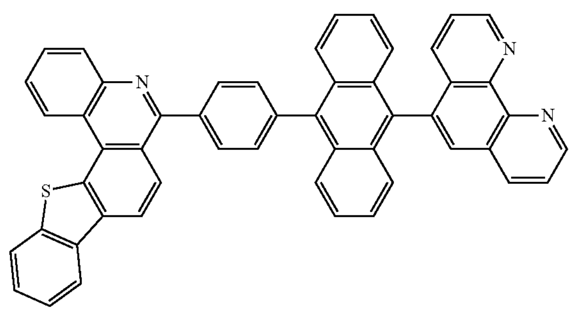
7-24
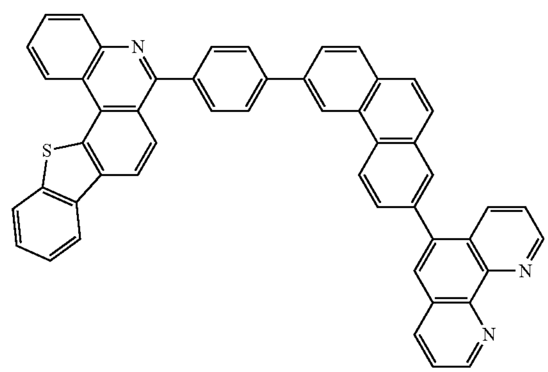
7-25
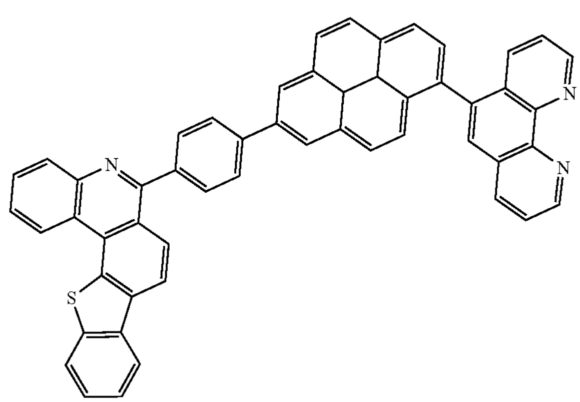
7-26
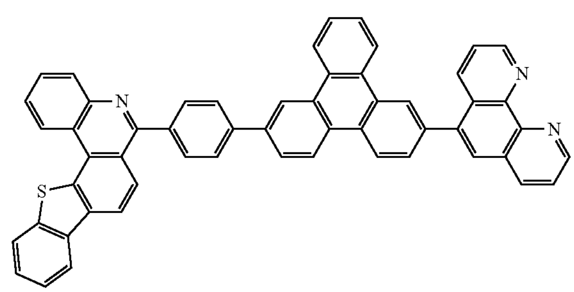

-continued
7-27
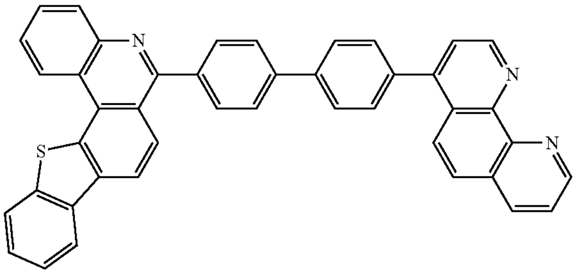
7-28
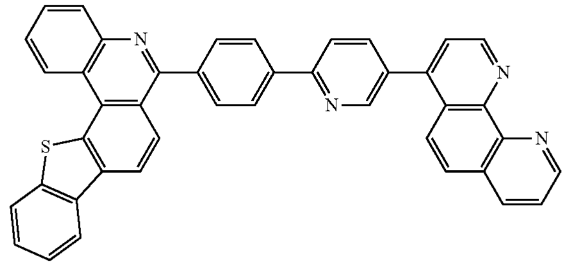
7-29
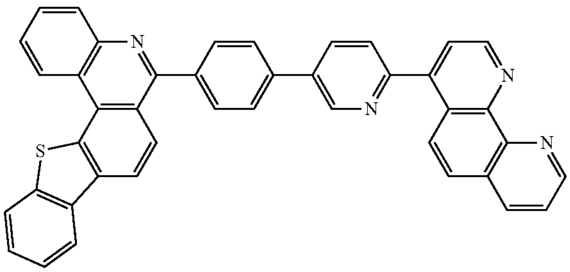
7-30
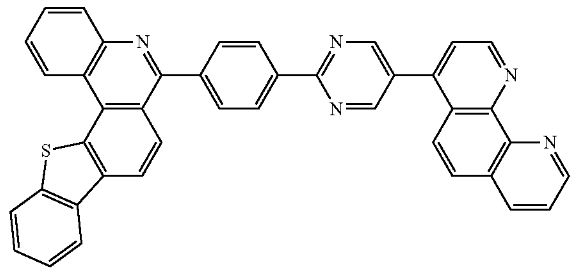
7-31
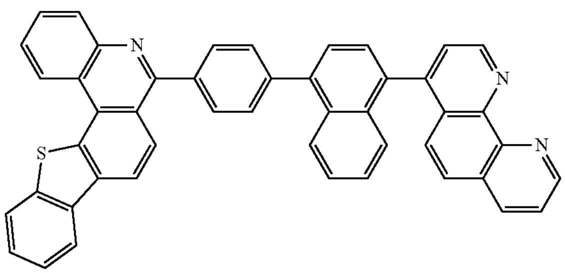
7-32
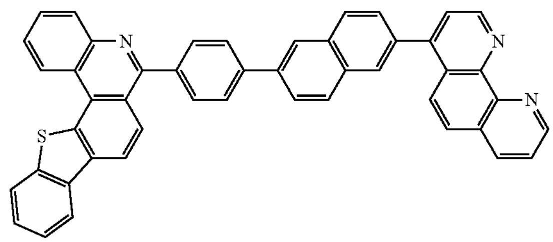
7-33
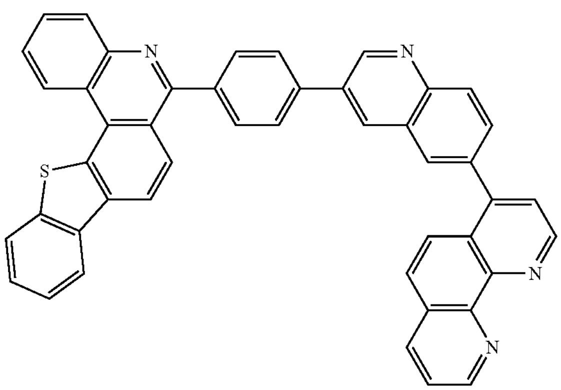
7-34
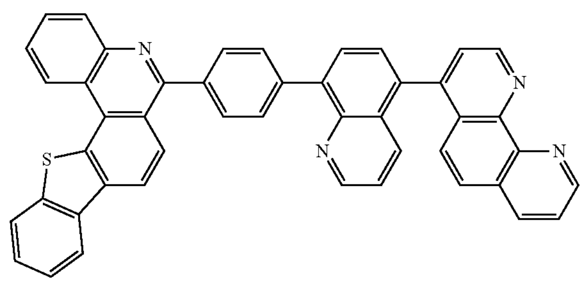
7-35
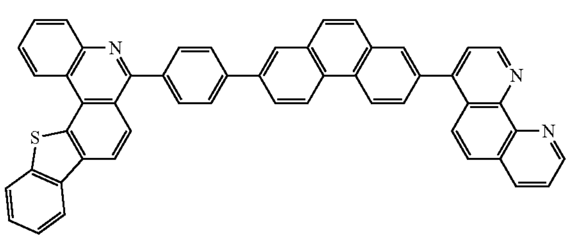
7-36
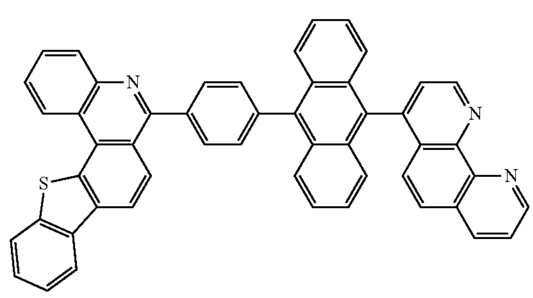

-continued
7-37
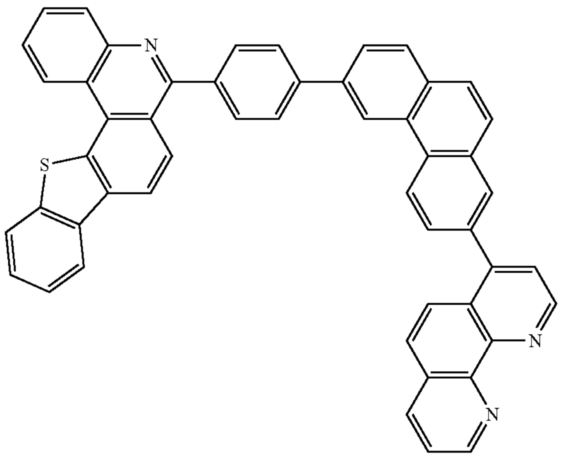
7-38
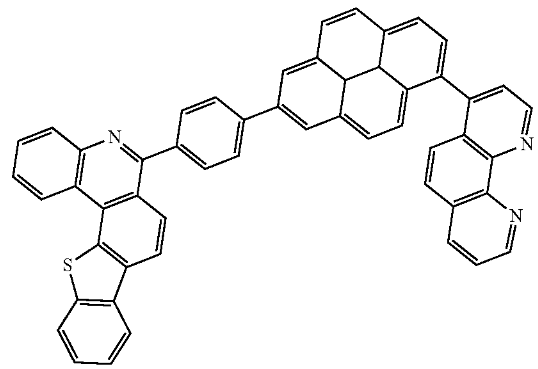
7-39
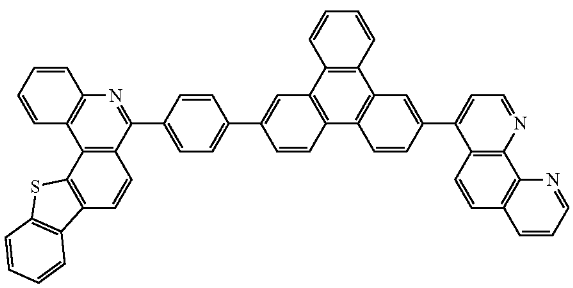
8-1
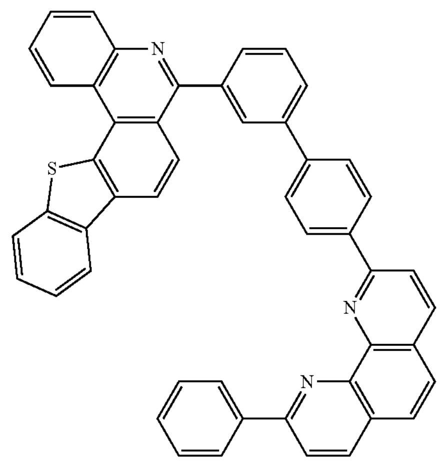
8-2
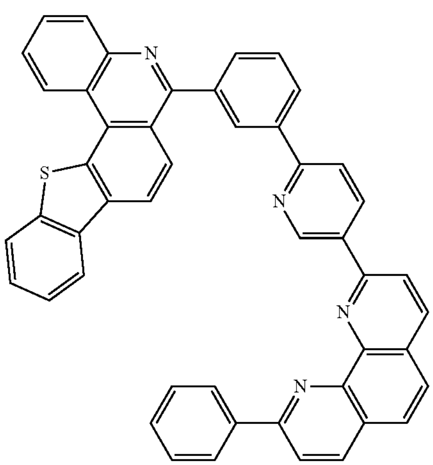
8-3
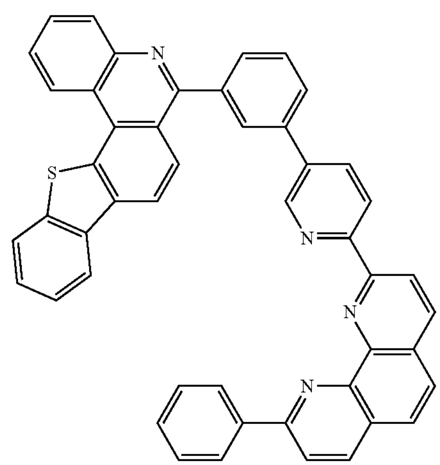

-continued
8-4
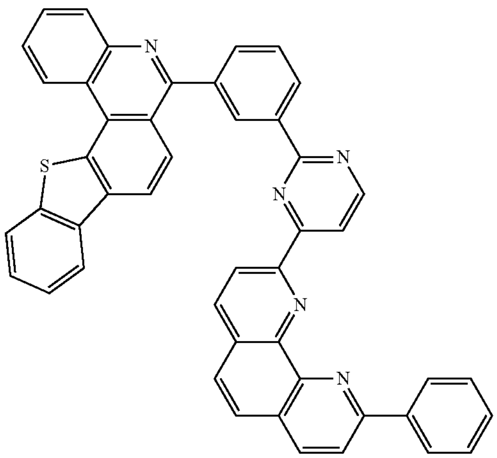
8-5
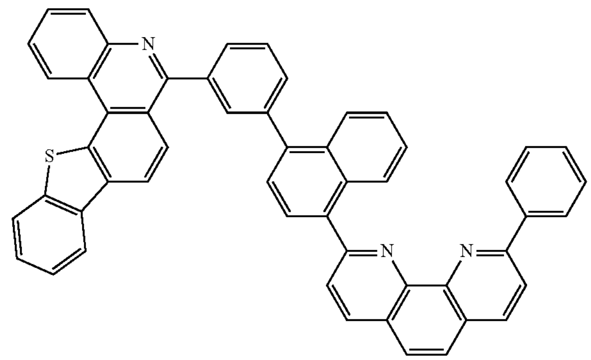
8-6
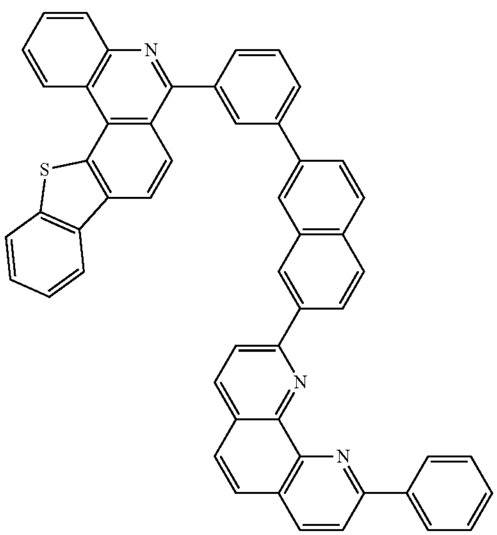
8-7
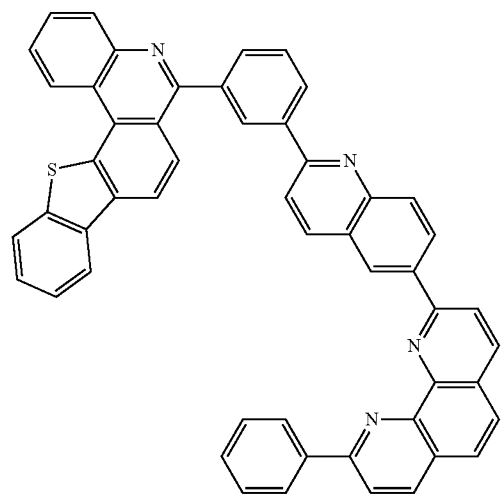
8-8
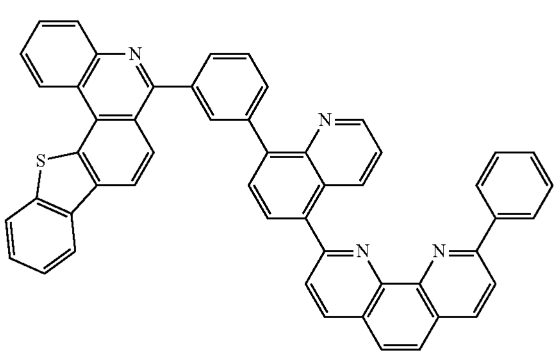
8-9
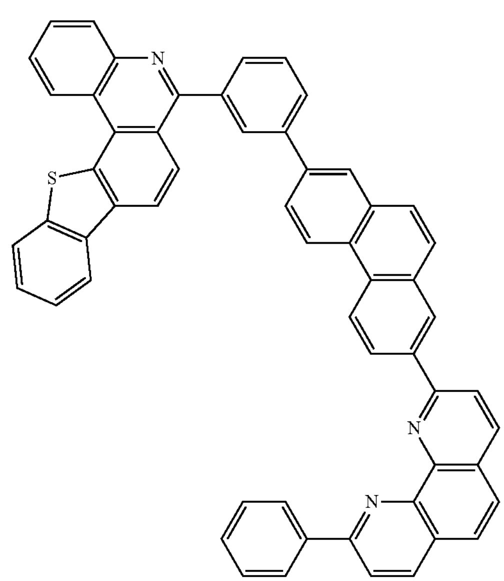

-continued
8-10
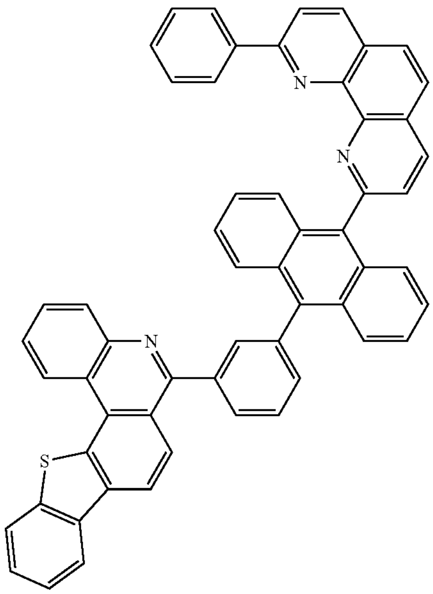
8-11
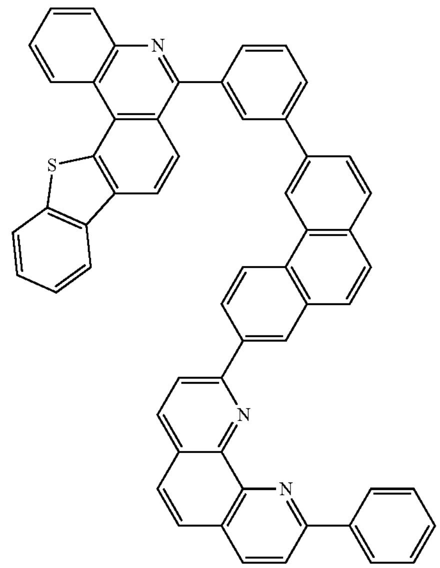
8-13
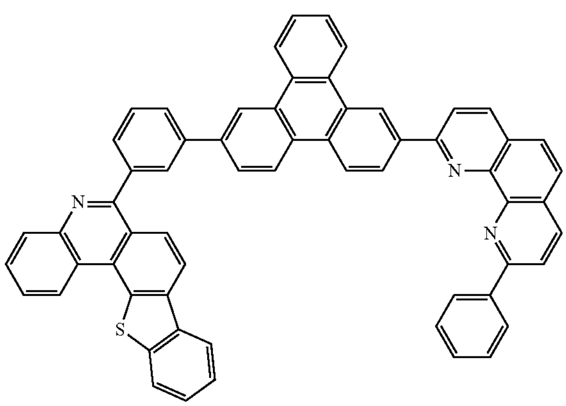
8-14
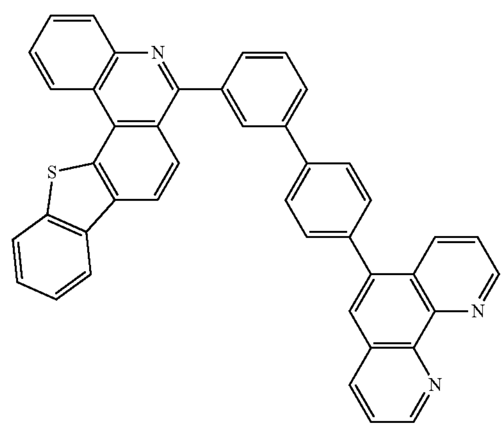
8-15
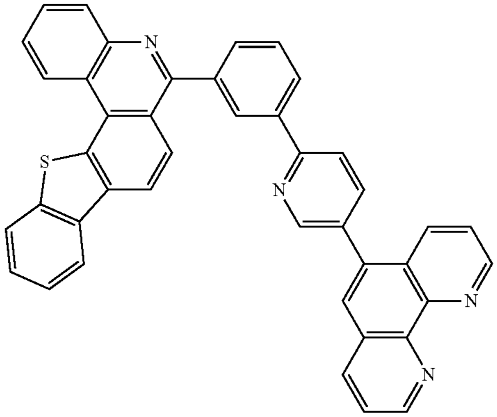
8-16
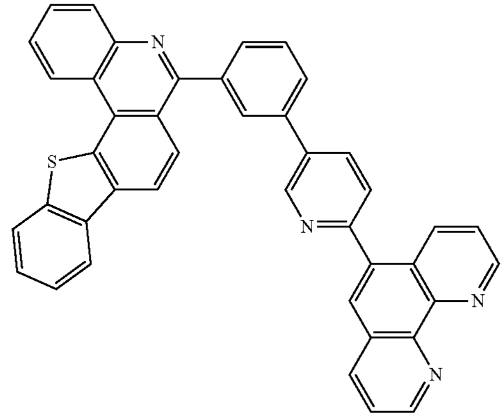

-continued
8-17
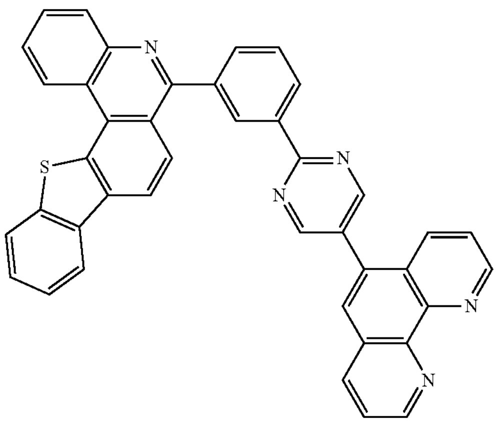
8-18
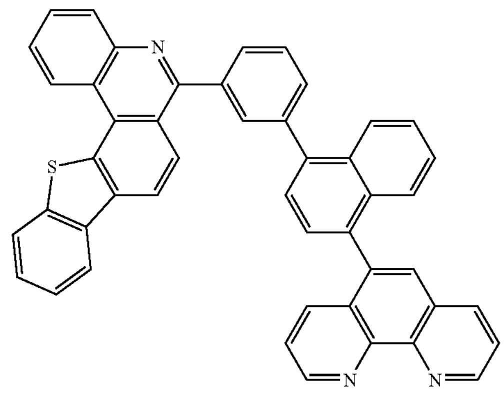
8-19
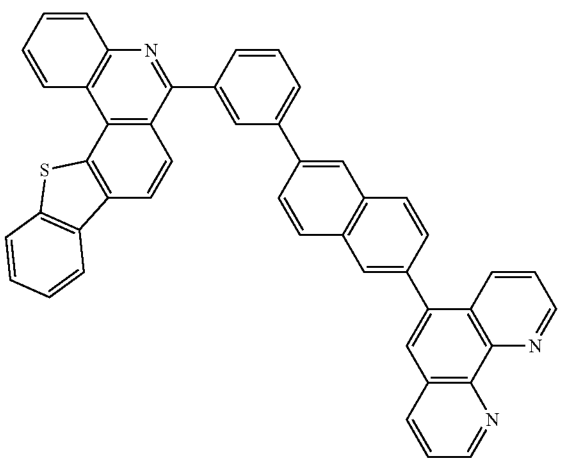
8-20
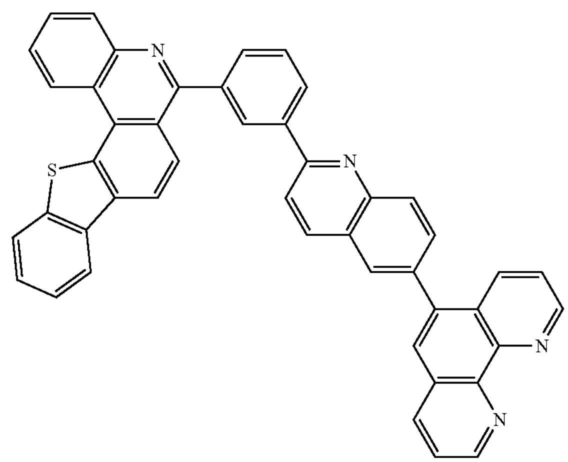
8-21
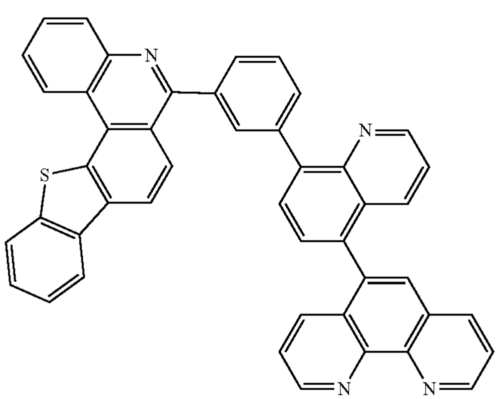
8-22
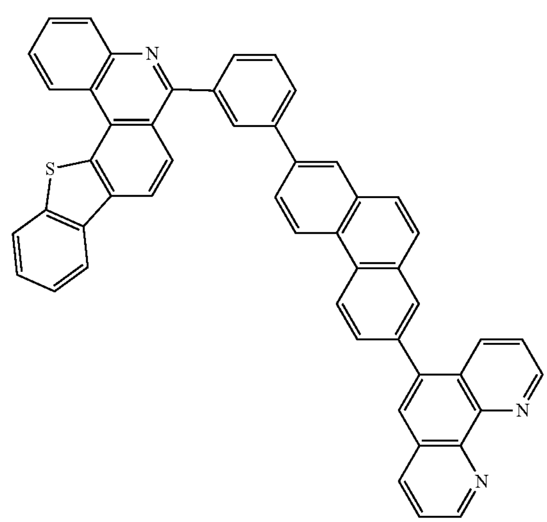

-continued
8-23
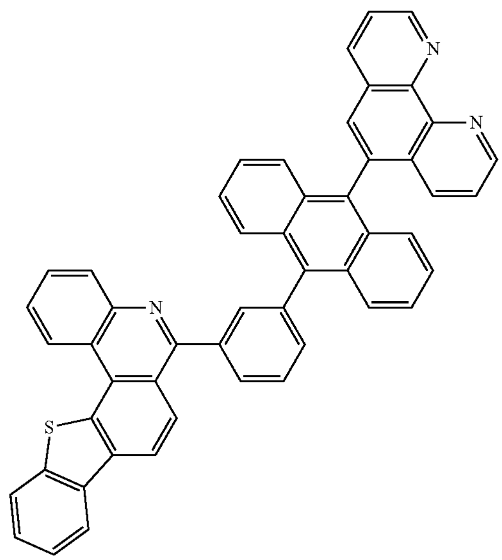
8-24
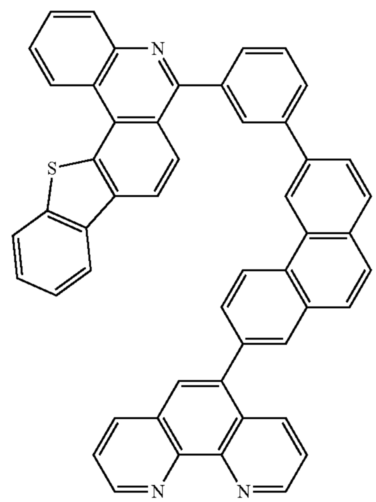
8-25
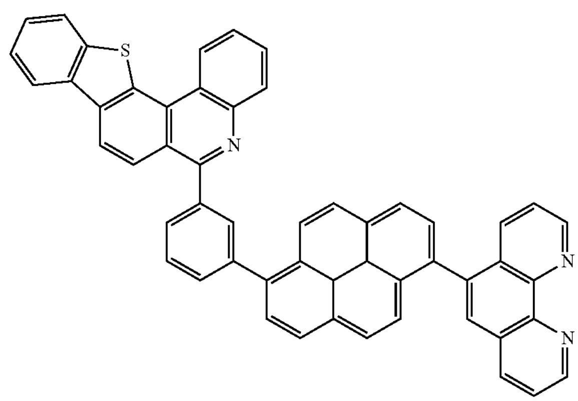
8-26
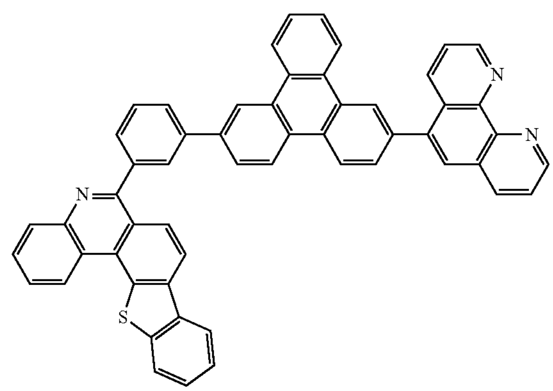
8-27
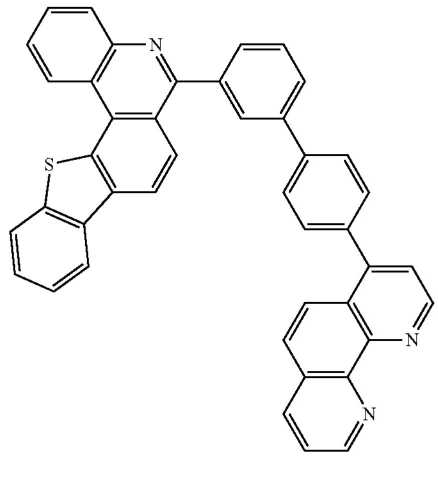
8-28
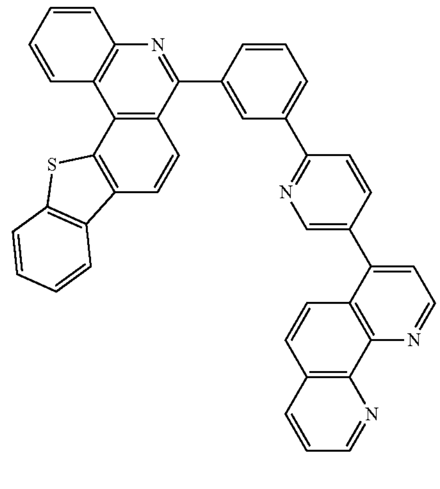

-continued
8-29
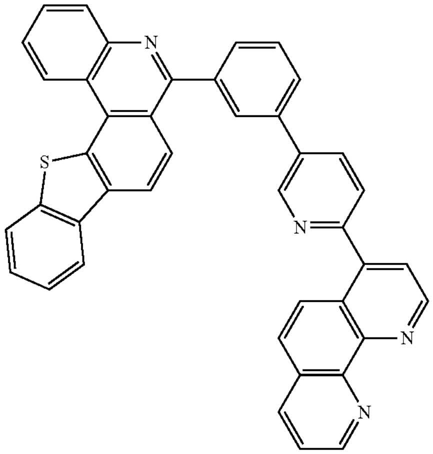
8-30
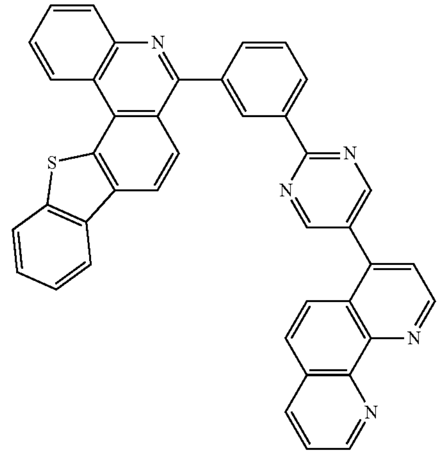
8-31
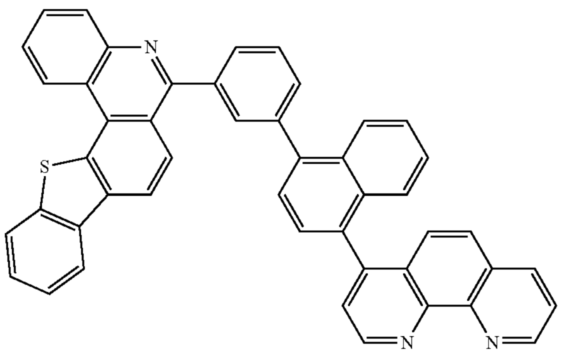
8-32
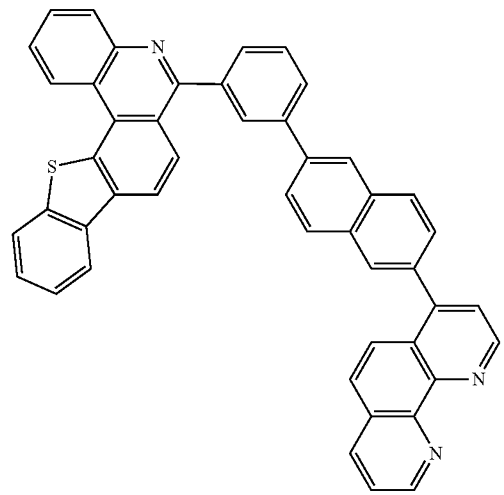
8-33
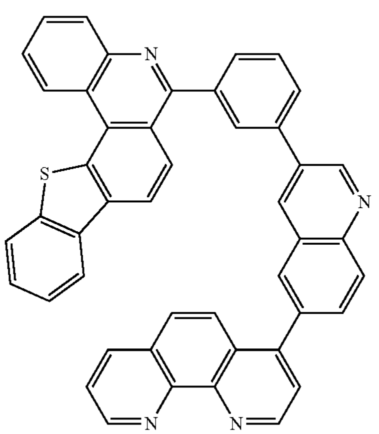
8-34
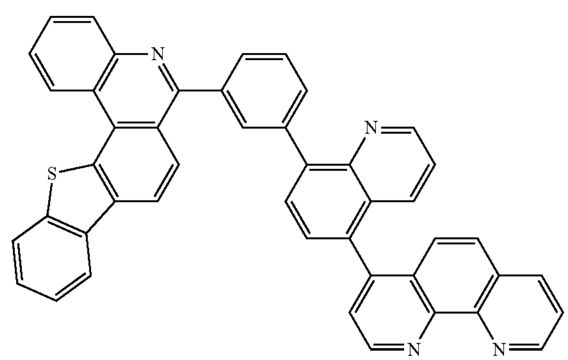

-continued
8-35
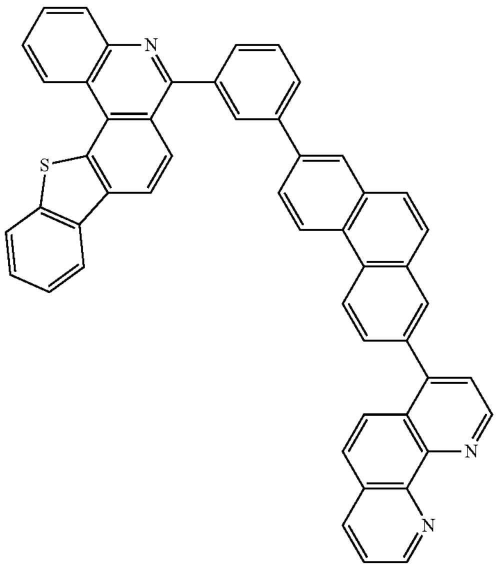
8-36
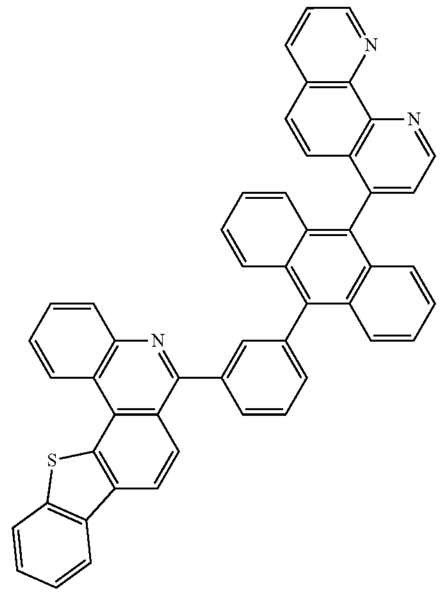
8-37
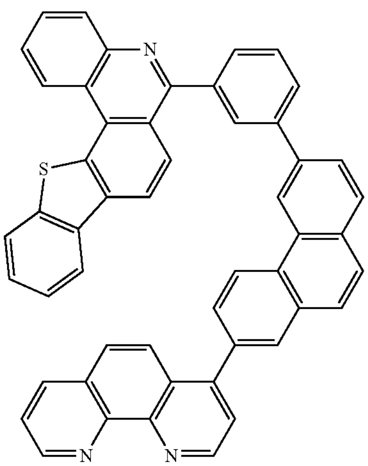
8-38
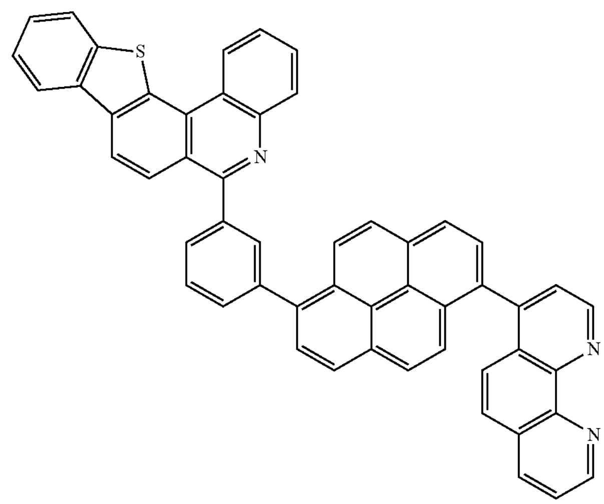
8-39
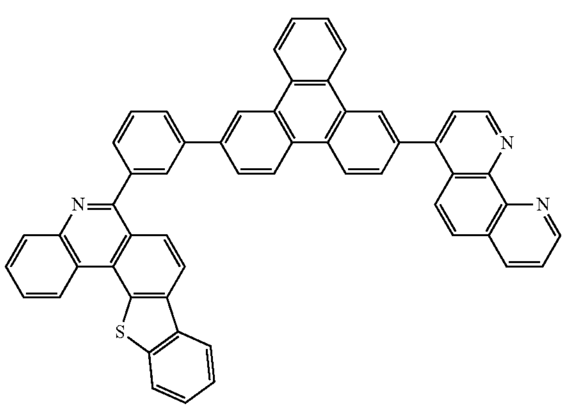
9-1
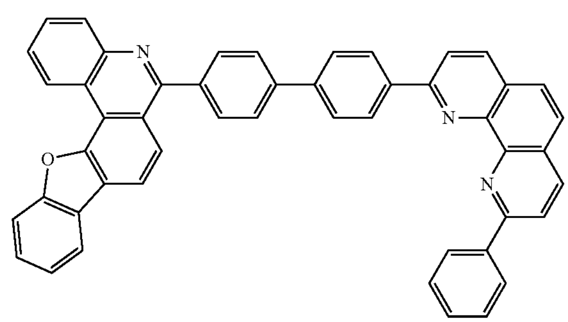

-continued
9-2
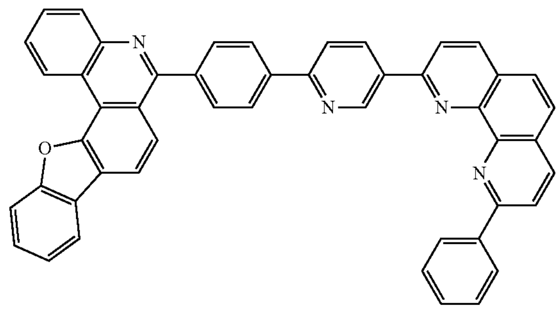
9-3
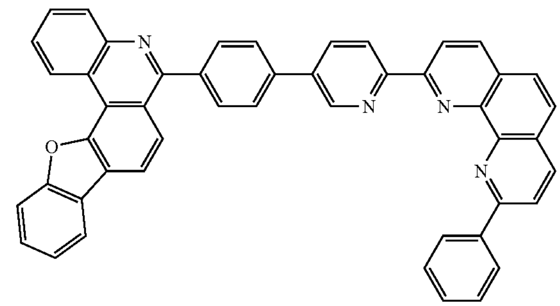
9-4
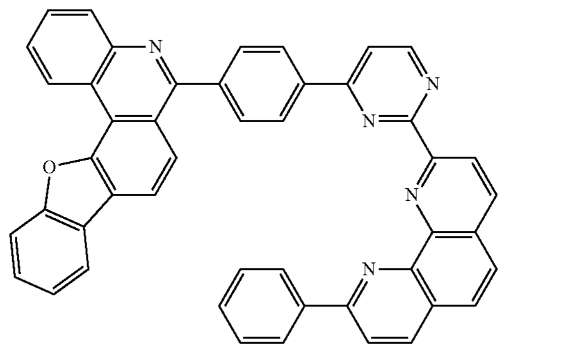
9-5
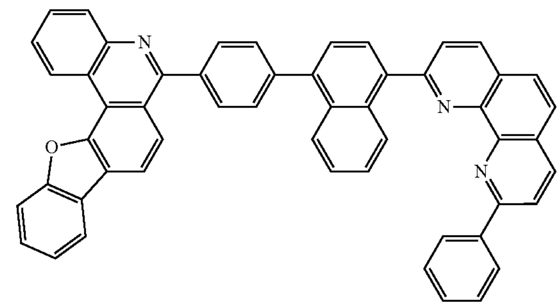
9-6
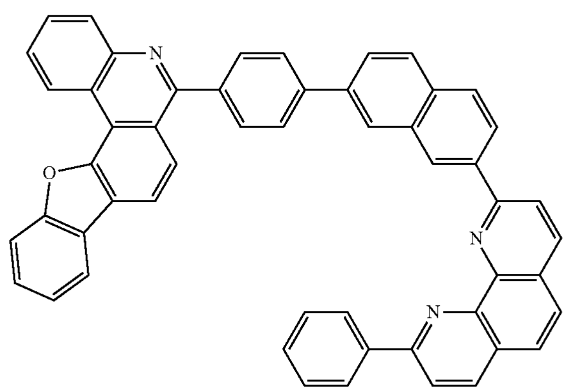
9-7
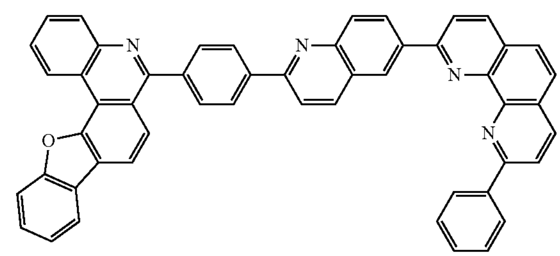
9-8
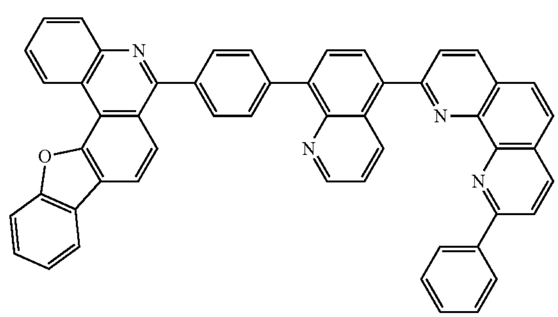
9-9
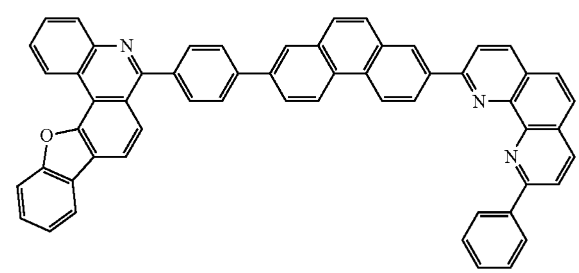

-continued
9-10
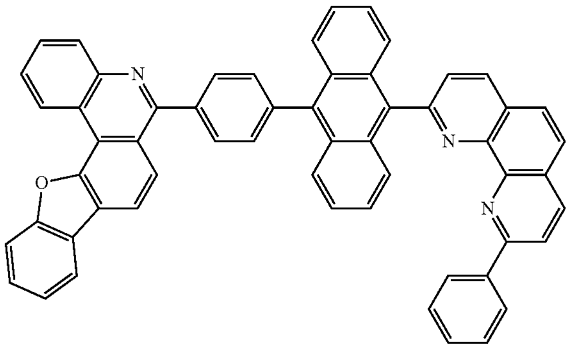
9-11
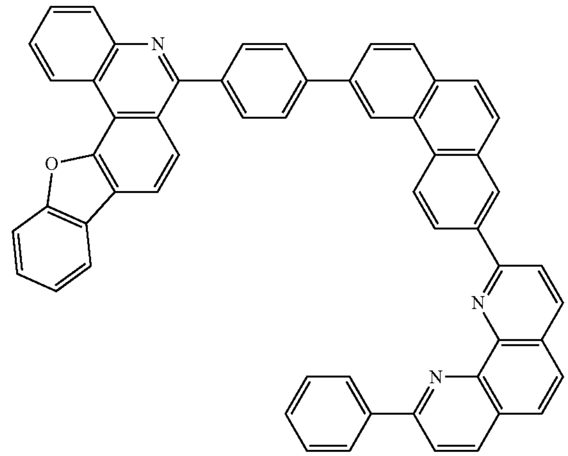
9-13
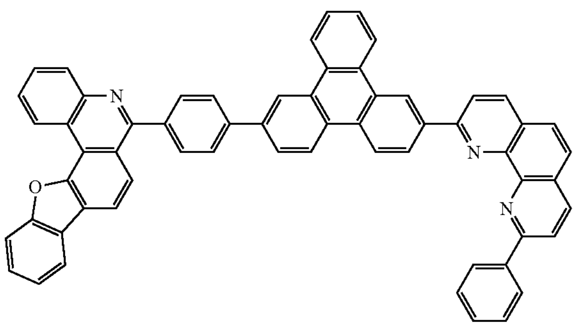
9-14
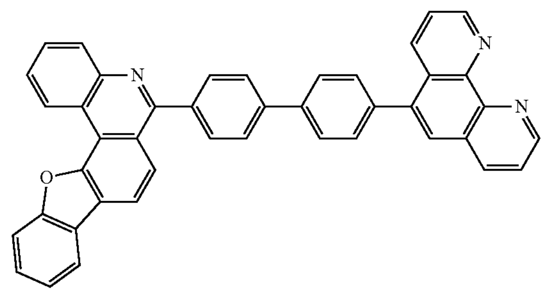
9-15
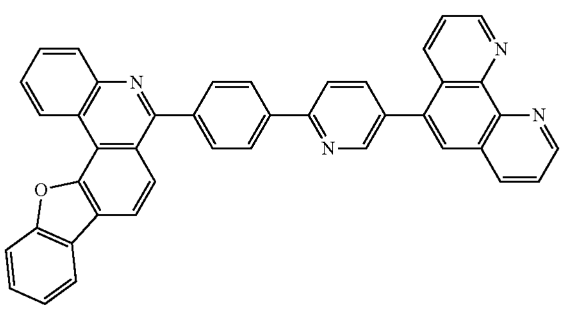
9-16
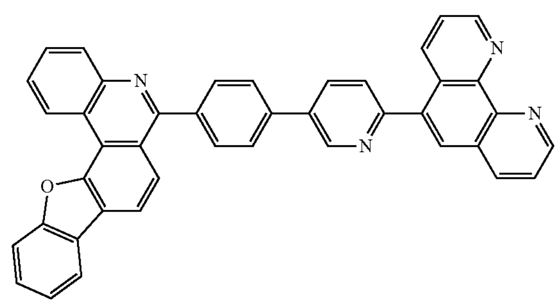
9-17
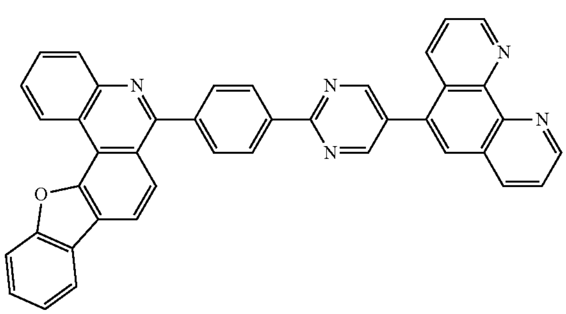
9-18
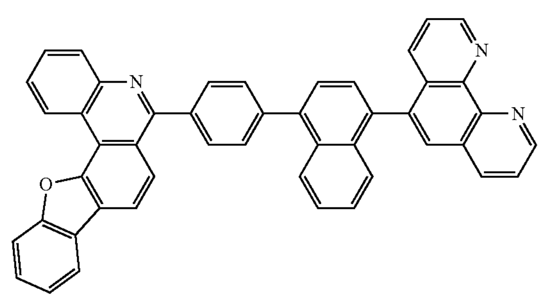

-continued
9-19
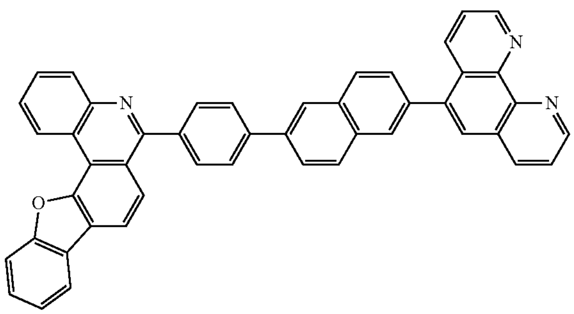
9-20
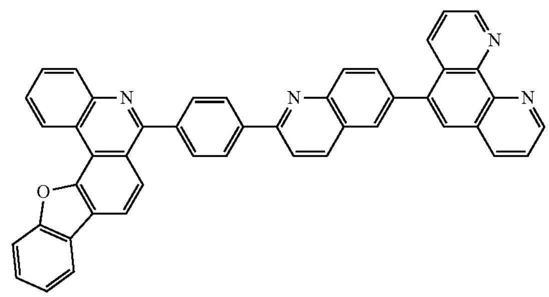
9-21
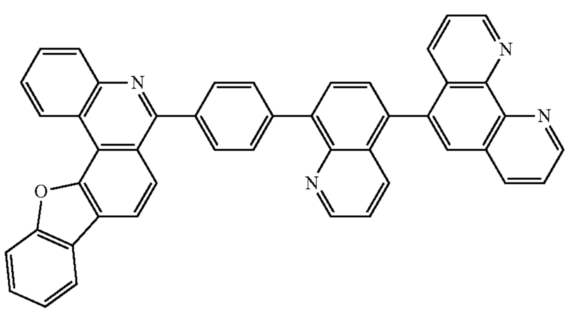
9-22
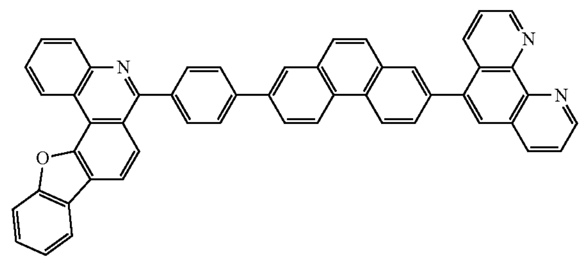
9-23
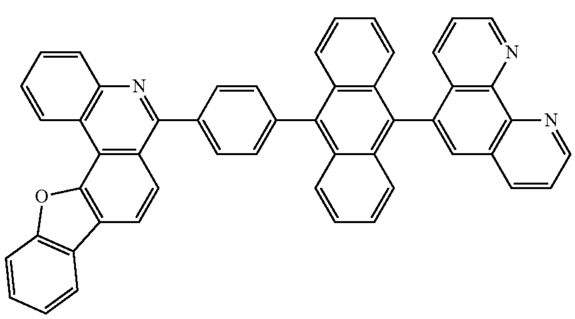
9-24
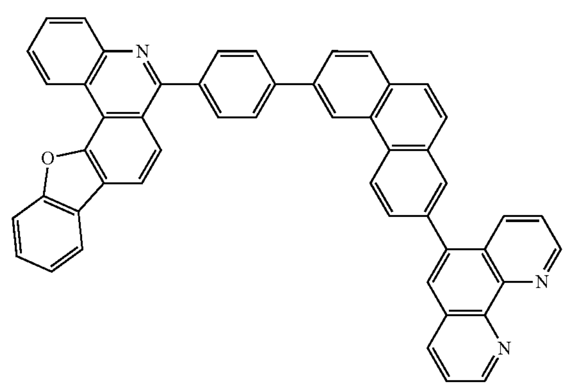
9-25
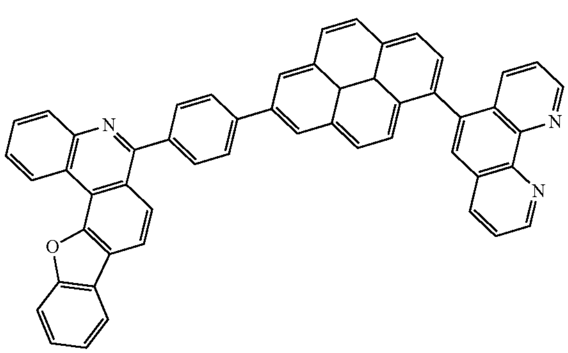
9-26
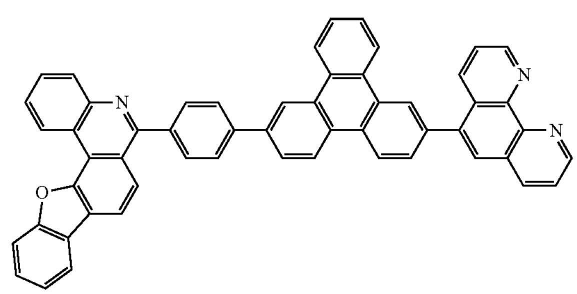

-continued
9-27
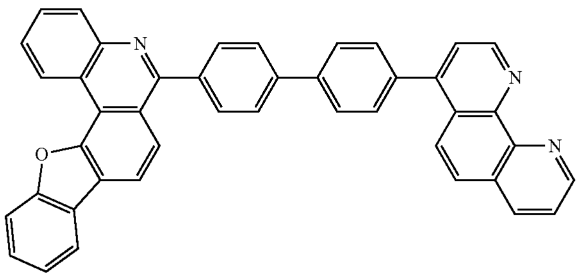
9-28
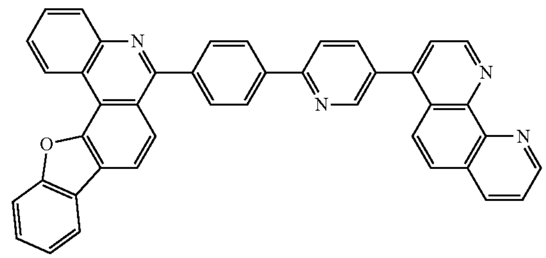
9-29
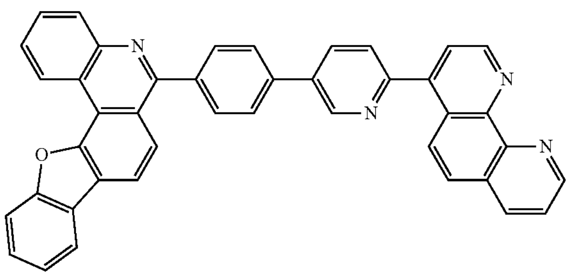
9-30
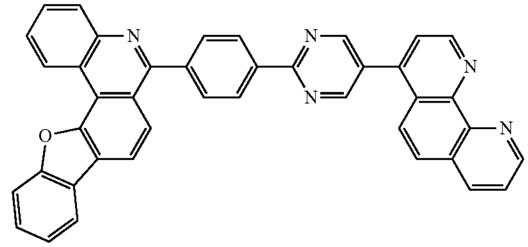
9-31
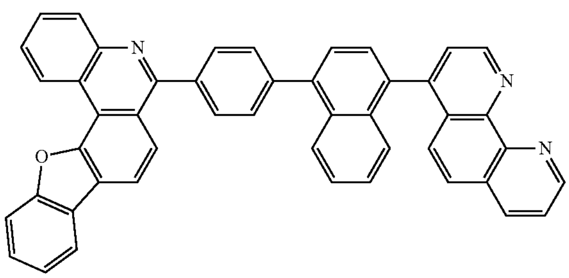
9-32
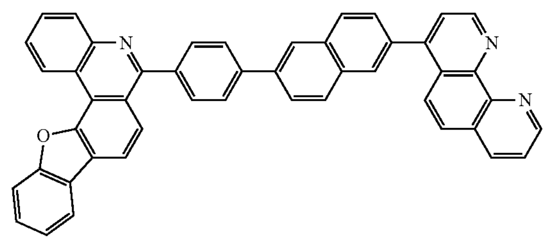
9-33
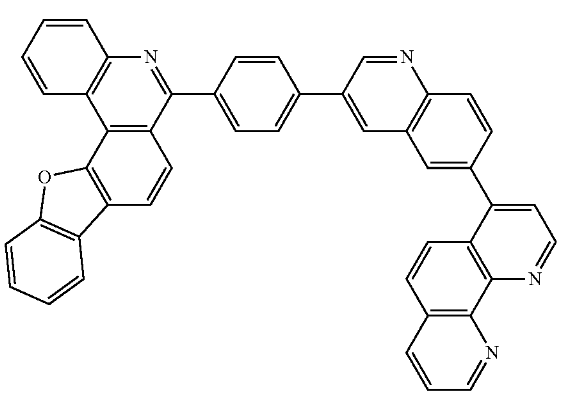
9-34
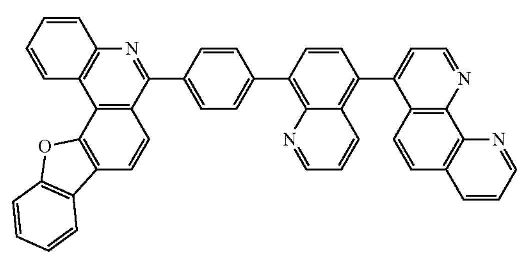
9-35
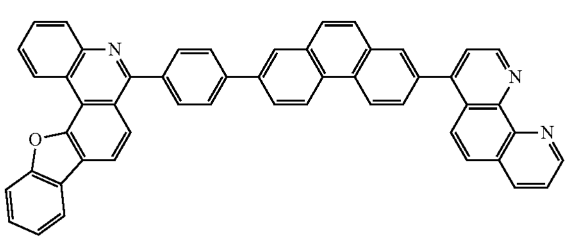
9-36
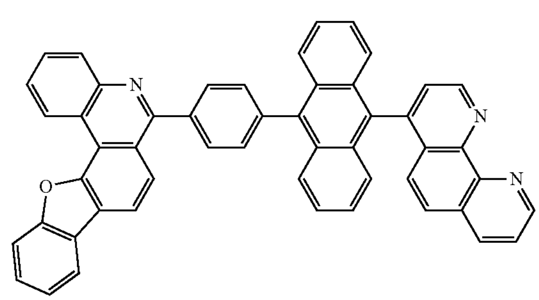

-continued
9-37
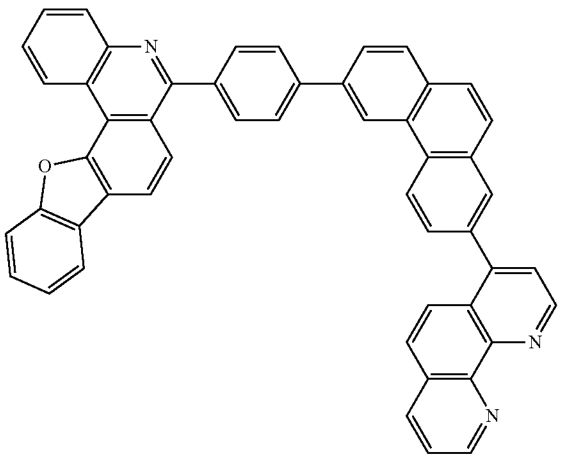
9-38
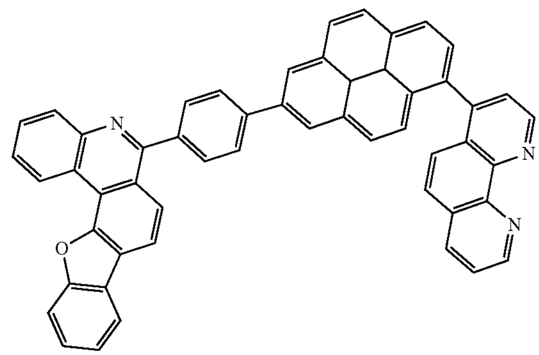
9-39
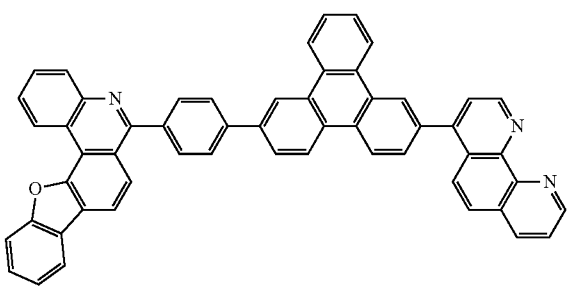
10-1
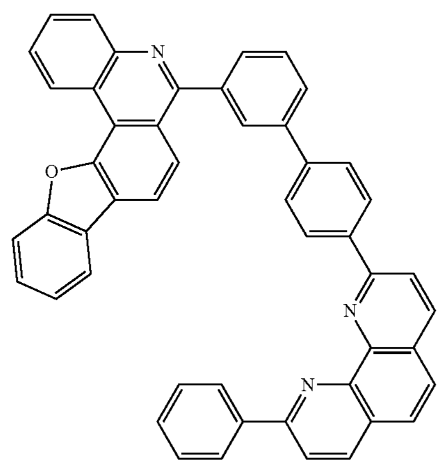
10-2
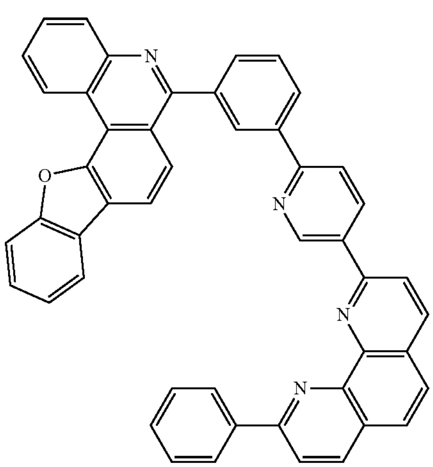
10-3
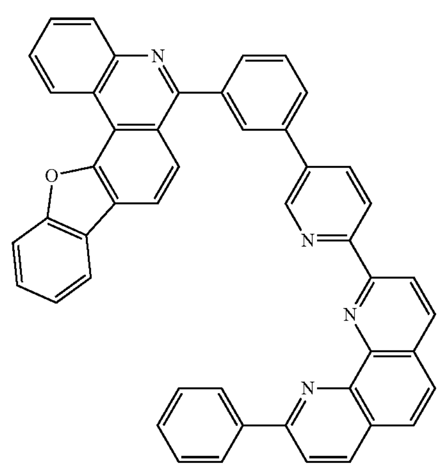

-continued
10-4
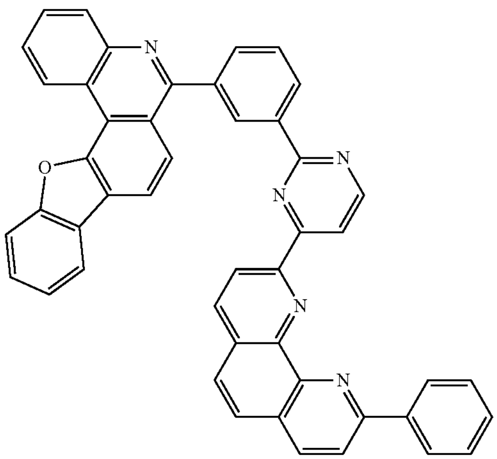
10-5
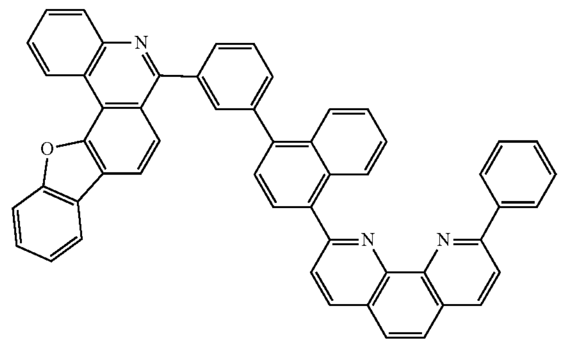
10-6
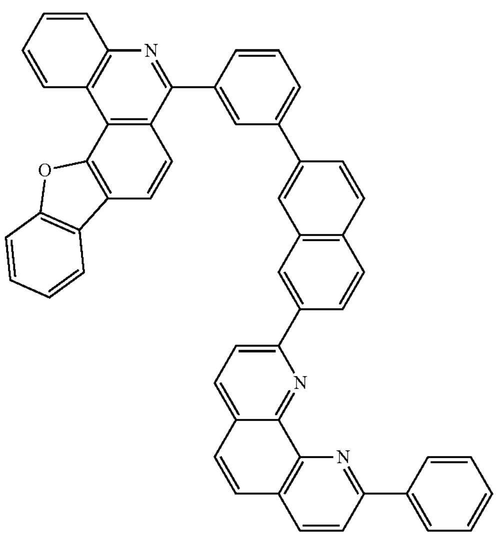
10-7
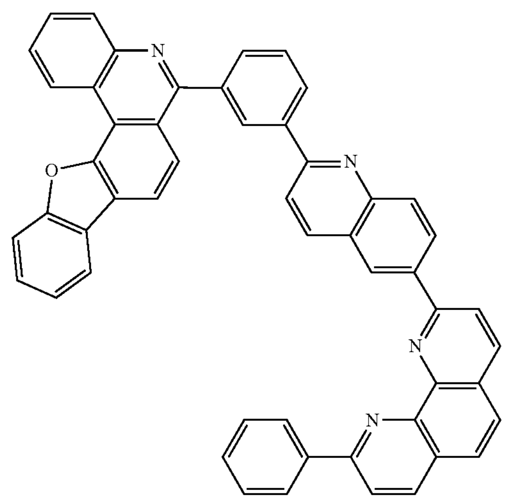
10-8
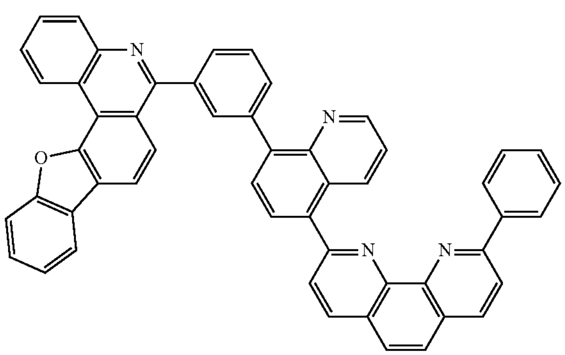
10-9
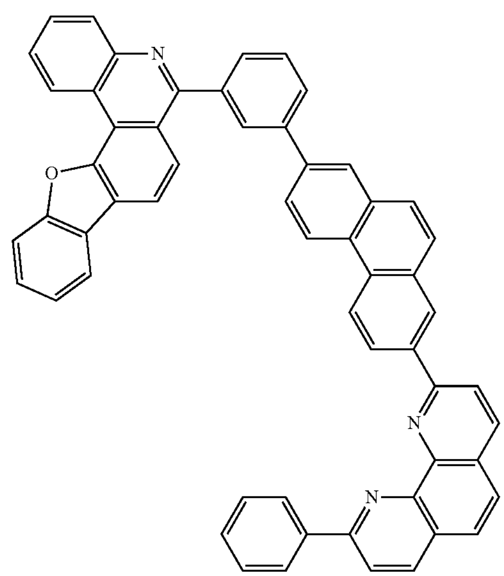

-continued
10-10
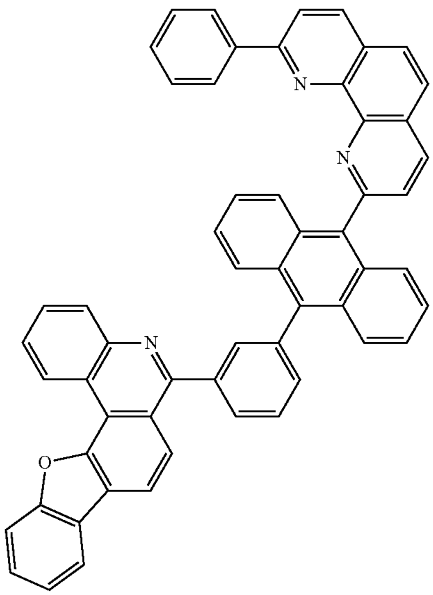
10-11
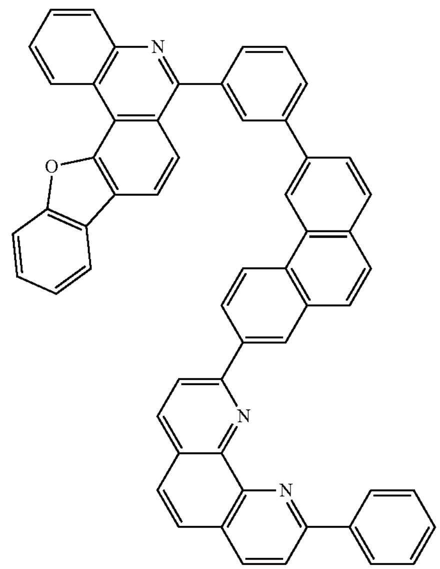
10-13
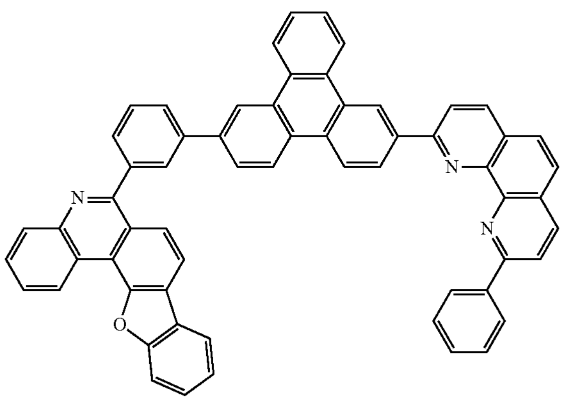
10-14
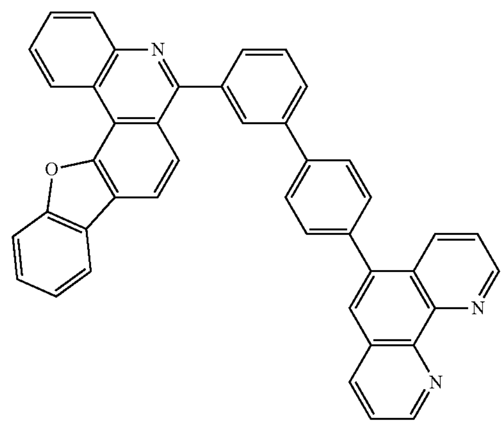
10-15
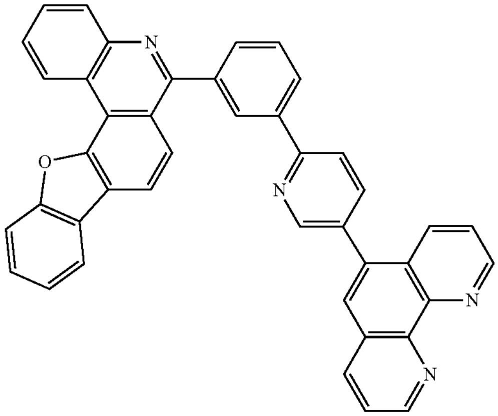
10-16
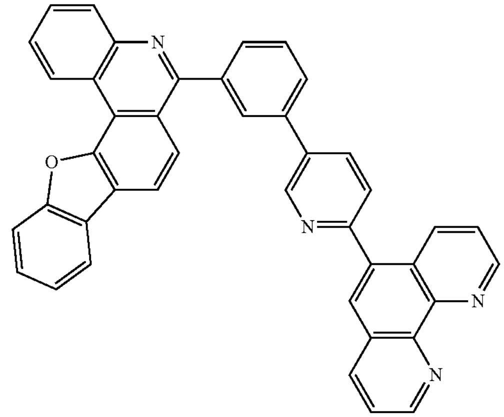

-continued
10-17
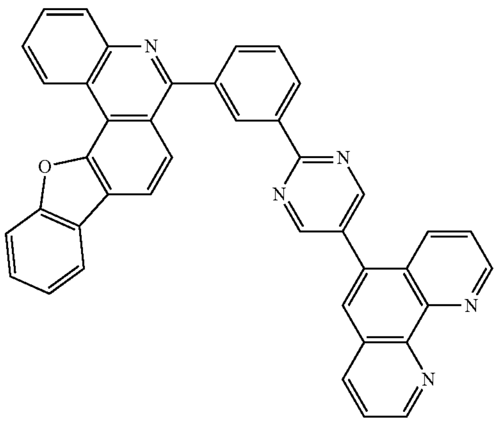
10-18
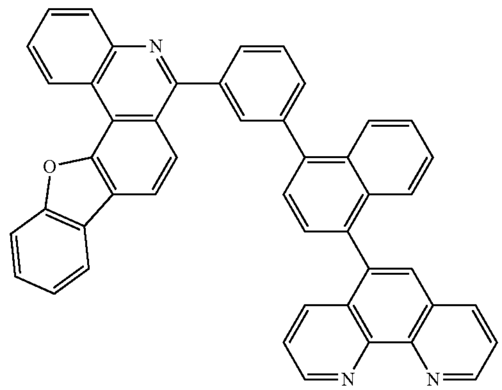
10-19
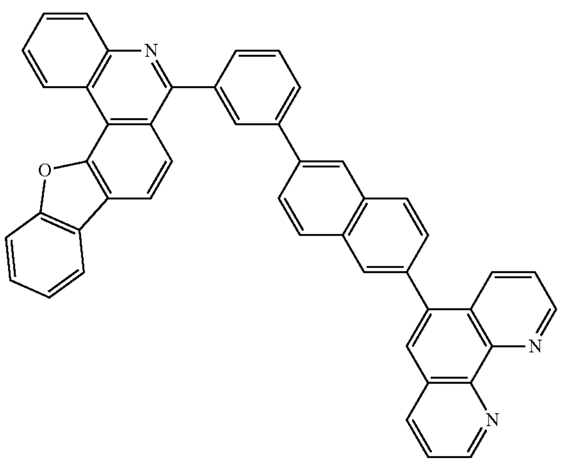
10-20
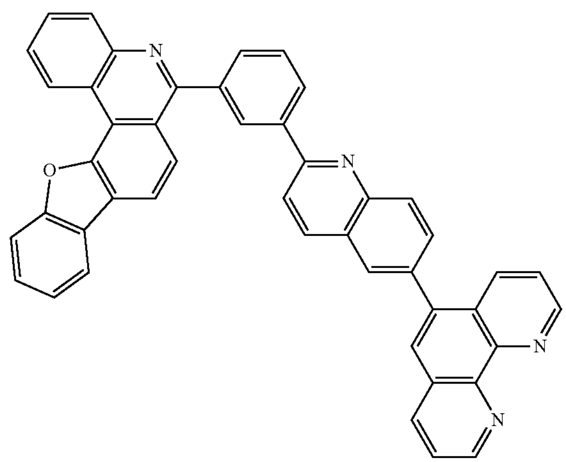
10-21
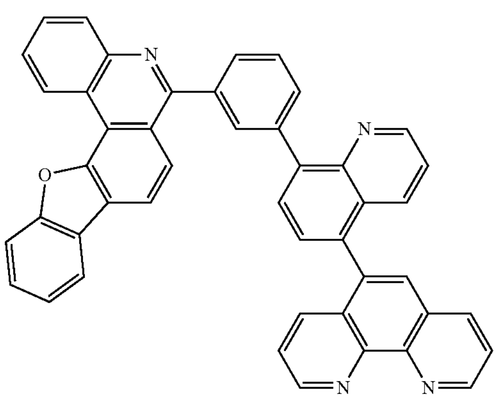
10-22
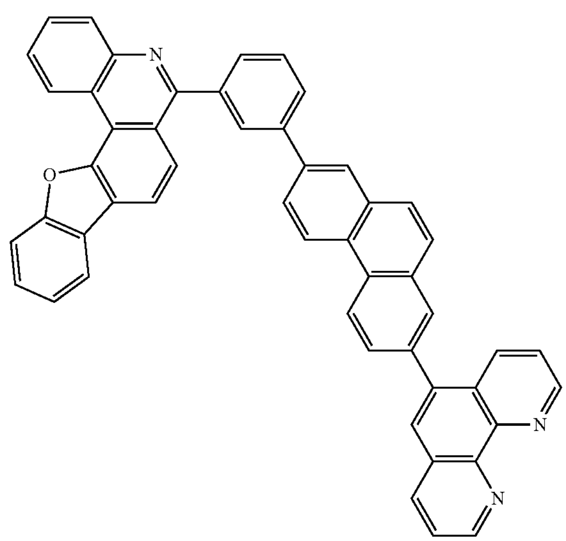

-continued
10-23
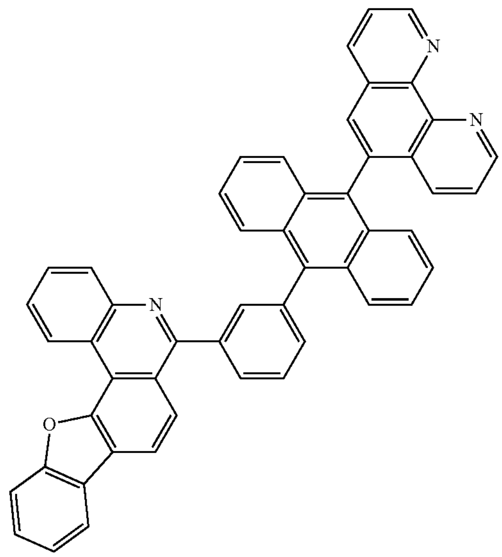
10-24
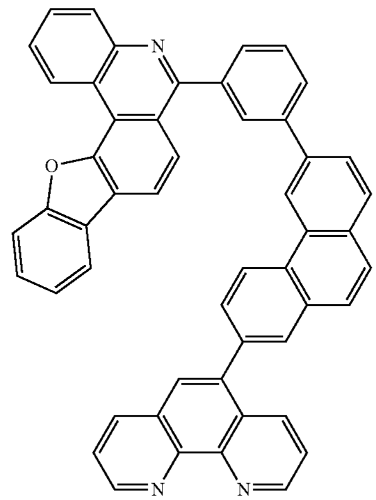
10-25
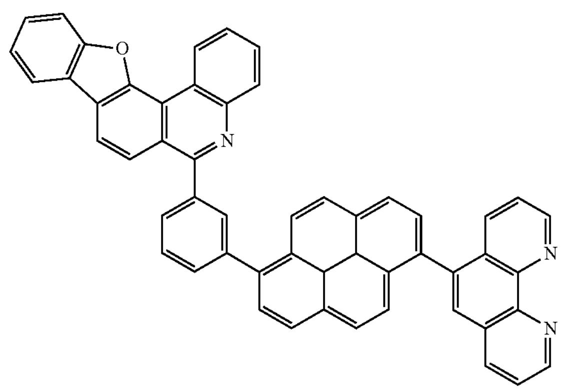
10-26
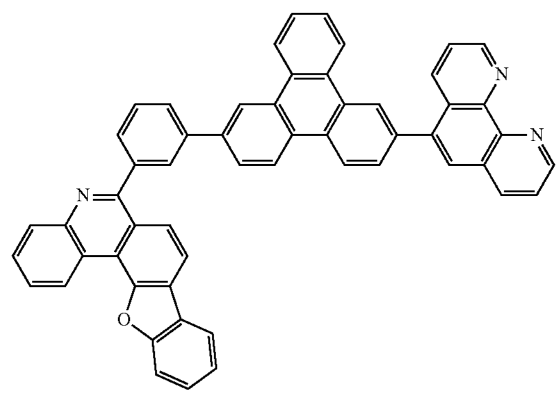
10-27
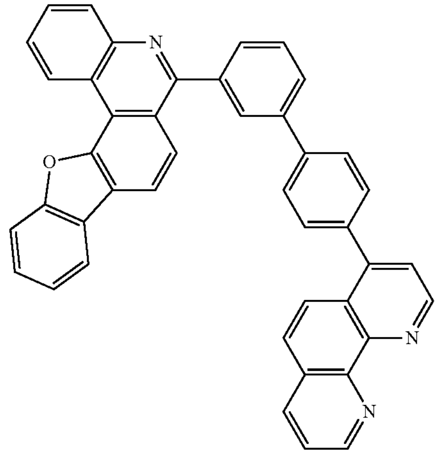
10-28
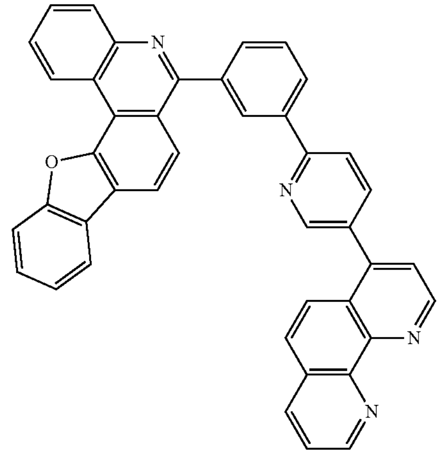

-continued
10-29
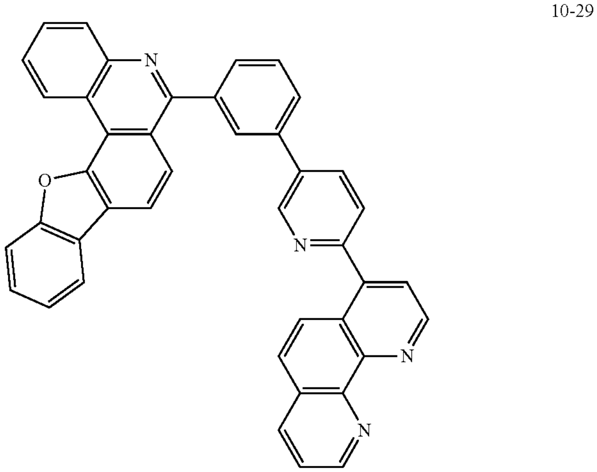
10-30
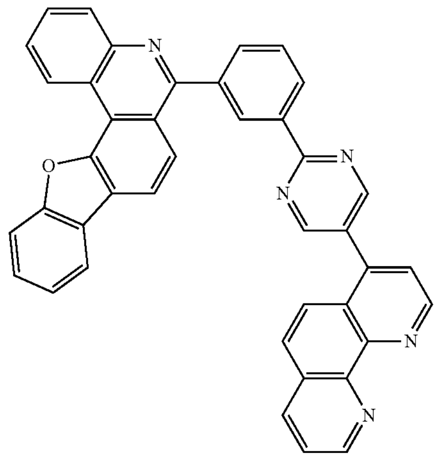
10-31
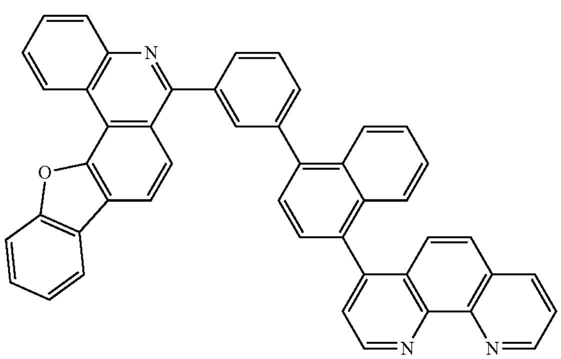
10-32
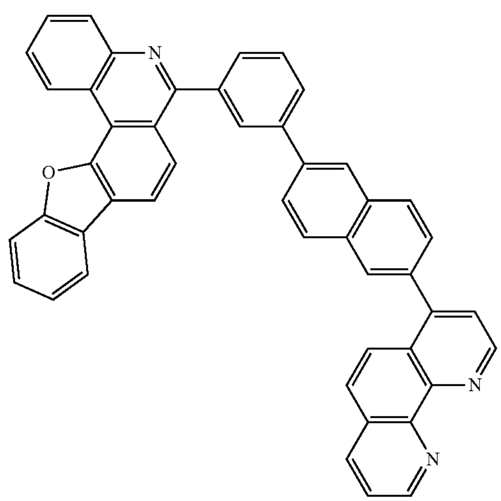
10-33
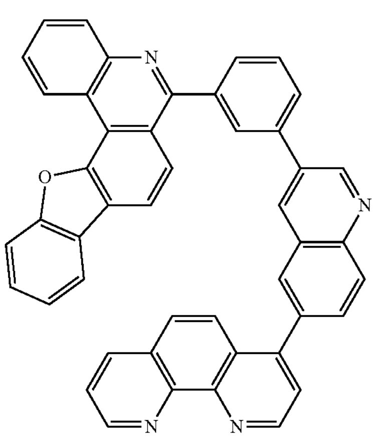
10-34
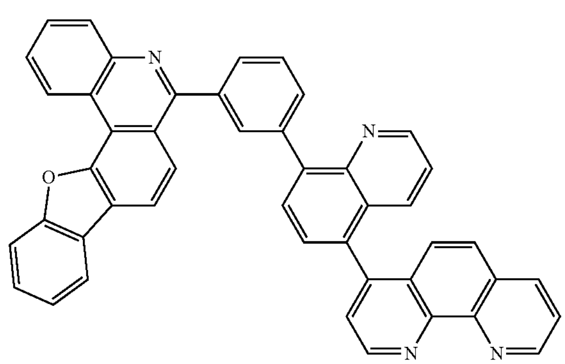

-continued
10-35
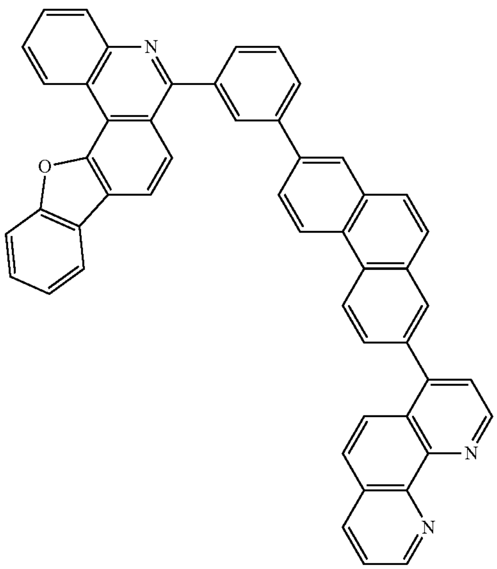
10-36
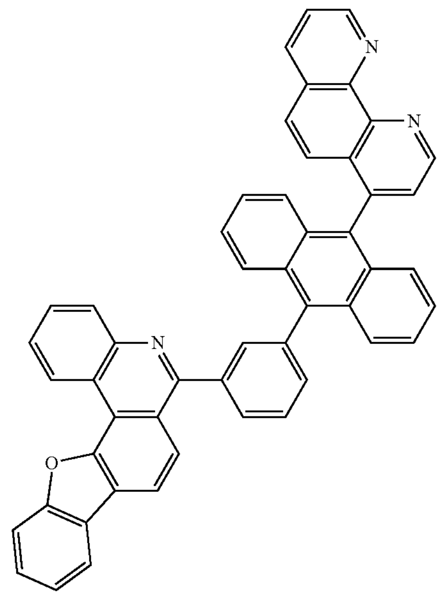
10-37
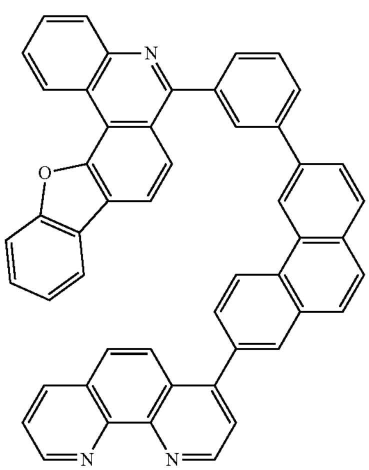
10-38
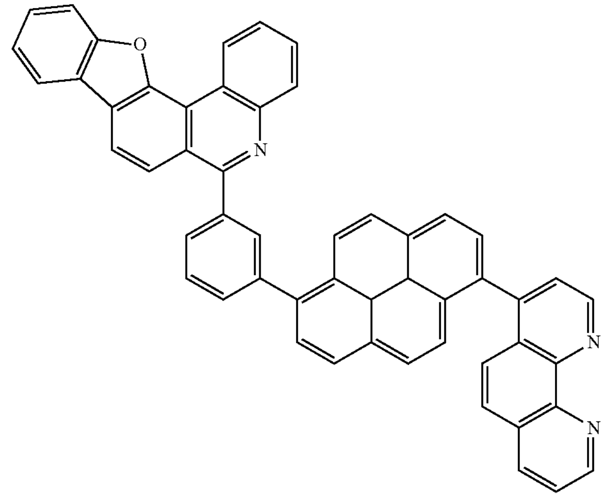
10-39
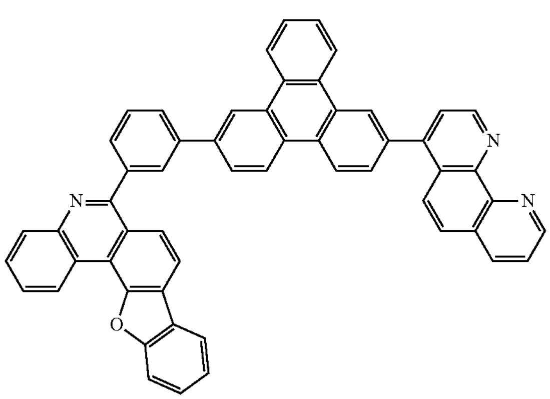
11-1
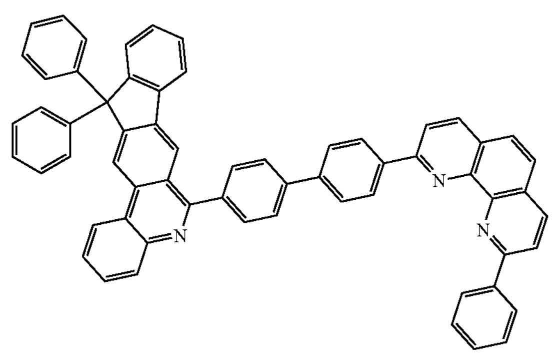

-continued
11-2
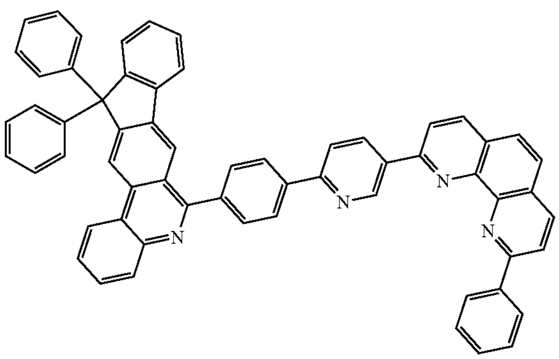
11-3
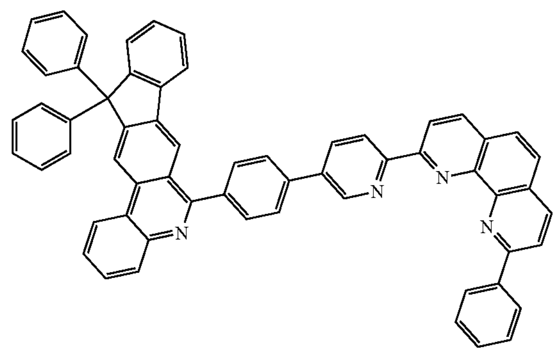
11-4
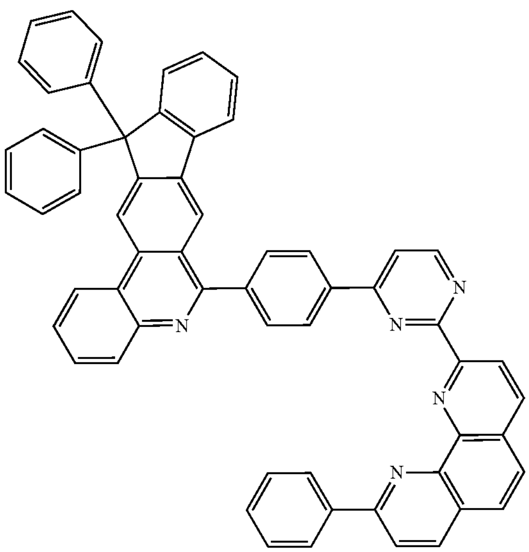
11-5
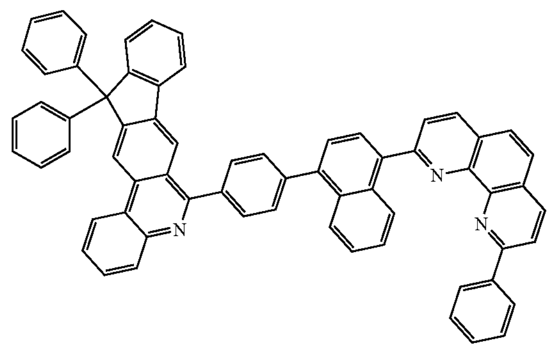
11-6
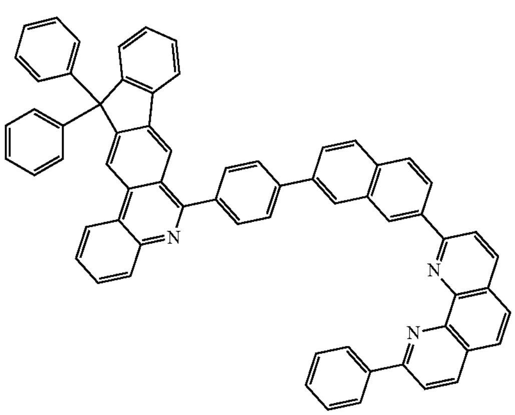
11-7
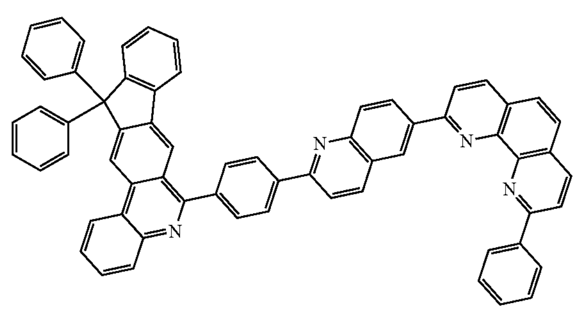

-continued
11-8
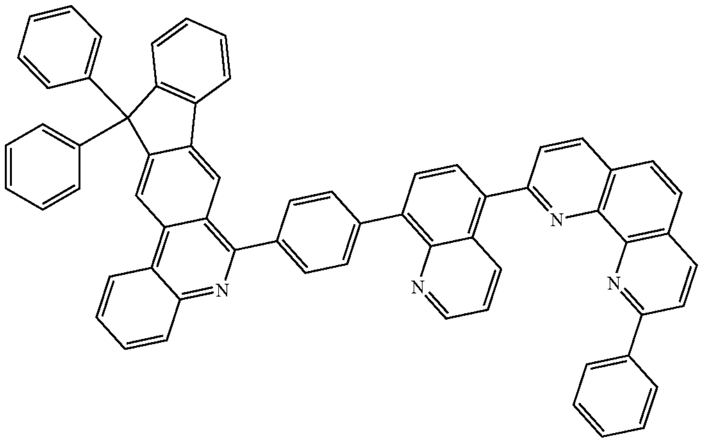
11-9
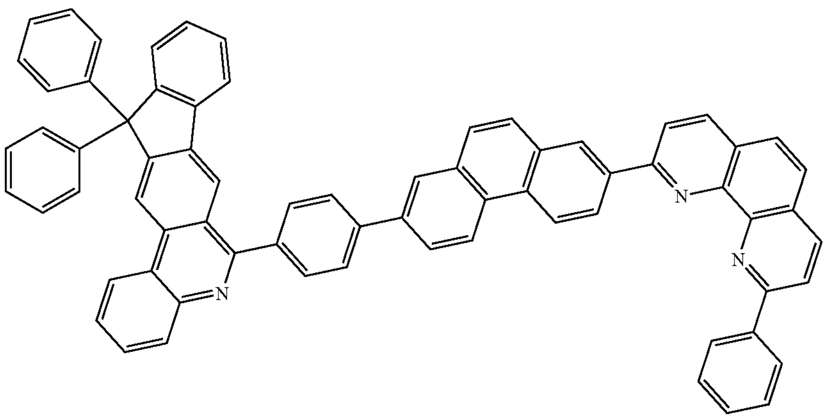
11-10
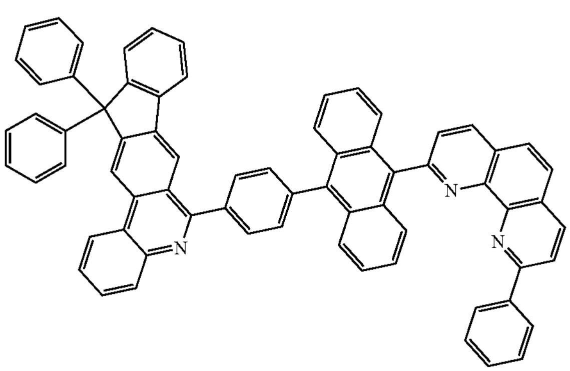
11-11
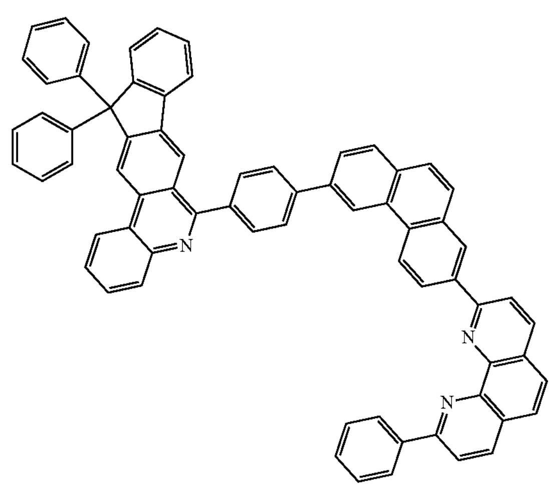

-continued
11-13
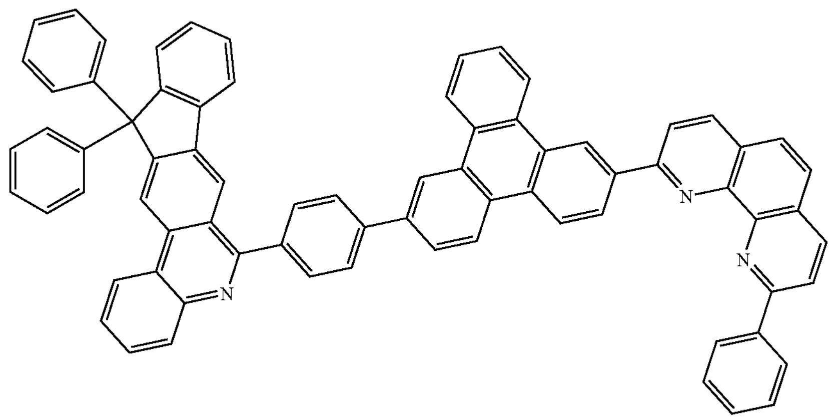
11-14
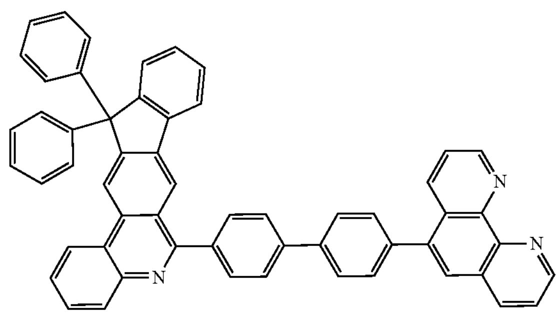
11-15
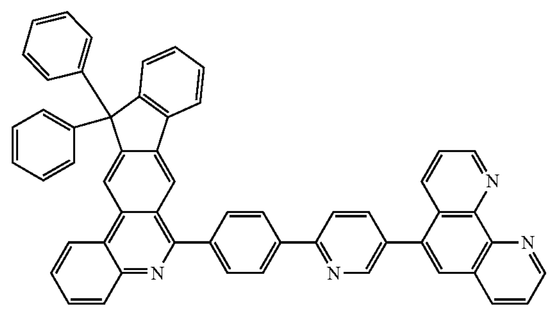
11-16
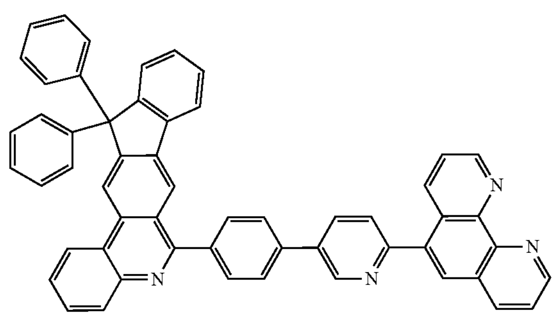
11-17
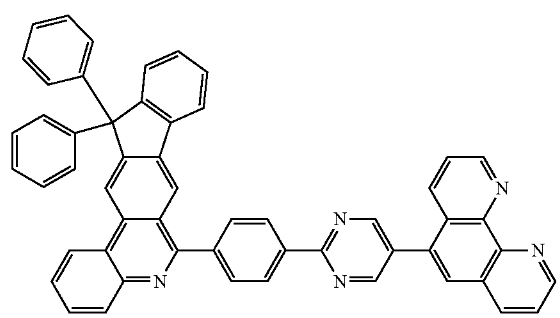
11-18
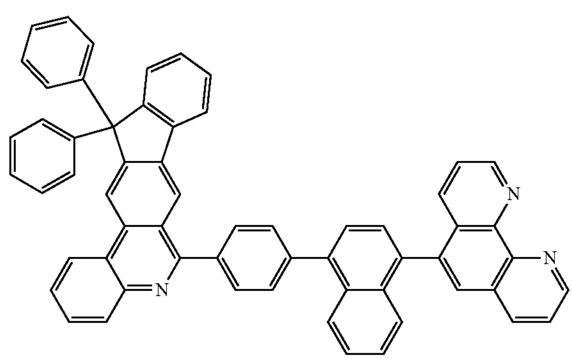
11-19
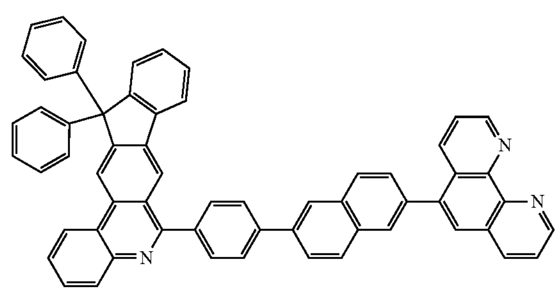

-continued
11-20
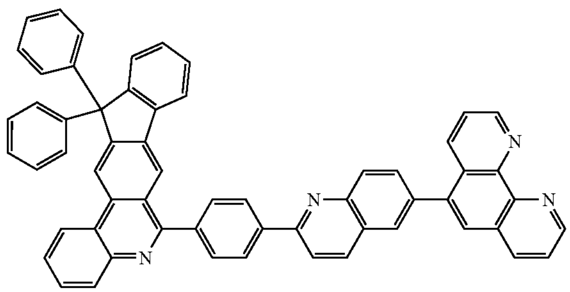
11-21
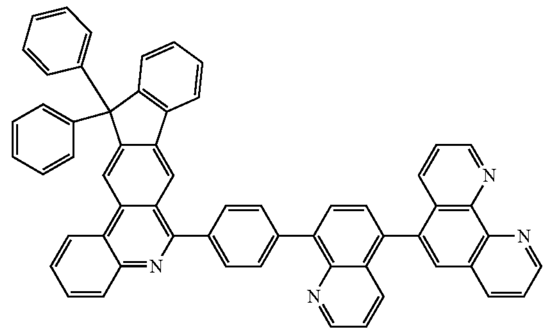
11-22
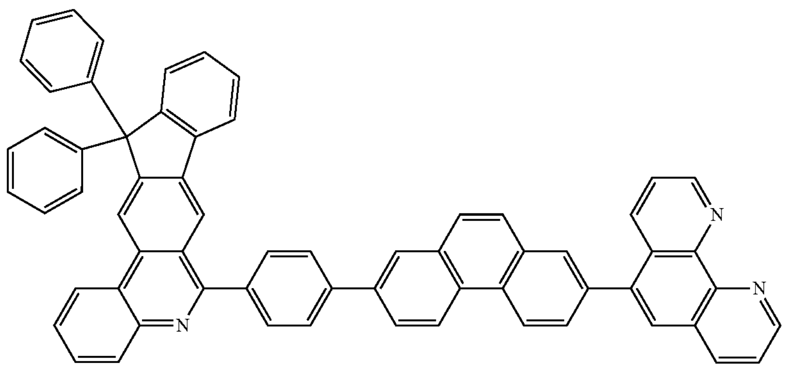
11-23
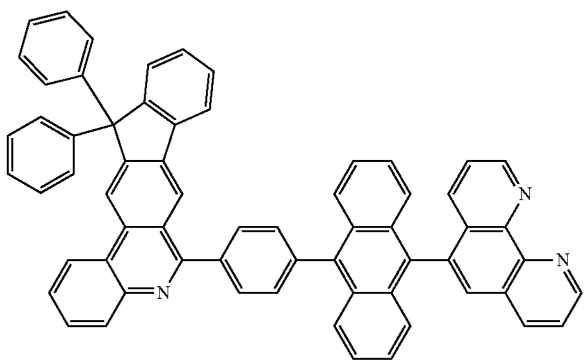
11-24
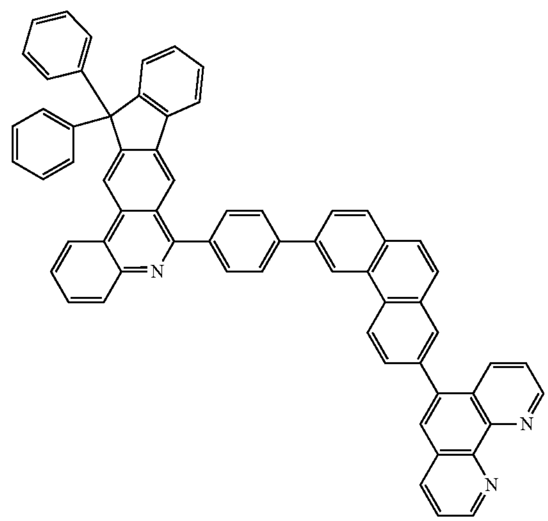
11-25
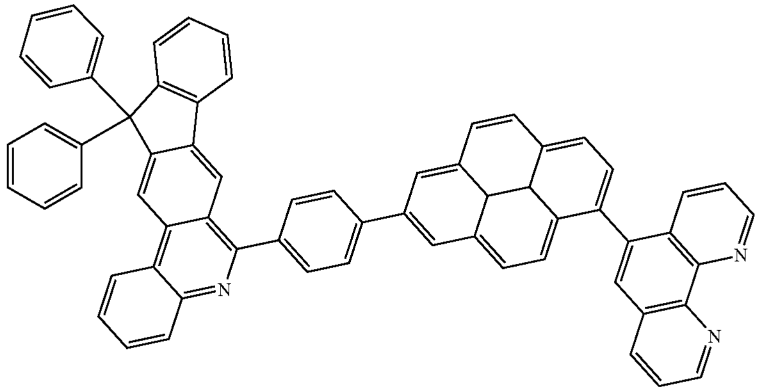

-continued
11-26
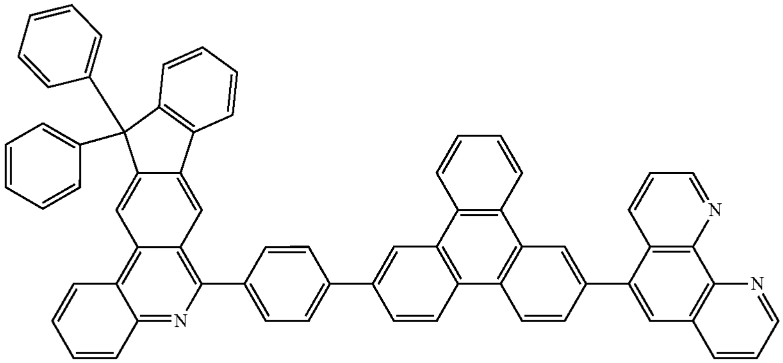
11-27
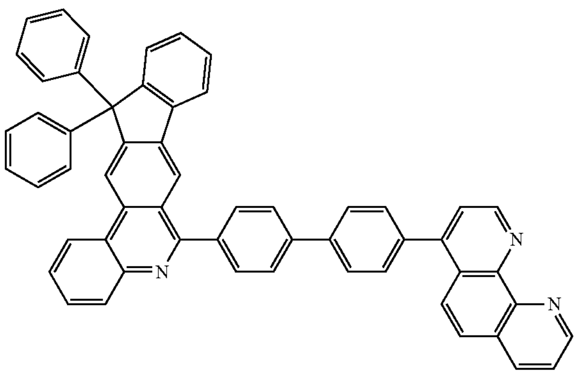
11-28
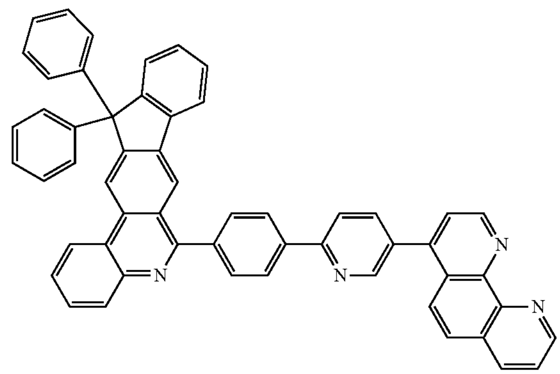
11-29
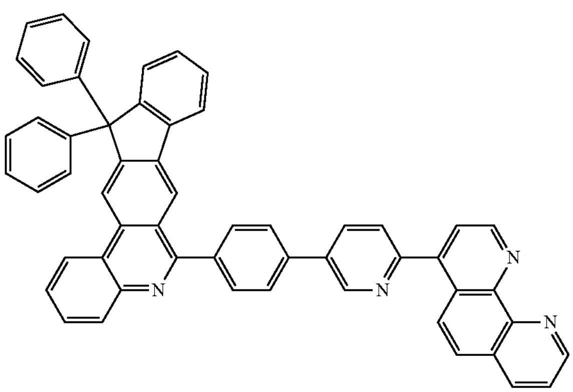
11-30
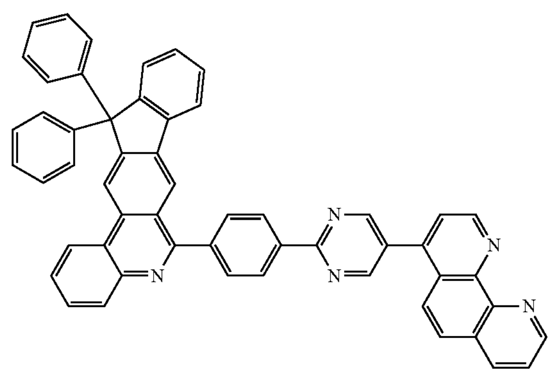
11-31
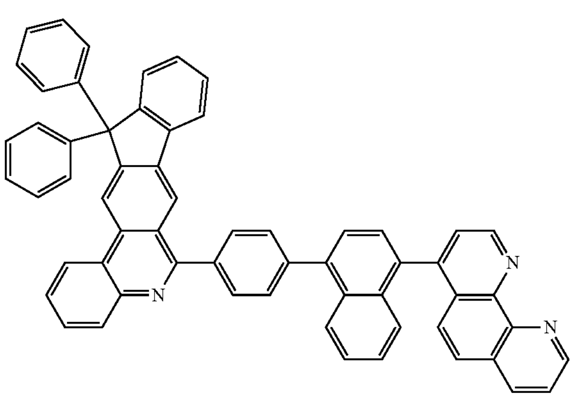
11-32
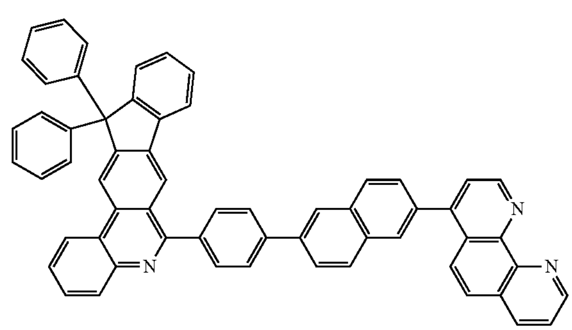

-continued
11-33
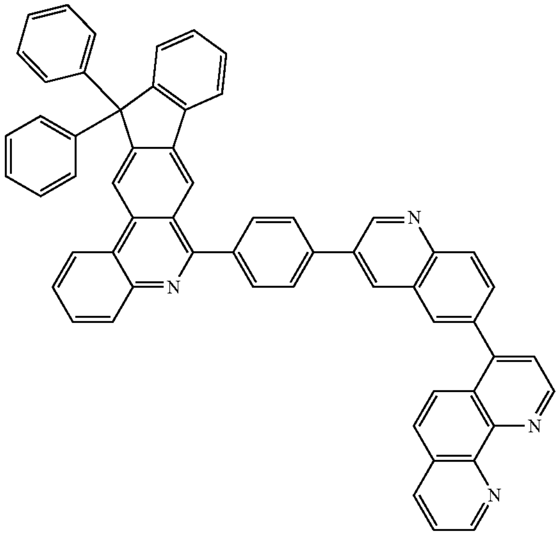
11-34
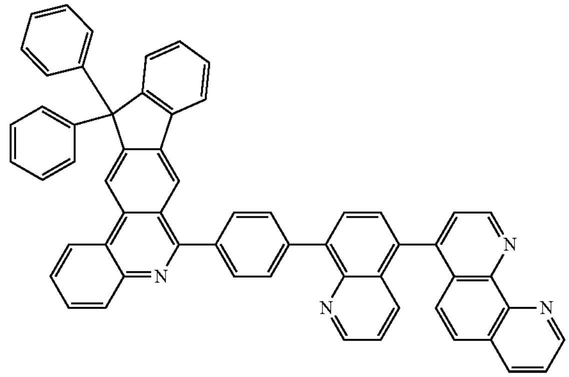
11-35
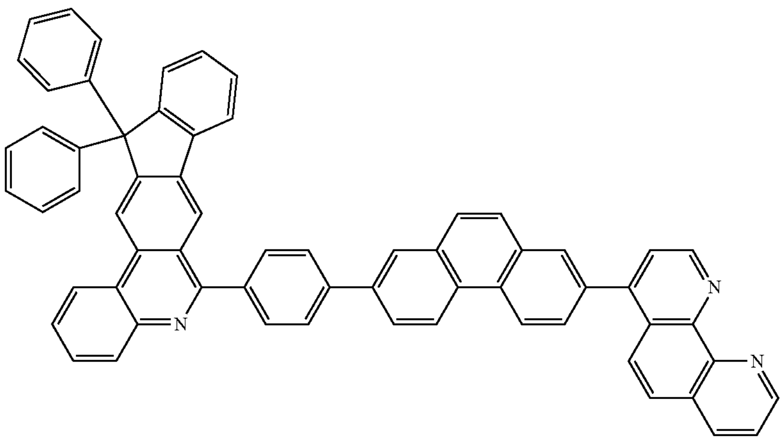
11-36
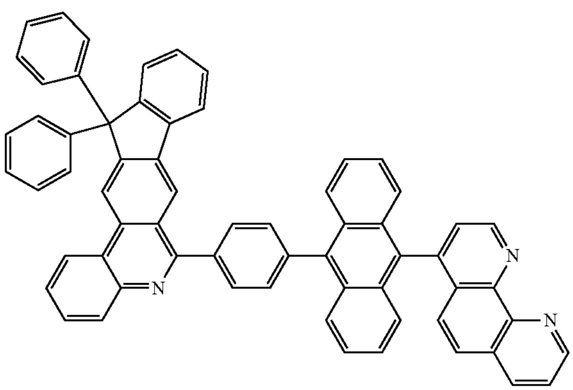
11-37
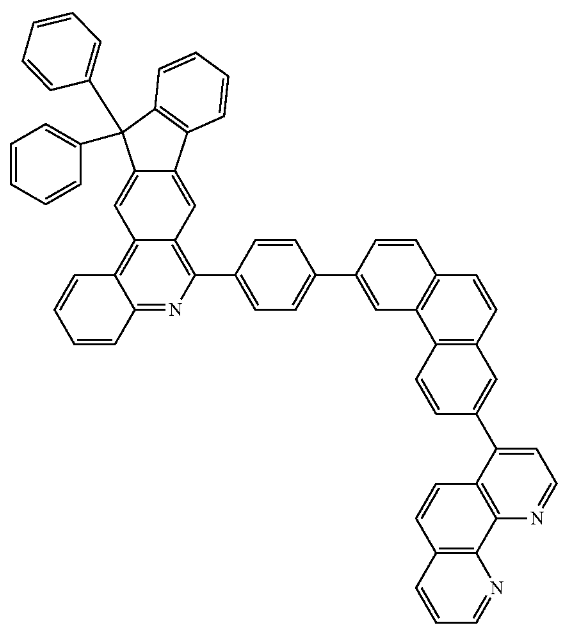

-continued
11-38
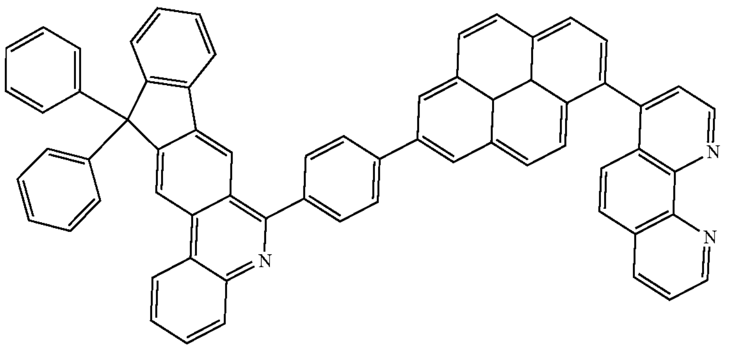
11-39
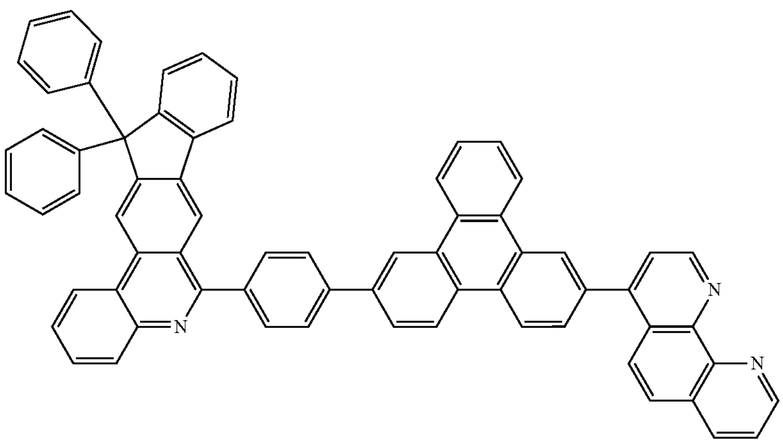
12-1
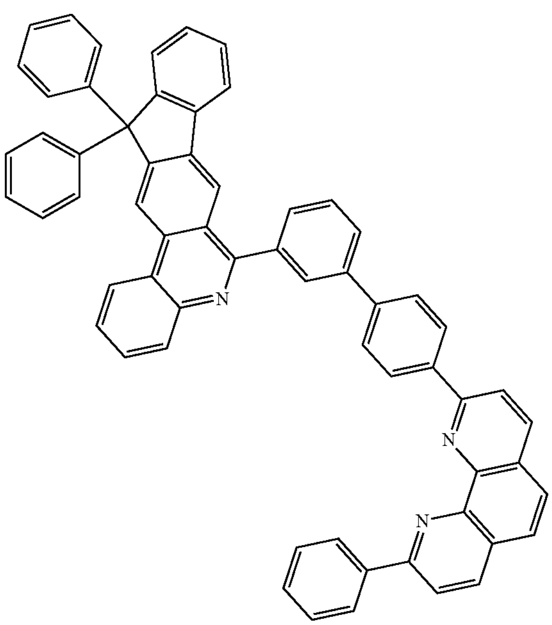
12-2
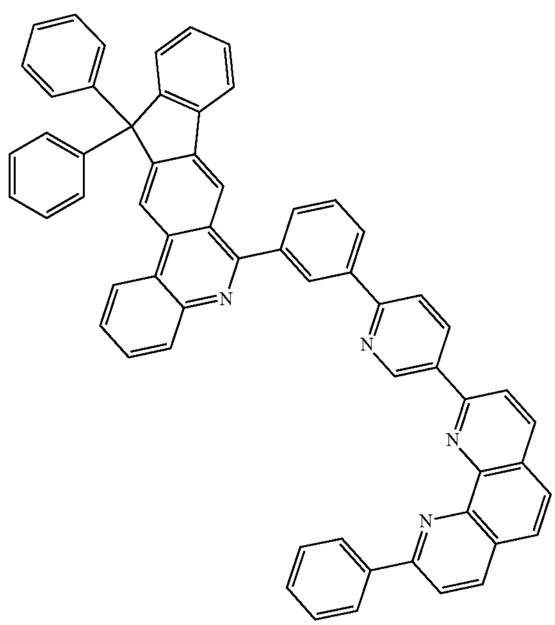

-continued
12-3
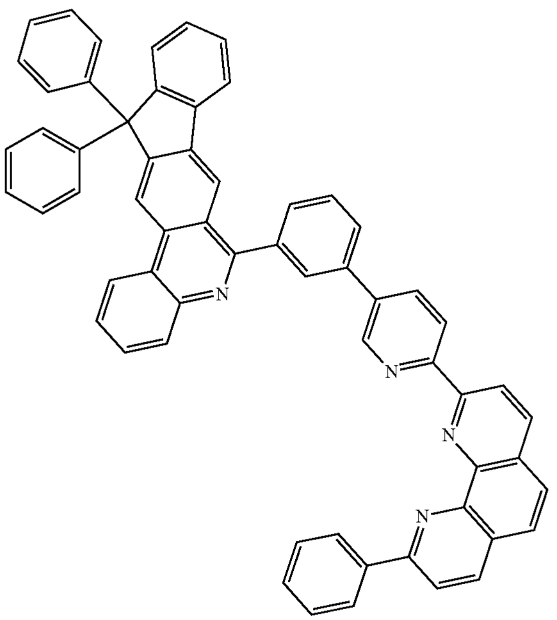
12-4
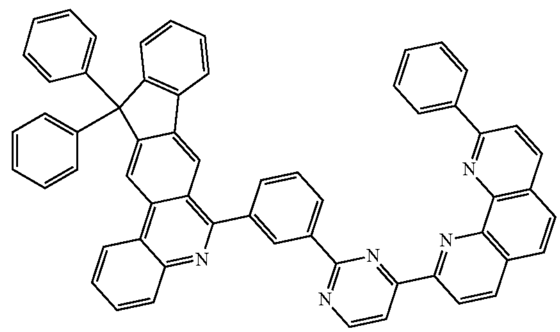
12-5
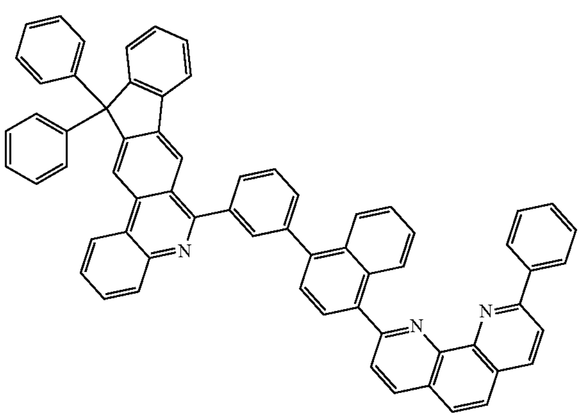
12-6
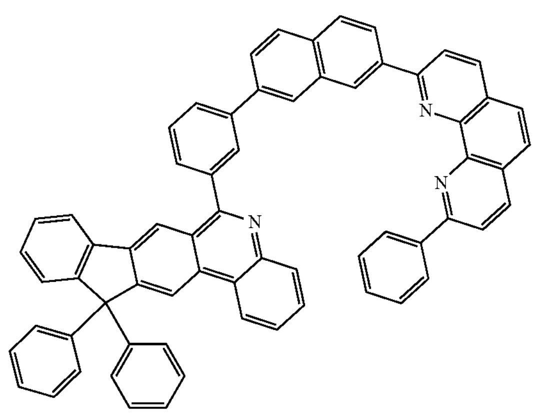

-continued
12-7
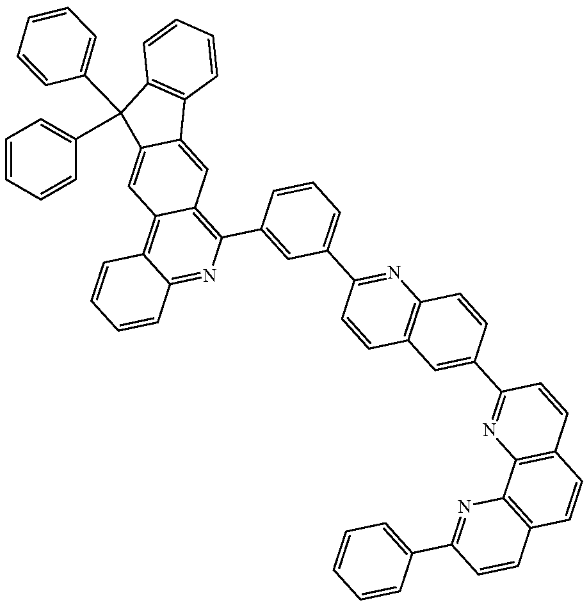
12-8
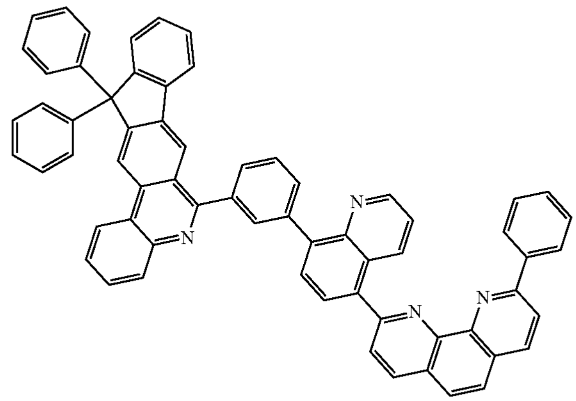
12-9
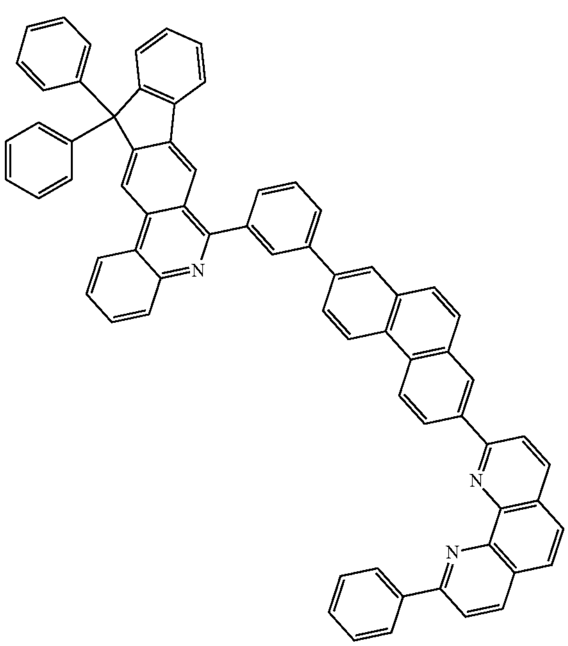
12-10
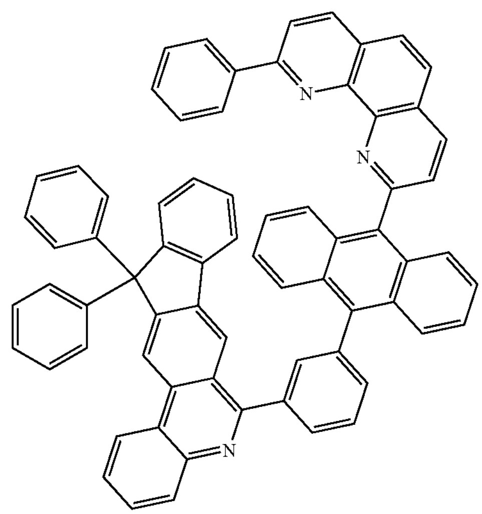

-continued
12-11
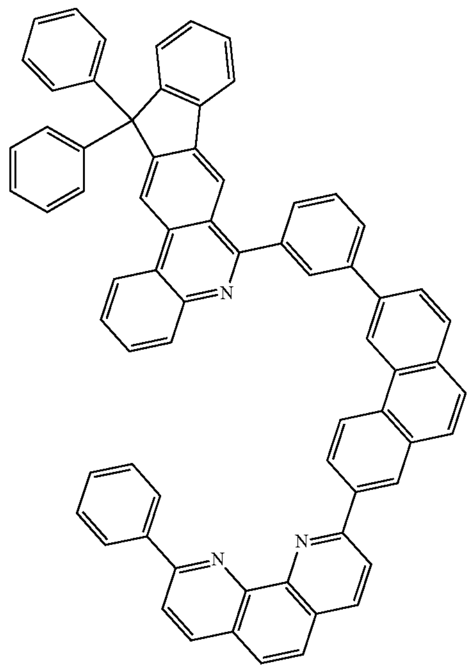
12-13
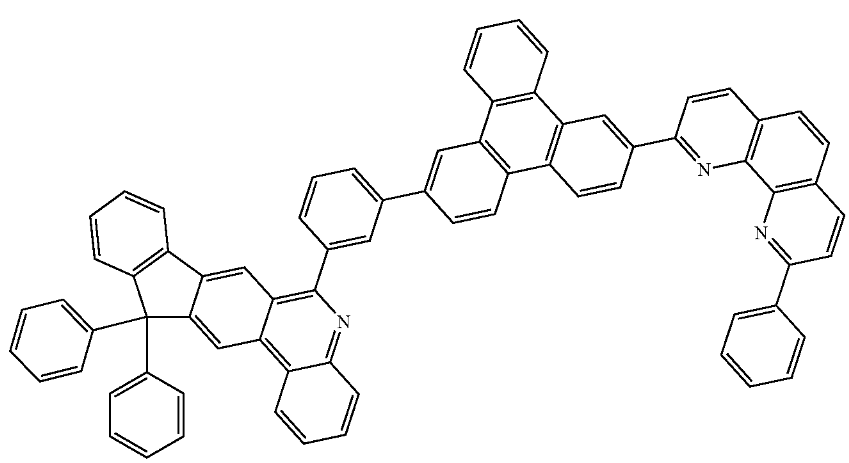

-continued
12-14
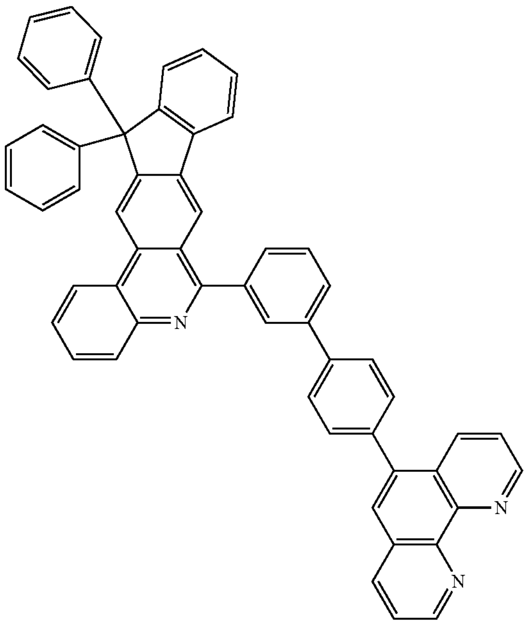
12-15
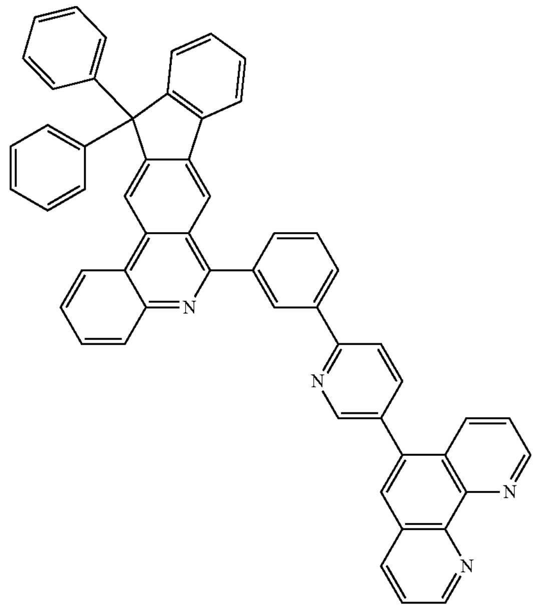
12-16
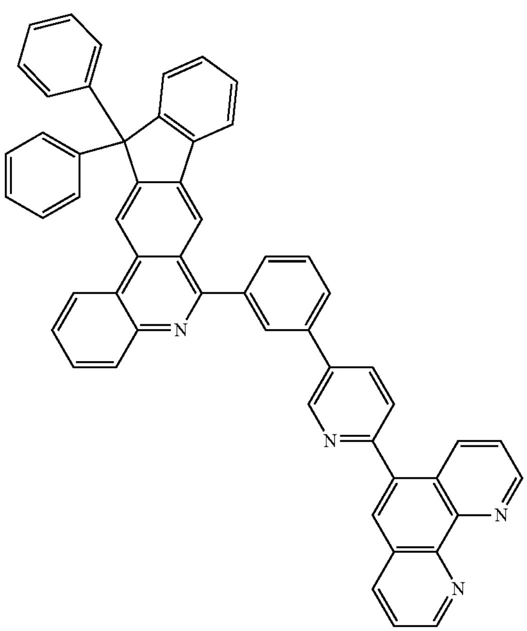
12-17
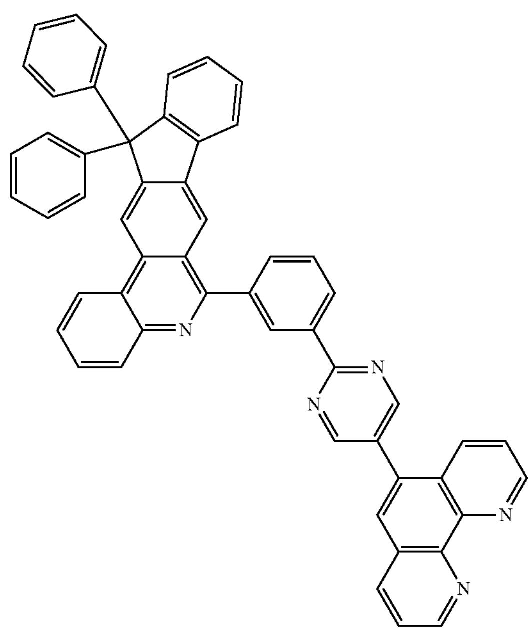

-continued
12-18
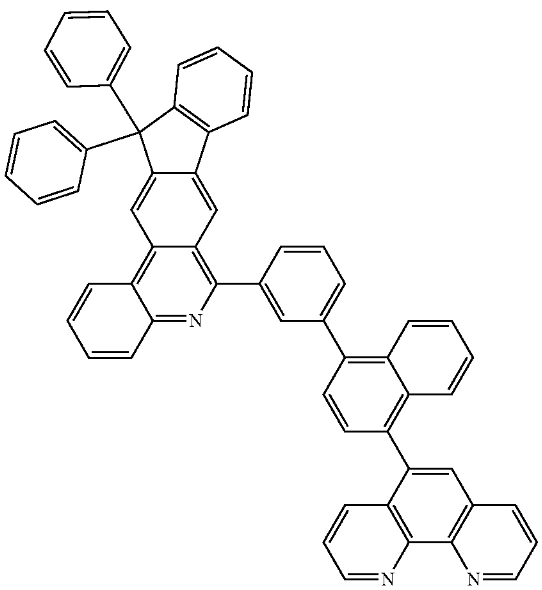
12-19
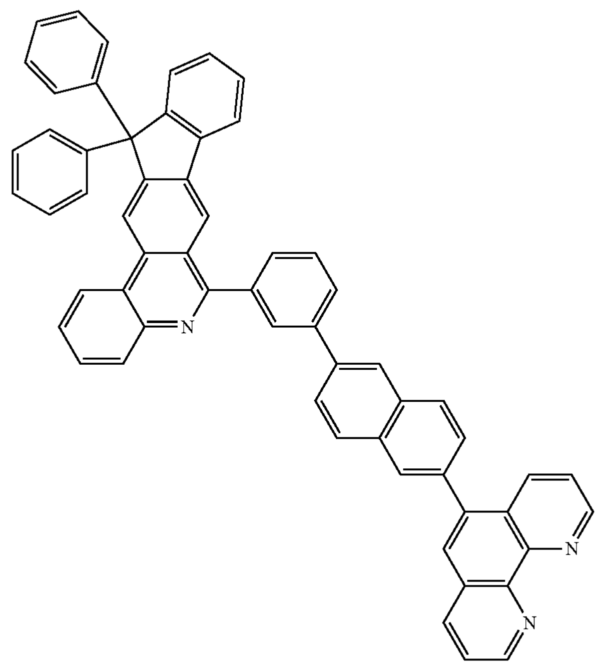
12-20
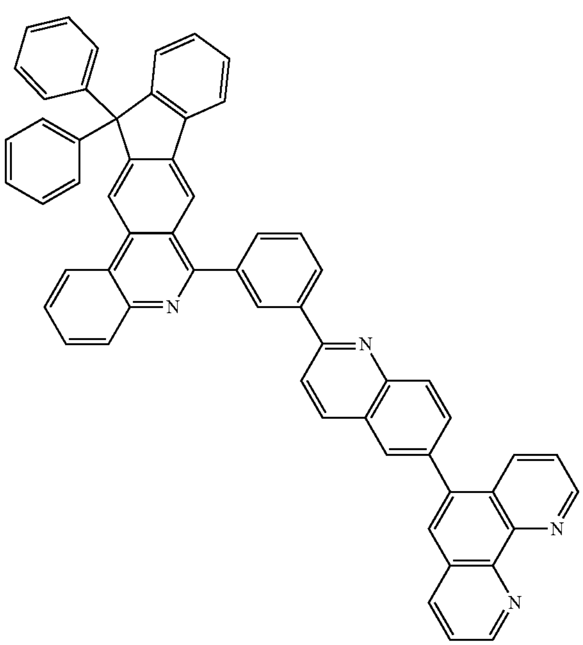
12-21
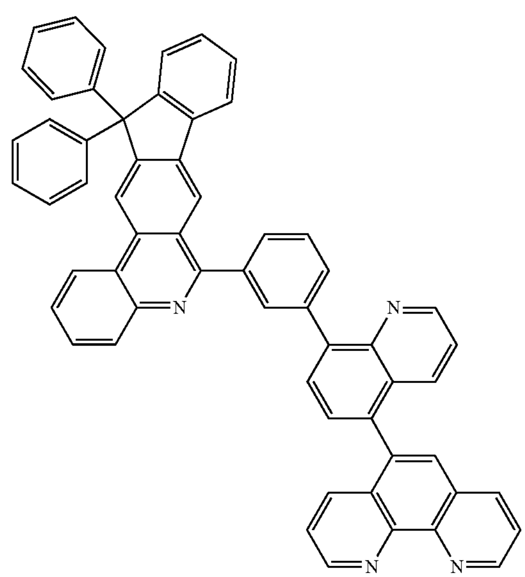

-continued
12-22
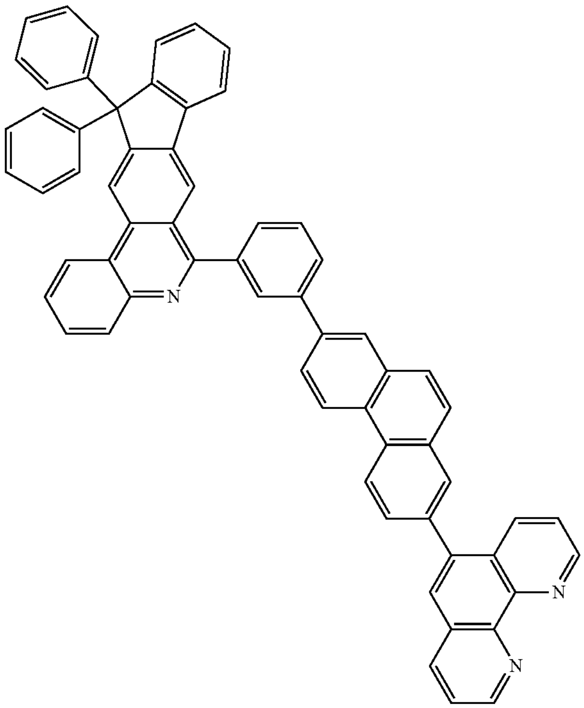
12-23
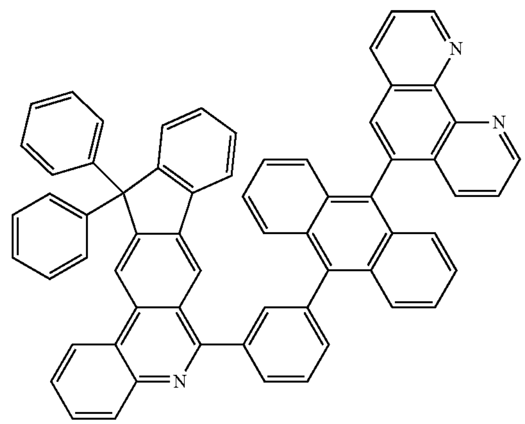
12-24
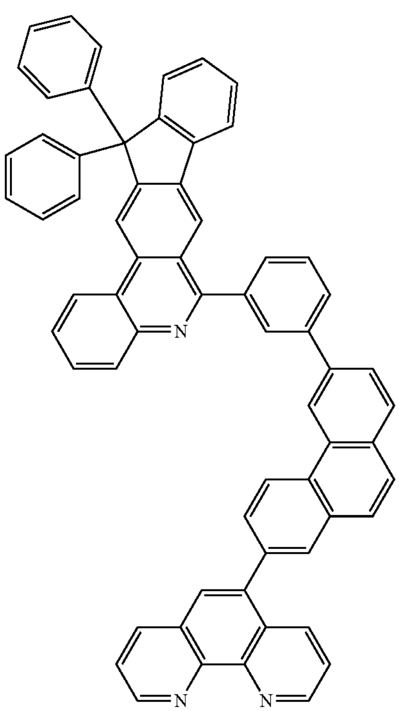
12-25
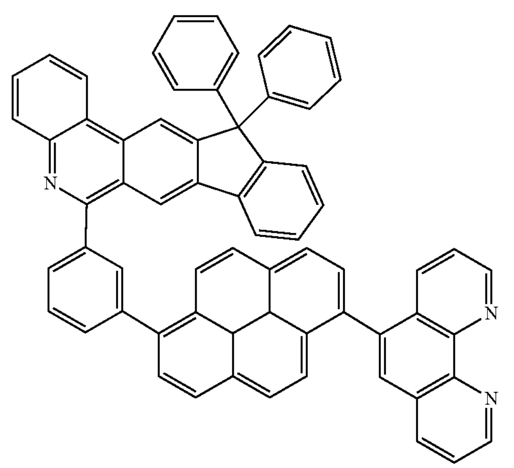

-continued
12-26
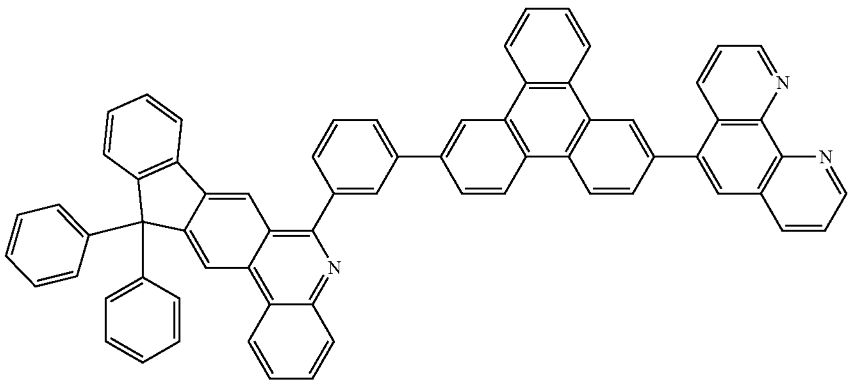
12-27
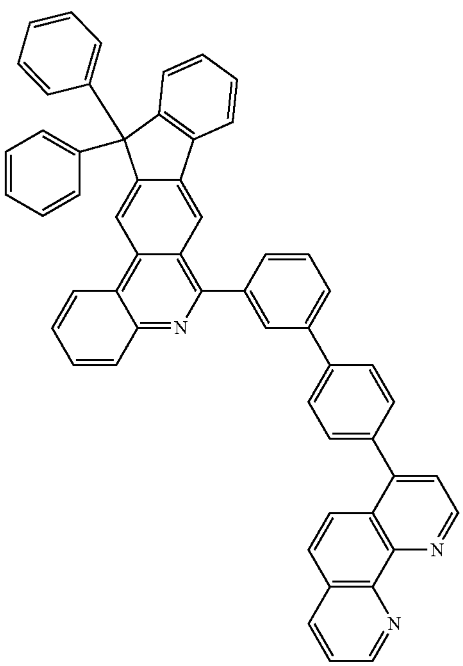
12-28
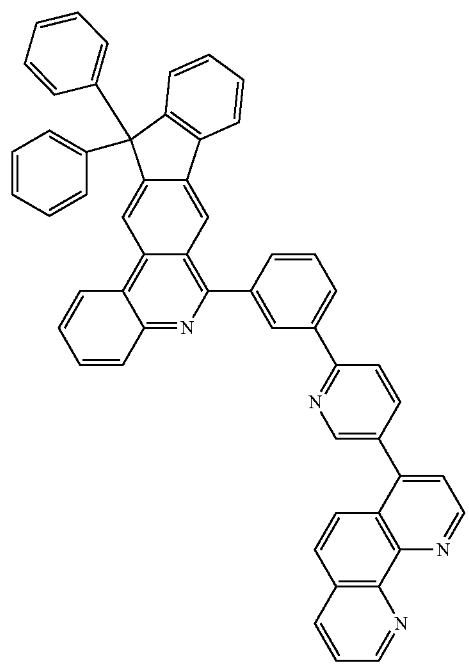

-continued
12-29
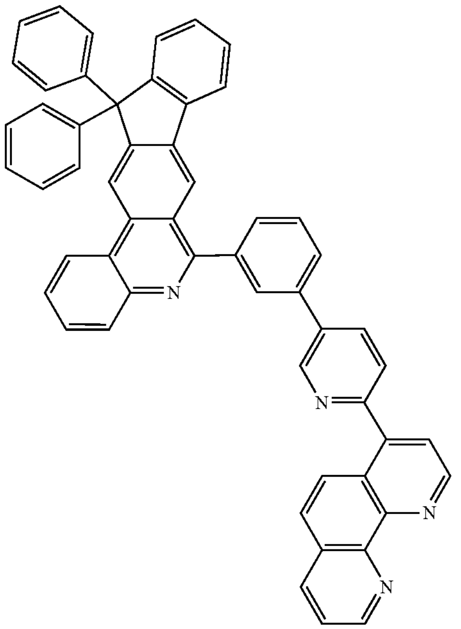
12-30
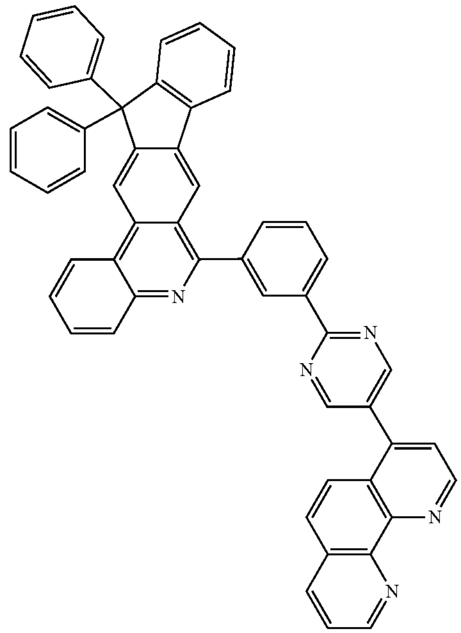
12-31
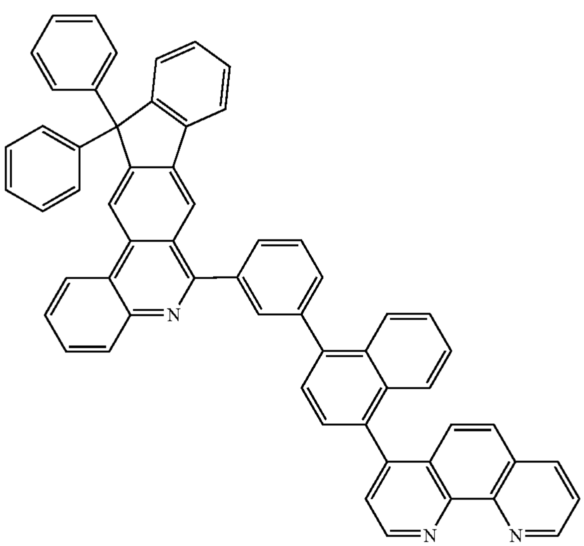
12-32
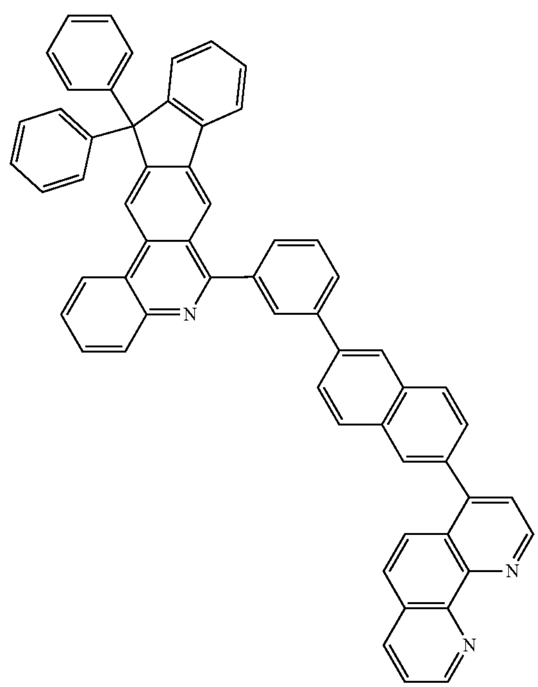

-continued
12-33
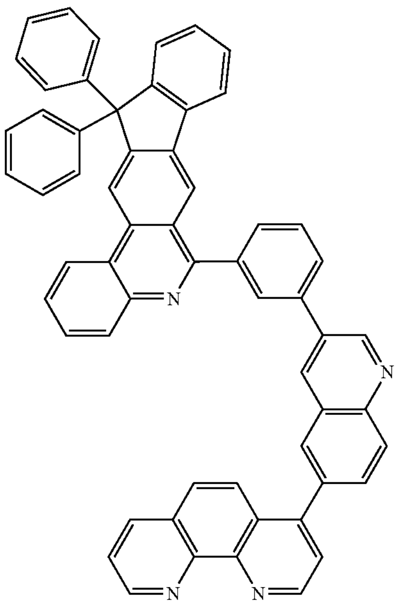
12-34
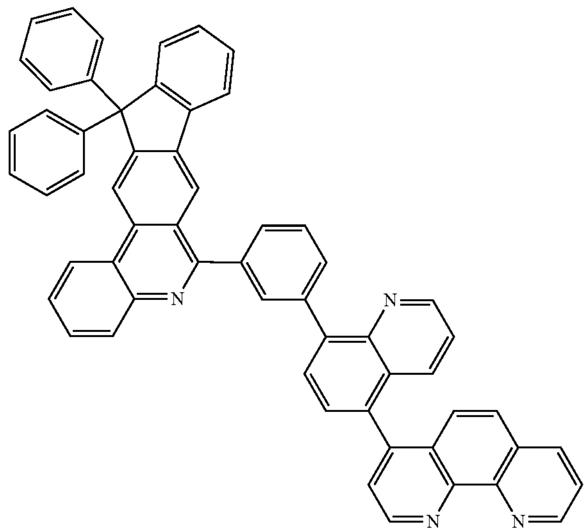
12-35
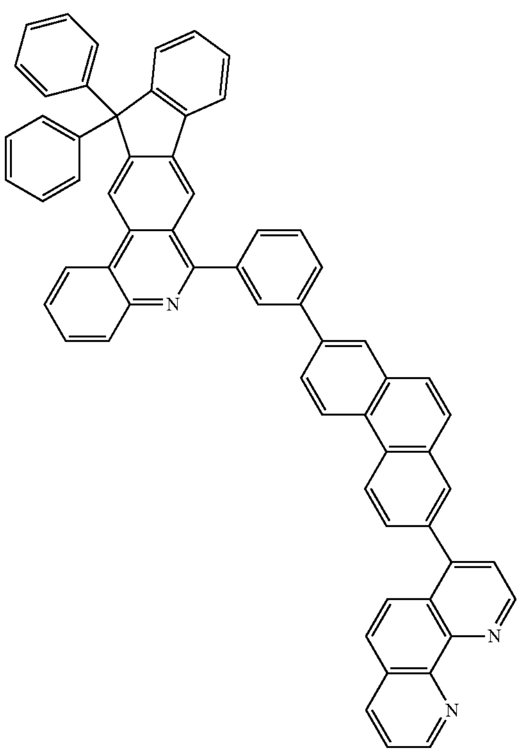
12-36
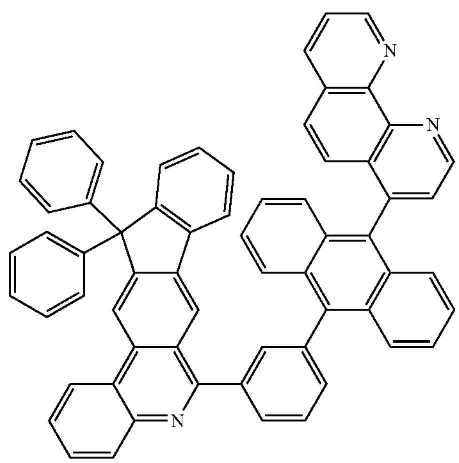

-continued
12-37
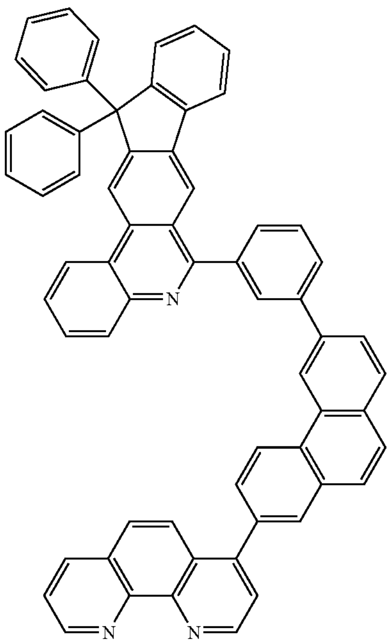
12-38
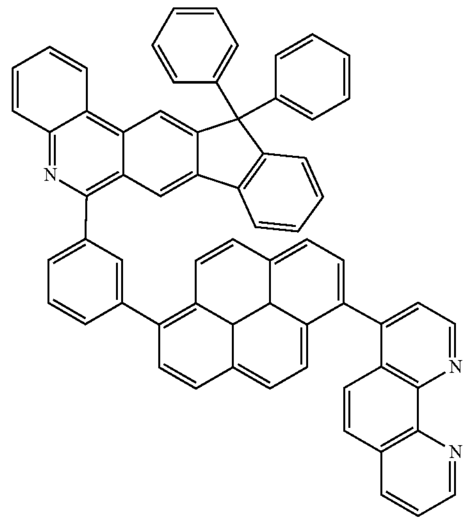
12-39
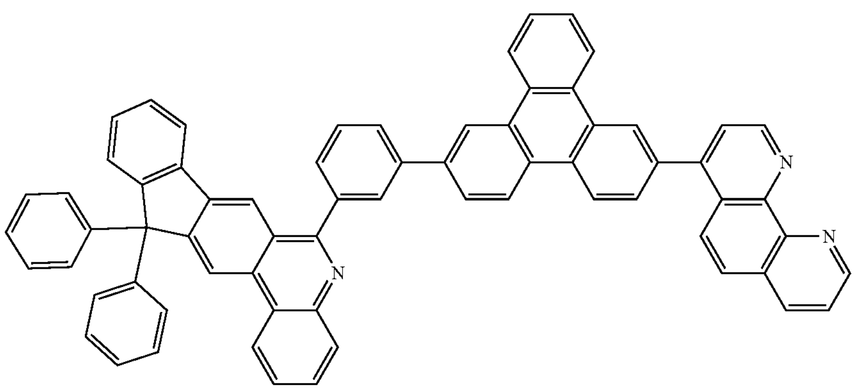
13-1
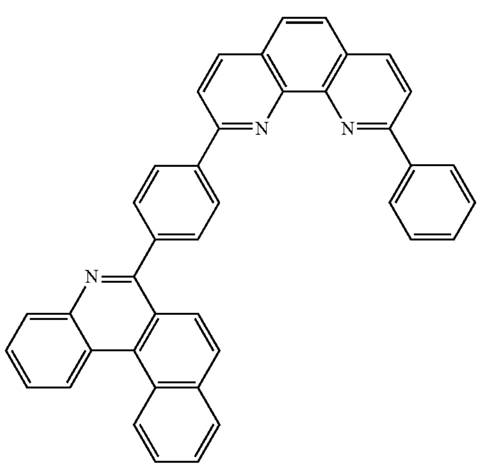
13-2
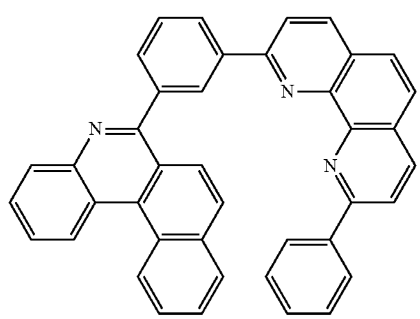

-continued
13-3
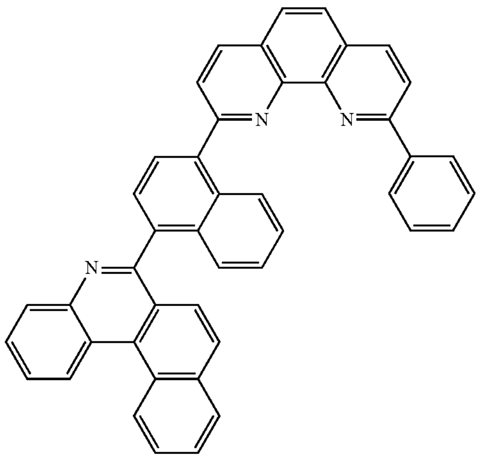
13-4
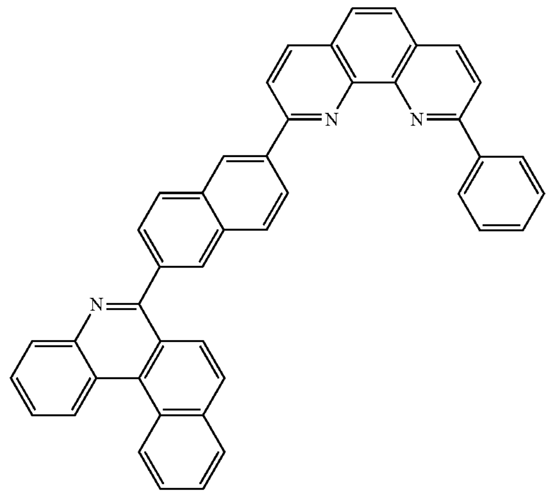
13-5
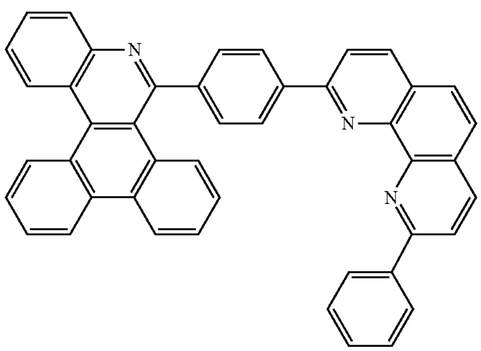
13-6
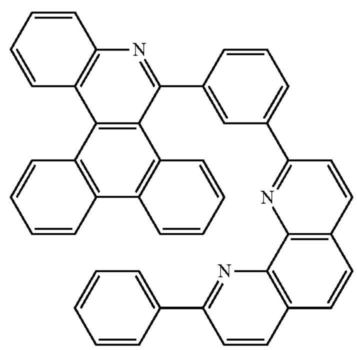
13-7
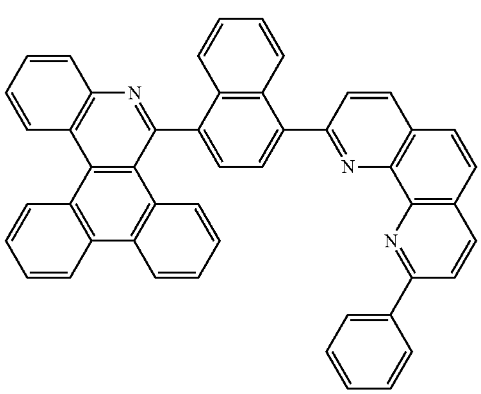
13-8
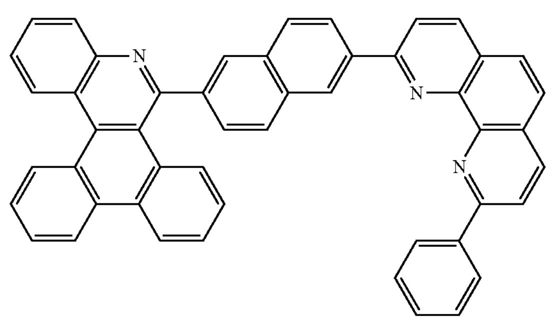

-continued
13-9
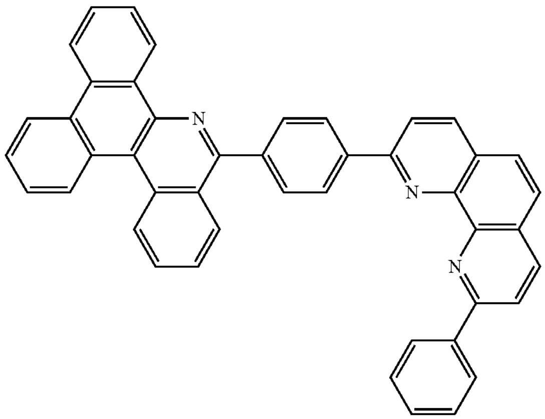
13-10
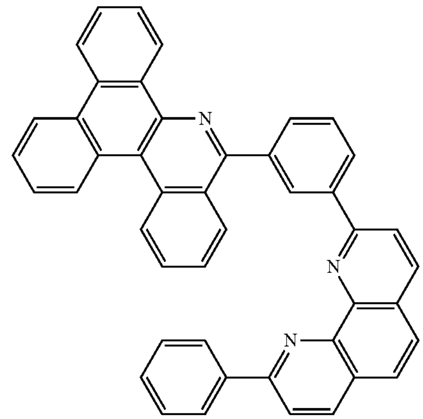
13-11
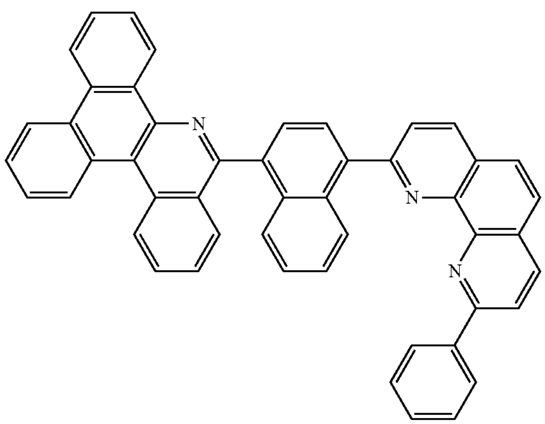
13-12
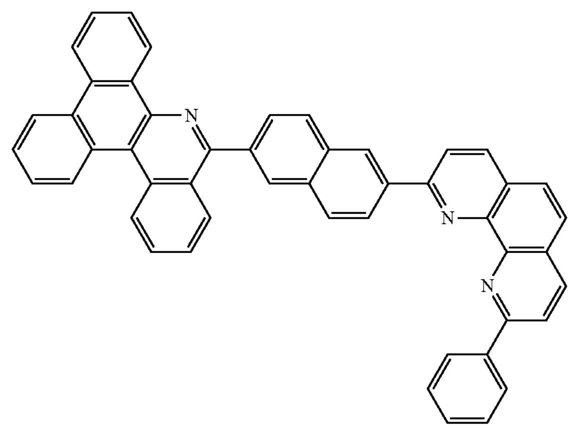
13-13
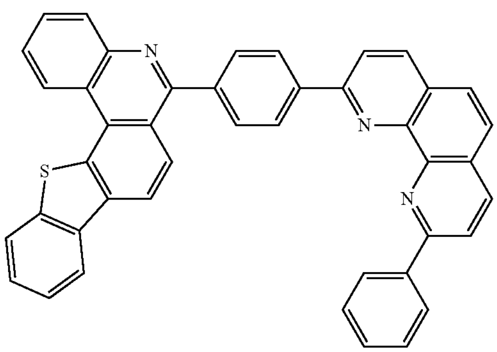
13-14
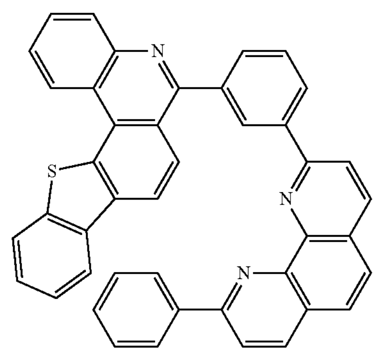
13-15
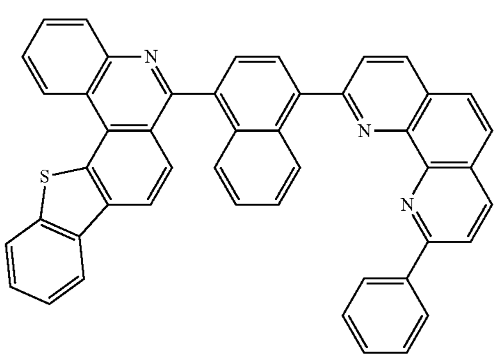
13-16
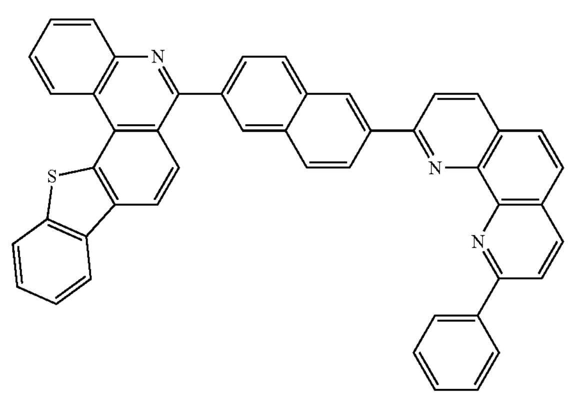

-continued
13-17
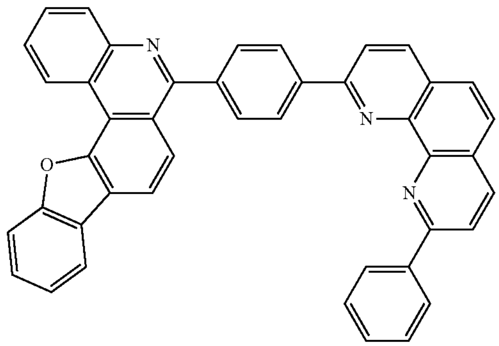
13-18
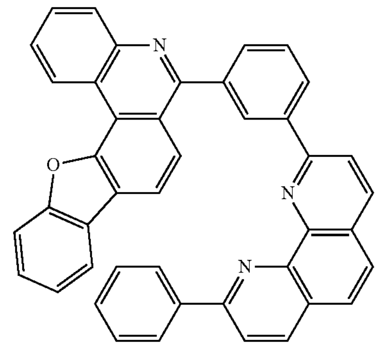
13-19
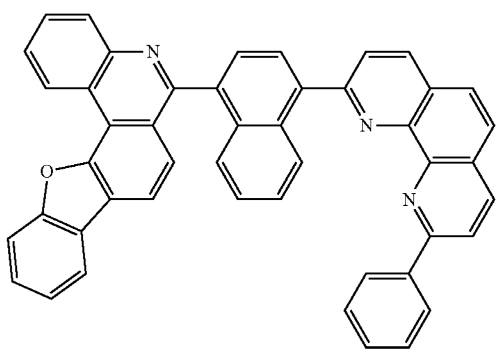
13-20
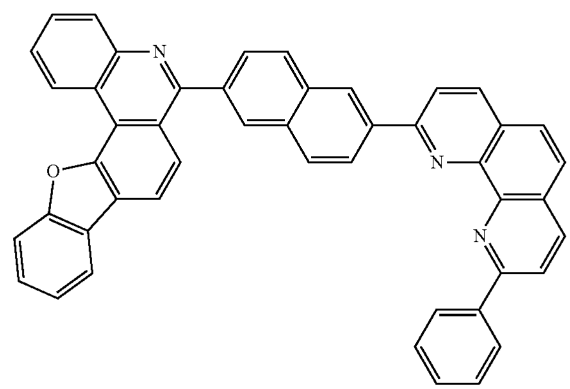
13-21
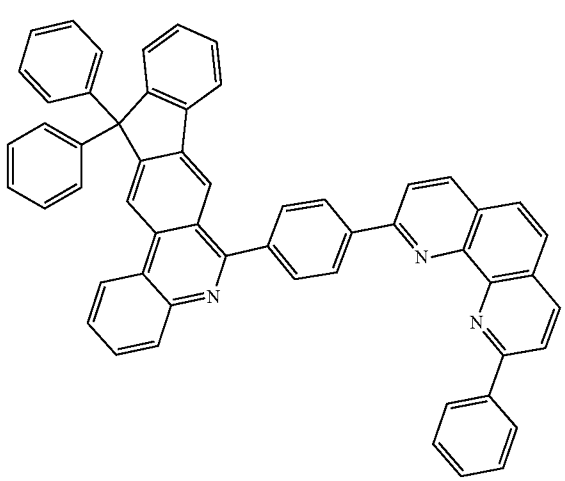
13-22
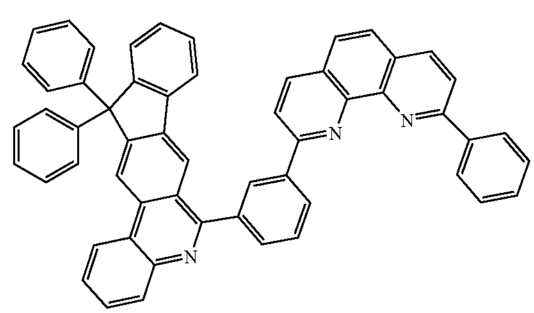

-continued 13-23

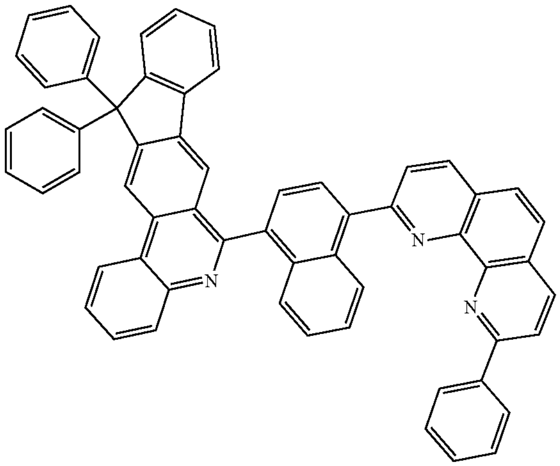

13-24

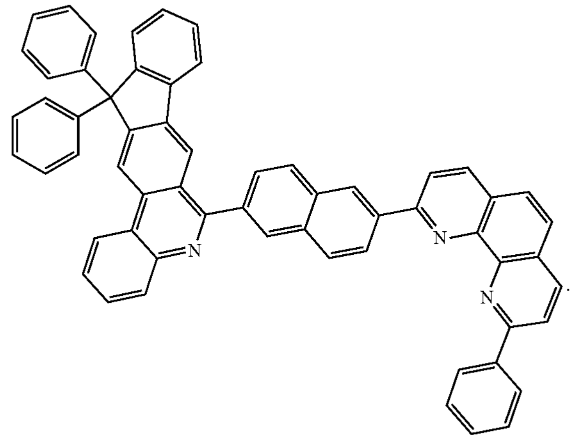

6. The organic light emitting device of claim 1, wherein the organic material layer comprises at least one of a hole blocking layer, an electron injection layer and an electron transfer layer, and at least one of the hole blocking layer, the electron injection layer and the electron transfer layer comprises the hetero-cyclic compound.

7. The organic light emitting device of claim 1, wherein the organic material layer comprises a light emitting layer, and the light emitting layer comprises the hetero-cyclic compound.

8. The organic light emitting device of claim 1, wherein the organic material layer comprises one or more of a hole injection layer, a hole transfer layer, and a layer carrying out hole injection and hole transfer at the same time, and one of the layers comprises the hetero-cyclic compound.

9. The organic light emitting device of claim 1, wherein the organic material layer comprises a charge generation layer, and the charge generation layer comprises the hetero-cyclic compound.

10. The organic light emitting device of claim 1 comprising:

an anode;

a first stack provided on the anode and comprising a first light emitting layer;

a charge generation layer provided on the first stack;

a second stack provided on the charge generation layer and comprising a second light emitting layer; and a cathode provided on the second stack.

* * * * *